US011114464B2

(12) United States Patent
Or-Bach et al.

(10) Patent No.: US 11,114,464 B2
(45) Date of Patent: Sep. 7, 2021

(54) 3D SEMICONDUCTOR DEVICE AND STRUCTURE

(71) Applicant: Monolithic 3D Inc., San Jose, CA (US)

(72) Inventors: Zvi Or-Bach, San Jose, CA (US); Jin-Woo Han, San Jose, CA (US)

(73) Assignee: MONOLITHIC 3D INC., Klamath Falls, OR (US)

( * ) Notice: Subject to any disclaimer, the term of this patent is extended or adjusted under 35 U.S.C. 154(b) by 0 days.

(21) Appl. No.: 17/063,397

(22) Filed: Oct. 5, 2020

(65) Prior Publication Data

US 2021/0050369 A1 Feb. 18, 2021

Related U.S. Application Data

(63) Continuation-in-part of application No. 16/526,763, filed on Jul. 30, 2019, now Pat. No. 10,847,540, (Continued)

(51) Int. Cl.
*H01L 27/11582* (2017.01)
*H01L 29/47* (2006.01)
(Continued)

(52) U.S. Cl.
CPC .... *H01L 27/11582* (2013.01); *H01L 23/5283* (2013.01); *H01L 27/0207* (2013.01); (Continued)

(58) Field of Classification Search
CPC ............... H01L 27/11582; H01L 29/47; H01L 29/7827; H01L 29/167; H01L 23/5283; H01L 27/0207; H01L 27/11578; H01L 29/792; H01L 27/11565; H01L 27/11519; H01L 27/11514; H01L 27/11551; H01L 27/10802; H01L 27/0688; H01L 45/1675; H01L 27/249; H01L 27/2436; H01L 45/10; G11C 17/165; G11C 16/0483;
(Continued)

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |

(Continued)

FOREIGN PATENT DOCUMENTS

| | | | |
|---|---|---|---|
| EP | 1267594 | A2 | 12/2002 |
| WO | PCT/US2008/063483 | | 5/2008 |

OTHER PUBLICATIONS

Uchida, K., et al., "Enhancement of hot-electron generation rate in Schottky source metal-oxide-semiconductor filed-effect transistors," Appl. Phys. Lett., 76, 3992 (2000). 10.1063/1.126845.

(Continued)

*Primary Examiner* — Allison Bernstein
(74) *Attorney, Agent, or Firm* — PowerPatent; Bao Tran

(57) ABSTRACT

A 3D device, the device including: a first level including logic circuits; a second level including a plurality of dynamic memory cells; and a third level including a plurality of non-volatile memory cells, where the first level is bonded to the second level, and where the device includes refresh circuits to refresh the dynamic memory cells.

20 Claims, 218 Drawing Sheets

Related U.S. Application Data which is a continuation-in-part of application No. 15/990,611, filed on May 26, 2018, now Pat. No. 10,418,369, which is a continuation of application No. 15/333,138, filed on Oct. 24, 2016, now Pat. No. 10,014,318.

(60) Provisional application No. 62/307,568, filed on Mar. 14, 2016, provisional application No. 62/286,362, filed on Jan. 23, 2016, provisional application No. 62/276,953, filed on Jan. 10, 2016, provisional application No. 62/271,251, filed on Dec. 27, 2015, provisional application No. 62/266,610, filed on Dec. 12, 2015, provisional application No. 62/246,054, filed on Oct. 24, 2015.

(51) Int. Cl.

| | |
|---|---|
| ***H01L 29/78*** | (2006.01) |
| ***H01L 29/167*** | (2006.01) |
| ***H01L 23/528*** | (2006.01) |
| ***H01L 27/02*** | (2006.01) |
| ***H01L 27/11578*** | (2017.01) |
| ***H01L 29/792*** | (2006.01) |
| ***H01L 27/11565*** | (2017.01) |
| ***H01L 27/11519*** | (2017.01) |
| ***H01L 27/11514*** | (2017.01) |
| ***H01L 27/11551*** | (2017.01) |

(52) U.S. Cl.
CPC .. *H01L 27/11565* (2013.01); *H01L 27/11578* (2013.01); *H01L 29/167* (2013.01); *H01L 29/47* (2013.01); *H01L 29/7827* (2013.01); *H01L 29/792* (2013.01); *H01L 27/11514* (2013.01); *H01L 27/11519* (2013.01); *H01L 27/11551* (2013.01)

(58) Field of Classification Search
CPC ........... G11C 16/0466; G11C 2213/71; G11C 13/0002; G11C 11/56; G11C 11/406; G11C 11/005
See application file for complete search history.

(56) References Cited

U.S. PATENT DOCUMENTS

| | | | |
|---|---|---|---|
| 4,009,483 | A | 2/1977 | Clark |
| 4,197,555 | A | 4/1980 | Uehara et al. |
| 4,213,139 | A | 7/1980 | Rao et al. |
| 4,400,715 | A | 8/1983 | Barbee et al. |
| 4,487,635 | A | 12/1984 | Kugimiya et al. |
| 4,510,670 | A | 4/1985 | Schwabe |
| 4,522,657 | A | 6/1985 | Rohatgi et al. |
| 4,612,083 | A | 9/1986 | Yasumoto et al. |
| 4,643,950 | A | 2/1987 | Ogura et al. |
| 4,704,785 | A | 11/1987 | Curran |
| 4,711,858 | A | 12/1987 | Harder et al. |
| 4,721,885 | A | 1/1988 | Brodie |
| 4,732,312 | A | 3/1988 | Kennedy et al. |
| 4,733,288 | A | 3/1988 | Sato |
| 4,829,018 | A | 5/1989 | Wahlstrom |
| 4,854,986 | A | 8/1989 | Raby |
| 4,866,304 | A | 9/1989 | Yu |
| 4,939,568 | A | 7/1990 | Kato et al. |
| 4,956,307 | A | 9/1990 | Pollack et al. |
| 5,012,153 | A | 4/1991 | Atkinson et al. |
| 5,032,007 | A | 7/1991 | Silverstein et al. |
| 5,047,979 | A | 9/1991 | Leung |
| 5,087,585 | A | 2/1992 | Hayashi |
| 5,093,704 | A | 3/1992 | Sato et al. |
| 5,106,775 | A | 4/1992 | Kaga et al. |
| 5,152,857 | A | 10/1992 | Ito et al. |
| 5,162,879 | A | 11/1992 | Gill |
| 5,189,500 | A | 2/1993 | Kusunoki |
| 5,217,916 | A | 6/1993 | Anderson et al. |
| 5,250,460 | A | 10/1993 | Yamagata et al. |
| 5,258,643 | A | 11/1993 | Cohen |
| 5,265,047 | A | 11/1993 | Leung et al. |
| 5,266,511 | A | 11/1993 | Takao |
| 5,277,748 | A | 1/1994 | Sakaguchi et al. |
| 5,286,670 | A | 2/1994 | Kang et al. |
| 5,294,556 | A | 3/1994 | Kawamura |
| 5,308,782 | A | 5/1994 | Mazure et al. |
| 5,312,771 | A | 5/1994 | Yonehara |
| 5,317,236 | A | 5/1994 | Zavracky et al. |
| 5,324,980 | A | 6/1994 | Kusunoki |
| 5,355,022 | A | 10/1994 | Sugahara et al. |
| 5,371,037 | A | 12/1994 | Yonehara |
| 5,374,564 | A | 12/1994 | Bruel |
| 5,374,581 | A | 12/1994 | Ichikawa et al. |
| 5,424,560 | A | 6/1995 | Norman et al. |
| 5,475,280 | A | 12/1995 | Jones et al. |
| 5,478,762 | A | 12/1995 | Chao |
| 5,485,031 | A | 1/1996 | Zhang et al. |
| 5,498,978 | A | 3/1996 | Takahashi et al. |
| 5,527,423 | A | 6/1996 | Neville et al. |
| 5,535,342 | A | 7/1996 | Taylor |
| 5,554,870 | A | 9/1996 | Fitch et al. |
| 5,563,084 | A | 10/1996 | Ramm et al. |
| 5,583,349 | A | 12/1996 | Norman et al. |
| 5,583,350 | A | 12/1996 | Norman et al. |
| 5,586,291 | A | 12/1996 | Lasker |
| 5,594,563 | A | 1/1997 | Larson |
| 5,604,137 | A | 2/1997 | Yamazaki et al. |
| 5,617,991 | A | 4/1997 | Pramanick et al. |
| 5,627,106 | A | 5/1997 | Hsu |
| 5,656,548 | A | 8/1997 | Zavracky et al. |
| 5,656,553 | A | 8/1997 | Leas et al. |
| 5,659,194 | A | 8/1997 | Iwamatsu |
| 5,670,411 | A | 9/1997 | Yonehara |
| 5,681,756 | A | 10/1997 | Norman et al. |
| 5,695,557 | A | 12/1997 | Yamagata et al. |
| 5,701,027 | A | 12/1997 | Gordon et al. |
| 5,707,745 | A | 1/1998 | Forrest et al. |
| 5,714,395 | A | 2/1998 | Bruel |
| 5,721,160 | A | 2/1998 | Forrest et al. |
| 5,737,748 | A | 4/1998 | Shigeeda |
| 5,739,552 | A | 4/1998 | Kimura et al. |
| 5,744,979 | A | 4/1998 | Goetting |
| 5,748,161 | A | 5/1998 | Lebby et al. |
| 5,757,026 | A | 5/1998 | Forrest et al. |
| 5,770,483 | A | 6/1998 | Kadosh |
| 5,770,881 | A | 6/1998 | Pelella et al. |
| 5,781,031 | A | 7/1998 | Bertin et al. |
| 5,817,574 | A | 10/1998 | Gardner |
| 5,829,026 | A | 10/1998 | Leung et al. |
| 5,835,396 | A | 11/1998 | Zhang |
| 5,854,123 | A | 12/1998 | Sato et al. |
| 5,861,929 | A | 1/1999 | Spitzer |
| 5,877,034 | A | 3/1999 | Ramm |
| 5,877,070 | A | 3/1999 | Goesele et al. |
| 5,882,987 | A | 3/1999 | Srikrishnan |
| 5,883,525 | A | 3/1999 | Tavana et al. |
| 5,889,903 | A | 3/1999 | Rao |
| 5,893,721 | A | 4/1999 | Huang et al. |
| 5,915,167 | A | 6/1999 | Leedy |
| 5,920,788 | A | 7/1999 | Reinberg |
| 5,937,312 | A | 8/1999 | Iyer et al. |
| 5,943,574 | A | 8/1999 | Tehran et al. |
| 5,952,680 | A | 9/1999 | Strite |
| 5,952,681 | A | 9/1999 | Chen |
| 5,965,875 | A | 10/1999 | Merrill |
| 5,977,579 | A | 11/1999 | Noble |
| 5,977,961 | A | 11/1999 | Rindal |
| 5,980,633 | A | 11/1999 | Yamagata et al. |
| 5,985,742 | A | 11/1999 | Henley et al. |
| 5,994,746 | A | 11/1999 | Reisinger |
| 5,998,808 | A | 12/1999 | Matsushita |
| 6,001,693 | A | 12/1999 | Yeouchung et al. |
| 6,009,496 | A | 12/1999 | Tsai |
| 6,020,252 | A | 2/2000 | Aspar et al. |

(56) References Cited

U.S. PATENT DOCUMENTS

| | | | |
|---|---|---|---|
| 6,020,263 | A | 2/2000 | Shih et al. |
| 6,027,958 | A | 2/2000 | Vu et al. |
| 6,030,700 | A | 2/2000 | Forrest et al. |
| 6,052,498 | A | 4/2000 | Paniccia |
| 6,054,370 | A | 4/2000 | Doyle |
| 6,057,212 | A | 5/2000 | Chan et al. |
| 6,071,795 | A | 6/2000 | Cheung et al. |
| 6,075,268 | A | 6/2000 | Gardner et al. |
| 6,103,597 | A | 8/2000 | Aspar et al. |
| 6,111,260 | A | 8/2000 | Dawson et al. |
| 6,125,217 | A | 9/2000 | Paniccia et al. |
| 6,153,495 | A | 11/2000 | Kub et al. |
| 6,191,007 | B1 | 2/2001 | Matsui et al. |
| 6,200,878 | B1 | 3/2001 | Yamagata |
| 6,204,529 | B1 | 3/2001 | Lung et al. |
| 6,222,203 | B1 | 4/2001 | Ishibashi et al. |
| 6,226,197 | B1 | 5/2001 | Nishimura |
| 6,229,161 | B1 | 5/2001 | Nemati et al. |
| 6,242,324 | B1 | 6/2001 | Kub et al. |
| 6,242,778 | B1 | 6/2001 | Marmillion et al. |
| 6,252,465 | B1 | 6/2001 | Katoh |
| 6,259,623 | B1 | 7/2001 | Takahashi |
| 6,261,935 | B1 | 7/2001 | See et al. |
| 6,264,805 | B1 | 7/2001 | Forrest et al. |
| 6,281,102 | B1 | 8/2001 | Cao et al. |
| 6,294,018 | B1 | 9/2001 | Hamm et al. |
| 6,306,705 | B1 | 10/2001 | Parekh et al. |
| 6,321,134 | B1 | 11/2001 | Henley et al. |
| 6,322,903 | B1 | 11/2001 | Siniaguine et al. |
| 6,331,468 | B1 | 12/2001 | Aronowitz et al. |
| 6,331,790 | B1 | 12/2001 | Or-Bach et al. |
| 6,331,943 | B1 | 12/2001 | Naji et al. |
| 6,353,492 | B2 | 3/2002 | McClelland et al. |
| 6,355,501 | B1 | 3/2002 | Fung et al. |
| 6,355,976 | B1 | 3/2002 | Faris |
| 6,358,631 | B1 | 3/2002 | Forrest et al. |
| 6,365,270 | B2 | 4/2002 | Forrest et al. |
| 6,376,337 | B1 | 4/2002 | Wang et al. |
| 6,377,504 | B1 | 4/2002 | Hilbert |
| 6,380,046 | B1 | 4/2002 | Yamazaki |
| 6,392,253 | B1 | 5/2002 | Saxena |
| 6,404,043 | B1 | 6/2002 | Isaak |
| 6,417,108 | B1 | 7/2002 | Akino et al. |
| 6,420,215 | B1 | 7/2002 | Knall et al. |
| 6,423,614 | B1 | 7/2002 | Doyle |
| 6,429,481 | B1 | 8/2002 | Mo et al. |
| 6,429,484 | B1 | 8/2002 | Yu |
| 6,430,734 | B1 | 8/2002 | Zahar |
| 6,448,615 | B1 | 9/2002 | Forbes |
| 6,475,869 | B1 | 11/2002 | Yu |
| 6,476,493 | B2 | 11/2002 | Or-Bach et al. |
| 6,479,821 | B1 | 11/2002 | Hawryluk et al. |
| 6,483,707 | B1 | 11/2002 | Freuler et al. |
| 6,507,115 | B1 | 1/2003 | Hofstee |
| 6,515,334 | B2 | 2/2003 | Yamazaki et al. |
| 6,515,511 | B2 | 2/2003 | Sugibayashi et al. |
| 6,526,559 | B2 | 2/2003 | Schiefele et al. |
| 6,528,391 | B1 | 3/2003 | Henley et al. |
| 6,534,352 | B1 | 3/2003 | Kim |
| 6,534,382 | B1 | 3/2003 | Sakaguchi et al. |
| 6,544,837 | B1 | 4/2003 | Divakauni et al. |
| 6,545,314 | B2 | 4/2003 | Forbes et al. |
| 6,555,901 | B1 | 4/2003 | Yoshihara et al. |
| 6,563,139 | B2 | 5/2003 | Hen |
| 6,580,124 | B1 | 6/2003 | Cleeves |
| 6,580,289 | B2 | 6/2003 | Cox |
| 6,600,173 | B2 | 7/2003 | Tiwari |
| 6,617,694 | B2 | 9/2003 | Kodaira et al. |
| 6,620,659 | B2 | 9/2003 | Emmma et al. |
| 6,624,046 | B1 | 9/2003 | Zavracky et al. |
| 6,627,518 | B1 | 9/2003 | Inoue et al. |
| 6,627,985 | B2 | 9/2003 | Huppenthal et al. |
| 6,630,713 | B2 | 10/2003 | Geusic |
| 6,635,552 | B1 | 10/2003 | Gonzalez |
| 6,635,588 | B1 | 10/2003 | Hawryluk et al. |
| 6,638,834 | B2 | 10/2003 | Gonzalez |
| 6,642,744 | B2 | 11/2003 | Or-Bach et al. |
| 6,653,209 | B1 | 11/2003 | Yamagata |
| 6,653,712 | B2 | 11/2003 | Knall et al. |
| 6,661,085 | B2 | 12/2003 | Kellar et al. |
| 6,677,204 | B2 | 1/2004 | Sleeves et al. |
| 6,686,253 | B2 | 2/2004 | Or-Bach |
| 6,689,660 | B1 | 2/2004 | Noble |
| 6,701,071 | B2 | 3/2004 | Wada et al. |
| 6,703,328 | B2 | 3/2004 | Tanaka et al. |
| 6,720,613 | B1 | 4/2004 | Chang |
| 6,756,633 | B2 | 6/2004 | Wang et al. |
| 6,756,811 | B2 | 6/2004 | Or-Bach |
| 6,759,282 | B2 | 7/2004 | Campbell et al. |
| 6,762,076 | B2 | 7/2004 | Kim et al. |
| 6,774,010 | B2 | 8/2004 | Chu et al. |
| 6,805,979 | B2 | 10/2004 | Ogura et al. |
| 6,806,171 | B1 | 10/2004 | Ulyashin et al. |
| 6,809,009 | B2 | 10/2004 | Aspar et al. |
| 6,815,781 | B2 | 11/2004 | Vyvoda et al. |
| 6,819,136 | B2 | 11/2004 | Or-Bach |
| 6,821,826 | B1 | 11/2004 | Chan et al. |
| 6,841,813 | B2 | 1/2005 | Walker et al. |
| 6,844,243 | B1 | 1/2005 | Gonzalez |
| 6,864,534 | B2 | 3/2005 | Ipposhi et al. |
| 6,875,671 | B2 | 4/2005 | Faris |
| 6,882,572 | B2 | 4/2005 | Wang et al. |
| 6,888,375 | B2 | 5/2005 | Feng et al. |
| 6,917,219 | B2 | 7/2005 | New |
| 6,927,431 | B2 | 8/2005 | Gonzalez |
| 6,930,511 | B2 | 8/2005 | Or-Bach |
| 6,943,067 | B2 | 9/2005 | Greenlaw |
| 6,943,407 | B2 | 9/2005 | Ouyang et al. |
| 6,949,421 | B1 | 9/2005 | Padmanabhan et al. |
| 6,953,956 | B2 | 10/2005 | Or-Bach et al. |
| 6,967,149 | B2 | 11/2005 | Meyer et al. |
| 6,985,012 | B2 | 1/2006 | Or-Bach |
| 6,989,687 | B2 | 1/2006 | Or-Bach |
| 6,995,430 | B2 | 2/2006 | Langdo et al. |
| 6,995,456 | B2 | 2/2006 | Nowak |
| 7,015,719 | B1 | 3/2006 | Feng et al. |
| 7,016,569 | B2 | 3/2006 | Mule et al. |
| 7,018,875 | B2 | 3/2006 | Madurawe |
| 7,019,557 | B2 | 3/2006 | Madurawe |
| 7,043,106 | B2 | 5/2006 | West et al. |
| 7,052,941 | B2 | 5/2006 | Lee |
| 7,064,579 | B2 | 6/2006 | Madurawe |
| 7,067,396 | B2 | 6/2006 | Aspar et al. |
| 7,067,909 | B2 | 6/2006 | Reif et al. |
| 7,068,070 | B2 | 6/2006 | Or-Bach |
| 7,068,072 | B2 | 6/2006 | New et al. |
| 7,078,739 | B1 | 7/2006 | Nemati et al. |
| 7,091,551 | B1 | 8/2006 | Anderson et al. |
| 7,094,667 | B1 | 8/2006 | Bower |
| 7,098,691 | B2 | 8/2006 | Or-Bach et al. |
| 7,105,390 | B2 | 9/2006 | Brask et al. |
| 7,105,871 | B2 | 9/2006 | Or-Bach et al. |
| 7,109,092 | B2 | 9/2006 | Tong |
| 7,110,629 | B2 | 9/2006 | Bjorkman et al. |
| 7,111,149 | B2 | 9/2006 | Eilert |
| 7,112,815 | B2 | 9/2006 | Frail |
| 7,115,945 | B2 | 10/2006 | Lee et al. |
| 7,115,966 | B2 | 10/2006 | Ido et al. |
| 7,141,853 | B2 | 11/2006 | Campbell et al. |
| 7,148,119 | B1 | 12/2006 | Sakaguchi et al. |
| 7,157,787 | B2 | 1/2007 | Kim et al. |
| 7,157,937 | B2 | 1/2007 | Apostol et al. |
| 7,166,520 | B1 | 1/2007 | Henley |
| 7,170,807 | B2 | 1/2007 | Fazan et al. |
| 7,173,369 | B2 | 2/2007 | Forrest et al. |
| 7,180,091 | B2 | 2/2007 | Yamazaki et al. |
| 7,180,379 | B1 | 2/2007 | Hopper et al. |
| 7,183,611 | B2 | 2/2007 | Bhattacharyya |
| 7,189,489 | B2 | 3/2007 | Kunimoto et al. |
| 7,205,204 | B2 | 4/2007 | Ogawa et al. |
| 7,209,384 | B1 | 4/2007 | Kim |
| 7,217,636 | B1 | 5/2007 | Atanackovic |
| 7,223,612 | B2 | 5/2007 | Sarma |
| 7,242,012 | B2 | 7/2007 | Leedy |

(56) References Cited

U.S. PATENT DOCUMENTS 7,245,002 B2 7/2007 Akino et al.
7,256,104 B2 8/2007 Ito et al.
7,259,091 B2 8/2007 Schuehrer et al.
7,265,421 B2 9/2007 Madurawe
7,271,420 B2 9/2007 Cao
7,274,207 B2 9/2007 Sugawara et al.
7,282,951 B2 10/2007 Huppenthal et al.
7,284,226 B1 10/2007 Kondapalli
7,296,201 B2 11/2007 Abramovici
7,304,355 B2 12/2007 Zhang
7,312,109 B2 12/2007 Madurawe
7,312,487 B2 12/2007 Alam et al.
7,314,788 B2 1/2008 Shaw
7,335,573 B2 2/2008 Takayama et al.
7,337,425 B2 2/2008 Kirk
7,338,884 B2 3/2008 Shimoto et al.
7,339,821 B2 3/2008 Walker
7,342,415 B2 3/2008 Teig et al.
7,351,644 B2 4/2008 Henley
7,358,601 B1 4/2008 Plants et al.
7,362,133 B2 4/2008 Madurawe
7,369,435 B2 5/2008 Forbes
7,371,660 B2 5/2008 Henley et al.
7,378,702 B2 5/2008 Lee
7,381,989 B2 6/2008 Kim
7,385,283 B2 6/2008 Wu
7,393,722 B1 7/2008 Issaq et al.
7,402,483 B2 7/2008 Yu et al.
7,402,897 B2 7/2008 Leedy
7,419,844 B2 9/2008 Lee et al.
7,432,185 B2 10/2008 Kim
7,436,027 B2 10/2008 Ogawa et al.
7,439,773 B2 10/2008 Or-Bach et al.
7,446,563 B2 11/2008 Madurawe
7,459,752 B2 12/2008 Doris et al.
7,459,763 B1 12/2008 Issaq et al.
7,459,772 B2 12/2008 Speers
7,463,062 B2 12/2008 Or-Bach et al.
7,463,502 B2 12/2008 Stipe
7,470,142 B2 12/2008 Lee
7,470,598 B2 12/2008 Lee
7,476,939 B2 1/2009 Okhonin et al.
7,477,540 B2 1/2009 Okhonin et al.
7,485,536 B2 2/2009 Jin et al.
7,485,968 B2 2/2009 Enquist et al.
7,486,563 B2 2/2009 Waller et al.
7,488,980 B2 2/2009 Takafuji et al.
7,492,632 B2 2/2009 Carman
7,495,473 B2 2/2009 McCollum et al.
7,498,675 B2 3/2009 Farnworth et al.
7,499,352 B2 3/2009 Singh
7,499,358 B2 3/2009 Bauser
7,508,034 B2 3/2009 Takafuji et al.
7,514,748 B2 4/2009 Fazan et al.
7,521,806 B2 4/2009 Trezza
7,525,186 B2 4/2009 Kim et al.
7,535,089 B2 5/2009 Fitzgerald
7,541,616 B2 6/2009 Fazan et al.
7,547,589 B2 6/2009 Iriguchi
7,553,745 B2 6/2009 Lim
7,557,367 B2 7/2009 Rogers et al.
7,558,141 B2 7/2009 Katsumata et al.
7,563,659 B2 7/2009 Kwon et al.
7,566,855 B2 7/2009 Olsen et al.
7,566,974 B2 7/2009 Konevecki
7,586,778 B2 9/2009 Ho et al.
7,589,375 B2 9/2009 Jang et al.
7,608,848 B2 10/2009 Ho et al.
7,612,411 B2 11/2009 Walker
7,615,462 B2 11/2009 Kim et al.
7,622,367 B1 11/2009 Nuzzo et al.
7,629,640 B2 12/2009 She et al.
7,632,738 B2 12/2009 Lee
7,633,162 B2 12/2009 Lee
7,638,836 B2 12/2009 Walker
7,666,723 B2 2/2010 Frank et al.
7,670,912 B2 3/2010 Yeo
7,671,371 B2 3/2010 Lee
7,671,460 B2 3/2010 Lauxtermann et al.
7,674,687 B2 3/2010 Henley
7,687,372 B2 3/2010 Jain
7,687,872 B2 3/2010 Cazaux
7,688,619 B2 3/2010 Lung et al.
7,692,202 B2 4/2010 Bensch
7,692,448 B2 4/2010 Solomon
7,692,944 B2 4/2010 Bernstein et al.
7,697,316 B2 4/2010 Lai et al.
7,709,932 B2 5/2010 Nemoto et al.
7,718,508 B2 5/2010 Lee
7,719,876 B2 5/2010 Chevallier et al.
7,723,207 B2 5/2010 Alam et al.
7,728,326 B2 6/2010 Yamazaki et al.
7,732,301 B1 6/2010 Pinnington et al.
7,741,673 B2 6/2010 Tak et al.
7,742,331 B2 6/2010 Watanabe
7,745,250 B2 6/2010 Han
7,749,884 B2 7/2010 Mathew et al.
7,750,669 B2 7/2010 Spangaro
7,755,622 B2 7/2010 Yvon
7,759,043 B2 7/2010 Tanabe et al.
7,768,115 B2 8/2010 Lee et al.
7,772,039 B2 8/2010 Kerber
7,772,096 B2 8/2010 DeSouza et al.
7,774,735 B1 8/2010 Sood
7,776,715 B2 8/2010 Wells et al.
7,777,269 B2 8/2010 Walker
7,777,330 B2 8/2010 Pelley et al.
7,786,460 B2 8/2010 Lung et al.
7,786,535 B2 8/2010 Abou-Khalil et al.
7,790,524 B2 9/2010 Abadeer et al.
7,795,619 B2 9/2010 Hara
7,799,675 B2 9/2010 Lee
7,800,099 B2 9/2010 Yamazaki et al.
7,800,148 B2 9/2010 Lee et al.
7,800,163 B2 9/2010 Izumi et al.
7,800,199 B2 9/2010 Oh et al.
7,816,721 B2 10/2010 Yamazaki
7,843,718 B2 11/2010 Koh et al.
7,846,814 B2 12/2010 Lee
7,851,844 B2 12/2010 Van der Zanden et al.
7,863,095 B2 1/2011 Sasaki et al.
7,864,568 B2 1/2011 Fujisaki et al.
7,867,822 B2 1/2011 Lee
7,888,764 B2 2/2011 Lee
7,910,432 B2 3/2011 Tanaka et al.
7,915,164 B2 3/2011 Konevecki et al.
7,919,845 B2 4/2011 Karp
7,965,102 B1 6/2011 Bauer et al.
7,968,965 B2 6/2011 Kim
7,969,193 B1 6/2011 Wu et al.
7,973,314 B2 7/2011 Yang
7,982,250 B2 7/2011 Yamazaki et al.
7,983,065 B2 7/2011 Samachisa
8,008,732 B2 8/2011 Kiyotoshi
8,013,399 B2 9/2011 Thomas et al.
8,014,166 B2 9/2011 Yazdani
8,014,195 B2 9/2011 Okhonin et al.
8,022,493 B2 9/2011 Bang
8,030,780 B2 10/2011 Kirby et al.
8,031,544 B2 10/2011 Kim et al.
8,032,857 B2 10/2011 McIlrath
8,044,448 B2 10/2011 Kamigaichi et al.
8,044,464 B2 10/2011 Yamazaki et al.
8,068,364 B2 11/2011 Maejima
8,106,520 B2 1/2012 Keeth et al.
8,107,276 B2 1/2012 Breitwisch et al.
8,129,256 B2 3/2012 Farooq et al.
8,129,258 B2 3/2012 Hosier et al.
8,130,547 B2 3/2012 Widjaja et al.
8,136,071 B2 3/2012 Solomon
8,138,502 B2 3/2012 Nakamura et al.
8,153,520 B1 4/2012 Chandrashekar
8,158,515 B2 4/2012 Farooq et al.
8,178,919 B2 5/2012 Fujiwara et al.

(56) References Cited

U.S. PATENT DOCUMENTS

| | | | |
|---|---|---|---|
| 8,183,630 | B2 | 5/2012 | Batude et al. |
| 8,184,463 | B2 | 5/2012 | Saen et al. |
| 8,185,685 | B2 | 5/2012 | Selinger |
| 8,203,187 | B2 | 6/2012 | Lung et al. |
| 8,208,279 | B2 | 6/2012 | Lue |
| 8,209,649 | B2 | 6/2012 | McIlrath |
| 8,228,684 | B2 | 7/2012 | Losavio et al. |
| 8,266,560 | B2 | 8/2012 | McIlrath |
| 8,264,065 | B2 | 9/2012 | Su et al. |
| 8,288,816 | B2 | 10/2012 | Komori et al. |
| 8,294,199 | B2 | 10/2012 | Yahashi et al. |
| 8,324,680 | B2 | 12/2012 | Izumi et al. |
| 8,338,882 | B2 | 12/2012 | Tanaka et al. |
| 8,343,851 | B2 | 1/2013 | Kim et al. |
| 8,354,308 | B2 | 1/2013 | Kang et al. |
| 8,355,273 | B2 | 1/2013 | Liu |
| 8,374,033 | B2 | 2/2013 | Kito et al. |
| 8,426,294 | B2 | 4/2013 | Lung et al. |
| 8,432,719 | B2 | 4/2013 | Lue |
| 8,432,751 | B2 | 4/2013 | Hafez |
| 8,455,941 | B2 | 6/2013 | Ishihara et al. |
| 8,470,689 | B2 | 6/2013 | Desplobain et al. |
| 8,497,512 | B2 | 7/2013 | Nakamura et al. |
| 8,501,564 | B2 | 8/2013 | Suzawa |
| 8,507,972 | B2 | 8/2013 | Oota et al. |
| 8,508,994 | B2 | 8/2013 | Okhonin |
| 8,513,725 | B2 | 8/2013 | Sakuma et al. |
| 8,514,623 | B2 | 8/2013 | Widjaja et al. |
| 8,516,408 | B2 | 8/2013 | Dell |
| 8,566,762 | B2 | 8/2013 | Morimoto et al. |
| 8,525,342 | B2 | 10/2013 | Chandrasekaran |
| 8,546,956 | B2 | 10/2013 | Nguyen |
| 8,603,888 | B2 | 12/2013 | Liu |
| 8,611,388 | B2 | 12/2013 | Krasulick et al. |
| 8,619,490 | B2 | 12/2013 | Yu |
| 8,630,326 | B2 | 1/2014 | Krasulick et al. |
| 8,643,162 | B2 | 2/2014 | Madurawe |
| 8,650,516 | B2 | 2/2014 | McIlrath |
| 8,654,584 | B2 | 2/2014 | Kim et al. |
| 8,679,861 | B2 | 3/2014 | Bose |
| 8,736,068 | B2 | 5/2014 | Bartley et al. |
| 8,773,562 | B1 | 7/2014 | Fan |
| 8,775,998 | B2 | 7/2014 | Morimoto |
| 8,796,777 | B2 | 8/2014 | Song et al. |
| 8,824,183 | B2 | 9/2014 | Samachisa et al. |
| 8,841,777 | B2 | 9/2014 | Farooq |
| 8,853,785 | B2 | 10/2014 | Augendre |
| 8,896,054 | B2 | 11/2014 | Sakuma et al. |
| 8,928,119 | B2 | 1/2015 | Leedy |
| 8,971,114 | B2 | 3/2015 | Kang |
| 9,105,689 | B1 | 8/2015 | Fanelli |
| 9,172,008 | B2 | 10/2015 | Hwang |
| 9,227,456 | B2 | 1/2016 | Chien |
| 9,230,973 | B2 | 1/2016 | Pachamuthu et al. |
| 9,269,608 | B2 | 2/2016 | Fanelli |
| 9,334,582 | B2 | 5/2016 | See |
| 9,391,090 | B2 | 7/2016 | Manorotkul et al. |
| 9,472,568 | B2 | 10/2016 | Shin et al. |
| 9,564,450 | B2 | 2/2017 | Sakuma et al. |
| 9,570,683 | B1 | 2/2017 | Jo |
| 9,589,982 | B1 | 3/2017 | Cheng et al. |
| 9,595,530 | B1 | 3/2017 | Zhou |
| 9,627,287 | B2 | 4/2017 | Engelhardt et al. |
| 9,673,257 | B1 | 6/2017 | Takaki |
| 9,997,530 | B2 | 6/2018 | Yon et al. |
| 10,199,354 | B2 | 2/2019 | Modi et al. |
| 10,666,264 | B1 * | 5/2020 | Brewer .............. H01L 27/2436 |
| 2001/0000005 | A1 | 3/2001 | Forrest et al. |
| 2001/0014391 | A1 | 8/2001 | Forrest et al. |
| 2001/0028059 | A1 | 10/2001 | Emma et al. |
| 2002/0024140 | A1 | 2/2002 | Nakajima et al. |
| 2002/0025604 | A1 | 2/2002 | Tiwari |
| 2002/0074668 | A1 | 6/2002 | Hofstee et al. |
| 2002/0081823 | A1 | 6/2002 | Cheung et al. |
| 2002/0090758 | A1 | 7/2002 | Henley et al. |
| 2002/0096681 | A1 | 7/2002 | Yamazaki et al. |
| 2002/0113289 | A1 | 8/2002 | Cordes et al. |
| 2002/0132465 | A1 | 9/2002 | Leedy |
| 2002/0140091 | A1 | 10/2002 | Callahan |
| 2002/0141233 | A1 | 10/2002 | Hosotani et al. |
| 2002/0153243 | A1 | 10/2002 | Forrest et al. |
| 2002/0153569 | A1 | 10/2002 | Katayama |
| 2002/0175401 | A1 | 11/2002 | Huang et al. |
| 2002/0180069 | A1 | 12/2002 | Houston |
| 2002/0190232 | A1 | 12/2002 | Chason |
| 2002/0199110 | A1 | 12/2002 | Kean |
| 2003/0015713 | A1 | 1/2003 | Yoo |
| 2003/0032262 | A1 | 2/2003 | Dennison et al. |
| 2003/0059999 | A1 | 3/2003 | Gonzalez |
| 2003/0060034 | A1 | 3/2003 | Beyne et al. |
| 2003/0061555 | A1 | 3/2003 | Kamei |
| 2003/0067043 | A1 | 4/2003 | Zhang |
| 2003/0076706 | A1 | 4/2003 | Andoh |
| 2003/0102079 | A1 | 6/2003 | Kalvesten et al. |
| 2003/0107117 | A1 | 6/2003 | Antonelli et al. |
| 2003/0113963 | A1 | 6/2003 | Wurzer |
| 2003/0119279 | A1 | 6/2003 | Enquist |
| 2003/0139011 | A1 | 7/2003 | Cleeves et al. |
| 2003/0153163 | A1 | 8/2003 | Letertre |
| 2003/0157748 | A1 | 8/2003 | Kim et al. |
| 2003/0160888 | A1 | 8/2003 | Yoshikawa |
| 2003/0173631 | A1 | 9/2003 | Murakami |
| 2003/0206036 | A1 | 11/2003 | Or-Bach |
| 2003/0213967 | A1 | 11/2003 | Forrest et al. |
| 2003/0224582 | A1 | 12/2003 | Shimoda et al. |
| 2003/0224596 | A1 | 12/2003 | Marxsen et al. |
| 2004/0007376 | A1 | 1/2004 | Urdahl et al. |
| 2004/0014299 | A1 | 1/2004 | Moriceau et al. |
| 2004/0033676 | A1 | 2/2004 | Coronel et al. |
| 2004/0036126 | A1 | 2/2004 | Chau et al. |
| 2004/0047539 | A1 | 3/2004 | Okubora et al. |
| 2004/0061176 | A1 | 4/2004 | Takafuji et al. |
| 2004/0113207 | A1 | 6/2004 | Hsu et al. |
| 2004/0143797 | A1 | 7/2004 | Nguyen |
| 2004/0150068 | A1 | 8/2004 | Leedy |
| 2004/0150070 | A1 | 8/2004 | Okada |
| 2004/0152272 | A1 | 8/2004 | Fladre et al. |
| 2004/0155301 | A1 | 8/2004 | Zhang |
| 2004/0156172 | A1 | 8/2004 | Lin et al. |
| 2004/0156233 | A1 | 8/2004 | Bhattacharyya |
| 2004/0164425 | A1 | 8/2004 | Urakawa |
| 2004/0166649 | A1 | 8/2004 | Bressot et al. |
| 2004/0174732 | A1 | 9/2004 | Morimoto |
| 2004/0175902 | A1 | 9/2004 | Rayssac et al. |
| 2004/0178819 | A1 | 9/2004 | New |
| 2004/0195572 | A1 | 10/2004 | Kato et al. |
| 2004/0219765 | A1 | 11/2004 | Reif et al. |
| 2004/0229444 | A1 | 11/2004 | Couillard |
| 2004/0259312 | A1 | 12/2004 | Schlosser et al. |
| 2004/0262635 | A1 | 12/2004 | Lee |
| 2004/0262772 | A1 | 12/2004 | Ramanathan et al. |
| 2005/0003592 | A1 | 1/2005 | Jones |
| 2005/0010725 | A1 | 1/2005 | Eilert |
| 2005/0023656 | A1 | 2/2005 | Leedy |
| 2005/0045919 | A1 | 3/2005 | Kaeriyama et al. |
| 2005/0067620 | A1 | 3/2005 | Chan et al. |
| 2005/0067625 | A1 | 3/2005 | Hata |
| 2005/0073060 | A1 | 4/2005 | Datta et al. |
| 2005/0082526 | A1 | 4/2005 | Bedell et al. |
| 2005/0098822 | A1 | 5/2005 | Mathew |
| 2005/0110041 | A1 | 5/2005 | Boutros et al. |
| 2005/0121676 | A1 | 6/2005 | Fried et al. |
| 2005/0121789 | A1 | 6/2005 | Madurawe |
| 2005/0130351 | A1 | 6/2005 | Leedy |
| 2005/0130429 | A1 | 6/2005 | Rayssac et al. |
| 2005/0148137 | A1 | 7/2005 | Brask et al. |
| 2005/0176174 | A1 | 8/2005 | Leedy |
| 2005/0218521 | A1 | 10/2005 | Lee |
| 2005/0225237 | A1 | 10/2005 | Winters |
| 2005/0266659 | A1 | 12/2005 | Ghyselen et al. |
| 2005/0273749 | A1 | 12/2005 | Kirk |
| 2005/0280061 | A1 | 12/2005 | Lee |
| 2005/0280090 | A1 | 12/2005 | Anderson et al. |
| 2005/0280154 | A1 | 12/2005 | Lee |

(56) References Cited

U.S. PATENT DOCUMENTS

| | | | |
|---|---|---|---|
| 2005/0280155 | A1 | 12/2005 | Lee |
| 2005/0280156 | A1 | 12/2005 | Lee |
| 2005/0282019 | A1 | 12/2005 | Fukushima et al. |
| 2006/0014331 | A1 | 1/2006 | Tang et al. |
| 2006/0024923 | A1 | 2/2006 | Sarma et al. |
| 2006/0033110 | A1 | 2/2006 | Alam et al. |
| 2006/0033124 | A1 | 2/2006 | Or-Bach et al. |
| 2006/0043367 | A1 | 2/2006 | Chang et al. |
| 2006/0049449 | A1 | 3/2006 | Iino |
| 2006/0065953 | A1 | 3/2006 | Kim et al. |
| 2006/0067122 | A1 | 3/2006 | Verhoeven |
| 2006/0071322 | A1 | 4/2006 | Kitamura |
| 2006/0071332 | A1 | 4/2006 | Speers |
| 2006/0083280 | A1 | 4/2006 | Tauzin et al. |
| 2006/0108613 | A1 | 5/2006 | Song |
| 2006/0108627 | A1 | 5/2006 | Choi et al. |
| 2006/0113522 | A1 | 6/2006 | Lee et al. |
| 2006/0118935 | A1 | 6/2006 | Kamiyama et al. |
| 2006/0121690 | A1 | 6/2006 | Pogge et al. |
| 2006/0150137 | A1 | 7/2006 | Madurawe. |
| 2006/0158511 | A1 | 7/2006 | Harrold |
| 2006/0170046 | A1 | 8/2006 | Hara |
| 2006/0179417 | A1 | 8/2006 | Madurawe |
| 2006/0181202 | A1 | 8/2006 | Liao et al. |
| 2006/0189095 | A1 | 8/2006 | Ghyselen et al. |
| 2006/0194401 | A1 | 8/2006 | Hu et al. |
| 2006/0195729 | A1 | 8/2006 | Huppenthal et al. |
| 2006/0207087 | A1 | 9/2006 | Jafri et al. |
| 2006/0224814 | A1 | 10/2006 | Kim et al. |
| 2006/0237777 | A1 | 10/2006 | Choi |
| 2006/0249859 | A1 | 11/2006 | Eiles et al. |
| 2006/0275962 | A1 | 12/2006 | Lee |
| 2007/0004150 | A1 | 1/2007 | Huang |
| 2007/0008013 | A1 | 1/2007 | Fijany et al. |
| 2007/0014508 | A1 | 1/2007 | Chen et al. |
| 2007/0035329 | A1 | 2/2007 | Madurawe |
| 2007/0063259 | A1 | 3/2007 | Derderian et al. |
| 2007/0072391 | A1 | 3/2007 | Pocas et al. |
| 2007/0076509 | A1 | 4/2007 | Zhang |
| 2007/0077694 | A1 | 4/2007 | Lee |
| 2007/0077743 | A1 | 4/2007 | Rao et al. |
| 2007/0090416 | A1 | 4/2007 | Doyle et al. |
| 2007/0102737 | A1 | 5/2007 | Kashiwabara et al. |
| 2007/0103191 | A1 | 5/2007 | Sugawara et al. |
| 2007/0108523 | A1 | 5/2007 | Ogawa et al. |
| 2007/0109831 | A1 | 5/2007 | RaghuRam |
| 2007/0111386 | A1 | 5/2007 | Kim et al. |
| 2007/0111406 | A1 | 5/2007 | Joshi et al. |
| 2007/0132049 | A1 | 6/2007 | Stipe |
| 2007/0132369 | A1 | 6/2007 | Forrest et al. |
| 2007/0135013 | A1 | 6/2007 | Faris |
| 2007/0141781 | A1 | 6/2007 | Park |
| 2007/0158659 | A1 | 7/2007 | Bensce |
| 2007/0158831 | A1 | 7/2007 | Cha et al. |
| 2007/0176214 | A1 | 8/2007 | Kwon et al. |
| 2007/0187775 | A1 | 8/2007 | Okhonin et al. |
| 2007/0190746 | A1 | 8/2007 | Ito et al. |
| 2007/0194453 | A1 | 8/2007 | Chakraborty et al. |
| 2007/0206408 | A1 | 9/2007 | Schwerin |
| 2007/0210336 | A1 | 9/2007 | Madurawe |
| 2007/0211535 | A1 | 9/2007 | Kim |
| 2007/0215903 | A1 | 9/2007 | Sakamoto et al. |
| 2007/0218622 | A1 | 9/2007 | Lee et al. |
| 2007/0228383 | A1 | 10/2007 | Bernstein et al. |
| 2007/0252201 | A1 | 11/2007 | Kito et al. |
| 2007/0252203 | A1 | 11/2007 | Zhu et al. |
| 2007/0262457 | A1 | 11/2007 | Lin |
| 2007/0275520 | A1 | 11/2007 | Suzuki |
| 2007/0281439 | A1 | 12/2007 | Bedell et al. |
| 2007/0283298 | A1 | 12/2007 | Bernstein et al. |
| 2007/0287224 | A1 | 12/2007 | Alam et al. |
| 2007/0296073 | A1 | 12/2007 | Wu |
| 2007/0297232 | A1 | 12/2007 | Iwata |
| 2008/0001204 | A1 | 1/2008 | Lee |
| 2008/0003818 | A1 | 1/2008 | Seidel et al. |
| 2008/0030228 | A1 | 2/2008 | Amarilio |
| 2008/0032463 | A1 | 2/2008 | Lee |
| 2008/0038902 | A1 | 2/2008 | Lee |
| 2008/0048239 | A1 | 2/2008 | Huo |
| 2008/0048327 | A1 | 2/2008 | Lee |
| 2008/0054359 | A1 | 3/2008 | Yang et al. |
| 2008/0067573 | A1 | 3/2008 | Jang et al. |
| 2008/0070340 | A1 | 3/2008 | Borrelli et al. |
| 2008/0072182 | A1 | 3/2008 | He et al. |
| 2008/0099780 | A1 | 5/2008 | Tran |
| 2008/0099819 | A1 | 5/2008 | Kito et al. |
| 2008/0108171 | A1 | 5/2008 | Rogers et al. |
| 2008/0123418 | A1 | 5/2008 | Widjaja |
| 2008/0124845 | A1 | 5/2008 | Yu et al. |
| 2008/0128745 | A1 | 6/2008 | Mastro et al. |
| 2008/0128780 | A1 | 6/2008 | Nishihara |
| 2008/0135949 | A1 | 6/2008 | Lo et al. |
| 2008/0136455 | A1 | 6/2008 | Diamant et al. |
| 2008/0142937 | A1 | 6/2008 | Chen et al. |
| 2008/0142959 | A1 | 6/2008 | DeMulder et al. |
| 2008/0143379 | A1 | 6/2008 | Norman |
| 2008/0150579 | A1 | 6/2008 | Madurawe |
| 2008/0160431 | A1 | 7/2008 | Scott et al. |
| 2008/0160726 | A1 | 7/2008 | Lim et al. |
| 2008/0165521 | A1 | 7/2008 | Bernstein et al. |
| 2008/0175032 | A1 | 7/2008 | Tanaka et al. |
| 2008/0179678 | A1 | 7/2008 | Dyer et al. |
| 2008/0180132 | A1 | 7/2008 | Ishikawa |
| 2008/0185648 | A1 | 8/2008 | Jeong |
| 2008/0191247 | A1 | 8/2008 | Yin et al. |
| 2008/0191312 | A1 | 8/2008 | Oh et al. |
| 2008/0194068 | A1 | 8/2008 | Temmler et al. |
| 2008/0203452 | A1 | 8/2008 | Moon et al. |
| 2008/0213982 | A1 | 9/2008 | Park et al. |
| 2008/0220558 | A1 | 9/2008 | Zehavi et al. |
| 2008/0220565 | A1 | 9/2008 | Hsu et al. |
| 2008/0224260 | A1 | 9/2008 | Schmit et al. |
| 2008/0237591 | A1 | 10/2008 | Leedy |
| 2008/0239818 | A1 | 10/2008 | Mokhlesi |
| 2008/0242028 | A1 | 10/2008 | Mokhlesi |
| 2008/0248618 | A1 | 10/2008 | Ahn et al. |
| 2008/0251862 | A1 | 10/2008 | Fonash et al. |
| 2008/0254561 | A2 | 10/2008 | Yoo |
| 2008/0254572 | A1 | 10/2008 | Leedy |
| 2008/0254623 | A1 | 10/2008 | Chan |
| 2008/0261378 | A1 | 10/2008 | Yao et al. |
| 2008/0266960 | A1 | 10/2008 | Kuo |
| 2008/0272492 | A1 | 11/2008 | Tsang |
| 2008/0277778 | A1 | 11/2008 | Furman et al. |
| 2008/0283873 | A1 | 11/2008 | Yang |
| 2008/0283875 | A1 | 11/2008 | Mukasa et al. |
| 2008/0284611 | A1 | 11/2008 | Leedy |
| 2008/0296681 | A1 | 12/2008 | Georgakos et al. |
| 2008/0315253 | A1 | 12/2008 | Yuan |
| 2008/0315351 | A1 | 12/2008 | Kakehata |
| 2009/0001469 | A1 | 1/2009 | Yoshida et al. |
| 2009/0001504 | A1 | 1/2009 | Takei et al. |
| 2009/0016716 | A1 | 1/2009 | Ishida |
| 2009/0026541 | A1 | 1/2009 | Chung |
| 2009/0026618 | A1 | 1/2009 | Kim |
| 2009/0032899 | A1 | 2/2009 | Irie |
| 2009/0032951 | A1 | 2/2009 | Andry et al. |
| 2009/0039918 | A1 | 2/2009 | Madurawe |
| 2009/0052827 | A1 | 2/2009 | Durfee et al. |
| 2009/0055789 | A1 | 2/2009 | McIlrath |
| 2009/0057879 | A1 | 3/2009 | Garrou et al. |
| 2009/0061572 | A1 | 3/2009 | Hareland et al. |
| 2009/0064058 | A1 | 3/2009 | McIlrath |
| 2009/0065827 | A1 | 3/2009 | Hwang |
| 2009/0066365 | A1 | 3/2009 | Solomon |
| 2009/0066366 | A1 | 3/2009 | Solomon |
| 2009/0070721 | A1 | 3/2009 | Solomon |
| 2009/0070727 | A1 | 3/2009 | Solomon |
| 2009/0078970 | A1 | 3/2009 | Yamazaki |
| 2009/0079000 | A1 | 3/2009 | Yamazaki et al. |
| 2009/0080258 | A1 | 3/2009 | Walker |
| 2009/0081848 | A1 | 3/2009 | Erokhin |
| 2009/0087759 | A1 | 4/2009 | Matsumoto et al. |
| 2009/0096009 | A1 | 4/2009 | Dong et al. |

(56) References Cited

U.S. PATENT DOCUMENTS

| | | | |
|---|---|---|---|
| 2009/0096024 | A1 | 4/2009 | Shingu et al. |
| 2009/0108318 | A1 | 4/2009 | Yoon et al. |
| 2009/0115042 | A1 | 5/2009 | Koyanagi |
| 2009/0128189 | A1 | 5/2009 | Madurawe et al. |
| 2009/0134397 | A1 | 5/2009 | Yokoi et al. |
| 2009/0144669 | A1 | 6/2009 | Bose et al. |
| 2009/0144678 | A1 | 6/2009 | Bose et al. |
| 2009/0146172 | A1 | 6/2009 | Pumyea |
| 2009/0159870 | A1 | 6/2009 | Lin et al. |
| 2009/0160482 | A1 | 6/2009 | Karp et al. |
| 2009/0161401 | A1 | 6/2009 | Bigler et al. |
| 2009/0162993 | A1 | 6/2009 | Yui et al. |
| 2009/0166627 | A1 | 7/2009 | Han |
| 2009/0174018 | A1 | 7/2009 | Dungan |
| 2009/0179268 | A1 | 7/2009 | Abou-Khalil et al. |
| 2009/0185407 | A1 | 7/2009 | Park |
| 2009/0194152 | A1 | 8/2009 | Liu et al. |
| 2009/0194768 | A1 | 8/2009 | Leedy |
| 2009/0194829 | A1 | 8/2009 | Chung |
| 2009/0194836 | A1 | 8/2009 | Kim |
| 2009/0204933 | A1 | 8/2009 | Rezgui |
| 2009/0212317 | A1 | 8/2009 | Kolodin et al. |
| 2009/0218627 | A1 | 9/2009 | Zhu |
| 2009/0221110 | A1 | 9/2009 | Lee et al. |
| 2009/0224330 | A1 | 9/2009 | Hong |
| 2009/0224364 | A1 | 9/2009 | Oh et al. |
| 2009/0230462 | A1 | 9/2009 | Tanaka et al. |
| 2009/0234331 | A1 | 9/2009 | Langereis et al. |
| 2009/0236749 | A1 | 9/2009 | Otemba et al. |
| 2009/0242893 | A1 | 10/2009 | Tomiyasu |
| 2009/0242935 | A1 | 10/2009 | Fitzgerald |
| 2009/0250686 | A1 | 10/2009 | Sato et al. |
| 2009/0262572 | A1 | 10/2009 | Krusin-Elbaum |
| 2009/0262583 | A1 | 10/2009 | Lue |
| 2009/0263942 | A1 | 10/2009 | Ohnuma et al. |
| 2009/0267233 | A1 | 10/2009 | Lee |
| 2009/0268983 | A1 | 10/2009 | Stone et al. |
| 2009/0272989 | A1 | 11/2009 | Shum et al. |
| 2009/0290434 | A1 | 11/2009 | Kurjanowicz |
| 2009/0294822 | A1 | 12/2009 | Batude et al. |
| 2009/0294836 | A1 | 12/2009 | Kiyotoshi |
| 2009/0294861 | A1 | 12/2009 | Thomas et al. |
| 2009/0294990 | A1 | 12/2009 | Ishino et al. |
| 2009/0302294 | A1 | 12/2009 | Kim |
| 2009/0302387 | A1 | 12/2009 | Joshi et al. |
| 2009/0302394 | A1 | 12/2009 | Fujita |
| 2009/0309152 | A1 | 12/2009 | Knoefler et al. |
| 2009/0315095 | A1 | 12/2009 | Kim |
| 2009/0317950 | A1 | 12/2009 | Okihara |
| 2009/0321830 | A1 | 12/2009 | Maly |
| 2009/0321853 | A1 | 12/2009 | Cheng |
| 2009/0321948 | A1 | 12/2009 | Wang et al. |
| 2009/0325343 | A1 | 12/2009 | Lee |
| 2010/0001282 | A1 | 1/2010 | Mieno |
| 2010/0013049 | A1 | 1/2010 | Tanaka |
| 2010/0025766 | A1 | 2/2010 | Nuttinck et al. |
| 2010/0025825 | A1 | 2/2010 | DeGraw et al. |
| 2010/0031217 | A1 | 2/2010 | Sinha et al. |
| 2010/0032635 | A1 | 2/2010 | Schwerin |
| 2010/0038699 | A1 | 2/2010 | Katsumata et al. |
| 2010/0038743 | A1 | 2/2010 | Lee |
| 2010/0045849 | A1 | 2/2010 | Yamasaki |
| 2010/0052134 | A1 | 3/2010 | Werner et al. |
| 2010/0058580 | A1 | 3/2010 | Yazdani |
| 2010/0059796 | A1 | 3/2010 | Scheuerlein |
| 2010/0059864 | A1 | 3/2010 | Mahler et al. |
| 2010/0078770 | A1 | 4/2010 | Purushothaman et al. |
| 2010/0081232 | A1 | 4/2010 | Furman et al. |
| 2010/0089627 | A1 | 4/2010 | Huang et al. |
| 2010/0090188 | A1 | 4/2010 | Fatasuyama |
| 2010/0112753 | A1 | 5/2010 | Lee |
| 2010/0112810 | A1 | 5/2010 | Lee et al. |
| 2010/0117048 | A1 | 5/2010 | Lung et al. |
| 2010/0123202 | A1 | 5/2010 | Hofmann |
| 2010/0123480 | A1 | 5/2010 | Kitada et al. |
| 2010/0133695 | A1 | 6/2010 | Lee |
| 2010/0133704 | A1 | 6/2010 | Marimuthu et al. |
| 2010/0137143 | A1 | 6/2010 | Rothberg et al. |
| 2010/0139836 | A1 | 6/2010 | Horikoshi |
| 2010/0140790 | A1 | 6/2010 | Setiadi et al. |
| 2010/0155932 | A1 | 6/2010 | Gambino |
| 2010/0157117 | A1 | 6/2010 | Wang |
| 2010/0159650 | A1 | 6/2010 | Song |
| 2010/0181600 | A1 | 7/2010 | Law |
| 2010/0190334 | A1 | 7/2010 | Lee |
| 2010/0193884 | A1 | 8/2010 | Park et al. |
| 2010/0193964 | A1 | 8/2010 | Farooq et al. |
| 2010/0219392 | A1 | 9/2010 | Awaya |
| 2010/0221867 | A1 | 9/2010 | Bedell et al. |
| 2010/0224876 | A1 | 9/2010 | Zhu |
| 2010/0224915 | A1 | 9/2010 | Kawashima et al. |
| 2010/0225002 | A1 | 9/2010 | Law et al. |
| 2010/0232200 | A1 | 9/2010 | Shepard |
| 2010/0252934 | A1 | 10/2010 | Law |
| 2010/0264551 | A1 | 10/2010 | Farooq |
| 2010/0276662 | A1 | 11/2010 | Colinge |
| 2010/0289144 | A1 | 11/2010 | Farooq |
| 2010/0297844 | A1 | 11/2010 | Yelehanka |
| 2010/0307572 | A1 | 12/2010 | Bedell et al. |
| 2010/0308211 | A1 | 12/2010 | Cho et al. |
| 2010/0308863 | A1 | 12/2010 | Gliese et al. |
| 2010/0320514 | A1 | 12/2010 | Tredwell |
| 2010/0320526 | A1 | 12/2010 | Kidoh et al. |
| 2010/0330728 | A1 | 12/2010 | McCarten |
| 2010/0330752 | A1 | 12/2010 | Jeong |
| 2011/0001172 | A1 | 1/2011 | Lee |
| 2011/0003438 | A1 | 1/2011 | Lee |
| 2011/0024724 | A1 | 2/2011 | Frolov et al. |
| 2011/0026263 | A1 | 2/2011 | Xu |
| 2011/0027967 | A1 | 2/2011 | Beyne |
| 2011/0037052 | A1 | 2/2011 | Schmidt et al. |
| 2011/0042696 | A1 | 2/2011 | Smith et al. |
| 2011/0049336 | A1 | 3/2011 | Matsunuma |
| 2011/0050125 | A1 | 3/2011 | Medendorp et al. |
| 2011/0053332 | A1 | 3/2011 | Lee |
| 2011/0101537 | A1 | 5/2011 | Barth et al. |
| 2011/0102014 | A1 | 5/2011 | Madurawe |
| 2011/0111560 | A1 | 5/2011 | Purushothaman |
| 2011/0115023 | A1 | 5/2011 | Cheng |
| 2011/0128777 | A1 | 6/2011 | Yamazaki |
| 2011/0134683 | A1 | 6/2011 | Yamazaki |
| 2011/0143506 | A1 | 6/2011 | Lee |
| 2011/0147791 | A1 | 6/2011 | Norman et al. |
| 2011/0147849 | A1 | 6/2011 | Augendre et al. |
| 2011/0159635 | A1 | 6/2011 | Doan et al. |
| 2011/0170331 | A1 | 7/2011 | Oh |
| 2011/0204917 | A1 | 8/2011 | O'Neill |
| 2011/0221022 | A1 | 9/2011 | Toda |
| 2011/0222356 | A1 | 9/2011 | Banna |
| 2011/0227158 | A1 | 9/2011 | Zhu |
| 2011/0241082 | A1 | 10/2011 | Bernstein et al. |
| 2011/0284946 | A1 | 11/2011 | Kiyotoshi |
| 2011/0284992 | A1 | 11/2011 | Zhu |
| 2011/0286283 | A1 | 11/2011 | Lung et al. |
| 2011/0304765 | A1 | 12/2011 | Yogo et al. |
| 2011/0309432 | A1 | 12/2011 | Ishihara et al. |
| 2011/0314437 | A1 | 12/2011 | McIlrath |
| 2012/0001184 | A1 | 1/2012 | Ha et al. |
| 2012/0003815 | A1 | 1/2012 | Lee |
| 2012/0013013 | A1 | 1/2012 | Sadaka et al. |
| 2012/0025388 | A1 | 2/2012 | Law et al. |
| 2012/0032250 | A1 | 2/2012 | Son et al. |
| 2012/0034759 | A1 | 2/2012 | Sakaguchi et al. |
| 2012/0063090 | A1 | 3/2012 | Hsiao et al. |
| 2012/0074466 | A1 | 3/2012 | Setiadi et al. |
| 2012/0086100 | A1 | 4/2012 | Andry |
| 2012/0126197 | A1 | 5/2012 | Chung |
| 2012/0146193 | A1 | 6/2012 | Stuber et al. |
| 2012/0161310 | A1 | 6/2012 | Brindle et al. |
| 2012/0169319 | A1 | 7/2012 | Dennard |
| 2012/0178211 | A1 | 7/2012 | Hebert |
| 2012/0181654 | A1 | 7/2012 | Lue |
| 2012/0182801 | A1 | 7/2012 | Lue |
| 2012/0187444 | A1 | 7/2012 | Oh |

(56) References Cited

U.S. PATENT DOCUMENTS

2012/0193785 A1 8/2012 Lin
2012/0241919 A1 9/2012 Mitani
2012/0286822 A1 11/2012 Madurawe
2012/0304142 A1 11/2012 Morimoto
2012/0317528 A1 12/2012 McIlrath
2012/0319728 A1 12/2012 Madurawe
2013/0026663 A1 1/2013 Radu et al.
2013/0037802 A1 2/2013 England
2013/0049796 A1 2/2013 Pang
2013/0070506 A1 3/2013 Kajigaya
2013/0082235 A1 4/2013 Gu et al.
2013/0097574 A1 4/2013 Balabanov et al.
2013/0100743 A1 4/2013 Lue
2013/0128666 A1 5/2013 Avila
2013/0187720 A1 7/2013 Ishii
2013/0193550 A1 8/2013 Sklenard et al.
2013/0196500 A1 8/2013 Batude et al.
2013/0203248 A1 8/2013 Ernst et al.
2013/0207243 A1 8/2013 Fuergut et al.
2013/0263393 A1 10/2013 Mazumder
2013/0337601 A1 12/2013 Kapur
2014/0015136 A1 1/2014 Gan et al.
2014/0030871 A1 1/2014 Arriagada et al.
2014/0035616 A1 2/2014 Oda et al.
2014/0048867 A1 2/2014 Toh
2014/0099761 A1 4/2014 Kim et al.
2014/0103959 A1 4/2014 Andreev
2014/0117413 A1 5/2014 Madurawe
2014/0120695 A1 5/2014 Ohtsuki
2014/0131885 A1 5/2014 Samadi et al.
2014/0137061 A1 5/2014 McIlrath
2014/0145347 A1 5/2014 Samadi et al.
2014/0146630 A1 5/2014 Xie et al.
2014/0149958 A1 5/2014 Samadi et al.
2014/0151774 A1 6/2014 Rhie
2014/0191357 A1 7/2014 Lee
2014/0225218 A1 8/2014 Du
2014/0225235 A1 8/2014 Du
2014/0252306 A1 9/2014 Du
2014/0253196 A1 9/2014 Du et al.
2014/0264228 A1 9/2014 Toh
2014/0357054 A1 12/2014 Son et al.
2015/0021785 A1 1/2015 Lin
2015/0034898 A1 2/2015 Wang
2015/0243887 A1 8/2015 Saitoh
2015/0255418 A1 9/2015 Gowda
2015/0279829 A1 10/2015 Kuo
2015/0340369 A1 11/2015 Lue
2016/0049201 A1 2/2016 Lue
2016/0086970 A1 3/2016 Peng
2016/0104780 A1 4/2016 Mauder
2016/0133603 A1 5/2016 Ahn
2016/0141299 A1 5/2016 Hong
2016/0141334 A1 5/2016 Takaki
2016/0307952 A1 10/2016 Huang
2016/0343687 A1 11/2016 Vadhavkar
2017/0069601 A1 3/2017 Park
2017/0092371 A1 3/2017 Harar
2017/0098596 A1 4/2017 Lin
2017/0148517 A1 5/2017 Harari
2017/0179146 A1 6/2017 Park
2017/0221900 A1 8/2017 Widjaja
2017/0278858 A1 9/2017 Walker et al.
2018/0090219 A1 3/2018 Harari
2018/0090368 A1 3/2018 Eun-Jeong et al.
2018/0108416 A1 4/2018 Harari
2018/0294284 A1 10/2018 Tarakji
2019/0006009 A1 1/2019 Harari
2019/0043836 A1 2/2019 Fastow et al.
2019/0067327 A1 2/2019 Herner et al.
2019/0157296 A1 5/2019 Harari et al.
2020/0020408 A1 1/2020 Norman et al.
2020/0020718 A1 1/2020 Harari et al.
2020/0051990 A1 2/2020 Harari et al.
2020/0105773 A1 4/2020 Morris et al.
2020/0203328 A1* 6/2020 Park ..................... H01L 23/481
2020/0227123 A1 7/2020 Salahuddin et al.
2020/0243486 A1 7/2020 Quader et al.

OTHER PUBLICATIONS

Okuyama, K., et al., "Characterization of Newly Developed 3-D Parallel Triple Gate MOS Transistor," 4th COE Workshop Sep. 16, 2005. Hiroshima University.

Okuyama, K., et al., "Control of Subthreshold Characteristics of Narrow-Channel Silicon-on-Insulator n-Type Metal-Oxide-Semiconductor Transistor with Additional Side Gate Electrodes", Jap. J. of Appl. Phys., vol. 46, No. 4B, 2007, pp.

Okuyama, K., et al., "Proposal of 3-Dimensional Independent Triple-Gate MOS Transistor with Dynamic Current Control," IEDM 2007. IHHH 1-4244-0585-8/07/.

Hokazono, A., et al., "Steep Channel & Halo Profiles utilizing Boron-Diffusion-Barrier Layers (Si:C) for 32 nm Node and Beyond," VLSI Technology, 2008 IEEE Symposium on, vol., No., pp. 112-113, IEEE 978-1-4244-1805-3/08/.

Astrova, E.V., et al., "Anisotropic Shaping of Macroporous Silicon," ISSN 1063-7826, Semiconductors, 2015, vol. 49, No. 4, pp. 551-558.

Huang, Z., et al., "Extended Arrays of Vertically Aligned Sub-10 nm Diameter [100] Si Nanowires by Metal Assisted Chemical Etching", NanoLetters 2008, vol. 8, No. 9, pp. 3046-3051.

Schmidt, T., et al., "Fabrication of Ultra-high aspect ratio silicon nanopores by electrochemical etching", App. Phys. Lett., 105, 123111 (2014) 10.1063/1.4896524.

Lin, J., et al., "Investigation of the Formation of Undercut during the Fabrication of Silicon Microchannels by Electrochemical Etching," Proc. 3rd IEEE Intl. Conf. on Nano/Micro Engineered and Molecular Systems, Jan. 6-9, 2008. Sanya, China.

Tsai, Wen-Jer, "A Novel Trapping-Nitride-Storage Non-Volatile Memory Cell Using a Gated-Diode Structure With an Ultra-Thin Dielectric Dopant Diffusion Barrier", IEEE Trans. Elect. Dev., vol. 55, No. 8, pp. 2202-2211, Aug. 2008.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

(56) References Cited

OTHER PUBLICATIONS

Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integialion for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," Ill-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, p. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", *Asia pacific DAC* 2011, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B28(6), Nov./Dec. 2010, pp. C6P53-58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.

(56) References Cited

OTHER PUBLICATIONS

Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

(56) References Cited

OTHER PUBLICATIONS

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integialion: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50 (14)63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Phyisics Reviews, 1, 011104 (2014).
Delhougne, R., et al., "First Demonstalion of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al.,"Monolithic 3D BEOL FinFET switch arrays using location-controlled-grain technique in voltage regulator with better FOM than 2D regulators", IEDM paper 3.1, pp. IEDM19-46 to 19-49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to 405.
Rachmady, W., et al.,"300mm Heterogeneous 3D Integration of Record Performance Layer Transfer Germanium PMOS with Silicon NMOS for Low Power High Performance Logic Applications", IEDM 2019, paper 29.7, pp. IEDM19-697 to 700.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI—TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI—Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IFFH International, pp. 297-300, Dec. 7-9, 2009.
Burr, G. W., et al., "Overview of candidate device technologies for storage-class memory," IBM Journal of Research and Development, vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Stain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IHHH International, Dec. 10-12, 2007, p. 247.
Ragnarsson, L., et al., "Ultralow—EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration forsub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body Ram (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

(56) References Cited

OTHER PUBLICATIONS

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IFFF Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.

(56) References Cited

OTHER PUBLICATIONS

Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M "Emerging Technologies on Silicon", IEDM 2004, pp. 17-24.
Meindl, J. D "Beyond Moore'S Law: the Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chern. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques forthin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with

(56) References Cited

OTHER PUBLICATIONS

Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L. et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study ofthe splitting kinetic of H/He co-implanted substiale", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100° C.," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Subsliale with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Kim, I.-K., et al.,"Advanced Integration Technology for a Highly Scalable SOI DRAM with SOC (Silicon-On-Capacitors)", IEDM 1996, pp. 96-605-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

* cited by examiner

Pattern the Ridge to form vertical string;
Two step etching; anisotropic etch followed by isotropic etch.
The etching may be stop before the most bottom N+ layer that will be serve as common ground.
(see the sidewall view in next page)

Tunneling oxide layer, charge storage layer, control oxide layer stack deposition
Gate such as W or polysilicon deposition
Gate patterning Isotopic etching P layer with gate as mask, which results in separation between N+ region.

Staggered polysilicon for top contact

Straight polysilicon for top and bottom contact through ELTRAN process

Independently Controlled WL sharing a channel

Gate such as W or polysilicon deposition

Tunneling oxide layer, charge storage layer, control oxide layer stack deposition X-section view cut along word line direction across in-between channel region 4 independent channel NOR Flash memory unit cell sharing a single channel

| Operation | $S/D_{bottom}$ | $S/D_{top}$ | Other S/D | C-Gate | R-Gate | L-Gate | Other GLs |
|---|---|---|---|---|---|---|---|
| Write bit 1 | 0 V | 4.0 V | Floating | 8 V | 0 V | 0 V | 0 V |
| Write bit 2 | 4.0 V | 0 V | Floating | 8 V | 0 V | 0 V | 0 V |
| Erase bit 1 | 0 V | 4.0 V | Floating | -8 V | 0 V | 0 V | 0 V |
| Erase bit 2 | 4.0 V | 0 V | Floating | - 8 V | 0 V | 0 V | 0 V |
| Read on top channel ($S/D_{top}$ and $S/D_{bottom}$ swapping) | 1 .0 → 0 V | 0 → 1.0 V | Floating | 4 V | 0 V | 0 V | 0 V |

Fig. 17

| Operation | $S/D_{bottom}$ | $S/D_{top}$ | Other S/D | C-Gate | L-Gate | R-Gate | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | - 8 V | -4 V | 0 V | 0 V |
| Read on top channel ($S/D_{top}$ and $S/D_{bottom}$ swapping) | 1 .0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | - 8 V | 0 V | -4 V | 0 V |
| Read on top channel ($S/D_{top}$ and $S/D_{bottom}$ swapping) | 1 .0 → 0 V | 0 → 1.0 V | Floating | 4 V | 0 V | 4 V | 0 V |

Fig. 19

| Operation | $S/D_{bottom}$ | $S/D_{top}$ | Other S/D | C-Gate | L-Gate | R-Gate | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | - 8 V | -4 V | 0 V | 0 V |
| Read on top channel ($S/D_{top}$ and $S/D_{bottom}$ swapping) | 1 .0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | - 8 V | 0 V | -4 V | 0 V |
| Read on top channel ($S/D_{top}$ and $S/D_{bottom}$ swapping) | 1 .0 → 0 V | 0 → 1.0 V | Floating | 4 V | 0 V | 4 V | 0 V |
| Write bit 5 | 0 V | 4.0 V | Floating | 8 V | -4 V | -4 V | 0 V |
| Write bit 6 | 4.0 V | 0 V | Floating | 8 V | -4 V | -4 V | 0 V |
| Erase bit 5 | 0 V | 4.0 V | Floating | -8 V | 4 V | 4 V | 0 V |
| Erase bit 6 | 4.0 V | 0 V | Floating | - 8 V | 4 V | 4 V | 0 V |
| Read on top channel ($S/D_{top}$ and $S/D_{bottom}$ swapping) | 1 .0 → 0 V | 0 → 1.0 V | Floating | 4 V | -4 V | -4 V | 0 V |

Fig. 21

| Operation | $S/D_{bottom}$ | $S/D_{top}$ | Other S/D | C-Gate | L-Gate | R-Gate | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | - 8 V | -4 V | 0 V | 0 V |
| Read on top channel ($S/D_{top}$ and $S/D_{bottom}$ swapping) | 1.0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | - 8 V | 0 V | -4 V | 0 V |
| Read on top channel ($S/D_{top}$ and $S/D_{bottom}$ swapping) | 1.0 → 0 V | 0 → 1.0 V | Floating | 4 V | 0 V | 4 V | 0 V |
| Write bit 5 | 0 V | 4.0 V | Floating | 8 V | 2 V | -4 V | 0 V |
| Write bit 6 | 4.0 V | 0 V | Floating | 8 V | 2 V | -4 V | 0 V |
| Erase bit 5 | 0 V | 4.0 V | Floating | -8 V | -2 V | 4 V | 0 V |
| Erase bit 6 | 4.0 V | 0 V | Floating | - 8 V | -2 V | 4 V | 0 V |
| Read on top channel ($S/D_{top}$ and $S/D_{bottom}$ swapping) | 1.0 → 0 V | 0 → 1.0 V | Floating | 4 V | -2 V | -4 V | 0 V |
| Write bit 7 | 0 V | 4.0 V | Floating | 8 V | -4 V | 2 V | 0 V |
| Write bit 8 | 4.0 V | 0 V | Floating | 8 V | -4 V | 2 V | 0 V |
| Erase bit 7 | 0 V | 4.0 V | Floating | -8 V | 4 V | -2 V | 0 V |
| Erase bit 8 | 4.0 V | 0 V | Floating | - 8 V | 4 V | -2 V | 0 V |
| Read on top channel ($S/D_{top}$ and $S/D_{bottom}$ swapping) | 1.0 → 0 V | 0 → 1.0 V | Floating | 4 V | -4 V | -2 V | 0 V |

Fig. 23

After etch of O/N/O-1 from the top (exposing the first S/D over channel) X-section view cut along bit line direction across at the facet interface with the Ridges After etch of O/N/O-1 from the top X-section view cut along bit line direction within the Ridges Y-section view cut along word-line direction across the channel column X-section view cut along bit line direction across at the facet interface with the Ridges after etching top portion of 1st gate material along B-3

Y-section view cut along word-line direction across the channel column along B-4 after etching top portion of 1st gate material Y-section view cut along word-line direction across the channel column along B-4 after etching the exposed top surface of O/N/O-1

Y-section view cut along word-line direction across the channel column along B-4 after filling the holes with P doped silicon Y-section view cut along word-line direction across the channel column along B-4
after laser re-crystallization of the P silicon Top view after formation of top horizontal transistors The vertical FET with is part of the basic 3D-NOR could be used to eject the electrons from the charge trap layer or into it in order to shift threshold voltage of horizontal FET to be negative. So that the PHT becomes normally on-state device.
The vertical FET is operated to inject the electrons into the charge trap layer in order to shift threshold voltage of the PHT to be positive. So that the PHT becomes normally off-state device.
Or, no charge is transferred into the PHT O/N/O-2 layers so the PHT would operate is normal transistor to be dynamically switchable by the logic gate on top of it

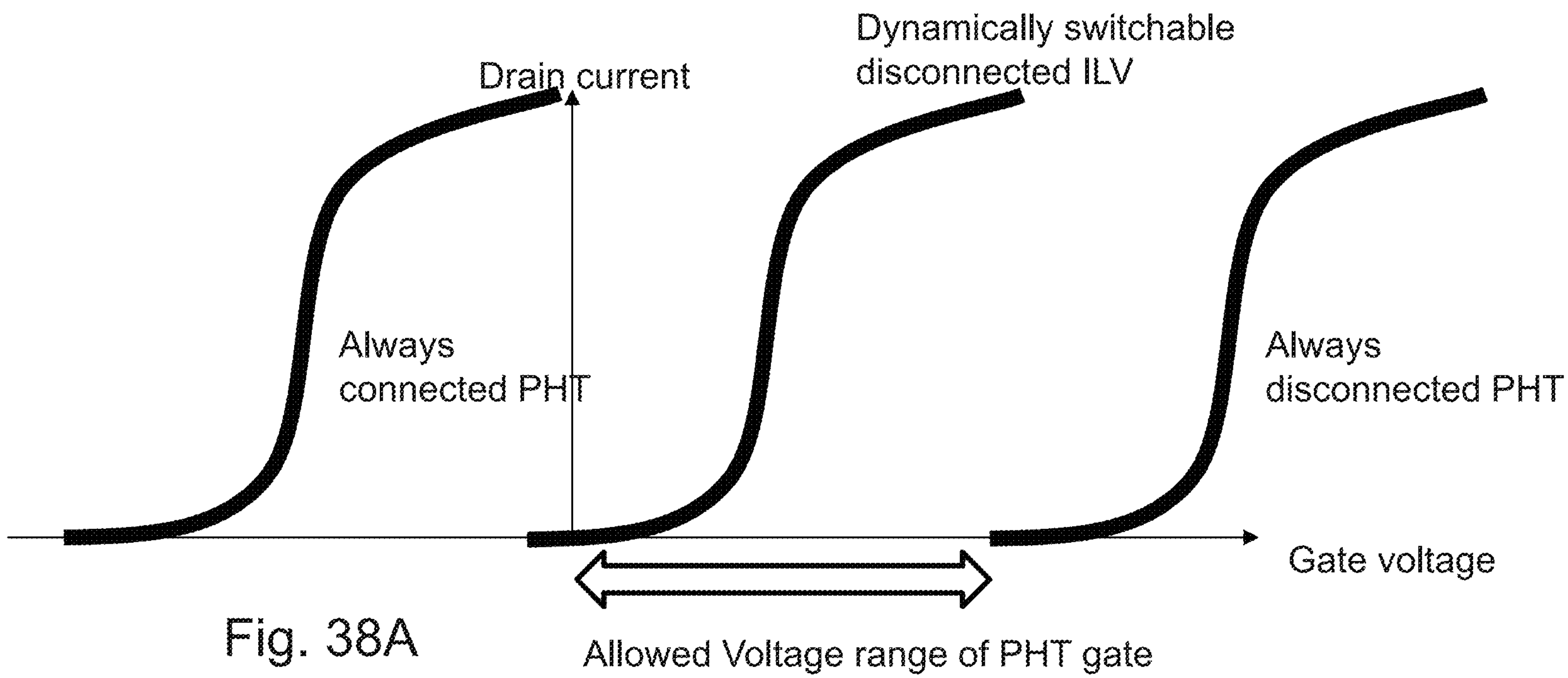

Fig. 38A

Figure 3: An 8-input HS-Domino OR gate

| IN | | | | | | | | | OUT | | | |
|---|---|---|---|---|---|---|---|---|---|---|---|---|
| First NAND | | | | Second NAND | | | | a= | 0 | 1 | 0 | 1 |
| A | AN | B | BN | A | AN | B | BN | b= | 0 | 0 | 1 | 1 |
| On | On | On | On | X | | | | | 0 | 0 | 0 | 0 |
| On | On | On | T | T | On | T | On | | 0 | 0 | 0 | 1 |
| On | On | On | T | On | T | T | On | | 0 | 0 | 1 | 0 |
| On | On | On | T | X | | | | | 0 | 0 | 1 | 1 |
| On | T | On | T | On | On | T | On | | 0 | 1 | 0 | 0 |
| On | T | On | T | On | T | T | On | | 0 | 1 | 0 | 1 |
| On | T | On | T | T | On | T | On | | 0 | 1 | 1 | 0 |
| On | T | On | T | X | | | | | 0 | 1 | 1 | 1 |
| On | On | T | On | T | On | On | T | | 1 | 0 | 0 | 0 |
| On | T | T | On | T | On | On | T | | 1 | 0 | 0 | 1 |
| T | On | T | On | T | On | On | T | | 1 | 0 | 1 | 0 |
| T | On | On | T | X | | | | | 1 | 0 | 1 | 1 |
| On | On | T | On | X | | | | | 1 | 1 | 0 | 0 |
| On | T | T | On | X | | | | | 1 | 1 | 0 | 1 |
| T | On | T | On | X | | | | | 1 | 1 | 1 | 0 |
| | | | X | X | | | | | 1 | 1 | 1 | 1 |

Fig. 46

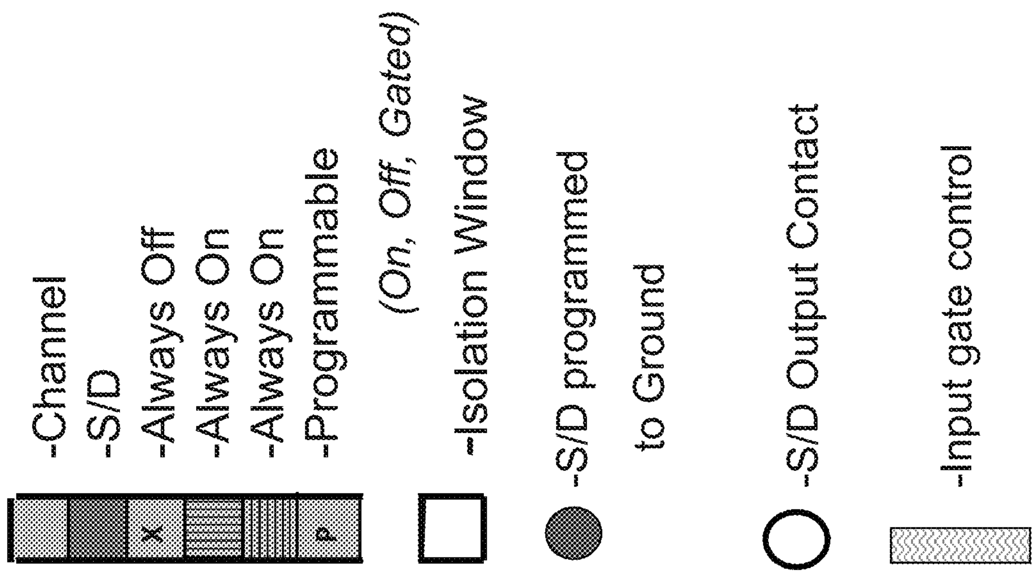
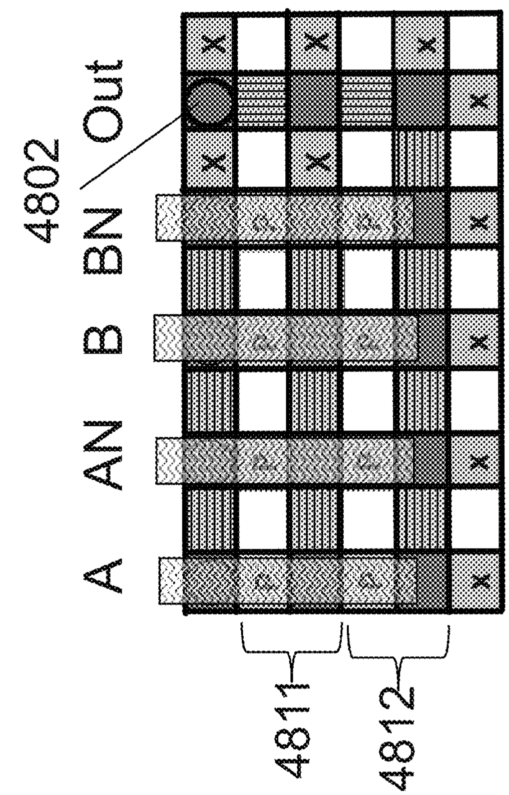
Fig. 48A

| IN | | | | | | | | OUT | | | | |
|---|---|---|---|---|---|---|---|---|---|---|---|---|
| First AND | | | | Second AND | | | | a= | 0 | 1 | 0 | 1 |
| A | AN | B | BN | A | AN | B | BN | b= | 0 | 0 | 1 | 1 |
| T | T | T | T | T | T | T | T | | 0 | 0 | 0 | 0 |
| X | T | X | T | T | T | T | T | | 0 | 0 | 0 | 1 |
| T | X | X | T | T | T | T | T | | 0 | 0 | 1 | 0 |
| X | X | X | T | T | T | T | T | | 0 | 0 | 1 | 1 |
| X | T | T | X | T | T | T | T | | 0 | 1 | 0 | 0 |
| X | T | X | X | T | T | T | T | | 0 | 1 | 0 | 1 |
| X | T | T | X | T | X | X | T | | 0 | 1 | 1 | 0 |
| X | T | T | X | X | X | X | T | | 0 | 1 | 1 | 1 |
| T | X | T | X | T | T | T | T | | 1 | 0 | 0 | 0 |
| T | X | T | X | X | T | X | T | | 1 | 0 | 0 | 1 |
| T | X | X | X | T | T | T | T | | 1 | 0 | 1 | 0 |
| T | X | X | X | X | X | X | T | | 1 | 0 | 1 | 1 |
| X | X | T | X | T | T | T | T | | 1 | 1 | 0 | 0 |
| X | X | T | X | X | T | X | X | | 1 | 1 | 0 | 1 |
| X | X | T | X | T | X | X | X | | 1 | 1 | 1 | 0 |
| | | | X | X | X | X | X | | 1 | 1 | 1 | 1 |

Fig. 48B

| LUT 2 (A, AN, B, BN) | C | CN | D | DN |
|---|---|---|---|---|
| LUT 2 for C=0 & D=0 | T | X | T | X |
| | T | X | T | X |
| LUT 2 for C=0 & D=1 | T | X | X | T |
| | T | X | X | T |
| LUT 2 for C=1 & D=0 | X | T | T | X |
| | X | T | T | X |
| LUT 2 for C=1 & D=1 | X | T | X | T |
| | X | T | X | T |

Fig. 49C

First Dummy Oxide Patterning

First ONO-Gate Stack

Thickness of patterned dummy oxide (spacer) is substantially preserved to ensure that the voltage applied to the second gate and the programmed states of the second charge storage layer do not affect the channel potential of the vertical NPN transistor.

Thickness of patterned dummy oxide (spacer) is remained to ensure that the voltage applied to the second gate and the programmed states of the second charge storage layer do not affect the channel potential of the vertical NPN transistor.

Lateral junctionless transistor unit

Thickness of a *lateral* junctionless transistor ($T_{JL}$) should be sufficiently thin so that the programmed status in the second charge storage layer can effectively control the threshold voltage shift.

Write operation for lateral JL transistor

Write operation for lateral JL transistor

| Operation | Selected S/D pair | Unselected S/Ds | Frist Gates | Selected Second Gate | Unselected Second Gates |
|---|---|---|---|---|---|
| Program Always on | 0 V | Inhibit voltage Floating | Don't care | Program voltage 8 V | Pass voltage 4 V |
| Program Always off | 0 V | Inhibit voltage Floating | Don't care | Erase voltage -8 V | Pass voltage 4 V |

Fig. 61B

Write operation for vertical NPN transistor

Write operation for vertical NPN transistor

| Operation | Selected S/D pair | Unselected S/Ds | Selected Frist Gate | Unselected First Gates | Second Gates |
|---|---|---|---|---|---|
| Write '0' | 0 V | Inhibit voltage Floating | 8 V | 0V | Pass voltage 4 V |
| Write '1' | 0 V | Inhibit voltage Floating | -8 V | 0V | Pass voltage 4 V |

Fig. 62B

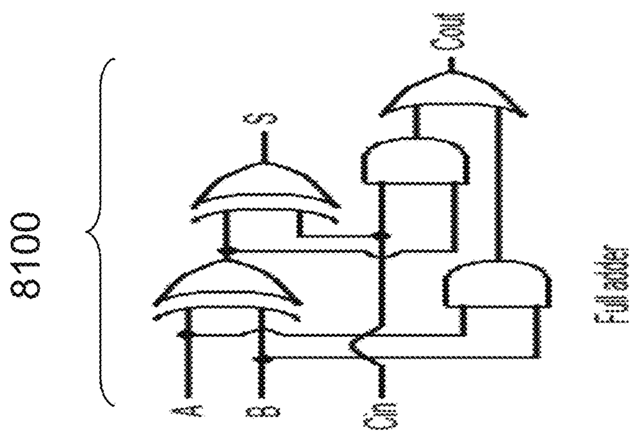
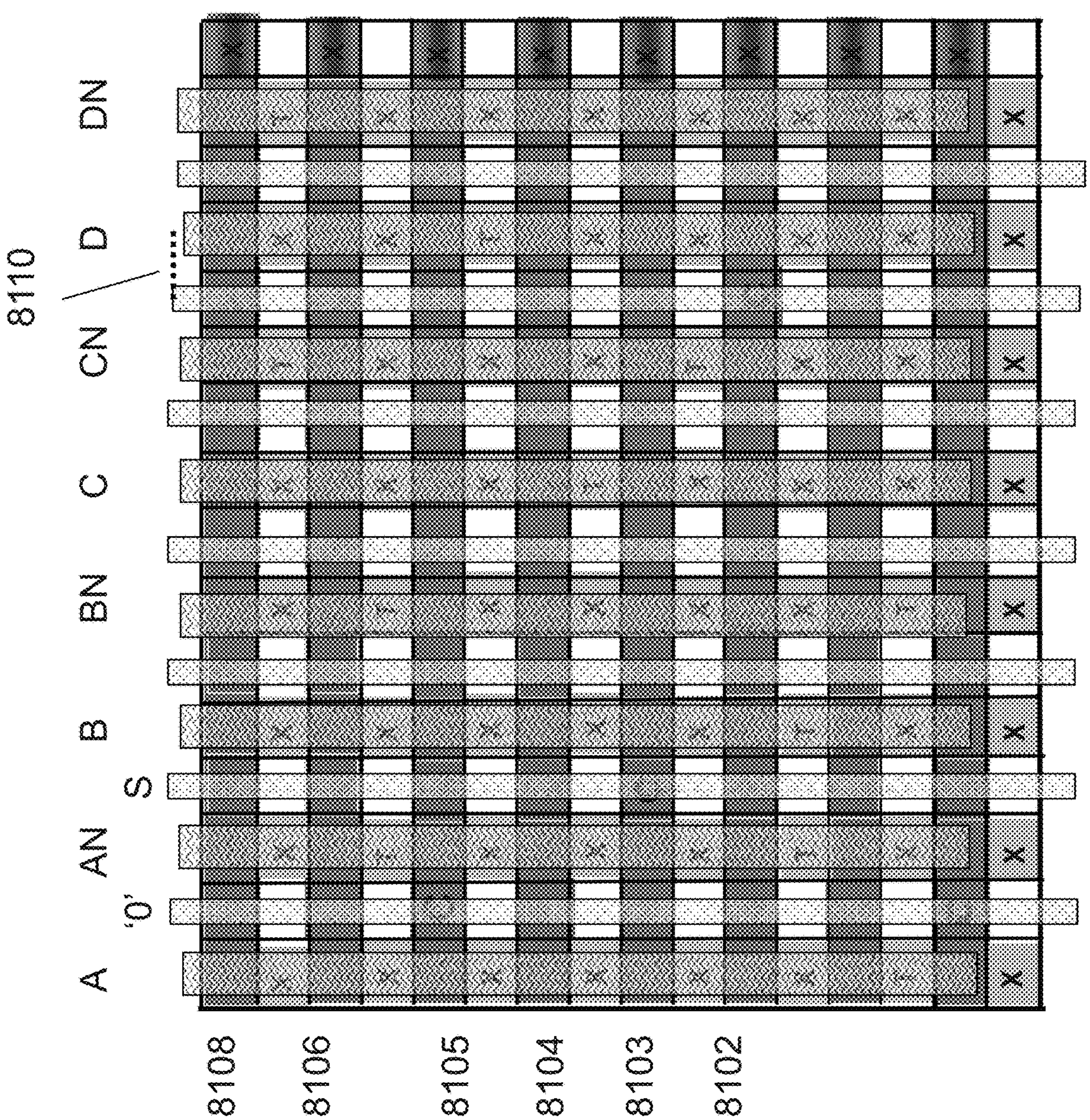
Fig. 81

| Operations | WL | BL | SL | Substrate |
|---|---|---|---|---|
| "1" write | 1.5V | 2.4V | 0V | -3V |
| "0" write | 1.5V | -1.5V | 0V | -3V |
| Hold | -2V | 0V | 0V | -3V |
| Read | 1.2V | 0.2V | 0V | -3V |
| Impact ionization phase of autonomous refresh | 0.4V | 2.4V | 0V | -3V |
| Charge pumping phase of autonomous refresh | 1.5V | 0V | 0V | -3V |

Fig. 86B

Fig. 15. Example of the MOSFET structure with two independent gates

3D SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

- Through-silicon via (TSV) technology: Multiple layers of transistors (with or without wiring levels) can be constructed separately. Following this, they can be bonded to each other and connected to each other with through-silicon vias (TSVs).
- Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318; and pending U.S. Patent Application Publications and applications, Ser. No. 14/642,724, Ser. No. 15/150,395, Ser. No. 15/173,686, 62/651,721; 62/681,249, 62/713,345, 62/770,751, 62/952,222, 2020/0013791, Ser. No. 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications are incorporated herein by reference.
- Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, and 10,679,977. The entire contents of the foregoing patents, publications, and applications are incorporated herein by reference.

In a land mark papers at VLSI 2007 and IEDM 2007, Toshiba presented techniques to construct 3D memories which they called-BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, these are incorporated herein by reference; we presented multiple 3D memory structures generally constructed by successive layer transfers using ion cut techniques. In this work we are presenting multiple methods and structures to construct 3D memory with monocrystalline channels constructed by alternative methods to ion cut and successive layer transfers. This structure provides the benefit of multiple layers being processed by one lithography step with many of the benefits of a monocrystalline channel, and provides overall lower construction costs.

In addition, the entire contents of U.S. Pat. Nos. 10,014,318, 10,418,369, U.S. patent application publication 2020/0013800 and U.S. patent applications 62/307,568, 62/286,362, 62/276,953, 62/271,251, 62/266,610, and 62/246,054 are incorporated herein by reference.

SUMMARY

The invention may be directed to multilayer or Three Dimensional Integrated Circuit (3D IC) devices and fabrication methods.

In one aspect, a 3D device, the device comprising: a first level comprising logic circuits; a second level comprising a plurality of volatile memory cells; and a third level comprising a plurality of non-volatile memory cells, wherein said first level is bonded to said second level.

In another aspect, a 3D device, the device comprising: a first level comprising logic circuits; a second level comprising a plurality of dynamic memory cells; and a third level comprising a plurality of non-volatile memory cells, wherein said first level is bonded to said second level, and wherein said device comprises refresh circuits to refresh said dynamic memory cells.

In another aspect, a 3D device, the device comprising: a first level comprising logic circuits; a second level comprising a plurality of high speed memory cells; and a third level comprising a plurality of high density memory cells, wherein said first level is bonded to said second level, and wherein said device comprises control circuits to store more than one bit per cell in said high density memory cells.

BRIEF DESCRIPTION OF THE DRAWINGS

Various embodiments of the invention will be understood and appreciated more fully from the following detailed description, taken in conjunction with the drawings in which:

FIG. 17 is an example illustration of operating conditions for the cell of FIG. 16;

FIG. 19 is an example illustration of operating conditions for the cell of FIG. 18;

FIG. 21 is an example illustration of operating conditions for the cell of FIG. 20;

FIG. 23 is an example illustration of operating conditions for the cell of FIG. 22;

FIG. 38A is an example illustration of three operating states for which the PHT could be programmed;

FIG. 46 is an example illustration table of programming of the two NAND rows of FIG. 45 to support LUT-2 functionality;

FIG. 48A is an example illustration of use of a ridge to construct a programmable function complementing the 'AND of NANDs' of FIG. 45;

FIG. 48B is an example illustration table of programming of the 'AND of NANDs' of FIG. 48A;

FIG. 49C is an example illustration table of programming of the programmable function LUT-4 using 8 rows of 'OR of Ands' of FIGS. 49*a* and 49B;

FIG. 52 is an example illustration of another use of the 3D-NOR fabric wherein a signal could be routed through;

FIGS. 61A-61B are example illustrations of conditions to program a junctionless transistor;

FIGS. 62A-62B are example illustrations of a conditions to program a vertical NPN transistor;

FIG. 81 is an example illustration of the function of a full adder implemented in a 3D NOR fabric;

FIGS. 86A-86B are example illustrations of a signal chart and table for the operation of a floating body memory in a 3DNOR fabric respectively;

DETAILED DESCRIPTION

Figure 1A:
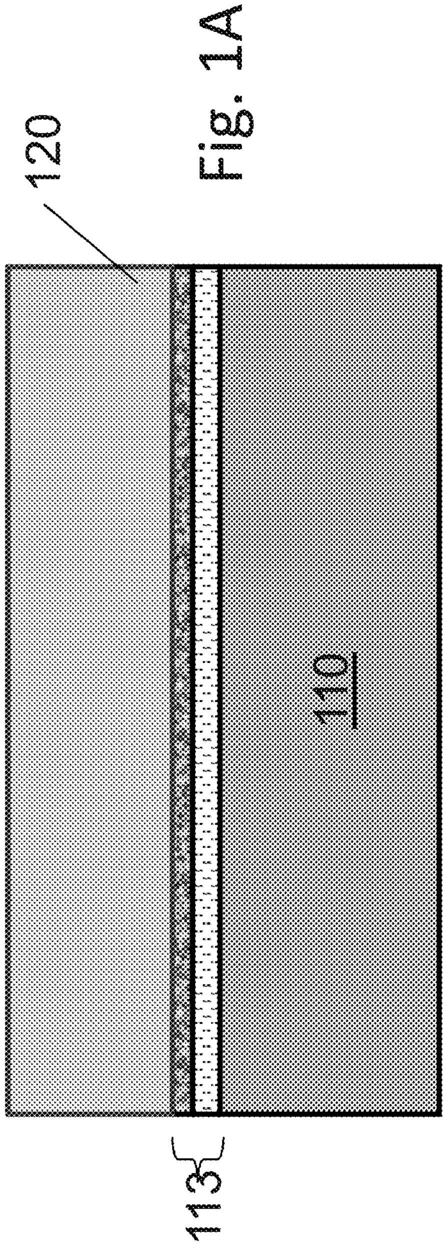
FIGS. 1A and 1B are example illustrations of forming multilayer porous structures.

An embodiment or embodiments of the invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

Memory architectures include at least two important types—NAND and NOR. The NAND architecture provides higher densities as the transistors forming the memory cells are serially connected with only an external connection at the beginning and end of the cell string as is illustrated in at least U.S. Pat. No. 8,114,757, FIGS. 37A-37G. NOR architectures are less dense but provide faster access and could work sometimes when the NAND architecture cannot as individual NOR memory cells are directly accessible and in many cases both its source and drain are accessible, such as being illustrated in at least U.S. Pat. No. 8,114,757, FIGS. 30A-30M.

The memory cell could be constructed with conventional N type or P type transistors where the channel doping may be of opposite type with respect to the source drain doping or the memory cell could utilize a junction-less transistor construction where the gate could fully deplete the channel when in the off-state. For some architectures, the junction-less transistor is attractive as it may take less processing steps (or provide other device advantages such as low leakage off-state) to form the memory array without the need to form a change in doping along the transistor.

Some 3D Memory architectures are utilizing a horizontal memory transistor, for example, such as illustrated in at least U.S. Pat. No. 8,114,757, at least FIGS. 37A-37G and FIGS. 30A-30M. Others may use vertical memory transistors, for example, such as in the Toshiba BiCS architecture such as illustrated in at least U.S. Pat. No. 7,852,675.

Multiple methods to construct 3D memory structures using horizontal junction-less transistors for a NAND architecture, and for horizontal NAND and NOR architectures in general may be found in, for example, such as U.S. Pat. No. 8,114,757 in at least FIG. 33 and FIG. 37. The following would present multiple techniques to form a multilayer silicon over oxide start structure equivalent to, for example, such as at least FIGS. 33D and 37D (of U.S. Pat. No. 8,114,757), without the use of ion-cut layer transfer.

The starting structure could be similar to FIG. 41A of U.S. application Ser. No. 14/642,724, incorporated herein by reference, as illustrated in FIG. 1A. A base donor substrate 110 may be used to form a dual porous layer for future cut layer 113 on which an epitaxial process may be used to form relatively thick crystalline layer 120. Future cut layer 113 may include two porous layers; an upper layer of porous silicon, which may contain microscopic pores of diameter of a few nm, and below this is formed a lower layer of porous silicon for which the pore diameter may be a few (or more) times greater (similar to FIG. 23 of U.S. application Ser. No. 14/642,724), for the future 'cut' or cleave. The epitaxial formation of relatively thick crystalline layer 120 could include successively altering the addition of dopants to further support the following steps.

Figure 1B:
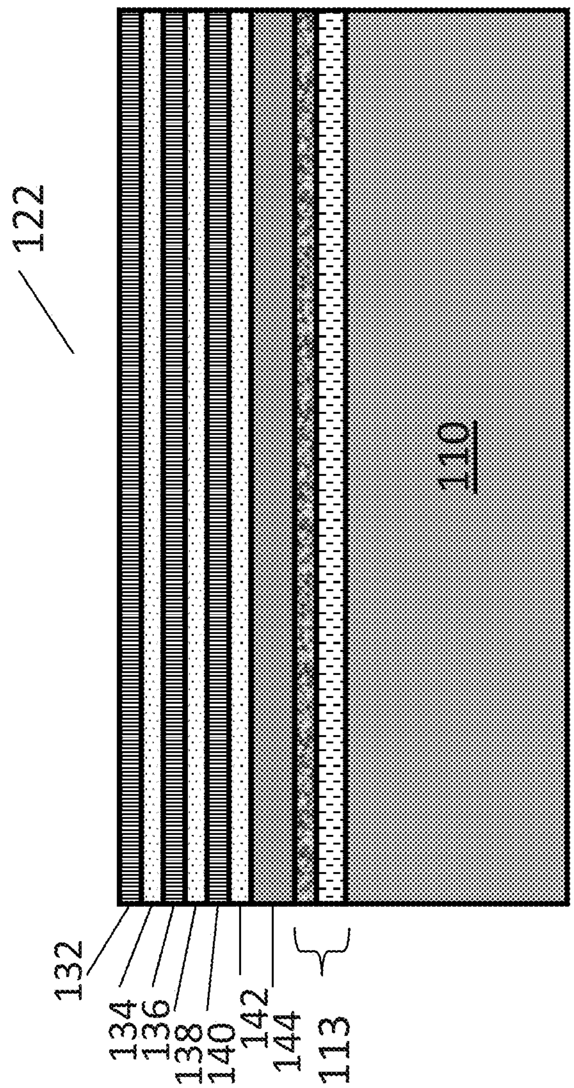

Then, by utilizing anodizing processes, thick crystalline layer 120 may be converted to a multilayer of alternating low porosity over high porosity as illustrated in FIG. 1B, which is similar to FIG. 41B of Ser. No. 14/642,724. The alternating-porosity multilayer can be converted later into alternating multilayer of monocrystalline-Si over insulating $SiO_2$, as described below. FIG. 1B illustrates relatively thick crystalline layer 120 after going through a porous formation process which forms multilayer structure 122. Multilayer structure 122 may include layer 144, layer 142, layer 140, layer 138, layer 136, layer 134 and layer 132. Multilayer structure 122 may include base donor wafer substrate 110 with porous cut layer 113 for the planed transfer of the fabricated multilayer structure over the target wafer, which could include the memory peripherals circuits prefabricated on the target wafer. Alternatively, multilayer structure 122 may not include porous cut layer 113 when the transfer to a target wafer is not intended. Layer 144 could be the portion of layer 120 which remains after the multi-layer processing. The alternating layers could have alternating porosity levels such as layers 132, 136, 140 with porosity of less than 30% or less than 40% while layers 134, 138, 142 with porosity over 50% or over 60%, or layers 132, 136, 140 with a porosity of less than 55% while layers 134, 138, 142 with porosity over 65%, or other alternating level of porosity based on the target application, process, and engineering choices. Each layer may include a varying porosity thru its thickness, or a number of sublayers of varying porosity.

The number of alternating layers included in multilayer structure 122 could be made as high as the number of layers needed for the 3D memory (for example, greater than 20, greater than 40, greater than 60, or greater than 100) or for the transferring of a subset of multilayer structures one on top of the other to form the desired final structure. The porosity modulation could be achieved, for example, by (1) alternating the anodizing current, or (2) changing the illumination of the silicon structure while in the anodizing process, or (3) by first alternating the doping as layer 120 is being grown through epitaxial process, or (4) etching & oxidizing multilayers of $Si_xGe_{1-x}/Si$. Layer 144 could be the portion of layer 120 which is left un-processed by the modulated-porosity process. Below are listed few embodiments of the above method of forming a c-Si/$SiO_2$ multilayer from an alternated porosity multilayer:

For example, U.S. Pat. No. 7,772,096, incorporated herein by reference, teaches the formation of a multilayer structure according to (3) above, starting with alternate doping following these steps:

i—Epitaxially grow alternating layers of p+ 134,138, 142, with dopant concentrations in the range of $1\times10^{19}$ $cm^{-3}$ to$2\times10^{20}$ $cm^{-3}$, respectively over layers p 132,136, 140, with dopant concentrations in the range of $1\times10^{14}$ $cm^{-3}$ to $5\times10^{18}$ $cm^{-3}$. Layers 132, 134, 136, 138, 140, 142 could have thickness of 3 nm to 20 nm, or even thicker such as 20 nm to 100 nm.

ii—Perform an anodization process in a hydrofluoric acid (HF) containing electrolyte solution to convert the doped layers to porous layers. The p+ 134,138, 142 layers would convert to a high porosity layer with coarse porous structures while the p 132,136, 140 layers will convert to a fine porous structure.

iii—Perform an oxidization process to convert the p+ 134,138, 142 layers to oxide.

iv—Perform a high temperature annealing, for example, such as at 1,000° C. for a few hours, to convert the p 132,136, 140 layers into high quality monocrystalline layers.

Figure 2:
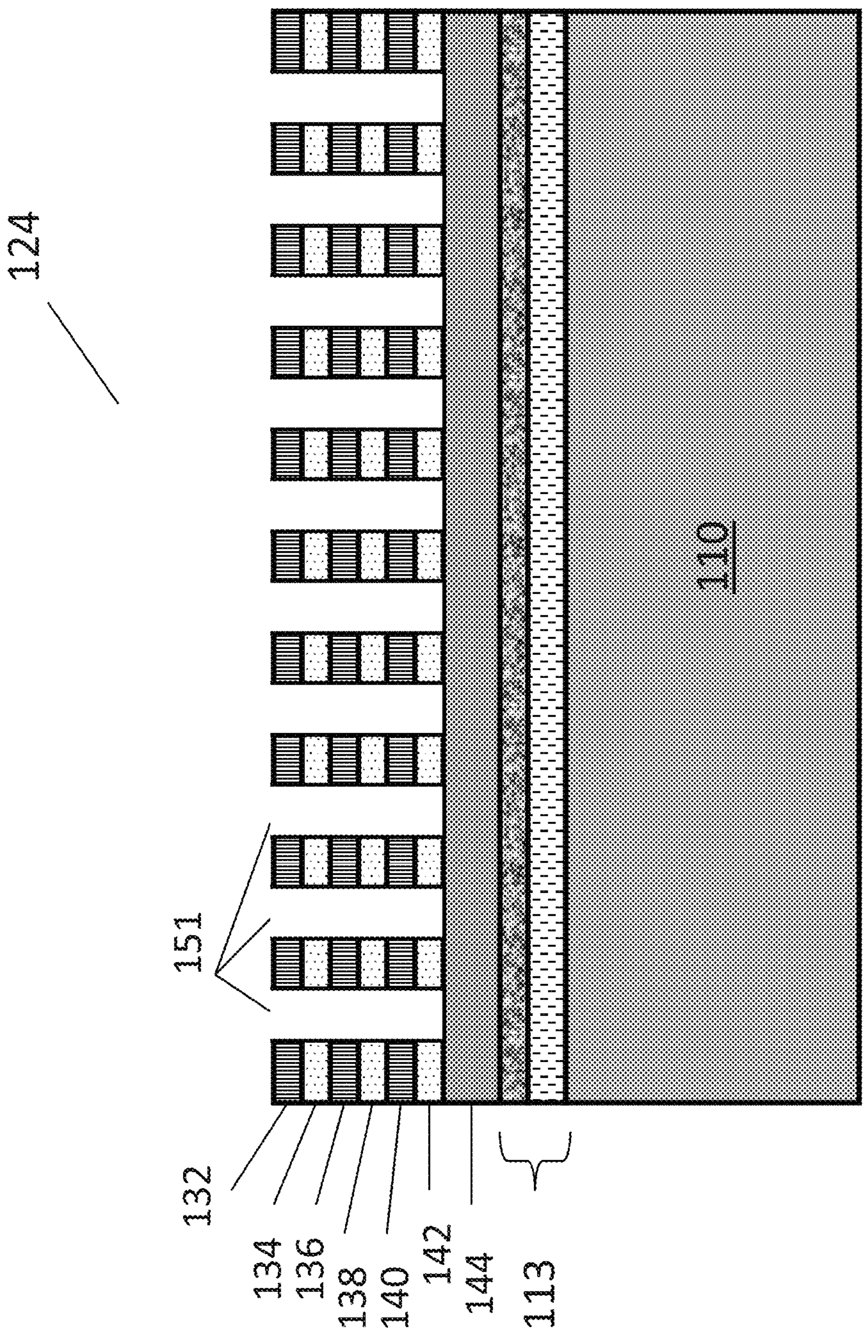
FIG. 2 is an example illustration of multilayer porous structures.

Alternatively, the above steps ii-iv can be carried out after holes 151 are formed by masking and etch processes as shown in FIG. 2, where holes 151 may be filled by, for example, contact metal or gate stacks in subsequent processing (not shown). Holes 151 may include regions of opening (not shown). Thus a second desired multilayer structure 124 may be formed.

The above processing may result in first desired multilayer structure 122 or second desired multilayer structure 124 for the formation of 3D memories.

In yet another embodiment of method (3), U.S. patent application Ser. No. 12/436,249, incorporated herein by reference, teaches an alternative method for the formation of the multilayer structure 122 with alternating doping. In brief, the method starts by multiple depositions of amorphous silicon with alternating doping, then performing a solid phase recrystallization to convert the stack into a stack of p-type doped single crystal Si-containing layers using a high temperature recrystallization, with recrystallization temperatures from 550° C. to 700° C. After recrystallization, the single crystal Si-containing layers could be subjected to anodization and so forth as presented in ii-iv above. U.S. patent application Ser. No. 12/436,249 teaches a few alternatives for the formation of the alternating doping layer structure which could be employed herein for the 3D memory multilayer structure formation.

In an embodiment of method (2), the epitaxial layer 120 could include alternating n doped and n+ doped layers. The porous formation of the n doped layers may be assisted by light to form the holes for the anodizing process to effectively work as had been presented in S. Frohnhoff et. al., Thin Solid Films, in press (1994), U.S. patent applications Ser. No. 10/674,648, Ser. No. 11/038,500, Ser. No. 12/436, 249 and U.S. Pat. No. 7,772,096, all of these incorporated herein by reference. Following the anodizing step the structure could be oxidized and then annealed as presented in steps iii and iv above.

In an embodiment of method (1), A method to form alternating layers of coarse and fine porous layers is by alternating the anodizing current similar to the description in "Porous silicon multilayer structures: A photonic band gap analysis" by J. E. Lugo et al J. Appl. Phys. 91, 4966 (2002), U.S. Pat. No. 7,560,018, U.S. patent application Ser. No. 10/344,153, European patent EP0979994, and "Photonic band gaps analysis of Thue-Morse multilayers made of porous silicon" by L. Moretti at el, 26 Jun. 2006/Vol. 14, No. 13 OPTICS EXPRESS, all of these incorporated herein by reference. Following the anodizing step the structure could be oxidized and then annealed as presented in steps iii and iv above.

The anodizing step could be done as a single wafer process or by using a batch mode as illustrated in U.S. Pat. No. 8,906,218, incorporated herein by reference and other similar patents assigned to a company called Solexel.

In yet another embodiment combining methods (3) and (2), the multilayer structure 122 may be formed by first forming multilayer structure of alternating n type over p type. Such a method is illustrated in U.S. Pat. No. 8,470,689 and in ""Silicon millefeuille": From a silicon wafer to multiple thin crystalline films in a single step" by D. Hernandez et al., Applied Physics Letters 102, 172102 (2013); incorporated herein by reference. These methods leverage the fact that n type silicon would not become porous without light while p type silicon would only need current for the anodizing process to take place. For these methods the multilayer of n over p could be first etched to form the multilayer pattern such as is illustrated in FIG. 31E or FIG. 37E of U.S. Pat. No. 8,114,757 followed by an anodizing process to convert the p type silicon to porous while leaving the n type solid and un-etched. Then the step of oxidation iii. could be used to convert the porous layer to an isolation layer. The annealing step iv. could be made short or skipped as the n layers might be very lightly etched or not be etched at all.

In yet another embodiment of method (3), a multilayer structure could be achieved by successive epitaxial growths of n type silicon over p+ type silicon multiple times for which the n silicon could be etched at a much higher rate than the p+ silicon. In a paper titled: "Fabrication of conducting GeSi/Si microand nanotubes and helical microcoils" by S V Golod, V Ya Prinz, V I Mashanov and A K Gutakovsky, Semicond. Sci. Technol. 16 (2001) 181-185, incorporated herein by reference, it presents that p+ silicon would be etched at a much lower rate than n silicon, quoting: "As a selective etchant, an ammonium hydroxide-water solution can be used. It was shown in [8] that the 3.7 wt. % NH4OH solution has a pp+ selectivity of approximately 8000:1 at 75° C. and boron concentration p+=$10^{20}$ $cm^{-3}$."

Another alternative is to form multilayers of silicon over $Si_{1-x}Ge_x$ as illustrated in "New class of Si-based superlattices: Alternating layers of crystalline Si and porous amorphous $Si_{1-x}Ge_x$ alloys" by R. W. Fathauer et al., Appl. Phys. Lett. 61 (19), 9 Nov. 1992, incorporated herein by reference. In such a multilayer structure there is high degree of selectivity in etching $Si_{1-x}Ge_x$ layers over Si layers. This may be followed by oxidation such as step iii. and anneal iv. could provide multilayers of silicon over oxide. In a paper titled: "Novel Three Dimensional (3D) NAND Flash Memory Array Having Tied Bit-line and Ground Select Transistor (TiGer)" by Se Hwan Park et al, IEICE Transactions on Electronics. May 2012, incorporated herein by reference, it presents the use of multilayers of silicon over $Si_1$-x$Ge_x$ for forming a 3D NAND device. While many of the 3D memories presented are 3D RAM and 3D ReRAM, the multilayer structure presented herein are useful for 3D NAND type memory as was presented in this paper and in many of process flow presented in the incorporated here in patents such as in U.S. Pat. No. 8,581,349 as related to FIG. 37A-37G, incorporated herein by reference.

An alternative method to the modulated-porosity method for forming c-Si/$SiO_2$ multilayers may be to utilize the Bosch process. In a paper titled "Fabrication and Characterization of Vertically Stacked Gate-All-Around Si Nanowire FET Arrays" by Davide Sacchetto et al. at IEEE SDDR09, incorporated herein by reference, a technique used for deep hole etch has been applied to form structures of crystalline lines one on top of the other each with oxide all around. Similar techniques could be used to form the base structure for 3D memory.

Yet another alternative for forming c-Si/$SiO_2$ multilayer structures is direct epitaxy of silicon, special oxide, and silicon again. The special oxide is a rare-earth oxide which if deposited properly would keep the crystal structure of the silicon to allow crystalline silicon on top of it as presented in U.S. patent application publication US 2014/0291752, incorporated herein by reference.

An interesting aspect of the multilayer structure that are epitaxial based rather than the layer transfer approach is that the whole structure in most cases would resemble one monolithic crystal, in which the crystal repeating element which could be a silicon atom or other molecules are very well aligned across layers. No molecular level alignment would happen in layer transfer process. So in an epitaxial process of multilayer formation the molecules forming the multilayer structure are all aligned forming lines that are parallel at better than 0.01 of degree while in layer transfer base multilayer structure between layers the molecules line would have in most case a misalignment greater than 0.1 degree. As well, in an epitaxial process of multilayer formation the molecules forming the multilayer structure from one layer to the next are aligned less than within half an atomic or molecule distance.

The epitaxy process of multilayers of an n+ type layer over a p type layer could be done at lower temperatures to reduce the dopant movement of the n+ layer, at the lower portion of the multilayer structure, into the p type layer as the multilayer structure is being formed. There are known epitaxial processes in the art which allow good quality layers to be formed while keeping the process temperature below 600° C. For example, such has been presented in papers by D. SHAHRJERDI, titled "Low-Temperature Epitaxy of Compressively Strained Silicon Directly on Silicon Substrates" published at Journal of ELECTRONIC MATERIALS, Vol. 41, No. 3, 2012; by S. Wirths titled "Low temperature RPCVD epitaxial growth of Si1_xGex using Si2H6 and Ge2H6" published at Solid-State Electronics 83 (2013) 2-9"; and by Pere Roca I Cabarrocas titled "Low temperature plasma deposition of silicon thin films: From amorphous to crystalline" published at Journal of Non-Crystalline Solids, Elsevier, 2012, 358 (17), pp. 2000-2003; and in U.S. Pat. Nos. 7,262,116, 8,778,811 and application US 2014/0045324, all of the forgoing incorporated herein by reference.

An advantage of using oxidized porous silicon for isolating the silicon layers for the 3D memory structure is the ability to easily and selectively etch portions of these oxidized porous layers to allow the gate formation to have a larger coverage of the transistor channel to have an increased control on the memory transistor, for example, such as with gate all around or a 'mostly' gate all around transistor structure. In a similar way in the other forms of multilayer structure the area on top and under the channel could be etched so in the follow-on processing step of oxide and gate formation it would form a larger coverage of the channel which could be a gate all around configuration for better channel control.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

In general the described memory structure would be arranged as a process flow forming a type of a 3D memory structure. These flows could be considered as a Lego part which could be mixed in different ways forming other variations, thus forming many types of devices. Some of these variations will be presented but as with Lego there too many variations to describe all of them. It is appreciated that artisan in the art could use these elements of process and architecture to construct other variations utilizing the teaching provided herein.

Many of these memory structures are constructed starting with multilayer of mono-crystal layers as illustrated in FIG. 1B. The mono-crystal could be doped and could have either an isolative layer in-between or sacrificial layer which could be replaced at some point in the process with an isolative layer. The multilayer structure could be fully ready or partially readied with the etching of vertical holes or trench shapes, as required for the memory structure to follow, and allows the completion of the multilayer structure which may include selective etching of the sacrificial layers in-between.

A volatile 3D memory using floating body charge is described in U.S. Pat. No. 8,114,757, incorporated herein by reference, as related to at least FIGS. 30A-30M and FIGS. 31A-31K. The following is an additional alternative for forming a 3D DRAM volatile memory.

3D Memory may be multi-layers of 2D memory in which memory cells are placed as a matrix with rows and columns. These memory cells are controlled by memory control lines such as bit-lines, source-lines, and word-lines, usually in a perpendicular arrangement, so that by selecting a specific bit-line and specific word-line one may select a specific memory cell to write to or read from. In a 3D memory matrix, having three dimensions, selecting a specific memory cell requires the selecting of the specific layer which could be done by additional memory control lines such as select-lines. As been presented herein, some of the select lines could be integrated in the semiconductor layer in which the memory devices are built into (for example, FIGS. 8F and 85). Other select lines could be deposited or formed thru epitaxial growth. These memory control lines could therefore be comprising semiconductor materials such as silicon or conductive metal layers such as tungsten aluminum or copper. Such as FIGS. 3 and 4 of incorporated application U.S. 62/215,112.

Another alternative that would not require changes in the device structure presented is to use what could be called 'self refresh'. In a common DRAM refresh, a refresh cycle means that each cell is being read and re-written individually. In 'self refresh' many or even all cells could be refreshed together by driving a specific current (may be a current range or minimum current) through them. The cell holding 'zero' will keep its zero state and the cell holding 'one' will get recharged to recover their lost of floating body charge due to leakage. This technique had been detailed in a paper by Takashi Ohsawa et. al. in paper titled: "Autonomous Refresh of Floating Body Cell (FBC)" published in IEDM 2008, and in follow up paper titled: "Autonomous Refresh of Floating-Body Cell due to Current Anomaly of Impact Ionization" published by IEEE TRANSACTIONS ON ELECTRON DEVICES, VOL. 56, NO. 10, OCTOBER 2009, and U.S. Pat. Nos. 8,194,487 and 8,446,794, all of the foregoing are incorporated herein by reference.

Another type of memory is resistive-memory ("ReRAM") which is a non-volatile memory type. A 3D ReRAM has been described in U.S. Pat. No. 9,117,749, incorporated herein by reference. In general, ReRAM perform the memory function by having the resistivity change which could be achieved by driving current through the ReRAM variable resistivity medium and could be sense by measuring current or voltage through that medium. There are many types of materials that could be used for ReRAM and some of those are oxides with additional materials which could be driven into the oxide to change it resistivity. U.S. Pat. No. 8,390,326 incorporated herein by reference present the use of silicon oxide for such use. A subclass of the ReRAM are structure that allow only one time programing ("OTP") of these mediums such as presented in U.S. Pat. No. 8,330,189 incorporated herein by reference.

A form of T-RAM cell has been described in a paper by Ahmad Z. Badwan et. al. titled "SOI Field-Effect Diode DRAM Cell: Design and Operation" published in IEEE Electron Device Letters, Vol. 34, No. 8 August 2013, incorporated herein by reference. The T-RAM structured presented here and the method to process them could be adapted to build FED (Field-Effect Diode) structure and to form a 3D-FED RAM device.

A volatile 3D memory using floating body charge is described in U.S. Pat. No. 8,114,757, incorporated herein by reference, as related to at least FIGS. 30A-30M and FIGS. 31A-31K. The following is an additional alternative for forming a 3D DRAM volatile memory.

3D Memory may be multi-layers of 2D memory in which memory cells are placed as a matrix with rows and columns. These memory cells are controlled by memory control lines such as bit-lines, source-lines, and word-lines, usually in a perpendicular arrangement, so that by selecting a specific bit-line and specific word-line one may select a specific memory cell to write to or read from. In a 3D memory matrix, having three dimensions, selecting a specific memory cell requires the selecting of the specific layer which could be done by additional memory control lines such as select-lines. As been presented herein, some of the select lines could be integrated in the semiconductor layer in which the memory devices are built into (for example, FIGS. 8F and 85). Other select lines could be deposited or formed thru epitaxial growth. These memory control lines could therefore be comprising semiconductor materials such as silicon or conductive metal layers such as tungsten aluminum or copper.

Figure 3A:
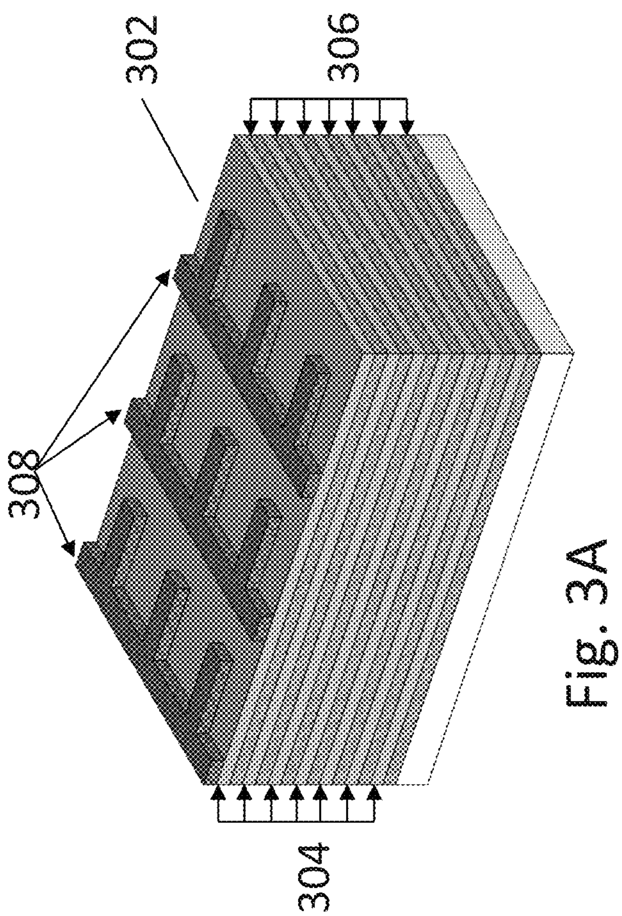
FIGS. 3A-3P are example illustrations of the formation and structure of a floating body 3D DRAM memory.

FIG. 3A illustrates a starting multilayer structure 302, comprising p-type or n-type silicon 304 and isolation or sacrificial layer in-between 306 formed by many of the processes presented herein. A hard mask 308 such as silicon nitride may be patterned on top for the following etch step. As been presented herein an important advantage of these 3D memories flow is the use of one lithography step to be affecting multiple layers. Many of the memory flows will utilize this concept.

Figure 3B:
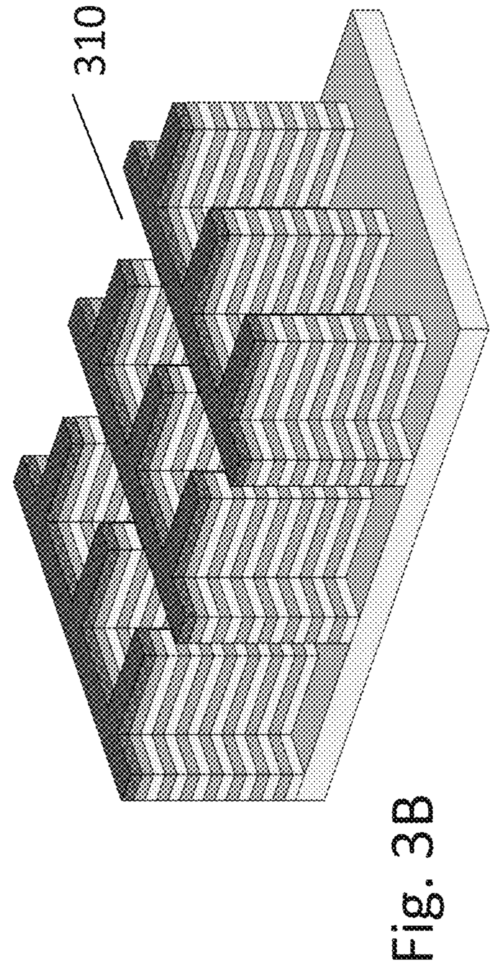

FIG. 3B illustrates the multilayer structure 310 after an etch step.

Figure 3D:
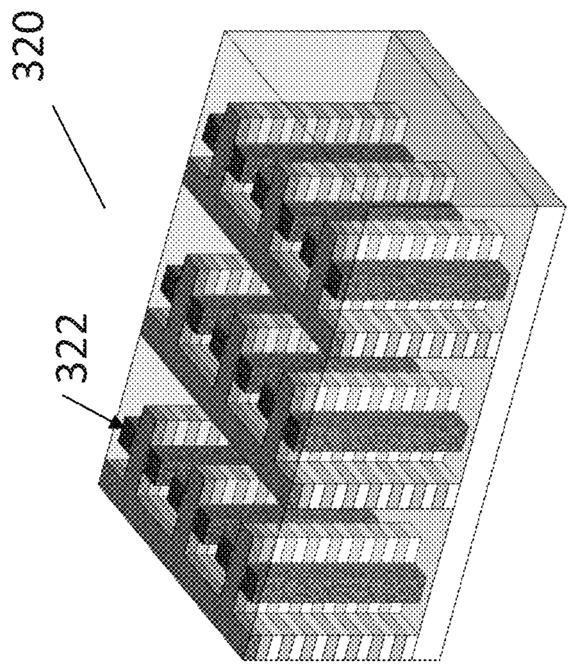
Figure 3C:
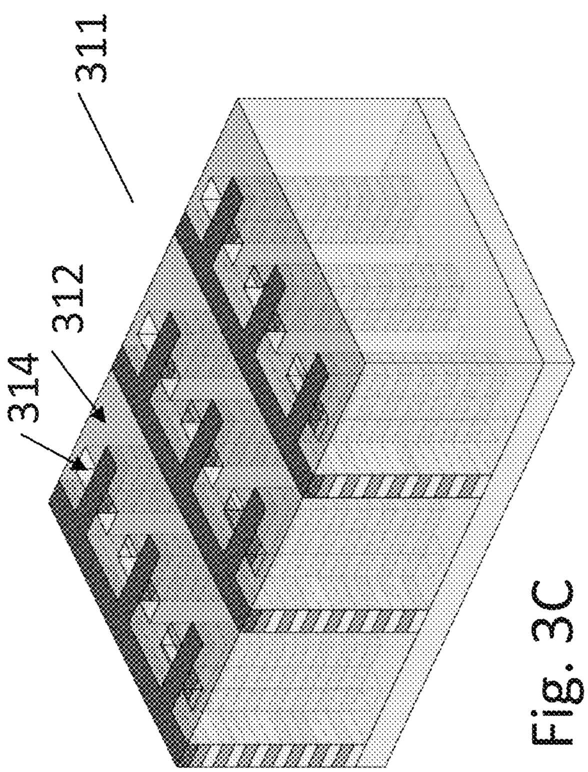

FIG. 3C illustrates the structure 311 after deposition of isolative material 312, such as SiO2, and etching holes 314 for the following step of gate stack.

FIG. 3D illustrates the structure 320 after forming the gate stack 322. The gate stack may include agate dielctric and a gate electrode material, which could be formed by CVD or ALD of first a gate oxide and then gate material which could be metal or in-situ doped polysilicon. A high quality thermal oxide may also be utilized via techniques such as radical oxidation. For example, by a TEL SPA (slot plane antenna) tool/machine, wherein oxygen radicals are generated and utilized to form thin thermal oxides (generally of single crystal silicon) at less than 400 deg C. The gate formation could be two independent side gate columns as illustrated or tied double gate or even gate all around. For the gate all around, it may require that the step of etching the gate holes 314 will include a non-directional isotropic etch step to etch the in-between layer to allow the following gate all around formation.

Figure 3E:
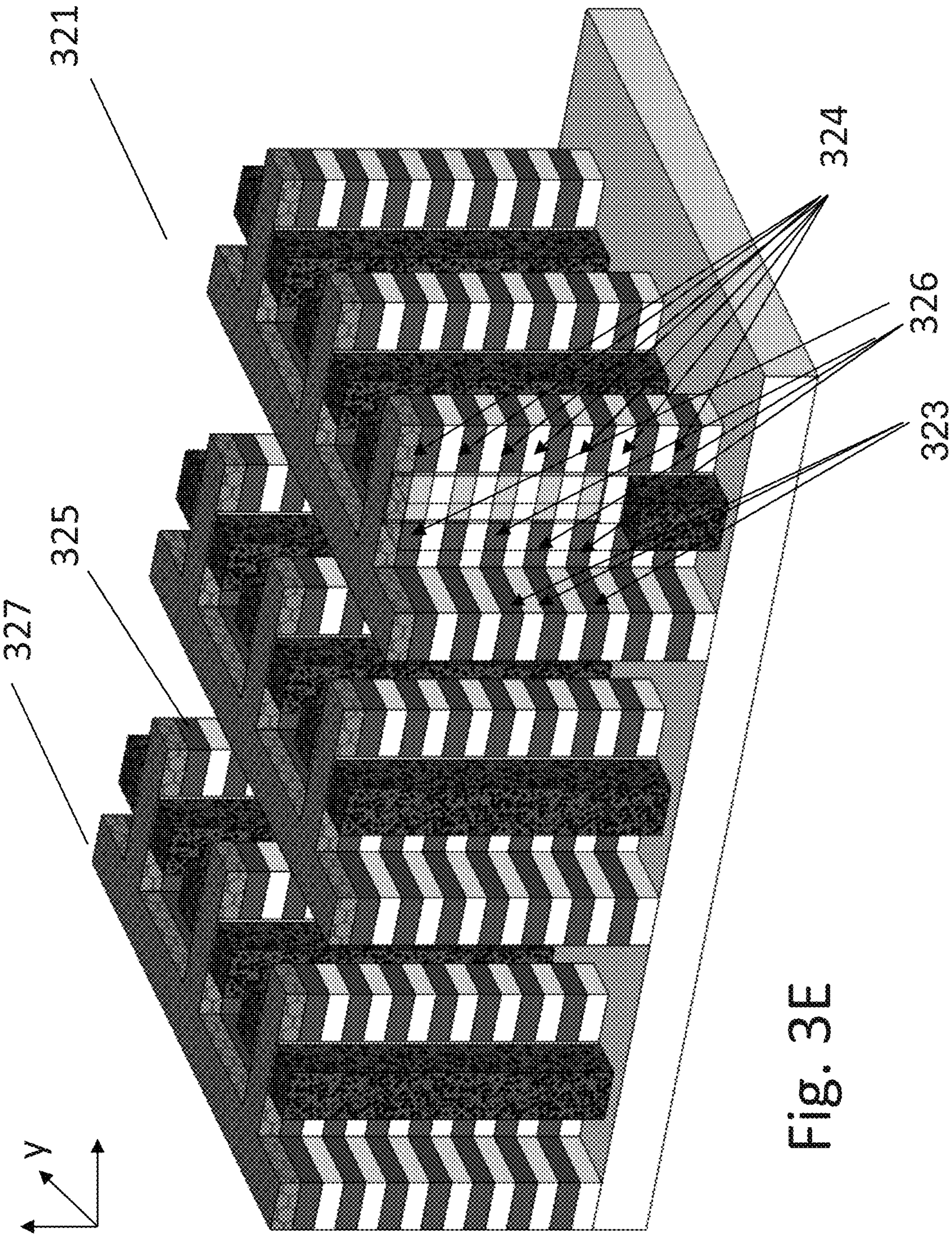

FIG. 3E illustrates the structure 321 after stripping off the dielectric 312, and then a step of diffusion doping to form the source 324 regions and the drain regions 326. The source regions 324 would be connected to the source line ("SL") and the strip of the drain regions 323 would become later part of the bit-lines ("BL"). Alternatively, the SL and the BL can be used interchangeably depending on the array arrangement. These diffusion doping will convert all the exposed silicon areas that are not protected by the gates structures 322 from p type to n+ type or n type to p+ type. This will form transistors in the small pin structures 325, while the common strips 327 would serve as simple conductor acting as the bit-lines or the source-lines for the memories that could be formed by the pins transistors 325.

Figure 3F:
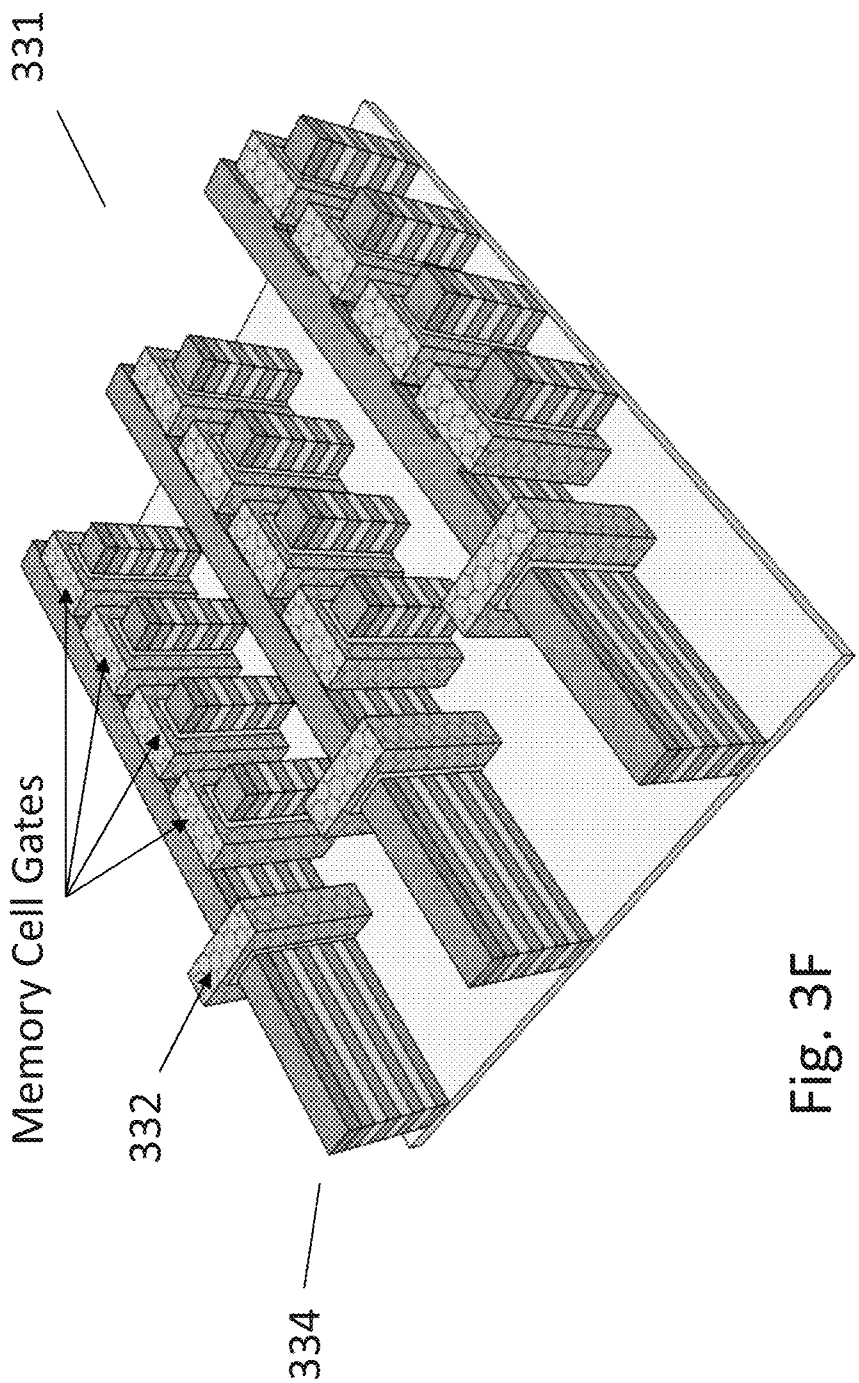

FIG. 3F illustrates the structure 331 with extension of the bit lines 334 which could be used for a stair-case per layer access. An optional select gate 332 could be used to select memory branch.

Figure 3G:
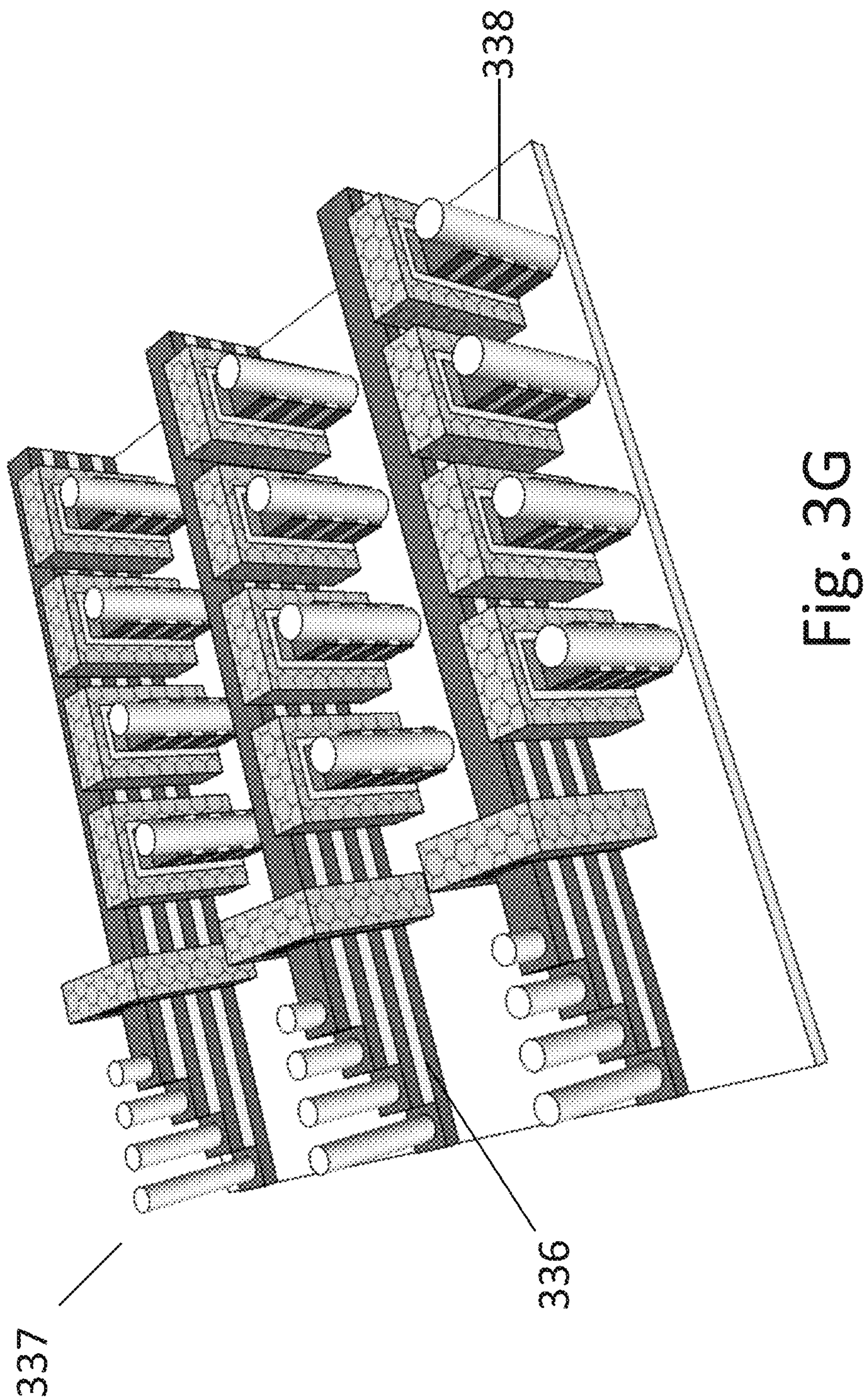

FIG. 3G illustrates the structure 331 after forming staircase 336 of the bit line extension 334 and after forming the vertical connections to the bit-lines 337 and to the transistor sources 338.

Figure 3H:
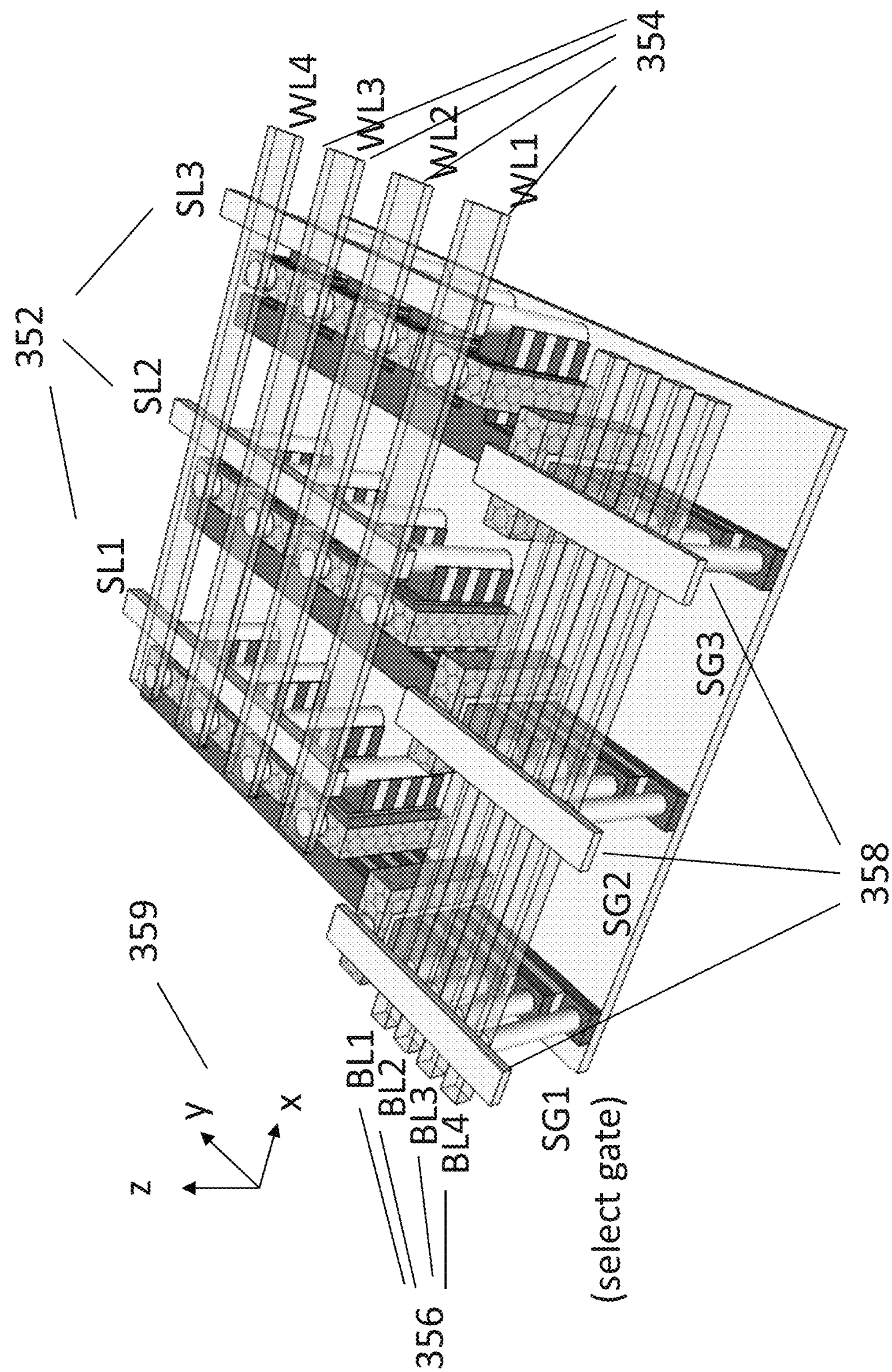

FIG. 3H illustrates the structure after adding the grid of connections. The illustration is one option for structuring bit-lines 356, select-gate lines 358, source-lines 352 and word-lines 354. We can call the direction x, y, z as illustrated by the corner direction 359. These connectivity structure allow selecting a specific cell such that select gate lines 358 allow selecting the 'x' location by selecting the 'x' branches, the word-lines 354 select the 'y' location by selecting the gates in 'y' direction, and the bit-lines 356 select the 'z' location by selecting the drain in 'z' direction. The optional select-gate lines 358 allow selecting of the bank of transistors in the bank along 'x' direction.

Figure 3I:
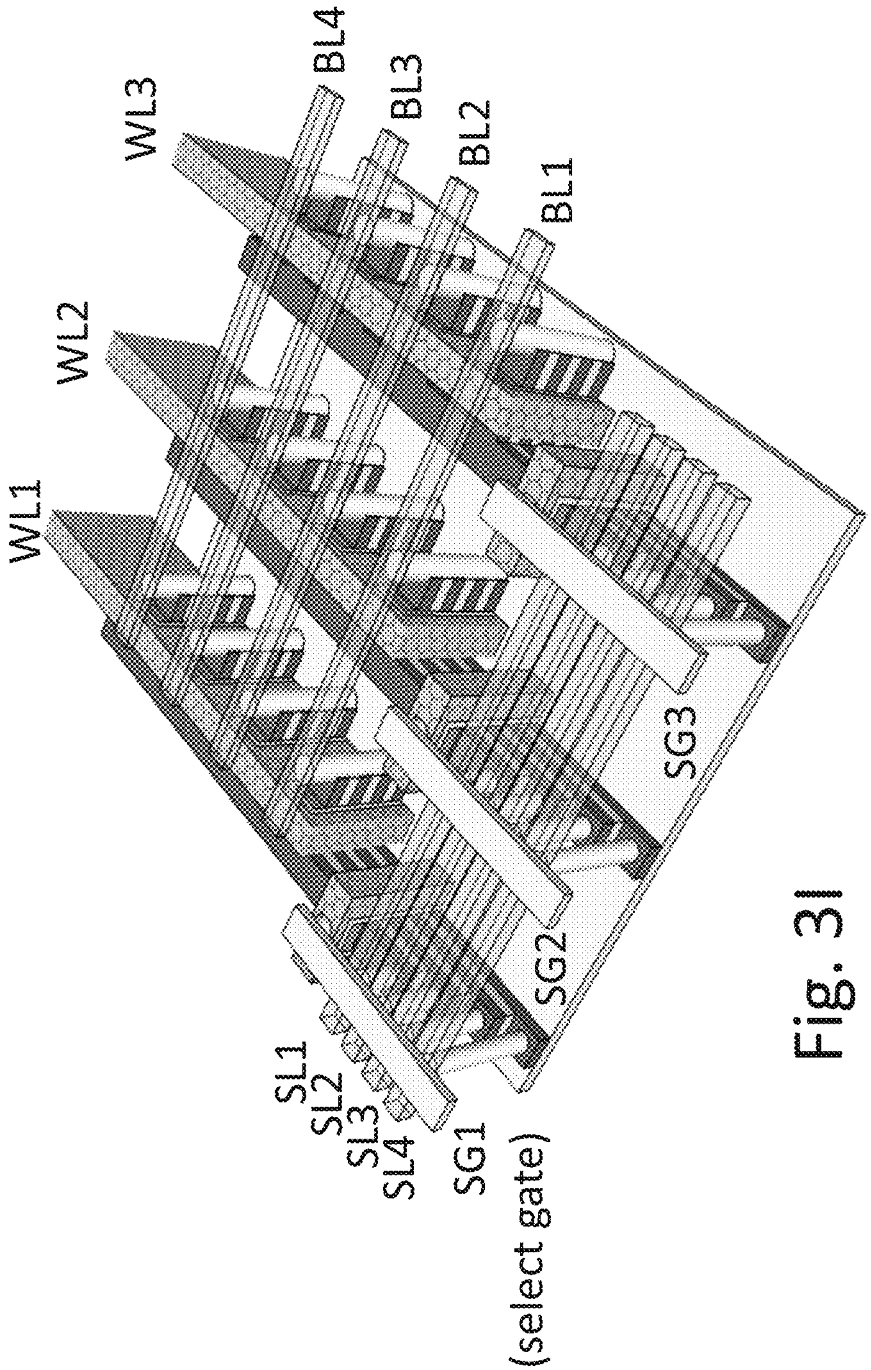

FIG. 3I illustrates the structure after adding the grid of connections with an alternative structure of word-lines and bit-lines. The gate material is common along the multiple pins, which would serve as simple conductor acting as the word-lines.

Figure 3K:
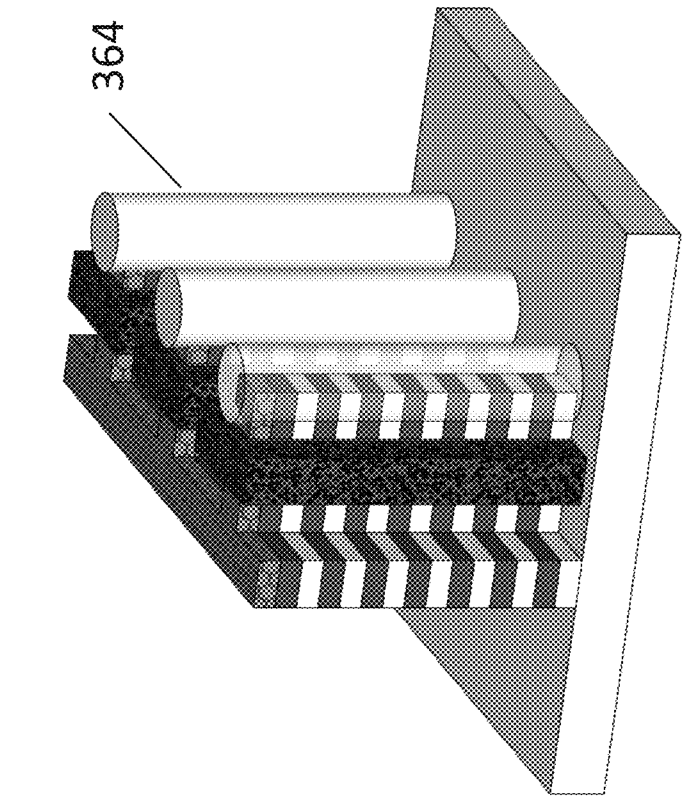
Figure 3J:
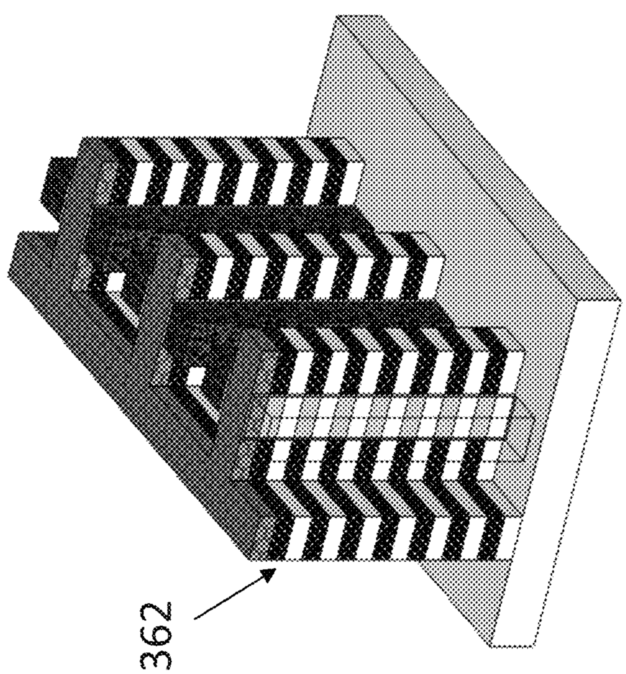

FIG. 3J illustrates optional silicidation of the bit lines 327 to reduce their resistance. First only the areas designated for silicidation 362 are being exposed while all other areas are being protected by photoresist or isolation oxide. Then a metal such as Ni, Ti, Co, or other known in the art material, is deposited making contact with the bit lines side walls 362. Then thermal reaction is achieved by the use of Rapid Thermal Anneal (RTA) or laser anneal. Then the unreacted metal is etched away.

FIG. 3K illustrates a 3D memory of 3 column structure. The transistors source forming the memory cell are connected by vertical line 338 of FIG. 3G connecting with the transistors source side wall. It is enlarged view at FIG. 3K. As alternative to deposition this conductive vertical column 364 a selective epitaxy process could be used to form this vertical connection.

Figure 3L:
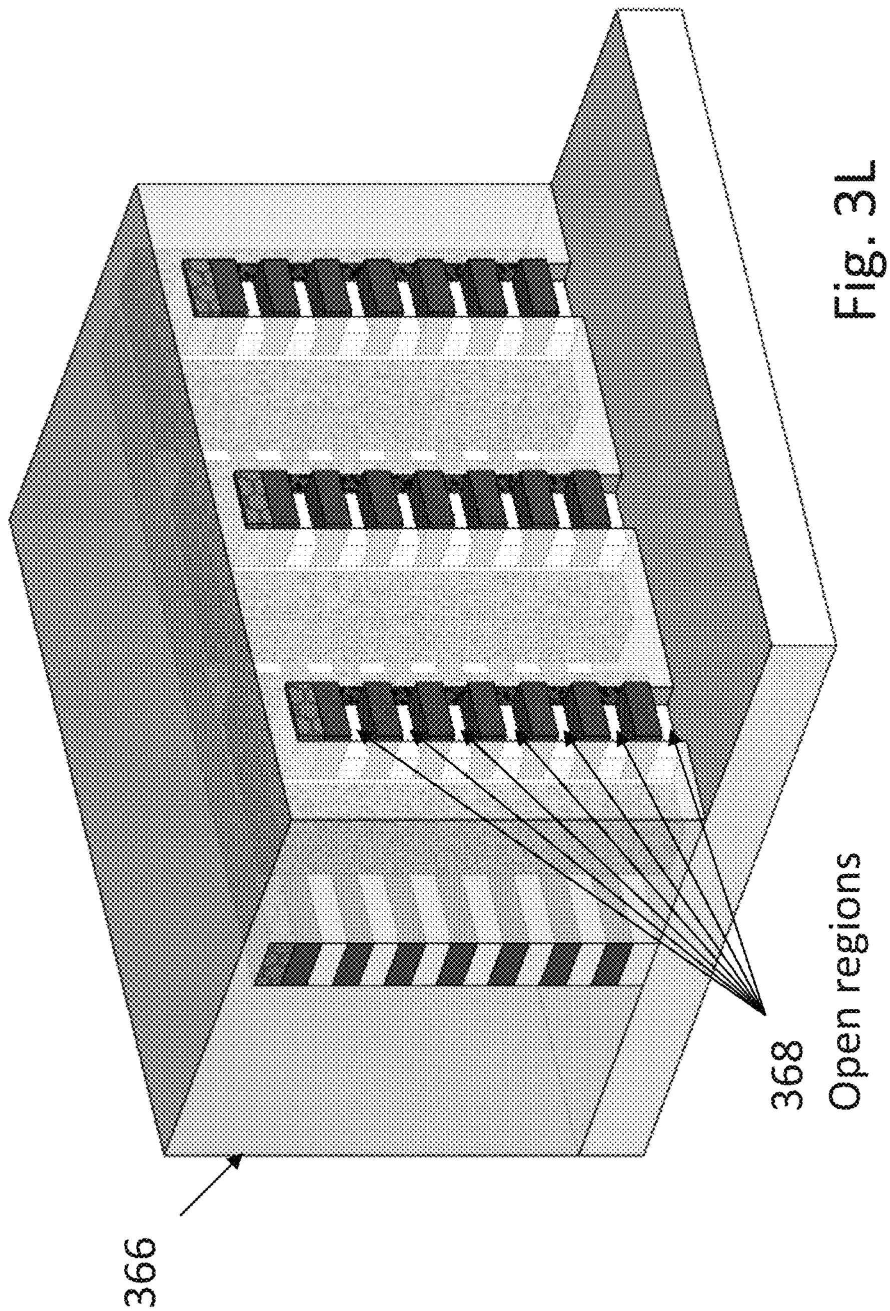

FIG. 3L illustrates the structure with protective cover of oxide or other protective material 366 and trench opening the side walls of the memory transistors source 368. The opening of the trenches 366 could include a step for selective removal of part of the vertical isolation between the sources of the stack transistors.

Figure 3M:
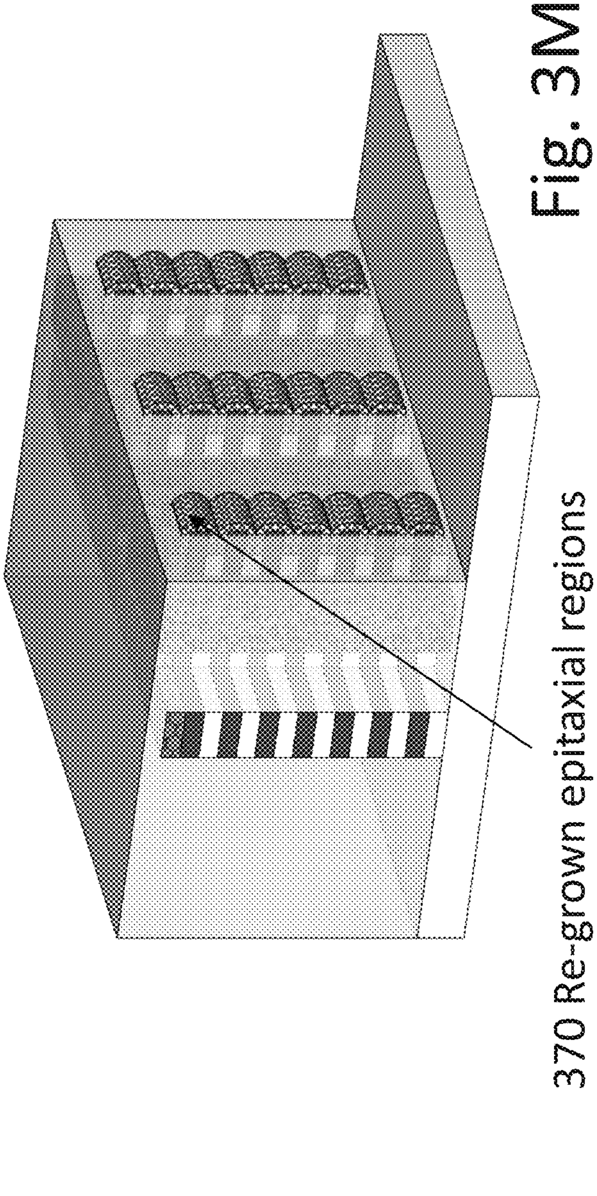

FIG. 3M illustrates the structure after a step of epitaxial growth for forming a vertical column connecting all the sources in a stack 370. These columns could be silicide to further improve their connectivity.

Figure 3N:
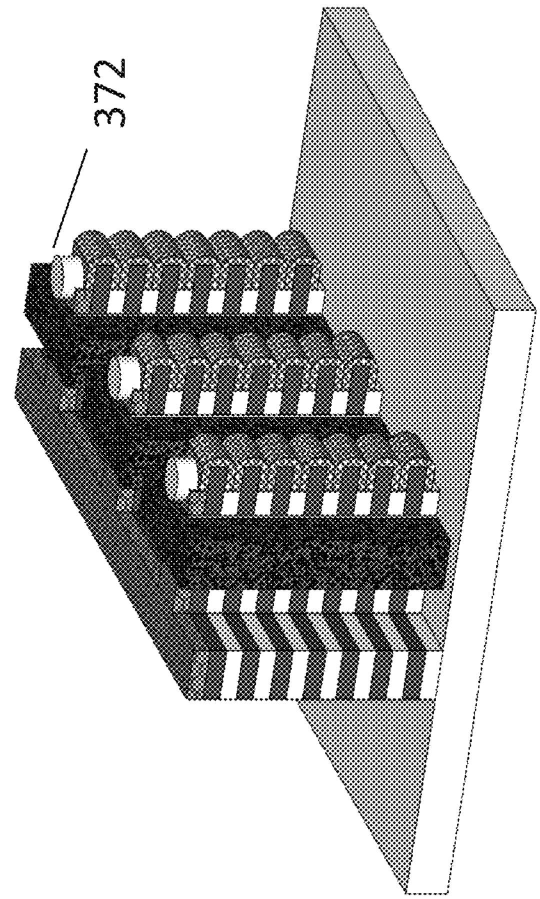

FIG. 3N illustrates the structure after adding contacts 372 from the top.

The illustrations in FIGS. 3A-3N were made for ease of drawings and understanding. Persons skilled in the art would understand that techniques common in memory design could be used to increase memory bit density. Such as mirroring the transistors along the bit lines sharing the bit lines for right side transistor and left side transistors and mirroring across source side sharing the vertical source lines. Such structure is been illustrated in U.S. Pat. No. 8,114,757, as related to FIGS. 30A-30M and FIGS. 31A-31K.

Figure 3O:
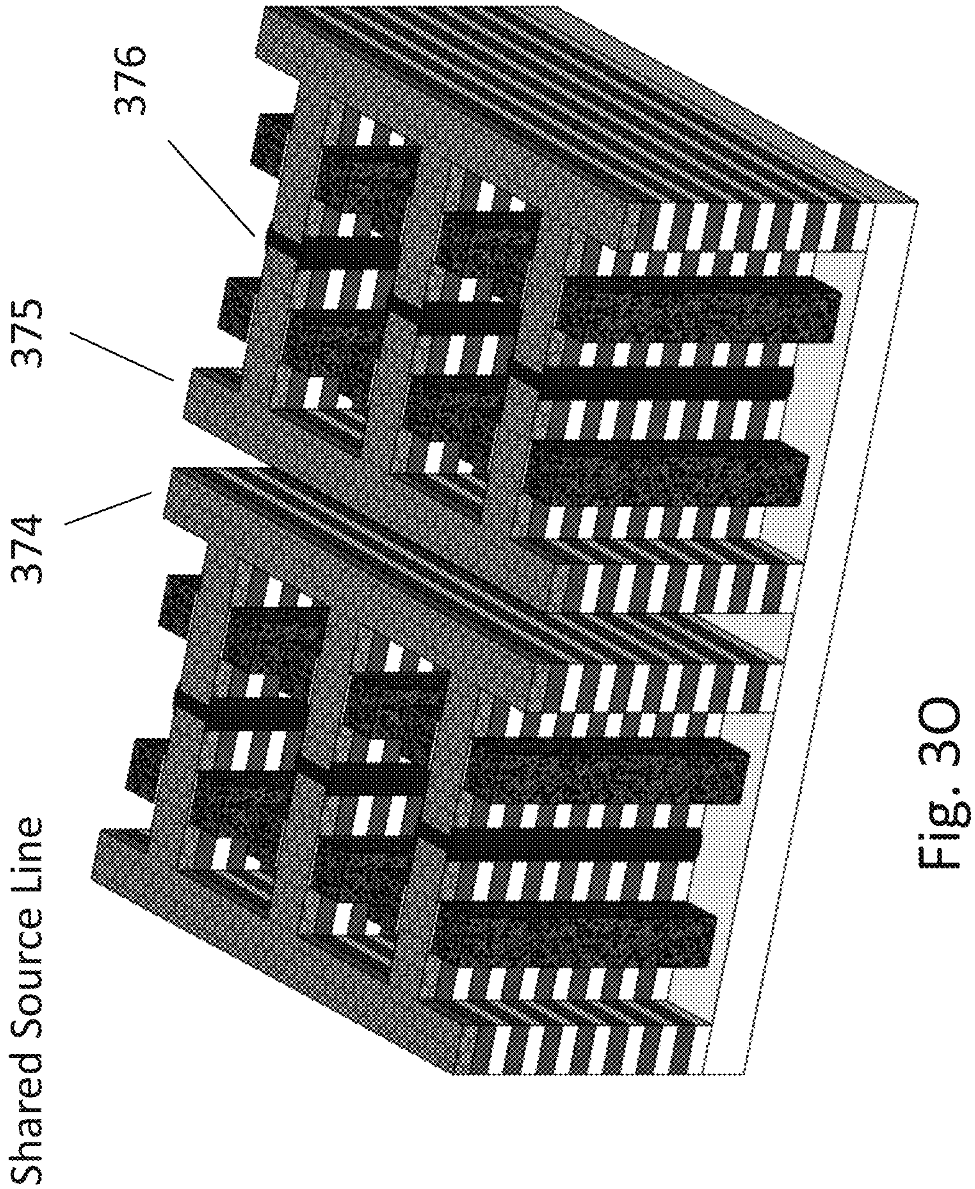

FIG. 3O illustrates another alternative where the vertical line connecting the source side of the stack transistors 376 are shared but the horizontal in silicon bit-lines first bit-line 374 and second bit-line 375 are not shared. One advantage of not sharing the bit-lines first bit-line 374 and second bit-line 375 is the option to add silicidation as was described in respect to FIG. 3J.

Figure 3P:
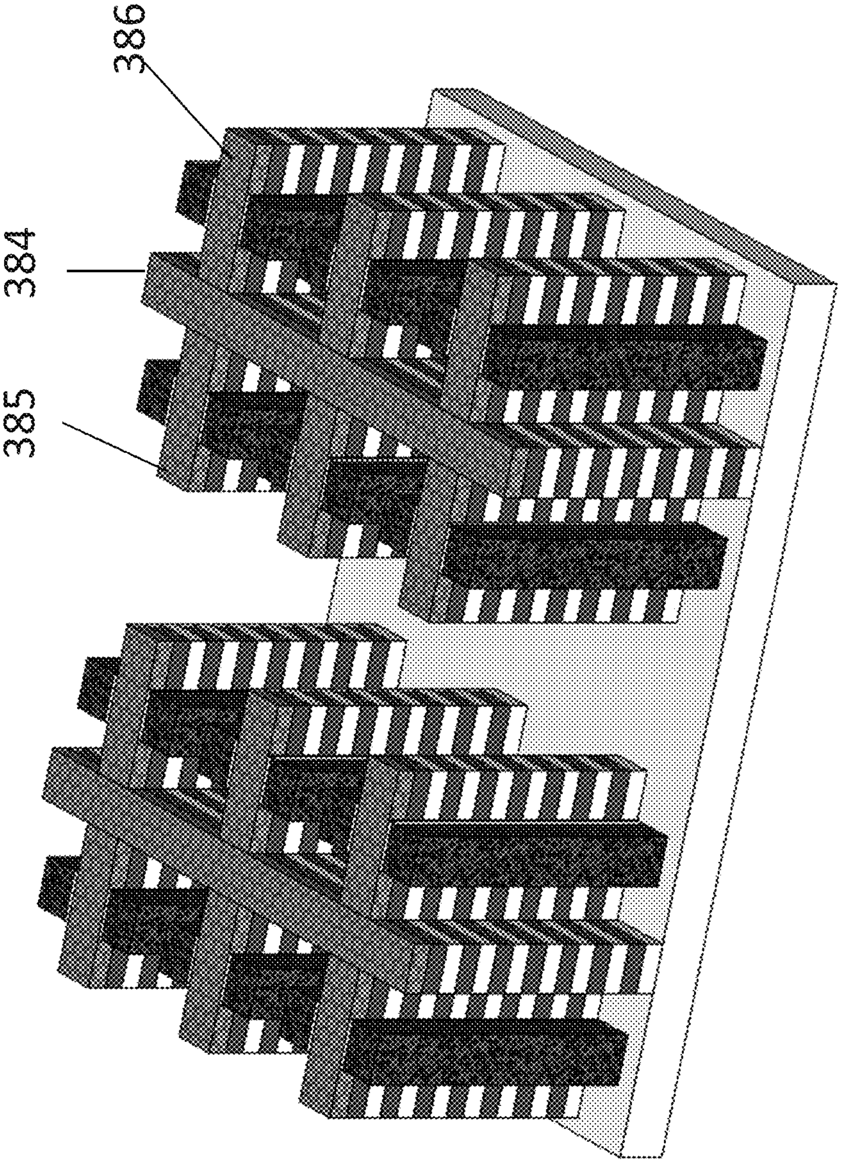

FIG. 3P illustrates another alternative where the horizontal bit lines of the stack transistors 384 are shared but the vertical line connecting the source side of the stack transistors first xtor 385 and second xtor 386 are not shared.

Figure 4A:
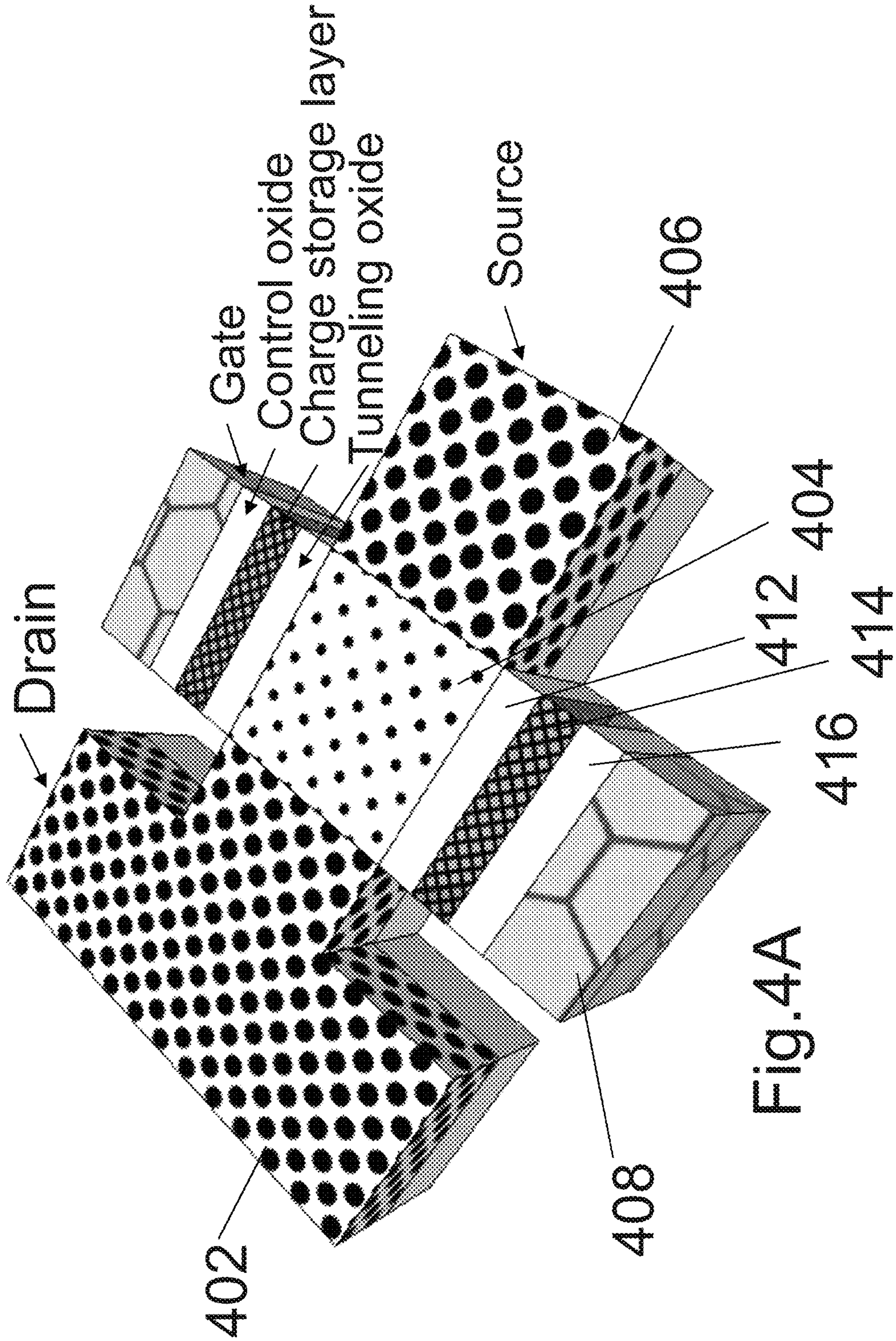
FIG. 4A is an example illustration of a non-volatile floating body cell.

FIG. 4A illustrates a charge storage (may be a floating-body or charge trap, etc.) memory cell, of the type utilized for 3D RAM such as illustrated with respect to FIG. 3A-3P herein, enhanced to support a non-volatile option by adding between the gate 408 and the channel 404, charge storage layer 414 isolated with tunneling oxide 412 and isolating control oxide 416. The memory cell may include n type drain 402, p type channel 404 and n type source 406. The process forming the tunneling oxide 412, charge storage layer 414, control oxide 416 and gate 408 could be utilizing successive steps of ALD (Atomic Layer Deposition) or other type of deposition process, in place of single gate layer deposition described before. Such memory is sometimes referred to as universal memory. Each memory cell could function as high speed volatile RAM and also as low power non-volatile floating gate or charge trap memory. For some applications the combination of high speed RAM with low power non-volatile built in back-up could be attractive. Such a dual use channel is also presented in U.S. Pat. No. 7,158,410, and papers by J. W. Han et al. titled "A Unified-RAM (URAM) Cell for Multi-Functioning Capacitorless DRAM and NVM" published by IEDM 2007 and by Dong-Il Moon et al. titled "Evolution of Unified-RAM: 1T-DRAM and BE-SONOS Built on a Highly Scaled Vertical Channel" published at IEEE TRANSACTIONS ON ELECTRON DEVICES, VOL. 61, NO. 1, JANUARY 2014, all of the forgoing incorporated herein by reference.

Figure 4B:
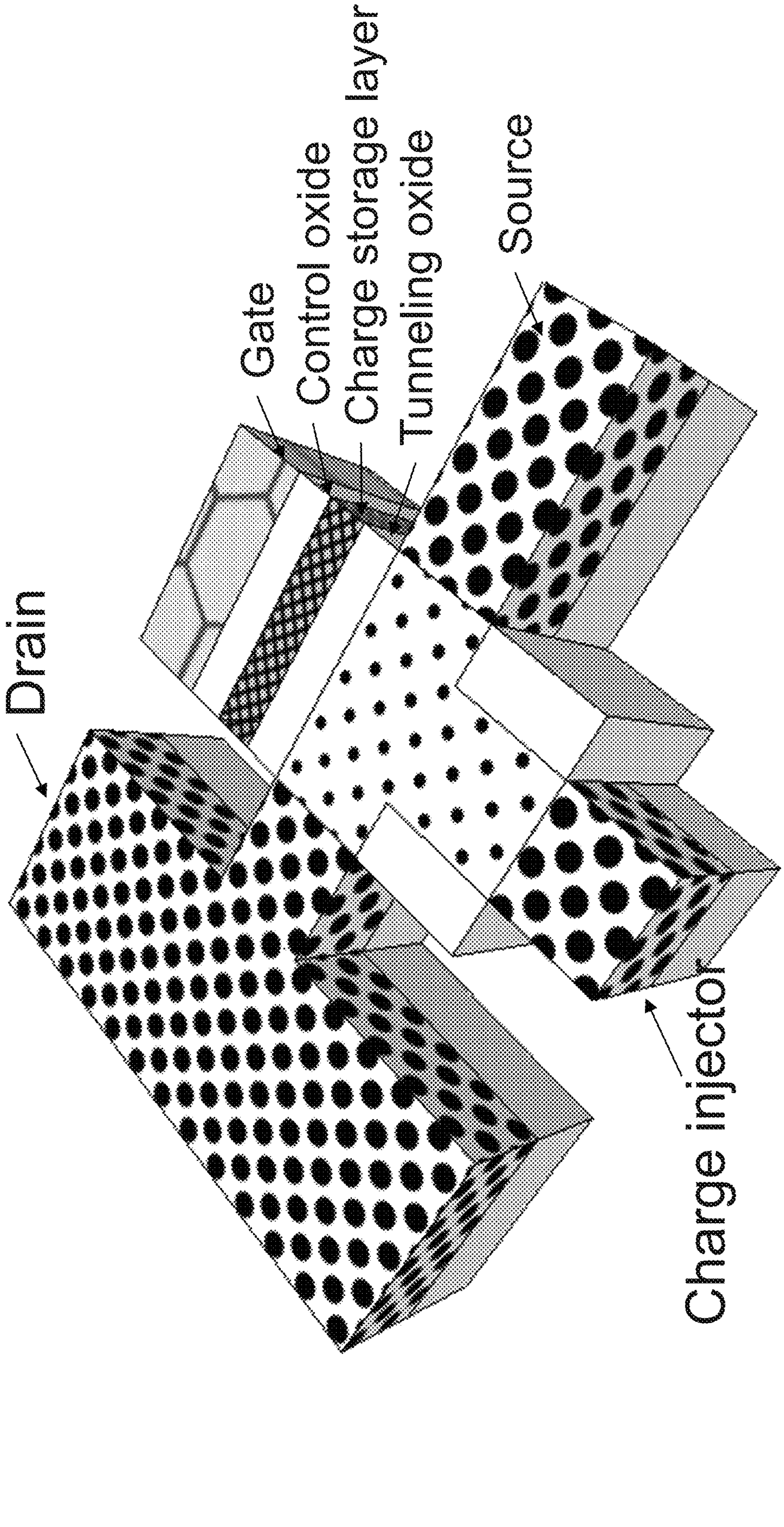
FIG. 4B is an example illustration of a stable two states one transistor memory structure 3D DRAM memory cell.

FIG. 4B illustrates enhancements supporting the non-volatile memory option concept of FIG. 4A to the 3D memory illustrated as related to FIG. 3A-3P.

Figure 4C:
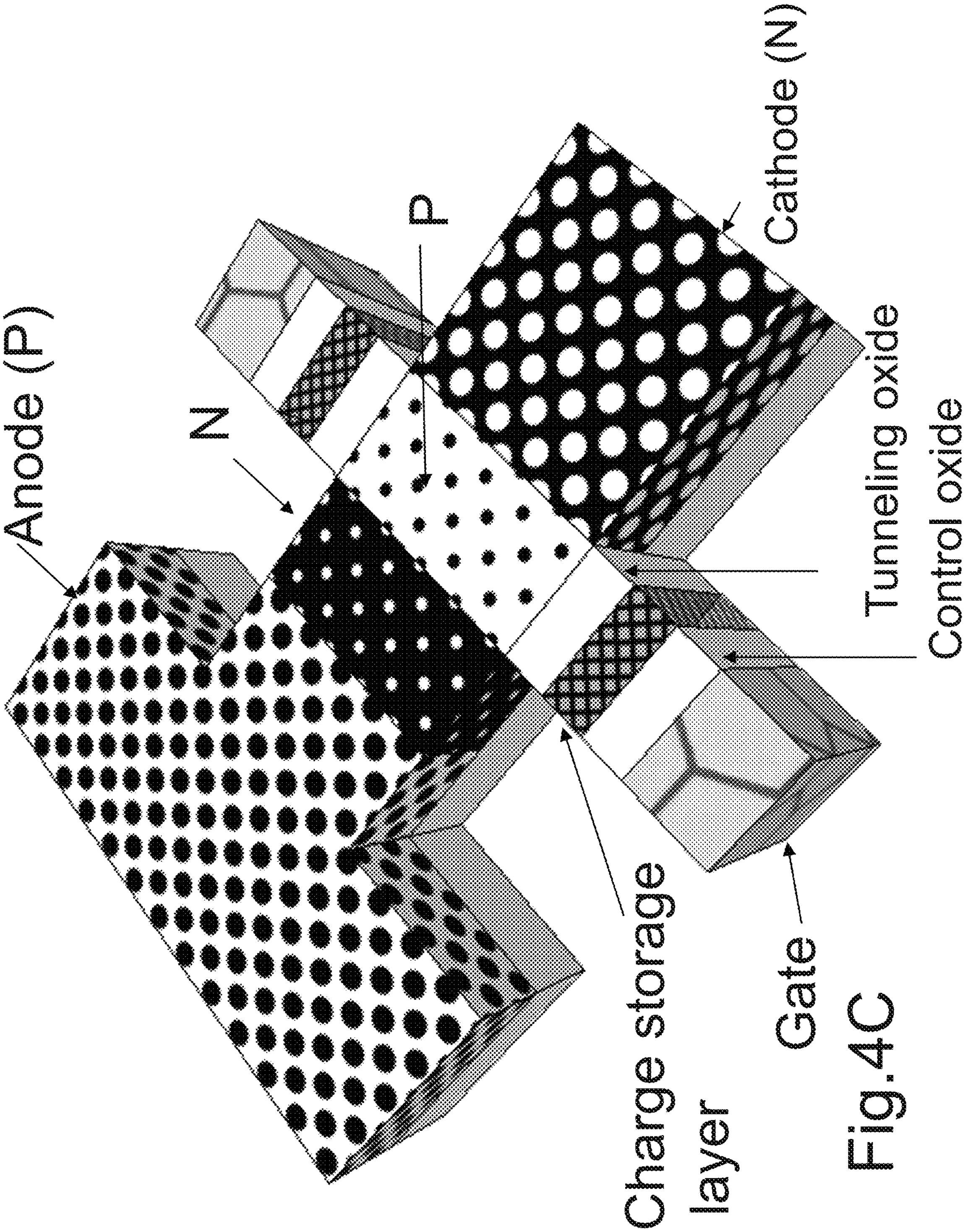
FIG. 4C is an example illustration of a non-volatile 3D TRAM memory.

FIG. 4C illustrates enhancements supporting the non-volatile memory option concept of FIG. 4A to the 3D memory illustrated as related to FIG. 14A-14H of U.S. Patent Application No. 62/221,618, incorporated herein by reference.

In U.S. Pat. No. 8,902,663, incorporated herein by reference; a select transistor is presented at the upper layer of a 3D memory cell column as presented in respect to FIG. 8 and the related description there. Such per column select transistor could be effective for many of the memory structures presented herein. In many of these structures this top layer select transistor could be processed together with the transistors forming the memory cell underneath by sharing the same lithography process and other processes, thus the top select transistor ends up being at least partially self-aligned with the memory cells underneath it. Having these select transistors could give additional control flexibility and could provide a buffer to the memory cells to improve overall memory access speed and assist the read or write operations. In the following a detailed description is provided for the process to add such select transistors to one of the 3D T-RAM structure presented herein. It would be obvious for a semiconductor memory artisan to apply the concept to many of the other memory structure presented herein.

Figure 5D:
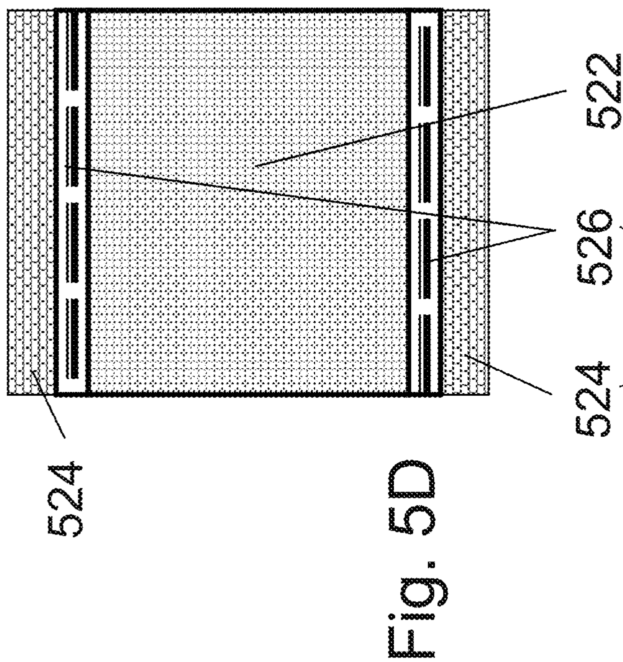
FIGS. 5A-5D are example illustrations of 3D memory arrangements.
Figure 5C:
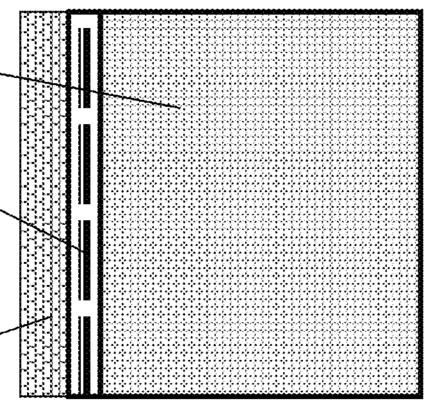
Figure 5B:
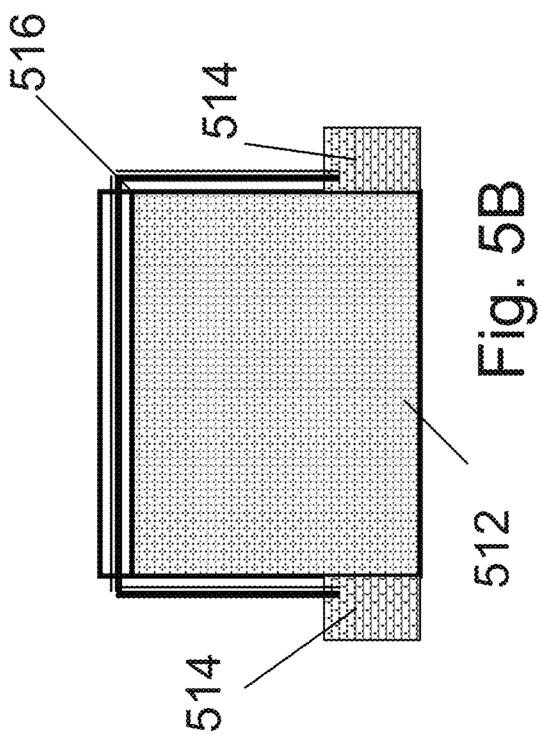
Figure 5A:
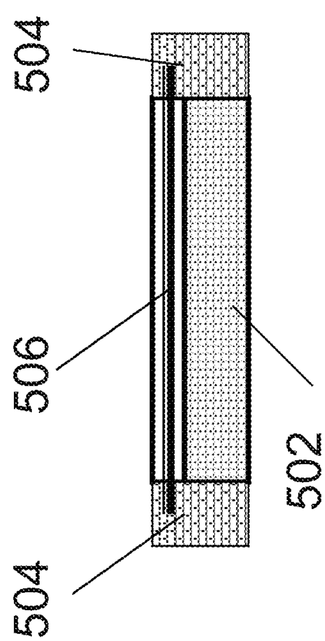

FIG. 5A illustrates prior art 2D memory device. The memory cells 2D matrix 502 is surrounded by memory control circuits 504 such as decoders, sense amplifiers and interfaces with external devices. Circuits 504 are called accordingly memory peripherals. The memory control lines 506 are miming across the memory array columns and rows all the way to the peripherals circuits.

FIG. 5B illustrates side view side view cross-section of cross section of prior art 3D memory device. Recently 3D memory also known as 3D-NAND has been released to the market. In such 3D NAND the memory cell 3D matrix 512 is still surrounded by the memory control circuits 514 such as decoders, sense amplifiers and interfaces with external devices. These memory peripherals circuits are being processed in very similar way to the 2D memory circuits on the silicon wafer substrate. In these 3D memories the control lines 516 are miming through the memory array columns and rows all the way across the memory matrix, some of these control lines are being built on top of the 3D matrix and some of those going through the bulk body of the memory matrix but at the edges they are brought down to the 2D peripheral circuits.

FIG. 5C illustrates side view cross-section of a 3D memory formed in accordance with the present invention using the techniques presented herein. The 3D memory matrix 522 comprises columns and rows having the control circuits 524 which could still be called peripherals circuits but they could be formed on top of the memory matrix. According to this embodiment, control lines 526 are built underneath the peripheral circuits, in-between the peripheral circuits 524 and the memory matrix 522.

FIG. 5D illustrates a side-view cross section of an alternative 3D memories formed using the techniques presented herein in which the control lines and the control circuits are also underneath the memory cell matrix.

This new type of 3D memories could be constructed to achieve significant advantage over the prior art by utilizing the 3D architecture as illustrated in at least FIGS. 5C and 5D, to break the control lines 526 into smaller chunks with the control circuits being repeated for each chunk. Shorter control lines could allow reduction of memory access read and write and refresh and could allow faster memory access time. The stair-case for layer access could impact device cost if it is repeated too often. Proper architecture and overall memory control strategy could use long per layer control lines (not shown) to save staircase overhead area. Accordingly, the memory architecture should be designed to use long control lines to the memory within the same layer for as long as possible so having the other (vertical) control lines relatively short while the per layer control lines are still long, could achieve the benefits of low power and fast access maintained for most of the time.

As was discussed in respect to FIG. 4A, FIG. 4B, and FIG. 4C these 3D memory could be enhanced to include dual functionality—a high speed volatile memory and a low power low speed non volatile memory. These figures illustrate non-volatile cells utilizing charge trap or floating gate technology. Alternatively other non-volatile memory technologies could be implemented such as Re-RAM, M-RAM, Phase-Change, etc. For some of these other non volatile technologies it might be preferred to split the gates on the side of the memory cell channel so one side will control the volatile function and the other side could control the non-volatile function. Alternatively splitting the gate could be used to increase the non-volatile memory denisty for cells that the channel is wide enough to allow 2-bit per cell techniques.

In most cases the volatile operation could interfere with the non-volatile operation of the memory cells. So it is common to avoid using them together, and to have the unused portion electrically reset to reduce interference with the used portion There are many use modes which such enhanced memory could be used including, splitting the memory bank for volatile and non-volatile portions, power down with saving the volatile information into the non-volatile portion, and reduce sleep power by moving the volatile information into the non volatile portion. For some of these use modes the 3D structures presented in here with control circuits on top and/or on the bottom—FIG. 5B and FIG. 5C—could be constructed for enhanced effectiveness. For these modes the time and the power required to move the data from the volatile portion into the non volatile portion, could be reduced by order of magnitude.

Figure 6A:
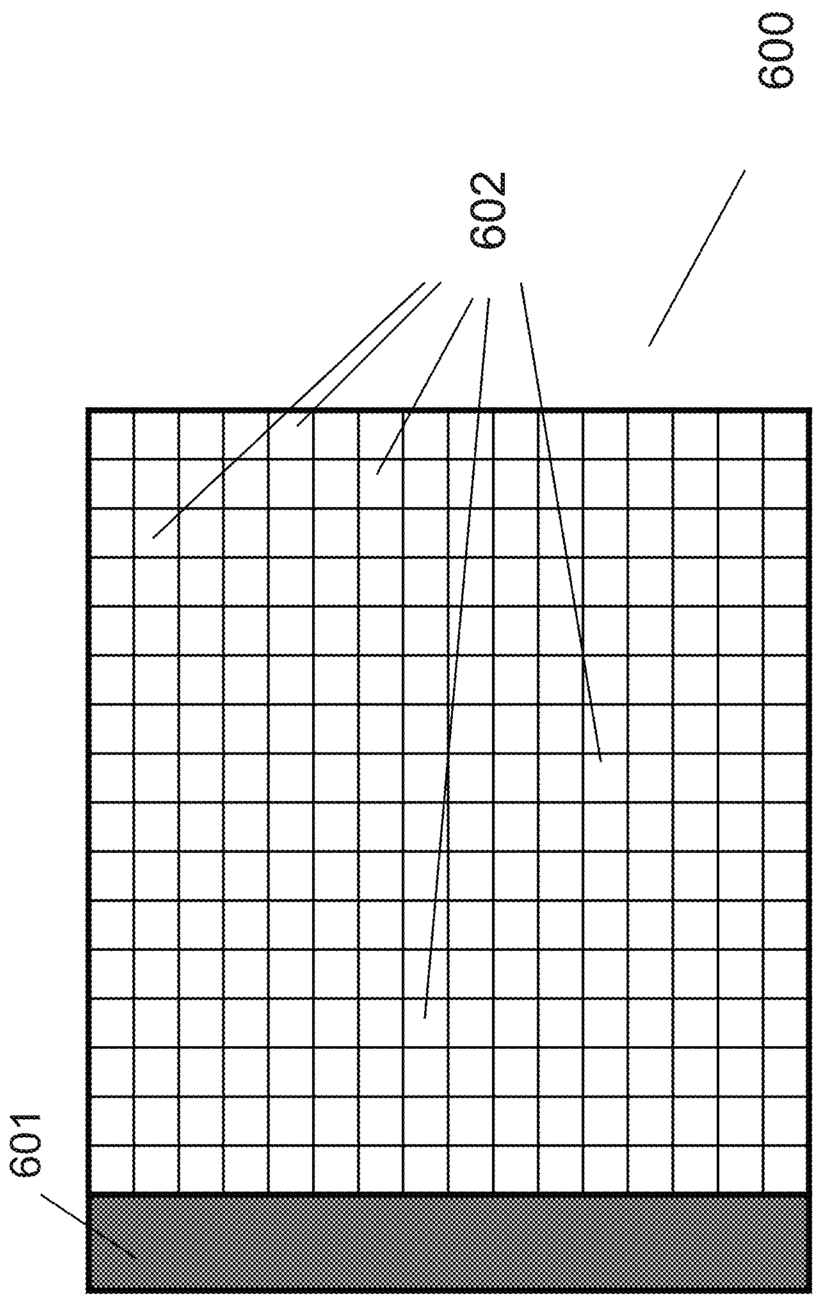
FIGS. 6A-6B are example illustrations of the formation and structure of 3D Memory with dual functionality.

FIG. 6A illustrates the top view construction of 3D memory 600 for such enhanced operation. The side memory control circuits 601 control the interface to external devices both for instruction, and data in and out. These circuits 601 could include the per-layer decoders and control to support all internal memory blocks so the stair-case area overhead could be minimized. The 3D memory is than partitioned to many blocks 602 each is a sub-memory structure with its own top peripherals circuits to control most of its control lines. In such design the operation of moving data from one portion to the other (for example, one block 602 to another block 602) could be done in parallel in all the units reducing the time and power by orders of magnitude. The side memory control circuits 601 could synchronize these operations so it will be done one layer at a time.

Figure 6B:
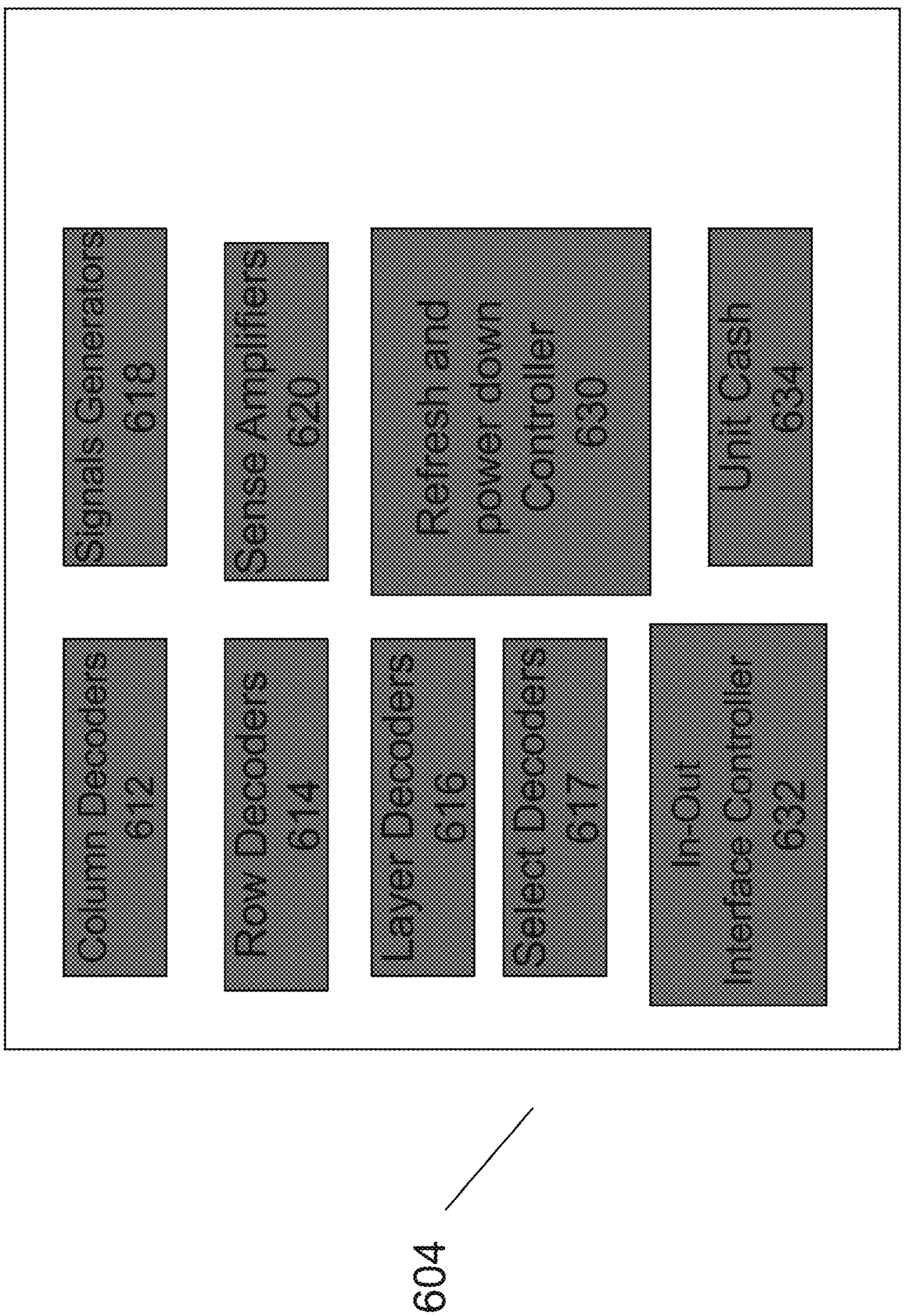

FIG. 6B illustrates the block diagram of peripherals circuit of a block 602. The block diagram 604 of such unit block control circuits could include:

Central controller 630 commanding and controlling these operations for sleep mode recovery mode etc.

In-Out interface controller to interface with data and with the device controller 601.

Sense Amplifiers 620 to sense the data of a memory cell according to the mode of operation and to convert side memory control circuits 601 to a digital bit which could be temporarily stored in the unit memory cash 634.

Signal generators 618 to generate the required voltages and current for the proper read write of the memory cells. Some of these circuitry, such as charge pumps, could be shared by all units and be placed in side memory control circuits 601.

Blocks 612, 614, 616, 617 for the various control lines such as bit-lines, word-lines, gate-lines, select lines etc. The layer decoders 616 might be removed from the unit 604 into the general per-layer circuits at side memory control circuits 601.

Additional advantage for such memory architecture is the potential ability to move in and out very large blocks of data as many blocks 602 could be accessed in parallel. If only a single per-layer stair case is used for maximum array efficiency than the parallel action would be limited to single layer at a time. For many applications this could be managed by proper system data structure and control.

Such 3D Memory could include redundancy circuitry to allow repair of control functions as well as replacement of faulty memory bits. The architecture of FIG. 5D could be used to allow access to substantially all of the memory control lines from both side—top and bottom and to have duplication of the device control circuit 524 at the bottom. Such redundancy scheme could be broken down to the memory block control units 602 level. So if one unit block control circuits are faulty then it is replaced by its compatible one on the other end/side. Alternatively each unit block control circuitry could be built with two stratum one being a back-up for the other as was detailed herein before.

The memory control redundancy could be applied to any of the 3D memories herein.

Another embodiment of monolithic 3D memory according to the present invention is demonstrated in FIGS. 7-13 and outlined below. It utilizes mono-crystalline transistors whose channels are vertically oriented so the current flows vertically through the device across each of the device layers rather than horizontally along the device layers. Yet, this structure is designed to be low cost by sharing lithography, etch and deposition of multiple layers together forming self-aligned vertically oriented transistors.

Figure 7A:
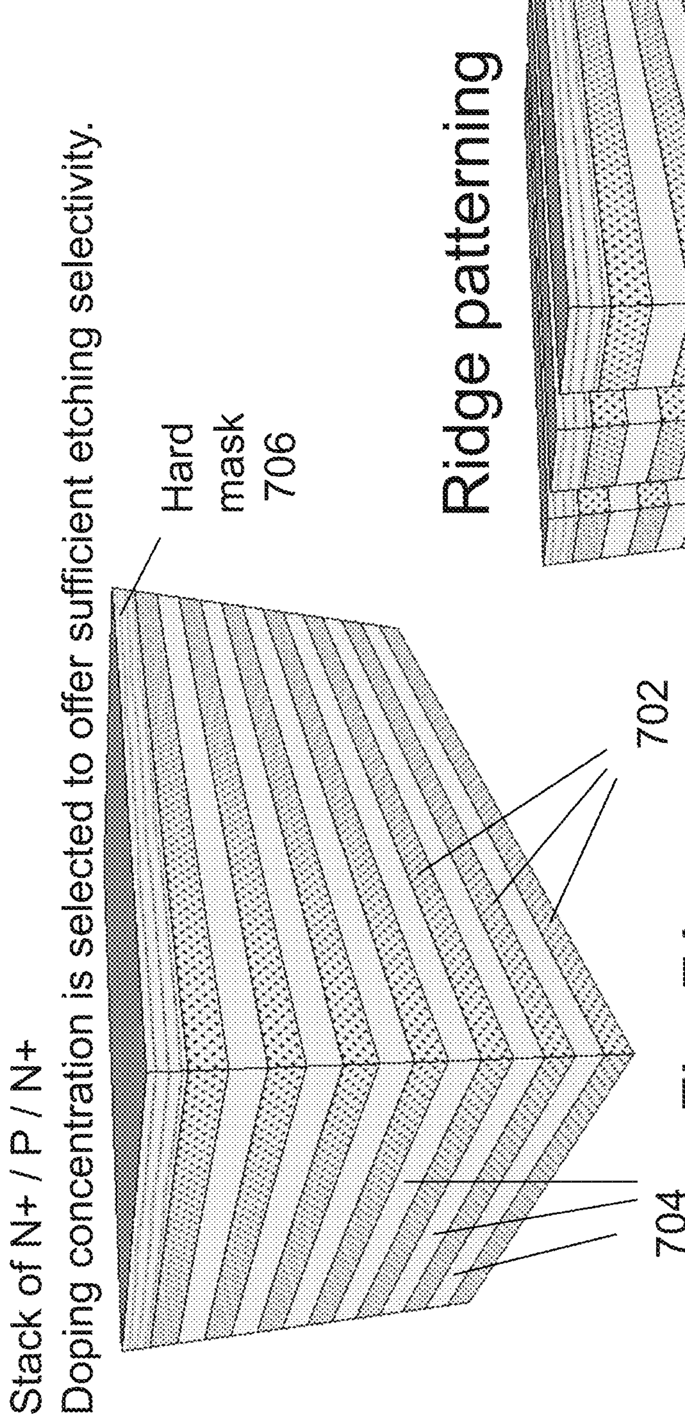
FIGS. 7A-7H are example illustrations of the formation and structure of vertically oriented 3D memories.

FIG. 7A illustrates the starting material structure for these vertically oriented 3D memories. It has interchanging layers of designated source/drain (S/D) material 702 over designated channel material 704. These layers could be processed by epitaxial steps with in-situ alternating N/N+ type to P/P+ type doping and/or between alternating silicon to SiGe layer, etc. The selection of the composition of these layers could include consideration of a choice of a high etch selectivity process between adjacent layers to enable faster etching of the designated channel layers 704 than the (S/D) layers 702. The thickness of these layers could be from a few nm up to hundreds of mn Suppression of dopant diffusion may be accomplished by use of low temperature epitaxial processes, for example the AMAT 450-500 deg C. epi process. As well, interlayer diffusion barriers may be employed, for example, such as a thin single or double atomic layer of a diffusion suppressor, such as carbon.

For example the composition of the S/D layers 702 could be N+ silicon while the channel layers 704 could be P type silicon and the selective etch process would utilize anodic etching as detailed in U.S. Pat. No. 8,470,689 and as was described herein.

An alternative is to use P++ silicon for the S/D layers 702 and N silicon for channel layers 704 and the later selective etch would utilize the $NH_4OH$ solution as taught by Golod et al.

Yet another alternative is to use N+ silicon for the (S/D) layers 702 and P type SiGe for channel layers 704 and the later selective etch would utilize the process taught by Se Hwan Park et al in a piper titled "Novel Three Dimensional (3D) NAND Flash Memory Array Having Tied Bit-line and Ground Select Transistor (TiGer)" published in TECHNICAL REPORT OF IEICE in 711 (APWF_PSH), a paper by F L W. Fathauer et al titled "New class of Si-based superlattices: Alternating layers of crystalline Si and porous amorphous Si, -, Ge, alloys" published by Appl. Phys. Lett. 61 (19), 9 Nov. 1992, a paper by Jang-GnYun titled "Single-Crystalline Si Stacked Array (STAR) NAND Flash Memory" published at IEEE TRANSACTIONS ON ELECTRON DEVICES, VOL. 58, NO. 4, APRIL 2011 and U.S. Pat. No. 8,501,609 all incorporated herein by reference.

For simplicity we shall outline the flow for a vertical channel 3D memory structure including S/D layers 702 as N+ silicon and P type silicon for channel layers 704. A person skilled in the art would be able to modify the flow for other alternative embodiments.

On top of the multilayer of alternating 702/704 a hard mask material 706 is deposited.

Figure 7B:
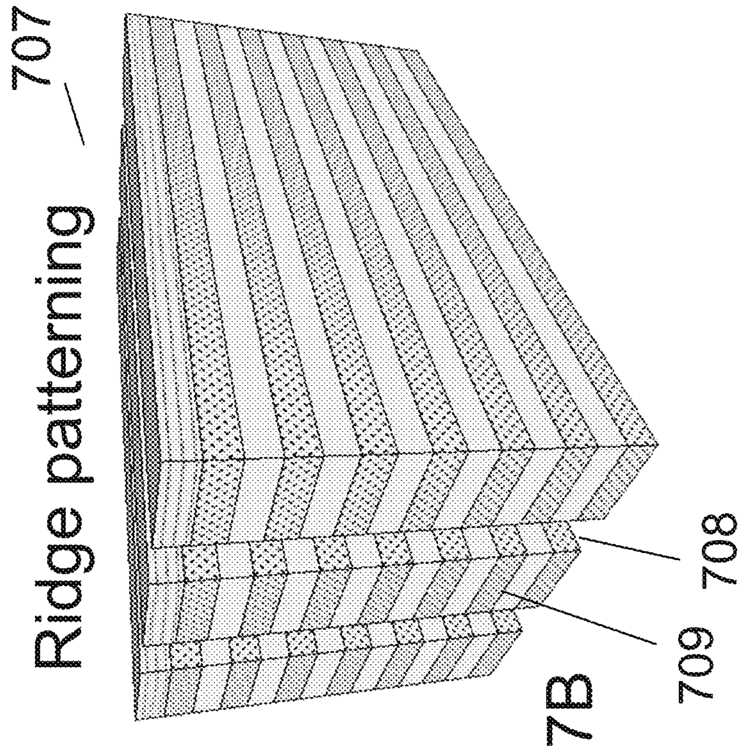

FIG. 7B illustrates etching the structure to form multilayer ridges 709 and valleys 708 in between resulted in repeating ridges structure 707. The width of the ridges and the valleys could be from 10 nm or even lower to a few hundreds of nm. At current state of technology about 50 nm could be good choice. The width of the ridges and the valleys could be set in consideration of the thickness of layers 702/704, the type of memory build and other consideration. Similar width and thickness could be appropriate.

Figure 7C:
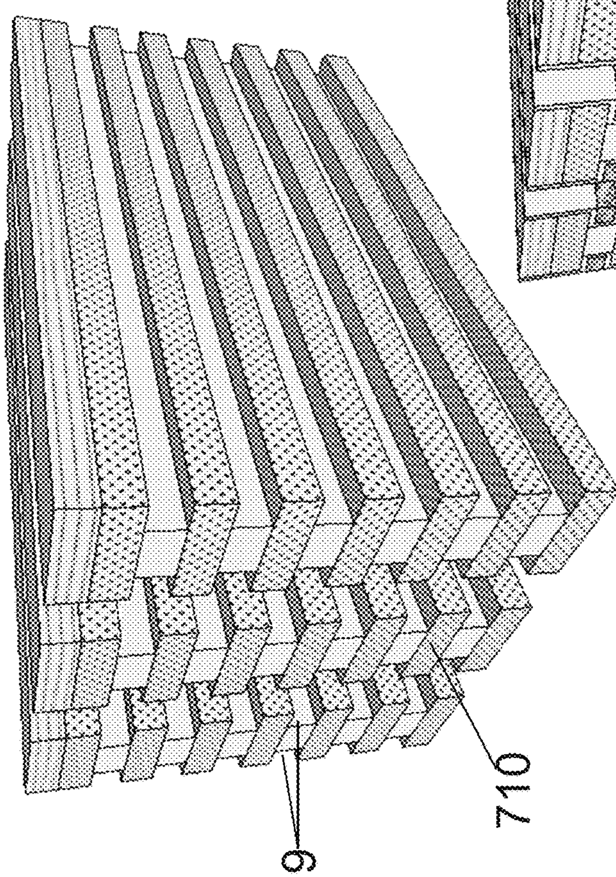

FIG. 7C illustrates the structure after a step of selective isotropic etches of the channel layers 704, forming horizontal notches 719 while keeping the S/D layers 710 mostly untouched. A selective plasma etch may be used. The selectivity may be greatly increased by first forming pores in the desired regions of the channel layers by selective anodization processing. Then the plasma etch would be very selective. Warm KOH may also be utilized to selectively etch down the <100> crystallographic planes.

Figure 7D:
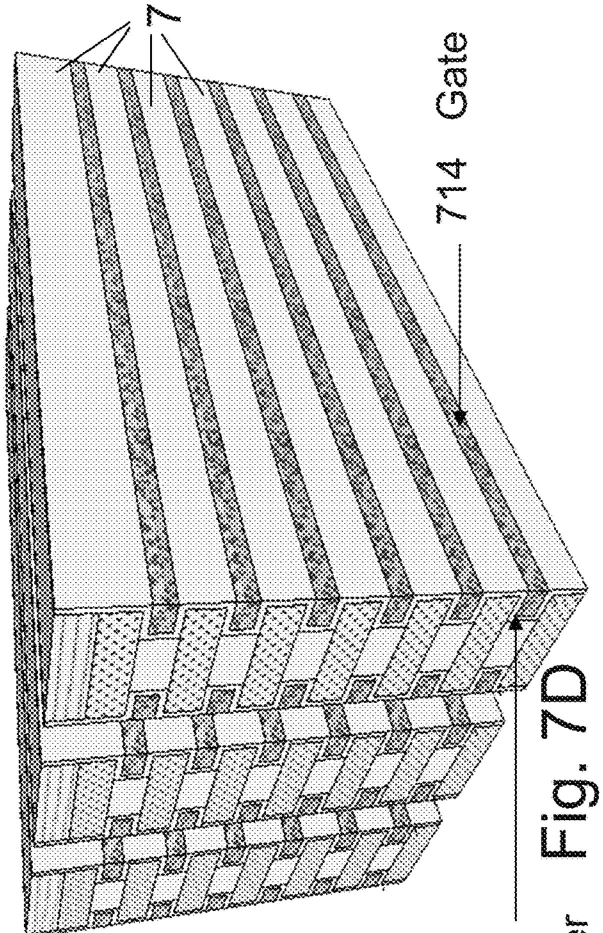

FIG. 7D illustrates the structure after depositing a stack of tunneling oxide layer/charge trap layer/control oxide layer 712 such as oxide/nitride/oxide and gate conductive material 714. The step could be done by Atomic Layer Deposition (ALD) or alternative processes used for semiconductor device fabrications. A directional anisotropic etch step may be used to remove substantially all gate material from the side walls of the S/D layers 713. A slight touch-up isotropic etch may also be employed to remove stringers.

Figure 7E:
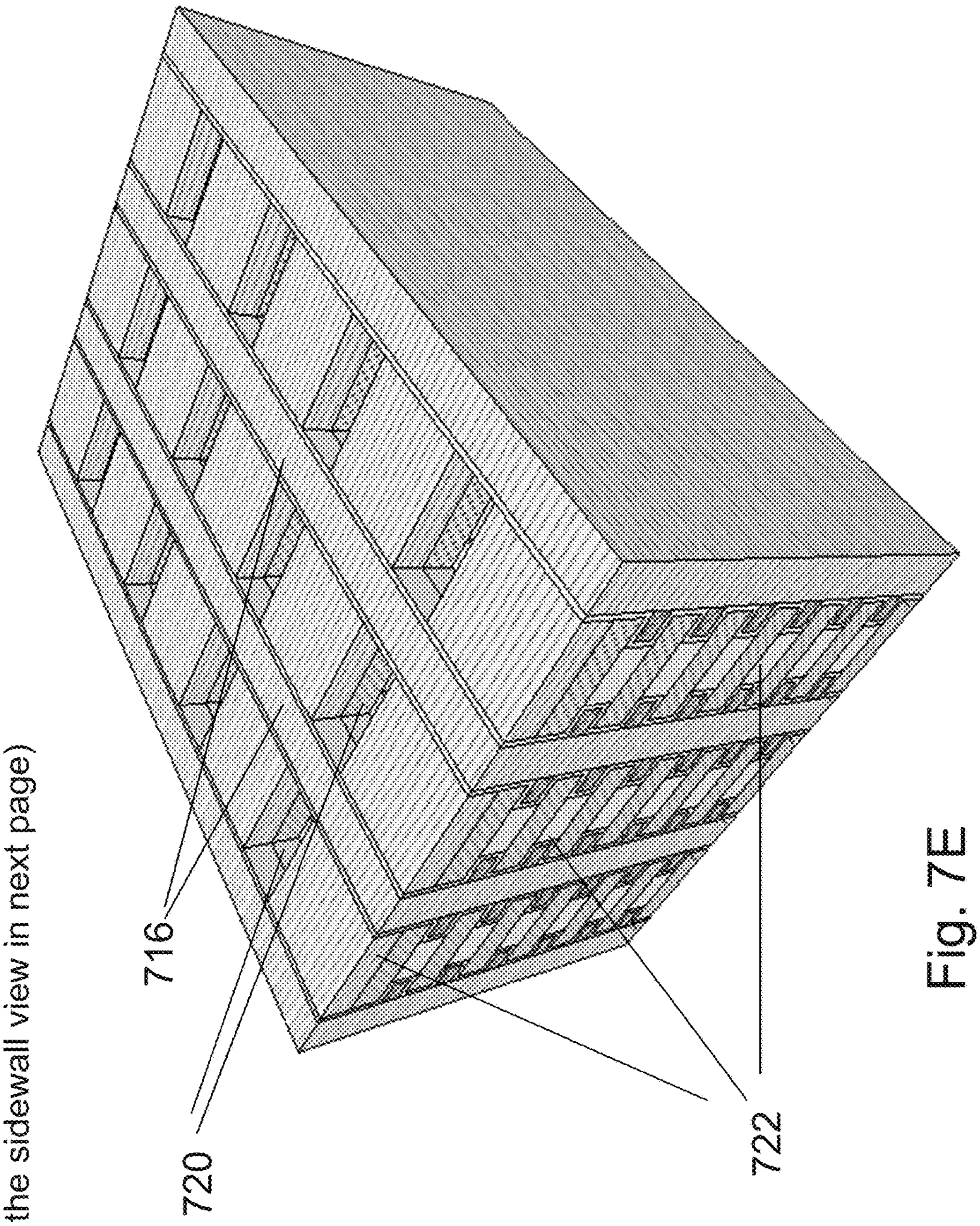

FIG. 7E illustrates the structure after filling the trenches 708 of FIG. 7B with insulating material 716, followed by an etch step which forms vertical gaps 720 along the ridges 709 of FIG. 7B to form vertical strings 722 of alternating N+/P material. The etch step could be done in two steps. First anisotropic etch the stack of multilayer of alternating 702/

704 to form the vertical individual strings 722, and then isotropic selective etch to remove the source/drain 702 in-between the gate stack 712, while leaving the horizontal going gate and oxide lines. The etching may be stopped before the lowest N+ layer so it will serve as a common ground. Conductive etch stop layers may be employed.

Figure 7F:
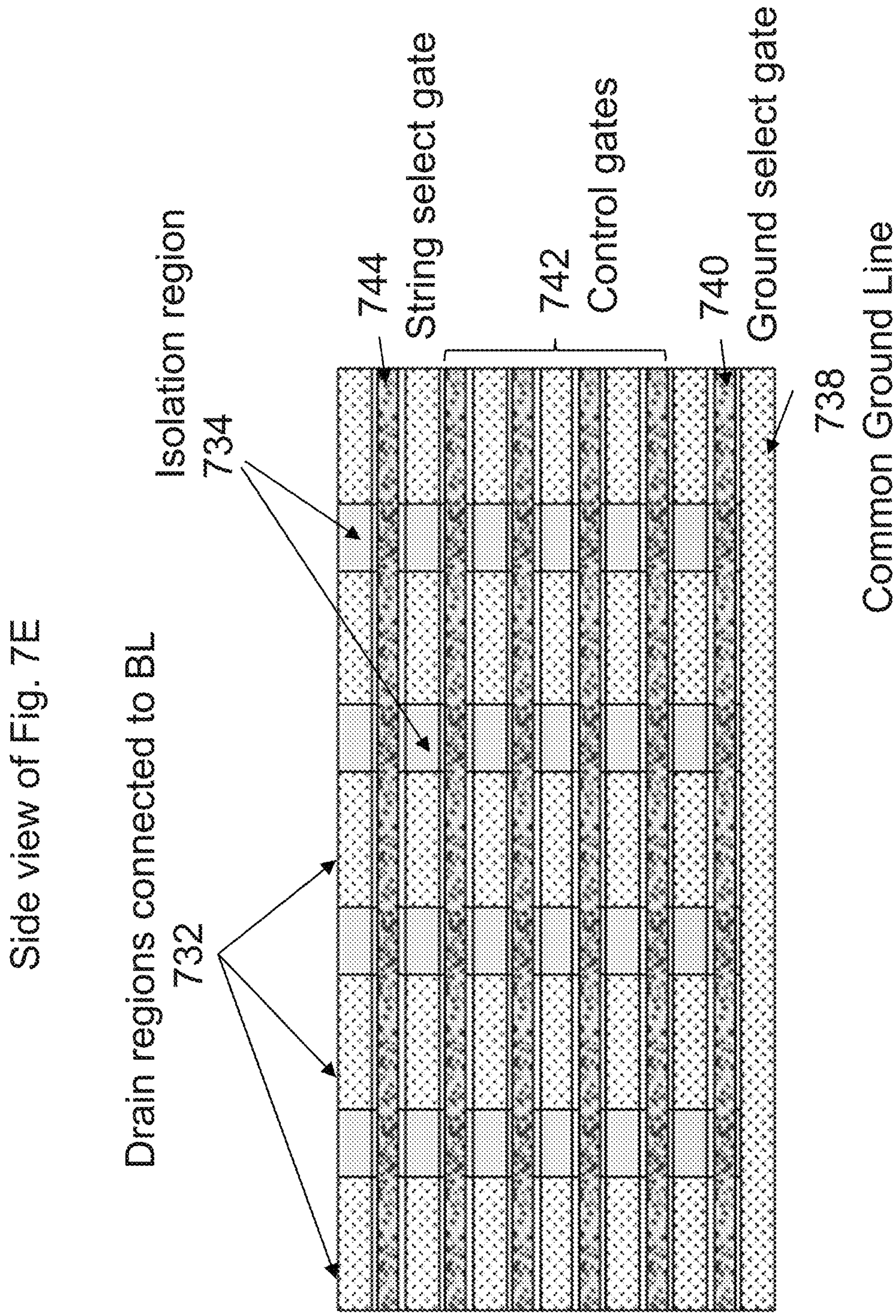

FIG. 7F illustrates a vertical cross-sectional view along the metal gate word line of the structure of FIG. 7E. The empty spaces left after removal of the in-between channel material 734 (previously vertical gaps 720) may serve as memory cell isolation. The remaining bottom material 738 could serve as a common ground line. The lower gate line 740 could serve as ground select gate. The top of the vertical strings 732 would serve as the string drain region and could be connected later to the bit-lines (BL). The obtained structure forms a matrix vertically oriented non-volatile NAND memory cells. The horizontal control gates 742 form the memory word lines controlling current through the vertical channels between successive source/drain layers, and may form vertical NAND strings.

Figure 7G:
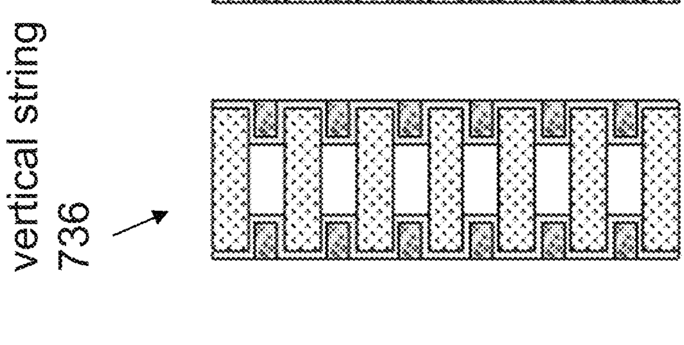

FIG. 7G illustrates a vertical cross section of one vertical NAND string 736 perpendicular to the metal-gate word-line direction.

Figure 7H:
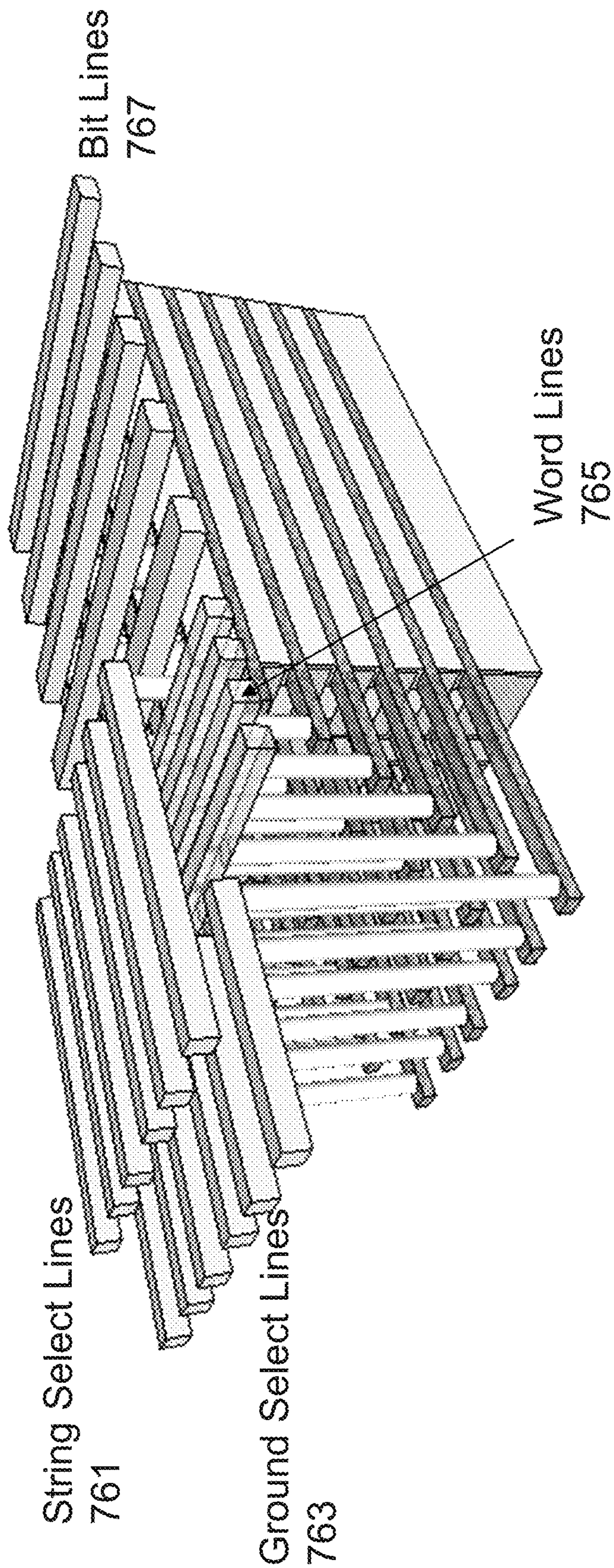

FIG. 7H illustrates the 3D NAND memory structure after adding the grid of memory control lines: word-lines 765, bit-lines 767, string select-lines 761 and ground select-lines 763.

In this 3D memory structure, and also in most other memory structures herein, the horizontal per layer line through the matrix could be the limiting factor of the power performance of the device with respect to how long it could be made. On the other hand the area required for the stair-case interconnect structure dictates longer lines to save in silicon real-estate and reduce cost per bit. A preferred design might place such stair-case on both sides of the line which could help reduce cell to cell variation in addition to improving power and delay. If the device is fractured into multiple blocks real estate efficiency can be improved by sharing each stair case between both the right and the left sides of each block.

Figure 8A:
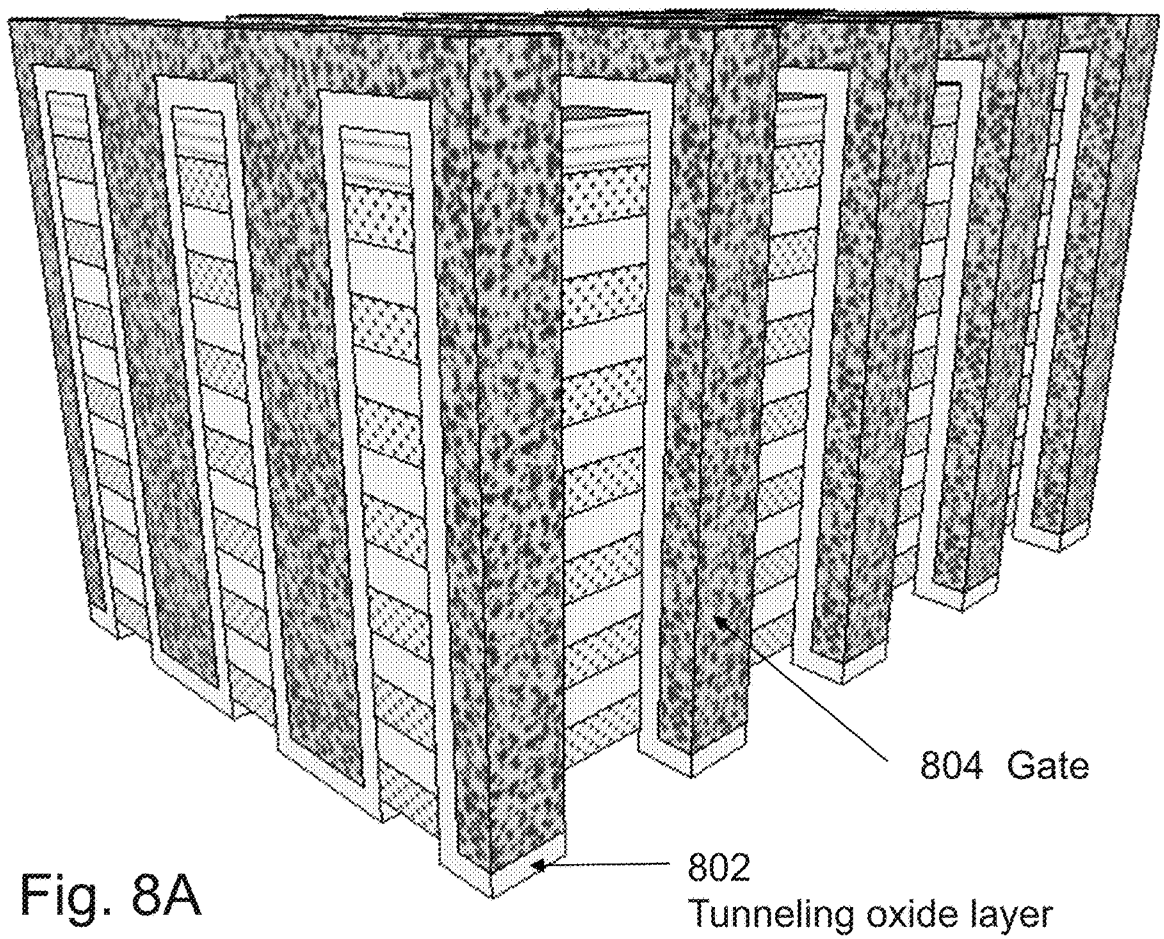
FIGS. 8A-8F are example illustrations of the formation and structure of a NOR type 3D memory.

FIG. 8A illustrates a structure for the formation of a NOR type 3D memory. It starts from the structure 2007 illustrated in FIG. 20B of the incorporated U.S. patent application 62/221,618. Masking an etching techniques are used to form first elongated strips of vertically alternating N+/P type single crystal silicon, coated by dielectric multilayer of tunneling-oxide layer, charge-trap layer and control gate oxide layer forming the charge storage stack 802. On top of it a gate 804 material such as tungsten (W) or polysilicon or other form of memory array gate material is deposited, said charge storage stack 802 and gate overcoat 804 being patterned by masking and etching techniques to form second elongated strips perpendicular to the direction of said first elongated strips. The deposition step could use ALD techniques.

Figure 8B:
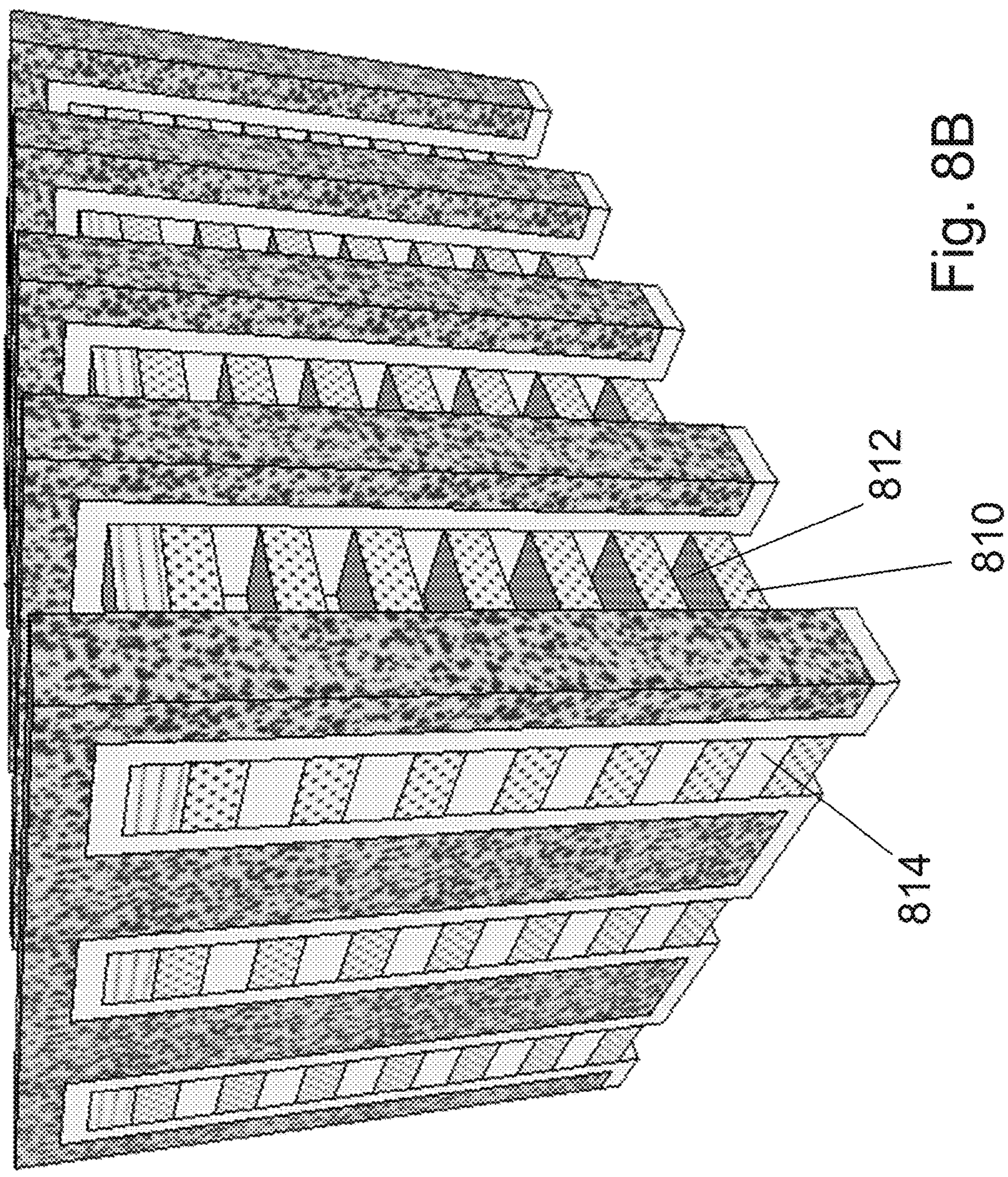

FIG. 8B illustrates the structure after selective isotropic etching the channel material layer wherever not covered by the gate stack, leaving voids 812 in between the horizontal strips of the un-etched S/D material. Under the gate stack the channels 814 are not etched as they are protected by the gate stack.

Figure 8C:
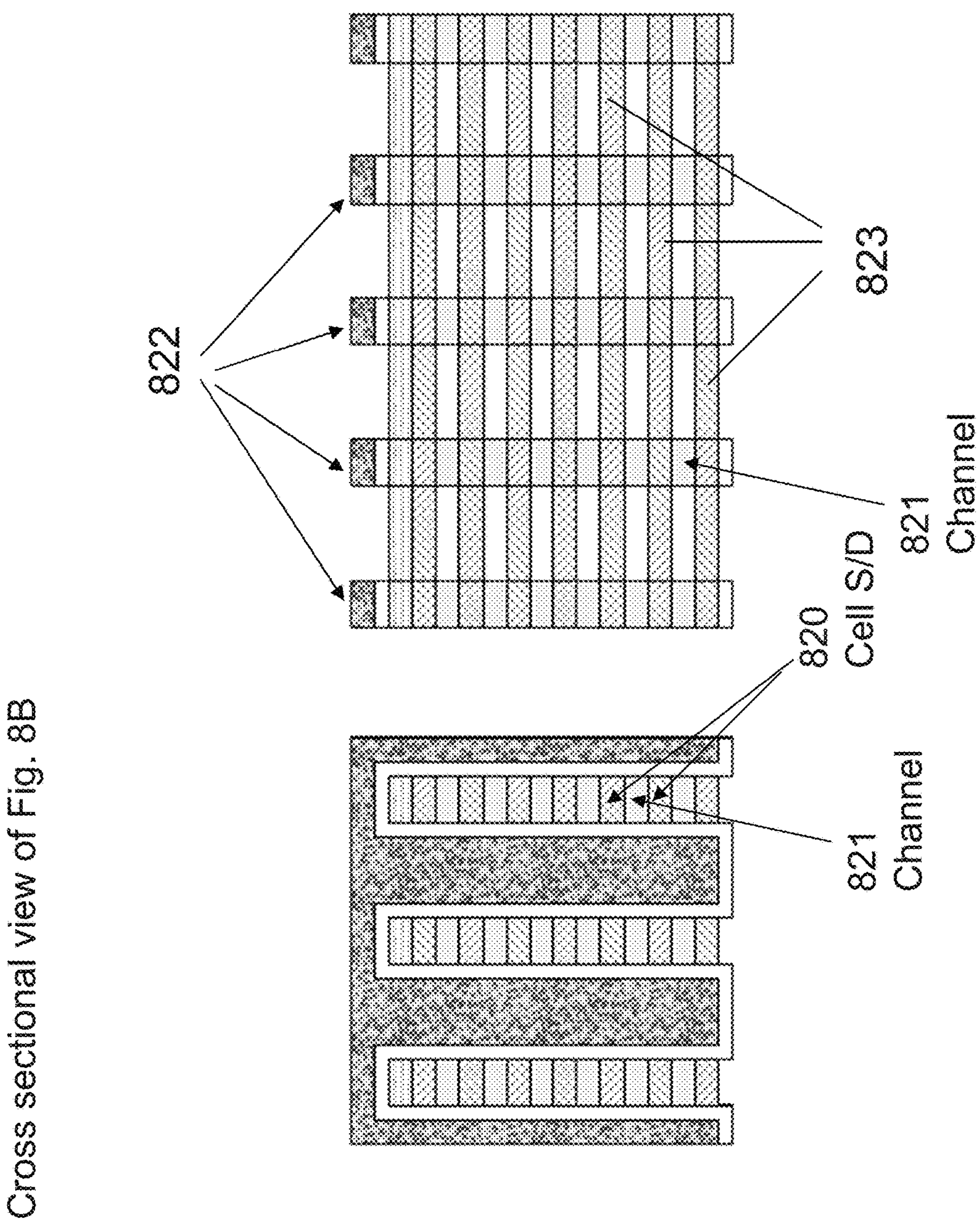

FIG. 8C illustrates a cross section of the structure of FIG. 8B. The gates 822 control the conductivity between the source and the drain 820 through the channel 821. In this structure the S/D material acts as source and drain under the gates 822 and as conductive lines 823 used to conduct the memory cell sensing current to the sense-amplifier circuitry (not shown) the memory control line connecting the S/D along the layer for each ridge. When the S/D material is selected to be N+ silicon and the channel material is selected to be P type silicon, then each memory cell would include an NPN transistor with two sidegate stacks to form a non-volatile memory cell. As the S/D lines are running along the ridge all the way to the end of the block then proper design would enable selecting a pair of adjacent S/D lines to select a specific channel layer 821 within a ridge, and a specific gate 822 will select the column at which the sensed memory cell is located. The vertical gate stack could then be selected to read write to a specific memory cell on that ridge.

Figure 8D:
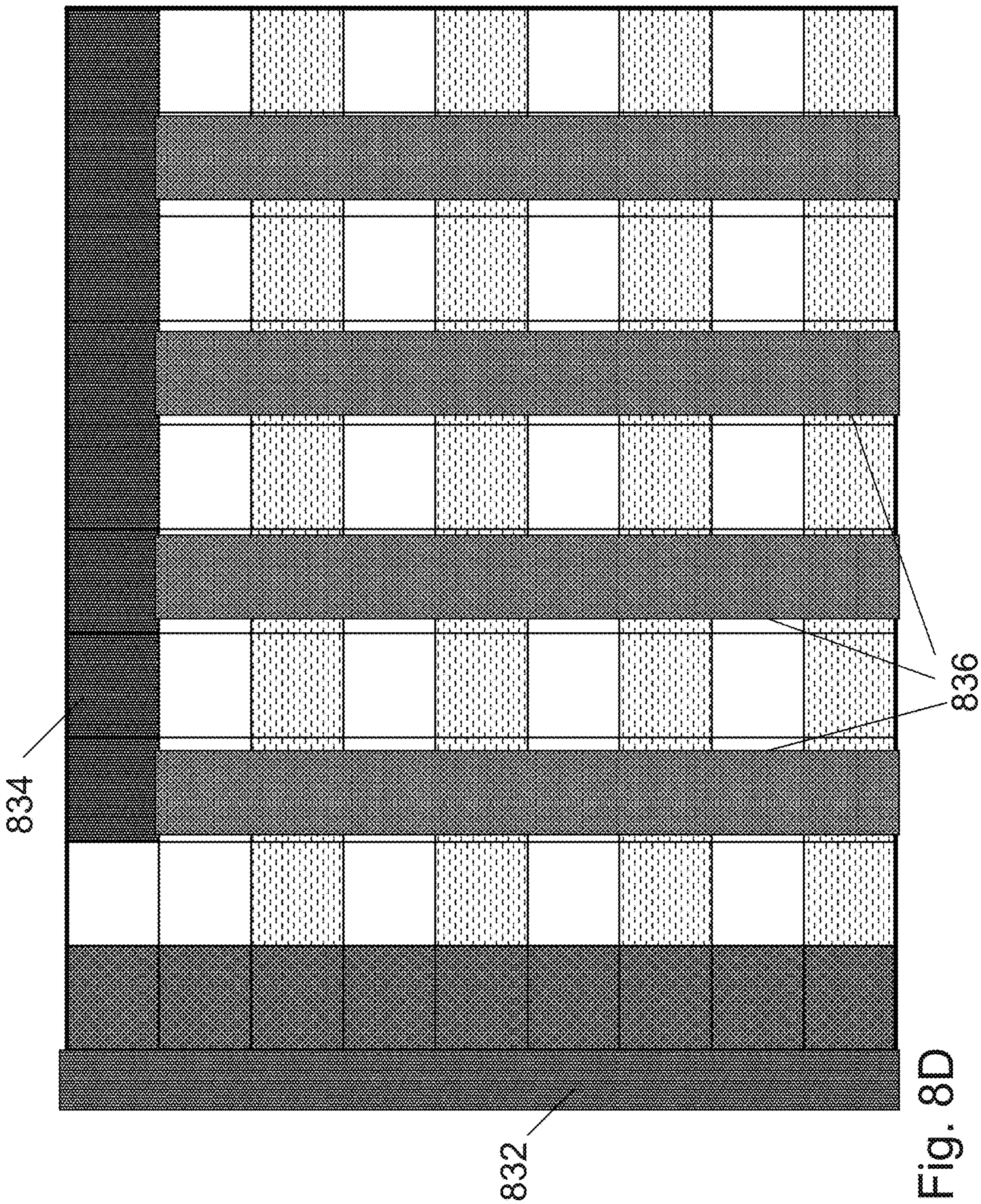

An alternative technique for selective removal of the P type material regions between channels while not etching the channel regions and the N type S/D lines is to use an anodizing process which would etch the P regions between channels to convert them to porous regions. The anodizing wet etching is highly selective and would not affect the N type S/D lines, especially if the process is done in dark as previously discussed such as in U.S. Pat. No. 8,470,689. For further enhancement of this anodizing porous formation the S/D lines could be used to deliver the anodizing current throughout various regions of the structure. An additional enhancement could be added by using positive voltage on substantially all of gates 804 conductors. Such positive voltage on the gates will further deplete the channels blocking the anodizing etch for the channel region while the entire P region in between are etched and become porous. The selected voltages for efficient selective anodization will depend on engineering considerations, for example, the type of the body, and doping concentrations. FIG. 8D illustrates a top view the ridge structure of FIG. 8A in which the leftmost side gate 832 (a shown in this example) is made without oxide underneath making it the anode delivering the positive anodizing current to all the N type S/D lines. The top most plate 834 illustrates the connection to all other gates 836 to deliver the depletion voltage to protect the P channel from being etched during the anodizing step. Following the completion of the anodizing step the delivery plates leftmost side gate 832 and top most plate 834 could be etched off. Then the porous region could be etched away, leveraging the many orders of magnitude higher etch rate of porous regions vs. solid silicon regions, to remove out all these porous regions, thus forming the structure illustrated in FIG. 8B. A selective wet etch, for example, warm KOH or TMAH, may be utilized to selectively etch the <100> planes and much slower on the <110> planes, thus minimizing undesirable undercutting. With reference to at least U.S. Pat. Nos. 4,600,934 and 5,096,535 and Schroeder, H., et al., "Convex Corner Undercutting of {100} Silicon in Anisotropic KOH Etching: The New Step-Flow Model of 3-D Structuring and First Simulation Results," J. Microelectromechanical Systems, vol. 10, no. 1, March 2001, pp. 88-97, all of the forgoing incorporated herein by reference.

Figure 10:
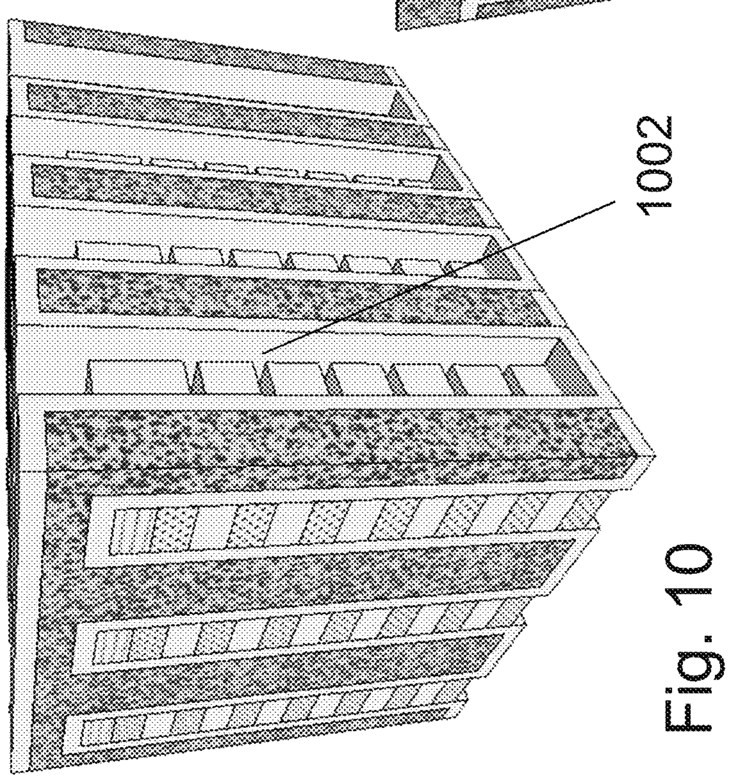
FIG. 10 is an example illustration of a portion of the formation and structure of a multi sided ONO faceted NOR type 3D memory.

In another alternative the above process of anodizing could be extended to achieve further an all-layer anodization under the ridge structure to support a following step of transferring the complete 3D NOR structure to another wafer cutting the formed porous layer underneath. The all-layer cut porous formation could alternatively be formed after the step of the second formation of O/N/O layer as illustrated in FIG. 10. Following the formation of the structure illustrated in FIG. 10 a directional etch-RIE could be applied opening the bottom of the area in between RIDGE allowing anodizing process to be applied to form cut porous underneath the 3D NOR structure illustrated in FIG. 10. Such a process and structure could allow flipping the NOR structure and bonding it on top of another wafer to add control lines and control circuits on the other side of the NOR structure. This could be an alternative to having the porous already there from the start as previously discussed herein.

Figure 8E:
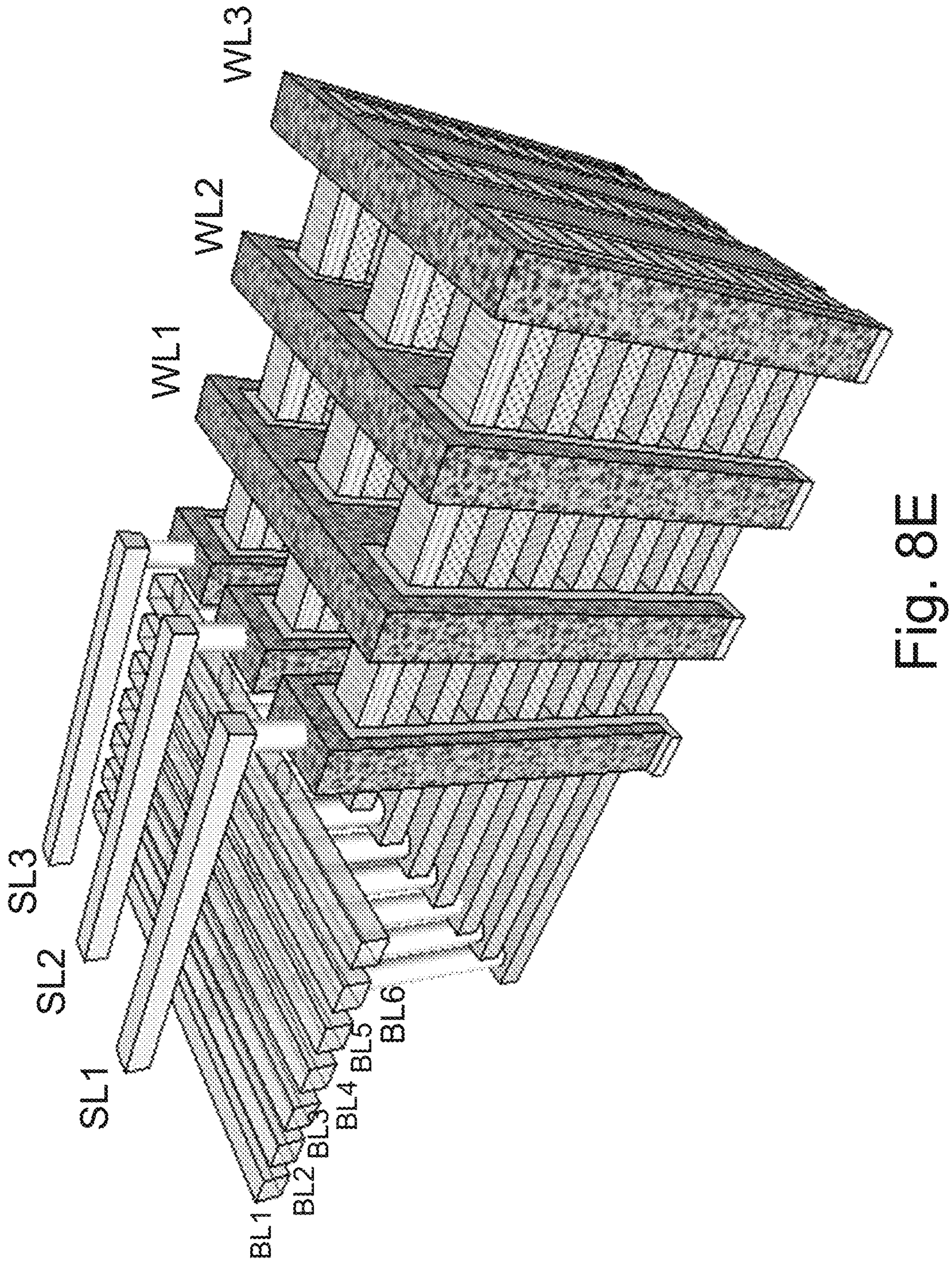

FIG. 8E illustrates the 3D NOR structure after adding interconnection to the control lines. The shared gates forming word-lines WL1, WL2, WL3 run perpendicular the ridges controlled by word-lines WL1, WL2, WL3. The interconnect stair case is used to connect control signals to the in-layer S/D lines. The interconnect line BL1 controls the S/D of the first layer of all the ridges in the memory block, BL2 controls the second layers and so forth. The select-lines control the access of the bit lines to the S/D of the ridges. SL1 control the access to the first ridge, SL2 to the second ridge and so forth.

The ridge control may be constructed by first removing the channel material at the region designated for ridge control. Then the select gate transistors are formed on the S/D line as outlined above. The select gate transistors may be designed to function as junction less transistors or as gate all around nano-wires. In some cases it might be desired to thin the S/D lines in the region designated as junction less transistor or nano-wire to achieve better gate control. Such thinning would narrow these regions to about 20 nm thickness or about 15 nm or about 10 nm.

Figure 8F:
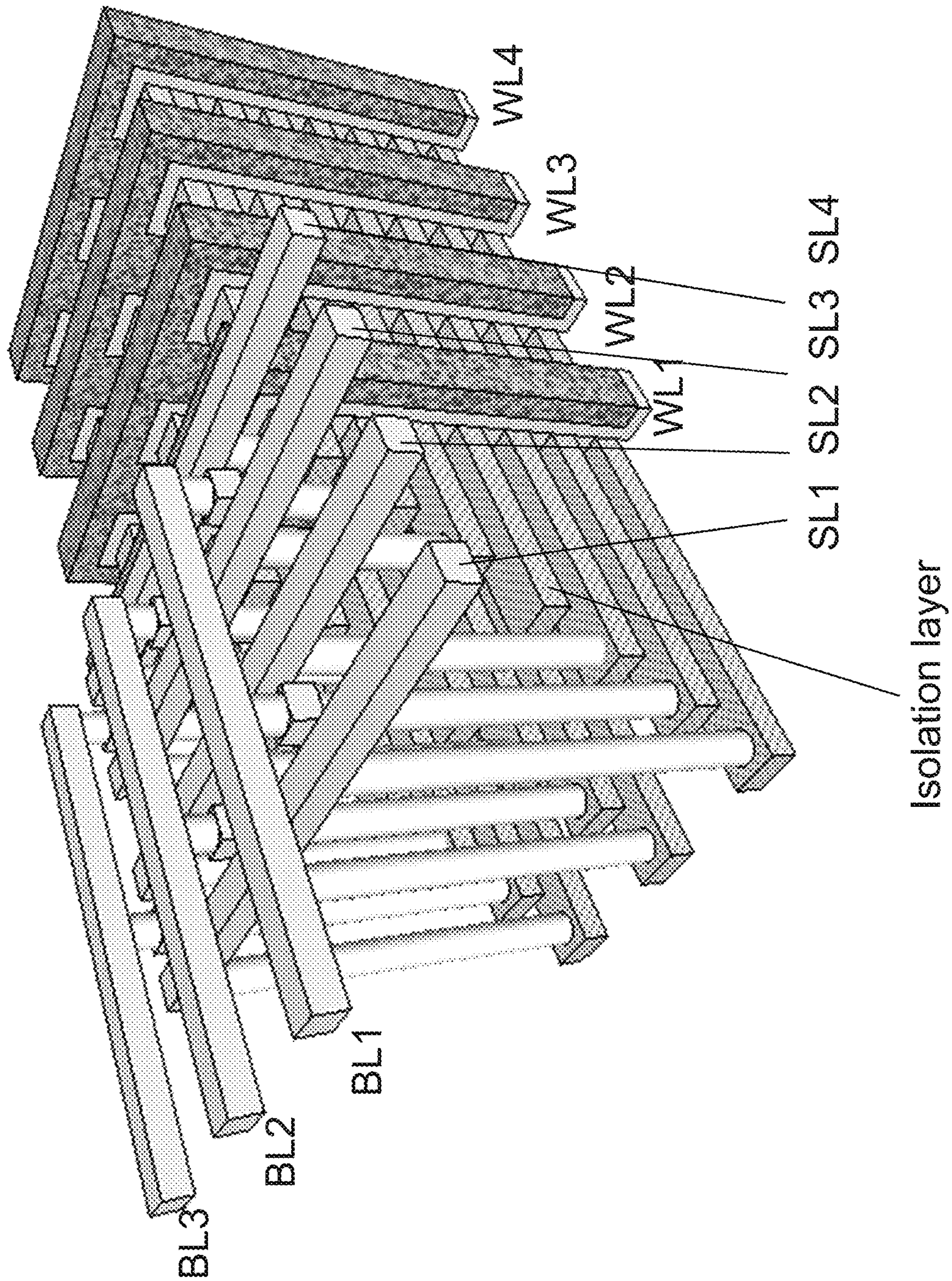

FIG. 8F illustrates another embodiment of 3D NOR structure for control for the per layer control lines. It provides a 3D NOR structure without using select gates. Instead, the bit addressing can be made by selecting a pair of source line (SL) and bit line (BL). The unit cell uses a single BL sharing two cells. The S/D lines are split to odd layers jointly connected by select-lines in parallel to the word-lines. In this structure, the source line is considered as the select line. According SL1 connects the S/D lines of layer 1, SL2 connects the S/D lines of layer 3 and so forth. And the even layers except layer 4 (for example) are connected per ridge along the ridge direction by bit-lines in vertical orientation to the word lines. The layer 4 is left floating to separate the upper and lower unit cell. Accordingly BL1 connects the S/D of all even layers except 4 of the first ridge, BL2 connects the S/D of all even layers of the second ridge and so forth. By selecting one bit-line and one select-line a specific layer within a specific ridge would have both S/D of its memory cell active all other cells in the matrix may have one or none of their S/D active. Selecting a specific word-line will activate one memory cell of those cells that have both of their S/D active. Accordingly a specific memory cell with specific x, y, z location could be selected. These approaches could have some variations which could work too, such as all S/D of layer 2,3, 4,5, 8,9, . . . may be connected to respectively SL1, SL2, SL3, SL4, SL5, SL6 while per ridge layer 1, 4, 7, 10, . . . of ridge 1 are connected to BL1 and those of ridge 2 to BL2 and so forth Such allocation could also allow selecting one specific channel of a specific layer at a specific ridge by selecting one specific bit-line (BLx) and one specific select-line (Sly). This 3D NOR structure could be enhanced using the universal memory concept of FIG. 4A. The cell channel becomes the floating body and the gate stack would be enhanced to support such dual functionality. The use of the enhanced 3D NOR and the various use mode and system architecture could be similar to those discussed herein.

The architecture referred to by naming as 3D NOR and illustrated herein in reference to FIG. 8A to 8E and in similar illustrations herein is also similar to a structure to what is called in the art 'AND' nonvolatile memory architecture, for example as presented in a patent such as U.S. Pat. No. 7,414,889, and as IT MONOS as in a paper by Hidenori Mitani et al. titled "A 90 nm Embedded 1T-MONOS Flash Macro for Automotive Applications . . . " presented at ISSCC 2016, both incorporated herein by reference.

Figure 9A:
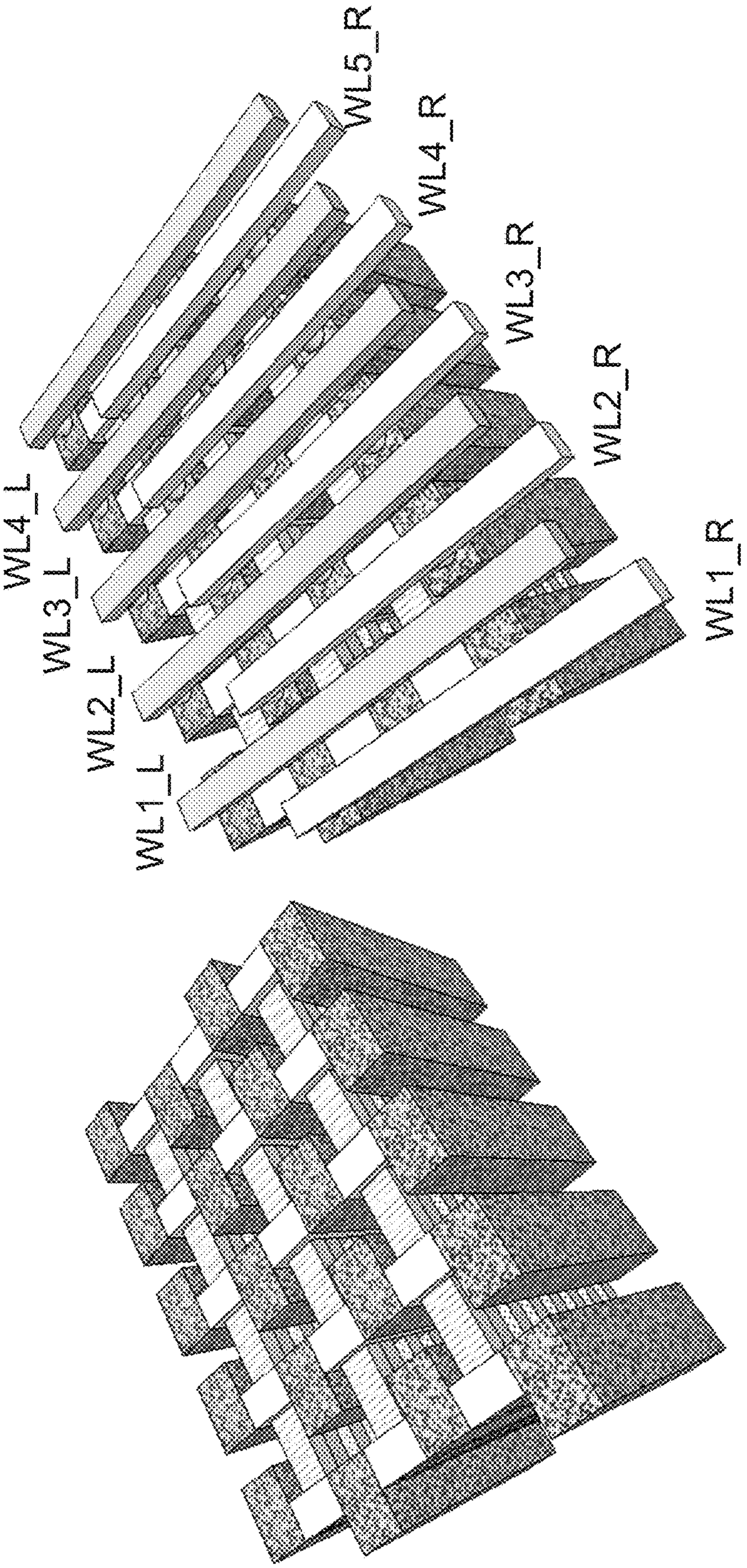
FIGS. 9A-9D are example illustrations of the formation and structure of a NOR type 3D universal memory.

Additional enhancement to such 3D NOR is to break the gate control to two independent side gates—left gates and right gates, as shown in FIG. 9A. For example, control line WL1_R will control all the right side gates and WL1_L would control all the left side gates. Such split could allow doubling the storage capacity. A channel width of 50 nm or larger has been used for such 'two bit' per cell functionality.

Figure 9B:
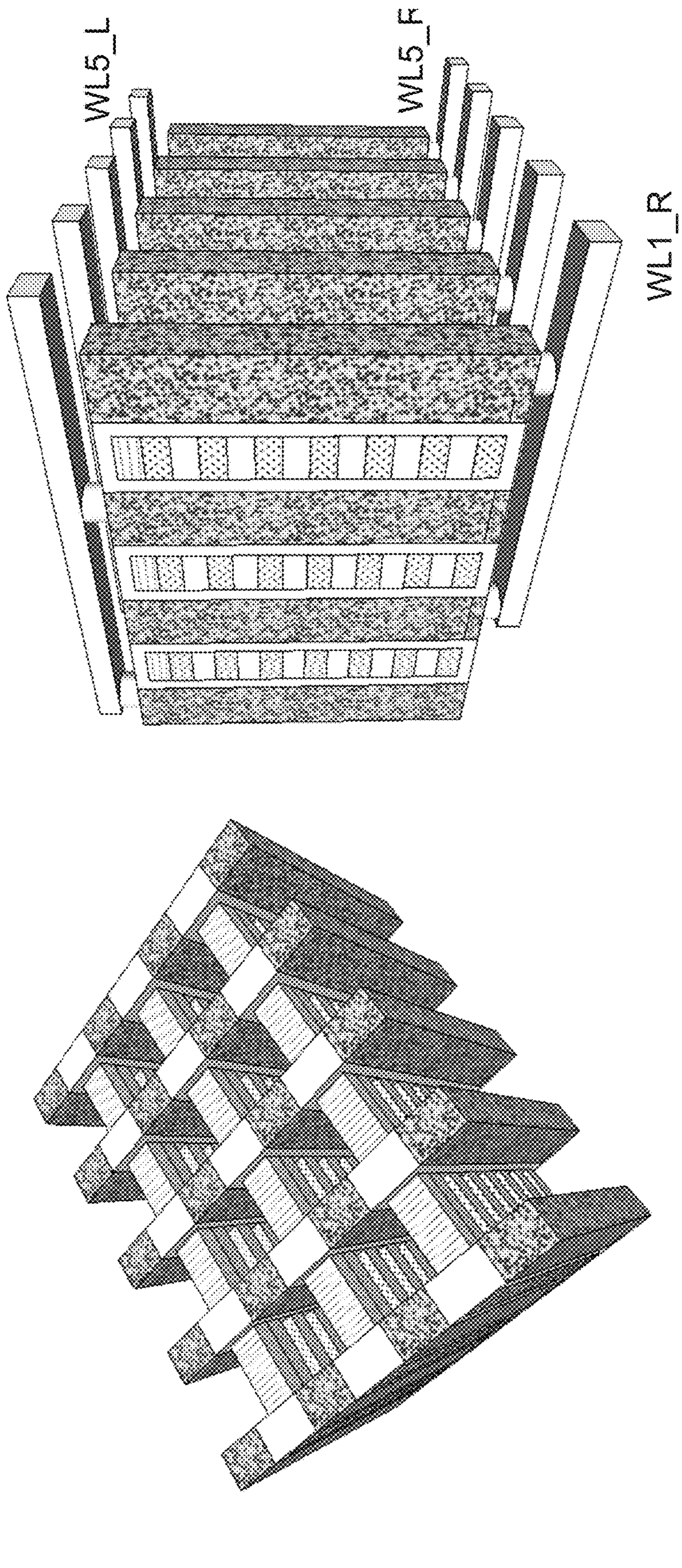

These two gate control lines can be placed on the top connection layer side by side as illustrated in FIG. 9A, or alternatively one on top and one under bottom as illustrated in FIG. 9B.

Additional enhancement to such 3D NOR is to implement MirrorBit® technology as was produced commercially by Spansion for NOR products.

Figure 9C:
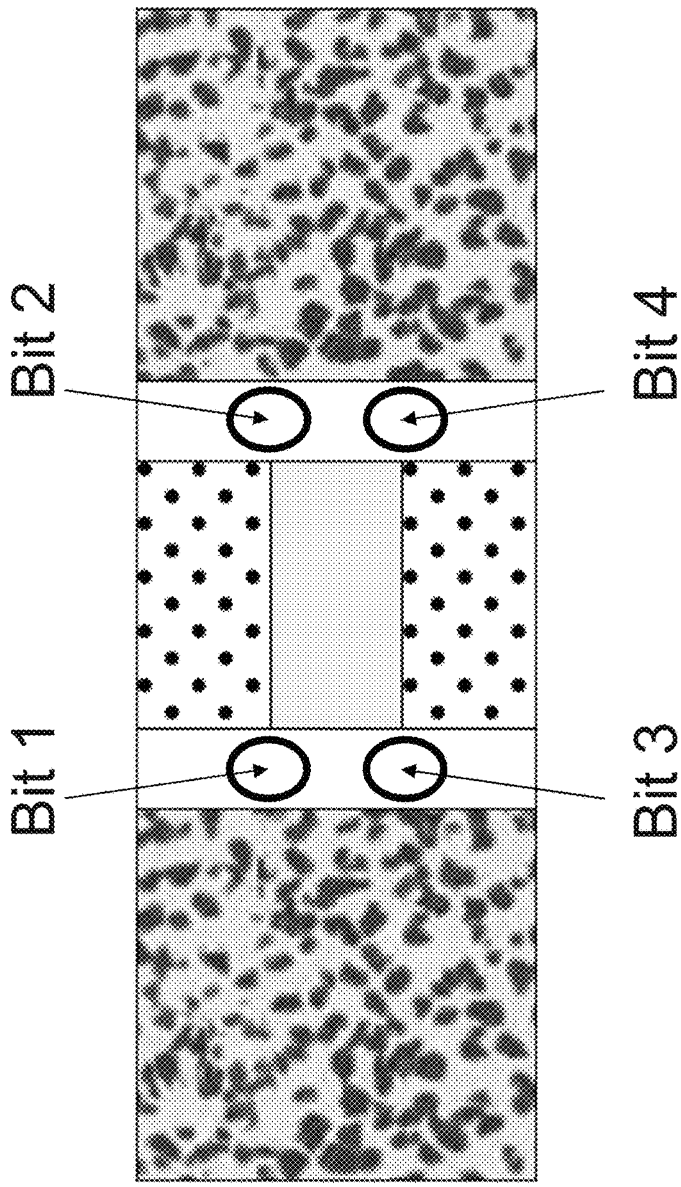

These two enhancements could be combined to allow '4 bit per cell' as is illustrated in FIG. 9C. Such technology is detailed in U.S. Pat. No. 7,091,551 incorporated herein by reference.

Another known enhancement is to control the amount of charge being stored in a cell to allow multi-level voltages per cell, hence coding more than 1 bit per cell. These different enhancement techniques could be combined to achieve even higher number of bits per cell. Accordingly if each corner is designed to hold 4 levels then the cell could store 16 bits. If more levels are managed at each corner than the storage capacity of a cell could be even higher.

Figure 9D:
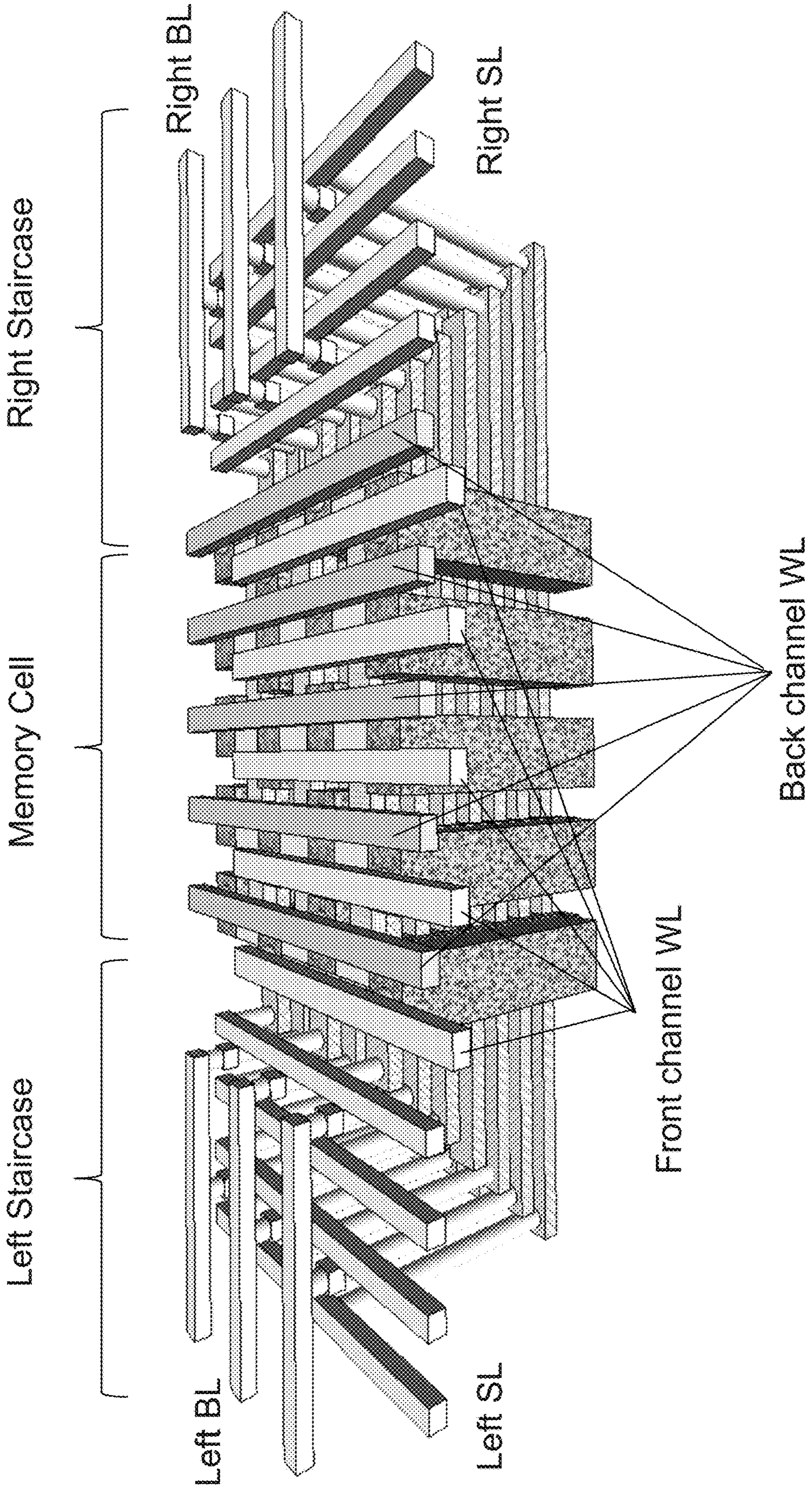

FIG. 9D illustrates a memory block with a stair case on both sides of the S/D lines. This could be useful for redundancy and better access time and less access time variation between cells along the ridge.

The general approach to select and access a specific bit could be as follows:

- Front side bit & Back side bit→Front side WL and Back side channel
- Upper bit & Lower bit→Source Line & Bit Line Swapping
- Left side bit & right side bit→Left staircase access & right staircase access Additional alternative is to add side gates to the other facet of the 3D NOR channels. So starting from the structure illustrated in FIG. 8B the O/N/O layers could be deposited using ALD or compatible deposition technique resulting with the structure illustrated in FIG. 10. The new O/N/O layers 1002 are now covering the other two facets of the channel.

Figure 11:
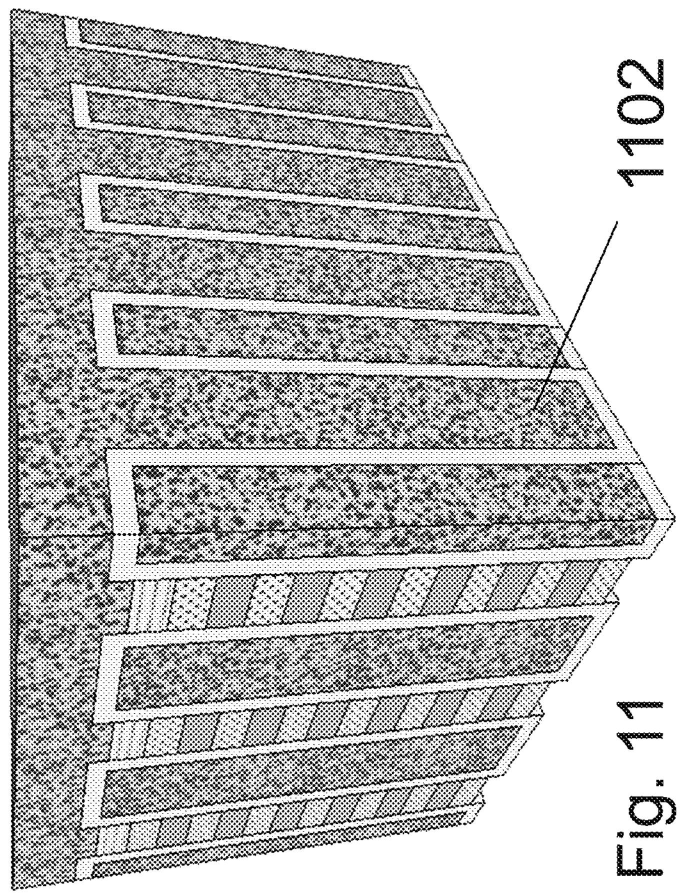
FIG. 11 is an example illustration of an additional portion of the formation and structure of a multi sided ONO faceted NOR type 3D memory.

FIG. 11 illustrates the structure after adding in the new side gates material 1102 which could be polysilicon or alternative conductor such as tungsten. This deposition could start with ALD and then other methods of depositions such as CVD.

Figure 12A:
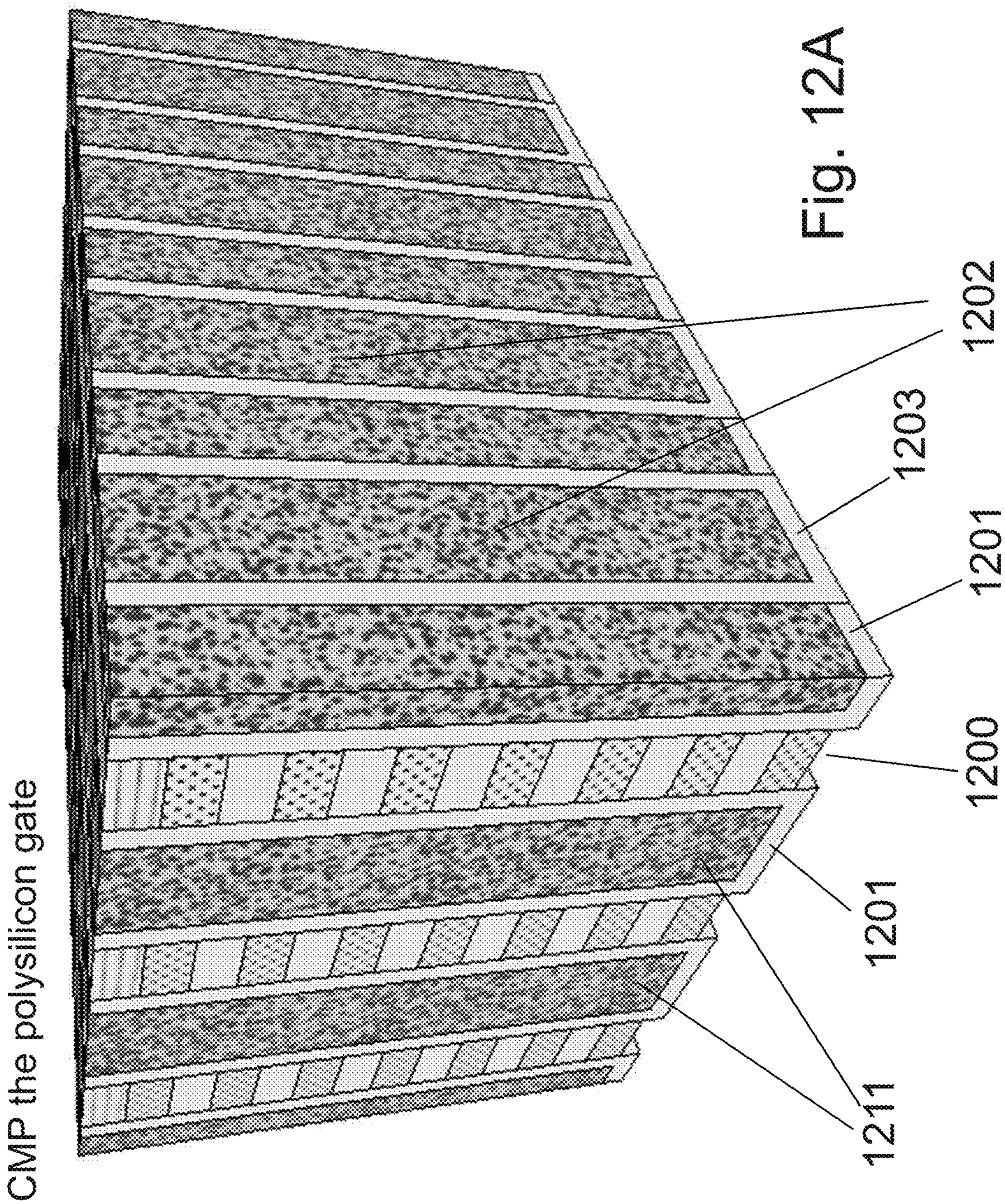
FIGS. 12A-12C are example illustrations of additional portions of the formation and structure of a multi sided ONO faceted NOR type 3D memory.
Figure 12B:
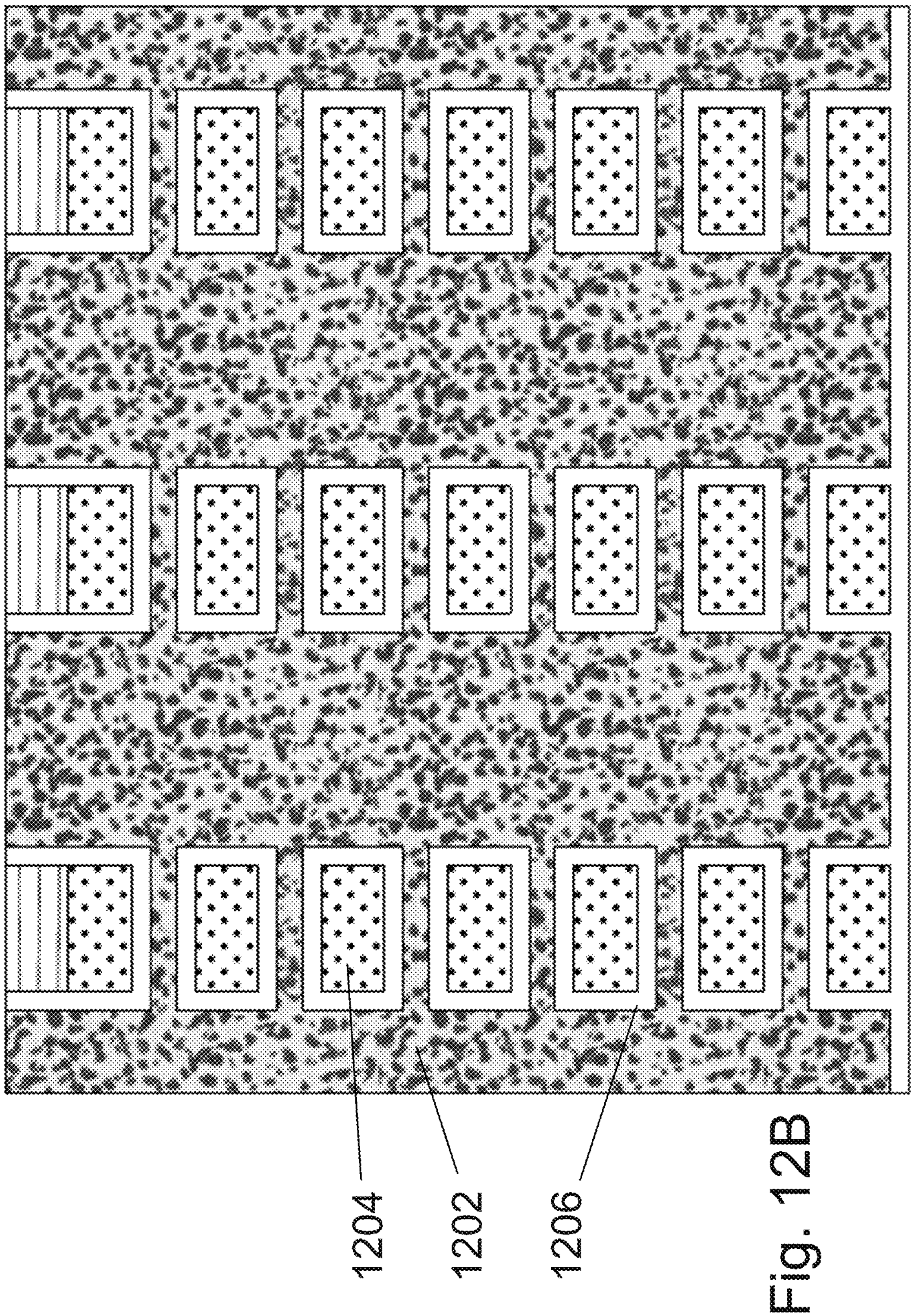
Figure 12C:
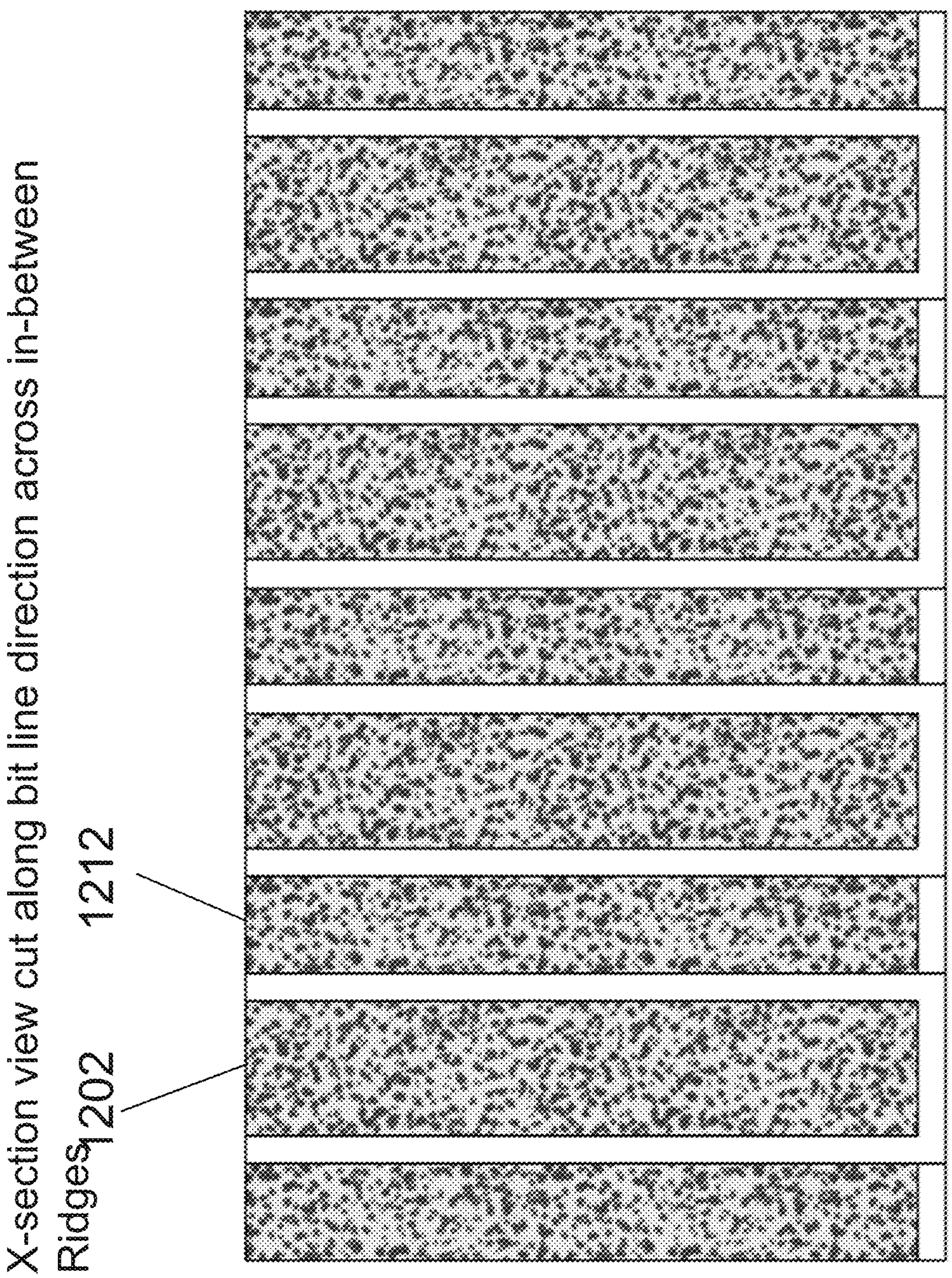

FIG. 12A illustrates the structure after step of CMP which also form isolated side gate lines 1202 for the two facet of the channel. FIG. 12B show the structure at orthogonal cut across the new gate regions 1202 showing the S/D bit-lines 1204 going through and isolated from the new conductive gates by the O/N/O layers which were deposited for the other facet of the channel and do also provide isolation from all other structures. The new gate region 1202 becomes continuous along the WL direction by filling the new gate material 1202 in between S/D regions. FIG. 12C is a 'cut' look in between the ridges showing the new gates 1202 and the old gates 1212.

Figure 13A:
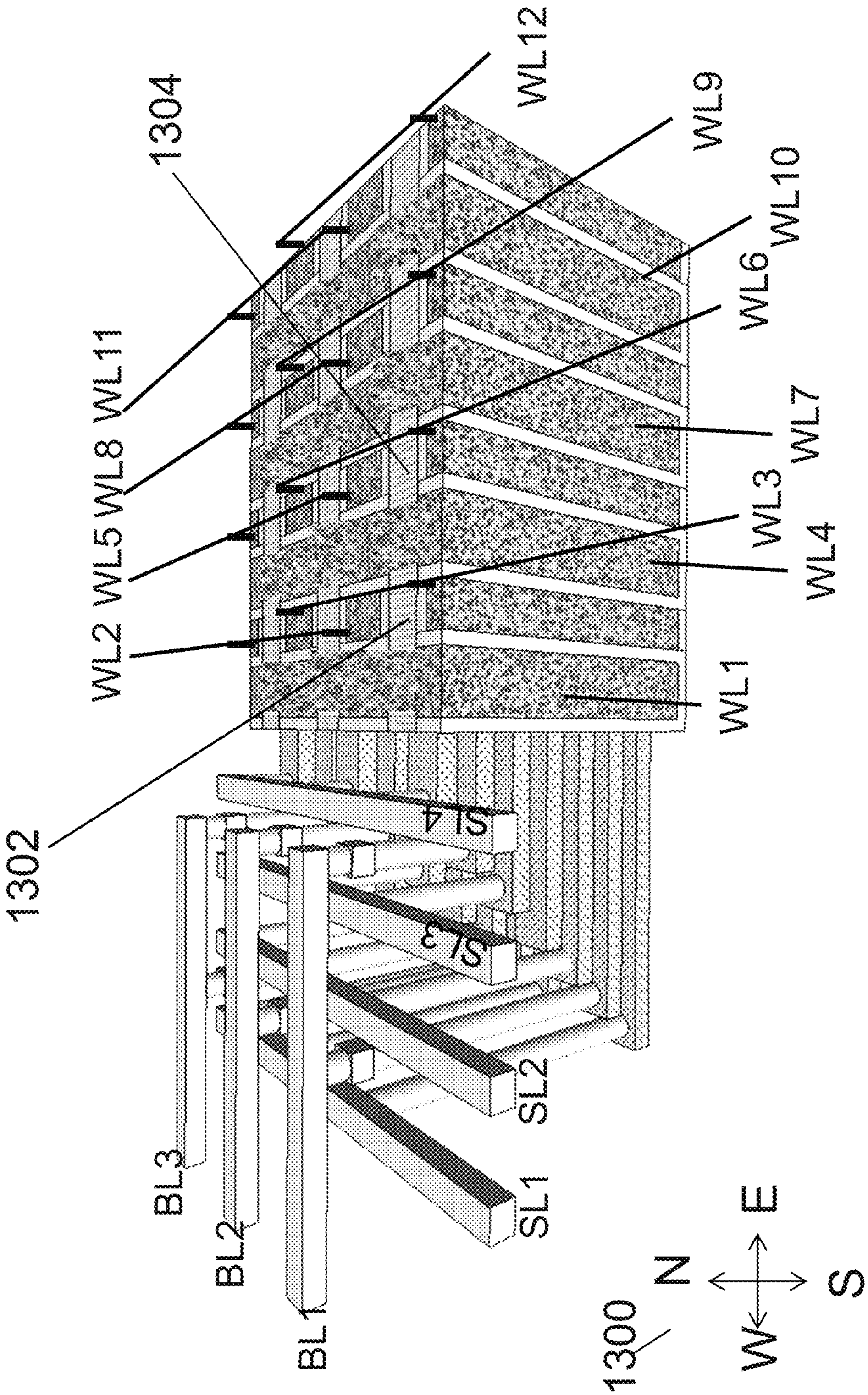
FIGS. 13A and 13B are example illustrations of an additional portion of the formation and structure of a multi sided ONO faceted NOR type 3D memory.

FIG. 13A illustrates the structure after adding the control lines. It utilizes similar concepts to the structure illustrated in FIG. 8E, but with each word-line of FIG. 8E is broken into two word-lines similar to the illustration of FIG. 9A or its two sided alternative FIG. 9B. In addition the new gates are forming new word lines in FIG. 13A—word-lines: WL1, WL4, WL7, WL10.

Figure 13B:
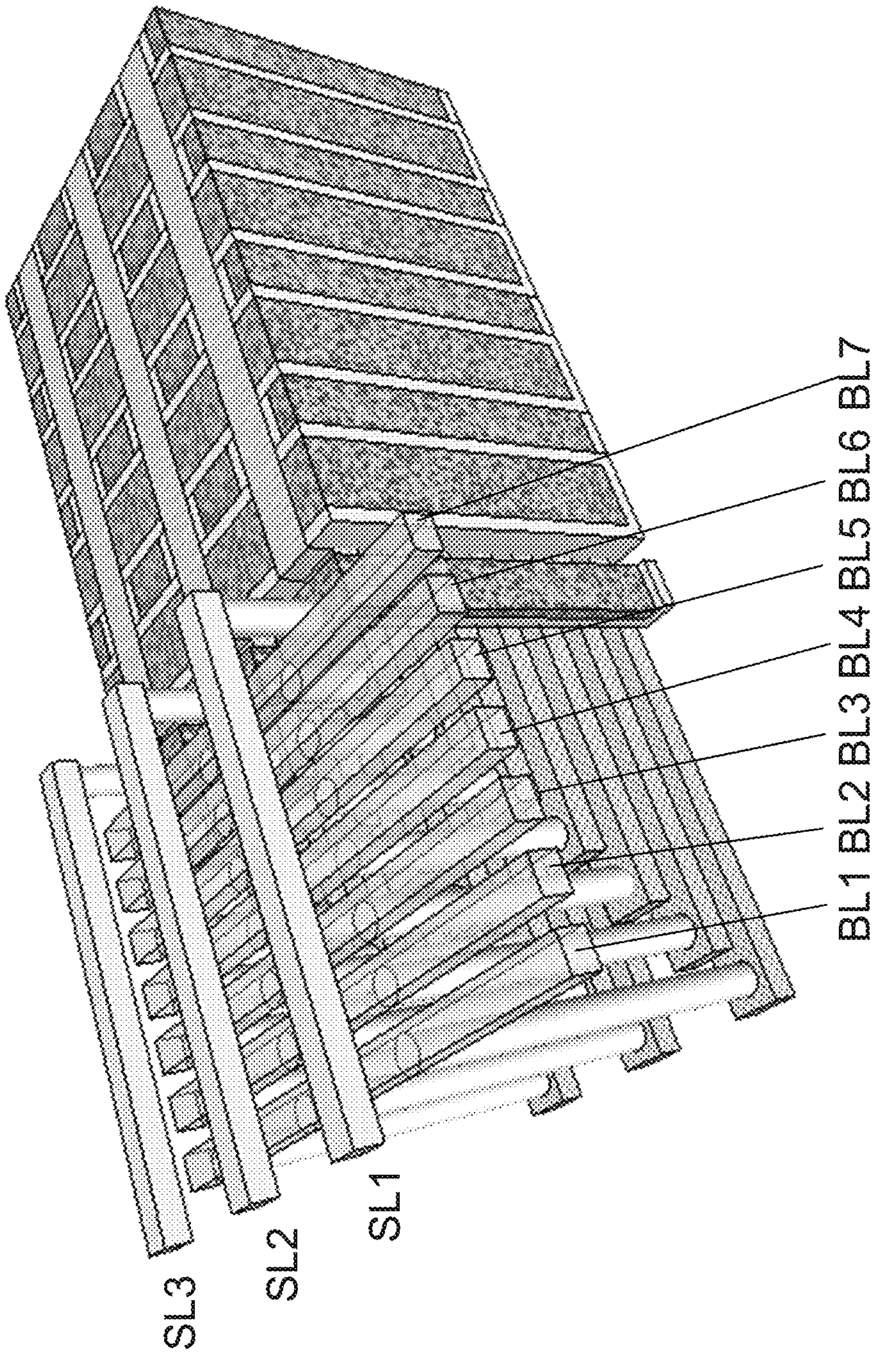

FIG. 13B illustrates the structure after adding control lines of the alternative illustrated in FIG. 8E. The word lines illustrated in FIG. 13B could be arranged such that WL2, WL5, WL8, . . . , are elevated to an upper layer and WL3, WL6, WL9, . . . are moved using short strips to overlay WL4, WL7, WL10; so accordingly two metal pitches could support those the word-lines per channel.

Figures 14A, 14B:
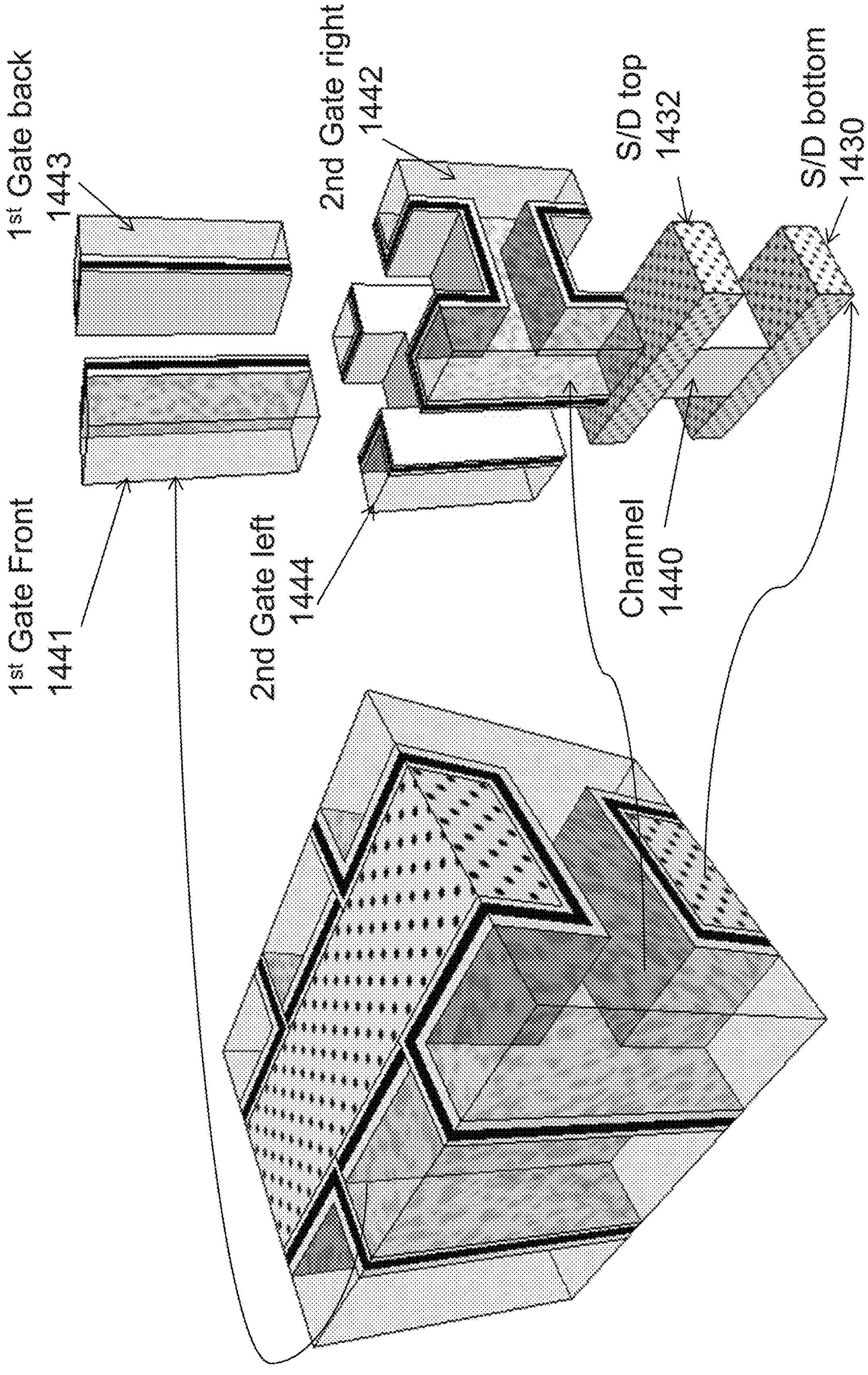
FIGS. 14A-14C are example illustrations of a NOR cell structure.

FIG. 14A is an illustration of one memory cell within the 3D NOR memory fabric illustrated in at least FIG. 11 to FIG. 13B.

FIG. 14B is an illustration of the memory cell of FIG. 14A in an 'exploded view' broken up into three illustrative components. The memory cell may include the 1$^{st}$ gates, first front gate 1441 and first back gate 1443; the 2nd gates, left side second gate 1444 and right side second gate 1442; and (at the lower part of FIG. 14B) the memory channel 1440, the top S/D line 1432, and the bottom S/D line 1430. The lower part of FIG. 14B illustrates a fundamental structure of the memory cell being a substantially cubic P (could be other shapes) memory channel 1440 with top and bottom facets connected to N+ S/D lines top S/D line 1432 and bottom S/D line 1430 while the side facets are isolated by the first O/N/O and second O/N/O. This is effectively a floating body ("FB") NPN transistor which could also be used for floating body random access memory ("FB-RAM") as was presented before in respect to FIG. 4A. Thus, effectively the memory cell within the 3D NOR memory fabric is a Universal memory which could be used for non-volatile ("NV") storage using the charge trap in the O/N/O gate first and second gate stack or as high speed volatile FB-RAM leveraging the floating body of the P channel. The FB-RAM could be refreshed using techniques described elsewhere and herein using the terms such as 'periodic refresh', 'self-refresh' or "Autonomous Refresh".

Figure 14C:
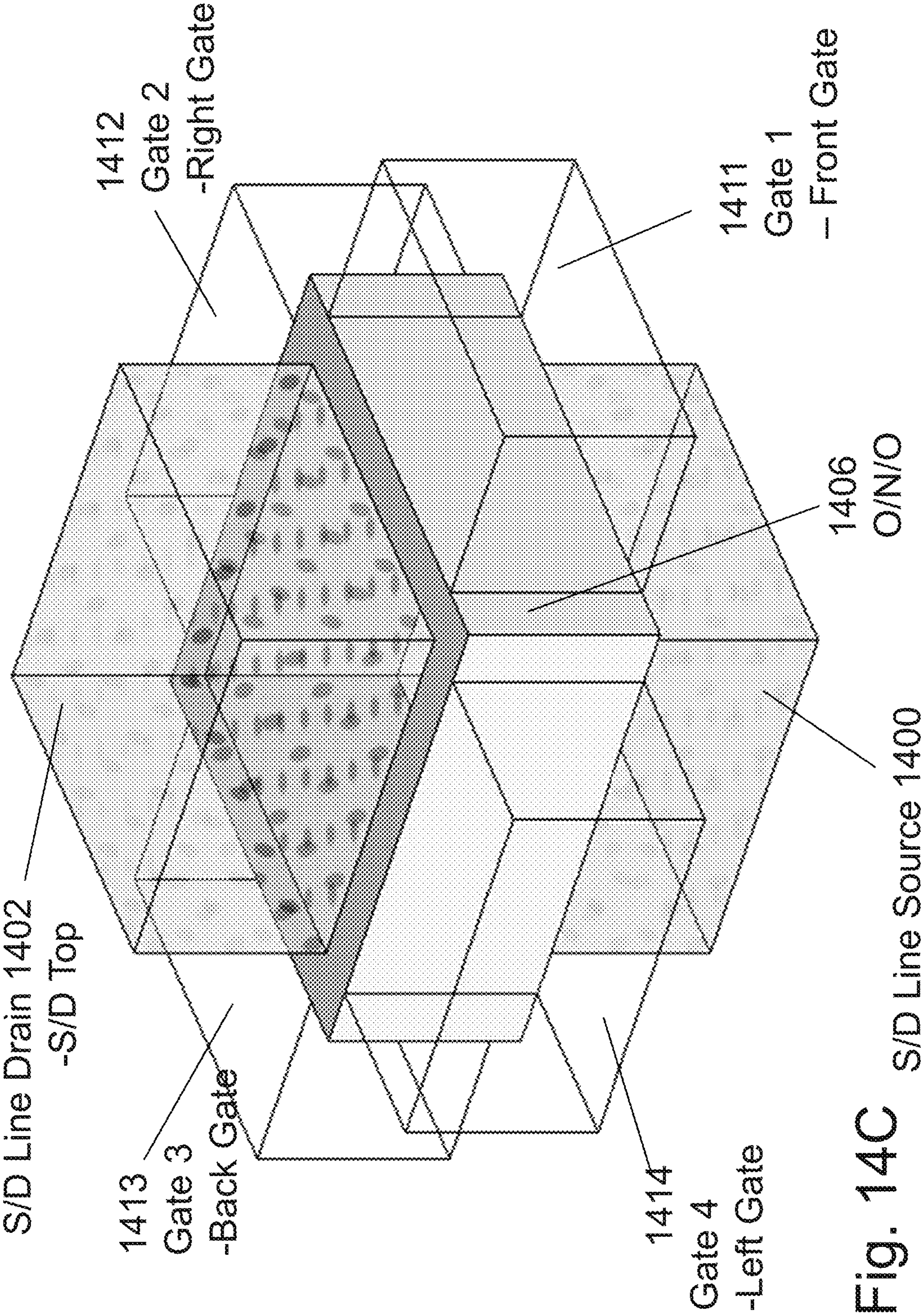

FIG. 14C is a 'zoomed-in' illustration of the memory channel of FIGS. 14A and 14B showing portions of the top S/D line 1402, the bottom S/D line 1400, and the four side gates: the front gate 1411, the new right gate 1412, the back gate 1413, and the new left gate 1414. In this 3D NOR structure every adjacent memory cell has a gate in between acting as, for example, a right gate to one channel and a left gate for the adjacent channel.

The move from a memory cell with two facet of gated control charged trap surfaces to a memory cell with four facets of gated control charged trap surfaces would allow a doubling of the memory cell storage capacity. Moreover, a smart control leveraging these multiple gate memory cells could enable a far larger increase in per cell storage capacity as will be described in the following.

Figures 15A, 15B, 15C:
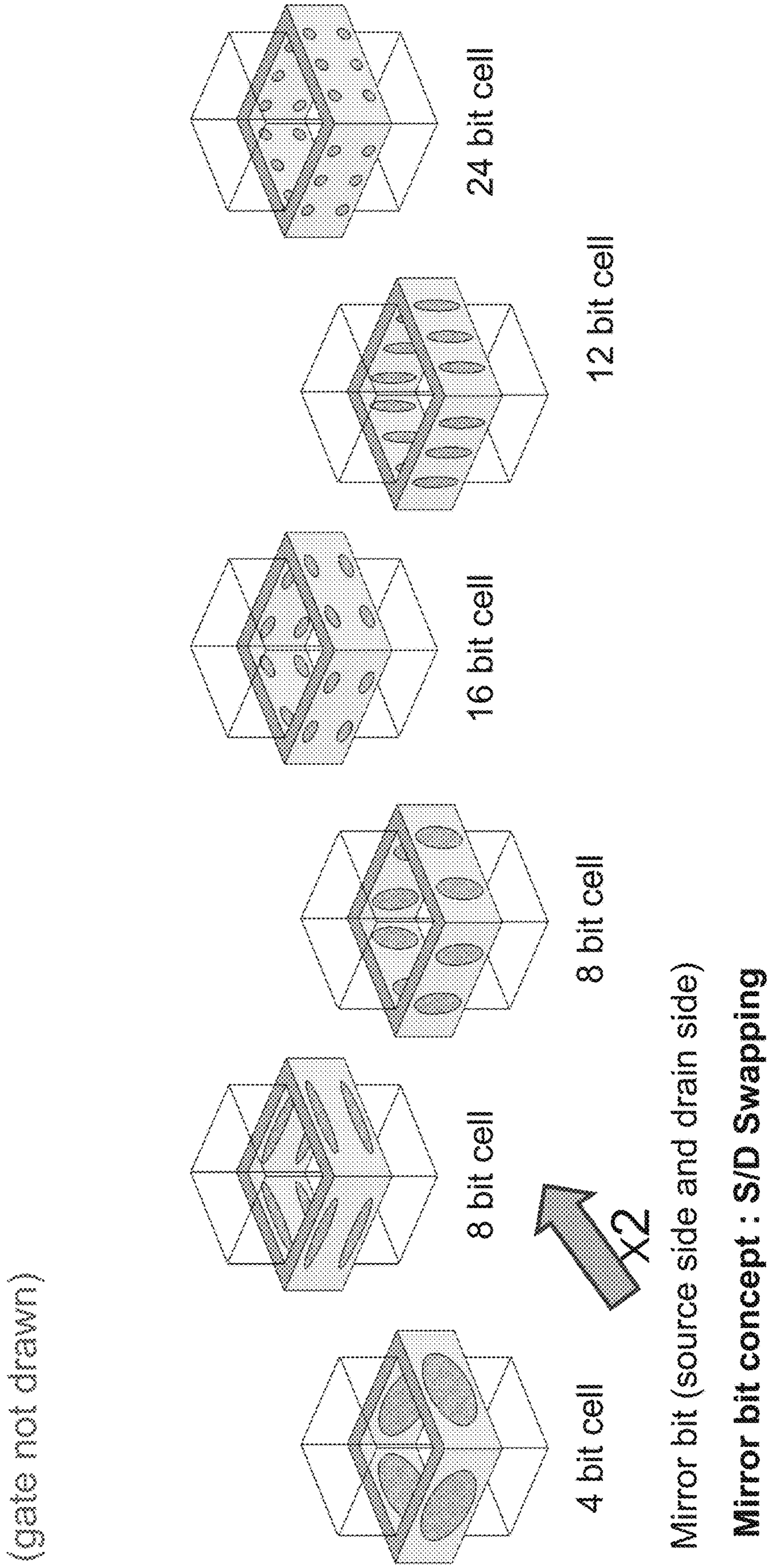
FIGS. 15A-15D are example illustrations of operation modes of a 4-Gate 3D NOR cell.

FIG. 15A illustrates a simple operation mode of the 4-Gate 3D NOR in which each facet is independently operated & controlled by that facet gate allowing 4 bits per cell. Deploying the well-known MirrorBit control by source-drain swapping and properly operating to Top S/D line and the Bottom S/D line could be used to double the bit per facet resulting with a total 8 bits per cell. It also well-known that every bit location could be extended to multiple coded by multilevel technique in which the operation could charge different amounts of charge based on the data. Common in the industry today are 8 levels corresponding to 3 bit stored in one bit location site. Accordingly FIG. 15A could represent 24 bits per cell.

This multilevel technique could apply to the following higher bit sites per facet scheme just as well.

FIG. 15A illustrate a more advanced operation mode of the 4-Gate 3D NOR in which three gates are involved for operating the memory cell. The facet gate performs the main function while the two other gates provide charge direction to focus the operation into the right corner or to the left corner. This yields 4 sites per facet and 16 bits for the memory cell.

FIG. 15B illustrate a more advanced operation mode of the 4-Gate 3D NOR in which three gates are involve for operating the memory cell. The facet gate performs the main function while the two other adjacent gates provide charge direction to focus the operation into the right corner or to the left corner by enhancing or suppressing the electric field by choosing proper voltage level and polarity. This yield 4 sites per facet and 16 bits for the memory cell.

FIG. 15C illustrate even more advanced operation mode of the 4-Gate 3D NOR in which three gates are involved for operating the memory cell. The facet gate performs the main function while the two other adjacent gates provide charge direction to focus the operation into the right corner, to the left corner or to the middle by enhancing or suppressing the electric field by choosing proper voltage level and polarity. This yields 6 sites per facet and 24 bits for the memory cell.

Figure 15D:
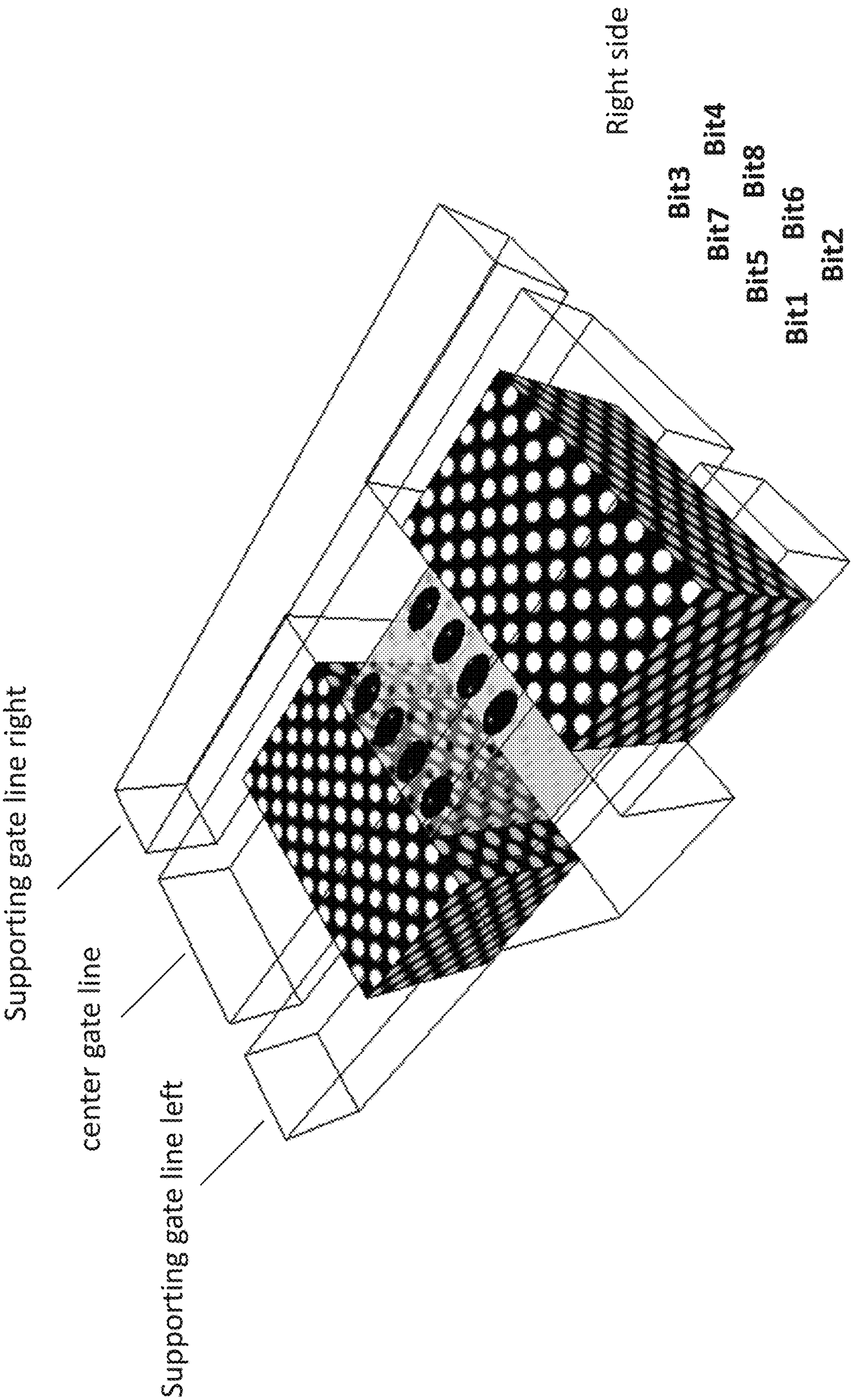

FIG. 15D illustrate very advanced operation mode of the 4-Gate 3D NOR in which three gates are involved for operating the memory cell. The facet gate performs the main function while the two other side gates provide charge direction to focus the operation into 4 sites along the facet edge facing the S/D lines yielding 8 sites per facet and 32 bits for the memory cell by enhancing or suppressing the electric field by more fine tuning proper voltage level and polarity. More sites per edge could be designed based on channel sizes & technology parameters considering how many levels per site are designed and other considerations.

To further illustrates the 4-Gate 3D NOR operation a table for the operating mode is provided. The memory channel has one facet facing and connecting to the top S/D line (S/Dtop) and one to the bottom S/D line (S/Dbottom), it has four gate controlled facet. For the facet the table is referring the gate controlling that facet would be called C-Gate, the supporting gate on its right side would be called R-Gate, and the one on its left L-Gate. The table suggests specific voltages but those could be consider relative values, based upon design and engineering considerations. The voltage to perform write into the charge traps is called 8 v and accordingly the erase is −8V. Values such as 2 v, 4 v and 6 v are high enough to direct the charge but not high enough to cause significant charge trapping.

Figure 16:
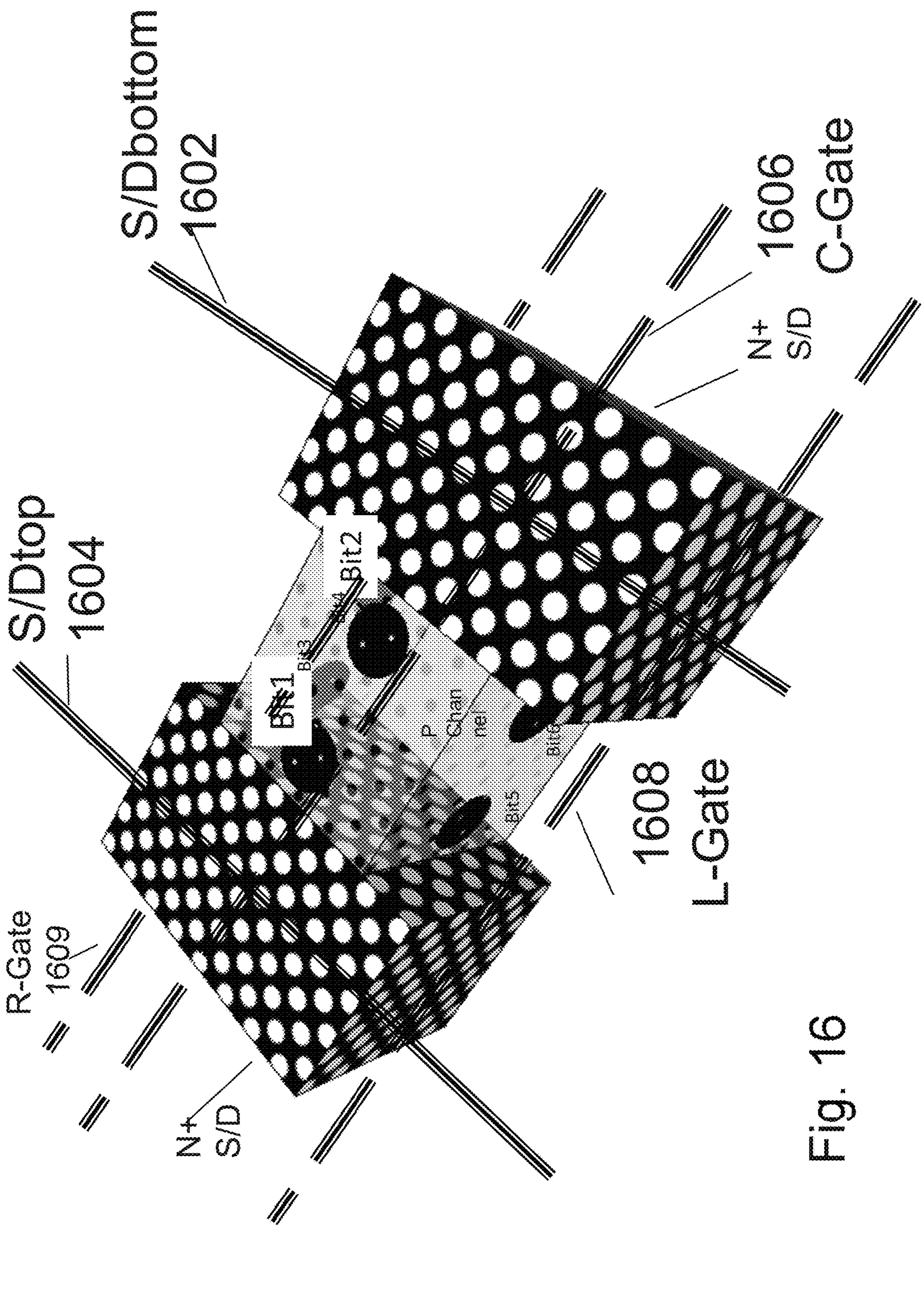
FIG. 16 is an example illustration of a channel with a facet holding bit 1 and bit 2.

FIG. 16 illustrates a channel with a facet holding bit 1 and bit 2, controlled by C-Gate 1606 with right gate R-Gate 1609 and left gate L-Gate 1608, a top S/D line 1604 S/Dtop close to Bit 1 and a bottom S/D line 1602 S/Dbottom close to Bit 2

FIG. 17 illustrates an example of the operating conditions for that storage facet. The read is by measuring the current (Vth) between the S/Dtop to S/Dbottom when pulsing S/Dtop from low to high, and swapping it for reading Bit 2. These operating conditions are well known as this is the common NOR with MirrorBit.

Figure 18:
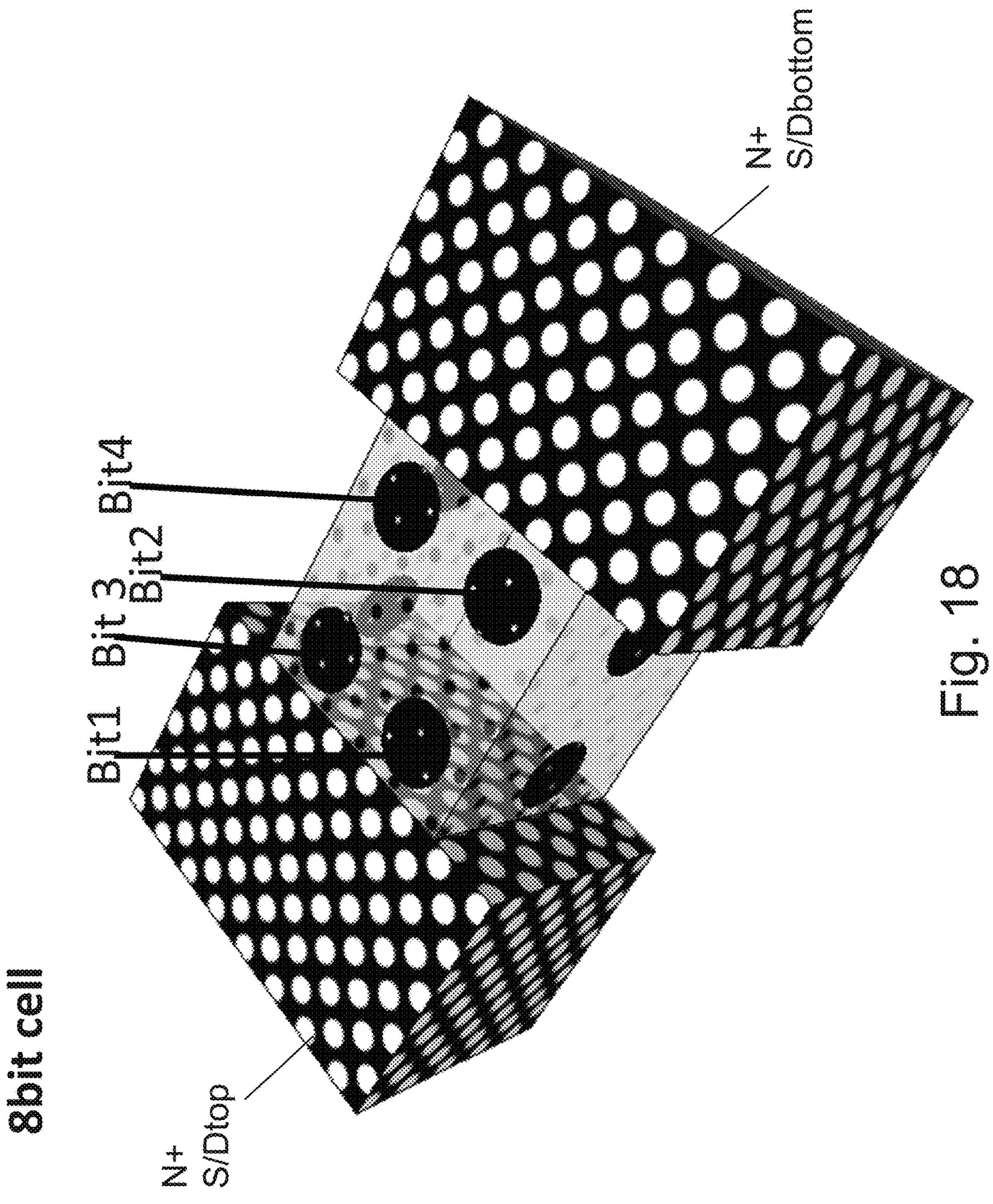
FIG. 18 is an example illustration of a channel with a facet holding 4 bits.

FIG. 18 illustrates 4 bit naming and locations on a facet.

FIG. 19 illustrates the operating condition for that storage facet. The read is by measuring the current (Vth) between the S/Dtop to S/Dbottom when pulsing S/Dtop from low to high.

Figure 20:
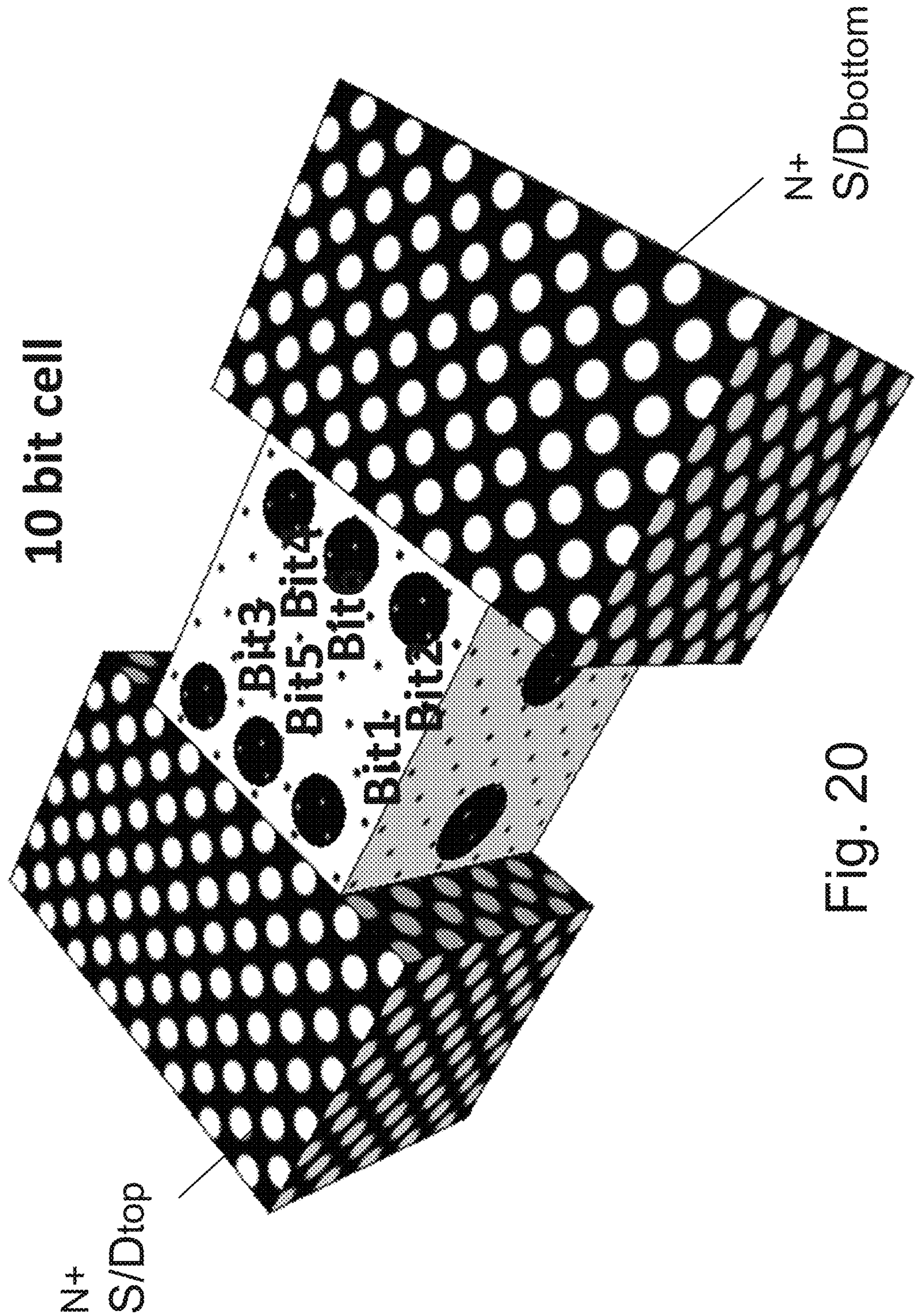
FIG. 20 is an example illustration of a channel with a facet holding 6 bits.

FIG. 20 illustrates 6 bit naming and locations on a facet.

FIG. 21 illustrates the operating condition for that storage facet. The read is by measuring the current (Vth) between the S/Dtop to S/Dbottom when pulsing S/Dtop from low to high.

Figure 22:
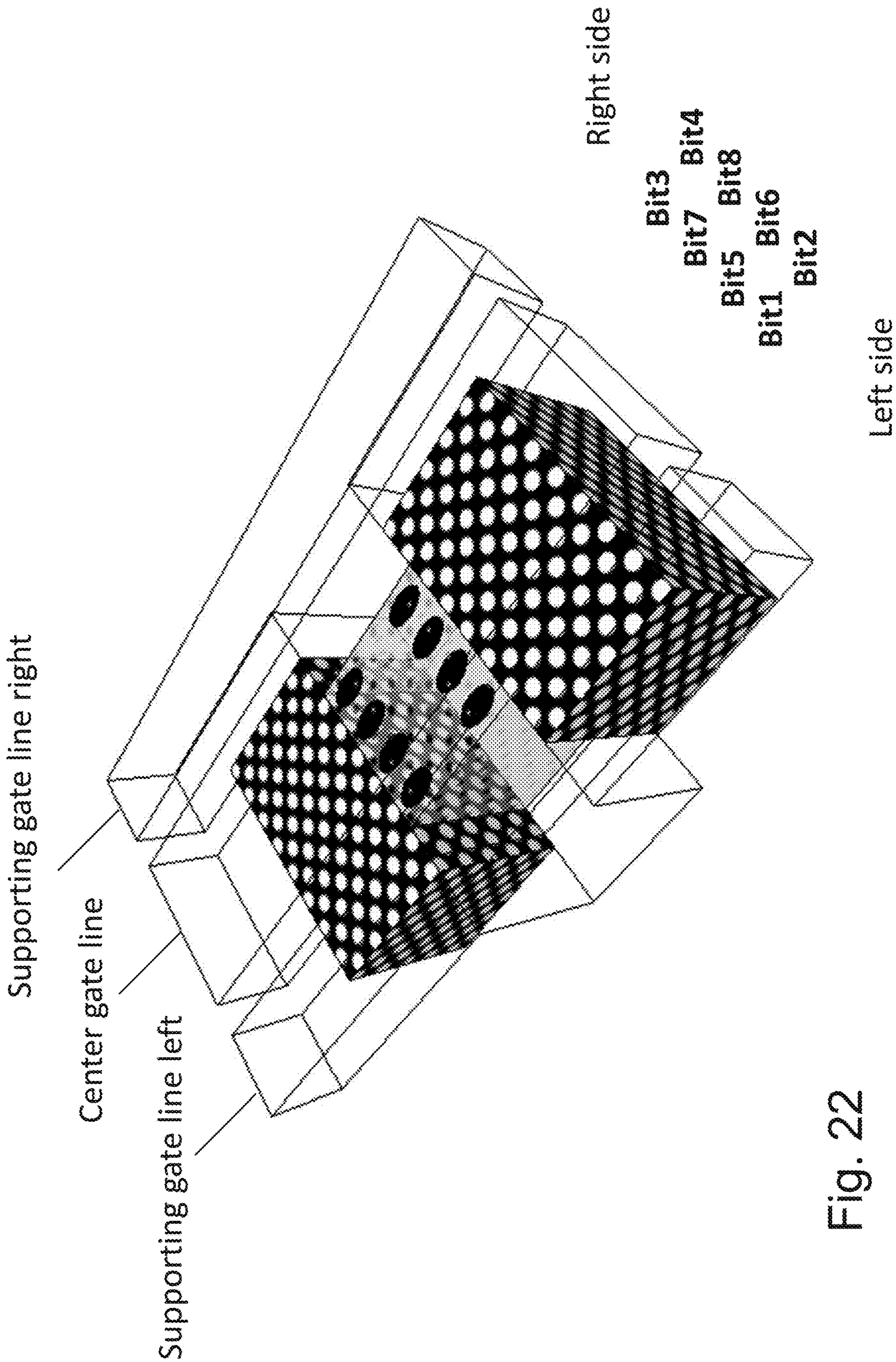
FIG. 22 is an example illustration of a channel with a facet holding 8 bits.

FIG. 22 illustrates 8 bit naming and location on a facet.

FIG. 23 illustrates the operating condition for that storage facet. The read is by measuring the current (Vth) between the S/Dtop to S/Dbottom when pulsing S/Dtop from low to high.

Engineering the memory peripheral circuits for the memory matrix including the circuits to generate the required signals for the memory control lines and the sense circuits to sense the memory content is a well-practiced memory engineering task. The memory structure presented herein adds some less common variation as a word-line controlling a gate may function as a R-Gate or as C-Gate or as L-Gate depend on the specific channel currently in action. In the following we review the high level architecture for such a memory control circuit.

The discussion would be for one of the many alternative architecture options—of an 8 bit per facet as illustrated in FIG. 22 with ridge select control as illustrated in FIG. 8E and word-line arrange as illustrated in FIG. 13.

As an alternative the gate control lines of the cells adjacent to a channel which is being written to or read from could be put into negative voltage such as −4 v to disable these adjacent channels. So for example if in reference to FIG. 13 a WL4 is active as being the control gate (C-Gate) for the channel between underneath 1302 between WL2 and WL3, so WL2 and WL3 are acting as L-Gate and R-Gate respectively, then WL5, WL6 are both being set to −4 v negative (which still do not erase), and also WL7 could be set to −4 v negative, so the right channel to WL4 underneath 1304 is deactivated to avoid disturb.

Figure 24:
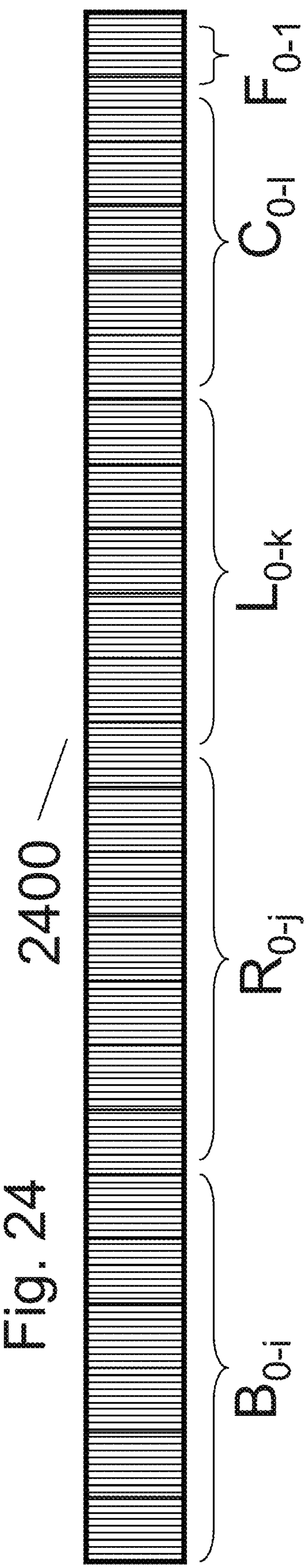
FIG. 24 is an example illustration of a memory addressing format.

FIG. 24 illustrate a memory addressing format 2400 which could include 0-2 bits to select the specific facet ($F_{0-1}$), a few bits to select the specific Channel ($C_{0-1}$), a few bits to select the specific layer ($L_{0-k}$), a few bits to select the specific Ridge ($R_{0-j}$) and a few bits to select the specific memory Block ($B_{0-i}$). The decoding function of the Block and Ridge is straight forward.

Figure 25A:
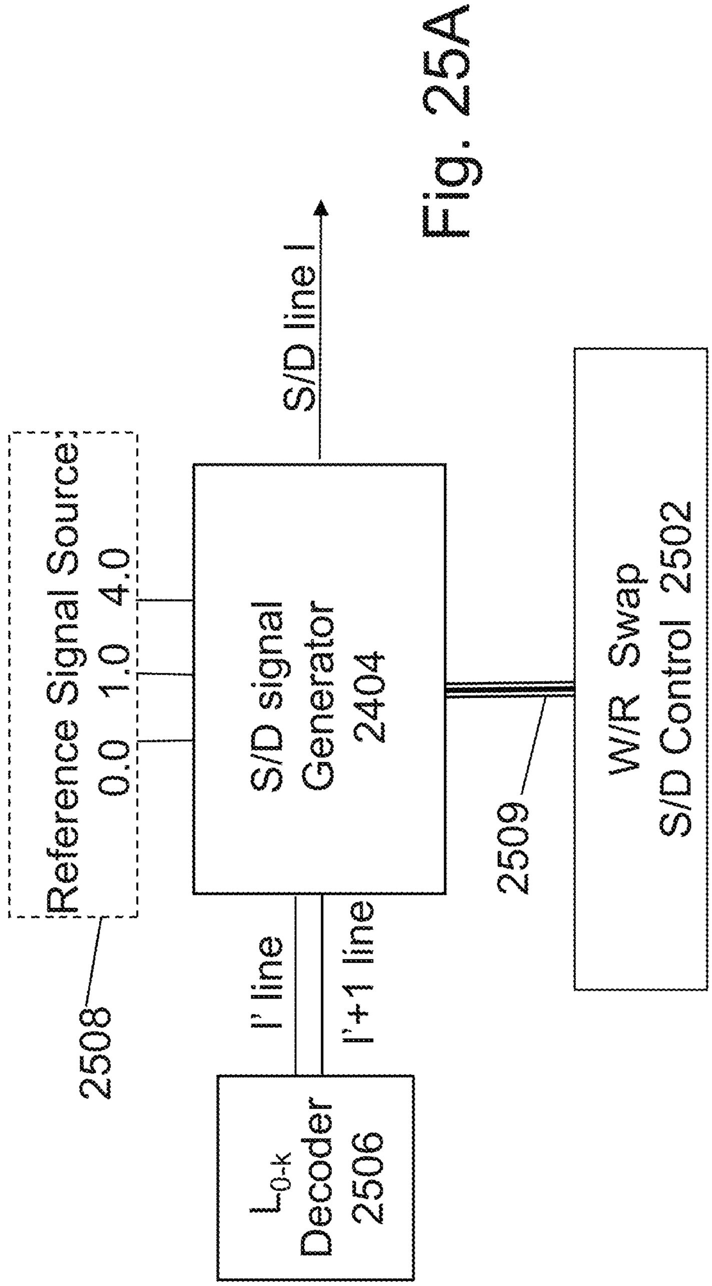
FIGS. 25A-25B are example illustrations of block diagrams of circuit control circuits.

FIG. 25A illustrates block diagram of the circuit controlling each of the bit-lines—S/D line 1 in which 1 denotes the layer. The decoder 2506 will assert one line of the 1 lines for each layer. The signal generator 2508 will provide the required signals that could be applied to the S/D line. The signal generator 2404 will activate signals only to the S/D line 1' for 'bottom' function activated by 1' or 'top' function activated by 1'+1 to provide the proper signal to the selected channel according to the table of FIG. 23 and the operation control as signaled by the S/D control 2502 to activate write, read or erase.

Figure 25B:
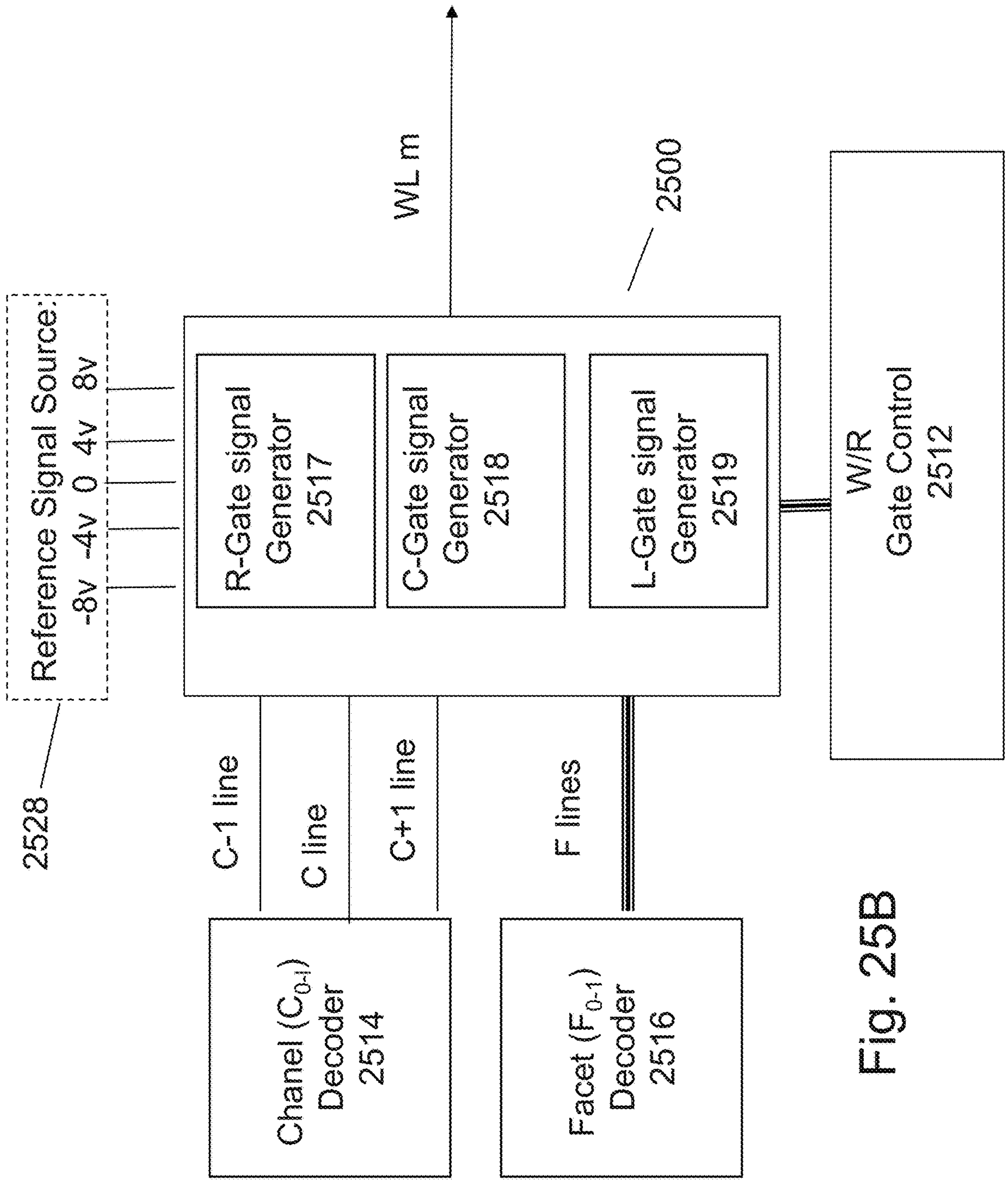

FIG. 25B illustrates a general block diagram of the circuits to control the word-lines. Each word-line could function as R-Gate, C-Gate or L-Gate according to the Channel decoding and the Facet decoding. The Gate-Lines could affect two channels so the decoding needs to account for it and activate the function based on the choice of Channel Facet and for some also odd or even Ridge. For each gate lines three channels may need to be considered. The circuit could be varied to support the three flavors of gates (WL1, WL4, WL7 . . . ), (WL2, WL5, WL8, . . . ) and (WL3, WL6, WL9, . . . ). For each Word-Line (WLm) a circuit as illustrated in FIG. 25B could be constructed. The circuit could be activated if one of the lines (C−1, C, or C+1) is activated by the channel decoder 2514. Than a word-line WL m could function as R-Gate, C-Gate or L-Gate according to the selection of Facet as decoded by the Facet decoder 2516 and the activated channel line. Each WL m could have a channel signal generator 2500 which could include three generators, one for the R-Gate function 2517, one for the C-Gate function 2518, and one for the L-Gate function 2519. These generators would generate the right signal according to the selected function as could be signaled by the Write/read control 2512 and using reference signals provided by the reference signal source 2528.

The reference signal generator 2528 provides the required signals to operate the read write operations. All the voltages suggested herein are suggested voltages for some conceptual 3D-NOR. These signal levels could be adjusted for specific designs based on the choice of materials, process flow, layer thicknesses, and feature sizes.

Another known enhancement technique is to control the amount of charge being trapped in a cell to allow coding of more than 1 bit based on the amount of charge. These different enhancement techniques could be combined to achieve an even higher number of bits per cell. Current charge trap memories are known to achieve 3 bits or 8 levels per cell. A white paper titled "MirrorBit® Quad Technology: The First 4-bit-per-cell Flash Memory Spansion™ MirrorBit Quad Technology to Expand Flash Memory Innovation for Electronic Devices" was published by Spansion—www.spansion, Doc. 43704A (SEPTEMBER 2006), incorporated herein by reference. The paper shows the use of MirrorBit in which every bit site could be programmed to one of 4 levels representing 2 bits, providing in total 4 bits per cell. Adapting such to the HD-NOR could result with 54 bits per cell non-volatile memory structure. And the structure could be organized to have some of the memory used as fast access FB-RAM for which a self-refresh mode could be added. In addition, known techniques such as Probabilistic error correction in multi-bit-per-cell flash memory as described in U.S. Pat. No. 8,966,342, incorporated herein by reference, could be integrated for increased robustness of such memory operations.

Figure 26:
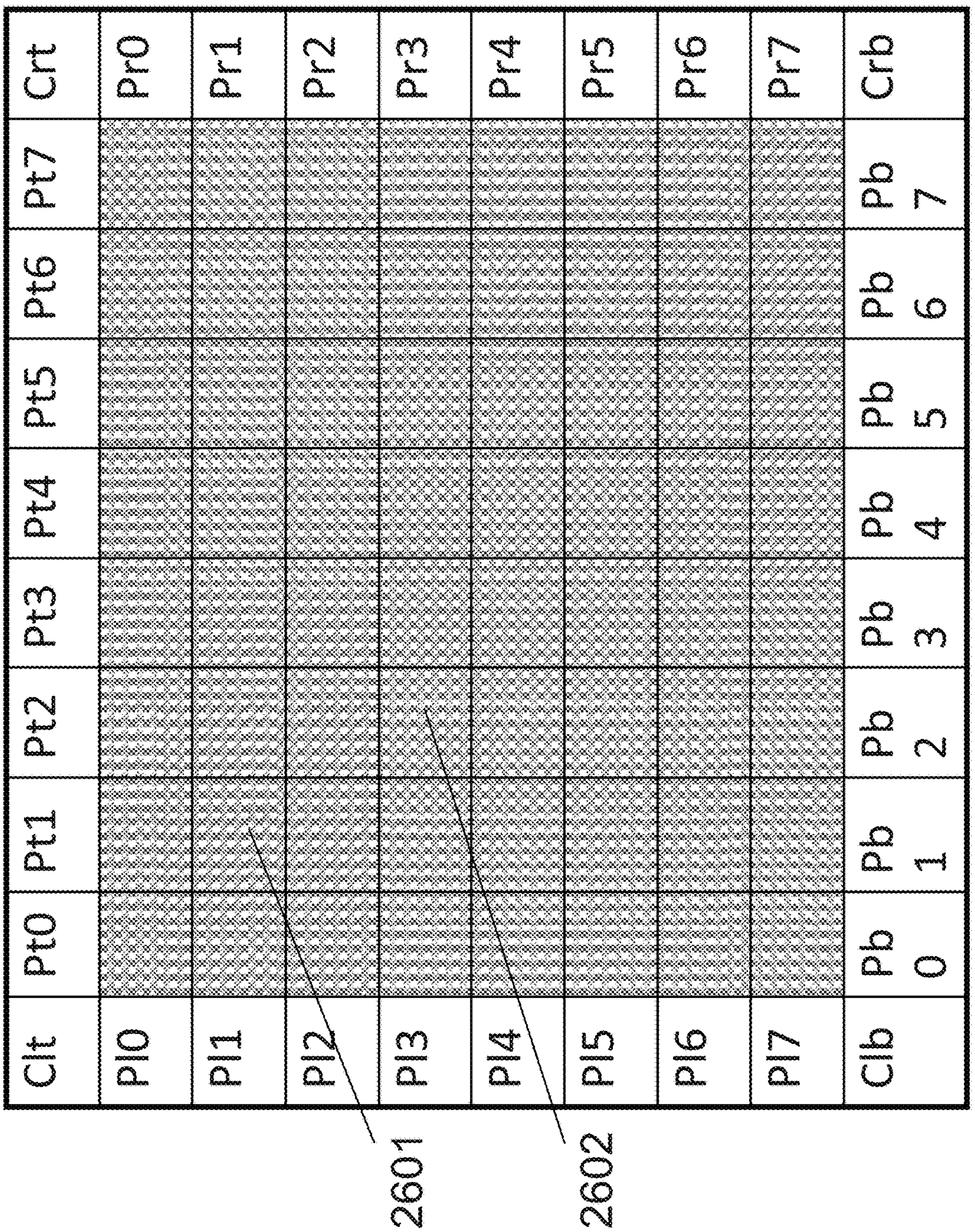
FIG. 26 is an example illustration of a architecture of a 3D-NOR array.

FIG. 26 illustrates an exemplary architecture of a 3D-NOR array. It could be a standalone device structure or embedded within a larger SoC. It illustrates a modular memory structure of 64 memory blocks, for example, forst memory block 2601 and second memory block 2602 with the peripheral circuits built-in a corresponding modular structure with 8 top units Pt_i to control the word-lines and additional 8 bottom units Pb_i to control the word-lines, and 8 left side units Pl_i to control the bit-lines and 8 right side units Pr_i to control the bit-lines. These could be used to drive the control lines from both sides to improve performance and reduce variability. By accessing from both sides the S/D line resistivity could be neutralized as the overall resistivity of the Source line access plus the Drain line access would be the same and would not highly dependent on the specific memory cell location along the ridge. Accordingly the read and write to a specific cell within a ridge would be substantially similar for all cells of that ridge In addition it could also be used as redundancy so that single control unit failures could be recovered.

This architecture could also support additional modes of operation. The structure could be designed to allow independent access to 8 blocks provided none of them share the Peripherals circuits. It could designed to support synchronized access of up to 8 units sharing the same row or sharing the same column and or the same layer, reducing access power and still provides multiple bits.

It could be designed to support on chip transfer from the non-volatile portion to the high speed FB-RAM portion or the other way. Such transfer could be done in parallel to or from 8 blocks reducing time and power for such transfer. Such capabilities could allow high speed access with a low power operating mode. So data is transferred to FB-DRAM designated block for fast access but could stored back into the NOR NV section for sleep or power down.

The corners Clt, Crt, Clb, Crb could be used for device top level control for the operating mode, to generate the special voltage source required for read and write, and for interface to external devices.

In general memory design it is common to use partitioning which utilizes powers of 2 numbers such as: 4, 8, 16, 32, 64, . . . . Such work well with decoding and addressing. Yet, FIG. 20 illustrates a structure for which the number of bits sited within a facet is 6 challenging the decoding function. An optional solution is to find a memory allocation which would be close enough to bridge over this challenge with minimal cost. As an example a facet of 6 sites might allow each site to have 3 levels representing a total memory space of 18 bits. This could be mapped to an address space of 4 bit which would need 16 memory storage options out of the potential 18. A simple look up table could be used for the circuit to support such memory allocation.

Alternatively 3 layers could be used to form the 18 memory sites of which 16 would be used. Or 11 layers to form 66 sites of which 64 could be used reducing further the unused memory sites, which could also be used as redundancy for repair of defective sites with proper look up table in the control circuits.

Figure 27:
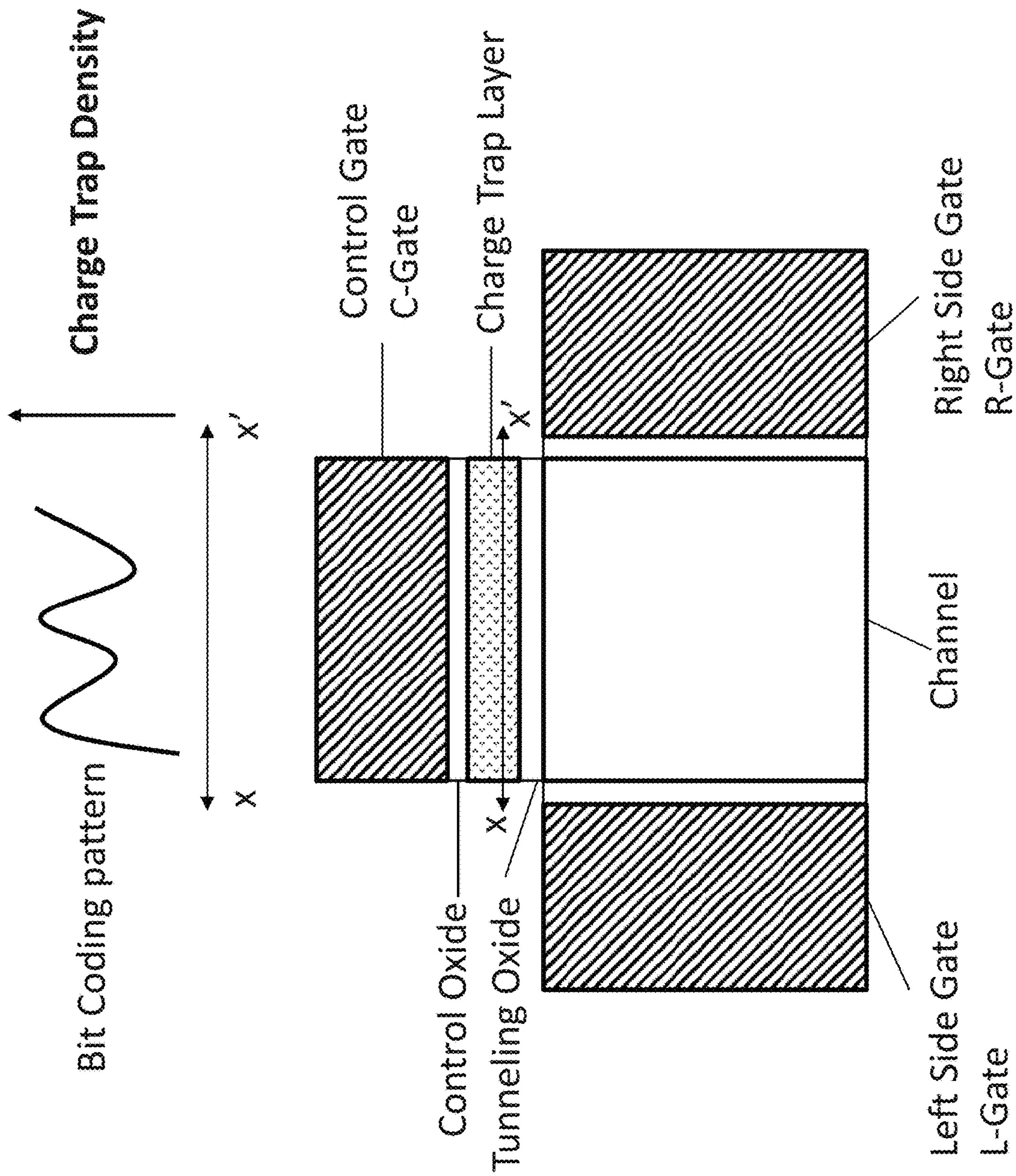
FIG. 27 is an example illustration of distributed bits allocation for a 3D NOR cell.

The three gates control of the charge trap layers of this 3D-NOR as illustrated in FIG. 22 could be used for distributed bits allocation rather than distinct sites, is illustrated in FIG. 27.

Figure 28:
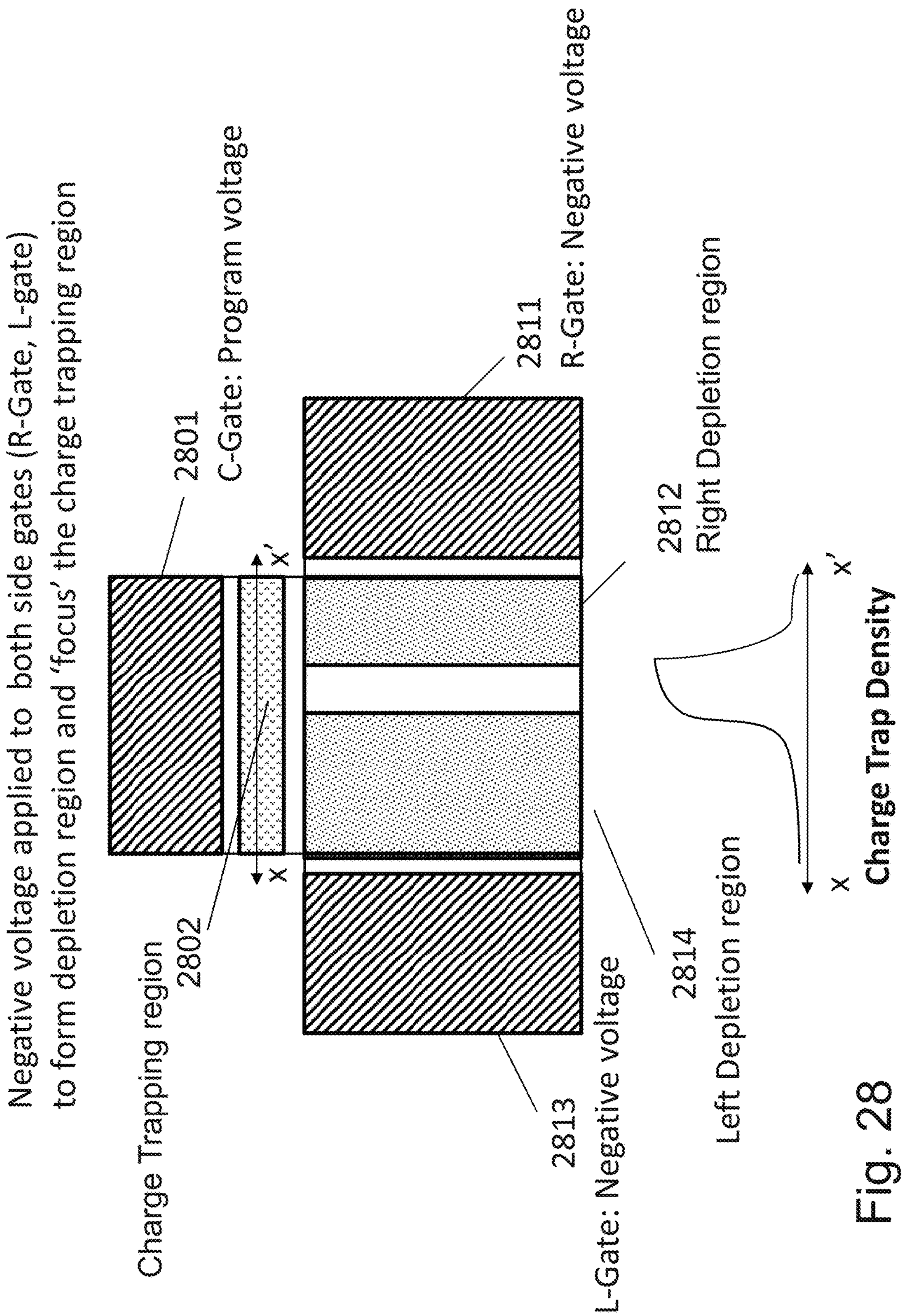
FIG. 28 is an example illustration of focusing the trapping region to a zone of charge trapping region.

FIG. 28 illustrates the concept of utilizing the right gate 2811 and left gate 2813 to focus the trapping region to a zone of trapping region 2802 driven by the control gate 2801 high 'programming' voltage. The R-Gate voltage and the L-Gate voltage need to be below the voltage which forces charges into the charge trap layer (write) or off the charge trap layer (erase). The negative voltage of the right gate depletes the channel region under its control 2812 while the negative voltage of the left gate depletes the channel region under its control 2814 focus the region of charge trapping. Controlling the process could allow a scanning of the region within the channel for which charge could be available and accordingly allows forming a distribution of charges trapped at the trapping layer. This could be done by controlling the voltage of the side gates to form a scanning like charges within the channel while control of the control gate 2801 programming voltage and the S/D charges forming current could control the amount of charges being trapped at the 'focus' zone 2802.

Figure 29:
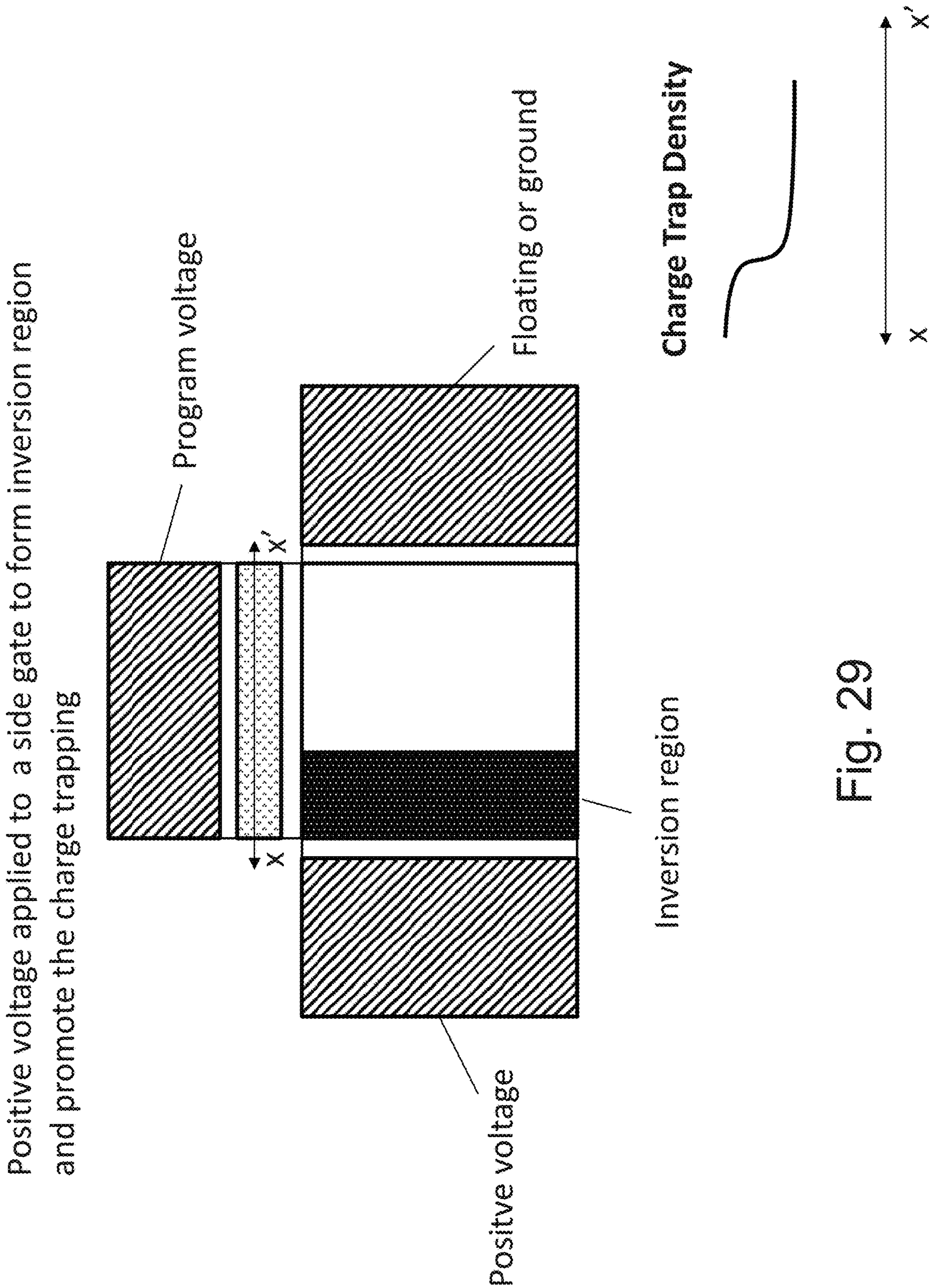
FIG. 29 is an additional example illustration of focusing the trapping region to a zone of charge trapping region.

FIG. 29 illustrates the use of positive voltage to form trapping 'focus'. Adding positive voltage to the R-Gate and L-Gate could be used to extend the width of the controlled regions within the channel.

Figure 30:
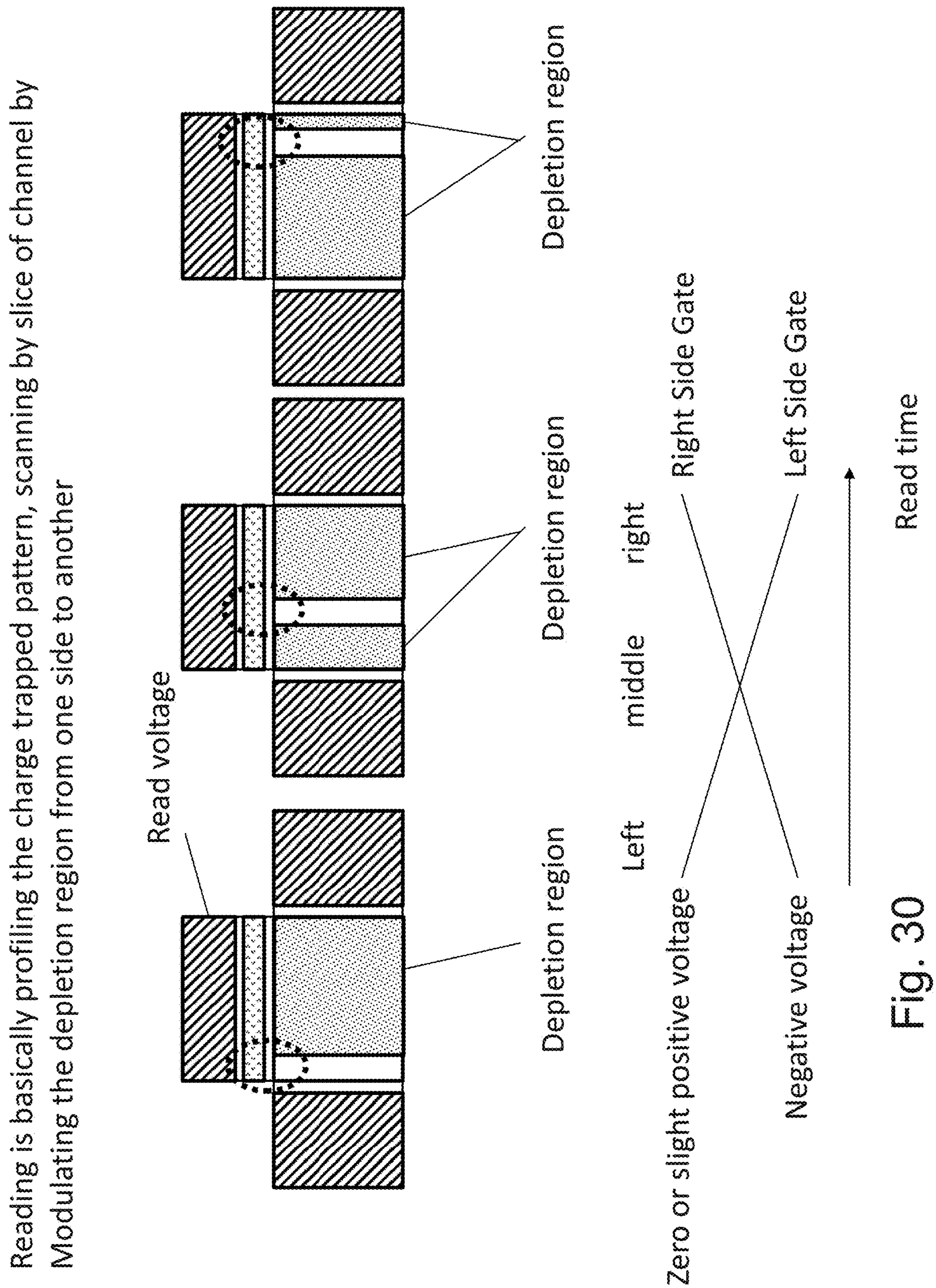
FIG. 30 is an example illustration of reading a zone of charge trapping region.

FIG. 30 illustrates the concept of using the scanning concept for reading. For reading the R-Gate and the L-Gate could be controlled to form scanning just like in writing but the C-Gate voltage is kept below the voltage that drive charges in or out of the charge trap layer, and by monitoring the current through the channel by sensing the selected S/D lines and monitoring their current.

Figure 31:
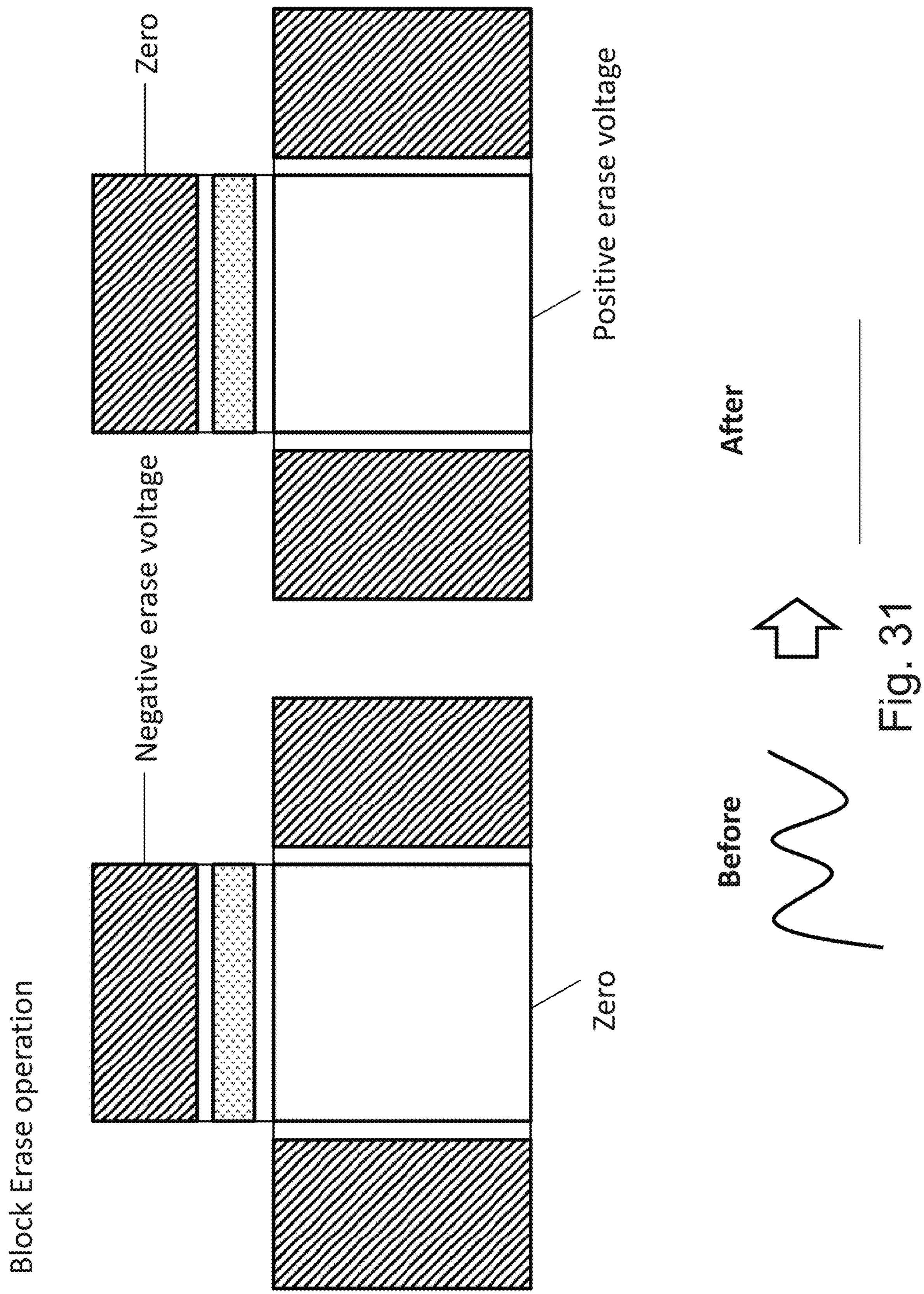
FIG. 31 is an example illustration of a block erase operation on a zone of charge trapping region.

FIG. 31 illustrates a block erase operation in which all the charges are being forced out from their respective trap zones.

This distributed form of storage could help reduce the sensitivity to local defect and increase the overall memory capacity.

For this distributed memory storage technique the Orthonormal basis signal processing techniques of linear algebra could be deployed. Quoting: Orthonormal Basis: A subset $\{v_1, \ldots, v_k\}$ of a vector space V, and the inner product $\langle , \rangle$, it called orthonormal if $\langle v_i,v_j\rangle=0$ when $i\neq j$. That is, the vectors are mutually perpendicular. Moreover, they are all required to have length one: $\langle v_i,v_i\rangle=1$.

There many such basis and there in signal processing has been extensively studied in the art. A subset of these are called wavelets as been described in article by G. BEYLKIN titled: "ON THE REPRESENTATION OF OPERATORS IN BASES OF COMPACTLY SUPPORTED WAVELETS" published SIAM J. NUMER. ANAL. c 1992 Society for Industrial and Applied Mathematics Vol. 6, No. 6, pp. 1716-1740, December 1992 011, incorporated herein by reference.

With Orthonormal set of vectors every 'bit site' could be represented by one of these vectors. So for n bits we would have n vectors. Writing a bit would be like adding a vector to the charge trap surface by scanning along the channel and modulating the amount stored according to the vector. Reading would be the inverse which could be the effect of multiplying the stored values by the reading vector. Accordingly if the vector was stored the value of the reading would be '1' and if it was not than it would be '0'. The vector itself could be multiplied by a scalar which would represent multilevel per vector.

Additional information on wavelets and related decomposition and reconstruction algorithms may be found in "Fundamentals of Wavelets Theory, Algorithms, and Applications," Goswami, J., C., et al., $2^{nd}$ Ed., JWiley & Sons, 2010, especially chapters 6 and 7, the entire book is incorporated herein by reference. Orthonormal wavelets such as, for example, of Shannon (sine radians sampling), Meyer (smoothing of Shannon), Battle-Lemarié, and Daubechies may be utilized depending on engineering choices and optimizations Biorthogonal wavelets, for example, of Cohen, Daubechies, and Feaveau, may be useful depending on engineering choices and optimizations. Moreover, additional information on wavlets may be found in B. Vidakovic, et al., "Wavelets for Kids, A Tutorial Introduction," 1994 Duke University, incorporated herein by reference.

Figure 32B:
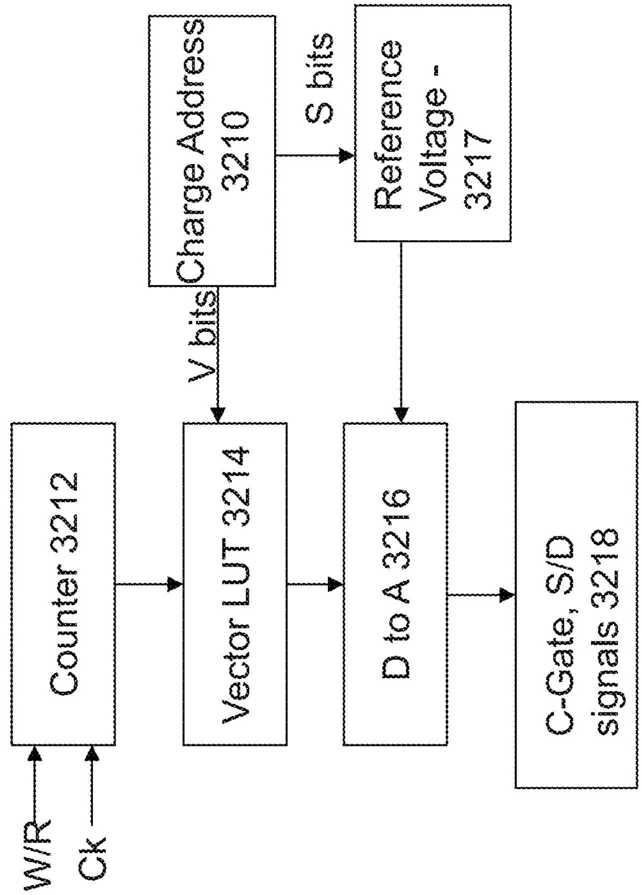
FIG. 32A-32B are example illustrations of block diagrams of optional circuits to generate signals.
Figure 32A:
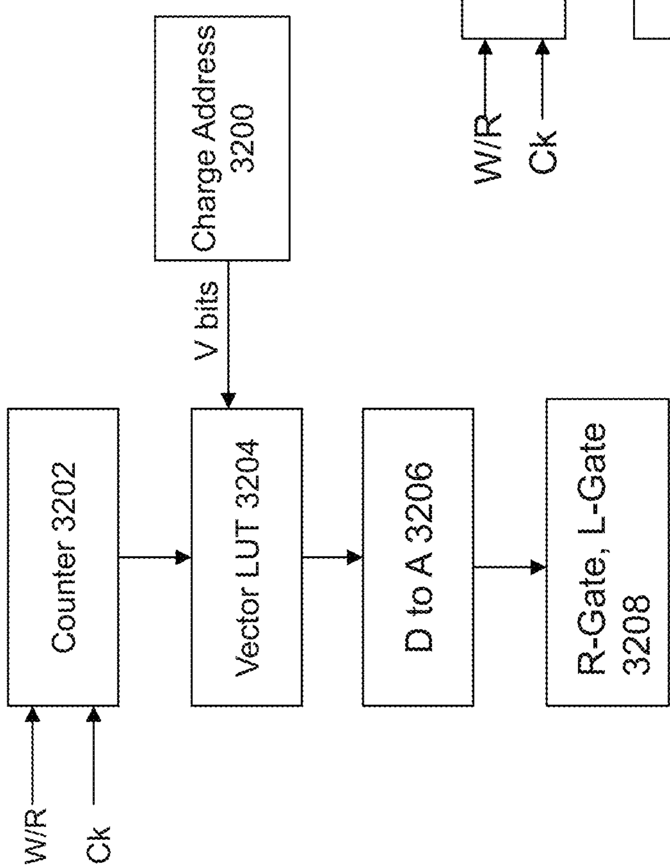

FIG. 32A illustrates a block diagram of optional circuits to generate the signal for such a storage approach. A counter 3202 will start counting per each write pulse or read pulse. The counting bits would be inputted into a look-up-table (LUT) 3204 along with additional vector selection bits—V bits from the charge address 3200. The look-up-table 3204 would carry the full set of vectors of which would be selected by the inputted V bits. The counter would facilitate the scanning process by going along the vector address. Similar circuits could be used for the generator of each of the control signal for the R-Gate and L-Gate. The output of the LUT 3204 could be inputted to a digital to analog converter 3206. This circuit could be used for the read scanning signal generator and the write scanning signal generators. The signals 3208 for the R-Gate and L-Gate could be the same for read or write. Scalar multiplication could be achieved by the C-Gate and S/D signal, yet it could be alternatively achieved by controlling the scan time so by doubling the time double amount of charge could be trapped. Time control is less common as it impact the memory access time.

FIG. 32B illustrates a block diagram of optional circuits to generate the signal for such a storage approach. A counter 3212 will start counting per each write pulse or read pulse. The counting bits would be inputted into a look-up-table (LUT) 3214 along with additional vector selection bits—V bits from the charge address 3210. The look-up-table 3214 would carry the full set of vectors of which would be selected by the inputted V bits. This is optional as the vector could be defined by the scanning process related to FIG. 32A, and accordingly the Vector LUT 3214 would become a fixed voltage or could incorporate the scalar multiplication currently illustrated by the reference voltage generator 3217. The counter 3212 would control the write and read operation during the scanning process. Similar circuits could be used for the generator of each of the control signal for the C-Gate and S/D lines. The output of the LUT 3214 could be inputted to a multiplying digital to analog converter 3216. The scalar could be represented the level from the Reference voltage generator 3217 according to the S bits from the charge address 3210 could be provided to the D to A 3216. This circuit could be used for the read signal generator and the write signal generators. The signals 3218 would support the write operation with a high positive voltage, the read operation with a mid-positive voltage and erase operation with high negative voltage.

Figure 33:
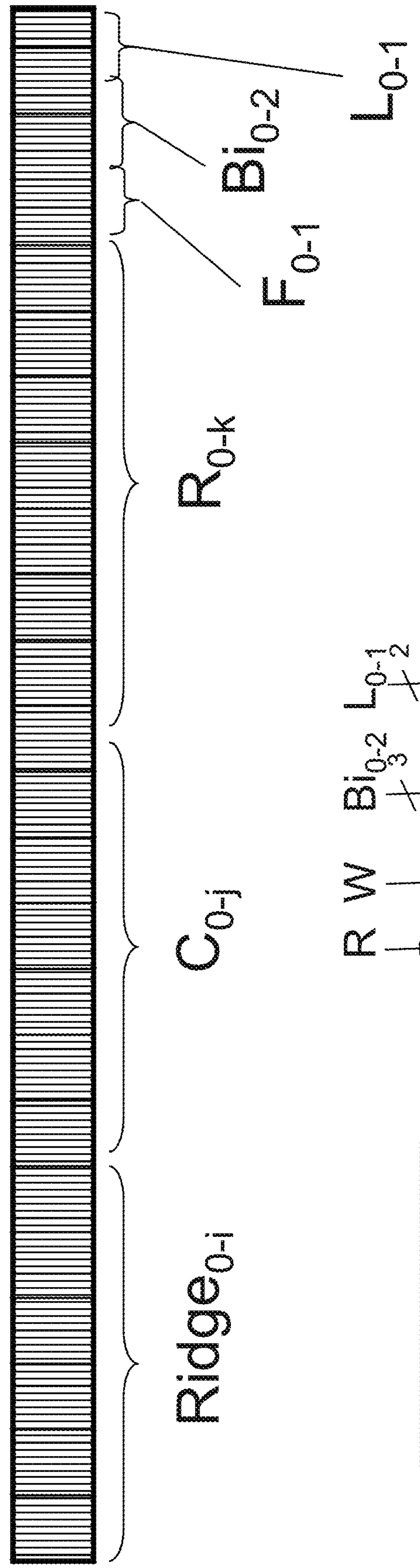
FIG. 33 is an additional example illustration of a memory addressing format.

An alternative peripheral circuits including block diagrams will now be presented for the 3D-NOR fabric such as is illustrated in FIG. 13 utilizing the 8 bit per facet as illustrated in FIG. 22. FIG. 33 illustrates an alternative addressing option 3300. The address could include a Ridge address with bits i+1 bits ($Ridge_{0-i}$), layer address with j+1 bits ($C_{0-j}$) which select the active bit-lines the S/D, Row address with k+1 bits ($R_{0-k}$) which select the active channel column within the Ridge as would be controlled by the selected word-lines, Facet address with 2 bits ($F_{0-1}$) to select one of the 4 facets and accordingly the role of the gates surrounding the selected channel column, Bit address with 2 bits ($Bi_{0-2}$) selecting one of the 8 bits within the facet and accordingly the voltage applied to the selected gates, and Level address with 2 bits ($L_{0-1}$) for an optional 4 levels of charge within the selected bit. The Ridge addressing is the higher level addressing and may be part of the S/D lines peripheral circuit. For the case that S/D lines are controlled by the structure illustrated in FIG. 8E the related peripheral circuits are selecting one SL line to be active while all other are disabled so that Ridge is active while all other Ridges are disabled. Accordingly the following discussion is for the active Ridge. For simplicity we assume a 3D-NOR structure design so that each of this decoding option represent a physical structure that is designed to be an integer by power of 2 (1, 2, 4, 8, 16, . . . ). For cases that this is not the case, some changes could be desired such as was discussed herein before.

Figure 34A:
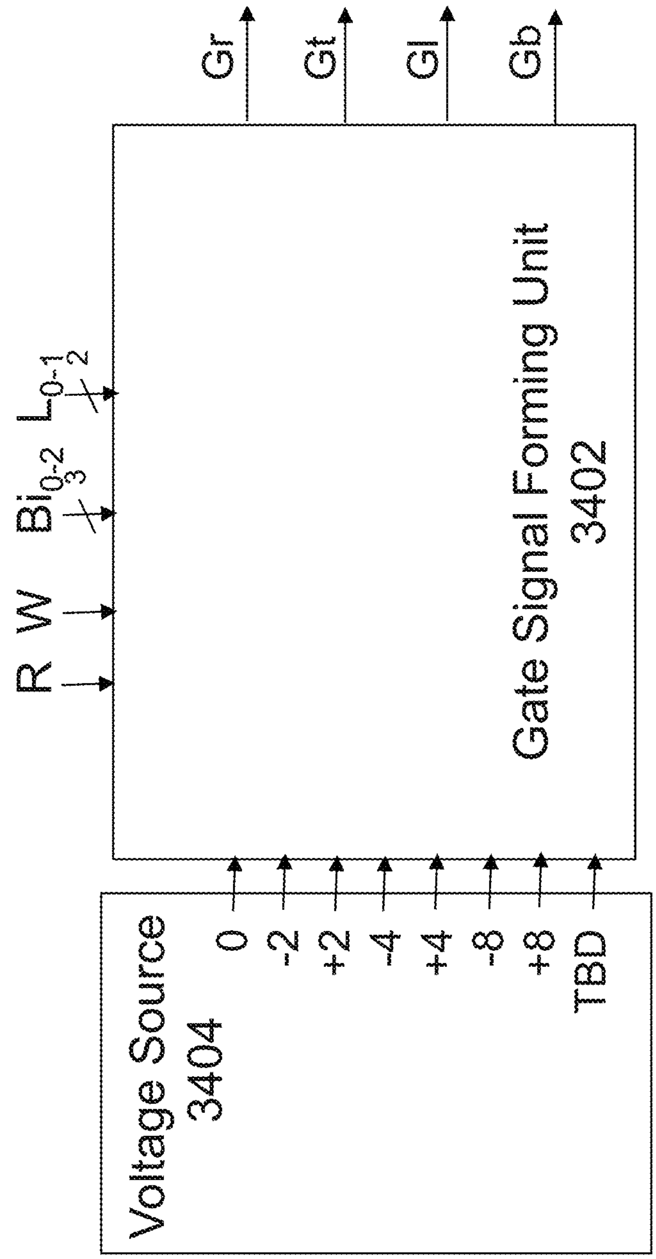
FIGS. 34A-34C are additional example illustrations of block diagrams of circuit control circuits.

FIG. 34A illustrates the first part of the word-line/gates related peripherals circuits. Voltage Source Circuits 3404 are the voltage generation circuits, which may be centralized circuits including charge pumps and other power supply type circuits generating the various voltages required for the 3D-NOR memory operations including voltages indicated in the table of FIG. 23 and other tables and discussions herein. Gate Signal Forming Unit 3402 circuits may be signal forming and selectors to generate the four gates signal outputs: Gr for the R-Gate of FIG. 23, Gt for the C-Gate of FIG. 23, Gl for the L-Gate of FIG. 23, and Gb which indicate the bottom gate or the inverse side of the channel in respect to the primary gate, also called the control gate or C-Gate. Gb for many memory operation could be left floating. These signals are the functional signals as indicated in FIG. 22. These signals would be connected to the selected gate of the selected channel and would be applied based on the selected facet. The formation of these signals would be according to the memory operation if write is indicted by W signal or read indicated by R signal and also according to the selected bit as indicted by address signals $Bi_{0-2}$, FIG. 22 and the table of FIG. 23 could be used to guide the detail functions of these circuits.

The $L_{0-1}$ address would indicate the level of charge stored or read from the selected bit. Changing stored levels could be achieved by additional write voltage levels such as, for example, 10 volts, 11 volts, 12 volts, etc. (adjusted to the device technology employed) or by modulating the writing/reading time or combination of these. The Gate Signal Forming Unit 3402 could include the corresponding circuits to implement the bit levels.

Figure 34B:
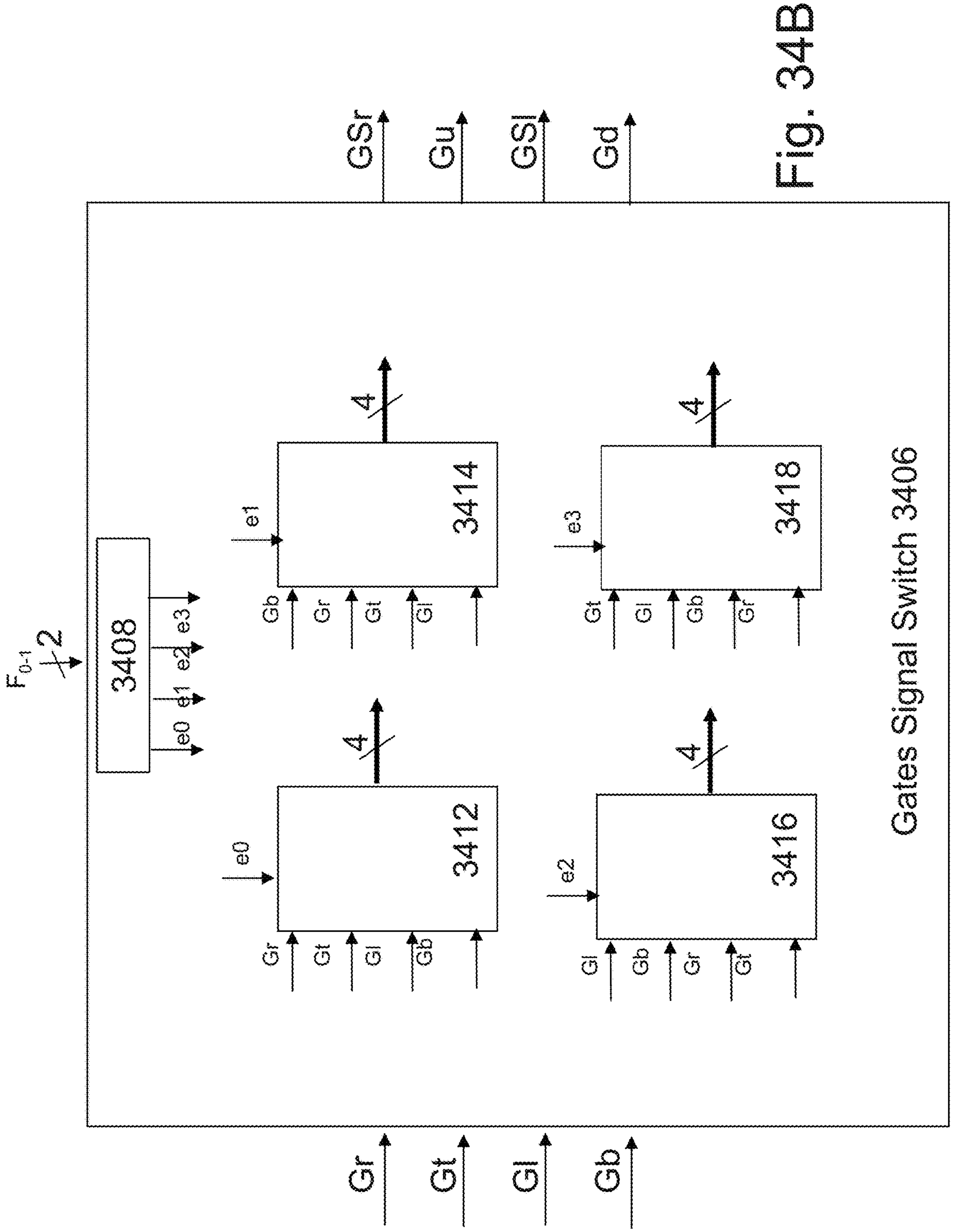

FIG. 34B illustrates the Gate Signal Switch 3406 circuits. Its inputs may be the four gate signals (Gr, Gt, Gl, Gb) and the Address bits selecting the facet—$F_{0-1}$. It could include decoder circuit 3408 to generate four enabling signal (e0, e1, e2, e3) of which one is active to enable selecting one of the four signals allocation 3412, 3414, 3416, 3418 to output the 4 gate signal in the proper allocation based on the selected facet to the 4 gate signal outputs: GSr, GU, GSl, Gd.

Figure 34C:
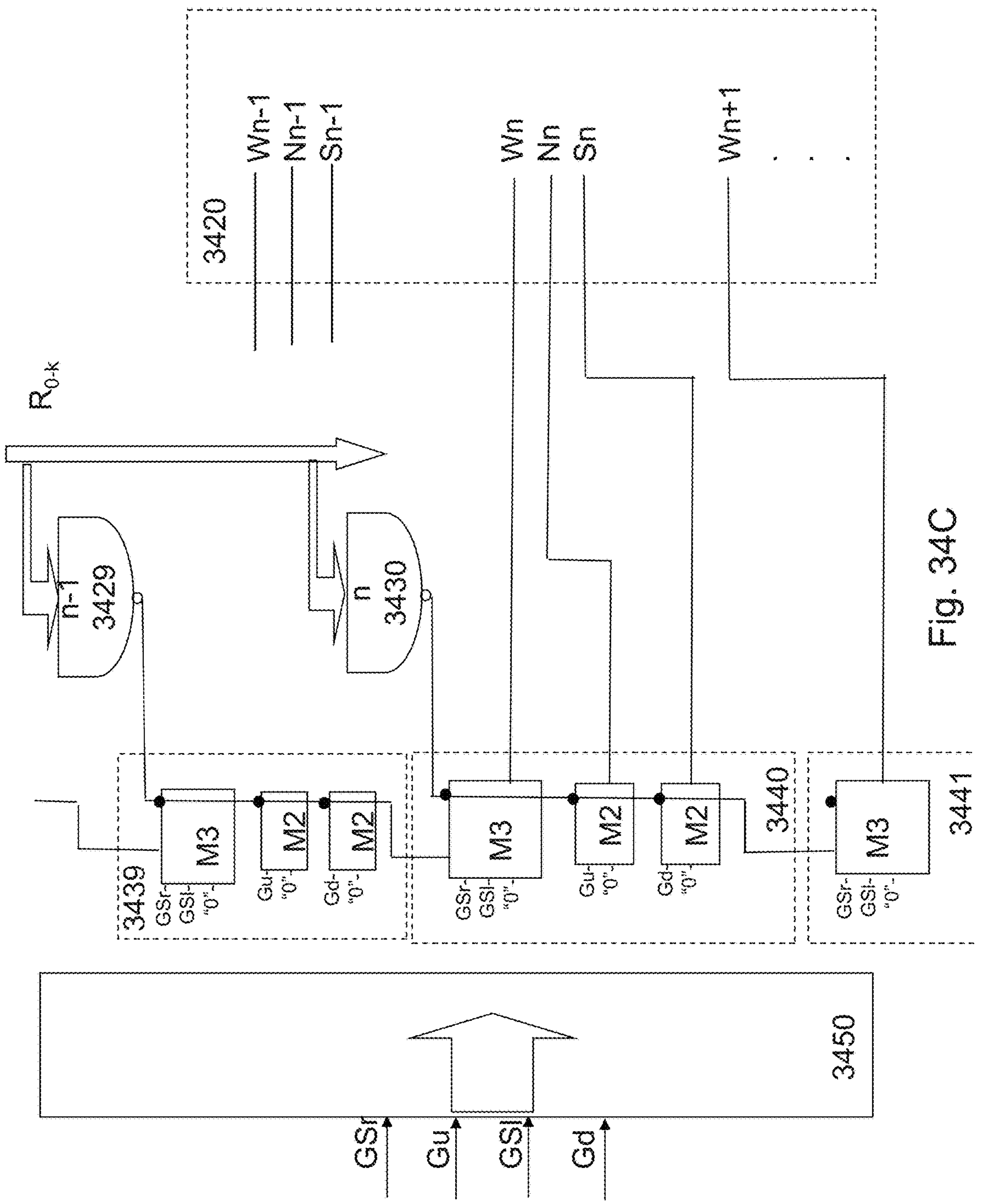

FIG. 34C illustrates the circuits to drive these centralized signals GSr, GU, GSl, Gd, to selected word-lines while all other word-line are disabled. FIG. 13 illustrates a 3D-NOR structure with active four facet, with compass 1300 those facet could be called North facet, East facet, South facet and West fact. Each channel column 1302 may be controlled by four gates, one on 'North' facet WL2, one on the South facet WL3, one on the East facet WL4 and one on the West facet WL1. It should be noted that the East/West gate is a dual function, the East gate of Channel Column 1302, is also the West gate of channel column 1304. Accordingly selection of channel column 1302 which could be indicated by integer symbol 'n' based on the address bits $R_{0-k}$ would select one 'n' North gate, one 'n' South gate, one West gate while the 'n' East gate is also the 'n+1' West gate of the 'n+1' channel 1304, as is illustrated in FIG. 13.

The four centralized signals (GSr, GU, GSl, Gd) are forming a bus like signals for the word-lines available to be selected for the selected channel column gates. Unit 3450 could include the buffers and drive electronics. These are designed according to system considerations such as access time, power and so forth. The Row Address lines $R_{0-k}$ and their complementary signals could be delivered as another bus-like signals. For each channel a large fan-in NAND gate could be used with decoding like connection to the Row address so NAND 3430 is activated to "0" only once the Row address is addressing channel 'n' (respectively NAND 3429 is activated to "0" only once the Row address is addressing channel 'n−1'). For each channel there is also a dedicated selector block—for 'n−1' selector block 3439, for 'n' selector block 3440, and for 'n+1' selector block 3441. Each selector block has three selectors, two are one-of-two selectors M2, and one is one-of-three selectors M3. These selectors could use a full transmission gate or other switching type circuits.

For the case when channel 'n' is addressed, NAND 3430 is activated and accordingly the selector M3 of 3440 would select GS1 signal to drive gate line related to West gate such as WL1-Wn, the first M2 selector of 3440 would select Gu signal to drive gate line related to the North gate such as WL2-Nn, the second M2 selector of 3440 would select Gd signal to drive gate line related to South gate such as WL3-Sn, and selector M3 of 3441 would select GSr signal to drive gate line related to the West gate of the n+1 column channel which could be the East gate of the n channel column WL4-Wn+1. All non-activated selectors (M2, M3) will output "0", or may be left floating in some configuration, which will prevent their respective channel to be affected or affect the memory operations. Accordingly providing the proper signal to perform the desired operation to the addressed bit within the addressed facet on the addressed channel.

In a similar architecture the peripherals circuit for driving the bit-lines—the S/D lines could be made. For simplicity the following peripherals circuits are to support the bit-lines—BL1, BL2, BL3, . . . —for the structure illustrated in FIG. 8E, these circuits could be modified to support the alternative structure which is illustrated in FIG. 13. The decoding for the select-lines—SL, SL2, SL3, . . . could be done with wide fan-in NAND receiving the address lines $Ridge_{0-i}$ and their complementary signal lines to decode the active Ridge and enable the bit-lines signals of the selected Ridge activate that Ridge S/D lines.

Figure 35A:
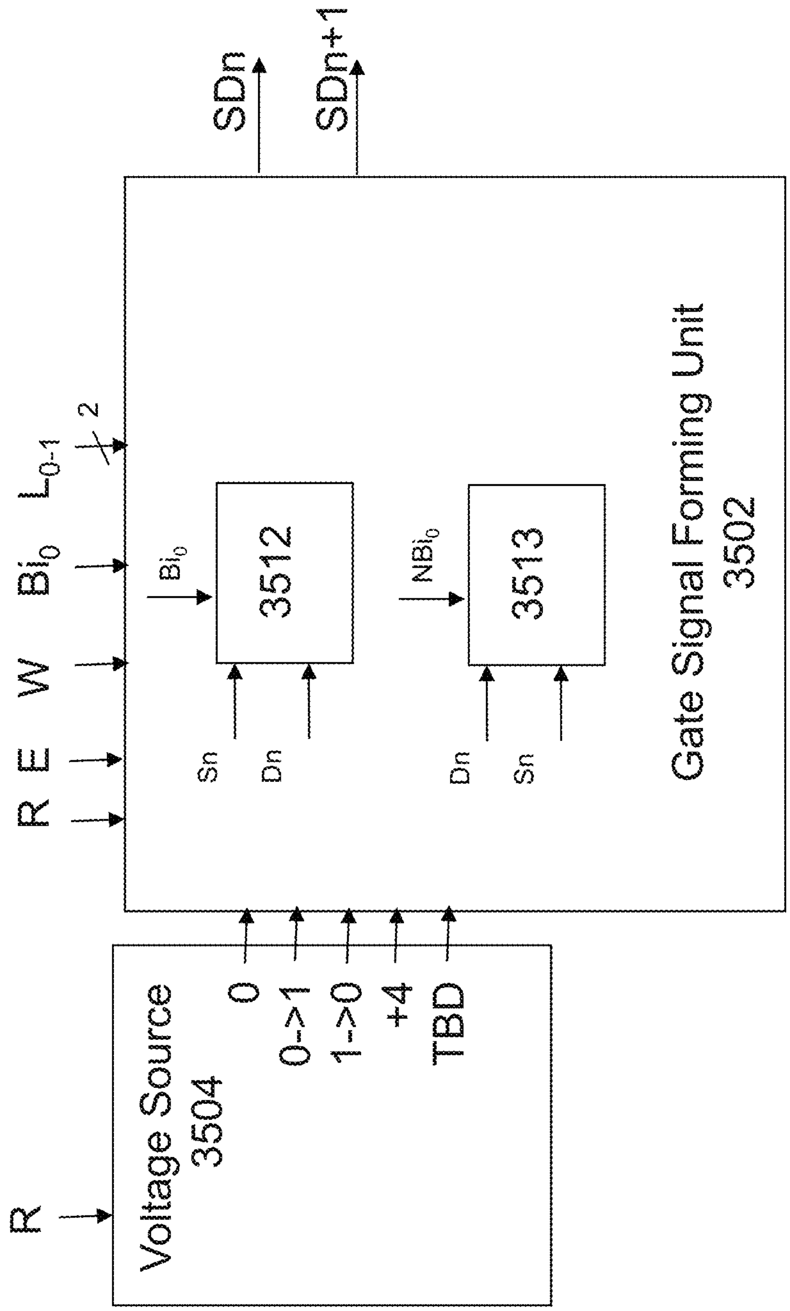
FIGS. 35A-35B are additional example illustrations of block diagrams of circuit control circuits.

FIG. 35A illustrates the first part of the bit-lines S/D lines related peripherals circuits. Voltage Source Circuits 3504 circuits may be the voltage generation circuits, those are centralized circuits including charge pumps and other power supply type circuits generating the various voltages require for the 3D-NOR memory operations including voltages indicated in the table of FIG. 23 and other tables and discussions herein. For reading bits a pulse to the S/D lines could be used and accordingly the R signal indicating a read function is an input for Voltage Source Circuits 3504. Gate Signal Forming Unit 3502 circuits may be signal forming and selectors to generate the two acting bit-line signals outputs: SDn for the S/Dbottom of FIG. 23, and SDn+1 for S/Dtop of FIG. 23. These signals would be connected to the selected S/D lines of the selected Ridge and accordingly the selected channel. The formation of these signals would be according to the memory operation with write indicted by W signal, R indicated by R signal or Erase indicated by E signal. The lower Bit address $Bi_0$ would affect the role of Source and Drain according to the bits location on the respective facet as indicated in FIG. 22. FIG. 22 and the table of FIG. 23 could be used to guide the details of these circuits.

The $L_{0-1}$ address would indicate the level of charge stored or read from the selected bit, this optional input for the case S/D lines may be used for the level modulation.

FIG. 35A also illustrates the swapping between the S/D lines for the role of Source or Drain. While physically these lines are fixed the swapping is done electronically by enabling either buffers 3512 or buffers two 3513. $NBi_0$ is the inversion of signal $Bi_0$.

Figure 35B:
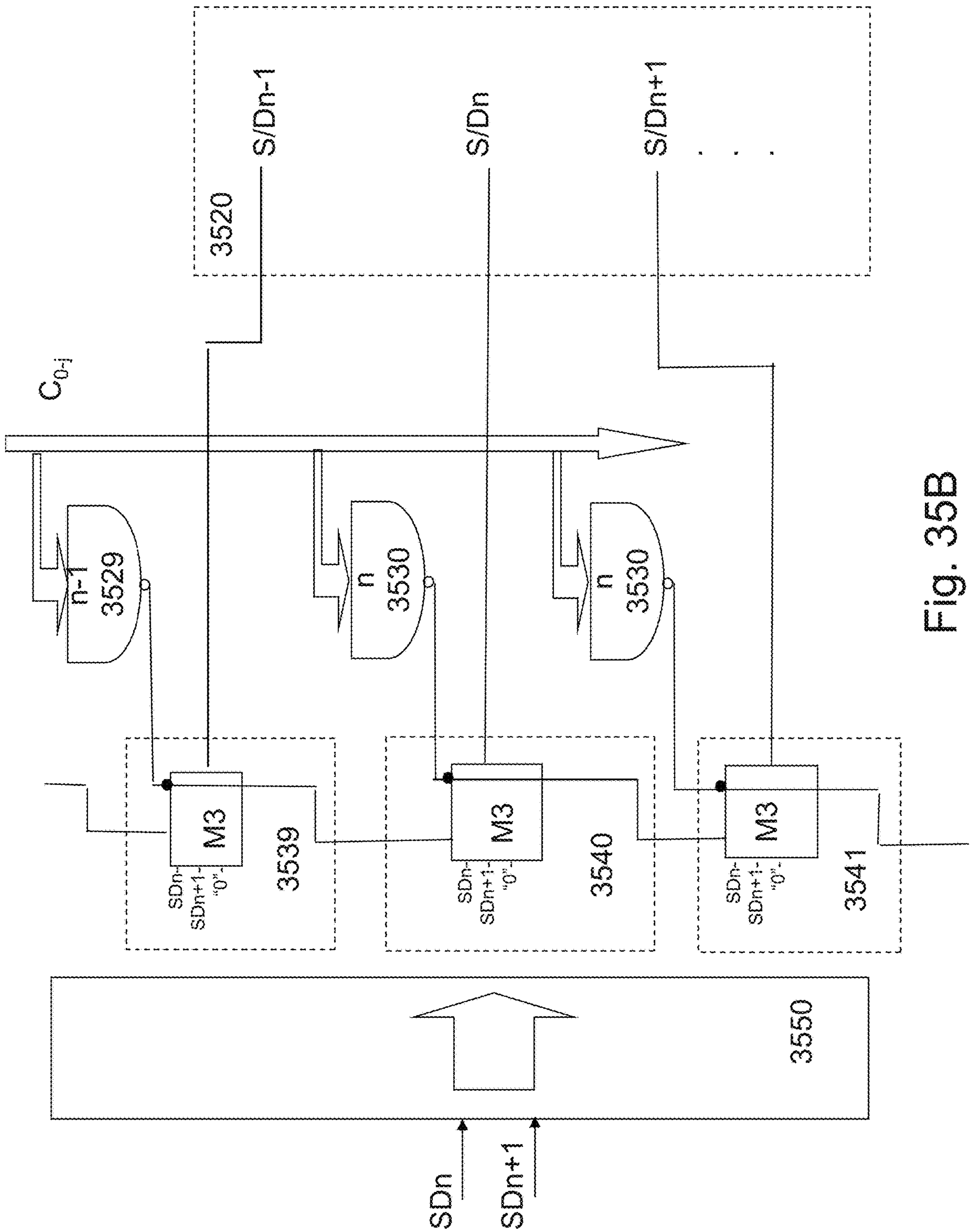

FIG. 35B illustrates the circuits which may be used to drive these centralized signals SDn and SDn+1 to selected bit-lines while all other bit-lines are disabled. FIG. 13A illustrates the naming and structure of the S/D lines. Each channel column 1302 is also controlled by the two S/D lines one below it and one on top of it: The below S/Dn line BL1, and the top S/Dn+1 BL2. It should be noted that other than the bottom most and top most each of the S/D line such as BL2, BL3, BL4 . . . affects two channels: one below it and one on top of it. Accordingly selection of layer 'n' base on the address bits $C_{0-j}$ would select two S/D lines which could be marked by S/Dn and S/Dn+1, as is illustrated in FIG. 35B.

The two centralized signals (SDn, SDn+1) are forming bus-like signals for the bit-lines available to be selected for the selected column. Unit 3550 could include the buffers and drive electronics. These are designed according to system consideration such as access time, power and so forth. The layer Address lines $C_{0-j}$ and their complementary signals could be delivered as another bus like signals. For each layer a large fan-in NAND gate could be used with decoding such as connection to the layer address so NAND 3530 is activated to "0" only once the layer address is addressing layer 'n' (respectively NAND 3529 is activated to "0" only once the layer address is addressing layer 'n−1'). For each layer there is also a dedicated selector block—for 'n−1' selector block 3539, for 'n' selector block 3540, and for 'n+1' selector block 3541. Each selector block has one-of-three selector M3. These selectors could use a full transmission gate or other switching type circuits.

For the case when column 'n' is addressed NAND 3530 may be activated and accordingly the selector M3 of 3540 would select SDn signal to drive bit-line to S/Dn at 3520 related such as BL1, and selector M3 of 3541 would select SDn+1 signal to drive bit line related to S/Dn+1 such as BL2. All non-activated selectors (M3) will output "0", or may be left floating in some configuration, which will prevent their respected channel to be affected or affect the memory operations. Accordingly providing the proper signal to perform the desired operation to the addressed bit within the addressed facet on the addressed channel.

In some configurations the M3 selector could be constructed to select between two active signals or leave the output floating which will render that line in-active.

The units Voltage Source Circuits 3404 and/or 3504 could be designed to provide the proper signals as was described herein for the word-line, bit-line operations of the 3D-NOR memory including such that were described in respect to FIG. 27 to FIG. 32B. Those signals could be routed to the acting S/D line and acting gate-lines using an architecture as presented in respect to FIG. 34A to FIG. 35B.

The O/N/O stacks within the 3D NOR fabric could be designed independently; for example, the facet(s) related to/under the first gates and the facet(s) related to/under the second gates could be different in many ways. It could include the same materials with different thickness or different materials. Some of such O/N/O stack materials have been presented in paper by Chun Zhao titled "Review on Non-Volatile Memory with High-k Dielectrics: Flash for Generation Beyond 32 nm" published at Materials 2014, 7, 5117-5145; doi:10.3390/ma7075117, incorporated herein by reference. The O/N/O stack could include band gap engineering for better performance. Such band gape engineering has been described in papers such as by Dong Hua Li et al. titled "Effects of Equivalent Oxide Thickness on Bandgap-Engineered SONOS Flash Memory" published at the 2009 IEEE Nanotechnology Materials and Devices Conference Jun. 2-5, 2009, and by Hang-Ting Lue et al. titled "BE-SONOS: A Bandgap Engineered SONOS with Excellent Performance and Reliability" published at IEDM 2005. And in patents such as U.S. Pat. Nos. 7,414,889, 7,512,016 and 7,839,696 all of the forgoing are incorporated herein by reference.

In the 3D NOR architecture such as is illustrated in at least FIG. 10 to FIG. 13E herein, the active O/N/O-2 stack is formed in-between the S/D lines. The flow as described will likely deposit the O/N/O material on substantially all exposed surfaces and not just on the desired facet. This implies that the O/N/O stack is deposited on the upper surface of the S/D segment and on the lower S/D segment and accordingly reduces the area for the second gates by two times the O/N/O-2 thickness in each direction. In some application it could be advantageous to make the O/N/O-2 stack extra thin. Such could result in shorter retention time but also with shorter write and erase times. Such ultra-thin O/N/O is sometimes considered a DRAM (Dynamic Random Access Memory) alternative. Accordingly such 3D NOR memory could integrate multiple memories types in one device such as conventional NV (Non-Volatile) memory in the facets controlled by first gates and faster memories with shorter retention time in the facets controlled by second gates. Such memories are presented in papers such as by H. Clement Wann and Chenming Hu titled "High-Endurance Ultra-Thin Tunnel Oxide in MONOS Device Structure for Dynamic Memory Application" published at IEEE ELECTRON DEVICE LETERS, VOL. 16, NO. 11, NOVEMBER 1995; by Dong-Il Moon et al. titled "A Novel FinFET with High-Speed and Prolonged Retention for Dynamic Memory" published at IEEE ELECTRON DEVICE LETTERS, VOL. 35, No. 12, DECEMBER 2014; and in U.S. Pat. Nos. 5,608,250, 8,329,535 and 9,025,386. Additional optional enhancement is to combine two level of memory forming structure in the gate stack such as presented by Daniel Schinke et al titled "Computing with Novel Floating-Gate Devices" published at IEEE Computer magazine FEBRUARY 2011; and also described by Daniel Johannes Schinke A dissertation submitted to the Graduate Faculty of North Carolina State University 2011, titled "Computing with Novel Floating Gate Devices"; by Biplab Sarkar titled "Dual Floating Gate Unified Memory MOSFET With Simultaneous Dynamic and Non-Volatile Operation" published at IEEE ELECTRON DEVICE LETTERS, VOL. 35, NO. 1, JANUARY 2014; and by Yu-Chien Chiu, titled "Low Power 1T DRAM/NVM Versatile Memory Featuring Steep Sub-60-mV/decade Operation, Fast 20-ns Speed, and Robust 85° C.-Extrapolated 1016 Endurance" published at IEEE 2015 Symposium on VLSI Technology, all of the foregoing in this paragraph are incorporated herein by reference.

Radical oxidation could be used for the formation of a high quality oxide such as for the formation of the tunneling oxide. For example, by a TEL SPA (slot plane antenna) tool/machine, wherein oxygen radicals are generated and utilized to form thin thermal oxides (generally of single crystal silicon) at less than 400 deg C.

Additional alternative is to integrate logic and programmable logic into the 3D-NOR fabric. FIG. 12A illustrates a 3D-NOR structure in which every channel column 1200 may be surrounded by a charge trap—O/N/O layer and control gates. First O/N/O-1 stack 1201 is controlled by first control gate 1211 (which is connected to word-lines WL2, WL3, WL5, WL6, . . . of FIG. 13). Second O/N/O-2 stack 1203 is controlled by second control gate 1202 (which is connected to word-lines WL4, WL7 . . . of FIG. 13). For this logic integration alternative it could simplify the process if O/N/O-2 is constructed/formed so it will allow selectively etching O/N/O-1 without etching or degrading O/N/O-2. Specifically the charge-transfer-oxide layer of O/N/O-2 could be made with an oxide layer that has good etch selectivity to the O/N/O-1 layers.

Figure 36A:
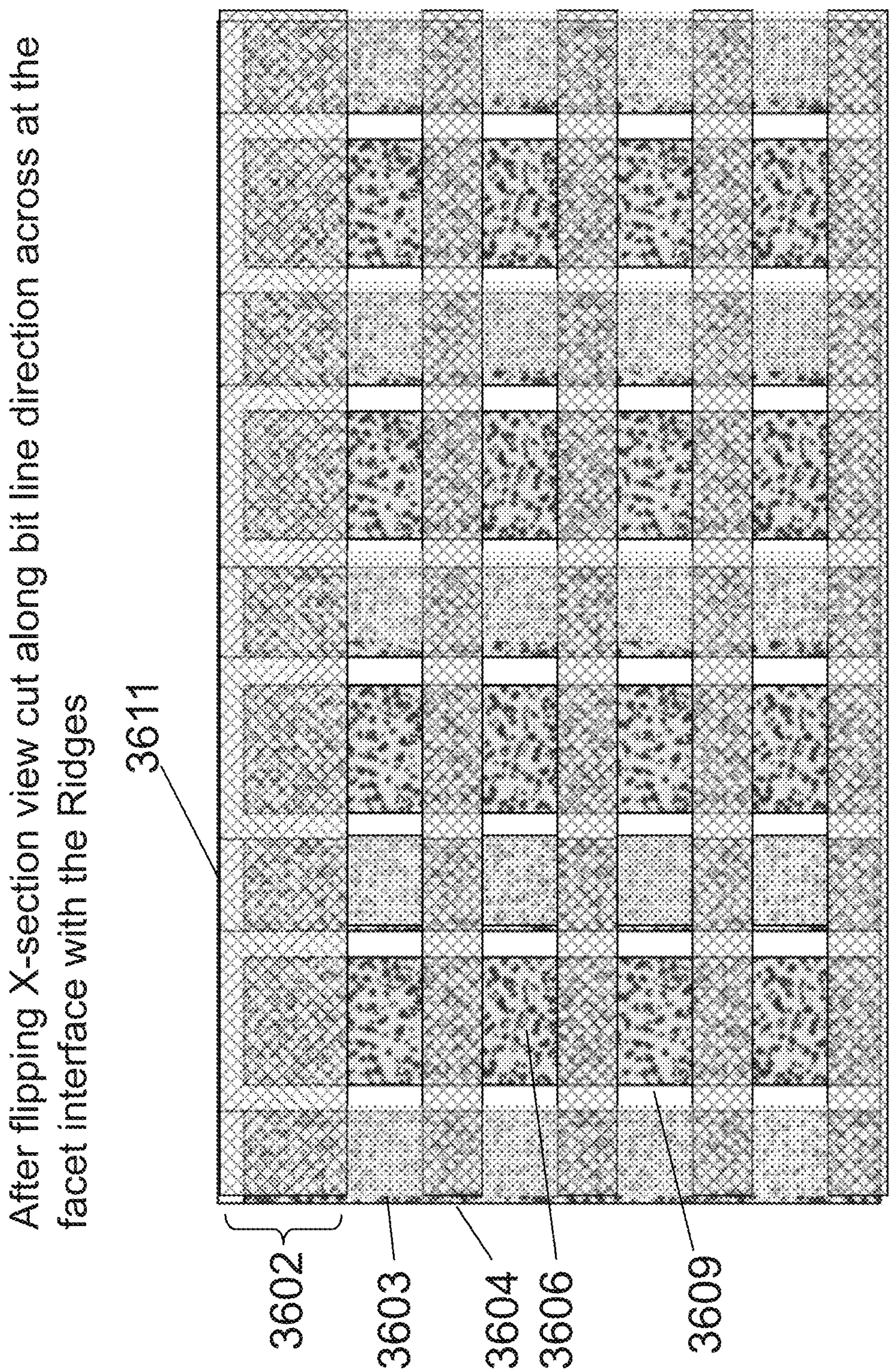
FIGS. 36A-36L are example illustrations of an additional portion of the formation and structure of a multi sided ONO faceted NOR type 3D memory PHTs.

FIG. 36A illustrates an X-section view cut along the bit line direction across the channel facet interface with the Ridge after flipping the 3D-NOR structure of FIG. 12A, by layer transfer technique onto a carrier wafer. The first S/D layer 3602 which is now on the top could be made extra thick for this alternative application. The channel 3603 and the S/D layers 3604 are made with normal thickness. The second gate 3606 is covered with the second O/N/O-2 3612 (not shown) and the first O/N/O-1 3611 is illustrated at the top surface.

Figure 36B:
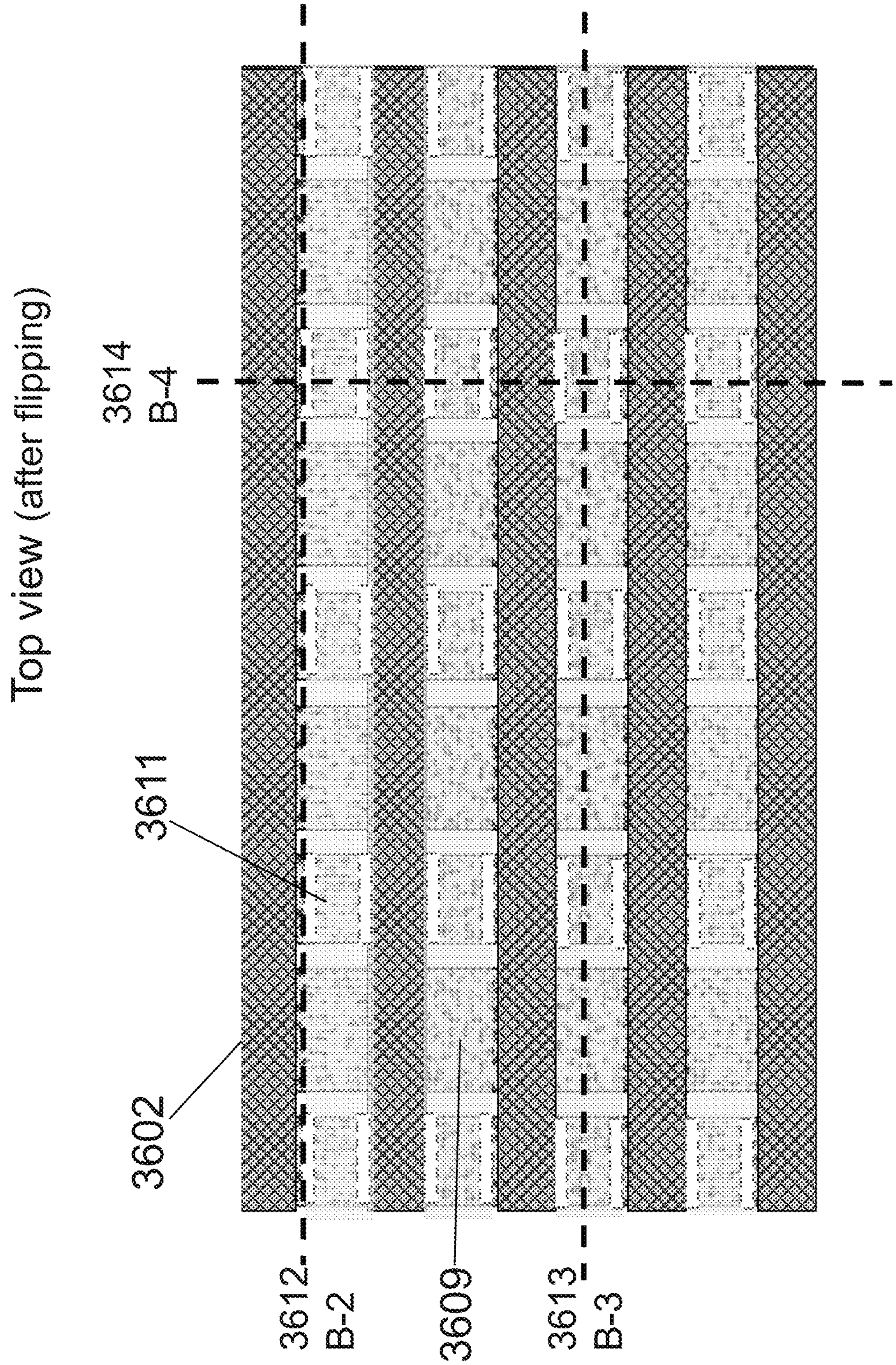

FIG. 36B illustrates a top view of the structure before etching the top layer of the first O/N/O-1 3611, preferably with a selective etcher so to not degrade the second O/N/O-2 3609. Then performing an etch step for the removal of the first O/N/O-1 3621. The top view also marks the cut-view locations which would be used in following illustrations.

Figure 36C:
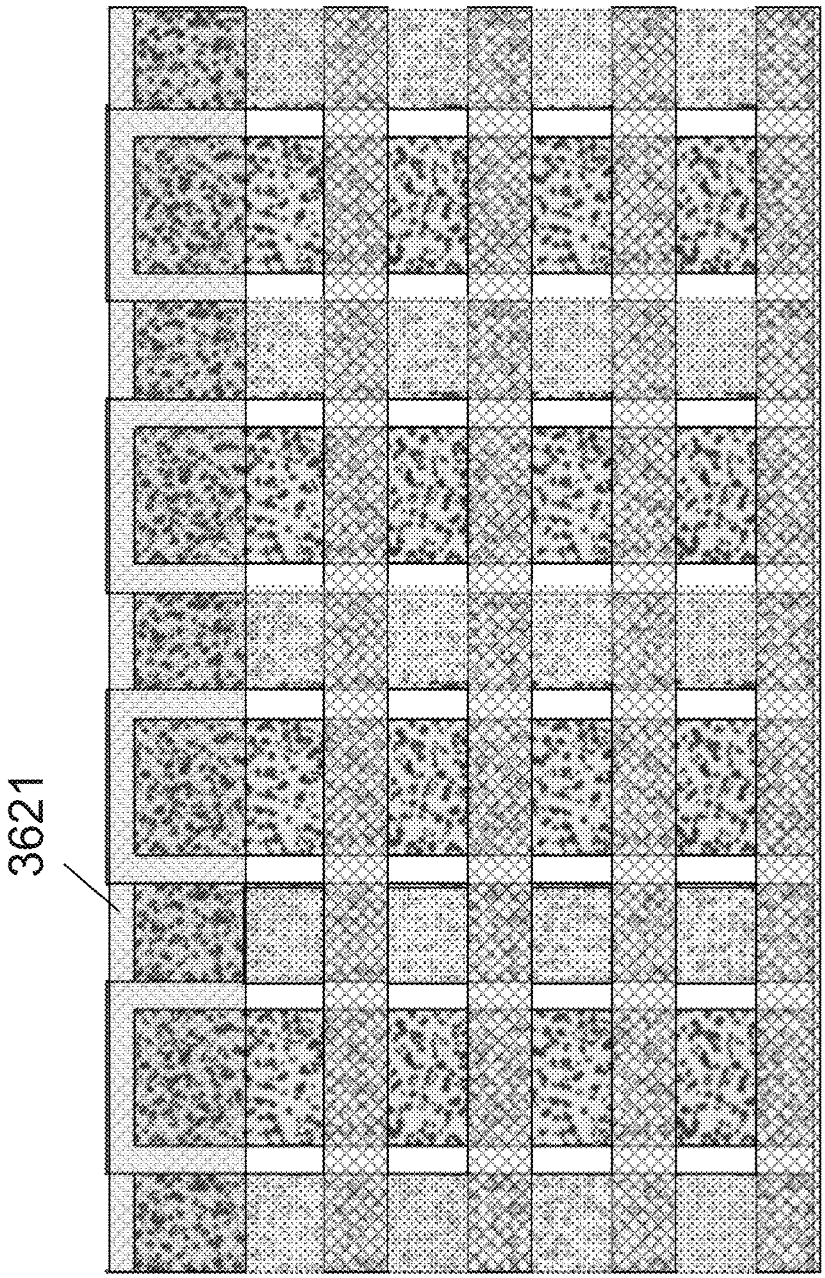

FIG. 36C illustrates the structure from a cut view along line 3612 which is a cut view along the bit-line across the column channel facet interface with the first O/N/O-1 facing the Ridge walls.

Figure 36D:
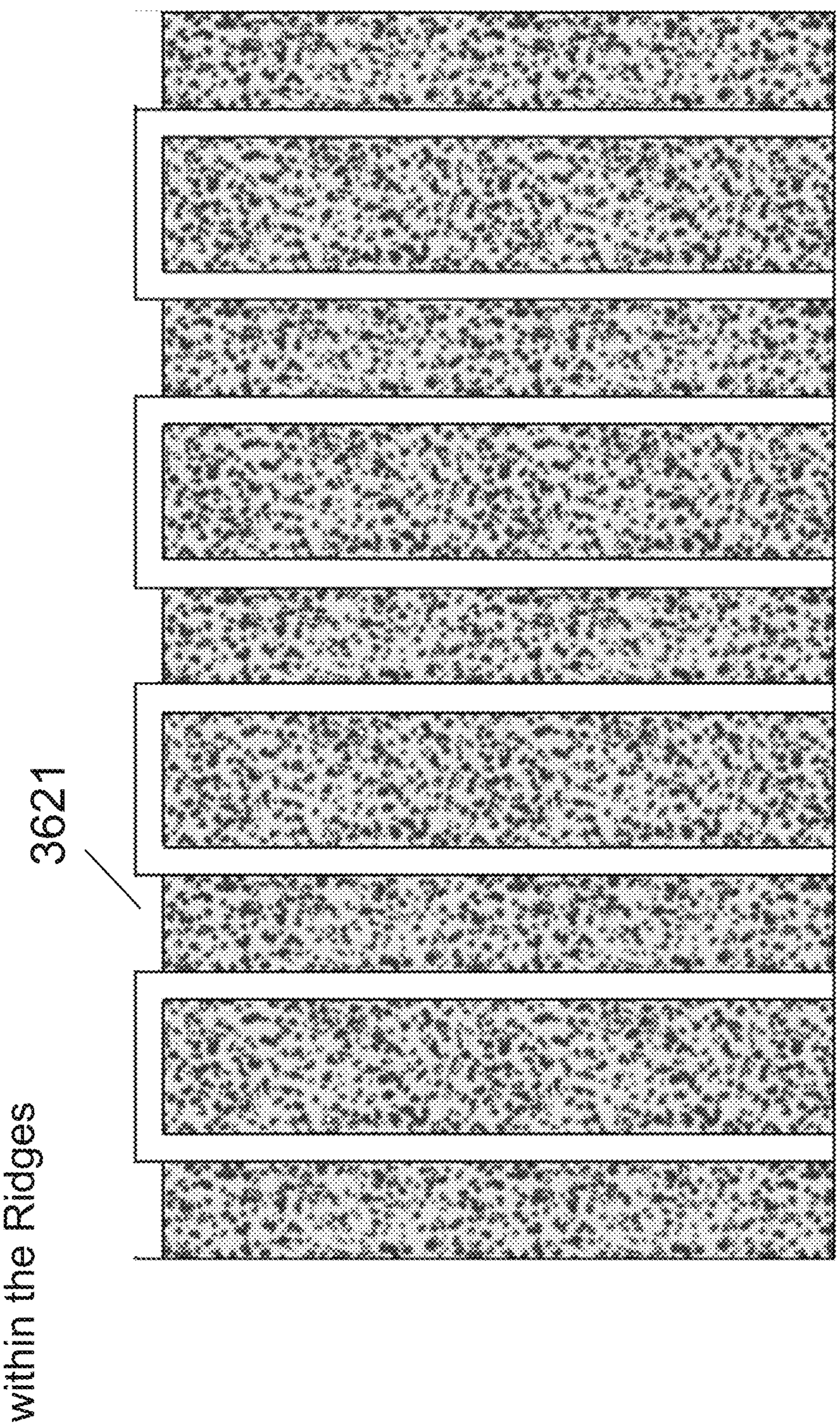

FIG. 36D illustrates the structure from a cut view along line 3613 which is a cut view along the bit-line across the gate area in between Ridges.

Figure 36E:
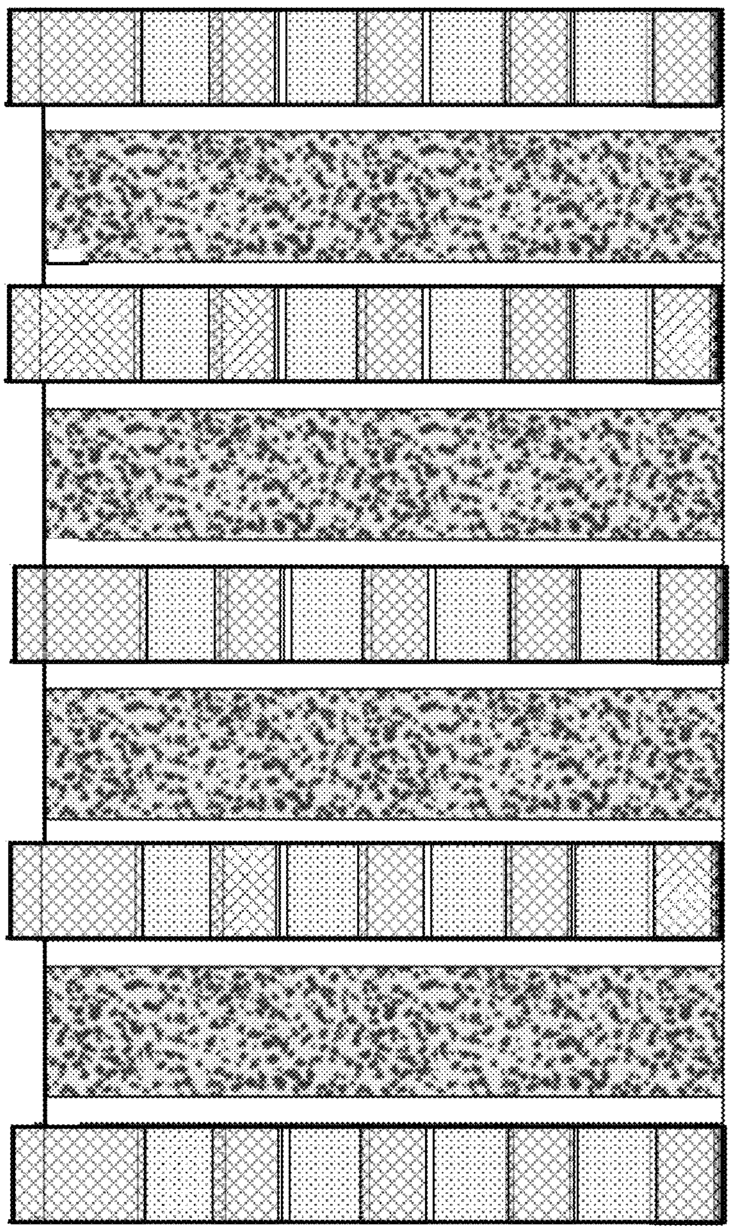

FIG. 36E illustrates the structure from a cut view along line 3614 which is a cut view along the word-line across the first gate area in between the channel column.

Figure 36F:
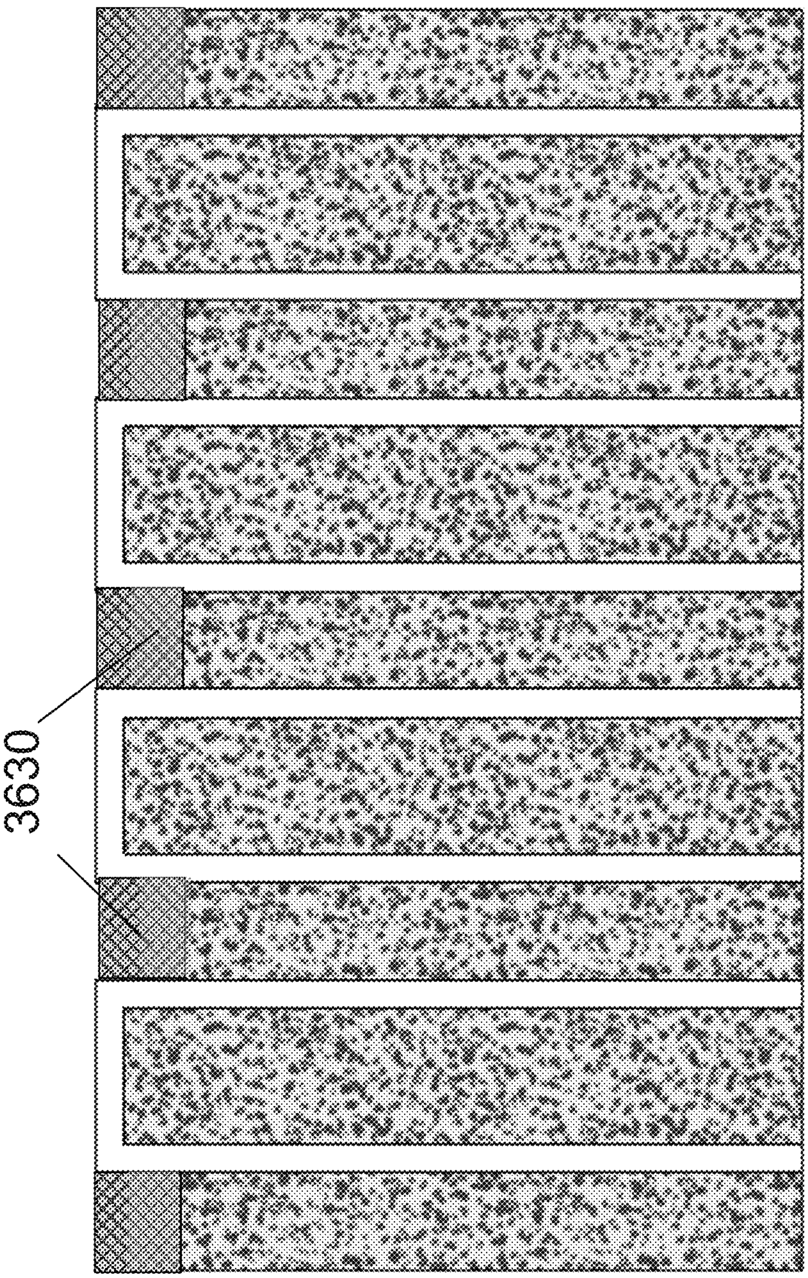

FIG. 36F illustrates the structure from a cut view along line 3613 which is a cut view along the bit-line across the gates area in between Ridges, after etching the top portion of the exposed first gate material 3630.

Figure 36G:
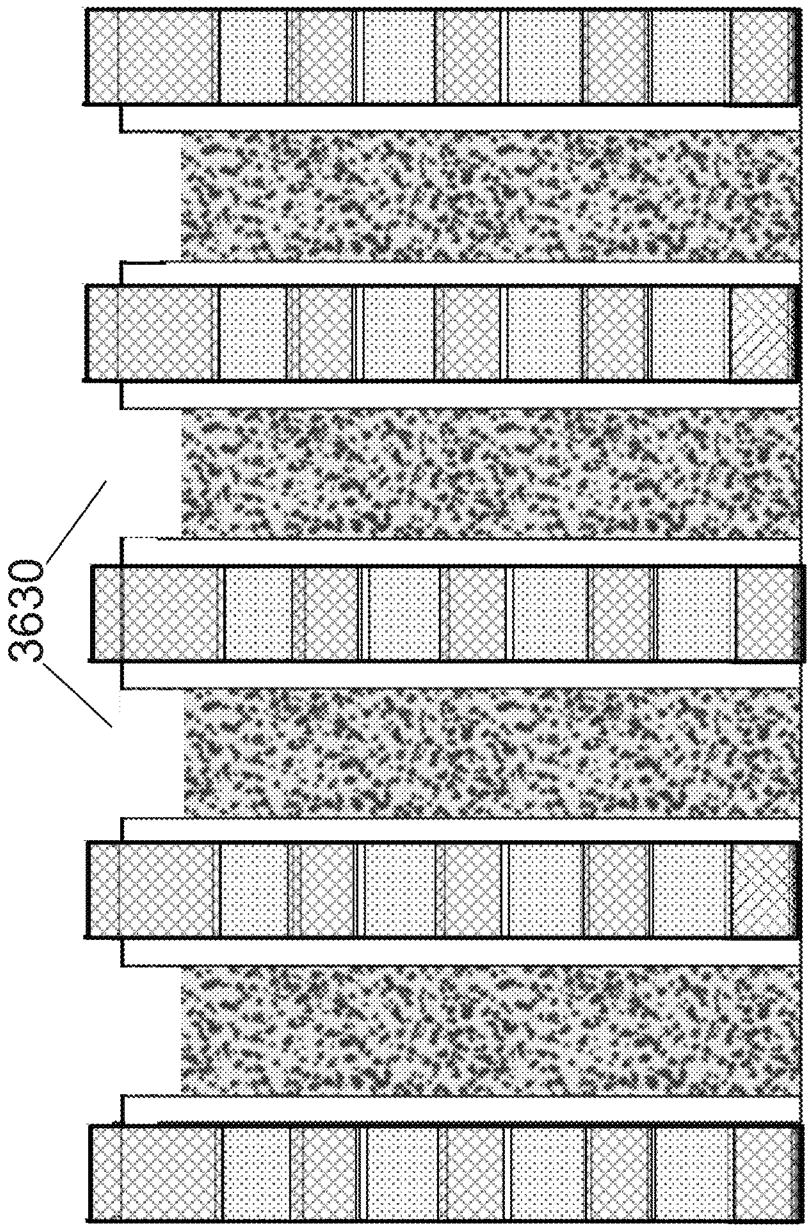

FIG. 36G illustrates the structure from a cut view along line 3614 which is a cut view along the word-line across the first gate area in between the channel column, after etching the top portion of the exposed first gate material 3630.

Figure 36H:
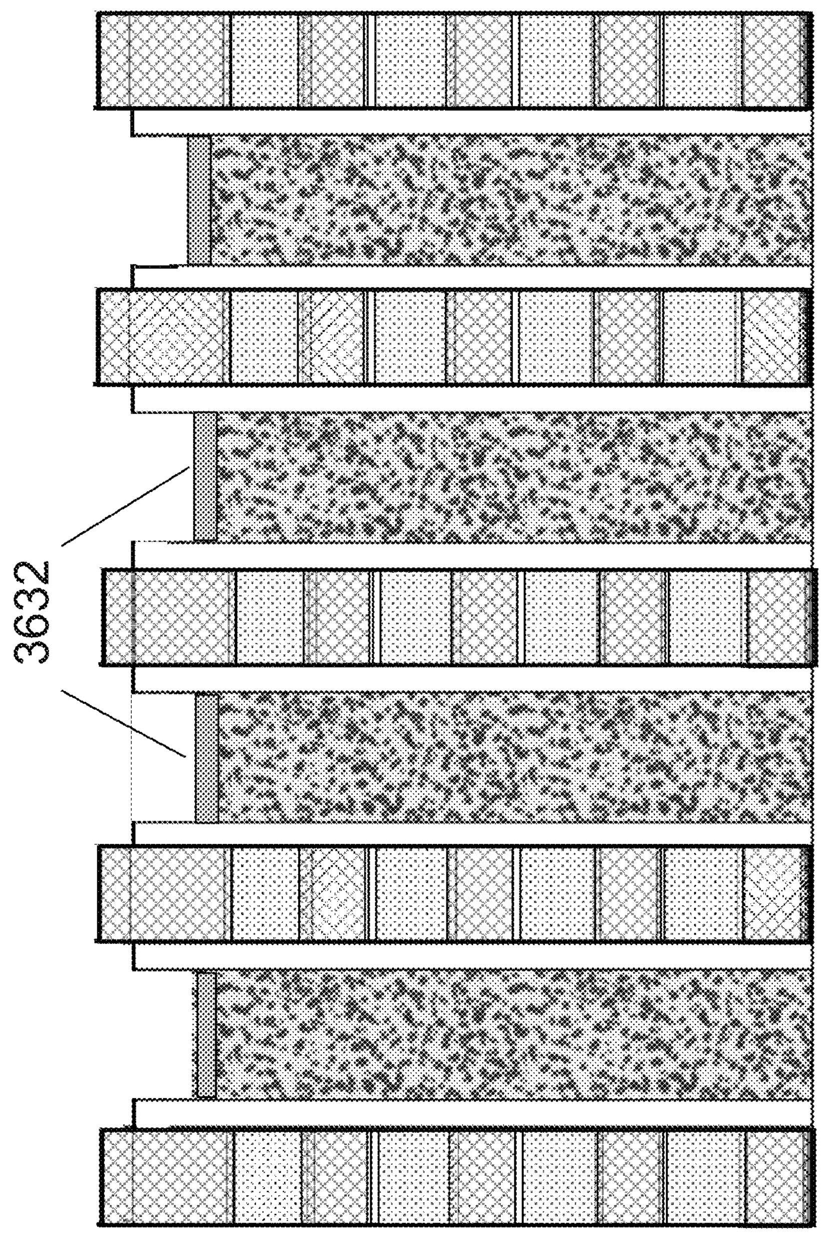

FIG. 36H illustrates the structure from a cut view along line 3614 after oxidation of the exposed top surface of the first gates 3632 or growing isolation on it.

Figure 36I:
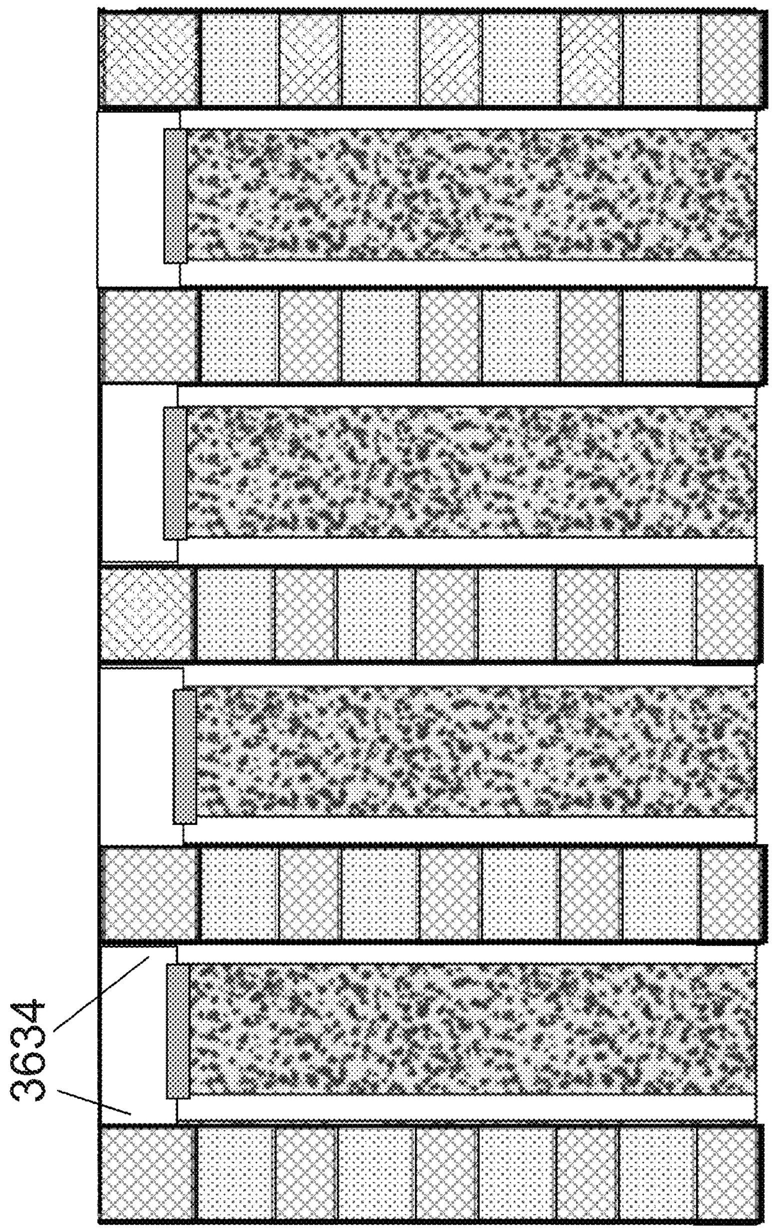

FIG. 36I illustrates the structure from a cut view along line 3614 after etching the exposed side wall O/N/ON-1 3634.

Figure 36J:
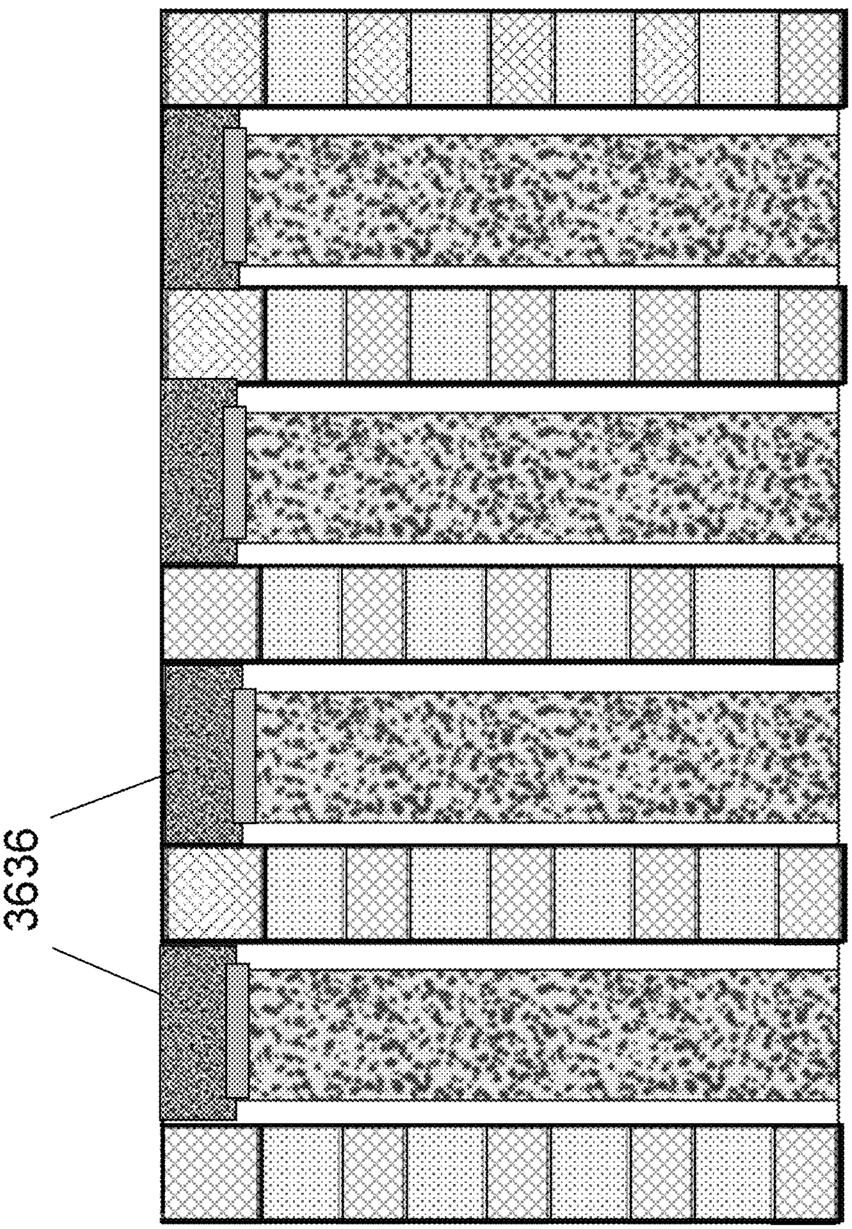

FIG. 36J illustrates the structure from a cut view along line 3614 after filling the holes with P doped silicon 3636.

Figure 36K:
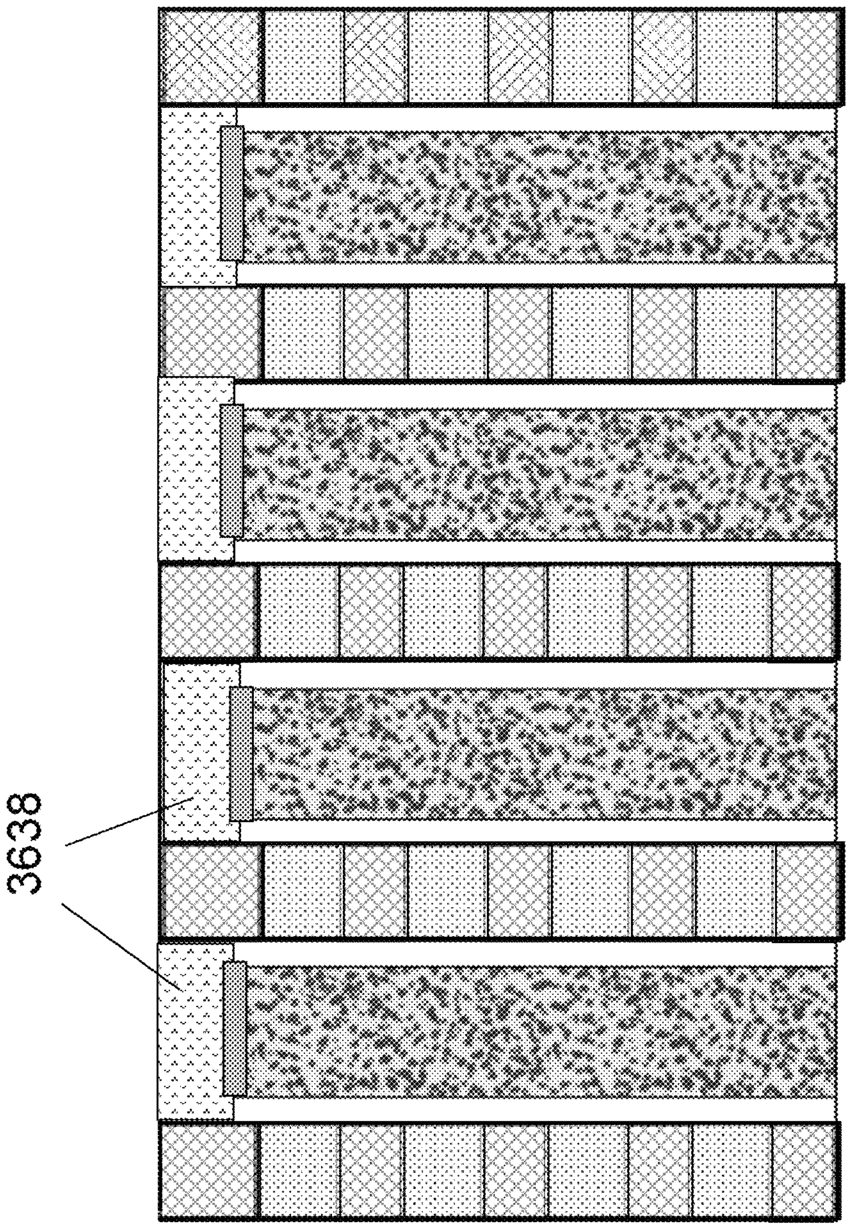

FIG. 36K illustrates the structure from a cut view along line 3614 after re-crystallization of the P silicon with laser or alternative technique forming crystallized silicon 3638.

Figure 36L:
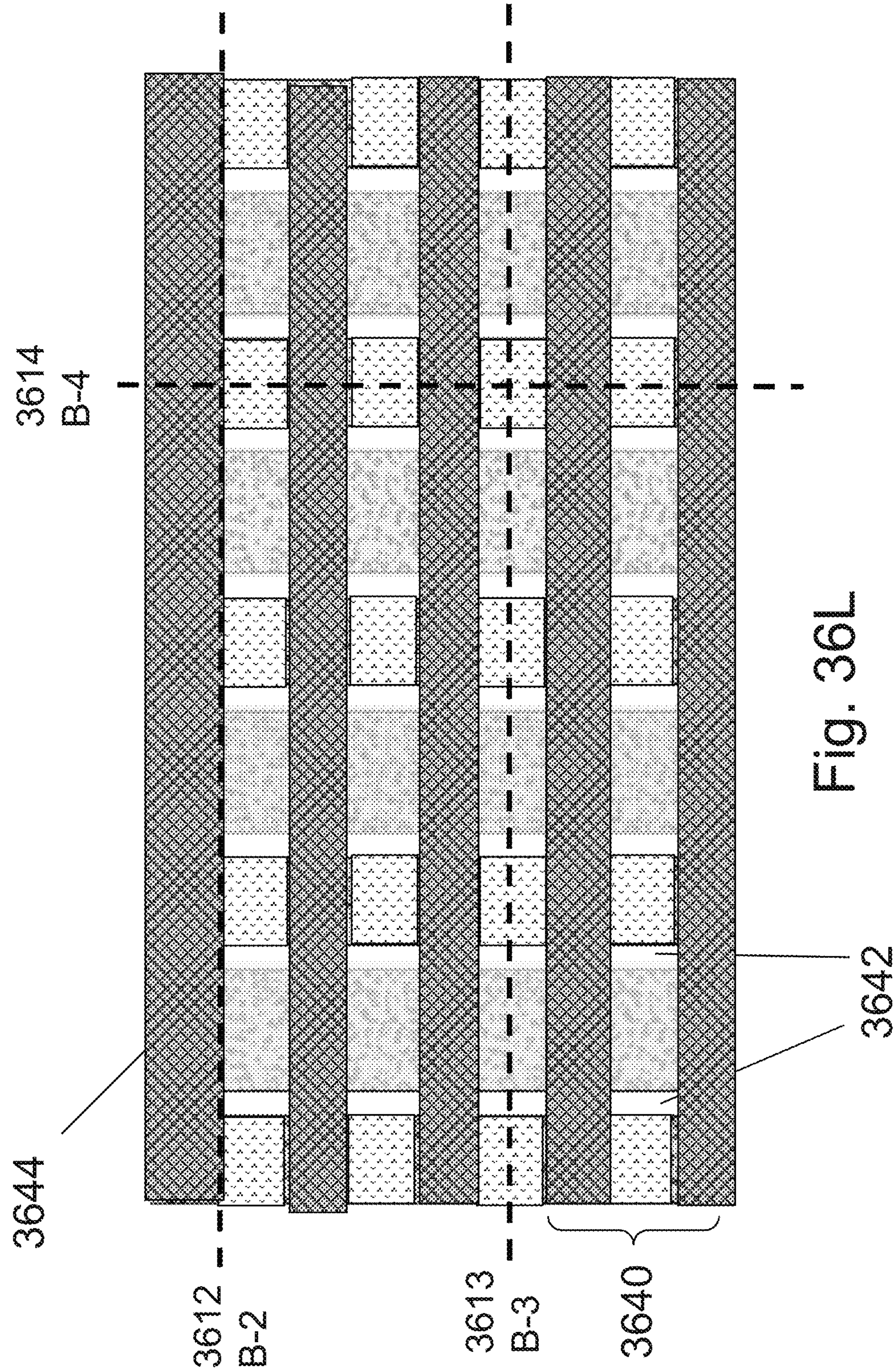

FIG. 36L illustrates the structure from top view showing the new formed NPN 3640 device with side O/N/O-2 3642 controlled by the second gates 3642. By adding on top of it gate oxide and logic gate a programmable horizontal transistors ("PHT") 3640 could be formed which could be used to form the programmable logic terrain on that top side.

Alternative to construct a PHT on the bottom of the 3D NOR fabric could utilize lithography instead of etch selectivity between O/N/O-1 and the charge transfer oxide of O/N/O-2. One such alternative is illustrated in respect to FIG. 37A to FIG. 37E.

Figure 37A:
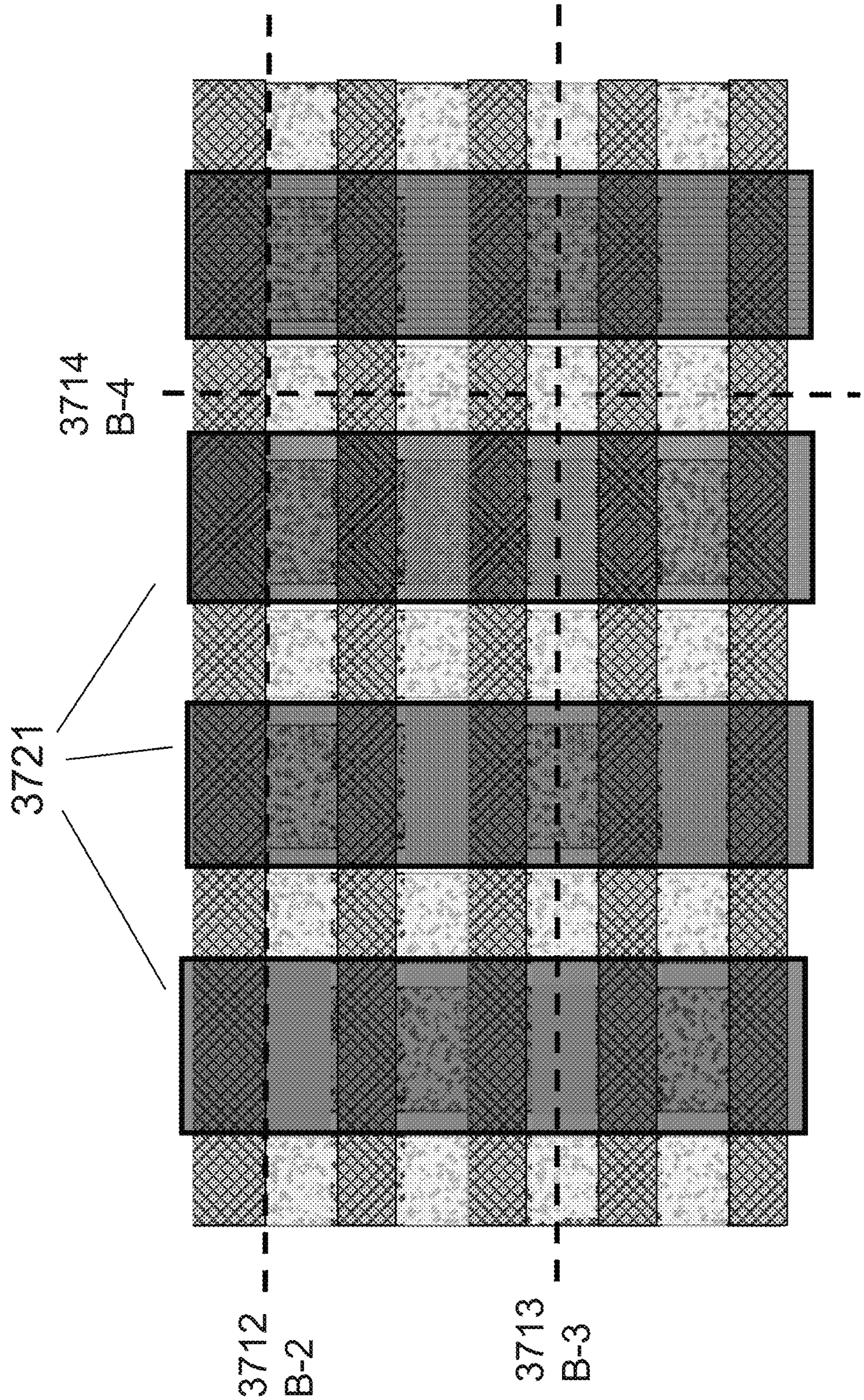
FIGS. 37A-37C example illustrations of an additional portion of the formation and structure of a multi sided ONO faceted NOR type 3D memory PHTs.

FIG. 37A illustrates the structure of FIG. 36C in which a hard-mask may be formed as patterned hard mask 5241 leaving the top of the Channel column and the O/N/O-1 top layer uncovered.

Figure 37B:
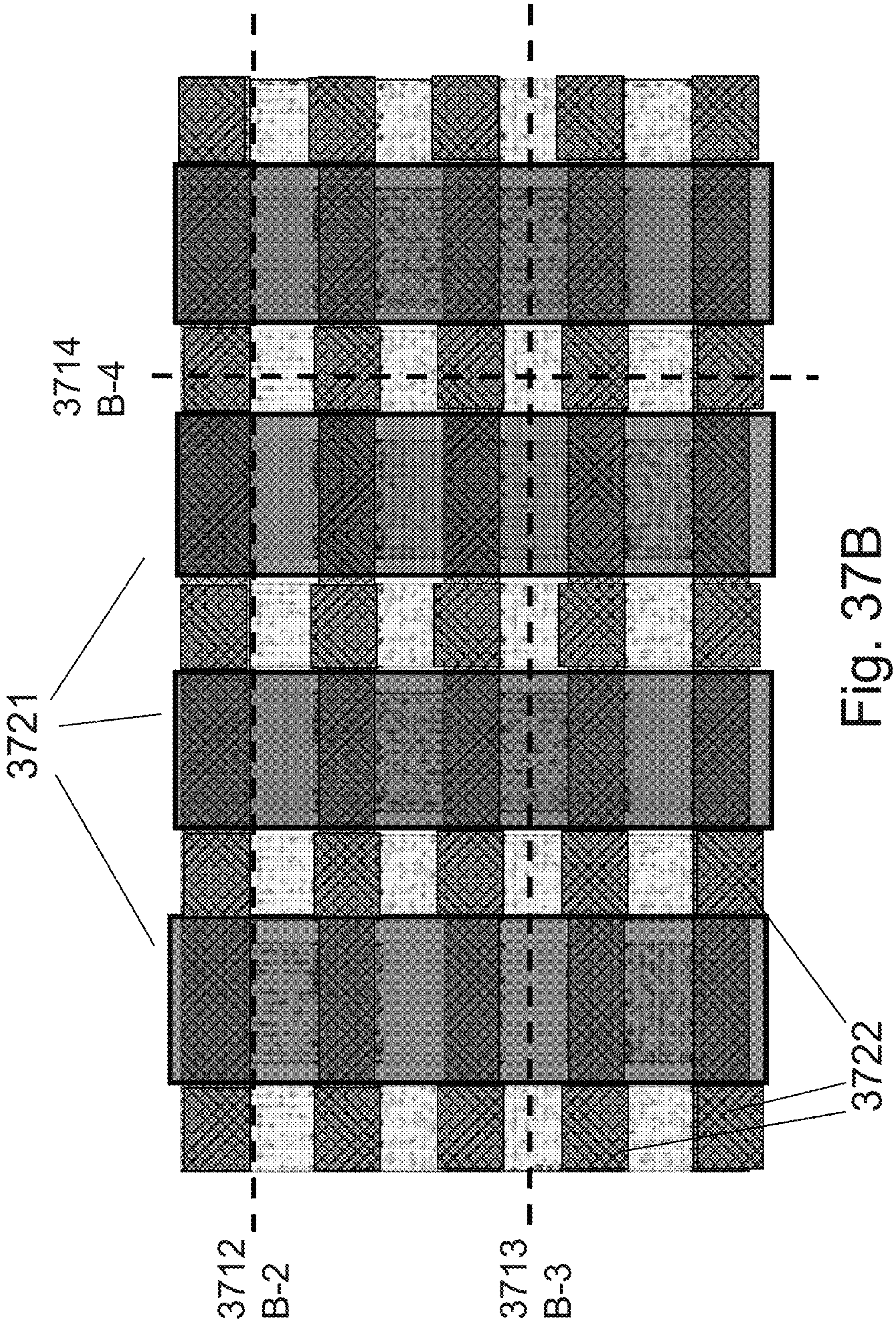

FIG. 37B illustrates the structure after performing of an epitaxial growth of N+ silicon 3722 over the exposed top portion of the top S/D. It should be noted that in this alternative that S/D layer could have a conventional thickness similar to the other S/D layers.

Figure 37C:
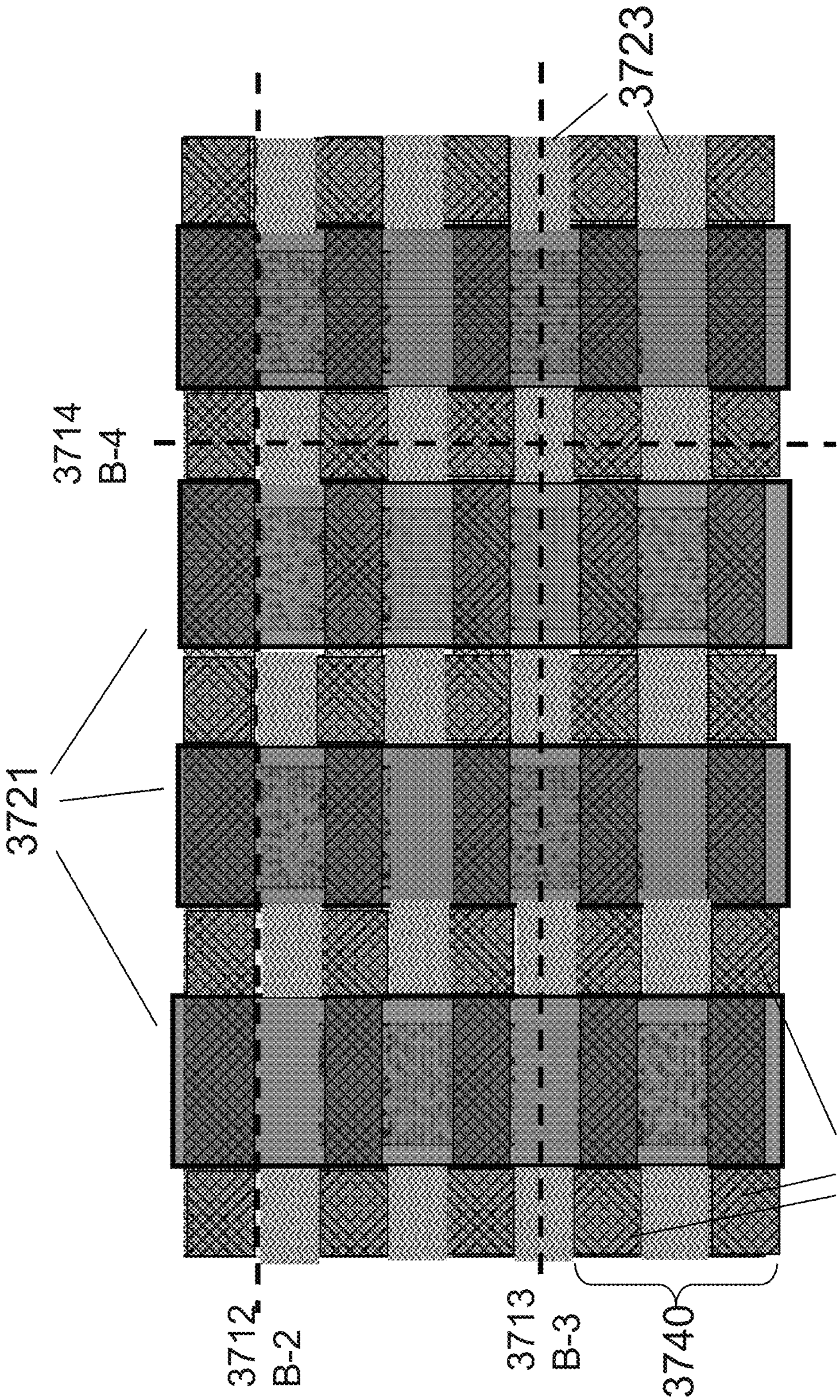

FIG. 37C illustrates the structure after P type silicon is deposited to form the horizontal channel 3723 in between the epi-grown N+ silicon. The channel formation could include a-Si or poly silicon deposition, CMP and then laser crystallization, thus resulting with PHT 3740.

These PHTs could be programmed by the first gates using the top part of O/N/O-1, or by forming additional O/N/O-3 and new horizontal gate in replacement of the hard mask 3721.

The horizontal transistor source and drain are part of a vertical transistors of adjacent Ridges which are part of the 3D-NOR structure. Using these two Ridges first bit-lines (BL1) and the appropriate second gates (WLn, WLn+3) these new horizontal transistors could be programmed to three operating modes: Always off, top gate controlled (un-programmed), or always on. FIG. 38A illustrates these three operating states for which the PHT could be programmed to.

This form of customizing the HD-NOR fabric could allow support for programmable logic as presented in the following.

Figures 38B, 38C, 38D:
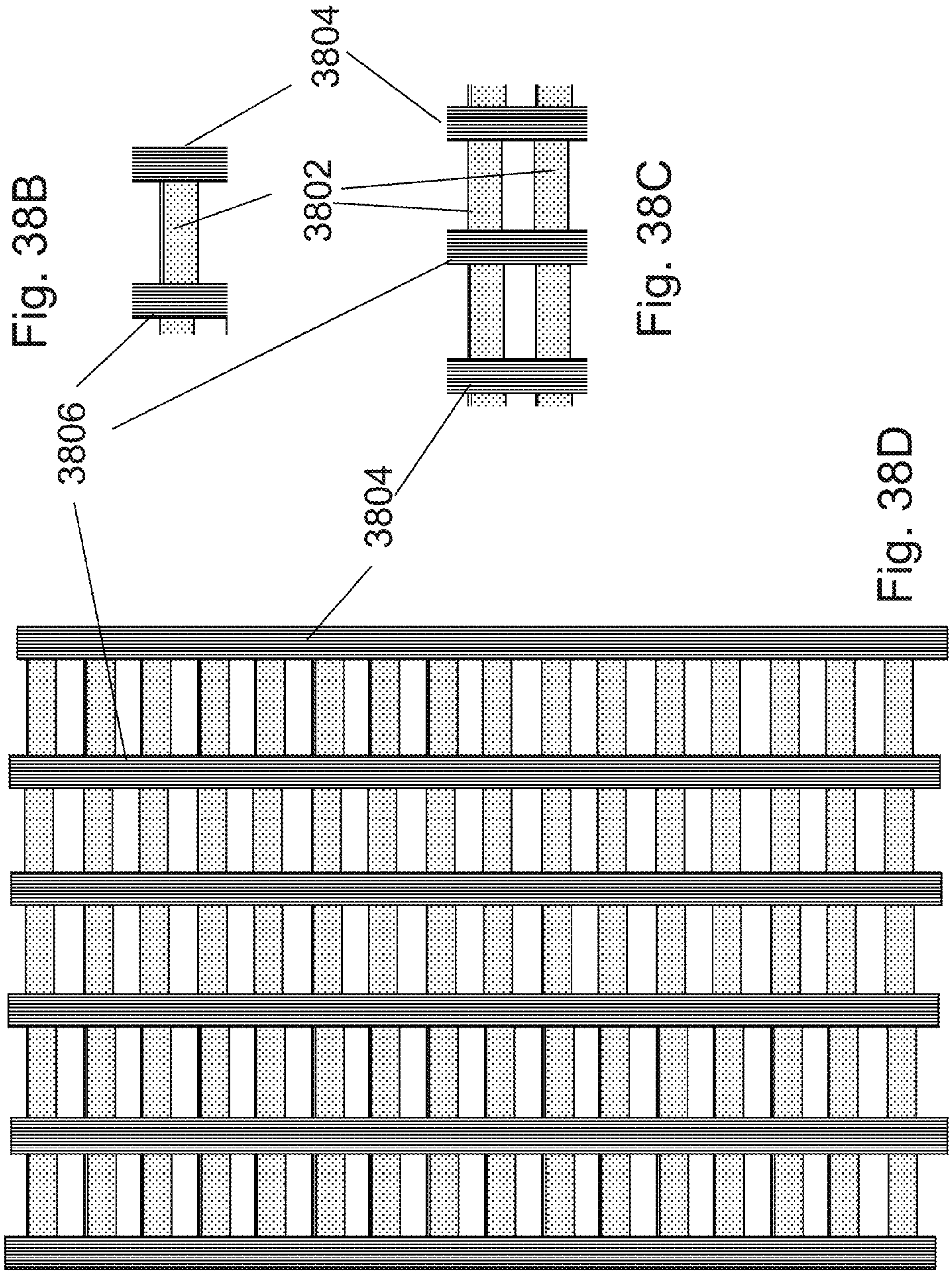
FIGS. 38B-38D are example illustrations of an exemplary single cell, 2×2 and 5×16 arrays of a memory.

FIG. 38B is an illustration of an exemplary single cell of such memory substrate with S/D lines of N+ type silicon 3804, 3806 and P− type silicon 3802 in between. The charge trap regions and the gates are not shown as they are or on the sides of P− type silicon 3802. FIG. 38C illustrates 4 such cells arranged as a 2×2 array and FIG. 38D illustrates a larger array of 5×16 cells.

Figure 39D:
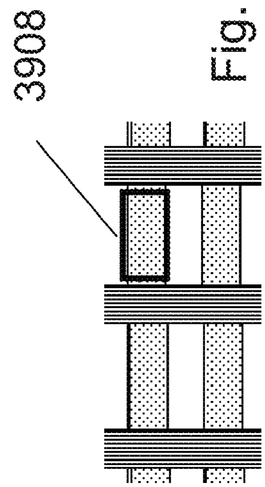
FIGS. 39A-39F are illustrations of the symbols defined for logic cell formation of the memory fabric.
Figure 39E:
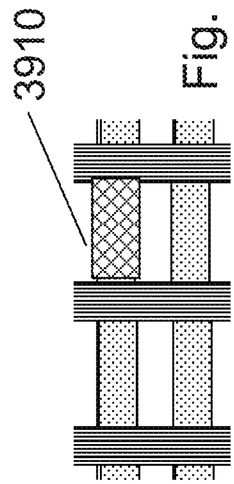
Figure 39F:
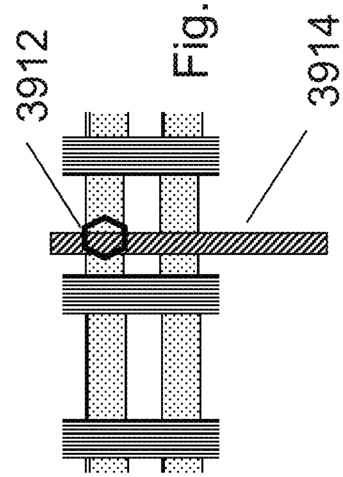
Figure 39A:
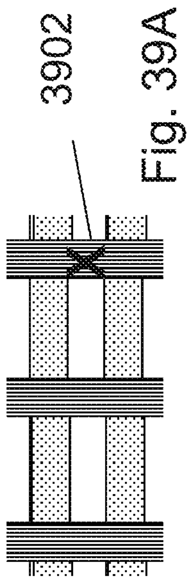

FIG. 39A illustrates an indication of forming a cut in the S/D line 3902.

Figure 39B:
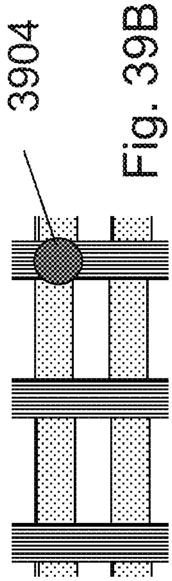

FIG. 39B illustrates connecting the S/D line to a ground 3904. This could be a programmable ground which would be activated at normal operation and deactivated at programming time.

Figure 39C:
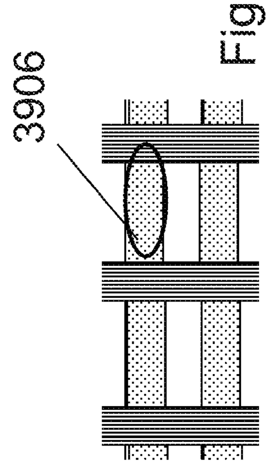

FIG. 39C illustrates a channel being programmed 3906 to either an always on "0" or to an always off "1". This could replace the SRAM cell in a Look-Up-Table.

FIG. 39D illustrates programming the channel to always on 3908.

FIG. 39E illustrates programming the channel to always off 3910.

FIG. 39F illustrates the channel functioning as an active transistor with conductor 3914 going across it connected to the transistor gate as indicted by 3912.

Figure 40B:
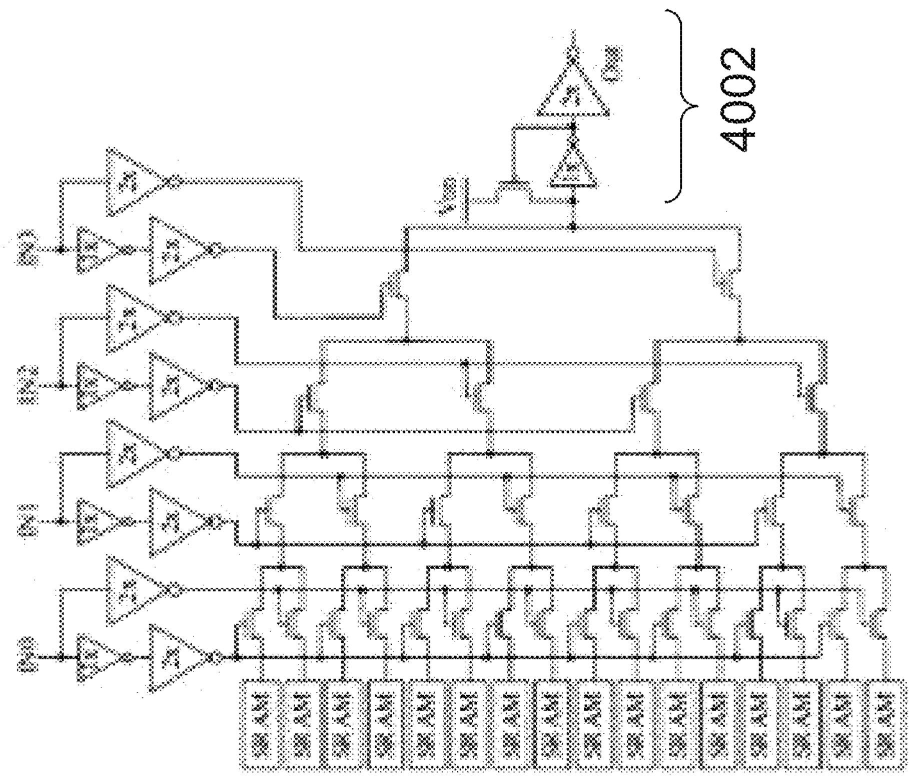
FIGS. 40A-40B are example illustrations of LUT circuits.
Figure 40A:
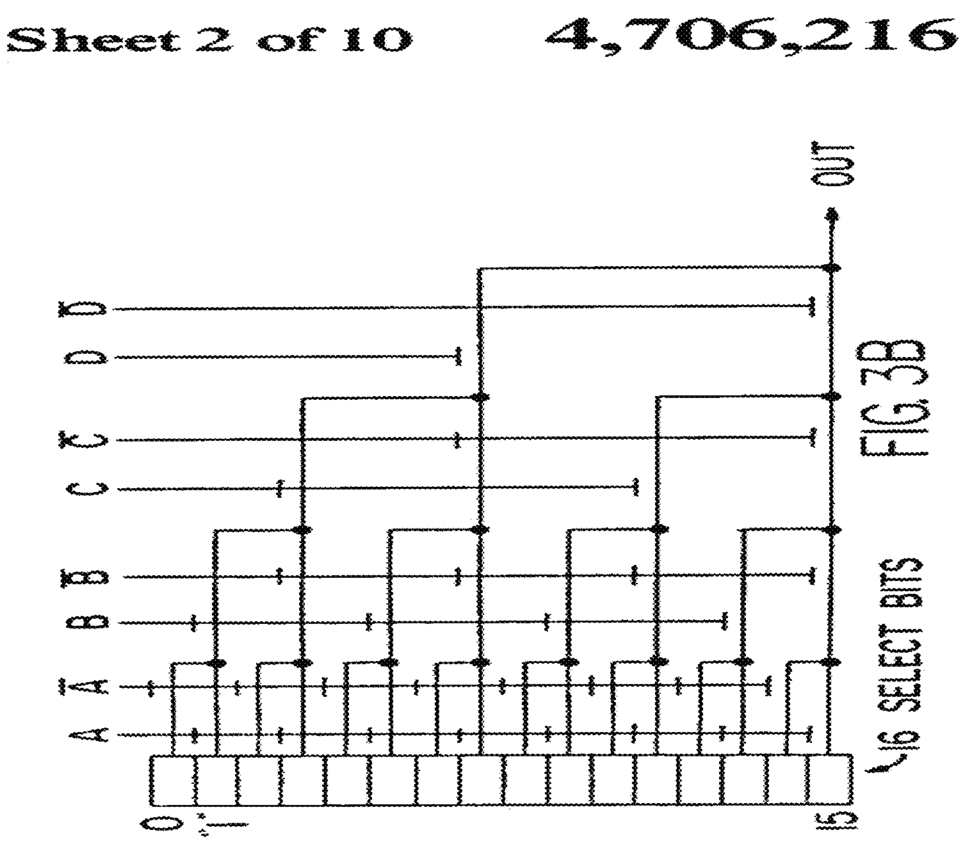

FIG. 40A is from one of Xilinx early patents U.S. Pat. No. 4,706,216 incorporated herein by reference. FIG. 40A illustrates the classic 4 bit Look-Up-Table (LUT 4) which uses 16 SRAM bit-cells and a decoder constructed by N type transistors. FIG. 40B illustrates such a LUT 4 with the additional input drivers to buffer the 4 inputs and for their inversion for controlling the decoder, and the output signal reconstruction circuits to reconstruct the decoder output to a full "0"/'1" signal. Some of the extra circuits would be constructed on the upper custom silicon layer while the main LUT 4 of FIG. 40A could be implemented in the NOR substrate as is illustrated in FIG. 41 with symbol map on its left.

Figure 41:
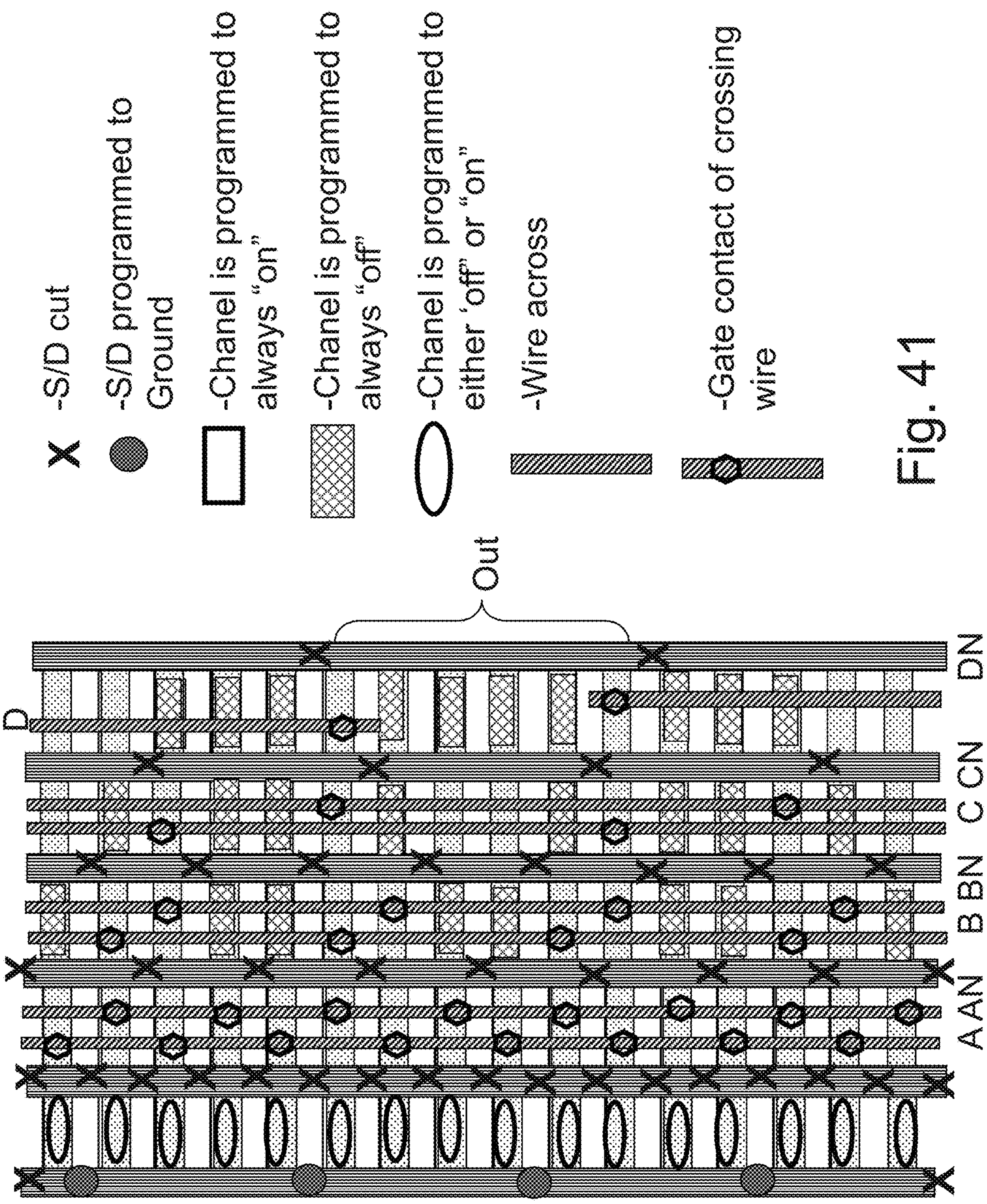
FIG. 41 is an example illustration of a LUT 4 of FIG. 40A implemented in the NOR fabric.

Use of the NOR structure as illustrated in FIG. 41 could be designed in such a way in which the LUT 4 decoders of multiple LUT 4s are aligned to share the same S/D lines.

Figure 42:
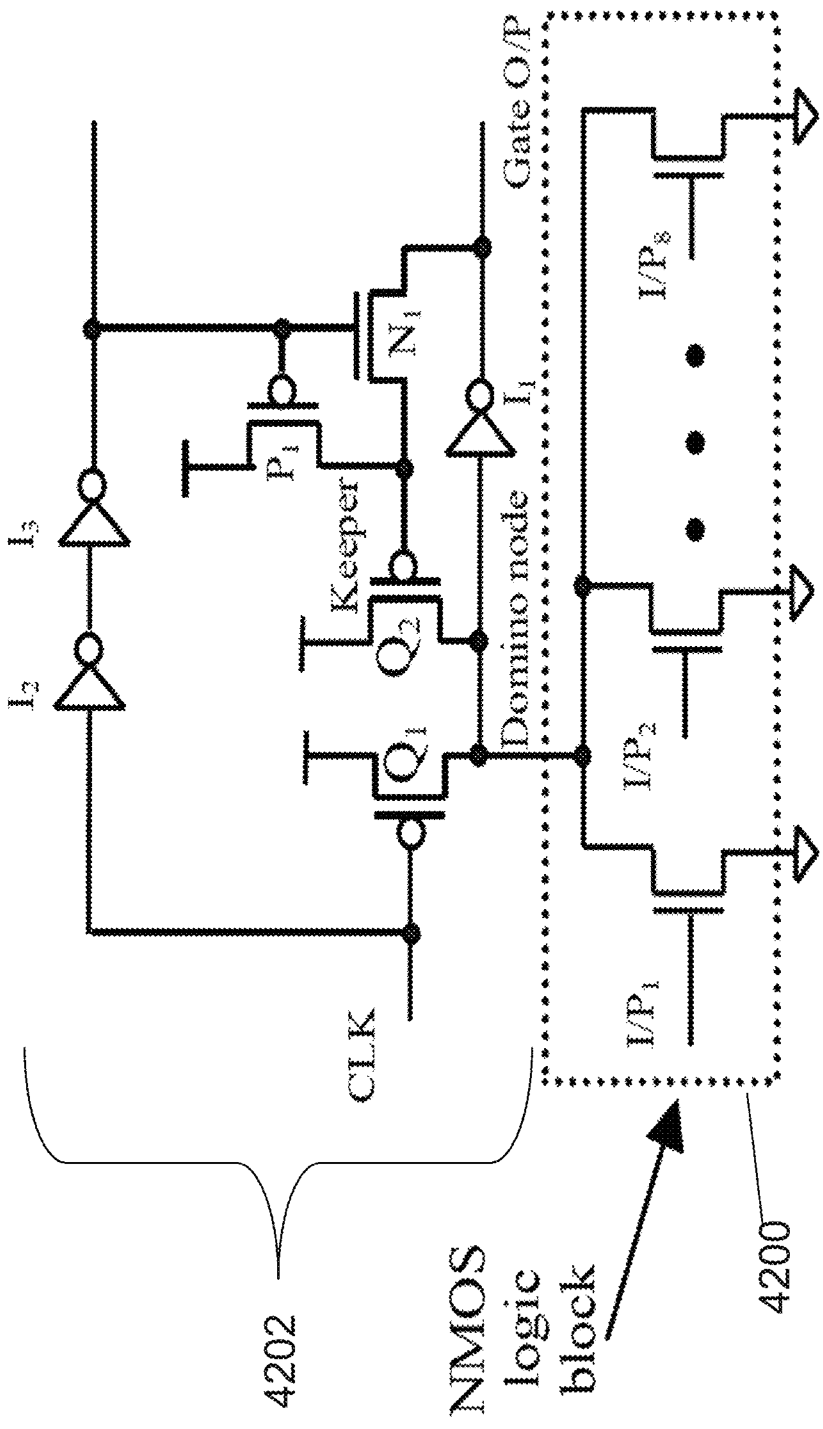
FIG. 42 is an example illustration of an 8-input HE-Domino OR gate.

The substrate of N channel transistors tightly packed in a 2D array in which every transistor could be configured as an active transistor or a connected path or a disconnected path provides a useful configurable terrain which could be used to form high density NV memory, high speed DRAM and or highly configurable logic terrain. Such a substrate overlaid by custom fabric could be used to form many attractive systems. For example, a NOR substrate of N channel transistors could be configured as domino logic that is known to be a very high speed design technique utilizing primarily N channel transistors. Such as in a paper by Allam, M. W et al titled "High-speed dynamic logic styles for scaled-down CMOS and MTCMOS technologies", published at Low Power Electronics and Design, 2000. ISLPED '00, incorporated herein by reference. An improvement is presented allowing higher speed and lower power domino logic. FIG. 42 is a copy of FIG. 3 there illustrating the "Domino part" 4200 which is build by just N channel transistors and the signal reconstruction portion 4202 which include clock circuits CLK a pre-charge circuits Q1 and keeper circuits Q2, I1, I2, I3, N1, P1, which could be build on the overlaying custom fabric 1790 herein. Another alternative was presented in a recent paper by Tonmoy Roy et al, titled "Novel FinFET Domino Logic Circuit Using Dual Keepers" published at: ICEEICT, 2014, incorporated herein by reference. Many other variations are known in the art with various specific names which we could refer to them all as domino logic.

Specific types of configurable logic could be formed in such 3D-NOR substrates. Within the field of programmable logic the most used fabric for which there currently is a wide range of design tools are the LUT based fabrics used for the most advanced FPGA and the PLA/PLD based fabrics used for some lower complexity smaller devices.

Figure 43A:
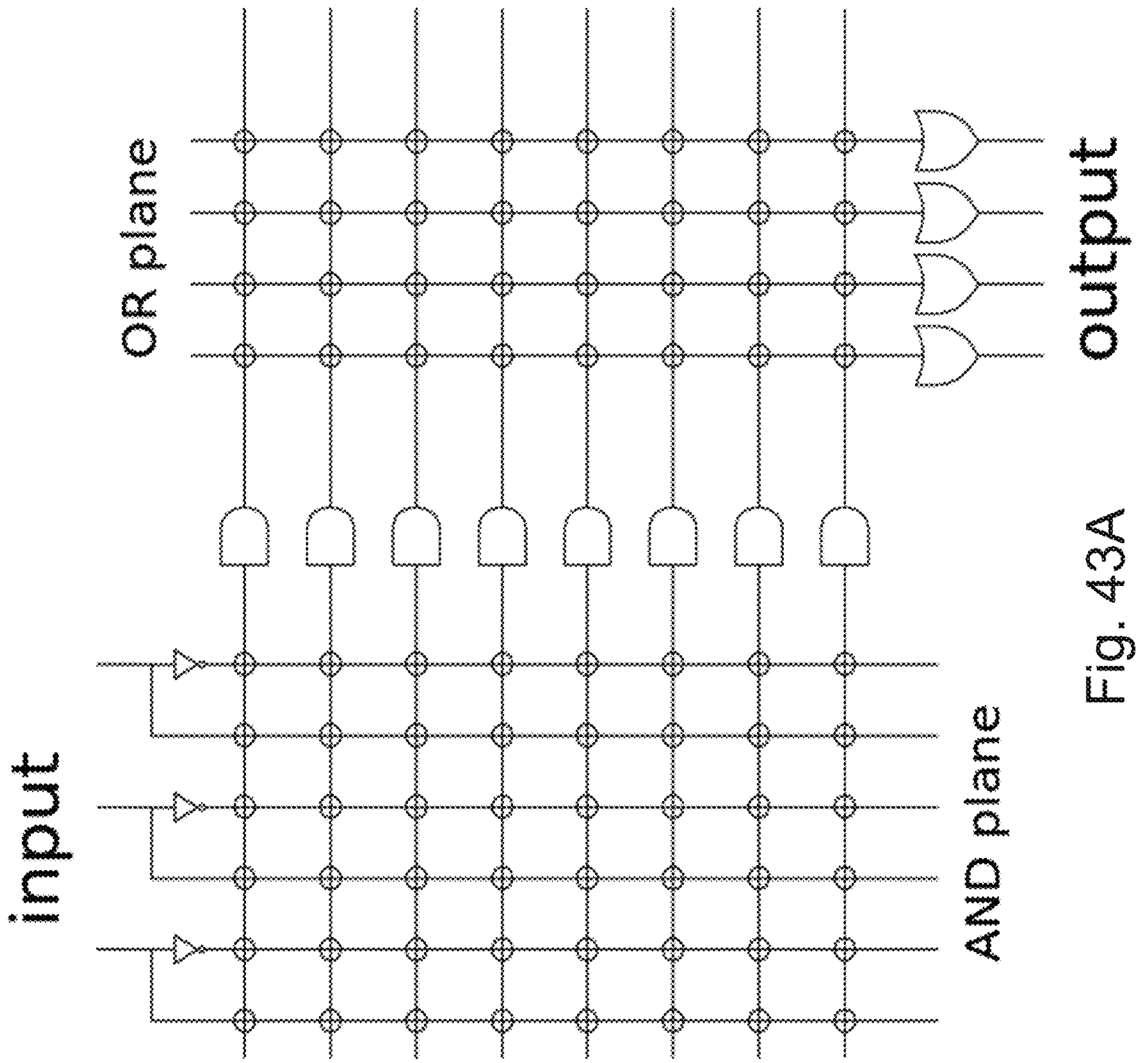
FIG. 43A is an example illustration of a Programmable logic array PLA structure.

FIG. 43A illustrates a simple prior art Programmable logic array PLA structure. These approaches were further developed with industry naming them Programmable array logic PAL, PLD and Complex programmable logic device CPLD.

Figure 43B:
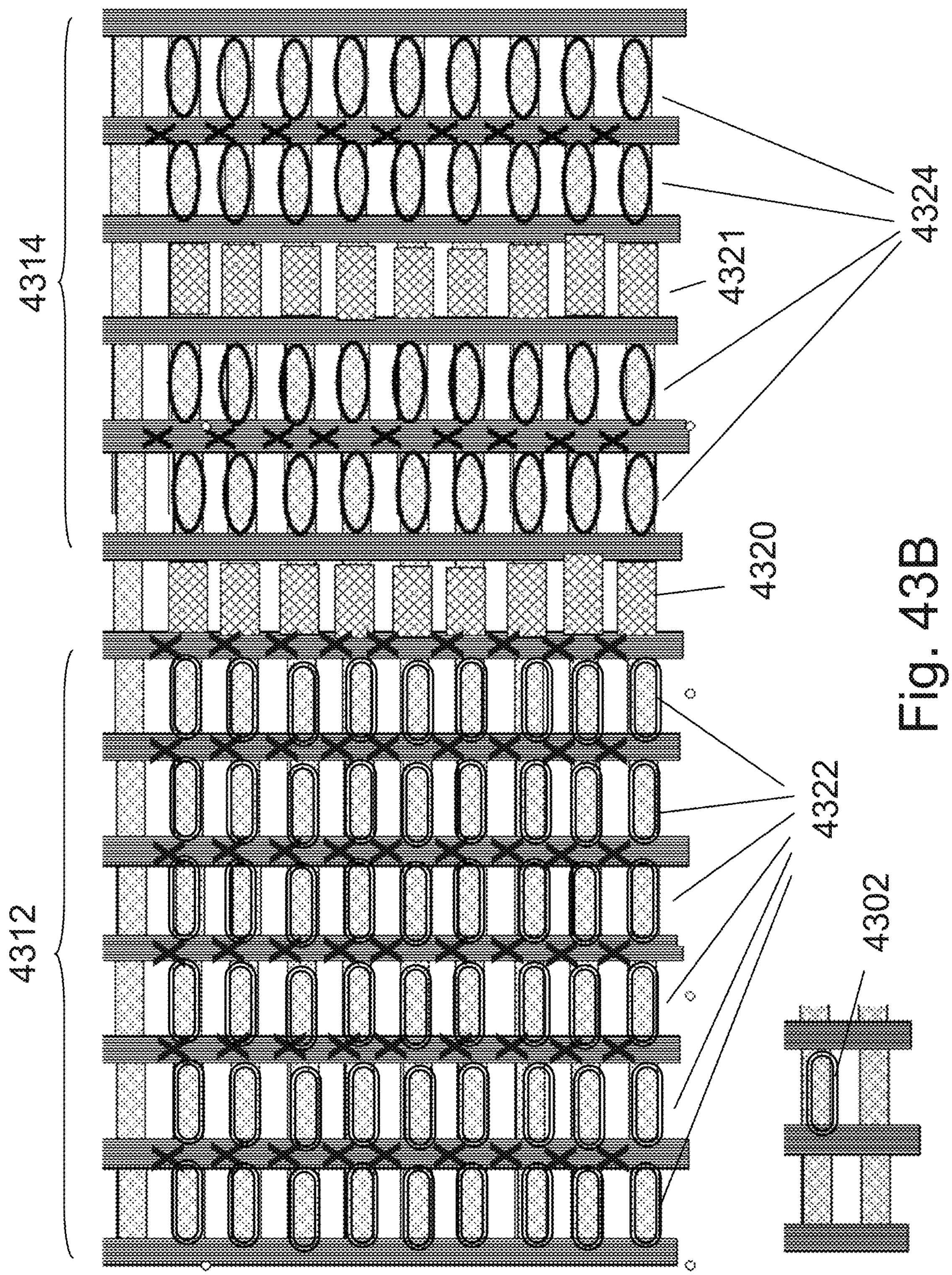
FIGS. 43B-43E are example illustrations of utilizing a NOR substrate to implement logic structures and circuits.

FIG. 43B illustrates the first step of utilizing a NOR substrate to implement such a PLA. The left side 4312 illustrates the multiple NAND gates implementation. Each channel could be programmed to either left as active transistor or programmed to be always on marked by 4302 symbol. The left side 4312 illustrates 9 horizontal strings of NAND gate 4322 each with 6 inputs. Channel programmed isolation 4320 is isolating the NAND portion from the wired- or portion 4314. In these drawing the symbols defined herein before in FIG. 39A-F and FIG. 41 are used whenever possible.

In the wired- or portion 4314 there are isolated central bars 4342 for which there are programmable connections 4324 to each side to the wired- or bar. The two groups are isolated with isolations 4321.

Figure 43C:
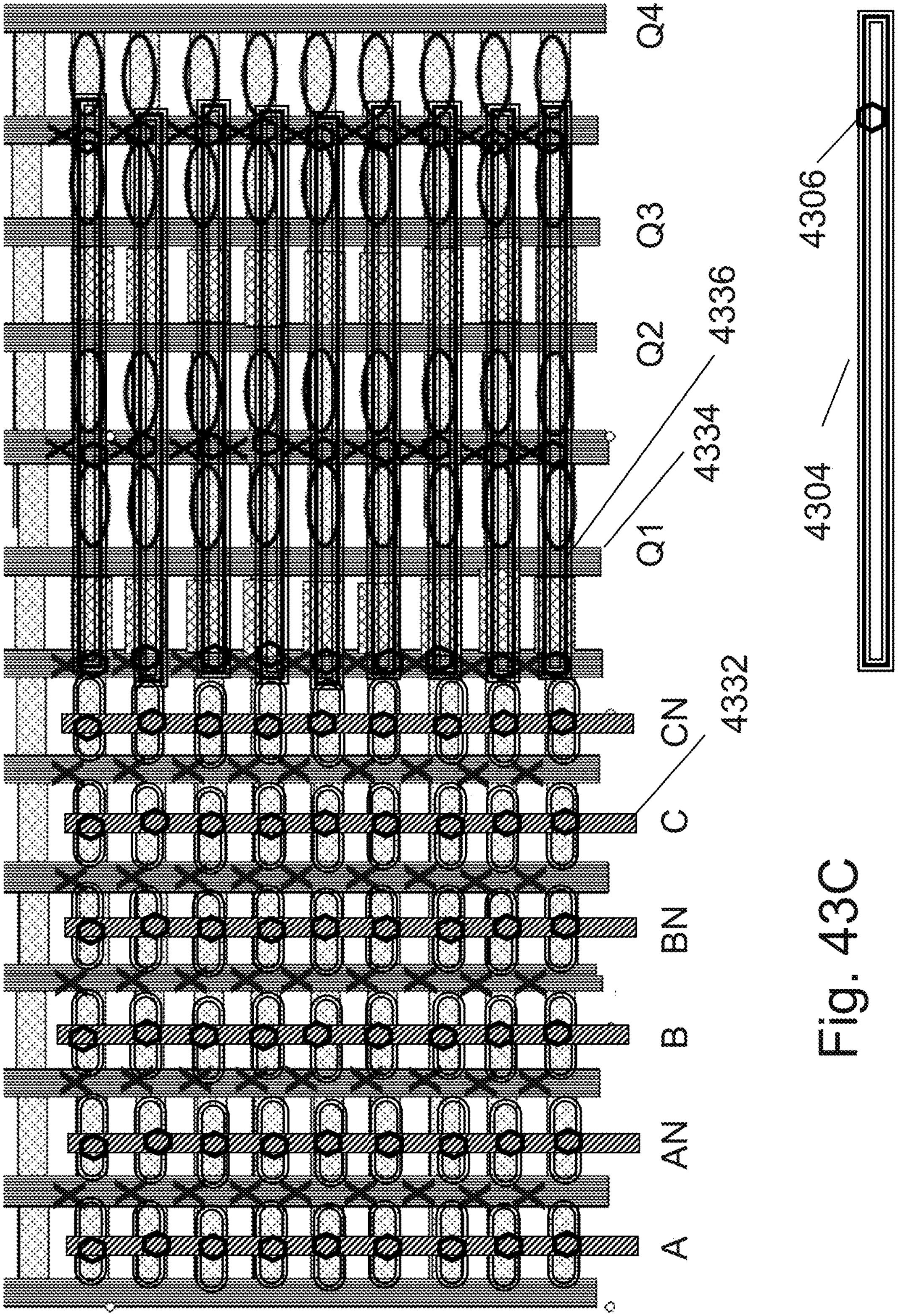

FIG. 43C is illustrating adding the top connection over the structure of FIG. 43B. The vertical connection bars 4332 are the input signals A, AN, B, BN, C, CN connected to all Programmable NAND strings. Then horizontal wires 4336 illustrated by symbol 4304 with connection to down 4306. The horizontal connections 4336 are connecting the 'NAND" outputs to the two bar 4342. The outputs of the programmable wired- or are Q1, Q2, Q3 and Q4.X.

Another alternative is to use the HD-NOR substrate for some of the required memory peripherals circuits. The left side 4312 of 43B illustrates construction of a wide AND circuit that is common for select lines decoder. The AND of FIG. 43B and FIG. C is oriented for the Gate-Lines/Word-Lines.

Figure 43D:
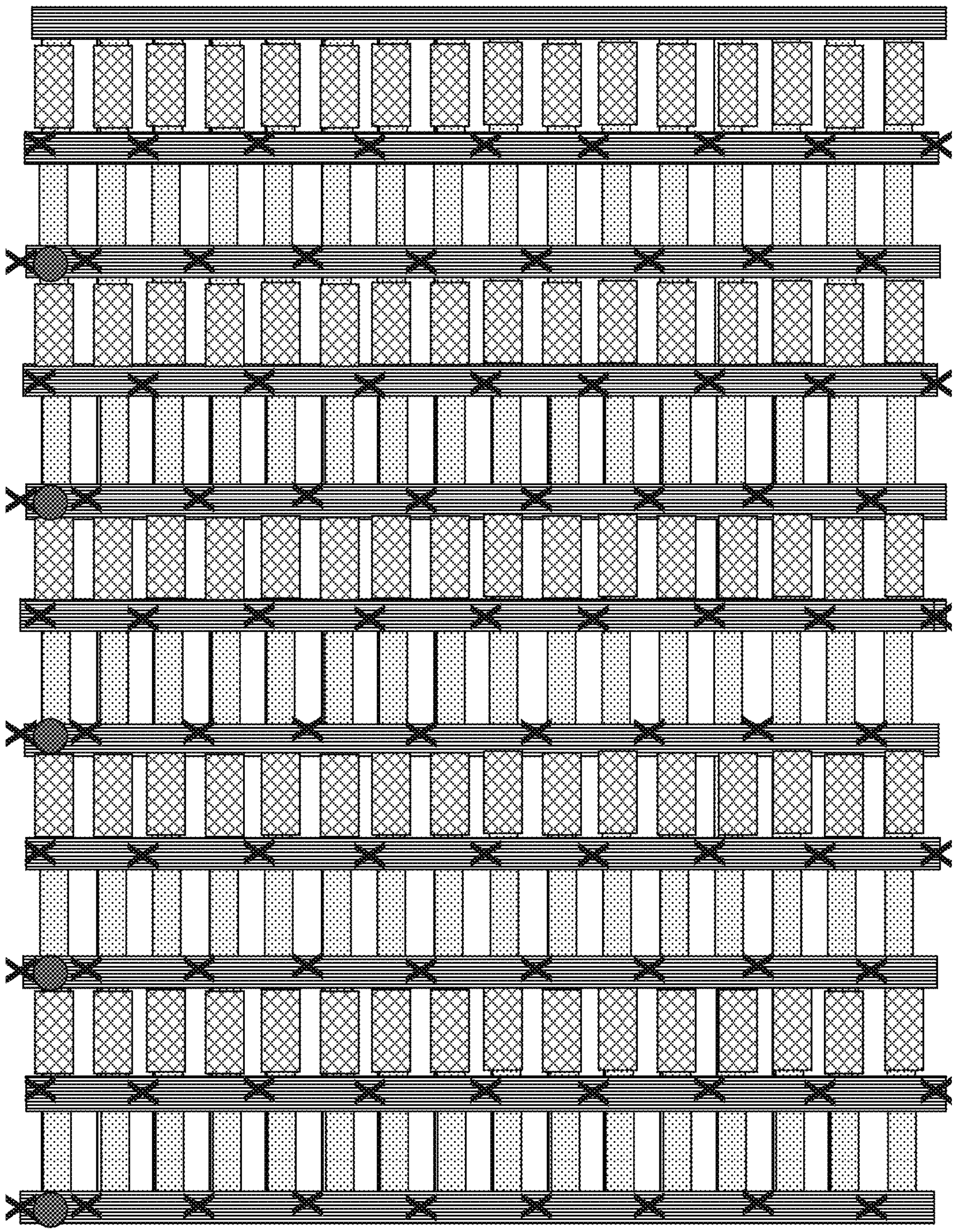
Figure 43E:
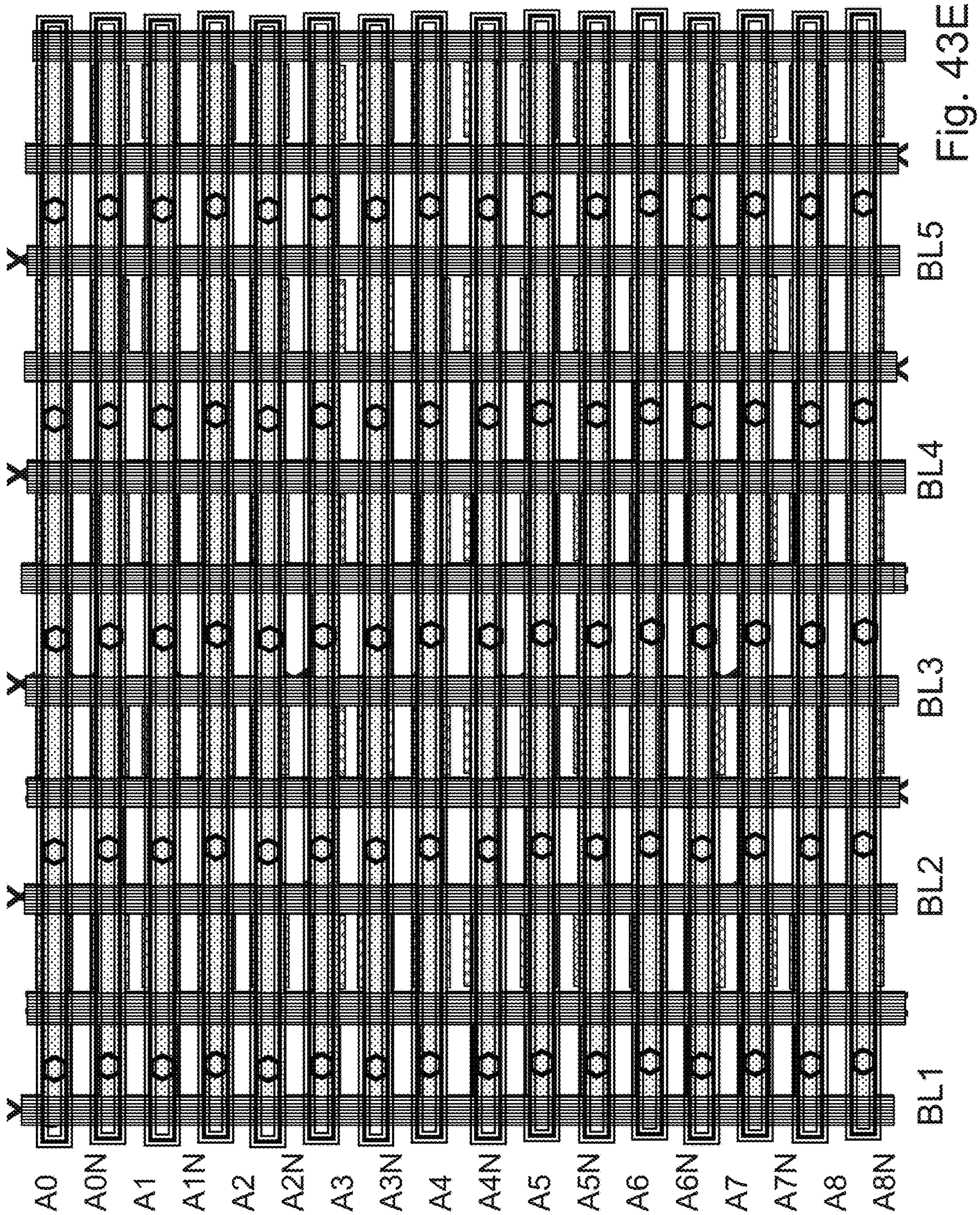

FIG. 43D illustrates forming a high fan in AND oriented for the S/D lines—Bit-Lines. FIG. 43D use symbols used before herein. All of the non-marked channels could be programmed to either 'left as active transistor' or made to be 'always on' and accordingly form the proper address decoding function. The output of the AND circuits are marked as BL1 to BL5. FIG. 43E illustrates the overlay of the horizontal connection lines bringing in the addresses marked as Address 0-A0 and its inverted signal A0N to address 8-A8 and its inverted signal A8N.

In some applications, such as advanced process nodes, the N type LUT circuit illustrated in FIG. 40A and FIG. 40B and the use of the pull-up-inverter signal reconstruction circuit 4001 is less than optimal. Also the domino logic clock base reconstruction circuit 4202 could be limiting. An alternative approach could be used as is illustrated FIG. 44A. It uses a half P MOS latch circuit 4414. The half P MOS latch 4414 would get as inputs, the output L-Out 4422 of the first LUT 4402, which could be a connection path to ground—zero signal or floating line—high resistivity, and the output L-OutN 4424 of the first LUT-N 4404, which, too, could be a connection path to ground—zero signal or floating line—high resistivity. The inputs to both LUT 4402 and LUT-N 4404 are the same input signals (A, B, C, D) and their inversion (AN, BN, CN, DN) 4412. The twp LUT are programmed to be complementing each other so if L-Out 4422 is low ('0') then L-OutN is high-impedance and the inverse when L-Out 4422 is high-impedance then L-OutN is low ('0'). Accordingly the half P MOS latch circuit 4414 converts these complementing signal to normal logic signal Output 4426 which would be low ('0' also called Vss) when L-Out 4422 is low and would be high (Vdd) when L-OutN is low ('0').

The broken line 4410 indicates the transitions of signals from the customizing the HD-NOR fabric to an overlaying upper layer of CMOS fabric which could carrying the CMOS circuits 4412 and 4414.

Figure 44A:
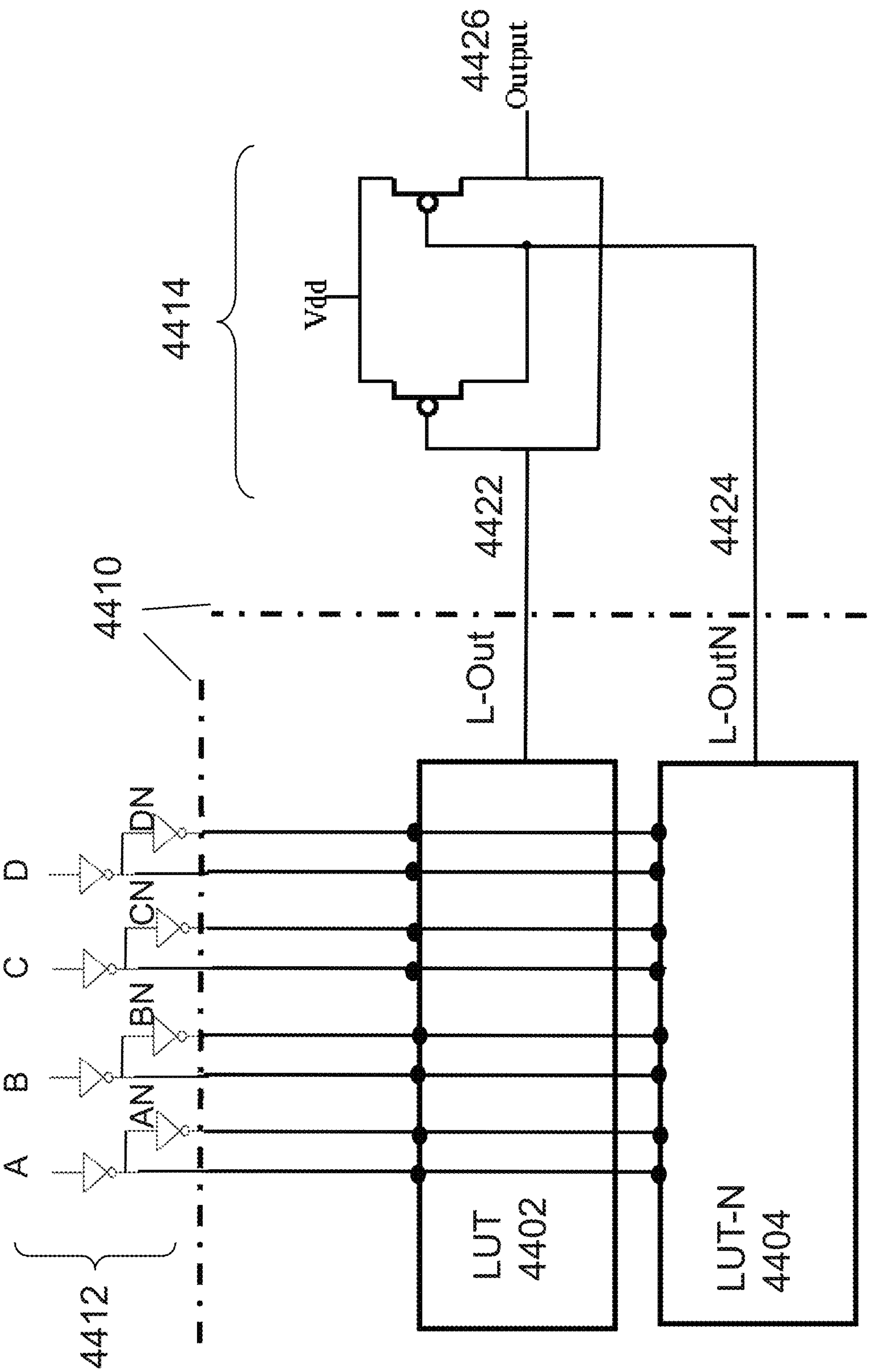
FIGS. 44A-44B are example illustrations of forming logic structures and circuits utilizing LUTs.

The structure of FIG. 44A illustrates forming a true 0/1 output using LUTs of programmable N type transistor fabric. This structure indicates doubling the resources as it uses two LUTs which complement each other. But if the circuit layout would leverage the triangular shape of these LUT circuits then the area penalty could be reduced as has been illustrated by FIG. 44B, in which the LUT 4408-N is flipped horizontally in respect to LUT 4406 to provide a more efficient circuit density and layout packing.

Figure 44B:
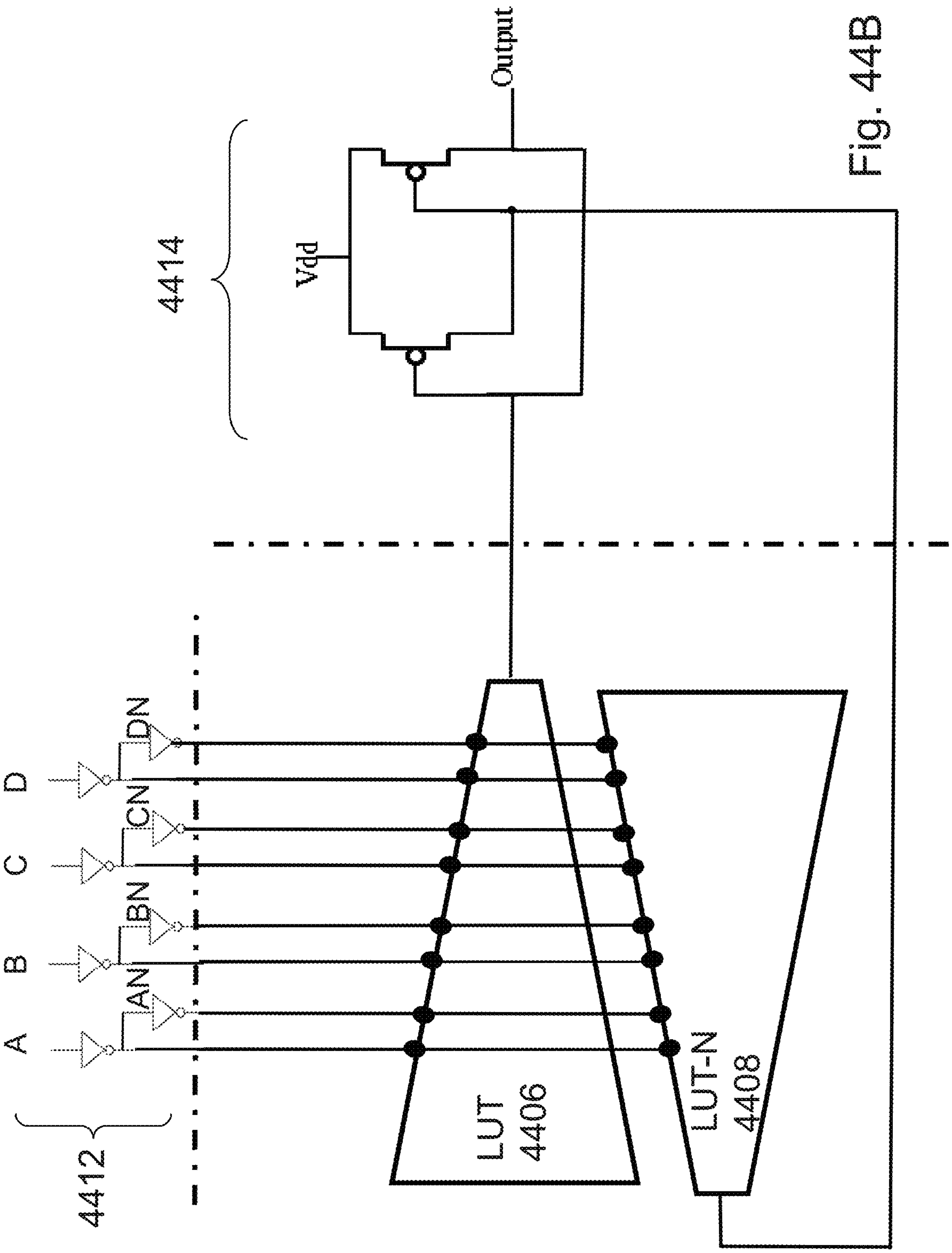

The use of two complementing N type circuits as described in FIGS. 44A-44B is known in the art as differential cascade voltage switch logic circuit ("DCVS"). It could also be used in combination with clocked circuits to further reduce power. D. Somasekhar et al. in a paper titled "Differential Current Switch Logic: A Low Power DCVS Logic Family" published in IEEE JOURNAL OF SOLID-STATE CIRCUITS, VOL. 31, NO. 7, JULY 1996; W. Chen paper titled "Mixed Multi-Threshold Differential Cascode Voltage Switch (MT-DCVS) Circuit Styles and Strategies for Low Power VLSI Design", published at ISLPED'01; and Dae Woon Kang et al in a paper titled "Design of Enhanced Differential Cascade Voltage Switch Logic (EDCVSL) Circuits for High Fan-In Gate" published at ASIC/SOC Conference, 2002, 15th Annual IEEE International, the entire contents of each are incorporated herein by reference. These references present additional variations and alternatives for improving power and or performance. Ho Joon Lee, in a paper titled "Low Power Null Convention Logic Circuit Design Based on DCVSL" publish at MWSCAS2013, incorporated herein by reference, suggests using such logic for asynchronous circuits. Such techniques and design approaches could be implemented in a 3D NOR fabric.

An alternative to building a programmable logic fabric on the 3D NOR backside is to build programmable logic fabric within the 3D NOR fabric. For this alternative some of the ridges or portion of them could be targeted for logic integration by using narrow enough S/D lines so in that a portion the S/D region surrounded by second gates are effectively junction-less transistors gated by their respective second gates.

Figure 45:
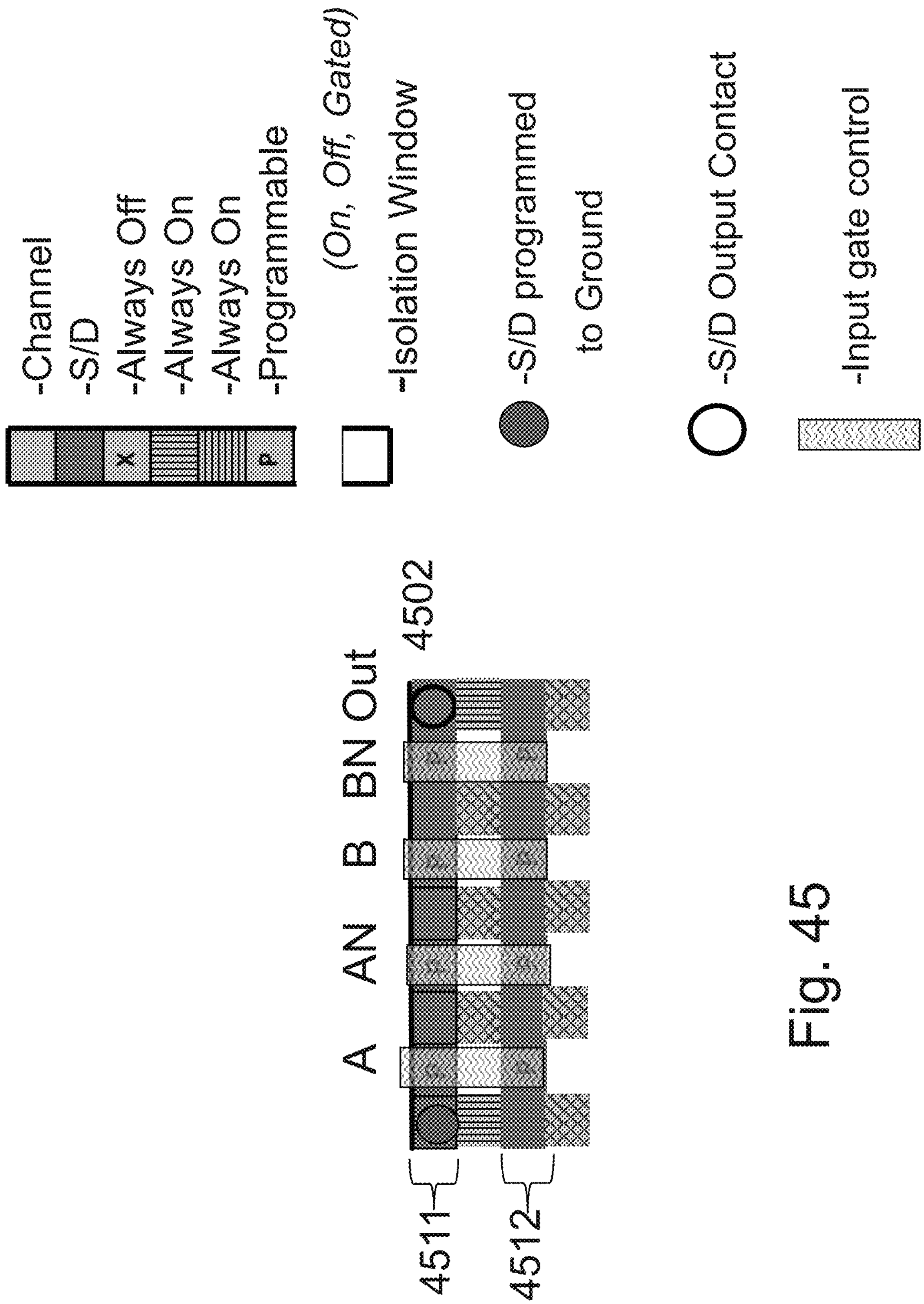
FIG. 45 is an example illustration of two programmable NANDs.

FIG. 45 illustrates 2 programmable NANDs 4511, 4512 of two inputs and their complements (A, AN, B, BN) with output 4502. This programmable structure could be programmed to form any two input logic functions and accordingly function as a LUT-2. The table in FIG. 46 presents the programming of these two NAND rows to support the LUT-2 functionality. The left side of the table shows the output function according to the two inputs 'a' and 'b' which could be the function inputs (A, B). The table shows '1' for high impedance output 4502, as the high impedance output could be reconstruct to a high logic level—'2' by a following circuit as was discussed herein. The right side represents the programming of the respective transistors of the First NAND row 4511 under the respective gate line and respective transistors of the Second NAND row 4512 under the respective gate line. The table uses the following symbols:

On—Always on
X—Always Off
T—Gate control
No symbol—Don't care

Figure 47A:
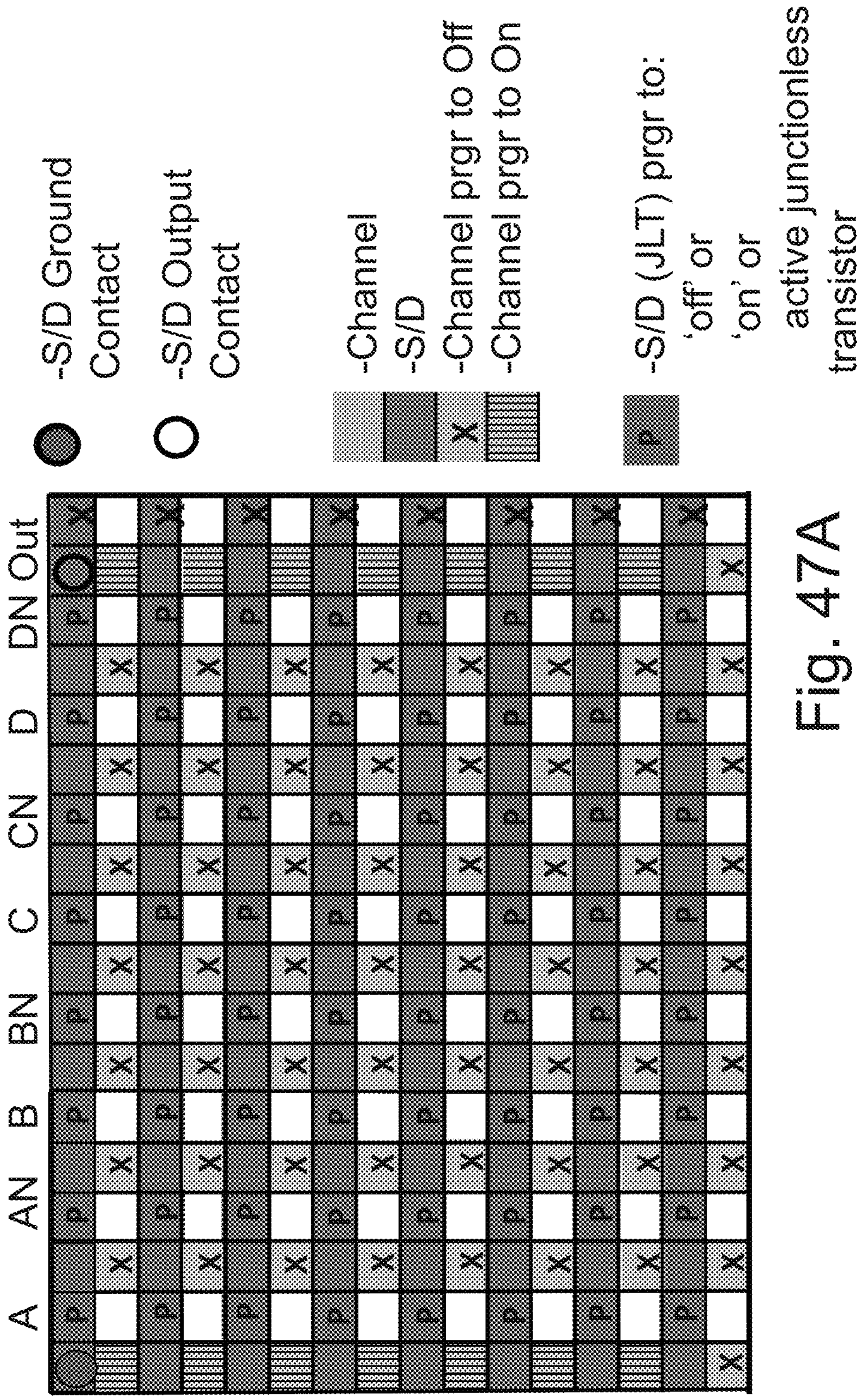
FIGS. 47A-47B are example illustrations of 8 rows of programmable NANDs.

For a LUT-3, 4 NAND rows would be needed, and for a LUT-4 8 rows as is illustrated in FIG. 47A.

Figure 47B:
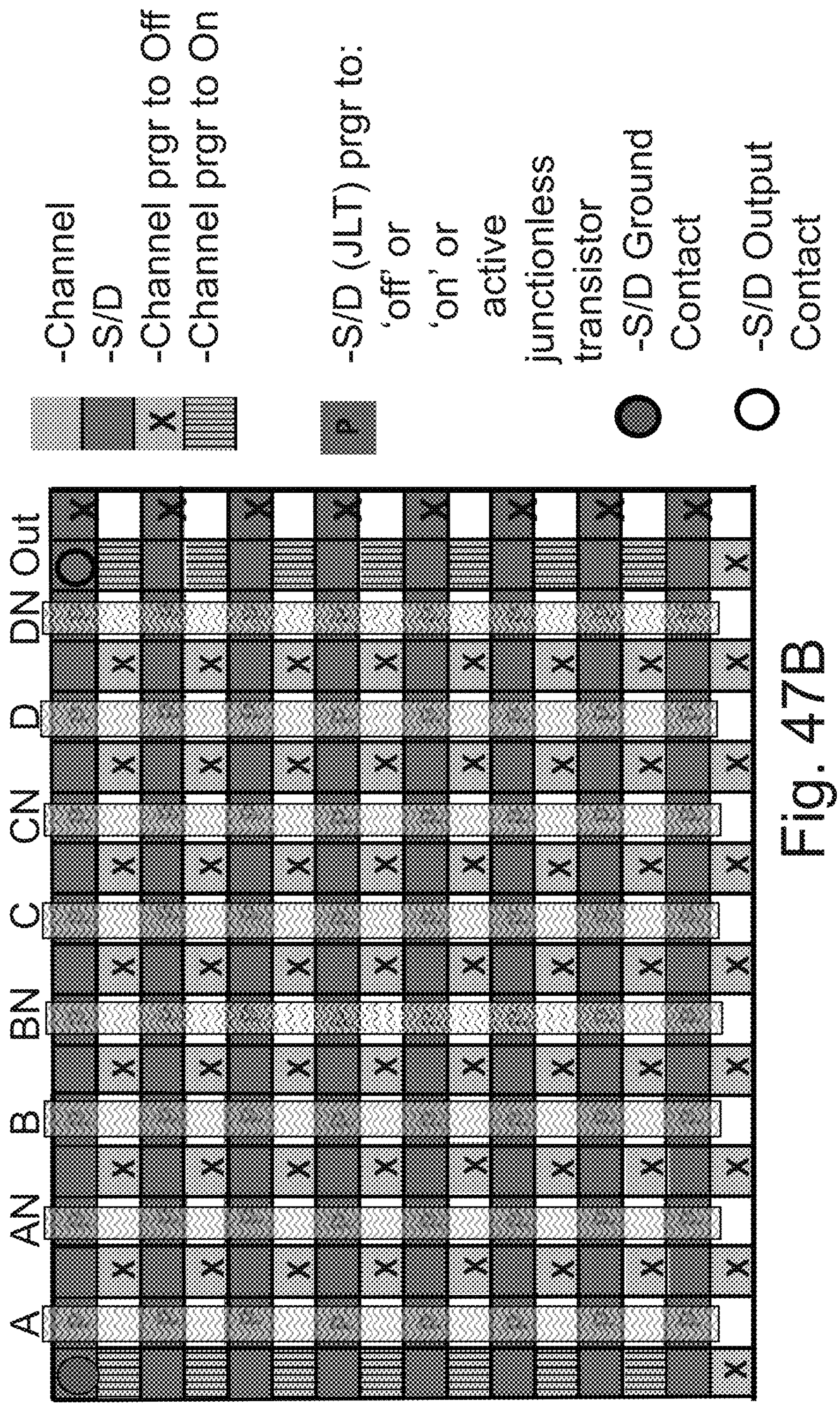

The first gates of the 3D NOR fabric could be used to program each of the channels in the NPN vertical channel column, while the second gates could be used to program the horizontal S/D junctionless transistor ("JLT") channels, as is illustrated in FIG. 47B.

These LUT-4s could be arranged along a ridge while their surrounding ridges may function as memories. Since the LUT-4 would need circuits for supporting functions such as half latch 4414, CMOS circuits 4412, signal reconstruction circuit 4202, restore buffer 4002, it could be desired to have more than 5 rows of memory ridge for each logic ridge.

The first gates and the second gates associated with logic function could be disconnected using litho and prices from the gates of the memory ridges, and by use of multiplexers could be made to have dual function. During the programming mode it may be connected to the memory gates and in logic mode be connected to the logic signals.

While junctionless transistors could need a very thin channel of less than 20 nm to have a low leakage comparable with comparable NPN transistor the use of them for programmable logic such as LUT-4 and especially when using two complementing LUT-4s with half latch 4414 reconstruction, could be effective even for larger channel widths, due to the differential function of the circuit and the use of junction less transistors in an N only serially connected structure as illustrated in FIG. 47. This may provide increasing yield in the face of process variation.

FIG. 48A illustrates use of a ridge to construct a programmable function complementing the 'AND of NANDs' of FIG. 45. It is an 'OR of ANDs'. FIG. 48A illustrates 2 programmable ANDs 4811, 4812 of two inputs and their complements (A, AN, B, BN) with output 4802. By being a full inversion of the structure of FIG. 45 this structure is also a programmable LUT-2. The right side presents the symbol map.

The table of FIG. 48B presents an optional programming of first AND 4811 and the second AND 4812 to construct a LUT-2. The left side of the table indicates the programming of the respective channels under each of the respective gate inputs (A, A, AN, B, BN) while the right side presents the resultant output 4802 for each programming choice according to the input signals—A (a), B (b).

Figure 49A:
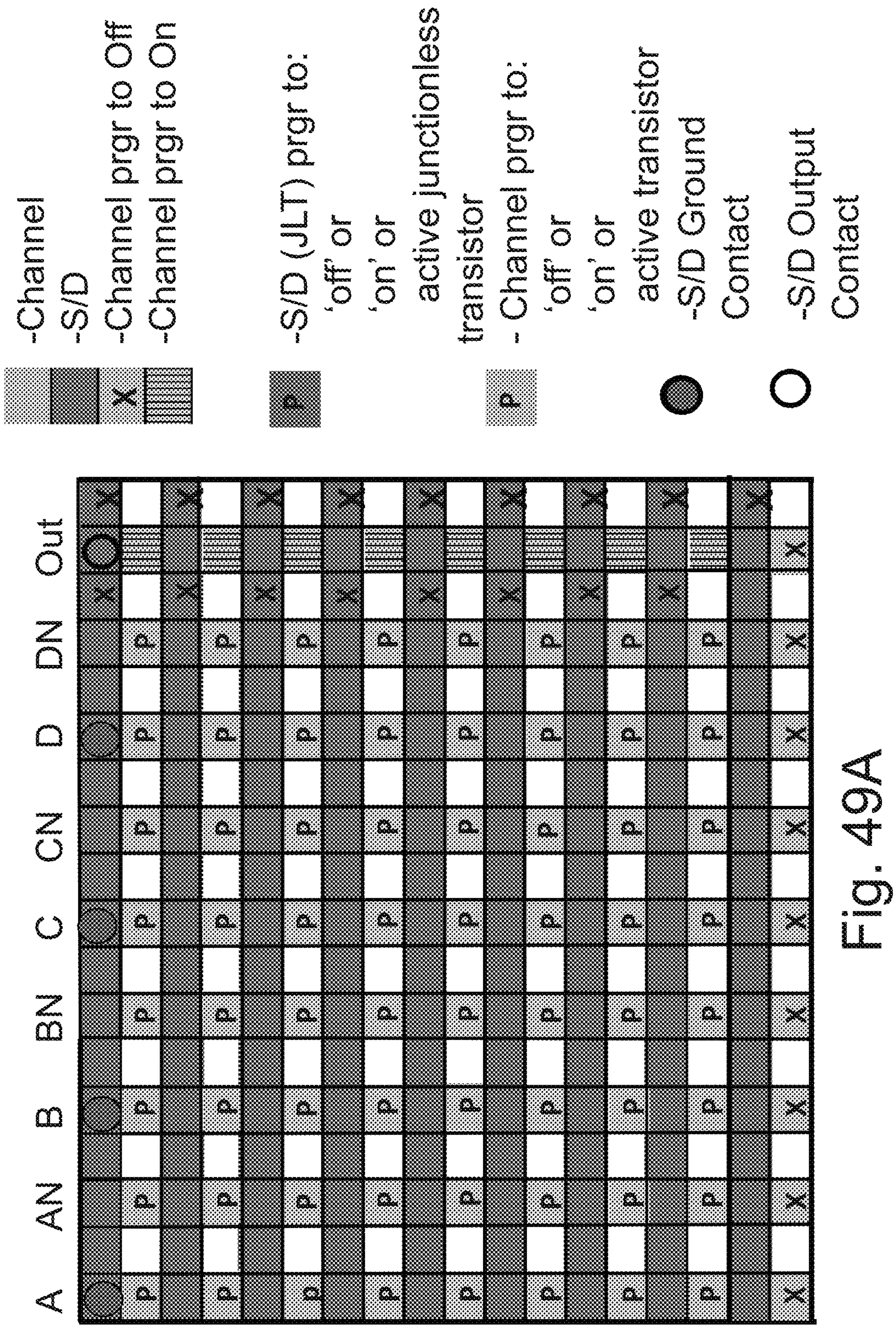
FIGS. 49A-49B are example illustrations of the use of a ridge to construct a programmable function LUT-4 using 8 rows of 'OR of ANDs'.
Figure 49B:
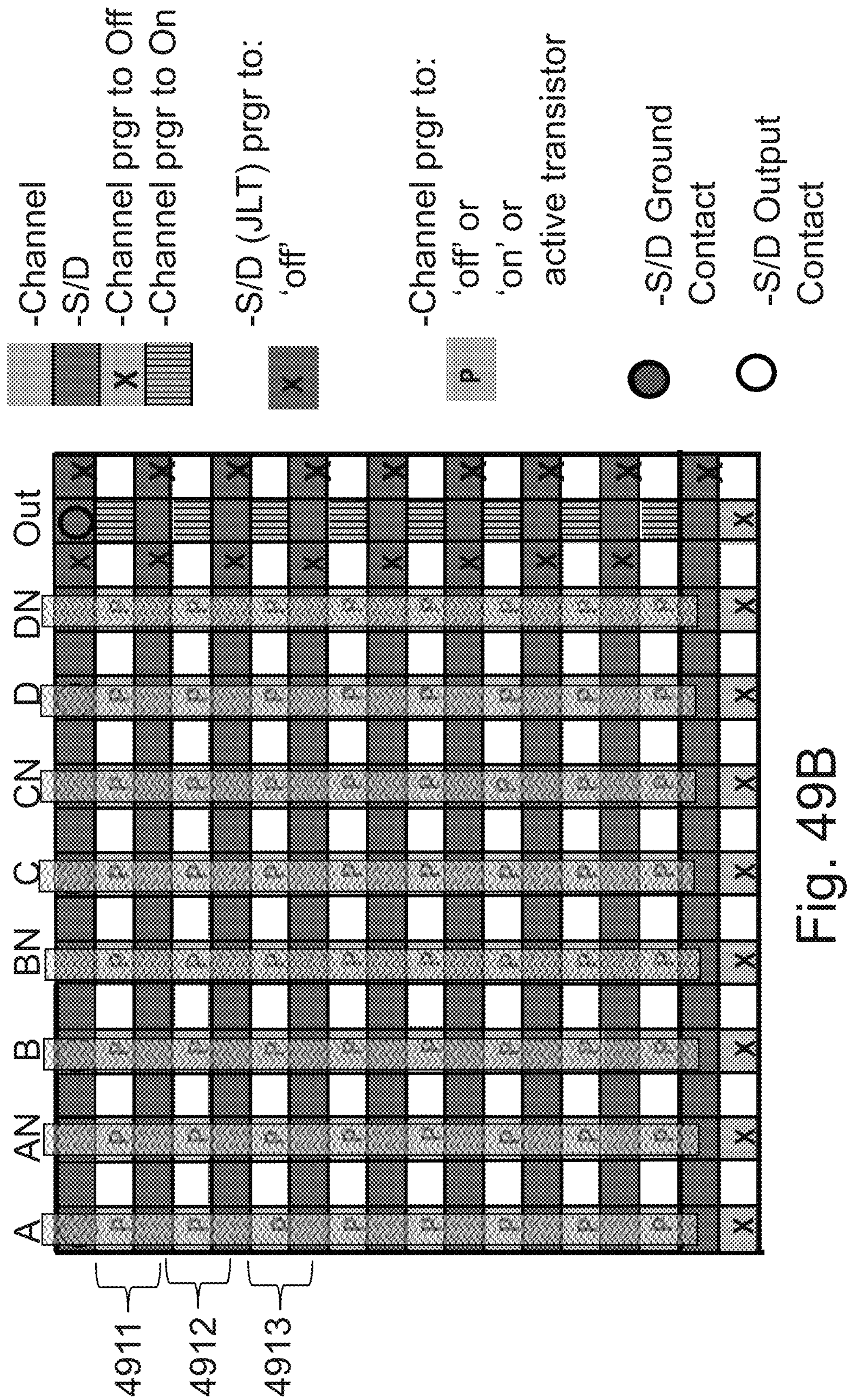

FIG. 49A illustrates use of a ridge to construct a programmable function LUT-4 using 8 rows of 'OR of ANDs'. In the structure the active logic gates could be first gates (those controlling the channel column) as is illustrated in FIG. 49B. There many programming options to construct such LUT-4. One programming option is to leverage the table of FIG. 48B to have 4 LUT-2 option and program the channel under the other inputs (C, CN, D, DN) so the LUT-2 that is being affected is controlled by the other inputs. So, for example, a LUT-2 being programmed in the upper most two ANDs 4911, 4912 is going to control "0" going to the third NAND 4913 when the other inputs are not asserted C=0, D=0 and bypass otherwise, and so forth as is illustrated in FIG. 49C. Using the AND structure such as FIG. 49B for a LUT-4 provides the option to form junctionless transistors only at the edge of the LUT-4 while keeping the other portion of the S/D line as regular lines (with S/D & channel widths and thicknesses greater than about 20 nm).

Figure 49D:
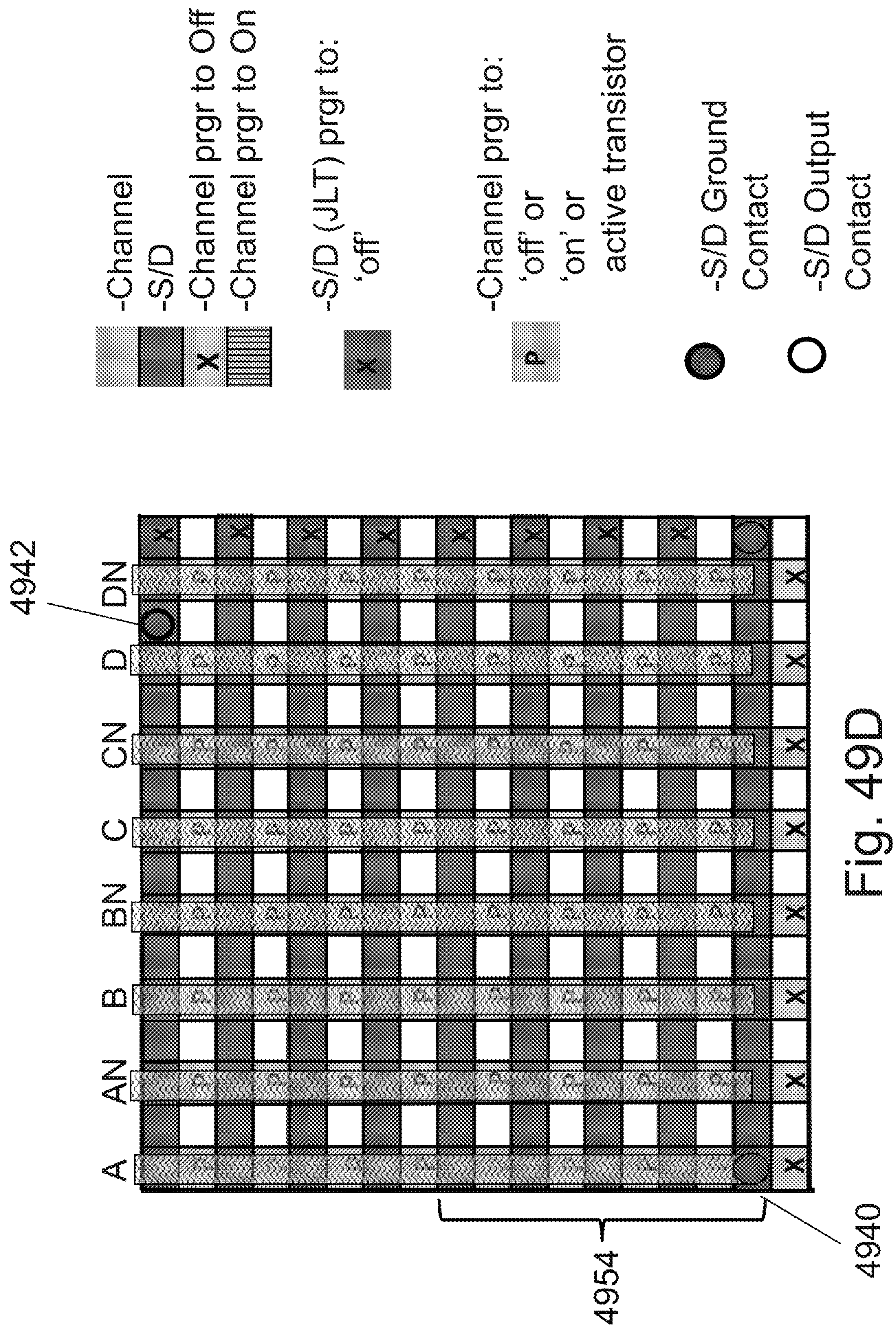
FIG. 49D is an example illustration of an alternative for the LUT-4 of FIG. 49B.

FIG. 49D illustrates an alternative for the LUT-4 of FIG. 49B when the lower S/D line 4940 is grounded and accordingly the output is at the upper S/D line 4942.

Figure 49E:
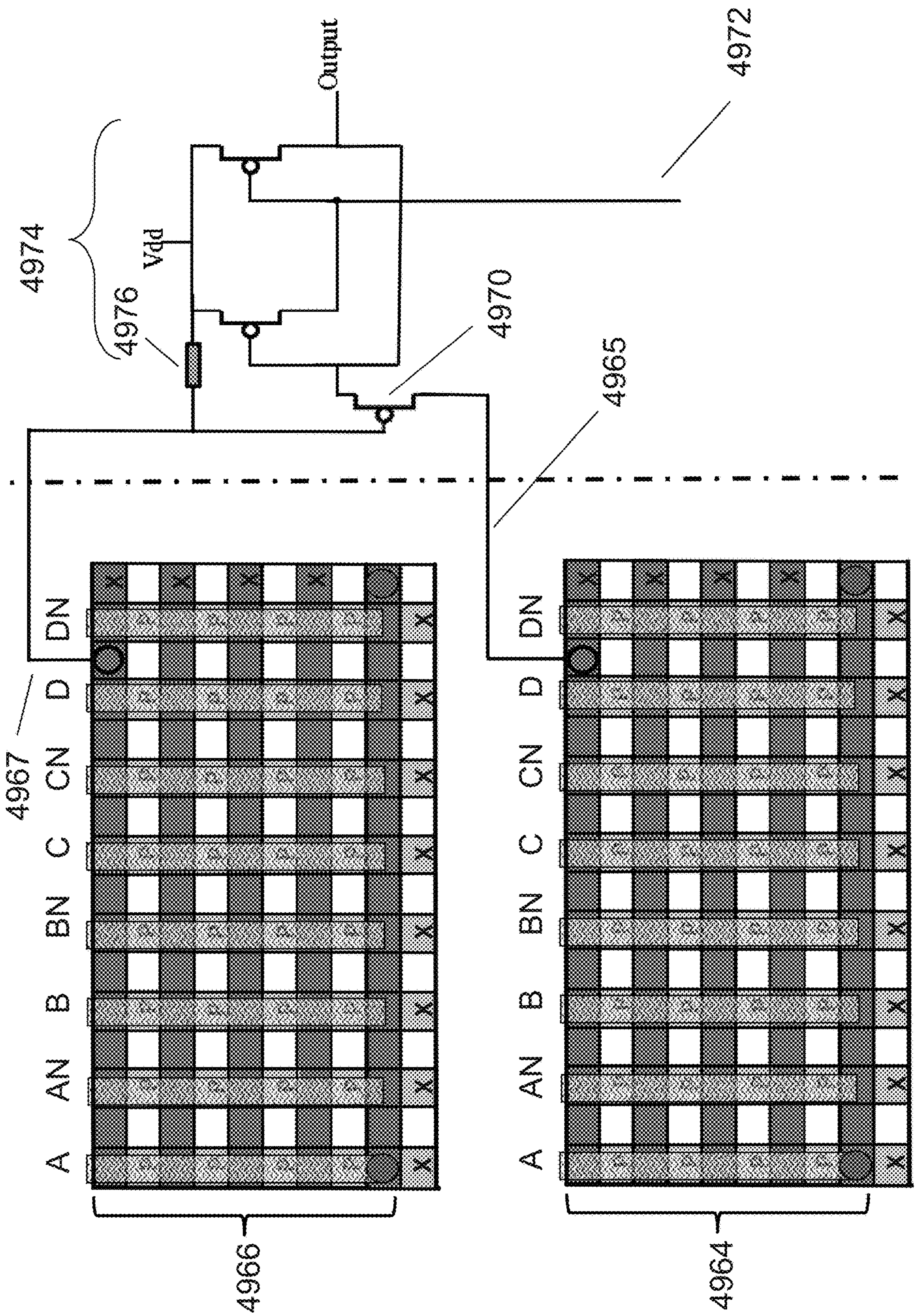
FIG. 49E is an example illustration an alternative for the LUT-4 of FIG. 49D.

FIG. 49E illustrates an alternative for the LUT-4 of FIG. 49D in which the LUT-4 utilizes only four layers with JLTs. It uses two structures such as portion 4954 part of the LUT-4 of FIG. 49D, first portion 4964 and second portion 4966. Both portions need to be connecting to 'zero' first signal 4965 and second signal 4967 to form the full LUT-4. An additional P type transistor 4970 with pull up (very high value resistor or circuit element) 4976 could be added to the half latch reconstruction circuit 4974 to implement the OR function in the control logic portion. A complementing LUT-4 could be connected to the other side of the half-latch 4972 to complete the function.

The 'OR of ANDs' implementation make a far less use of the junctionless transistor aspect of the S/D lines. It could be implemented even without use of this junctionless transistor by segmenting the ridges to groups of 8 channel columns with the area density penalty associated with such segmentation especially due to the potential stair-case access per layer structure.

Having the both programmable 'AND of NANDs' and its complementing 'OR of ANDs' allows structuring ridges as a PLA with a half latch reconstruction option providing a wider range of programmable fabric options.

Figure 50A:
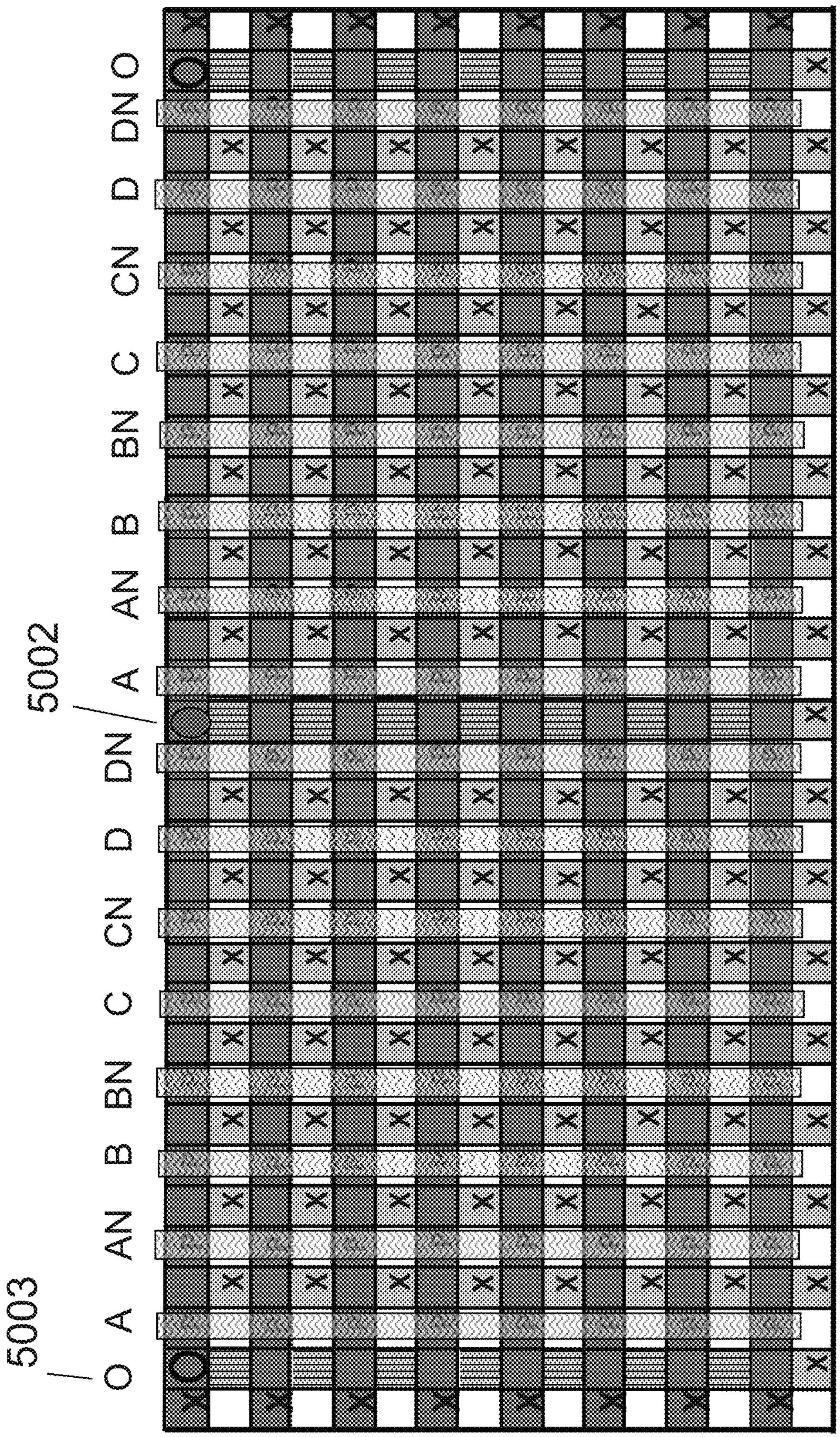
FIGS. 50A-50B are example illustrations of two LUT-4 placed back to back on the same ridge and two LUT-4s as one PLA with AND of 8 NANDs.

The fabric could be even programmed to allocate regions to LUT type or PLA type according to the need of specific products or type of product. FIG. 50A to FIG. 51B are to illustrate this flexibility FIG. 50A illustrates two LUT-4 place back to back on the same ridge. The programmed statuses of the left and right half plane of LUT-4s are complementary. The left and right half plane of LUT-4 correspond to LUT 4406 and LUT-N 4408 of FIG. 44B, respectively and each of the outputs are connected to the input of half latch 4414 of FIG. 44B.

Figure 50B:
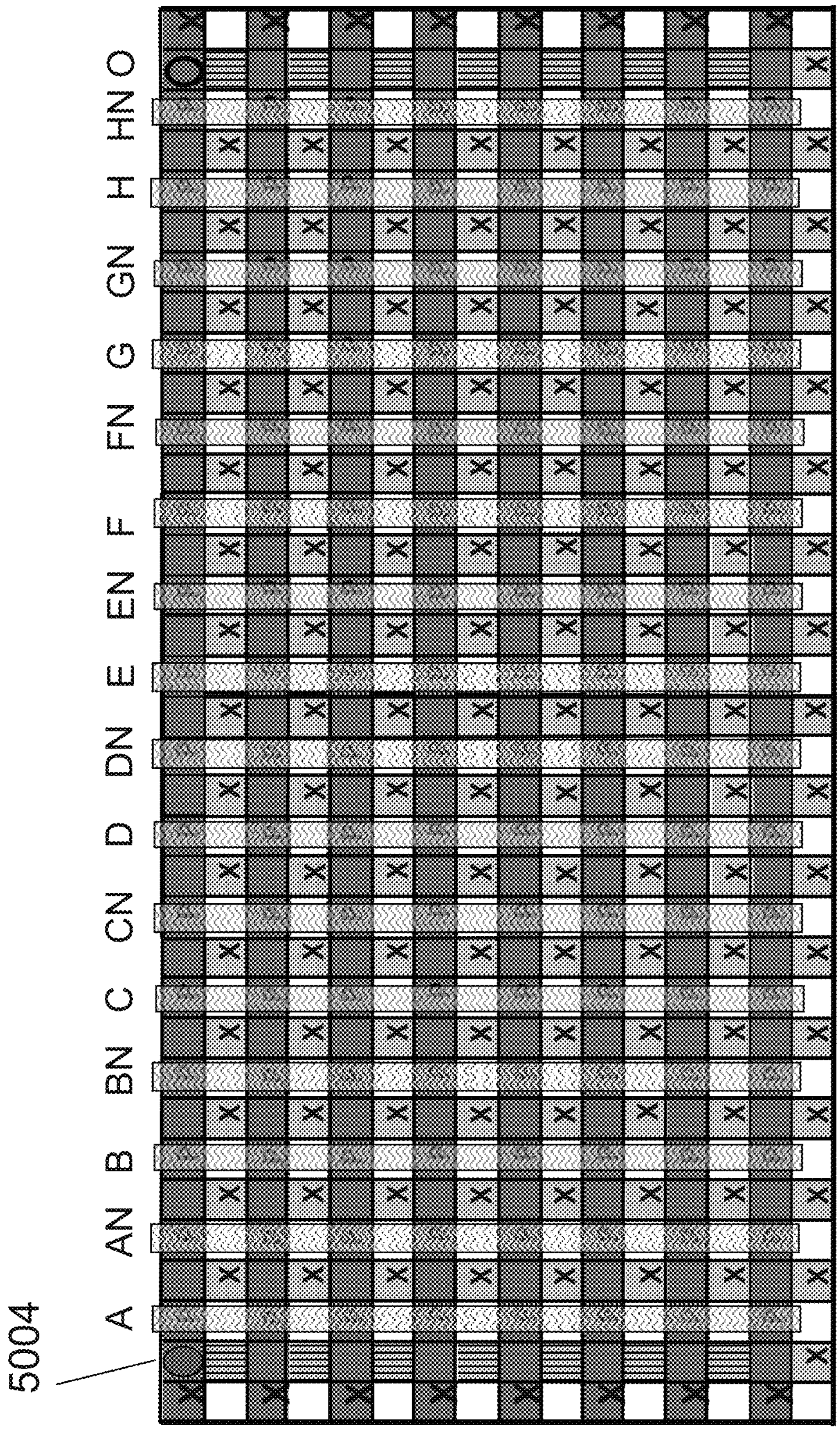

FIG. 50B illustrates the structure of FIG. 50A configured instead of two LUT-4s to one PLA with AND of 8 NANDs (of 8 inputs: A-H and their complements). The shared 'ground' channel column 5002 is programmed as disconnects vertically and accordingly connecting the two NANDs of each row to one long NAND, and the left most output 5003 is replaced with 'ground' input 5004.

Figure 51A:
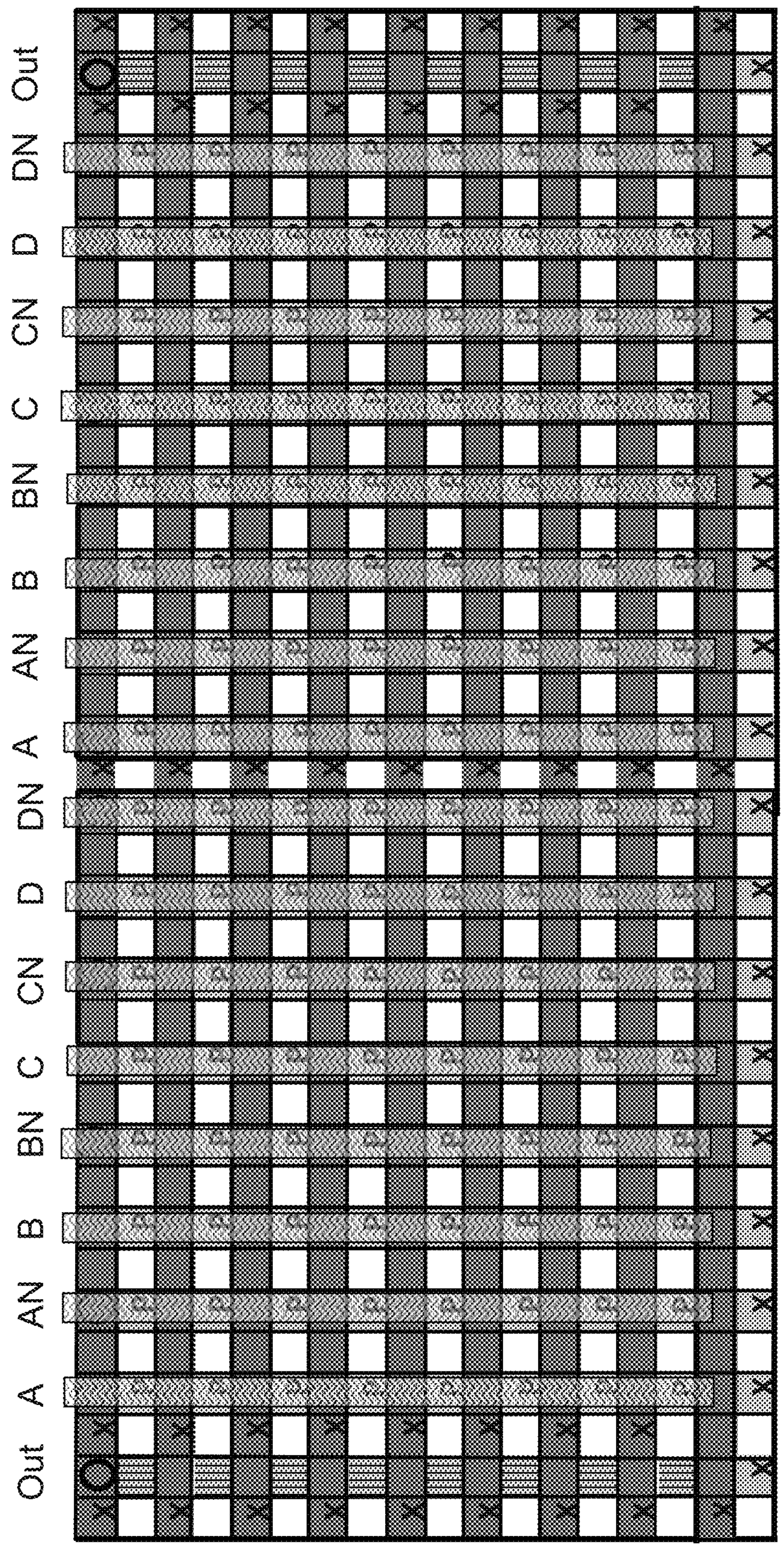
FIGS. 51A-51B are example illustrations of two LUT-4s of OR_AND type place back to back on the same ridge and two LUT-4s as one PLA with OR of 8 ANDs.

In similar way the complementing function could be configured from two OR-AND LUT-4. FIG. 51A illustrates two LUT-4s of OR_AND ype place back to back on the same ridge.

Figure 51B:
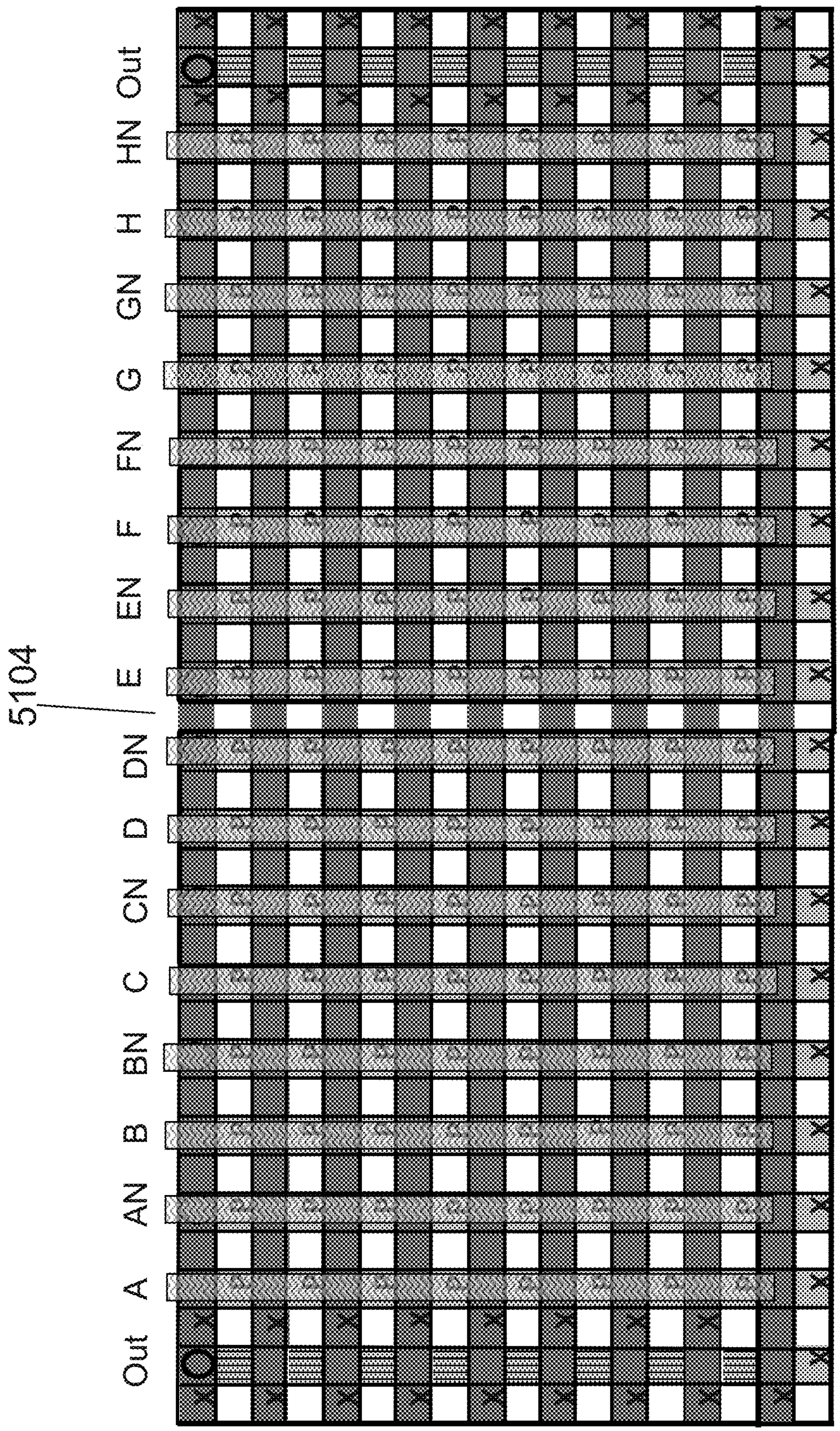

FIG. 51B illustrates the structure of FIG. 51A configured instead of two LUT-4s to one PLA with OR of 8 ANDs (of 8 inputs: A-H and their complements). The disconnects between these LUTs are removed 5104 and they become 8 long AND of 8 inputs: A-H and their complements.

Using the structure of FIG. 51B to complement the structure of FIG. 50B and a half latch 4414 could provide logic signals of 8 NAND terms of 8 inputs.

An additional flexibility of the 3D NOR fabric is the ability to allocate more rows for the programmable logic cell, if those are available in the fabric. So if the 8 input function requires more than 8 terms then by programming more rows it could be assigned in. A full LUT-8 would require 128 rows.

Figure 52:
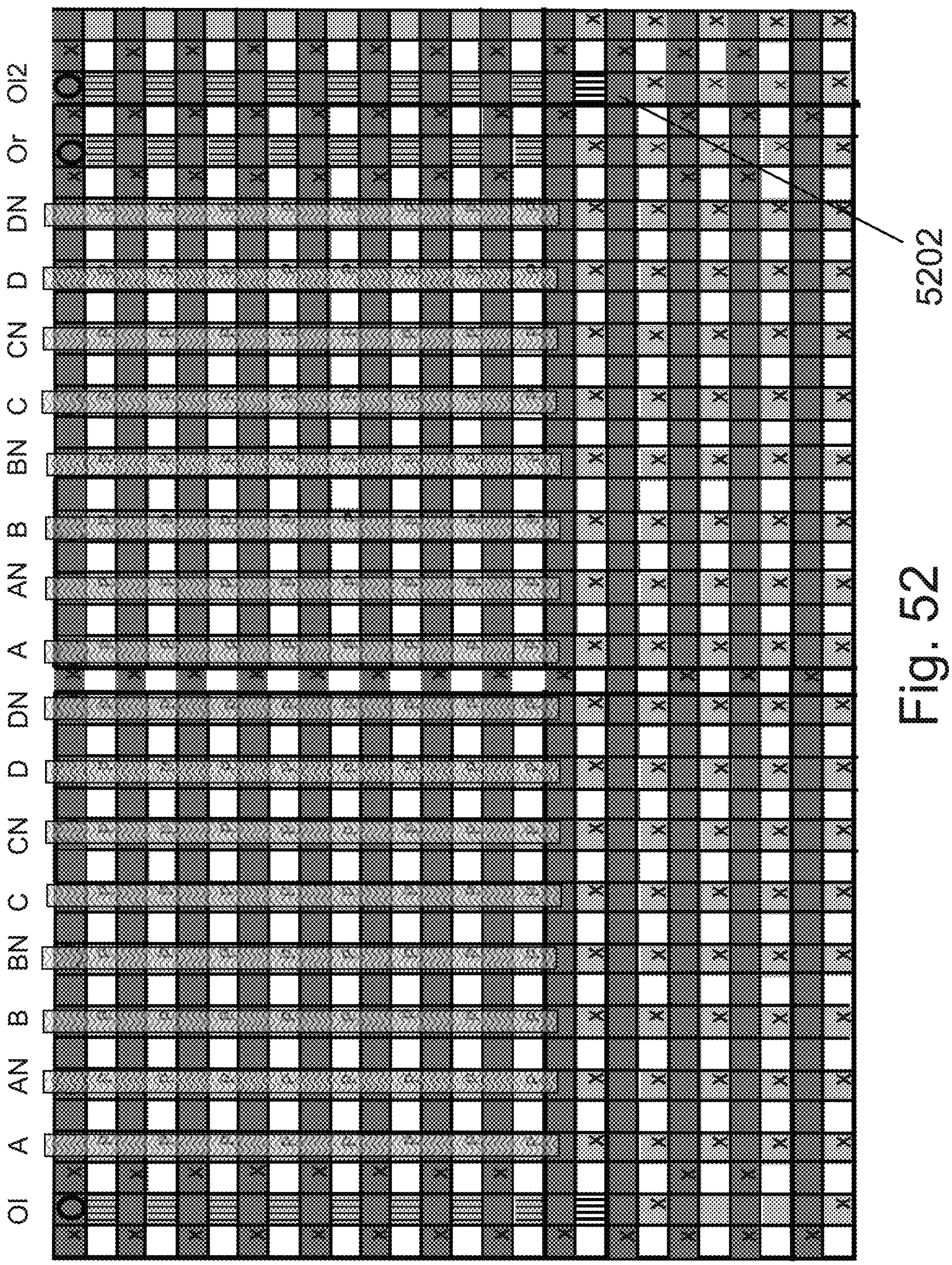

Another use of the 3D-NOR fabric could be to route a signal through. FIG. 52 illustrates routing the left output O1 over to the right to O12 using the 9th row 5202.

It might be preferred to route both the output and its corresponding complementary output to allow better signal recovery as the routing signal within the 3D NOR ridge fabric is associated with many 'on' transistors on the routing path and many 'off' transistor with their leakage hanging on the path. By using differential signal reconstruction, such as the half-latch 4414, the routed signal could be properly reconstructed.

Figure 53A:
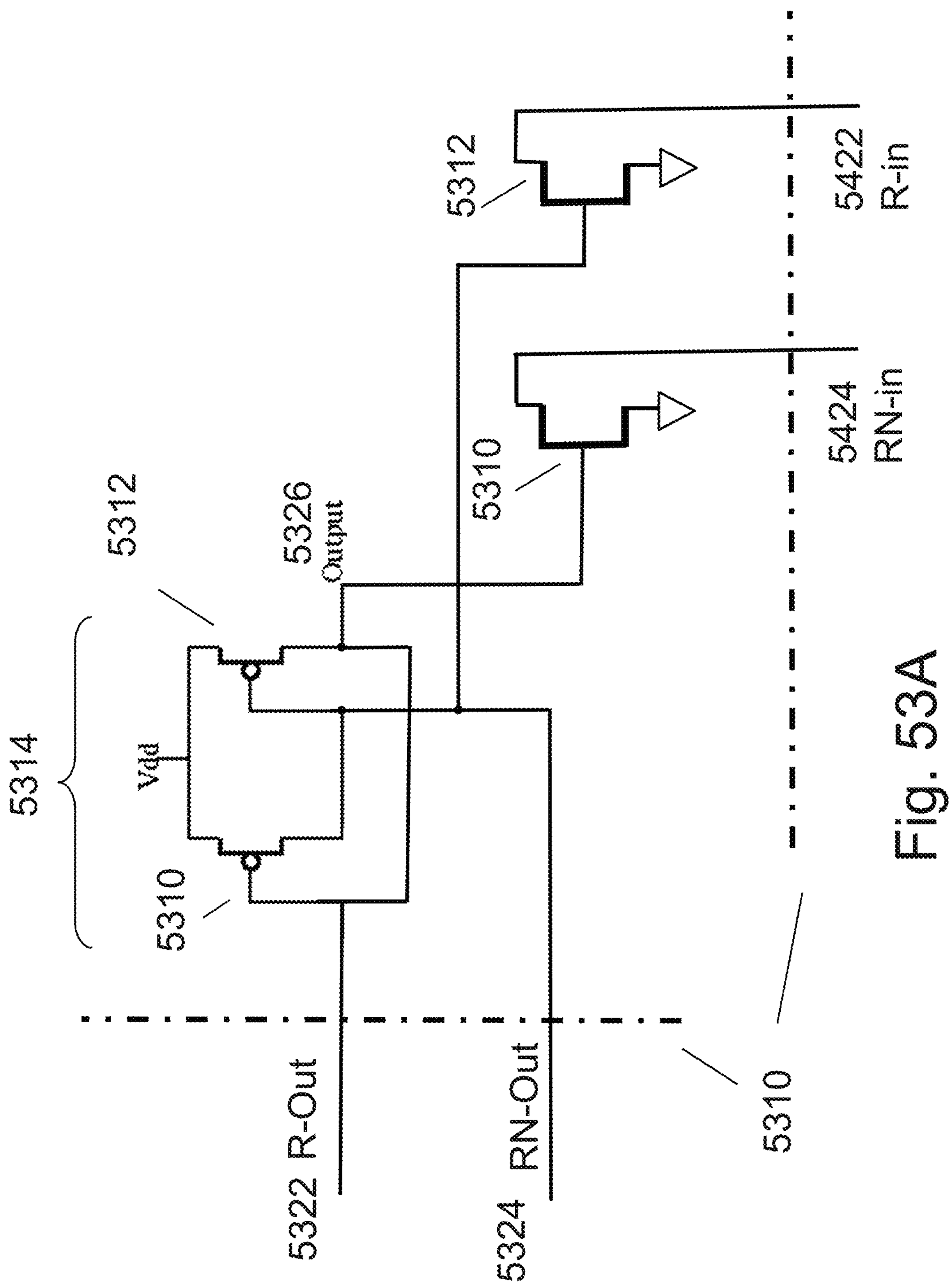
FIGS. 53A-53B are example illustrations of a re-buffered cell and alternative re-buffering with full inverters.

FIG. 53A illustrates a re-buffered cell that could be used as part of supporting circuits for routing signals using the 3D-NOR fabric. The two complementing routed signal R-out 5322 and RN-out 5324 re-crossing from the 3D NOR fabric to the support circuit above illustrated by crossing 5326. The half latch signal reconstruction circuit 5314 using relatively small P transistors first p 5310 and second p 5312 could then drive relatively large N transistors first n 5311 and second n 5313 forming the 're-buffered' signals R-in 5332 and RN-in 5334 back into the 3D NOR fabric. The relatively large N transistors first n 5311 and second n 5313 could be 1.5, 2.0, 2.5, 3, 5, 10 times wider than relatively small P transistors first p 5310 and second p 5312. Accordingly the two complementing signals of one is path to ground '0' and one is floating 'HR' would be re-strengthened back to the 3D fabric—one is path to ground '0' with far lower resistivity—'on' of either 5310/5311 or 5312/5313 and the other is high resistivity 'HR'.

Figure 53B:
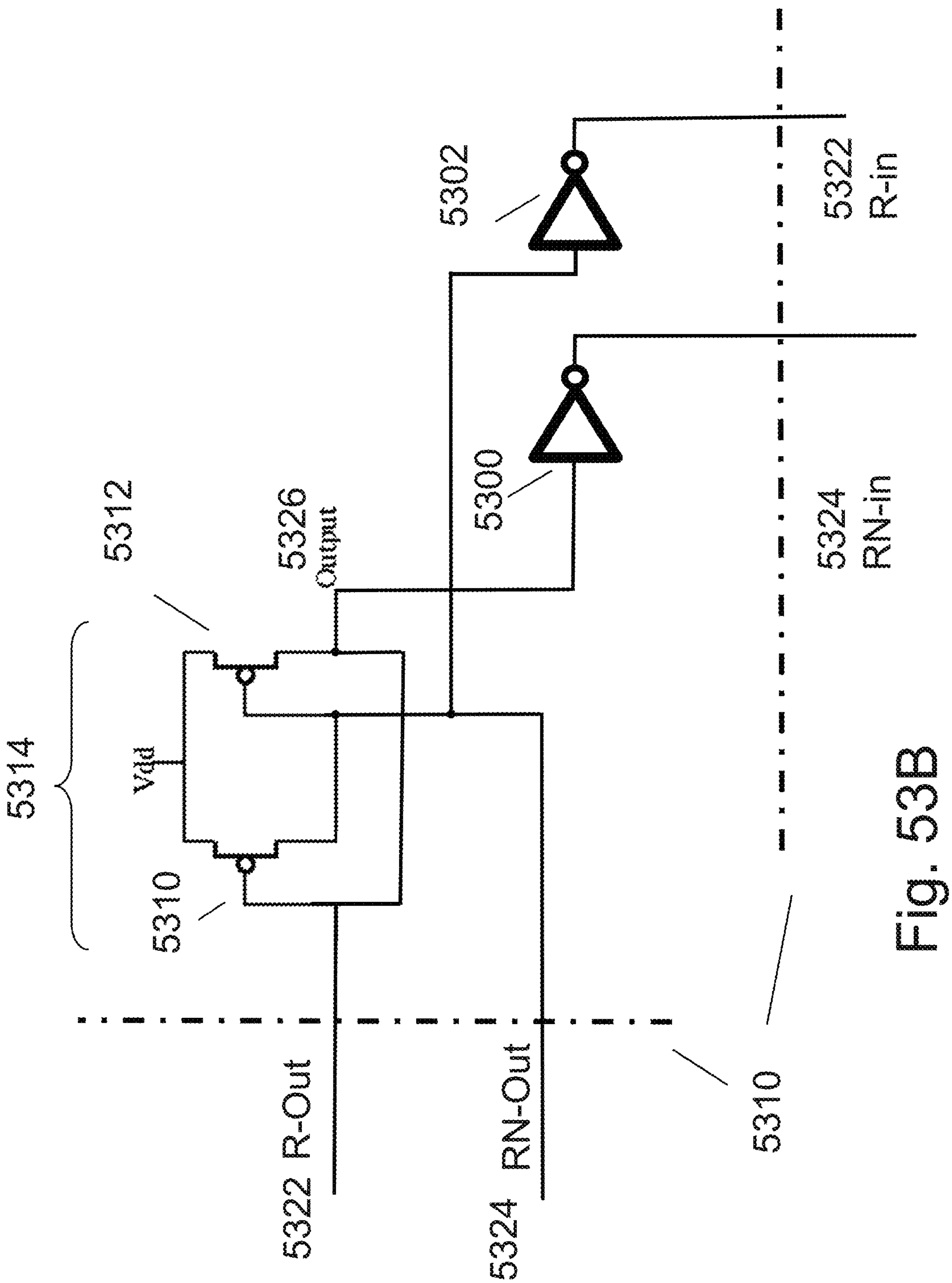

FIG. 53B illustrates an alternative re-buffering utilizing full inverters first inverter 5300 and second inverter 5302 feeding back to the 3D NOR fabric full complementing signals R-in 5342 and RN-in 5344.

Figure 54:
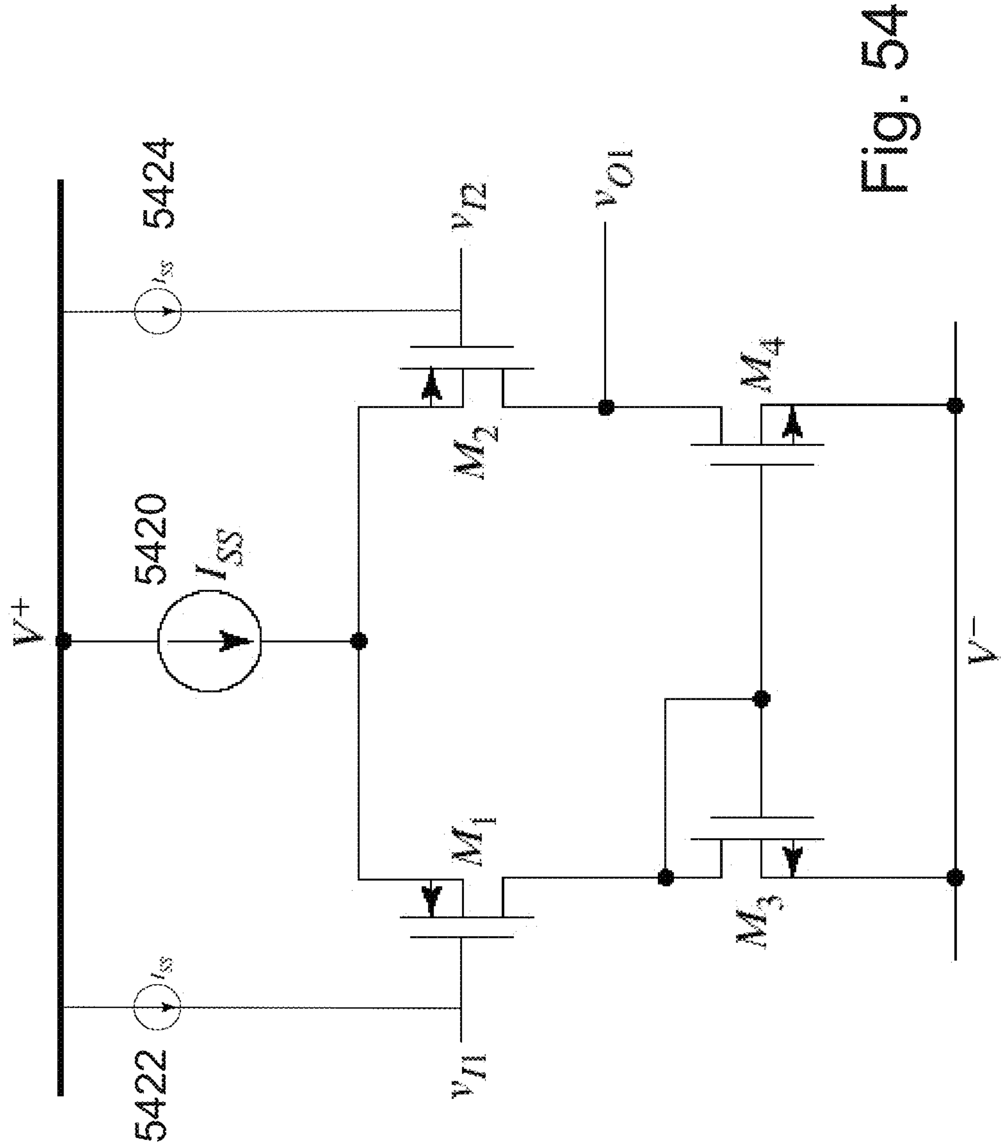
FIG. 54 is an example illustration of an alternative circuit for the complementing signal reconstruction utilizing a differential amplifier circuit.

FIG. 54 illustrates an alternative circuit for the complementing signal reconstruction utilizing a differential amplifier circuit instead of a half-latch. Such a differential amplifier could provide faster signal reconstruction due to the high gain of such circuit. A differential amplifier could consume higher power as it operates in the active mode of the transistor while a half latch only uses active mode in transition phase. An alternative approach to reduce this operating mode power is to activate the circuit by activating its main current source 5420 only when the signal needs to be detected using a clock signal. Optional tiny current sources first source 5422 and second source 5424 could be used to lightly pull up the input signal $V_{I1}$, $V_{I2}$, for the resistivity input signals. Such a differential amplifier could be used for signal reconstruction for logic output and routing output throughout this application and inventions herein and could help reduce the overall logic signal swing (Vdd−Vss) to reduce power and thermal loads or improve operating speed. An artisan in the art would know how to implement differential amplifier herein throughout as an alternative toa half latch reconstruction circuit.

Figure 55A:
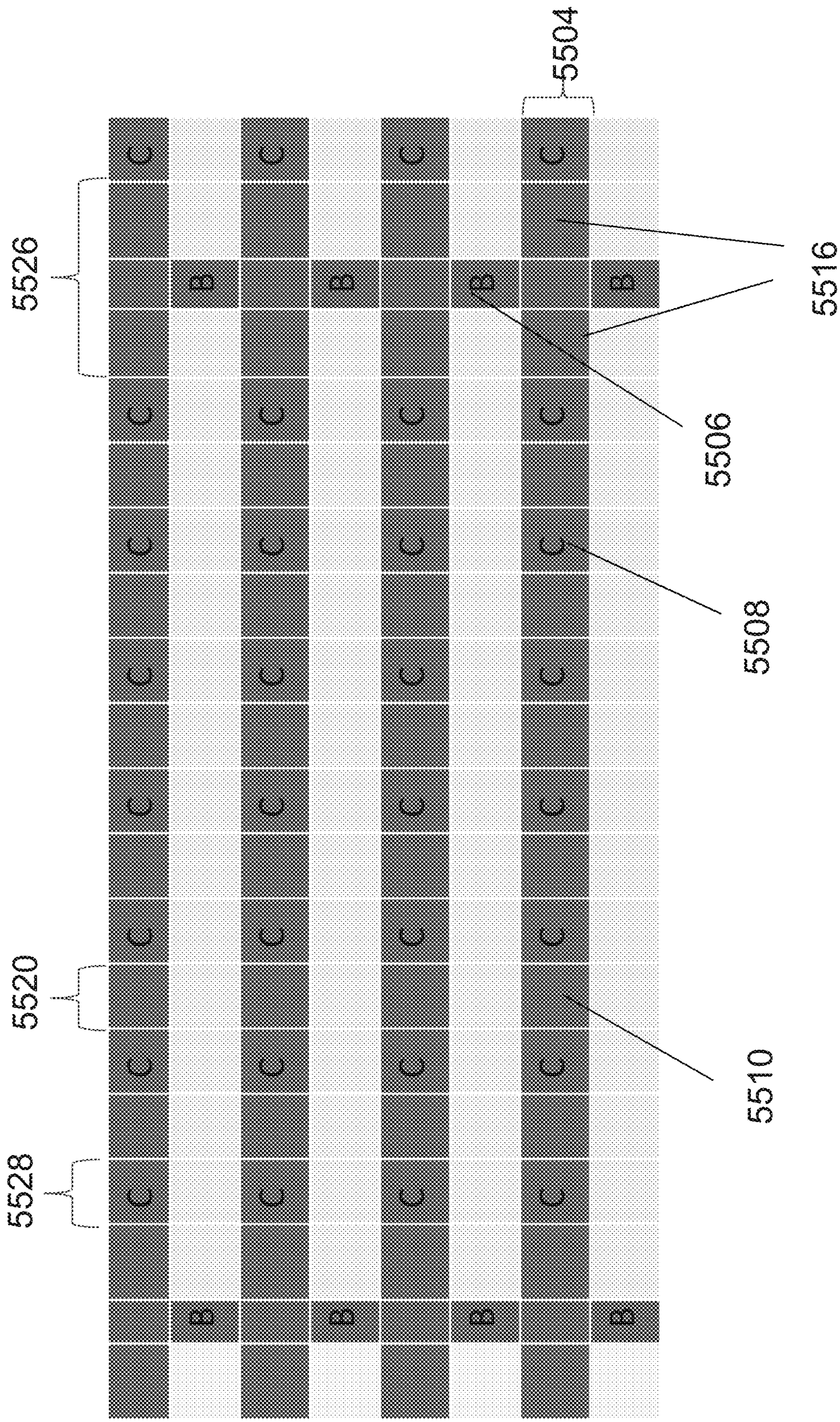
FIG. 55A is an example illustration of an alternative structure of the 3D NOR fabric which could leave some bridges between the ridges to support full three dimensional routing within the 3D NOR fabric.

An alternative structure of the 3D NOR fabric could leave some bridges between the ridges to support full three dimensional routing within the 3D NOR fabric. We can call this variation of the fabric 3D NOR-B. It starts with modifying the ridge 5504 forming a pattern by leaving periodic bridges 5506, of N+ silicon for example, as is illustrated by top view FIG. 55A.

Figure 55B:
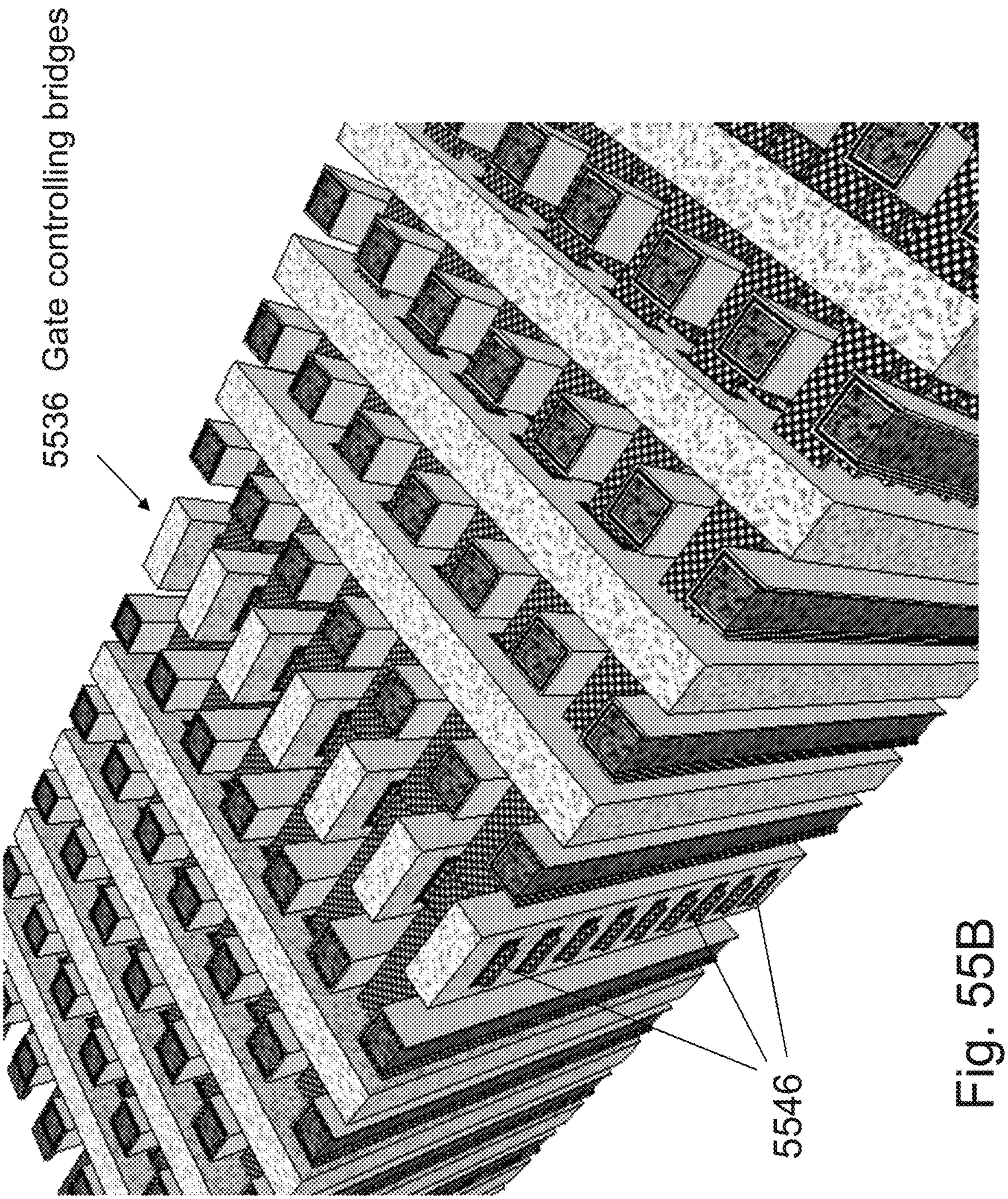
FIG. 55B is an example illustration of an exemplary structure in 3D perspective showing JLT bridges of FIG. 55A.

FIG. 55B illustrates an exemplary structure in 3D perspective showing JLT bridges 5546 controlled by their gates 5536.

The followings steps would be similar to those presented in respect to FIG. 8A to FIG. 8F and then FIG. 10 to FIG. 13B. Accordingly the channel column 5508 (marked by "C" on FIG. 55A) 5528 would be covered and controlled by first O/N/O and first gates (WL2, WL3, WL5, WL6, WL8, WL9, . . . ) while the in-between 5510, 5520, 5526, including the bridges (marked by "B" on FIG. 55A) would be covered and controlled by second O/N/O and second gates (WL1, WL4, WL7, . . . ). Or in an additional connectivity application the S/D regions between the bridges 5506 and the channel column 5516 could be designed to not be junctionless transistors either by leaving thicker than 20 nm gox, having them extra doped, removing enough of the second gate material over them The bridges would then be a programmable connection between adjacent ridge S/D lines. And accordingly allow routing signal between ridges.

An alternative for the use of the 3D NOR is to use 3D NAND fabric such as the one illustrated in FIG. 7G or as known in the art as 3D-NAND or V-NAND, in order to form a programmable 3D NAND fabric. A LUT circuit like the one illustrated in FIG. 47 rotated by 90 degrees could be implemented using word lines for the inputs (A, AN, B, BN, C, CN, D, DN) and the bit line as outputs. In such use the gates need to be connected for dual function—programming and LUT use, In the LUT use the gates are kept independent for each ridge so each ridge could form its own LUT logic. And simlarly are the outputs of each ridge which for memory use can connected together with the bit lines. An additional challenge is the need to add stair cases for each independent LUT, making the 3D-NAND less convenient for programmable logic.

Figure 56A:
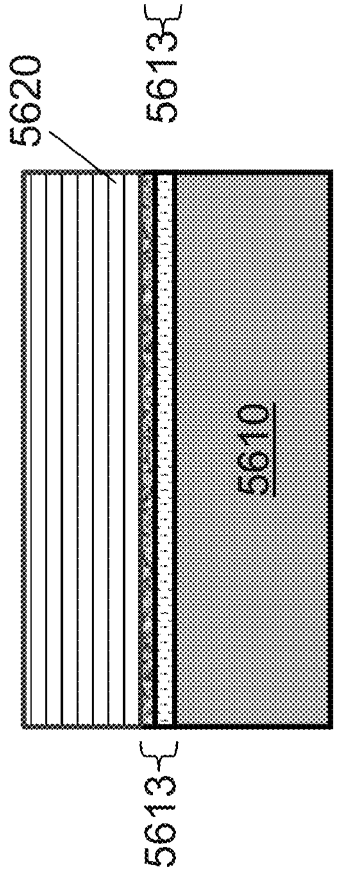
FIGS. 56A-56G are example illustrations of a review the system process flow.

Let's review the system process flow. It starts as was discussed in respect to FIG. 1A-1B. FIG. 56A illustrates such starting step having a multilayer (such as N+, P, N+, P, . . . ) structure 5620 over a cut layers 5613 over a carrier 5610.

Figure 56B:
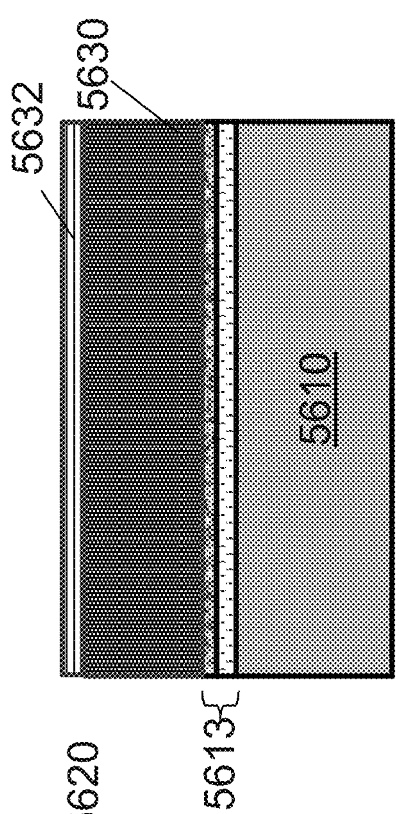

FIG. 56B illustrates the processing of the multilayer structure 5620 to 3D NOR structure 5630 and adding on the word-lines 5632.

Figure 56C:
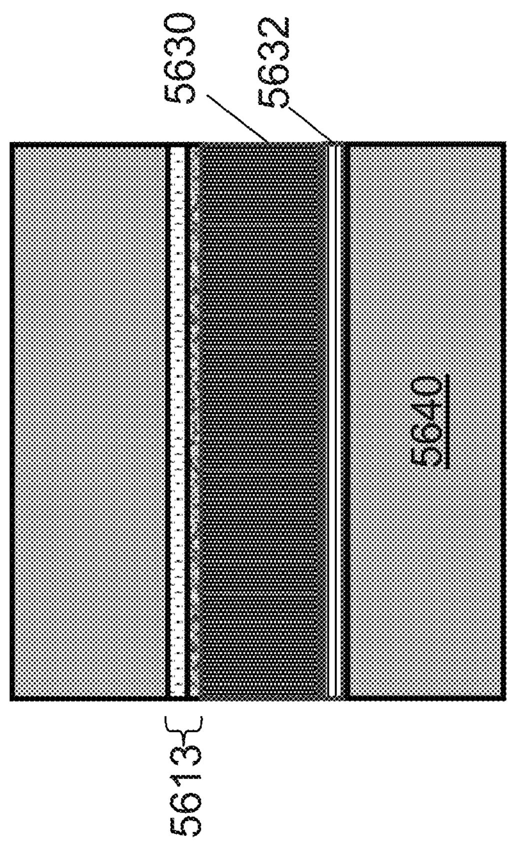

FIG. 56C illustrates flipping the structure on top of a new carrier 5640.

Figure 56D:
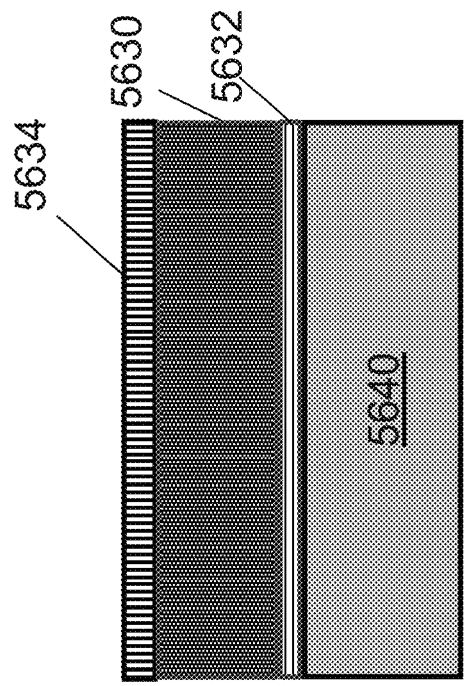
Figure 56F:
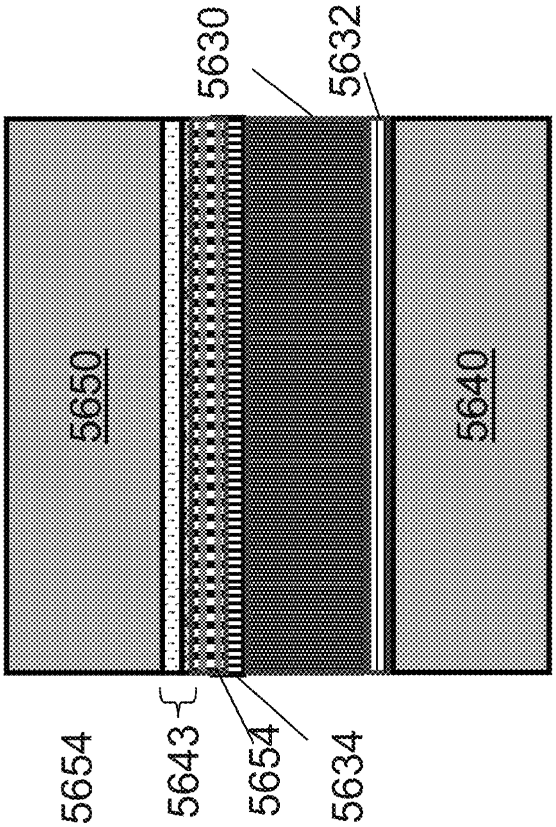
Figure 56E:
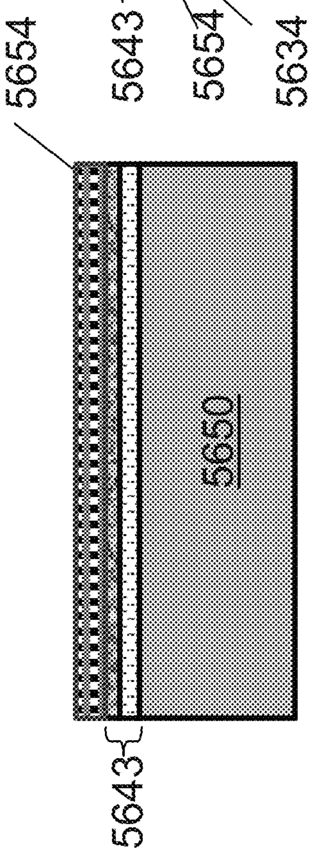

FIG. 56D illustrates processing the back of the 3D-NOR fabric to add the connection of logic gates (LUT, . . . ) 5634. This could include adding also all transistors circuits needed for the logic gates and for the peripherals circuits. Yet, an alternative is to do those additional circuits on another side wafer 5654 illustrated in FIG. 56E on cut layers 5643 over substrate 5650. This side wafer cut than flipped and precisely bonded to the 'already flipped' 3D NOR fabric as is illustrated in FIG. 56F.

Figure 56G:
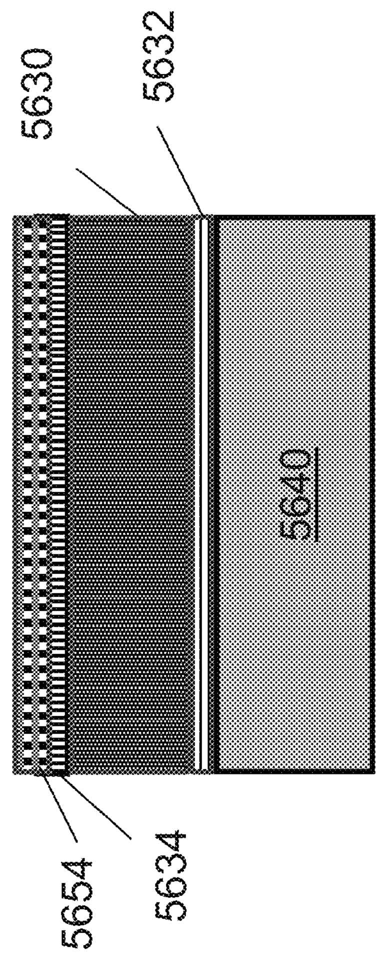

The substrate 5650 could then be removed as illustrated in FIG. 56G. Then the circuits on 5654 could be connected to the connection of logic gates (LUT, . . . ) 5634 using the smart alignment technique—"smart alignment"—such as presented in U.S. Pat. No. 7,986,042, incorporated herein by reference as relate to FIGS. 73, 74, 75, 77, 79.

This side wafer approach allow the decoupling of the 3D NOR fabrication process from the fabrication of the support circuits. It could allow using a relatively less dense process for generic 3D NOR and an advanced high density process for the support circuits. For example, if the rule used for 3D NOR uses a minimum size of $F_1$ and accordingly the contact area for complementing LUT 4~80-100 $F_1^2$. The basic circuits to support such LUT 4 structure are five of the half latch (on for each input signal A, B, C, D and one as just signal re-buffer) and drive illustrated in FIG. 53B and periodically a Flip-Flop. It could be estimated that this minimum circuit could be placed in an area of 2000-3000 $F_2^2$. So a programmable fabric could be built with $F_1=F_2$, and then improving the logic density by using more advanced node for the support circuits ½*$F_1=F_2$, and then improving further the logic density by using more advanced node for the support circuits ¼*$F_1=F_2$, and so forth.

In some applications it might be desired to allocate specific gates in the 3D-NOR fabric for logic application. This could allow gates used to control active transistors of the LUT to be with higher speed capability by using thin oxide for those instead of O/N/O. As an example some of the gates connected in FIG. 13A to word-lines such as WL1, WL5, WL8, . . . could be designated for LUT application and would be formed with a thin oxide instead of O/N/O and would not be connected to the respective WL1, WL5, WL8, . . . . These gates would be connected to the programmable logic circuit after the 3D NOR has been flipped. In such case the programmable logic fabric could use the structure of FIG. 49B as the building block.

Figure 57A:
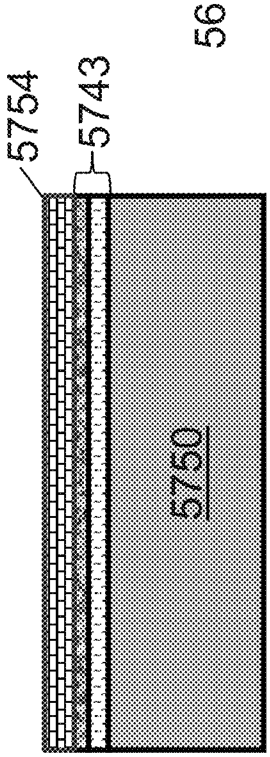
FIGS. 57A-57D are example illustrations of a stack structure variations.
Figure 57B:
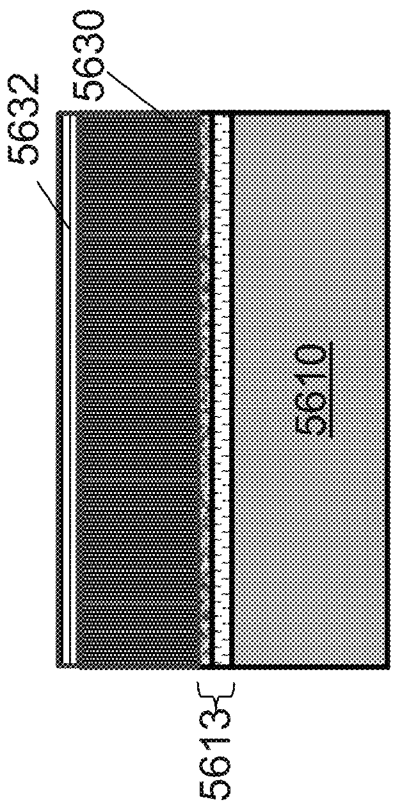
Figure 57C:
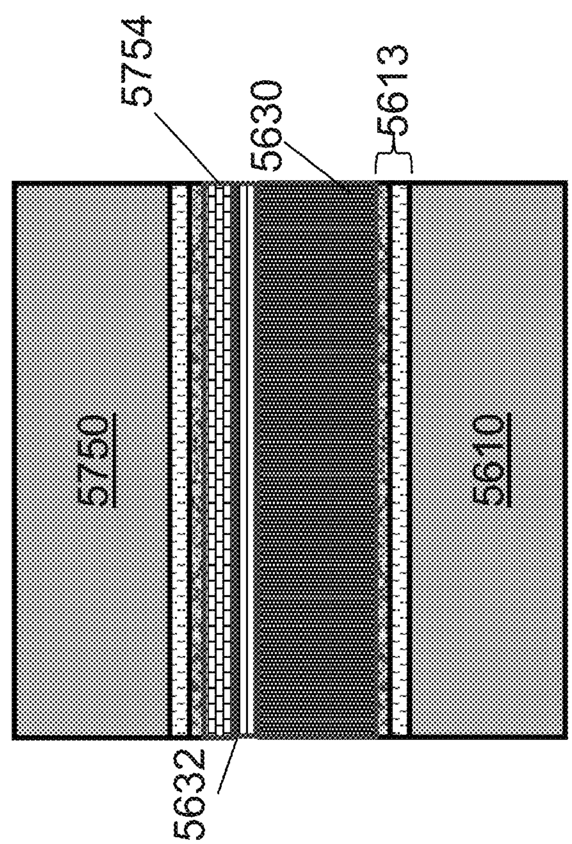
Figure 57D:
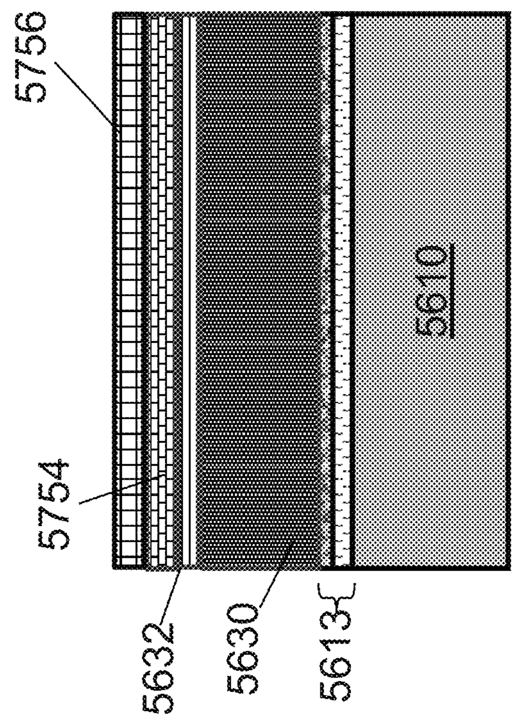

In some applications it might be desired to add on the peripheral circuits on top of the word-lines fabric 5632 using similar concept of layer transfer and "smart-alignment". FIG. 57A illustrates peripheral circuits 5754 built over cut structure 5743 over carrier 5750. FIG. 57B illustrates the 3D NOR fabric of FIG. 56B. FIG. 57C illustrates flipping and bonding the wafer of the peripherals circuits of FIG. 57A on top of the 3D NOR fabric of FIG. 56B. FIG. 57D illustrates the structure after removal of the carrier 5750 and cleaning the cut structure 5743 residues, and then utilizing the "smart-alignment" adding connections 5756 to connect the peripheral circuits 5754 to the word-lines and the bit-lines of the 3D NOR fabric.

An optional partition of the 3D-NOR fabric, to a multiplicity of units, was previously presented in relation to FIG. 5A-FIG. 6B. In such alternative it could be desired to process staircase connections to the bit-lines first. It could also be preferred to form through the 3D-NOR fabric a multiplicity of through-fabric vias which could be used later to connect between the logic circuits 5654 and the peripheral circuits 5754. Then transfer the peripheral circuits on top. This unit's formation could be done so each unit has its own stair-case, and accordingly, its own word-lines and bit-lines so it is completely independent and accordingly each unit would be able to read write or erase the portion of memory cells under its control independent from other units. The through fabric vias could enable the logic fabric to control independently each unit to provide a multi-core type programmable fabric. Buses could be established on both sides to allow data to be transferred between cores and to external devices. Other layers could be added in to form even more complex systems with the option of of adding in a range of communication circuits such as SER-DES and/or wireless communication with external devices. In this way this additional layer could be tested before integrating them with the 3D-NOR could fabric, and various redundancy techniques could be used with such 3D systems to provide better yield and field repair of the 3D programmable system.

The formation of the 3D NOR logic fabric as an array of semi-independent units fits well with the ideas of continuous array and 3D configurable FPGAs as presented in U.S. Pat.

Nos. 8,384,426 and 8,115,511 incorporated herein by reference, and related to FIG. 7-13, FIG. 36-38, and FIG. 41.

Figure 58A:
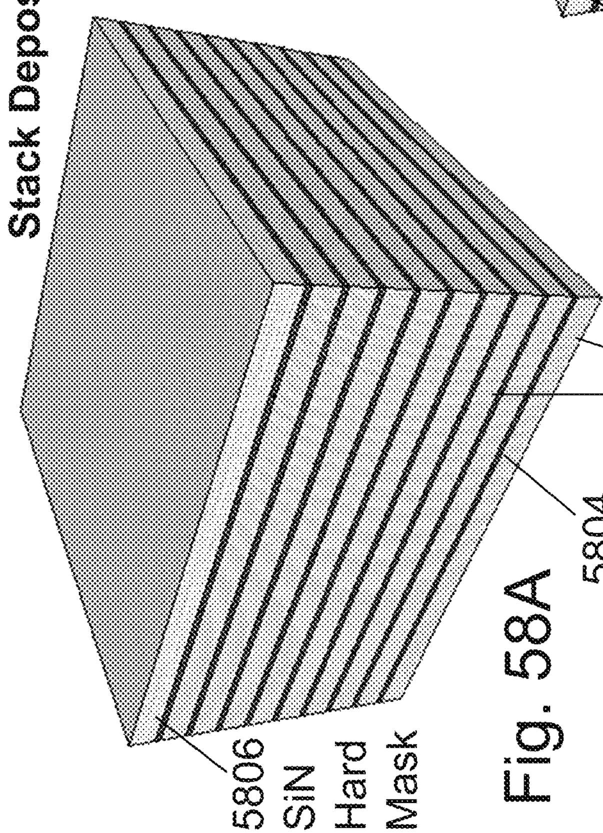
FIGS. 58A-58I are example illustrations of a process flow for forming a 3D-NOR design which supports junctionless transistors on the S/D lines.
Figure 58B:
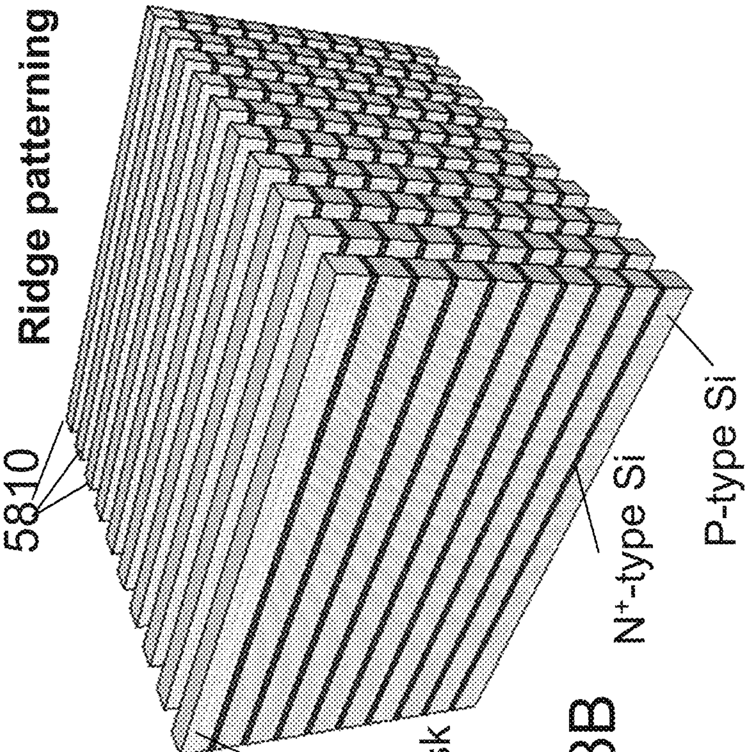

FIG. 58A illustrates an alternative process flow for forming a 3D-NOR design which supports junctionless transistors on the S/D lines. The illustrated stack is designed wherein N+ type layer 5804 may be thinner than about 20 nm while the P type layer 5802 could be made thicker such as about 40 nm or even thicker, for example, 2×, 3×, 4∴, and 5× the thickness of N+ type layer 5804 and then covering the stack with hard mask material 5806, such as, for example, Silicon Nitride or DLC, for the following patterning step. FIG. 58B illustrates the structure after deep trench etching forming ridges 5810 with deep valleys in between.

Figure 58C:
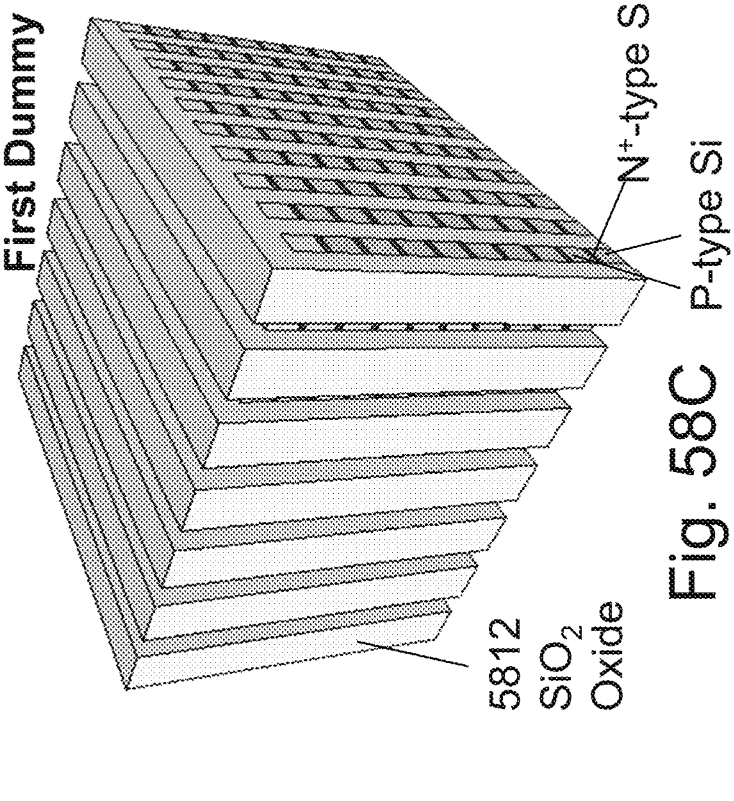

FIG. 58C illustrates the structure after deposition of a first dummy oxide and patterning/etching/forming vertical strips 5812 of the first dummy oxide. The oxides of this structure may be other dielectrics given various engineering, design, process integration and cost considerations.

Figure 58D:
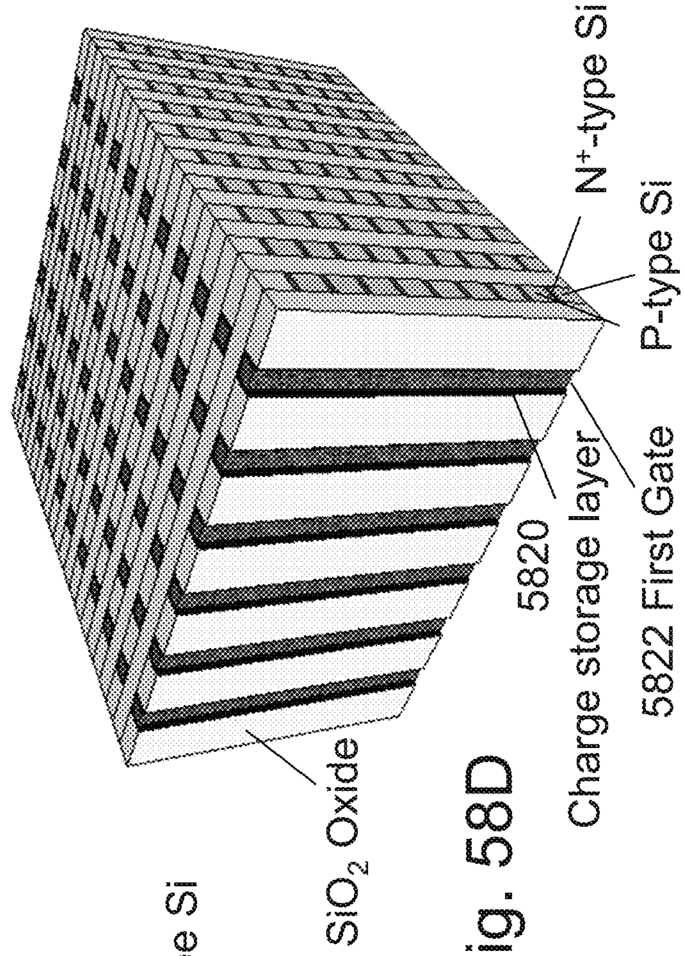

FIG. 58D illustrates the structure after depositing, using process such as ALD, of the first charge trap, first O/N/O 5820, covered by first gate material 5822, followed by chemical mechanical polishing the first gate material 5822 until the first gate material 5582 becomes separated by hard mask 5806. Thereby, the first gate materials 5582 are vertically arranged and independently controlled.

Figure 58E:
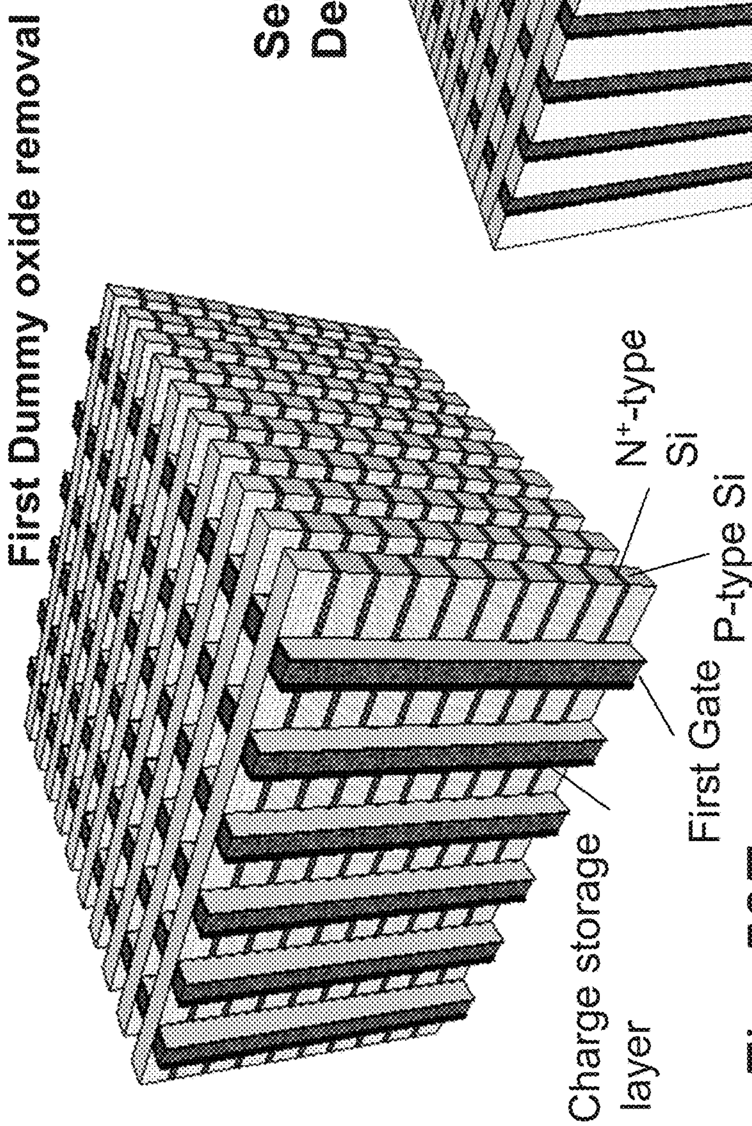

FIG. 58E illustrates the structure after removing the first dummy oxide.

Figure 58F:
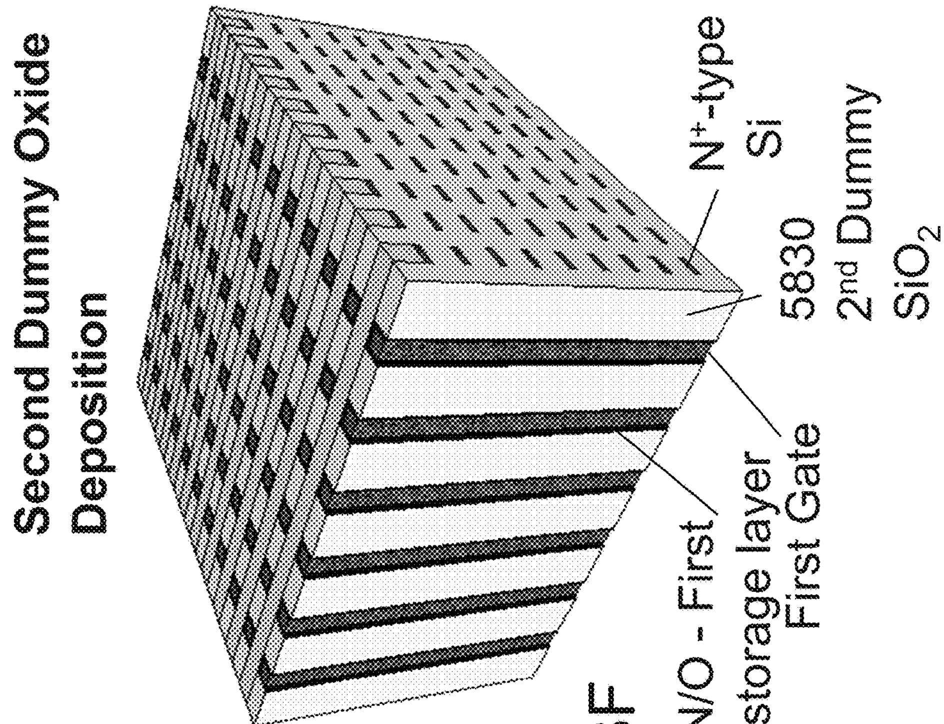

FIG. 58F illustrates the structure after filling in the structure with a second dummy silicon oxide 5830. Some of these filling steps may include CMP or other top layer removal of excess material.

Figure 58G:
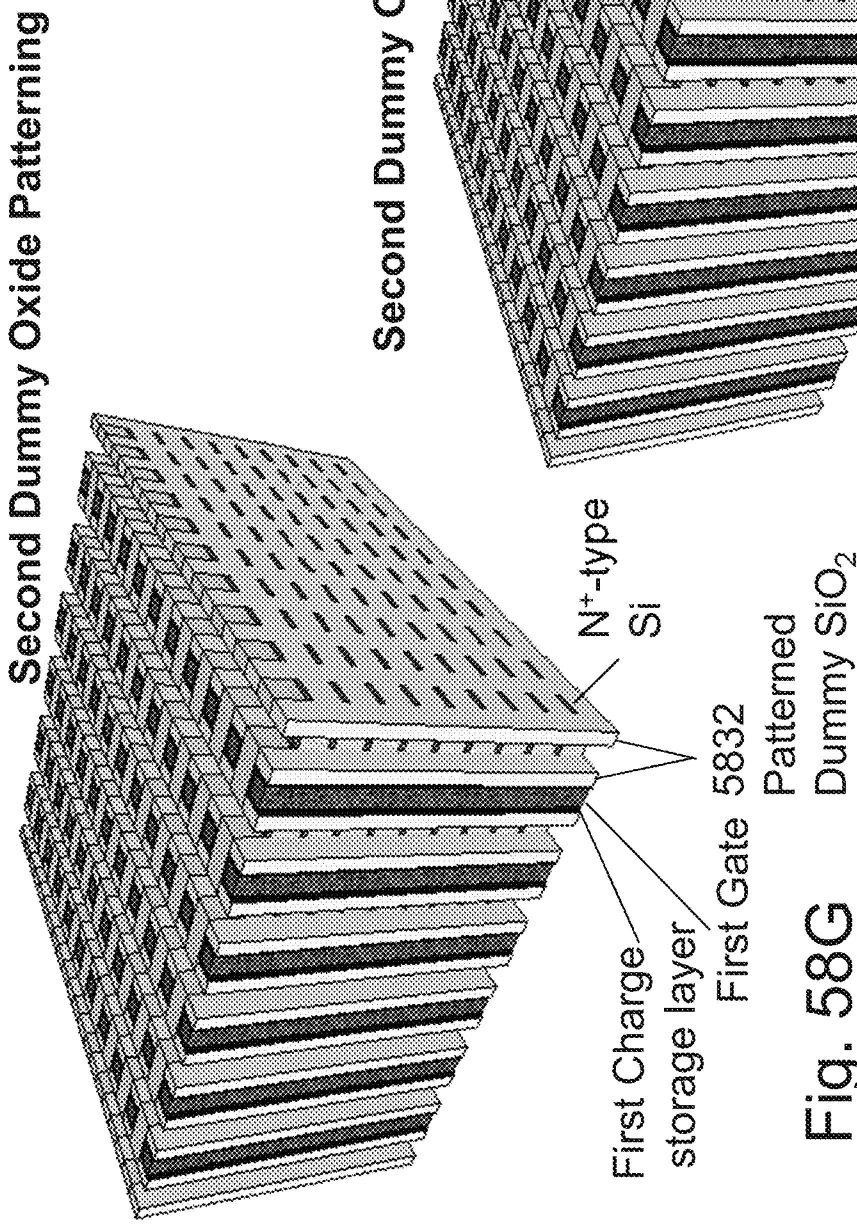

FIG. 58G illustrates the structure after patterning the second dummy oxide 5832. This second oxide could serve as a spacer to protect first O/N/O 5820 from accidental write due to a second gate, which may be subsequently formed.

Figure 58H:
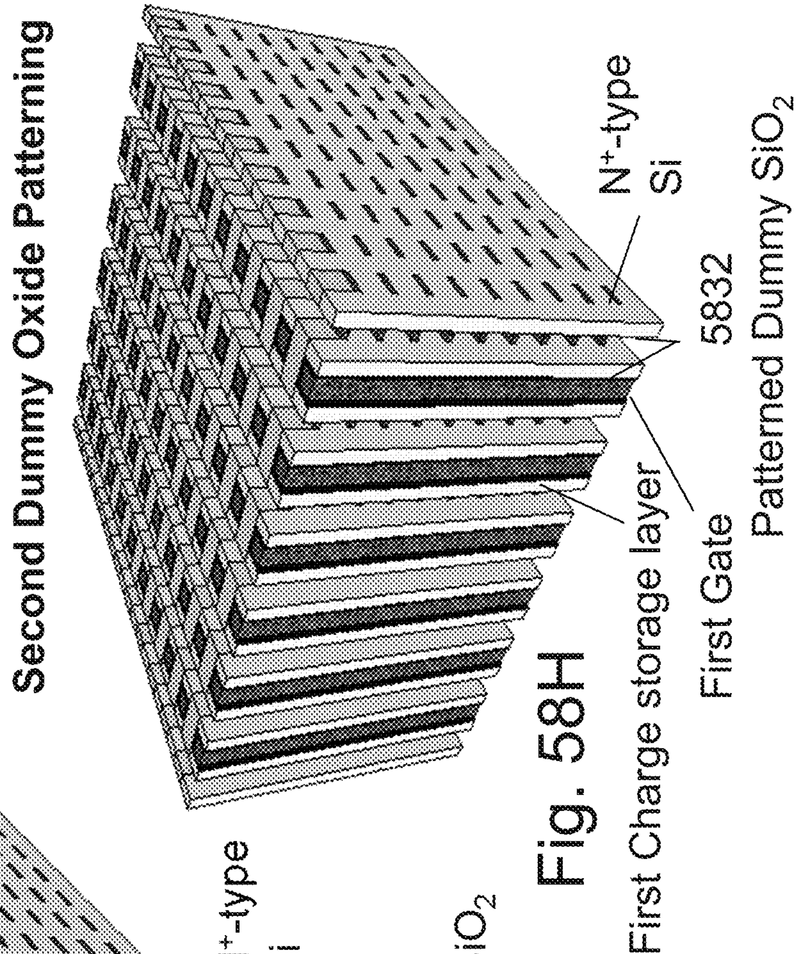

FIG. 58H illustrates the structure after selective etch of the uncovered P regions.

Alternatively, the structure of uncovered P region can be selectively removed before the second dummy oxide deposition and after the first dummy oxide removal. As a result, the second oxide could serve as a spacer to not only protect first O/N/O 5820 from accidental write due to a second gate but much more the second oxide could serve as a spacer in the formation of parasitic sidewall vertical NPN transistors gated by the second gate that will be subsequently formed.

Figure 58I:
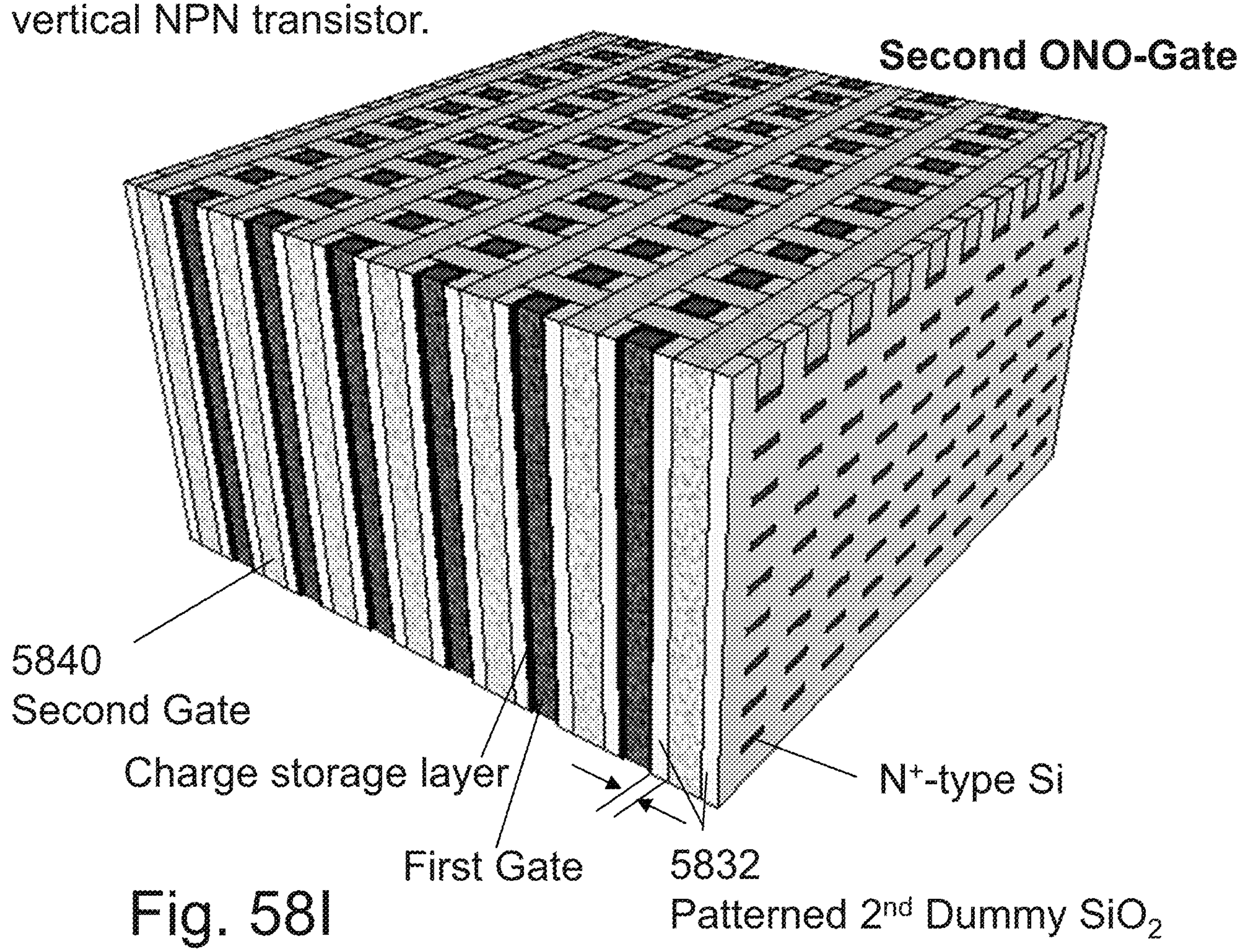

FIG. 58I illustrates the structure after depositing, using process such as ALD, the second charge trap—second O/N/O and covering it with the second gate material 5840.

Figure 59A:
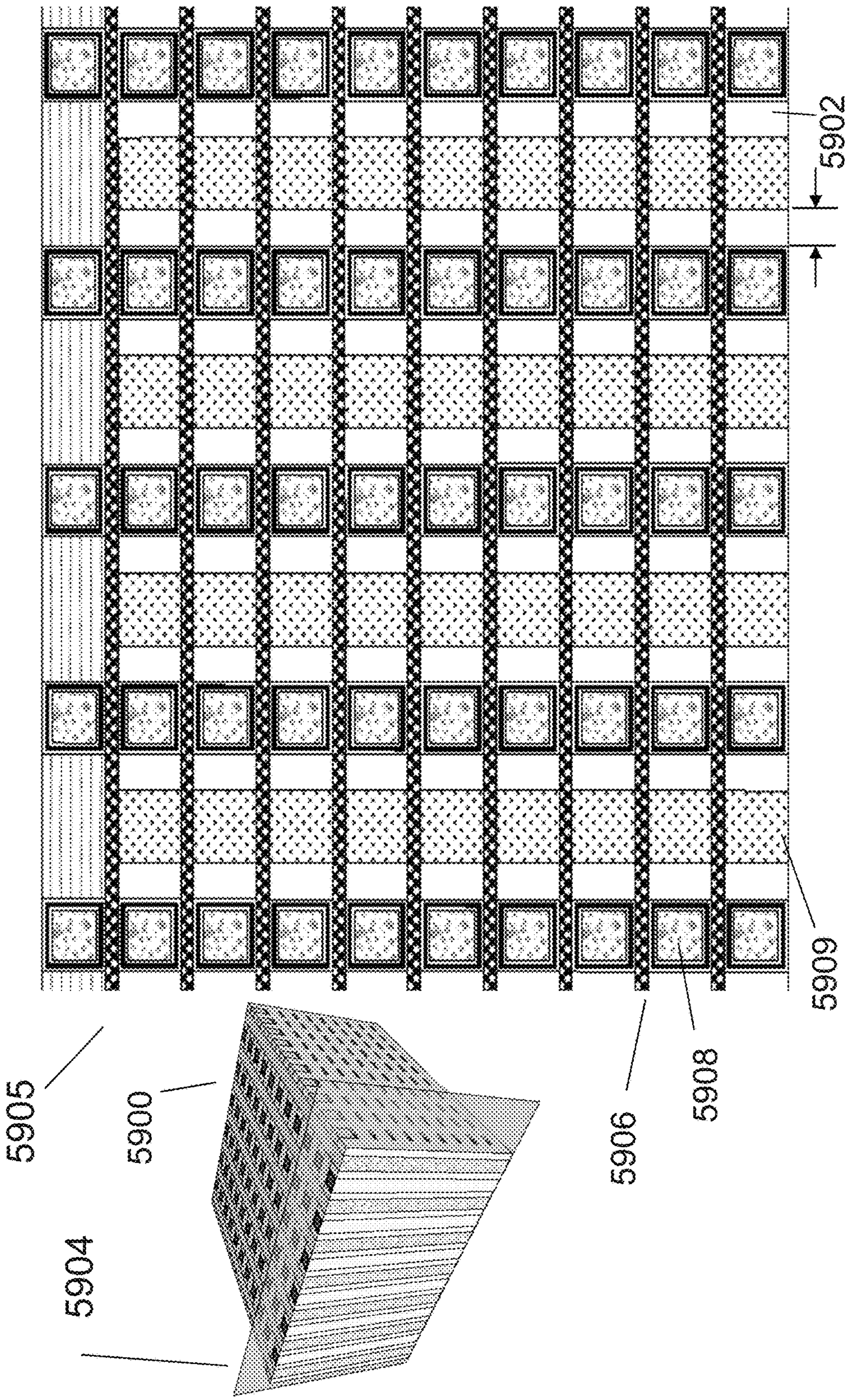
FIGS. 59A-59D are example illustrations of cut views of the structures of FIG. 58I.

FIG. 59A illustrates a cut view 5905 of the structure 5900 along the S/D lines and through the S/D lines as indicated in the side illustration first plane 5904 in reference to the structure 5900. Structure 5900 is an illustration of the structure of FIG. 58I. The second gate 5908 will control the junction-less transistor embedded in the S/D lines 5906. The second dummy oxide provides spacing 5902 to the P regions channel 5909, so the second gate would not substantially affect the vertical NPN transistor between the S/D lines.

Figure 59B:
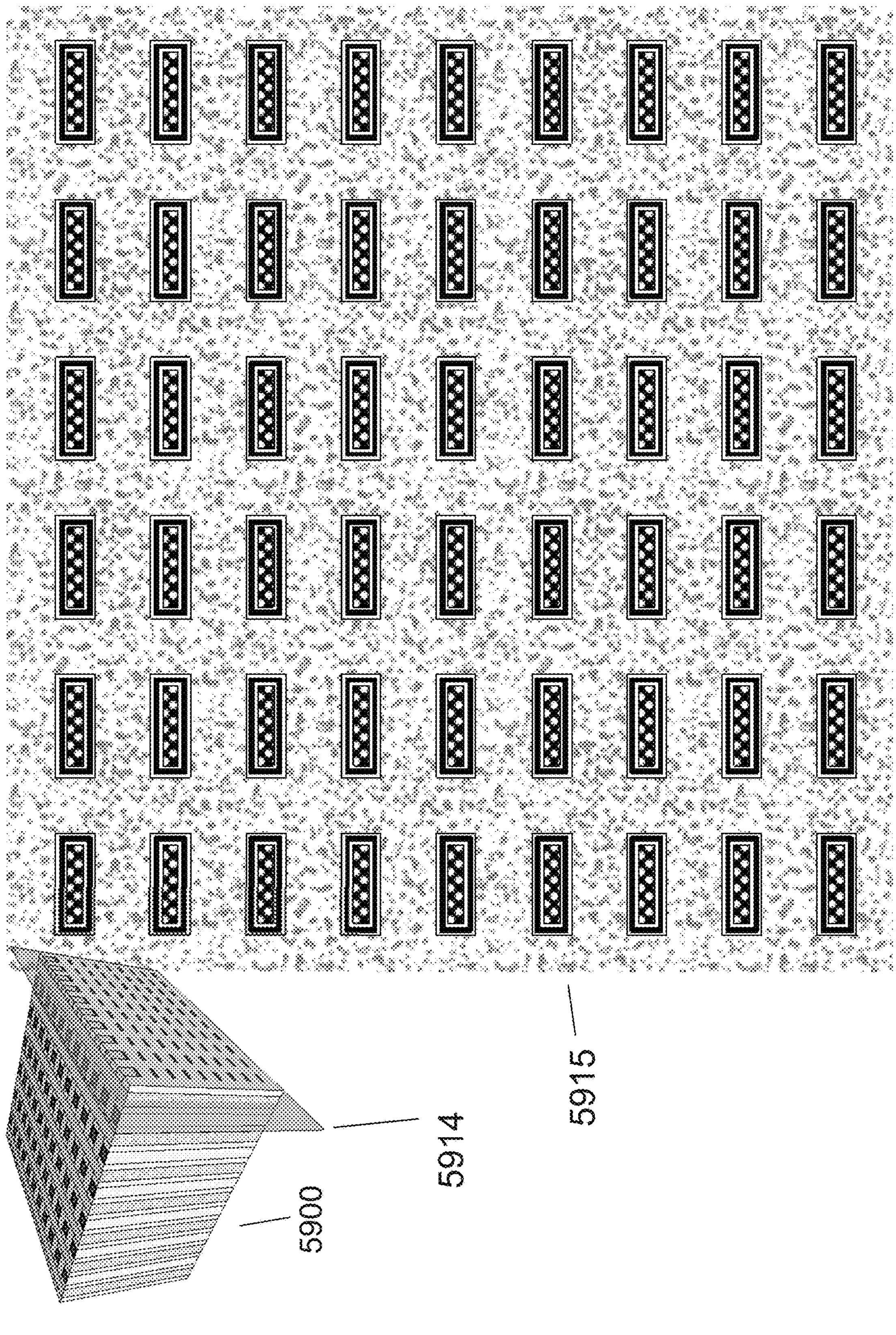

FIG. 59B illustrates a cut view 5915 of the structure along the word-lines vertically to the S/D lines through the second gate as indicated in the side illustrations second plane 5914 in reference to the structure 5900.

Figure 59C:
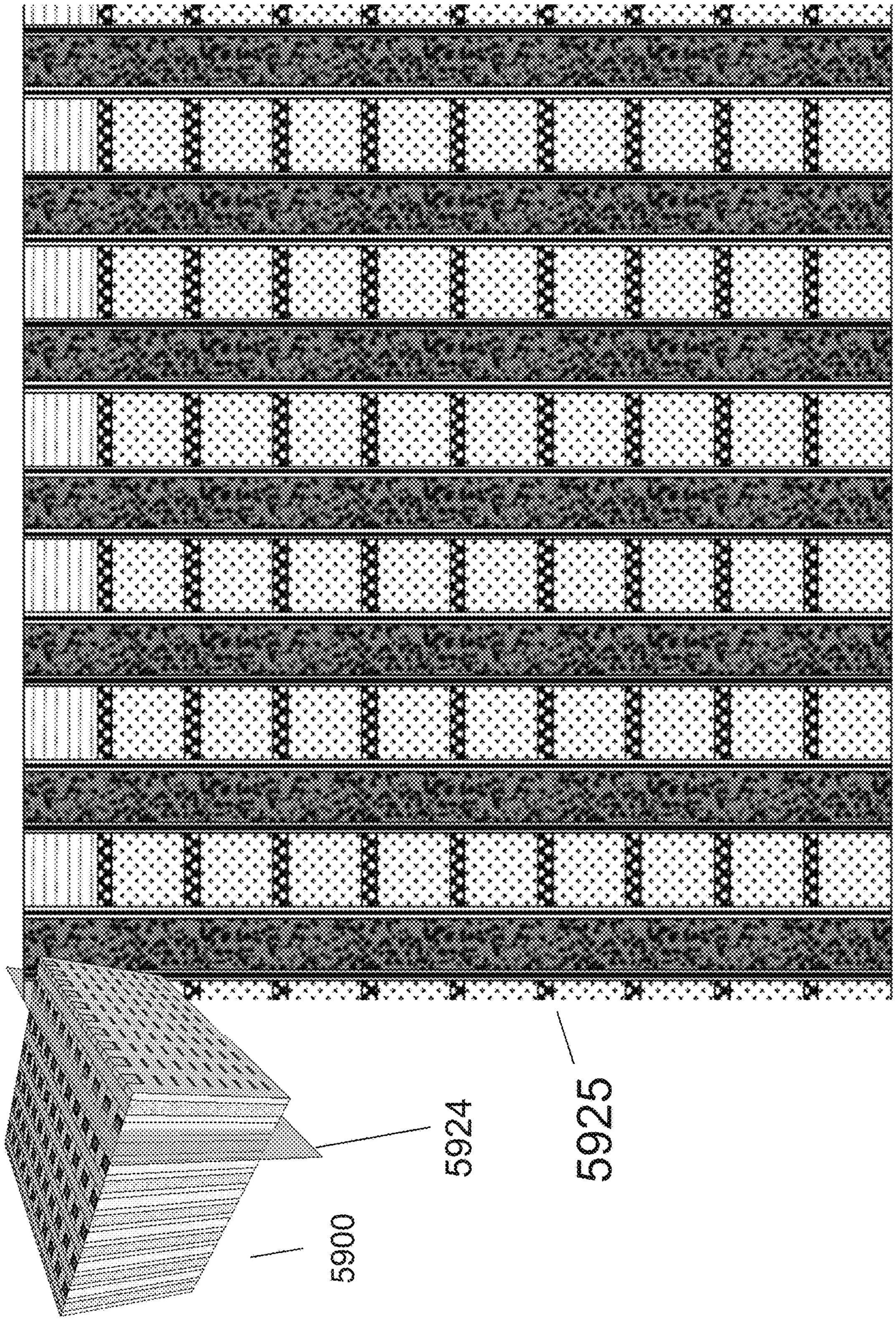

FIG. 59C illustrates a cut view 5925 of the structure along the word-lines vertically to the S/D lines through the first gate as indicated in the side illustrations third plane 5924 in reference to the structure 5900.

Figure 59D:
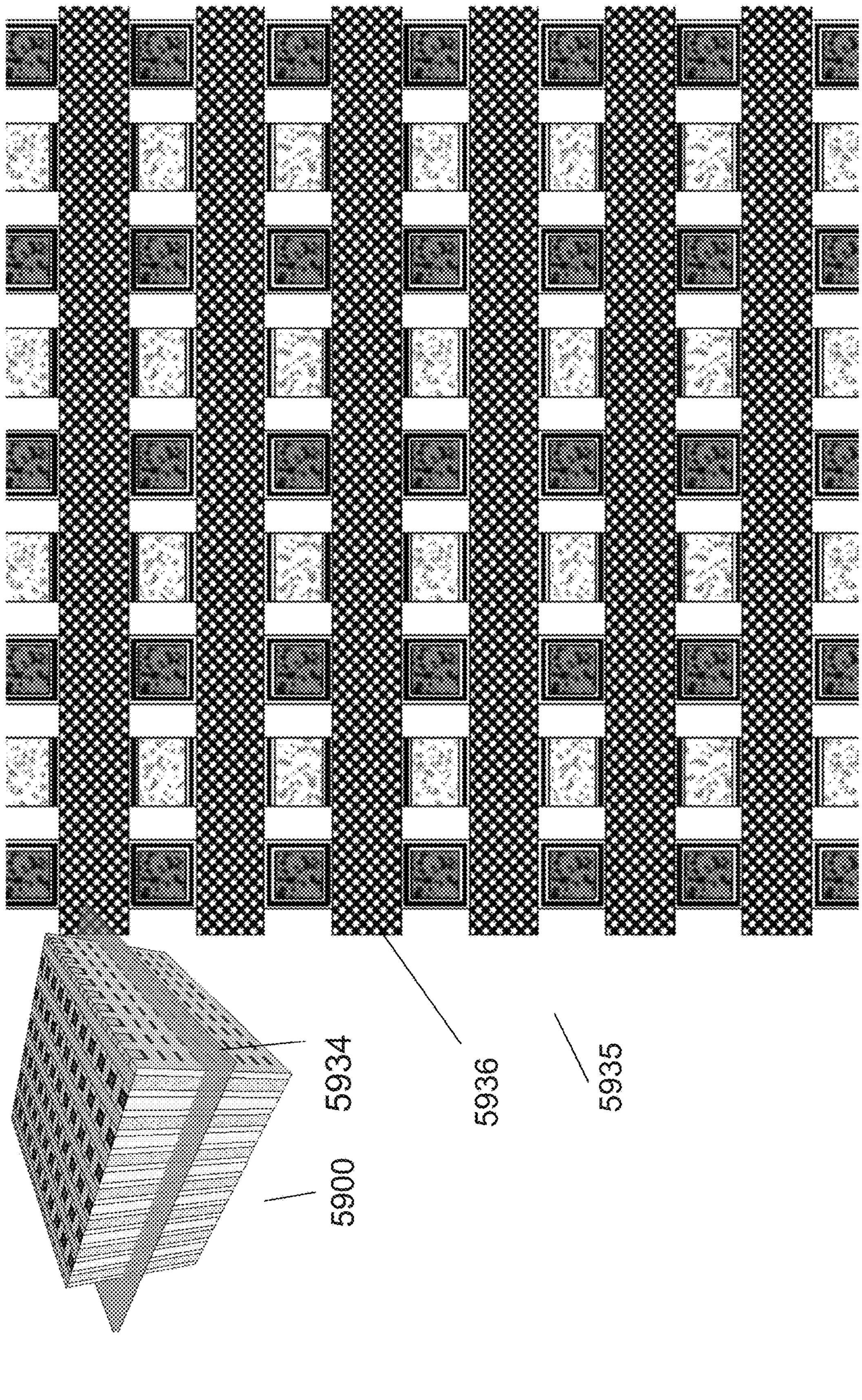

FIG. 59D illustrates a horizontal cut view 5935 of the structure through the S/D lines 5936 along the word-lines vertically to the S/D lines through the first gate as indicated in the side illustrations fourth plane 5934 in reference to the structure 5900.

Figure 60A:
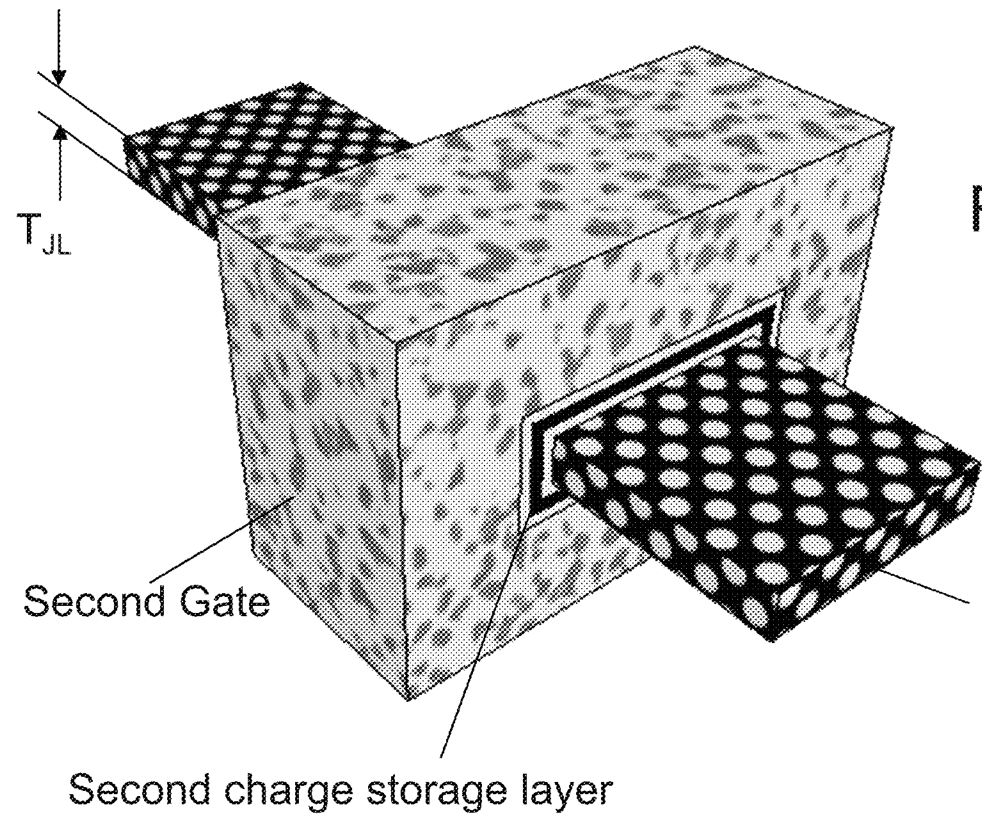
FIGS. 60A-60B are example illustrations of an embedded lateral junctionless transistor and operation modes.

FIG. 60A illustrates one junctionless transistor embedded within the S/D lines with second O/N/O and second gate surrounding it. The S/D line thickness $T_{JL}$ is critical to allow the second gate and/or the charge trap to turn the channel off. To be substantially effective the channel thickness could be made thinner than 20 nm ($T_{JL}$<20 nm).

Figure 60B:
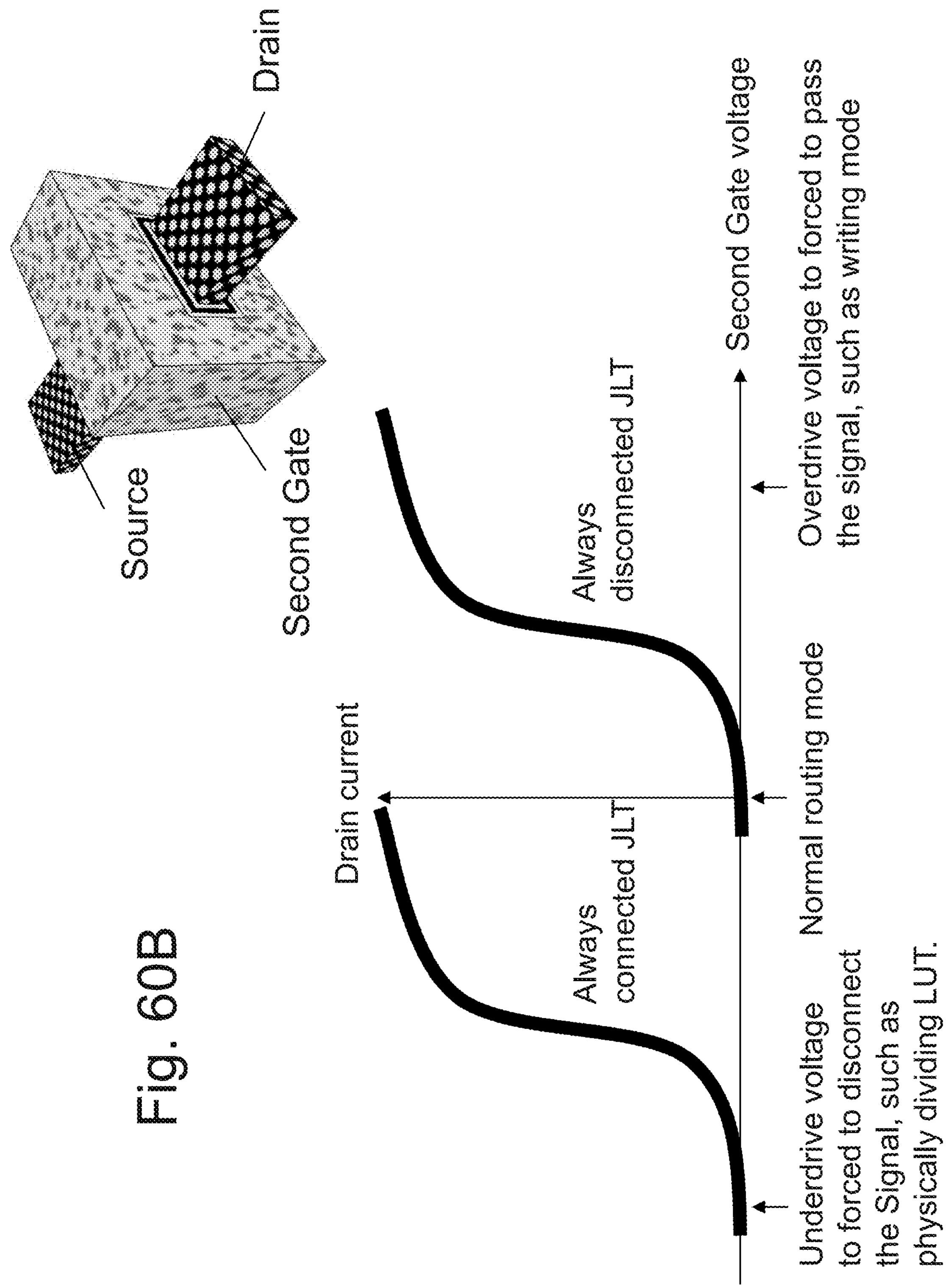

FIG. 60B illustrates the junctionless transistor and the three operating modes with the second gate and the second charge trap—Always Off, Gate controlled, Always On.

Figure 61A:
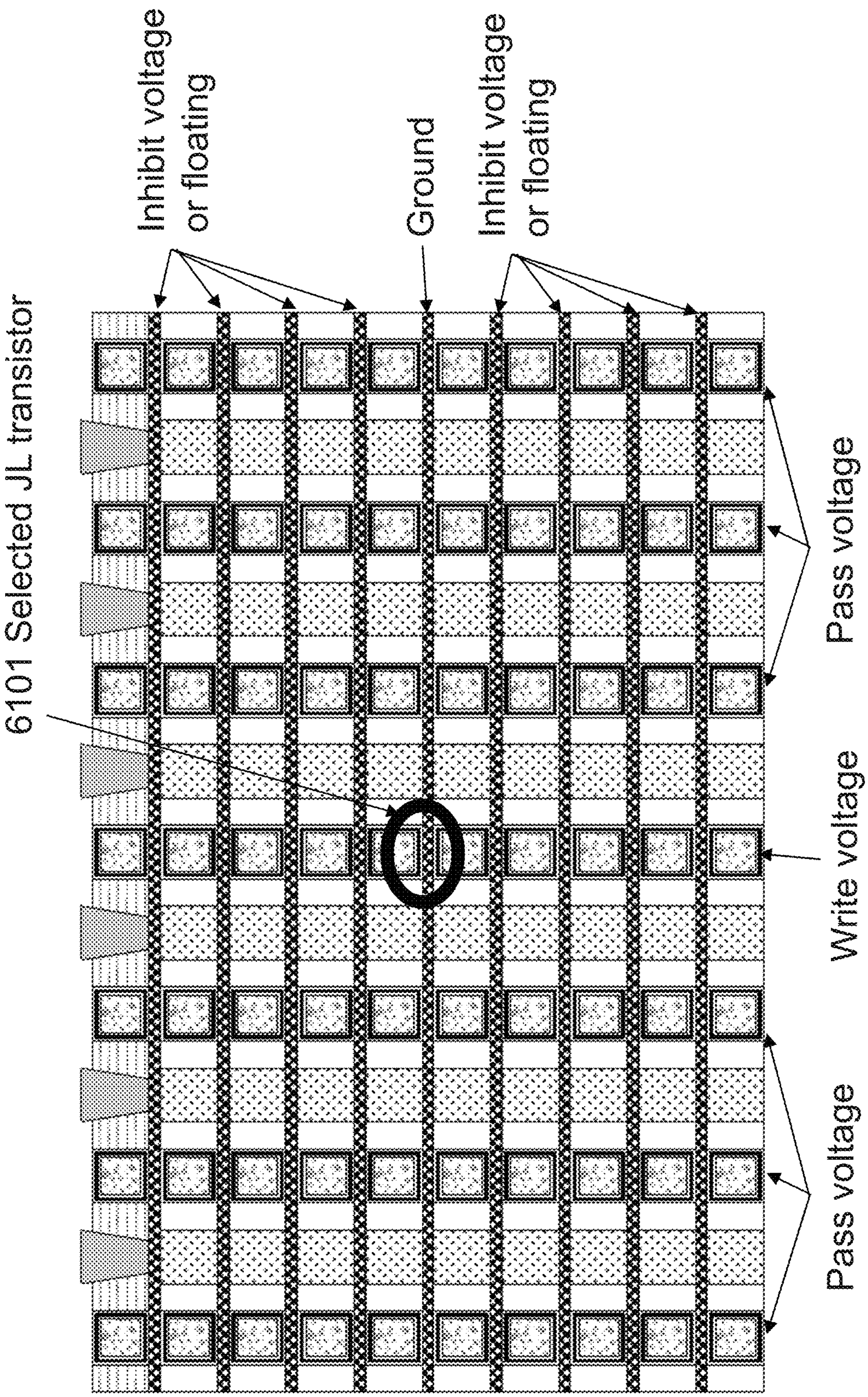

FIG. 61A illustrates the conditions to program a junctionless transistor, such as selected JLT 6101, as presented in the table in FIG. 61B.

The voltages suggested in FIG. 61B are an example, various alternative write conditions can be used, may be similar to the various write schemes available in NAND flash memory.

Figure 62A:
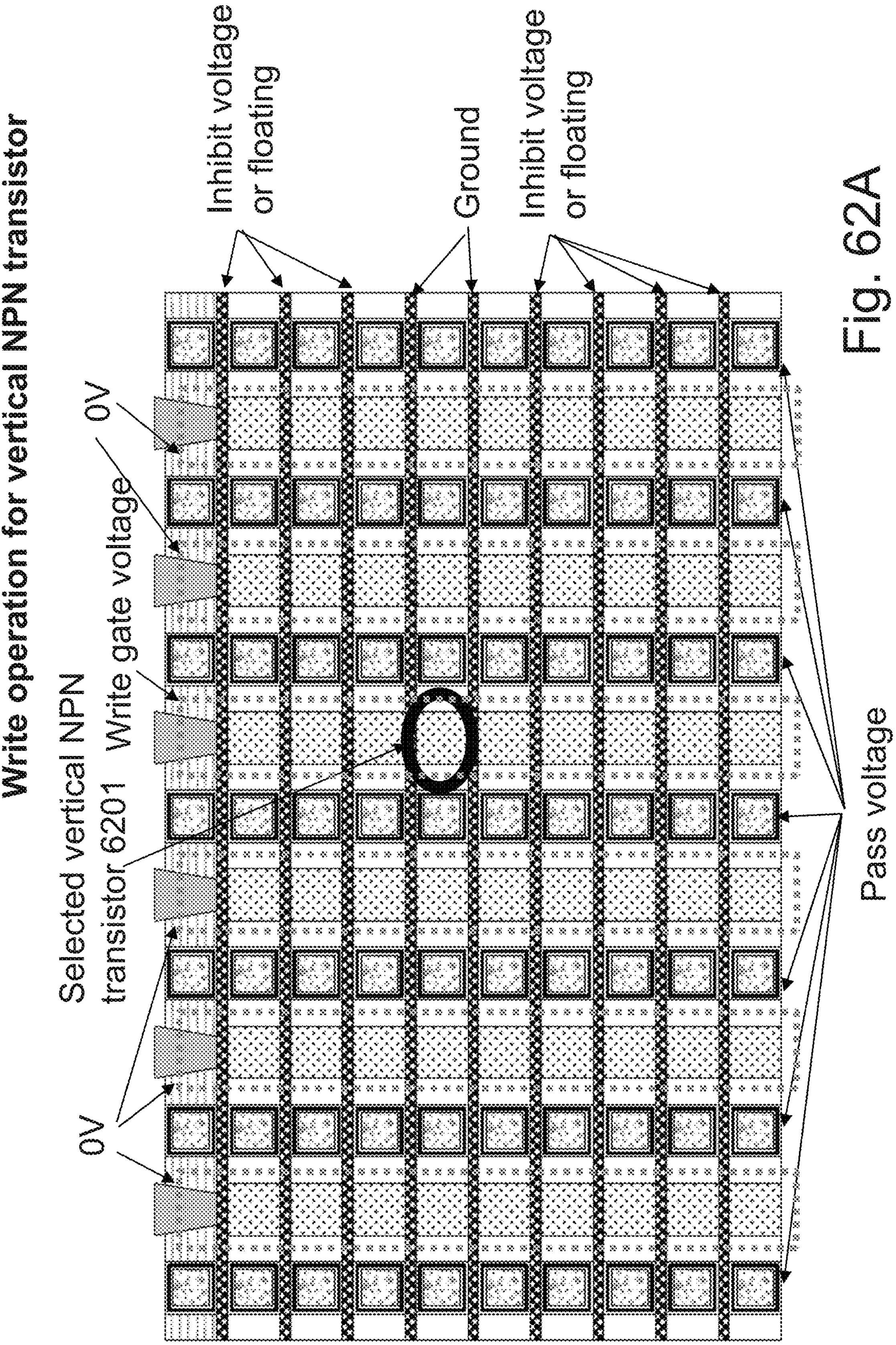

FIG. 62A illustrates the conditions to program a vertical NPN transistor, such as selected vertical NPN transistor 6201, as presented in the table in FIG. 62B.

The voltage suggested in FIG. 62B is an example so the various alternative write conditions can be used like there are various write scheme available in NOR flash memory.

FIG. 63 illustrates an alternative for using the combination of the vertical NPN transistors and horizontal junctionless transistors to form the equivalent of a stair-case per layer connection by programming rather than by process.

Figure 63A:
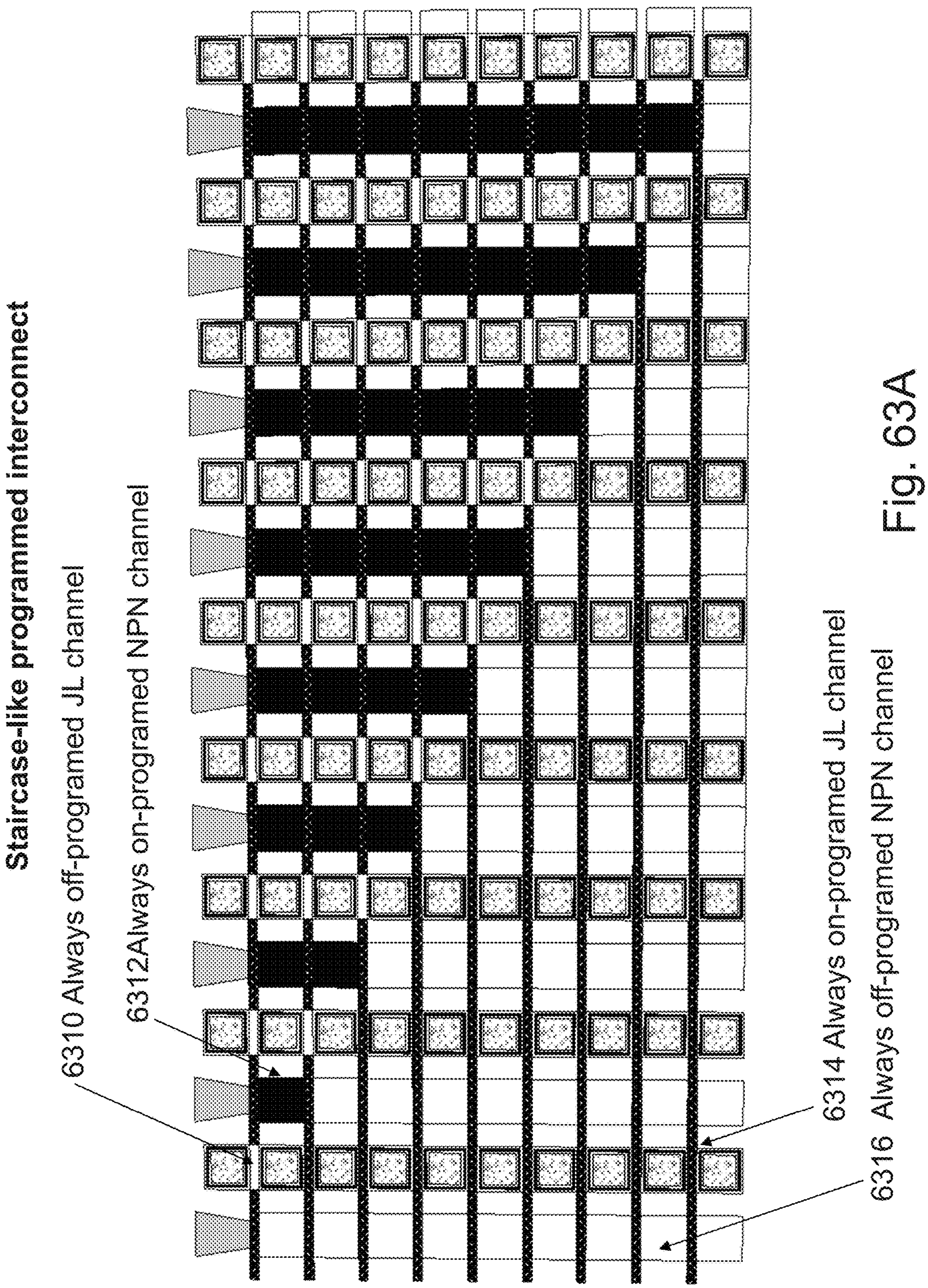
FIGS. 63A-63G are example illustrations of a programmable stair-case per layer connection structure and programmation method.
Figure 63B:
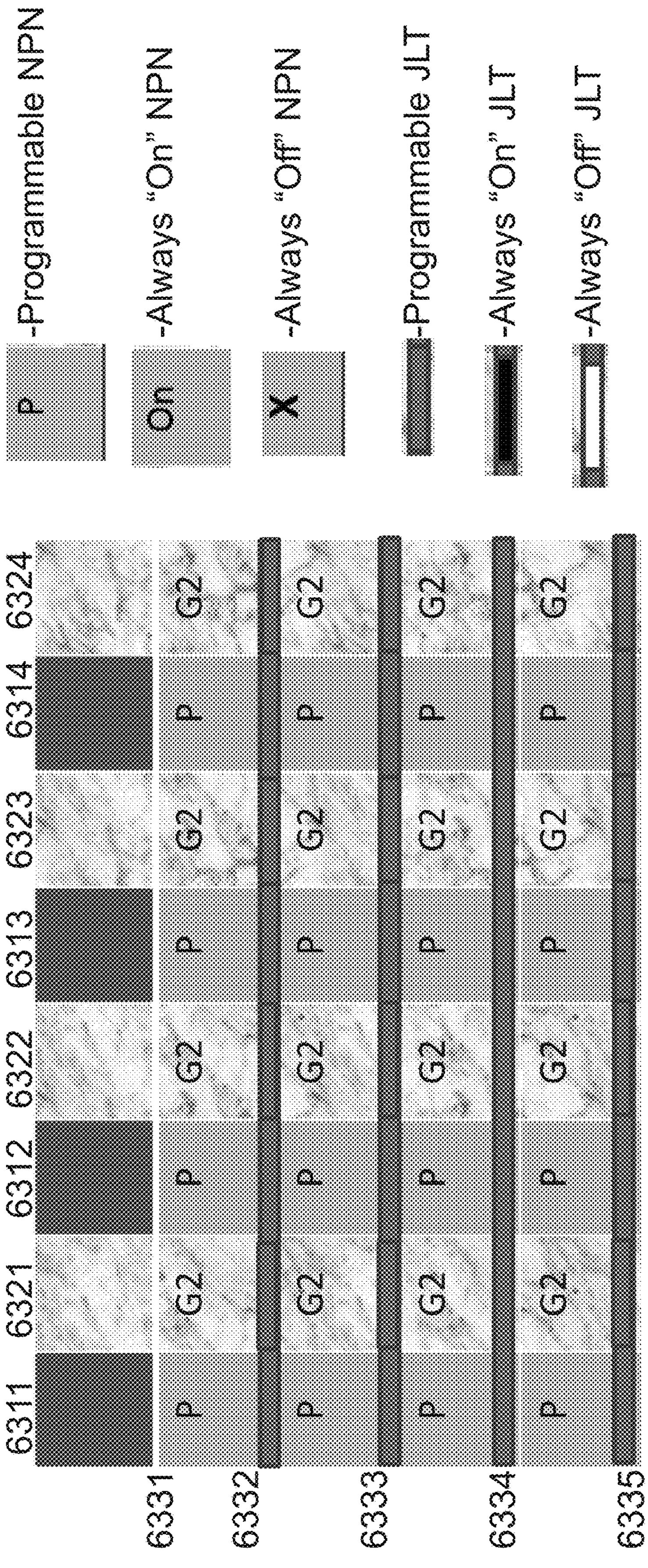

A detailed illustration of how such a 'ripple programming' of a structure such as FIG. 63A could be demonstrated using FIGS. 63B-63G. FIG. 63B illustrates a small structure of 4 channel columns 1st CC 6311, 2nd CC 6312, 3rd CC 6313, 4th CC 6314 and 5 S/D lines 1st SD 6331, 2nd SD 6332, 3rd SD 6333, 4th SD 6334, 5th SD 6335. A direct contact could be made to the top S/D of the 4 channel columns and to the respective first gates of these columns and to the second gates in between 1st SG 6321, 2nd SG 6322, 3rd SG 6323, 4th SG 6324. On the right side of FIG. 63B a symbol map is provided which will be utilized for G-FIGS. 63B-63G.

Figure 63C:
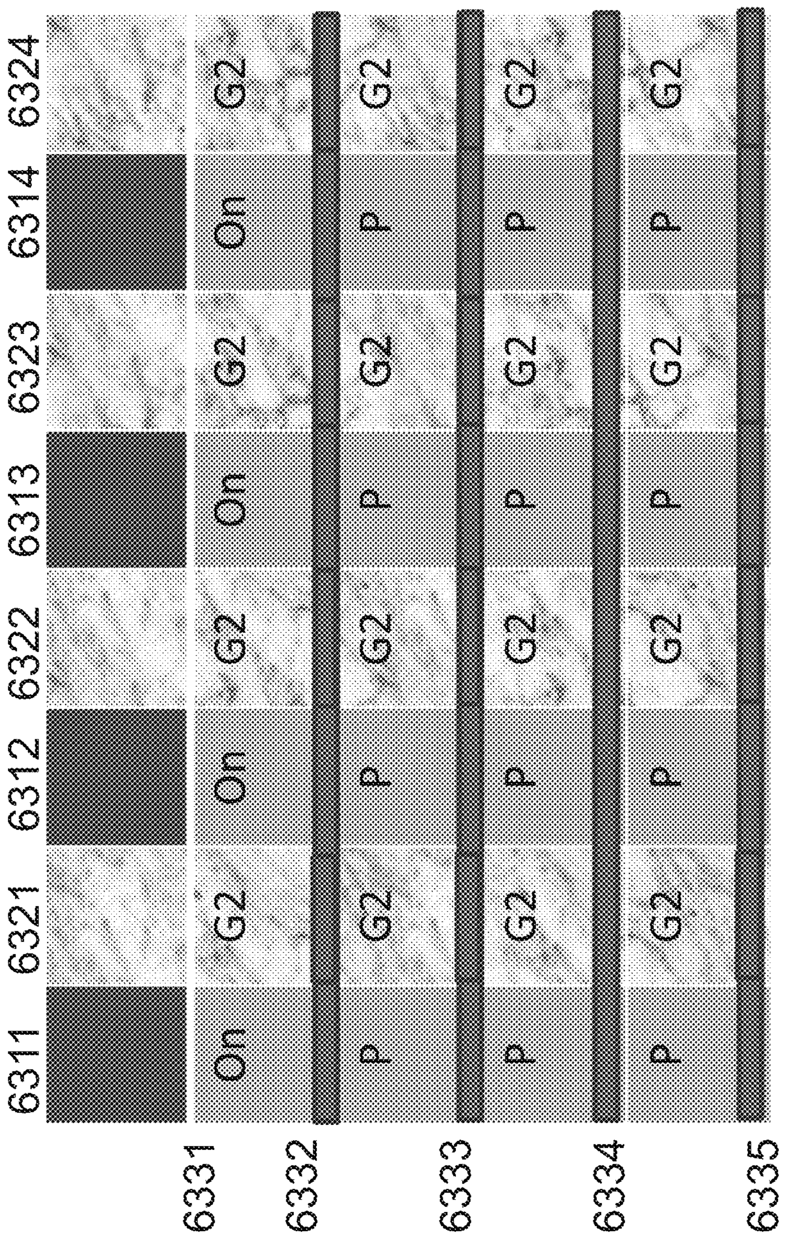

FIG. 63C illustrates the first step of programming. Using the top contact 1st CC 6311 of the first channel column and its first gate the channel is programmed to always "On" and so forth for the second channel column 2nd CC 6312, the third 3rd CC 6313 and the fourth 4th CC 6314.

Figure 63D:
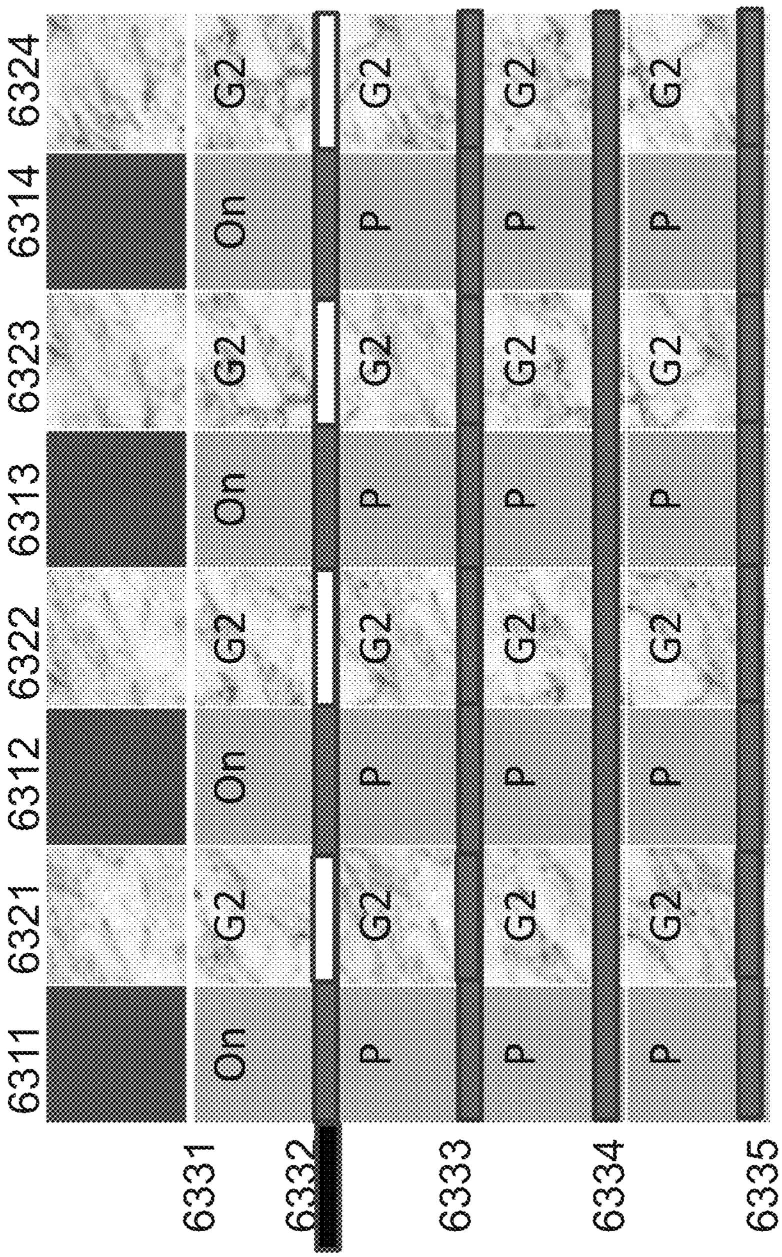

FIG. 63D illustrates the following step of programming. Using this programmed first channel and the second gates 1st SG 6321, 2nd SG 6322, 3rd SG 6323, 4th SG 6324 the JLTs of the second S/D line 2nd SD 6332 are programmed "off". The JLT left of the first column 1st CC 6311 of the second S/D line 2nd SD 6332 is programmed "on". In this ripple programming flow attention need to be made to time control programming of one site at a time and to stop before the program ripples to the next site.

Figure 63E:
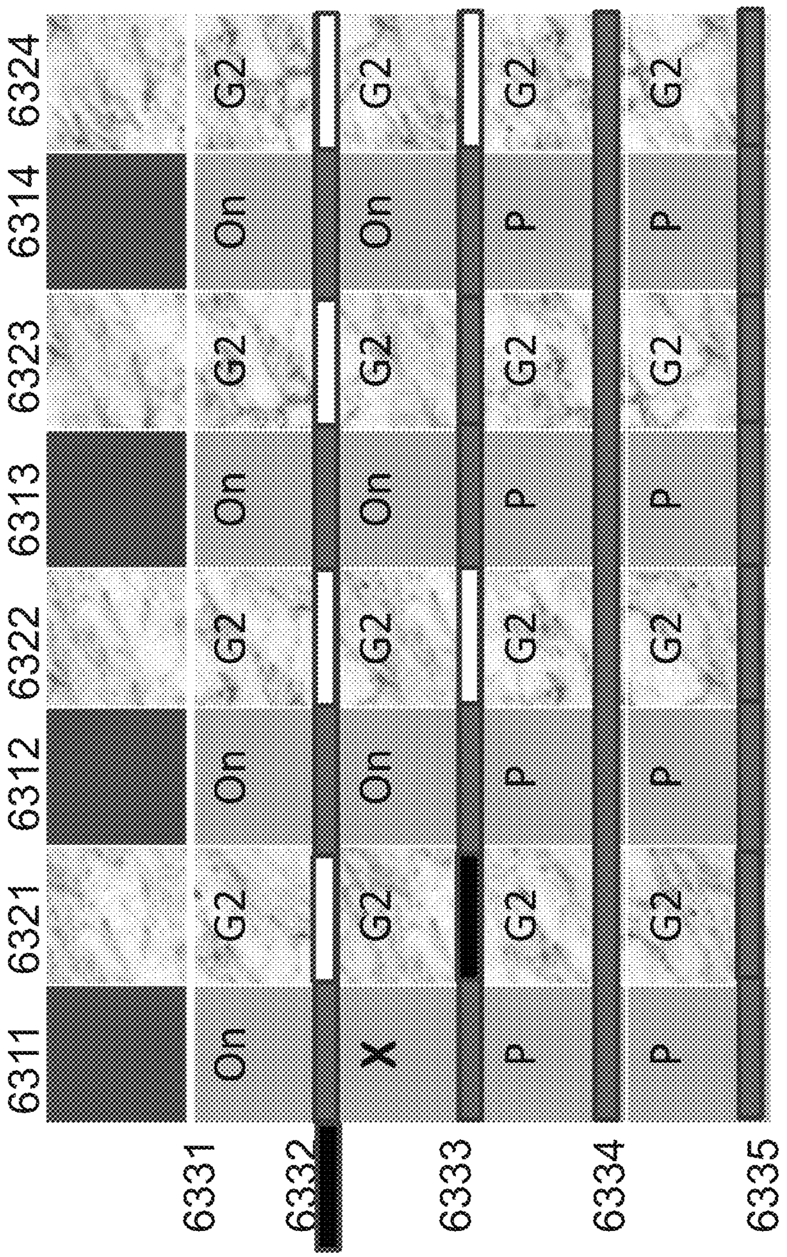

FIG. 63E illustrates the following step of programming Now the second channels and the third S/D line 3rd SD 6333 are program as illustrated.

Figure 63F:
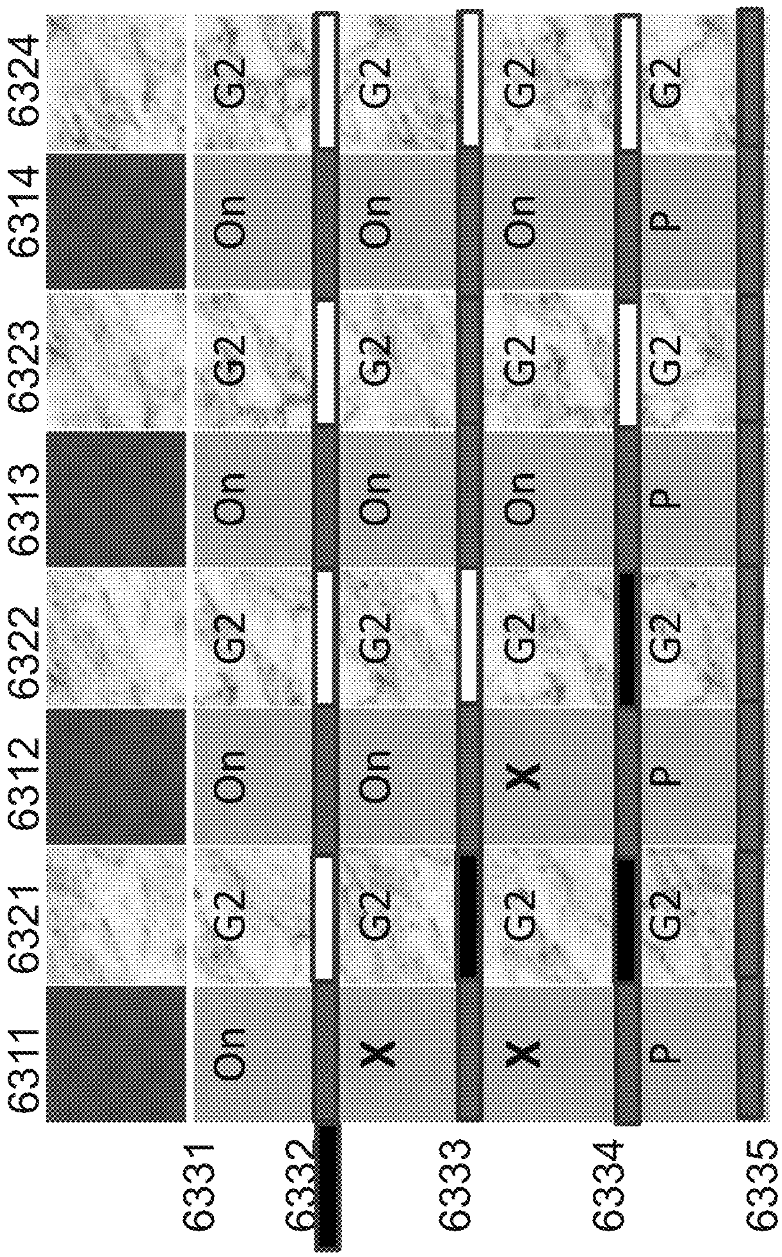

FIG. 63F illustrates the following step of programming. Now the third channels and the fourth S/D line 6334 are programmed as illustrated.

Figure 63G:
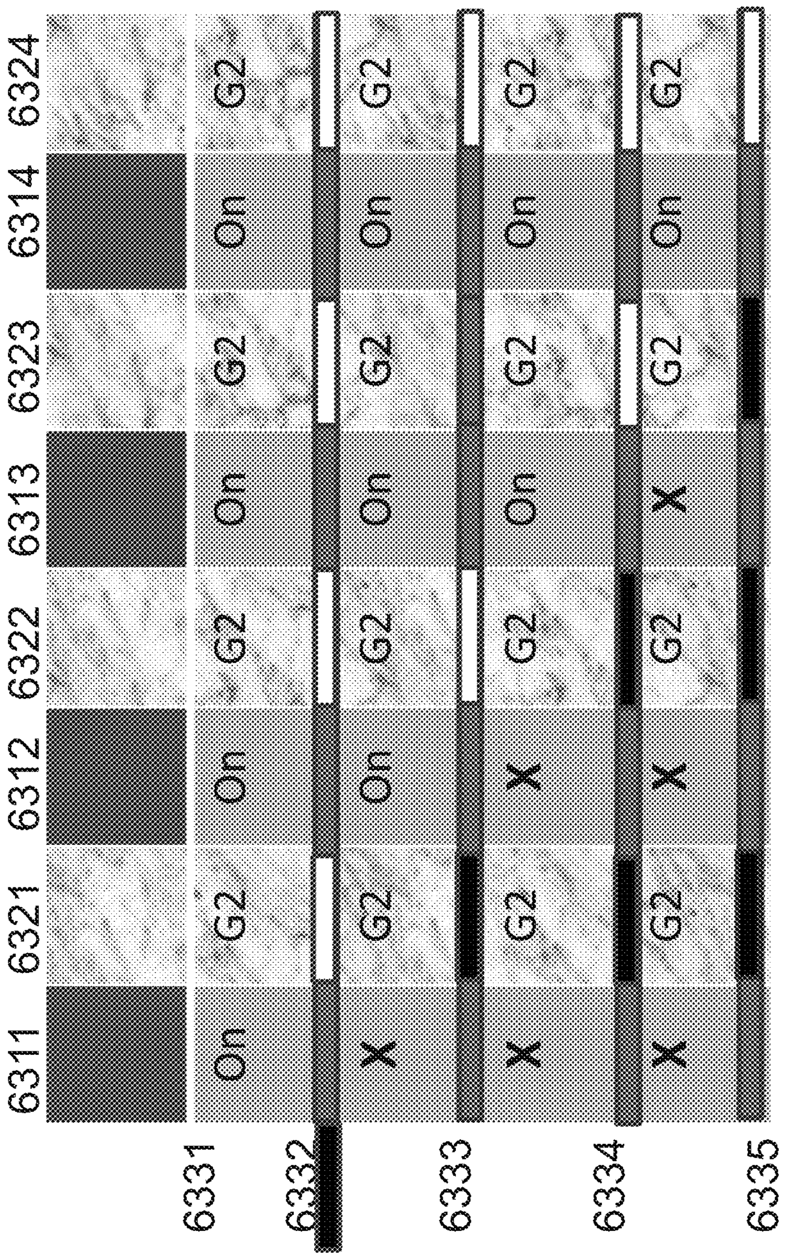

FIG. 63G illustrates the following step of programming. Now the fourth channels and the fifth S/D line 6335 are program as illustrated.

And the ripple programming could be extended to complete forming access per layer S/D line as an alternative to the stair-case process.

Using a structure such as is illustrated in FIG. 49C for LUT-4 or other logic functions reduces the relative number of the required junctionless ("JLT") transistors. For such structures an alternative approach could be used in which only those regions of the S/D lines that are designated to become JLT are made to have a channel of less than about 20 nm. This could be achieved with patterning or a targeting second trimming etch step or combination of these techniques. This process flow is illustrated in FIG. 64.

Figure 64A:
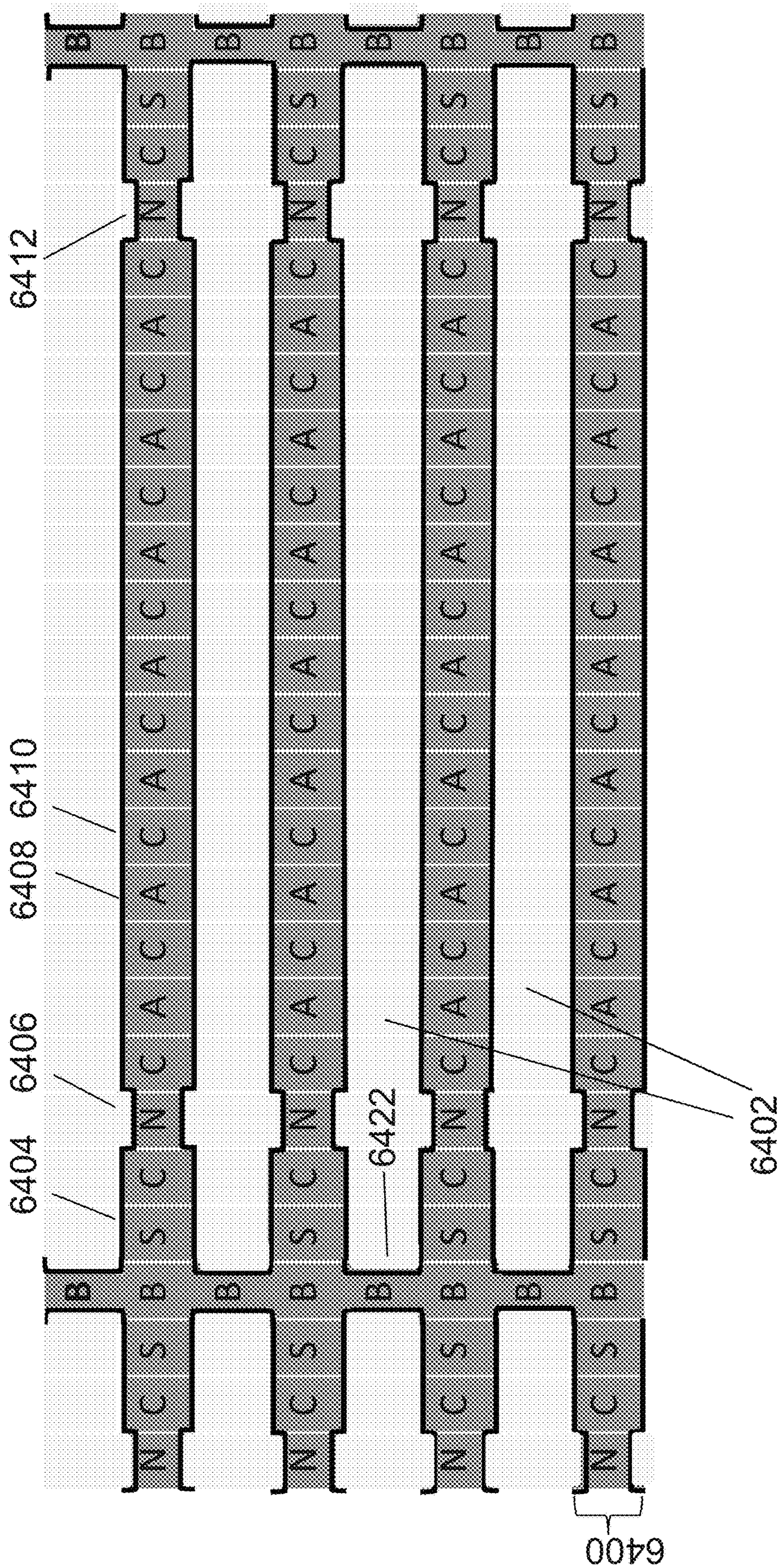
FIGS. 64A-64K are example illustrations of formation and structure of designated JLTs.

FIG. 64A illustrates a top view of such patterning of the layers stack forming ridges 6400 with designated "necks, N" 1st neck 6406 and 2nd neck 6412 for future JLTs. The figure also illustrates bridges 6422 between bridges over the "valleys" 6402 where this bridges 'B' are also designated as future JLT. The figure illustrates regions designated "C" for channel columns 6410 and region designated "A" for regular second gates 6408. The S/D regions approaching the "bridges" 6422 are designated "S" 6404 as they are designed to keep functioning as an effective conductor while they could share the "bridge" 6422 gates. By properly sizing the "S" 6404 they would be kept large enough from being substantially affected by the "bridge" 6422 gates.

Figure 64B:
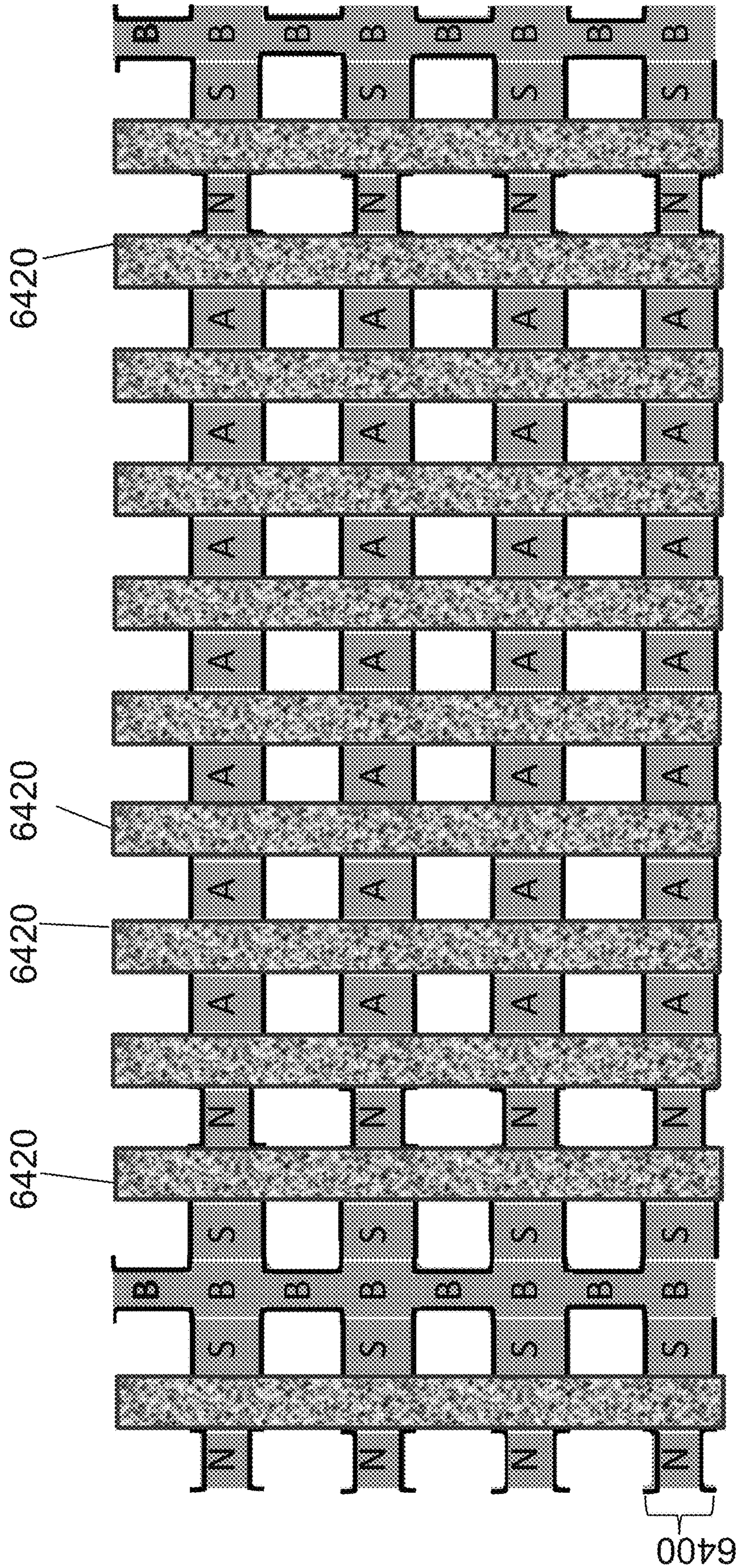

FIG. 64B illustrates the structure after dummy oxide 1 and forming first O/N/O and first gates 6420. After forming these second gates the P regions are etched in all regions not covered by first gates, as discussed before.

Figure 64C:
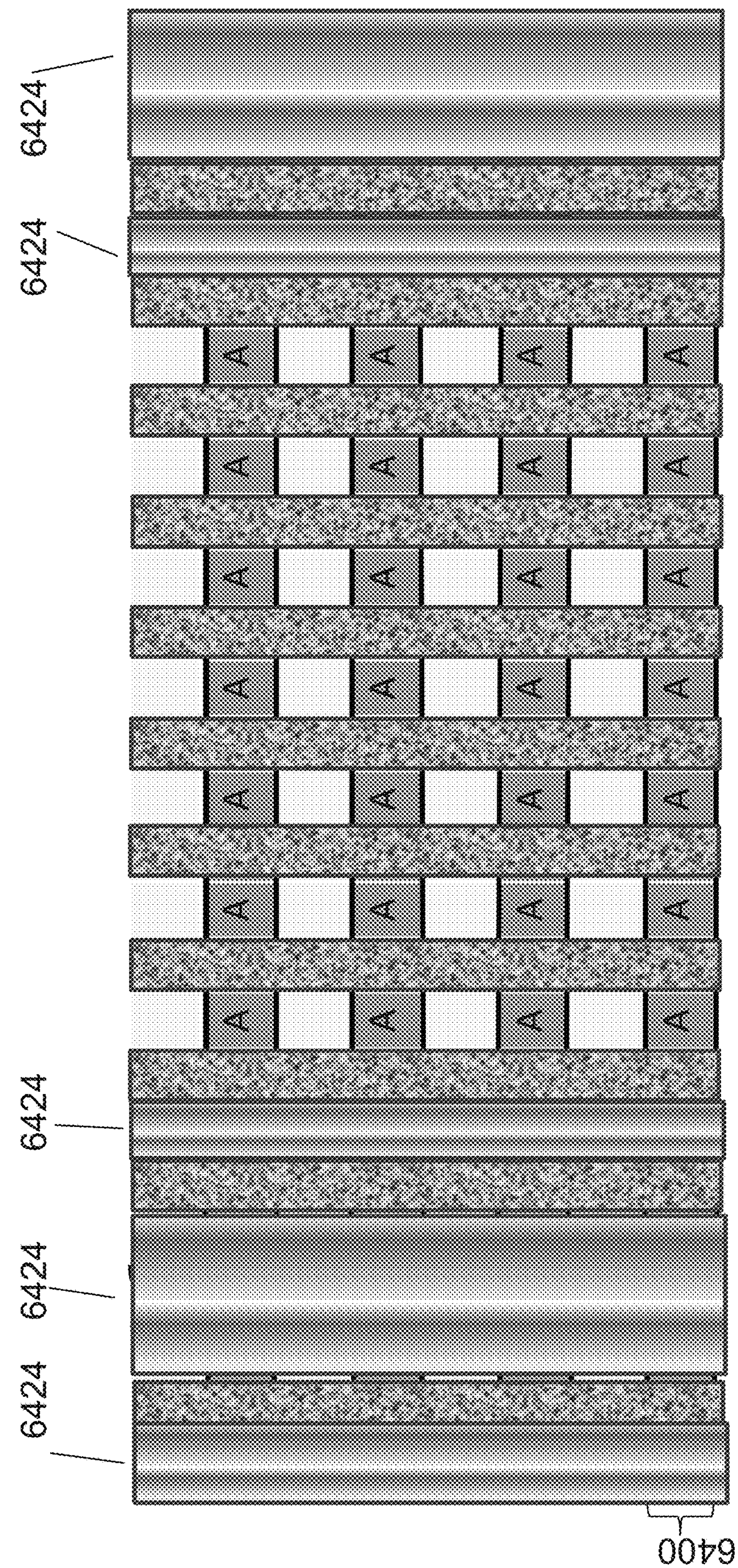

FIG. 64C illustrates the structure after optional patterning an removal of regions of dummy oxide 1 thus forming dummy oxide N regions 6424 in preparation for a future 'necking step'.

Figure 64D:
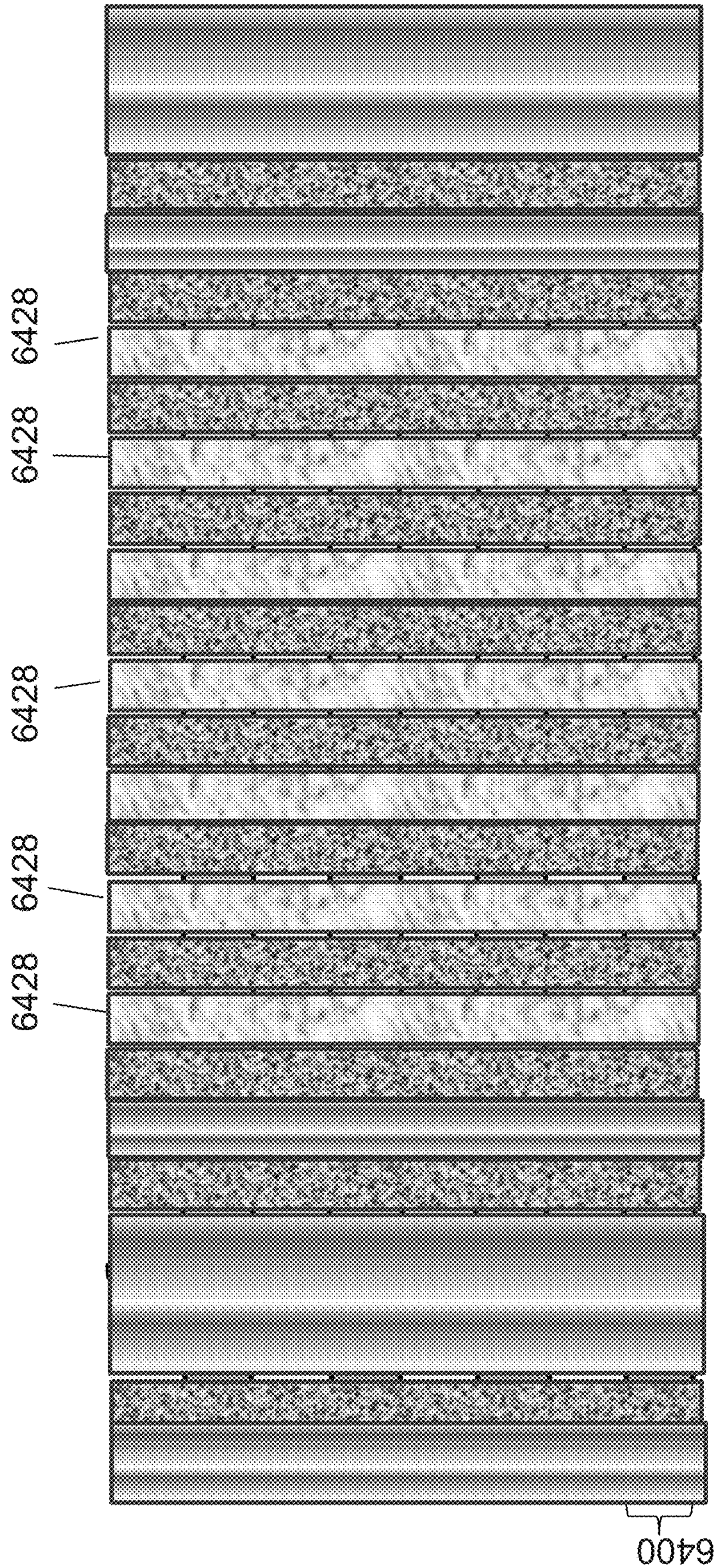

FIG. 64D illustrates the structure after forming second O/N/O and second gates 6428 on all uncovered regions.

Figure 64E:
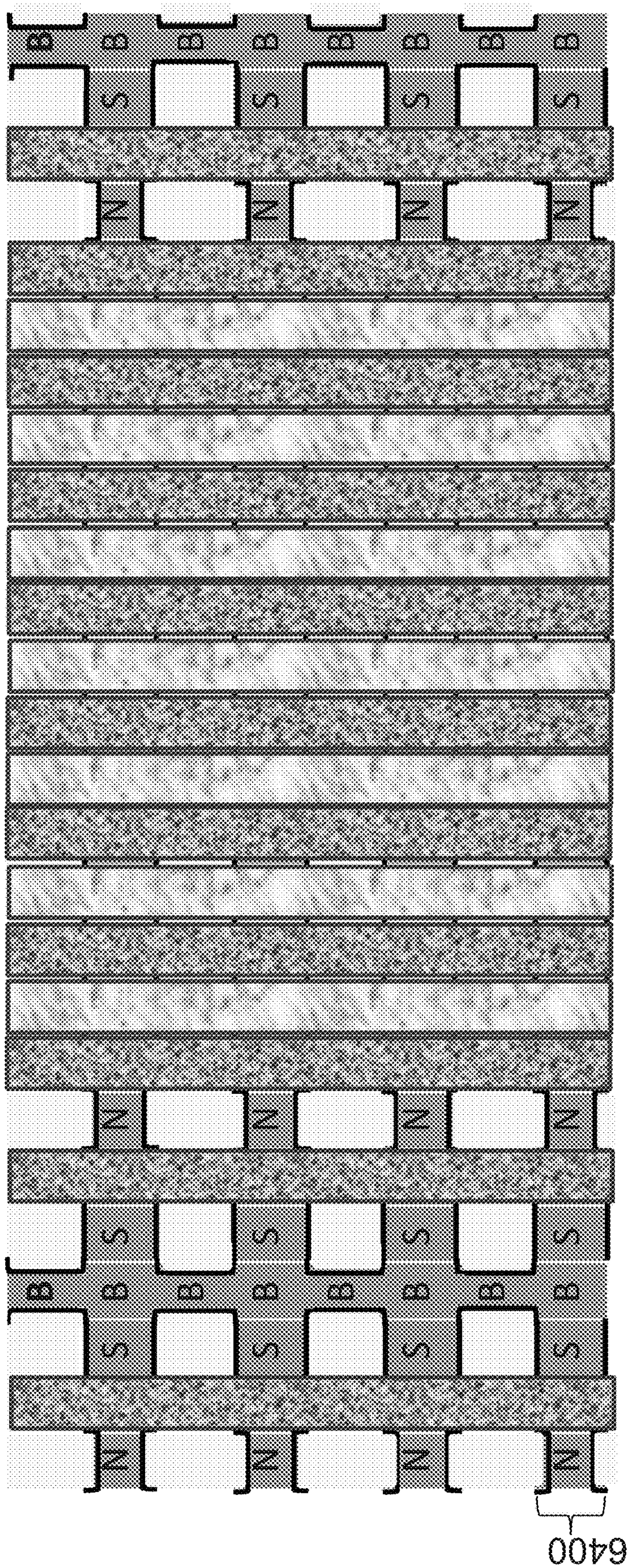

FIG. 64E illustrates the structure after removal of the dummy oxide N regions 6424. At this point a 'necking' step could be performed assisted with patterning or a non-directional all-around silicon removal step. For this necking step an Atomic Layer Etch ("ALE") could be used to allow good etch control so to avoid over etching. ALE techniques had been improved recently and as reported could allow controlled etching of about one or two nm increments of silicon. These had been reported in an overview paper by Keren J. Kanarik, et al titled "View of atomic layer etching in the semiconductor industry" published in Journal of Vacuum Science & Technology A 33, 020802 (2015), in a paper by Samantha Tan titled "Highly Selective Directional Atomic Layer Etching of Silicon" published in ECS Journal of Solid State Science and Technology, 4 (6) N5010-N5012 (2015), and a paper by G. S. Oehrlein, titled "Atomic Layer Etching at the Tipping Point: An Overview" published in ECS Journal of Solid State Science and Technology, 4 (6) N5041-N5053 (2015), all of these are incorporated herein by reference.

Figure 64F:
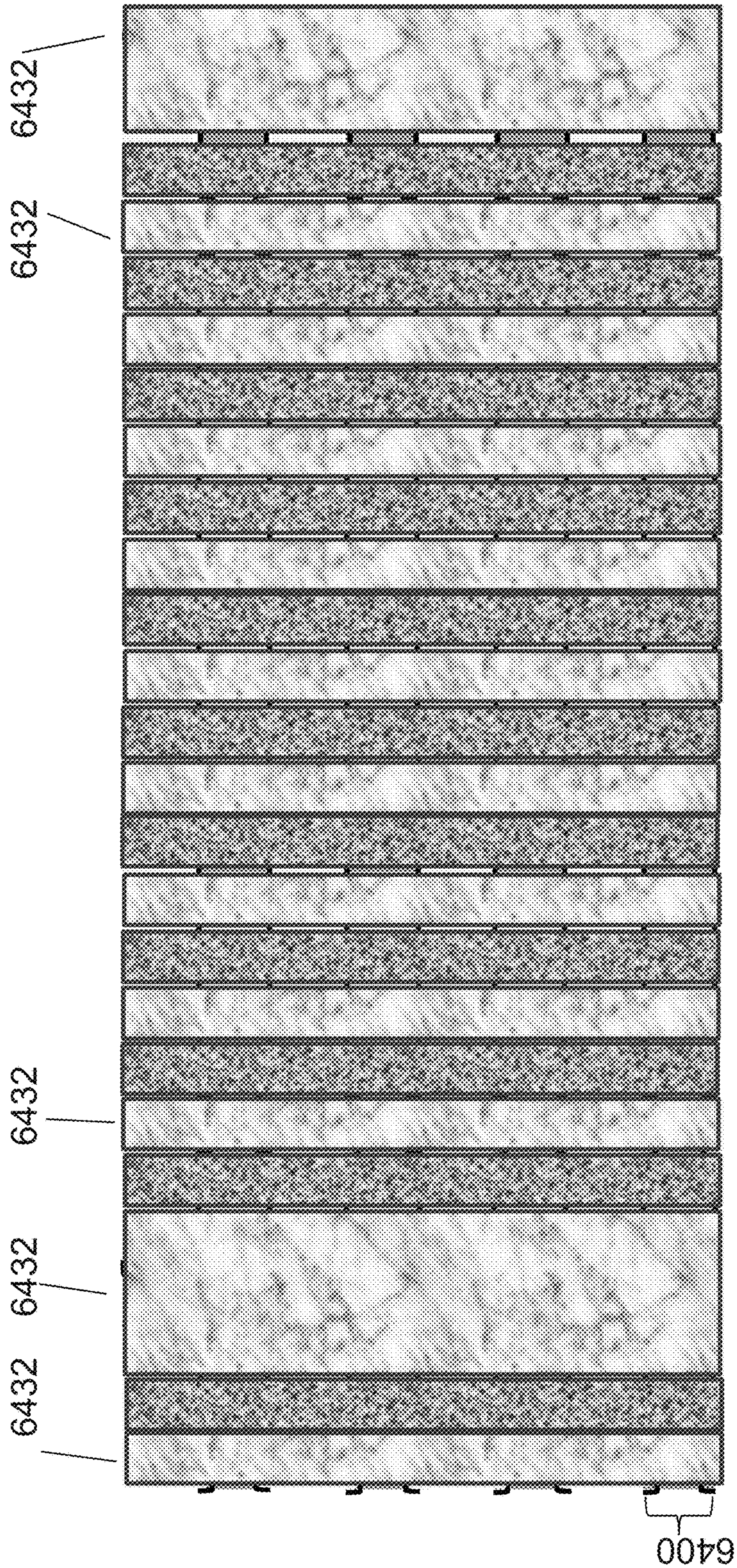

After the optional etching of the regions designated to become JLT to the tight size with channel of less than about 20 nm has been achieved, a third O/N/O and third gates could be deposited on at least all the designated JLT regions 6432 (could be approximately similar in shape to dummy oxide N regions 6424) as illustrated in FIG. 64F.

Figure 64G:
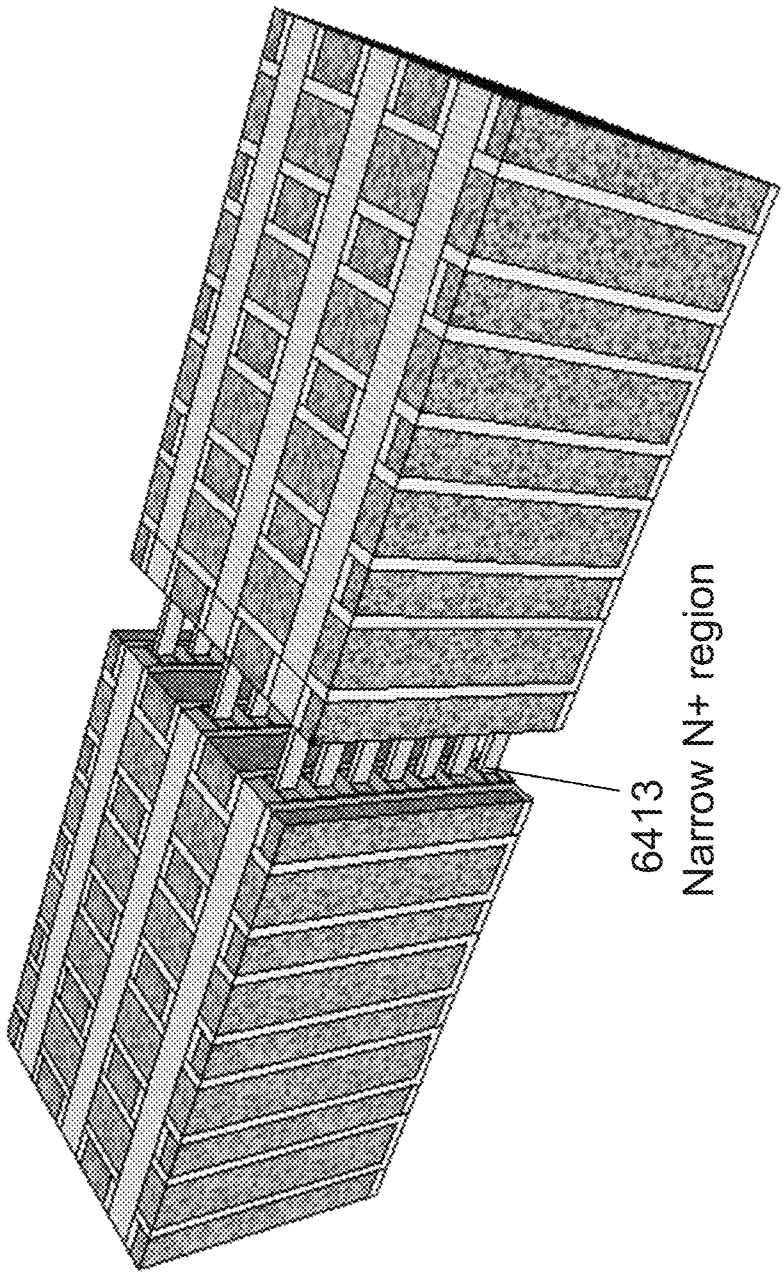

FIG. 64G illustrates a neck 6413 designated for JLT in a 3D view

Figure 64H:
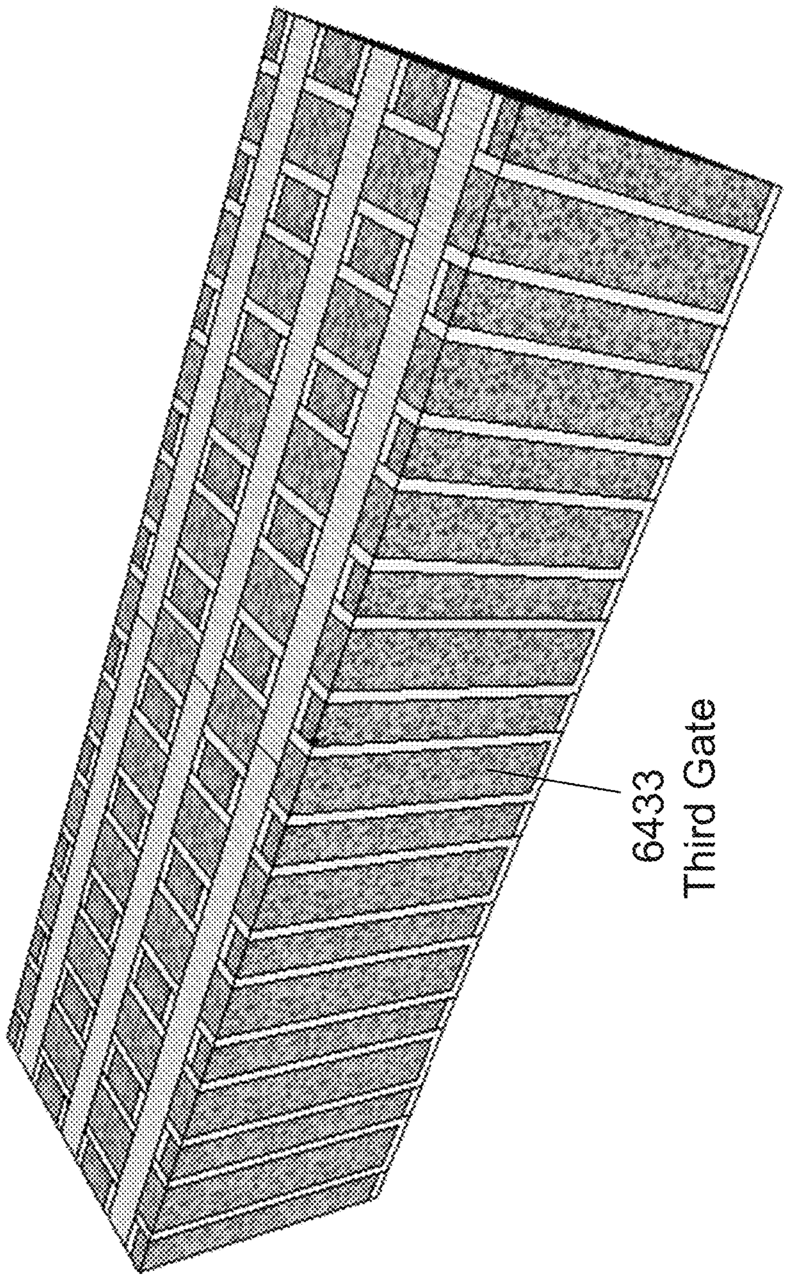

FIG. 64H illustrates the third gates 6433 controlling the JLT in a 3D view.

Figure 64I:
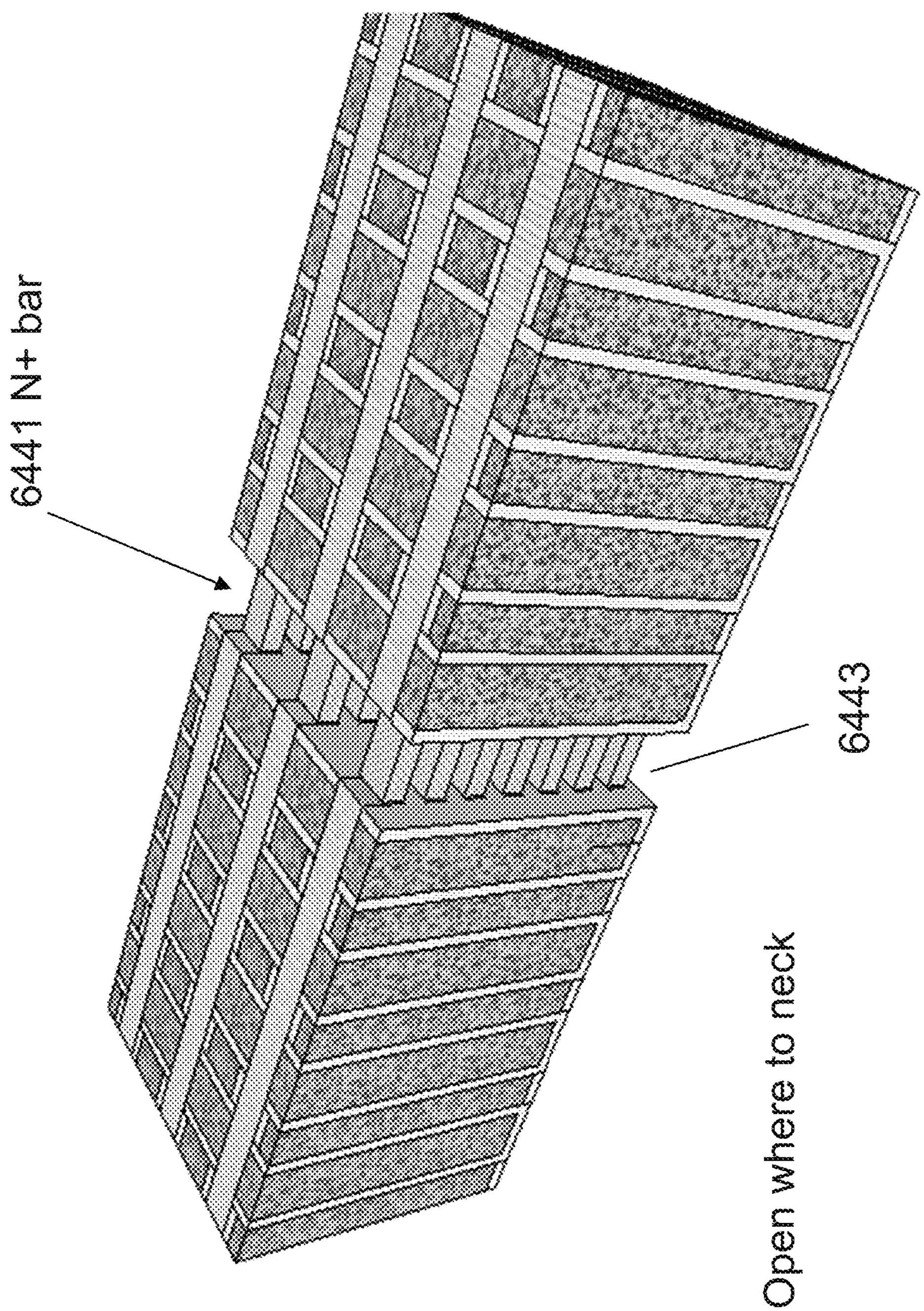

FIG. 64I illustrates an alternative of an etch step opening 6443 the regions for JLT formation, thus exposing N+ S/D bars 6441.

Figure 64J:
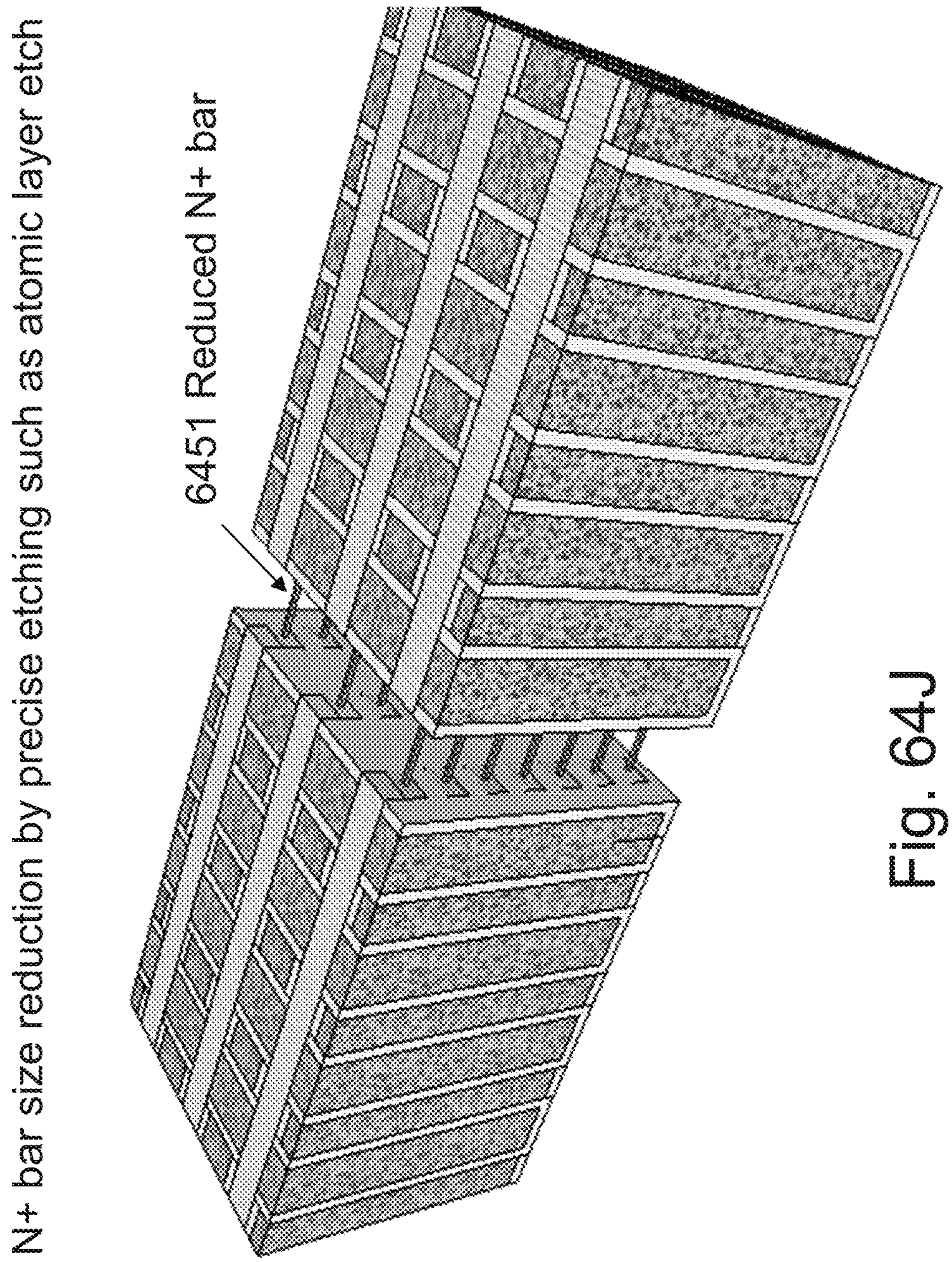

FIG. 64J illustrates the structure after an ALE process reduces the N+ S/D bars 6441 to below about 20 nm thickness in at least one dimension necks thus forming reduced N+ bars 6451 to enable them to function as a JLT.

Figure 64K:
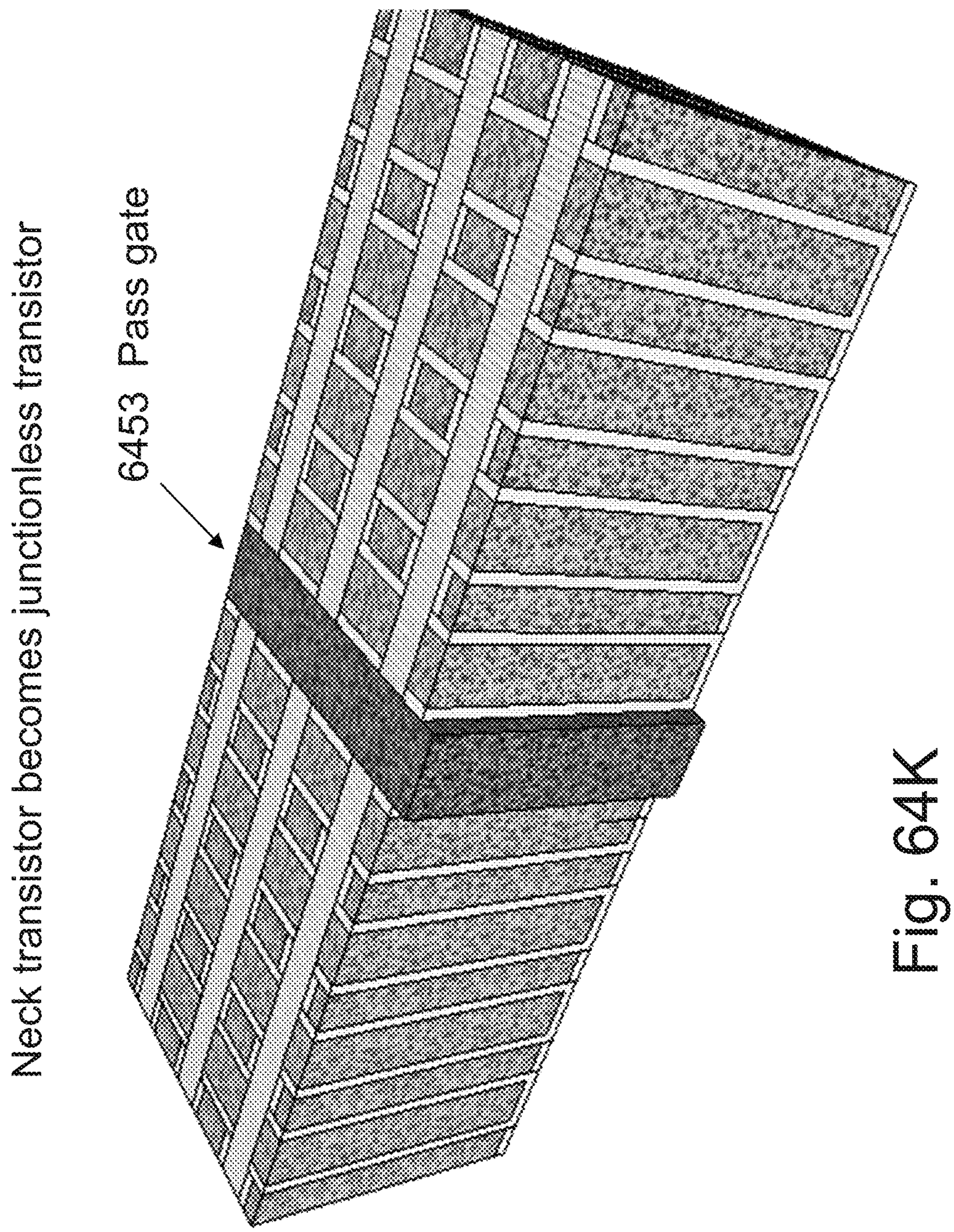

FIG. 64K illustrates the structure after adding third O/N/O and third gates 6453 to control the JLT.

Forming the necking for the JLT transistors is a relatively challenging process due to the small size the S/D lines need to be necked to allow the gate to control the JLT channel. The differential type of programmable logic structure presented herein allows the device to function in a wide range and wide variation of these JLTs. Yet a poor gate control of these JLT would increase the power wasting of the logic circuit. An optional approach could be to use less than 8 layers for the logic by allocating more ridges such as two or four with fewer layers to perform the comparable function.

Figure 65C:
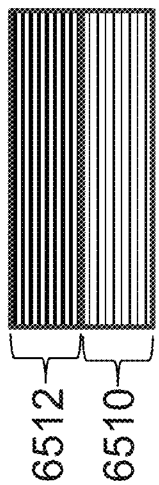
FIGS. 65A-65E are example illustrations of alternative structures leveraging multilayer 3D stacks.
Figure 65D:
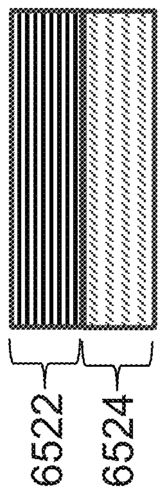
Figure 65E:
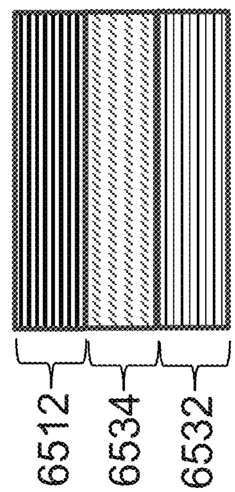
Figure 65A:
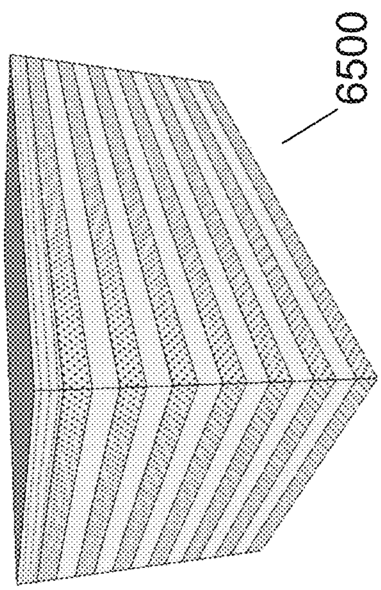
Figure 65B:
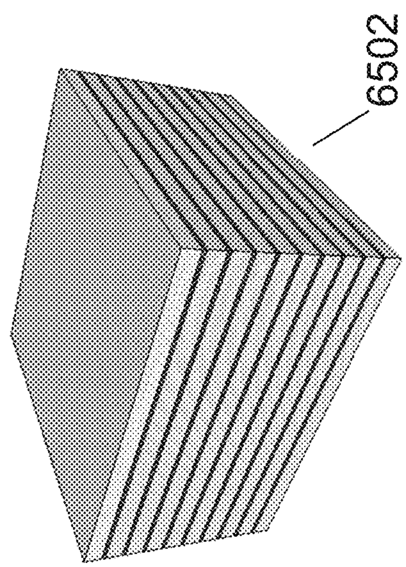

The alternative structures presented herein are leveraging multilayer 3D stacks. FIG. 65A illustrates a first stack design 6500 for a 3D NOR memory fabric and FIG. 65B illustrates a second stack design 6502 for 3D NOR logic fabric. FIG. 65C illustrates a stack of logic 6512, such as 3D NOR logic, over a stack of memory 6510, such as 3D NOR memory. FIG. 65D illustrates a stack of logic 6522 over a stack of routing 6524 and FIG. 65E illustrates a stack of logic 6532 over a stack of routing 6534 over a stack of memory 5532. The architectures, structures and process flows presented herein suggest processing multiple layers together will greatly reduce the fabrication cost per layer providing overall a device with many layers of functional transistors and other structures providing density cost and performance advantages. These process flows could use a 2D patterning which affects many layers simultaneously as was detailed herein. While creating patterns in 2D in the X and Y directions is a well-known technique in semiconductor device processing, it is far harder to form variation in the Z direction. Yet in some of the structures presented herein there are differences between the memory structure, logic structure and routing structure. Processing devices that integrate these slightly different structures might be harder. So one option is to process those individually and then bond them together. Yet there are a few techniques to effect changes in the Z direction.

One such Z direction change technique is the thickness of the various layers in the stack. As the stack could be formed by epitaxial growth, changing the gases time or other process parameters could result in a stack with Z direction changes which could enable forming multilayer structures of about 50 nm per layer in thickness in the memory portion and forming multilayer structures of less than about 20 nm per layer for the N+ layers in the logic portion.

Another alternative is to put a blocking hard pattern in between the memory stack and the logic stack.

Figure 66A:
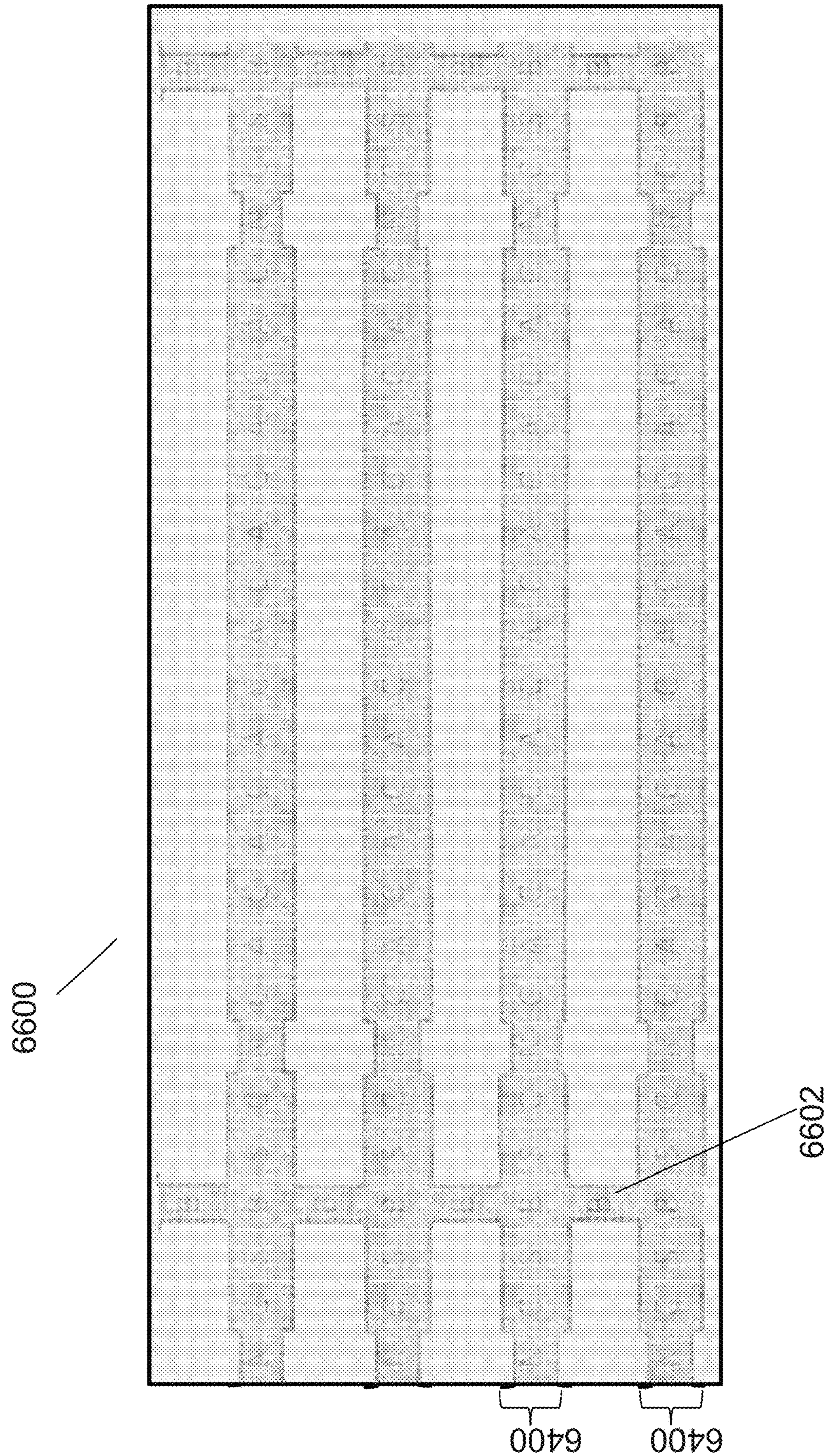
FIGS. 66A-66C are example illustrations of formation and structure of multilayer 3D stacks.
Figure 66B:
Figure 66C:
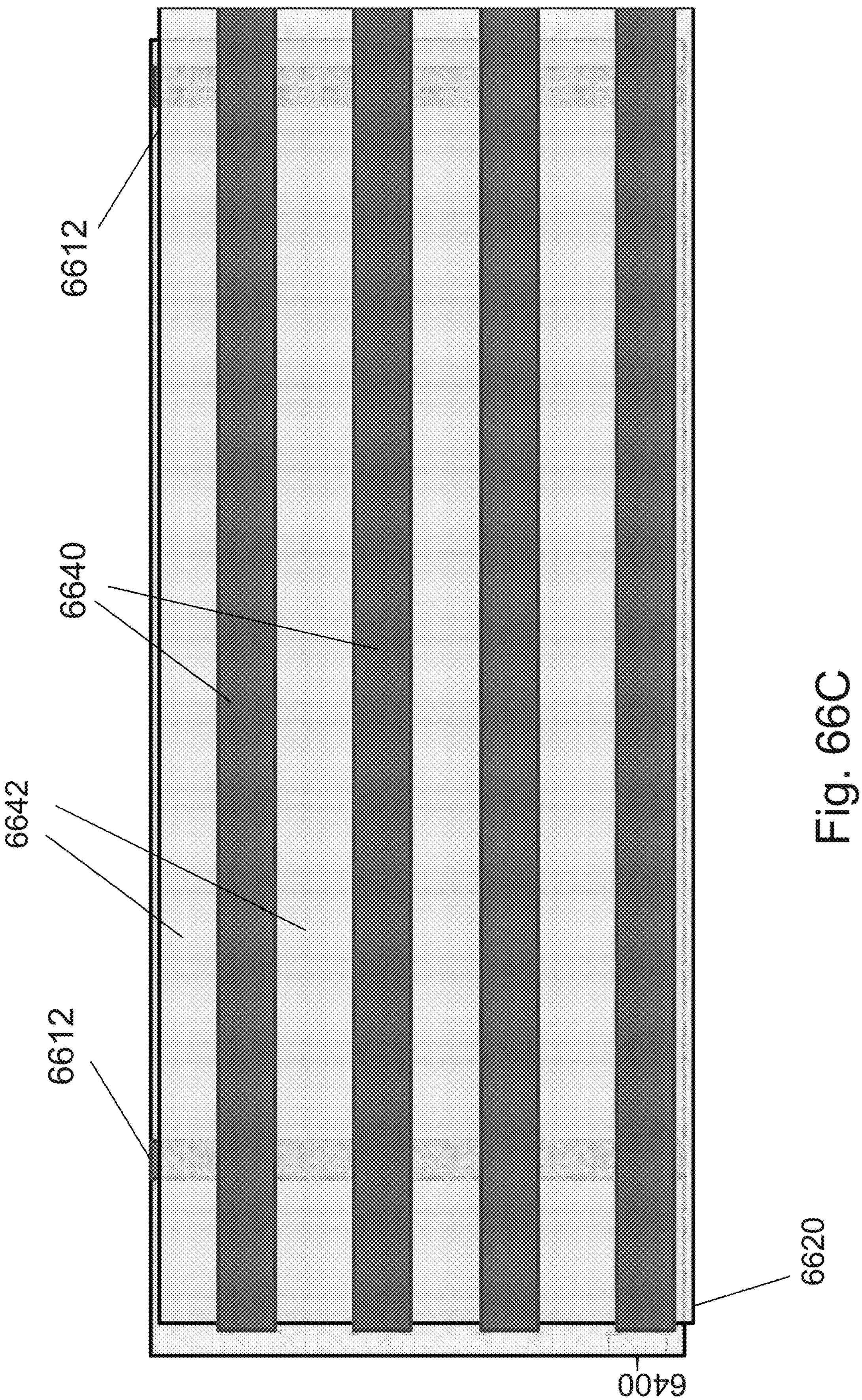

FIG. 66A illustrates a multi-layer stack 6600 for logic fabric with shadow of the planned pattern of FIG. 64A with planned locations for 'bridges' 6602 between ridges 6400. FIG. 66B illustrates forming a hard mask 6612 for these designated bridge locations. FIG. 66C illustrates adding on top of the structure of FIG. 66B a second multi-layer stack 6620 designated for the 3D NOR memory fabric. The second layer could be added by bonding using layer transfer techniques or by a second phase of epitaxial growth which would soon grow and cover the hard mask 6612. Then add on top hard mask 6640 to define the ridges and open the 'valleys' 6642 for etch. Now when a directional etch step is performed the memory stack would be formed into ridges 6640 while the logic stack underneath would formed into ridges with bridges 6612 in the designated locations. For such flow a alignment marks need to be formed in the logic stack so the ridges hard mask pattern could be aligned properly with bridges buried hard mask Other variations of this concept could be used in conjunction with layer/stack transfer step to direct the processing step from the proper side.

While processing fabrics for 3D NOR Memory while also forming 3D NOR Logic could reduce cost in other cases it might work better to process these fabrics mostly independently and then connect them together for a better more efficient (cost and/or performance) overall 3D system. There are many options for mix and match between step and fabric presented herein and the choice of a specific flavor could also be affected by the objective target of the end 3D system.

Additional alternative could be used to further enhance the fabric routing capabilities. In this option the second O/N/O and second gates, or a portion of them, could be replaced by Resistive Random Access Memory—"R-RAM" or One Time Programmable—"OTP" structure. In such an option, this programmable post could be programmed to form bridges between adjacent ridges and between layers of the same ridge offering a very rich connectivity fabric.

A flow could start by modifying the flow in respect to FIG. 64C in which the protection of necking regions 6424 could be done by resist or other form of masking.

Figure 67A:
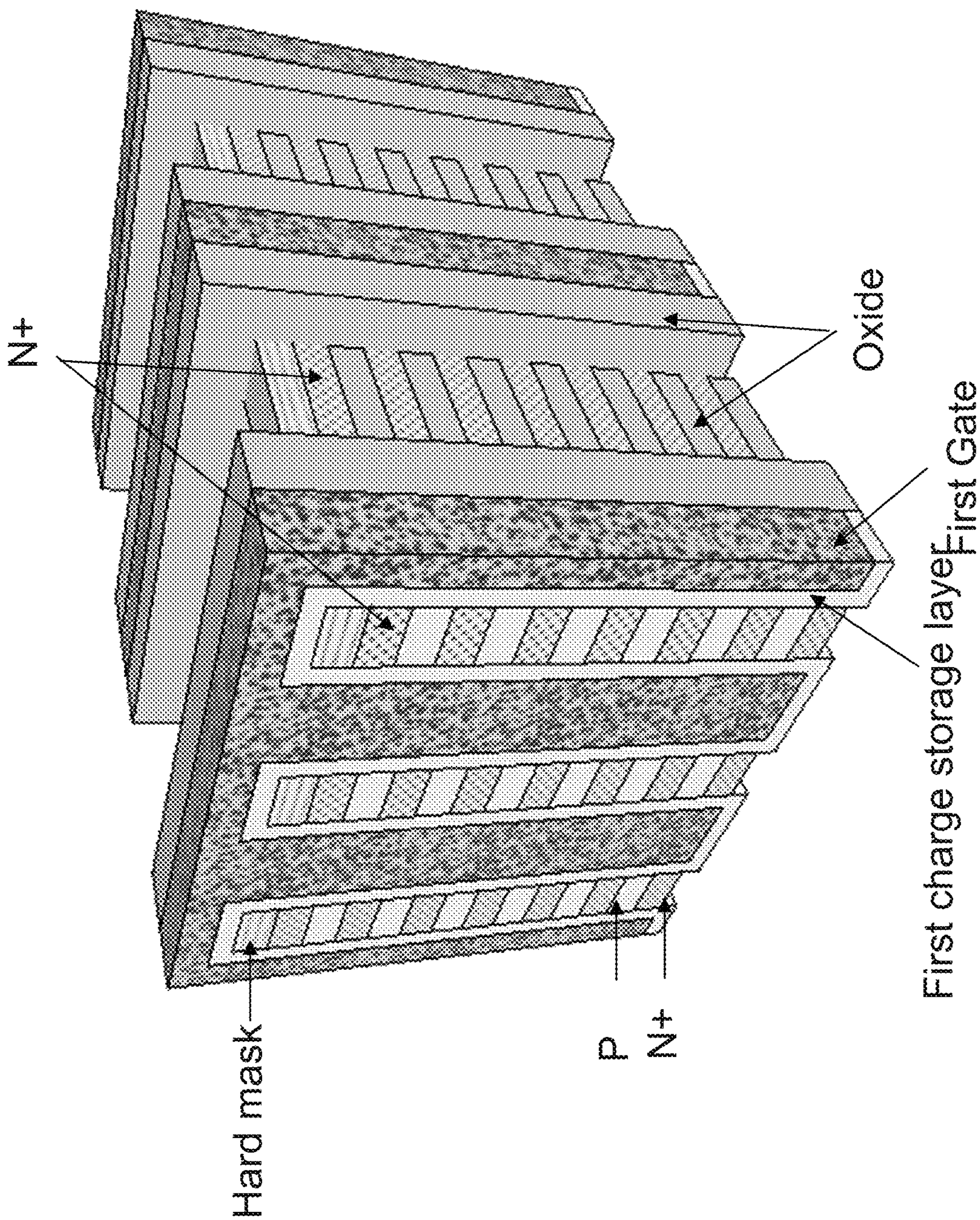
FIGS. 67A-67K are example illustrations of formation and structure of RRAM or OTP pillars.
Figure 67B:
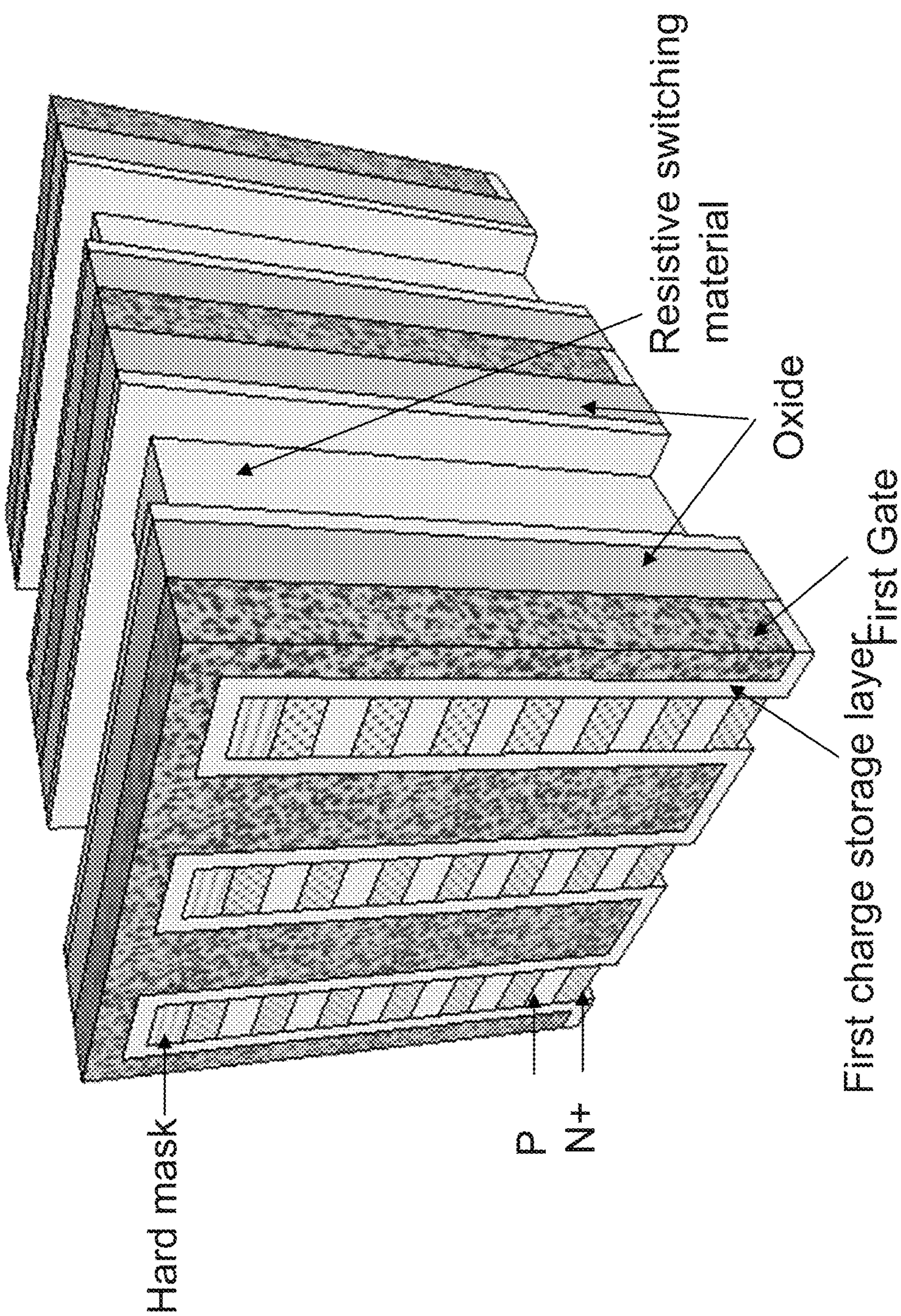
Figure 67C:
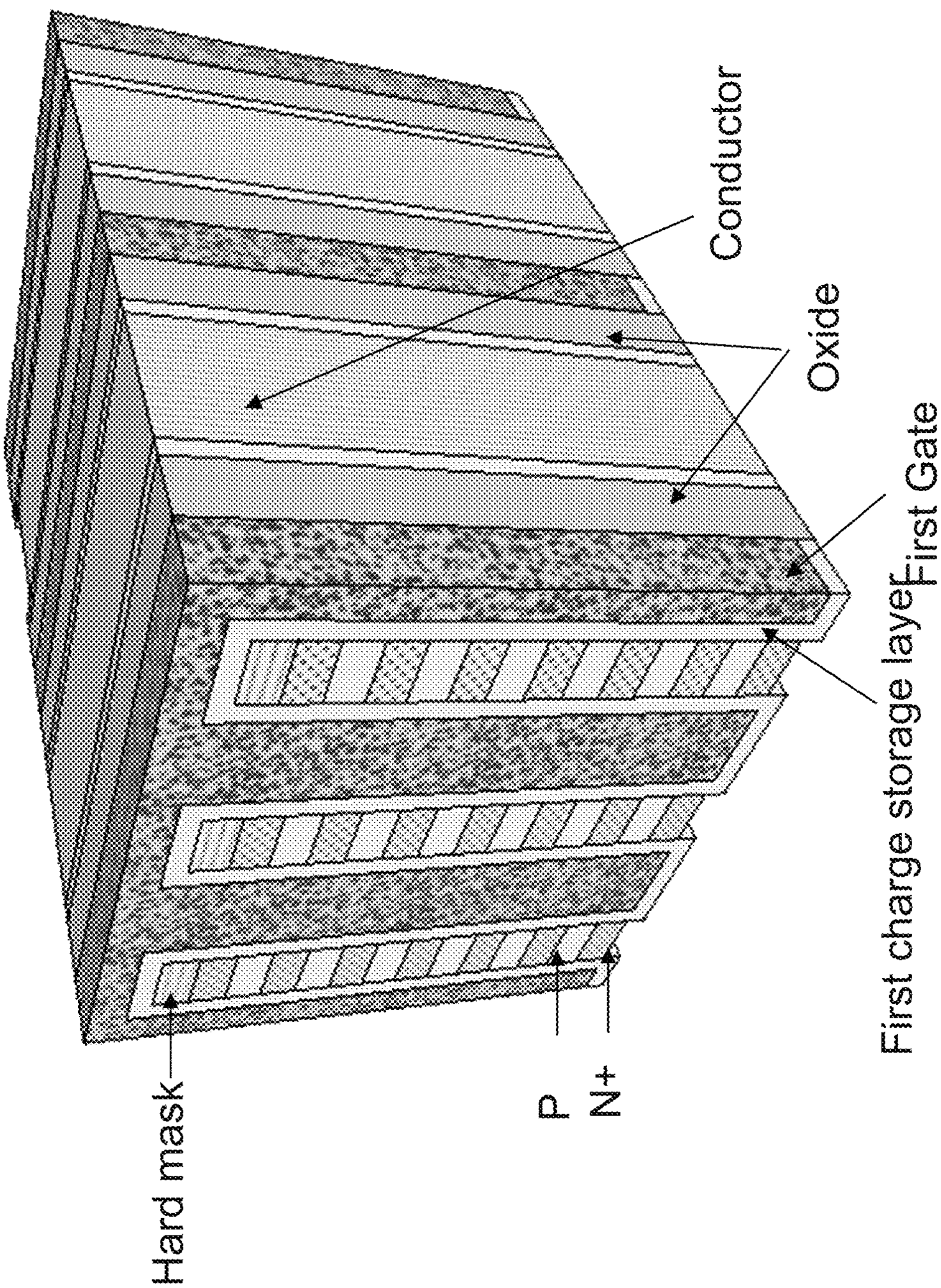
Figure 67D:
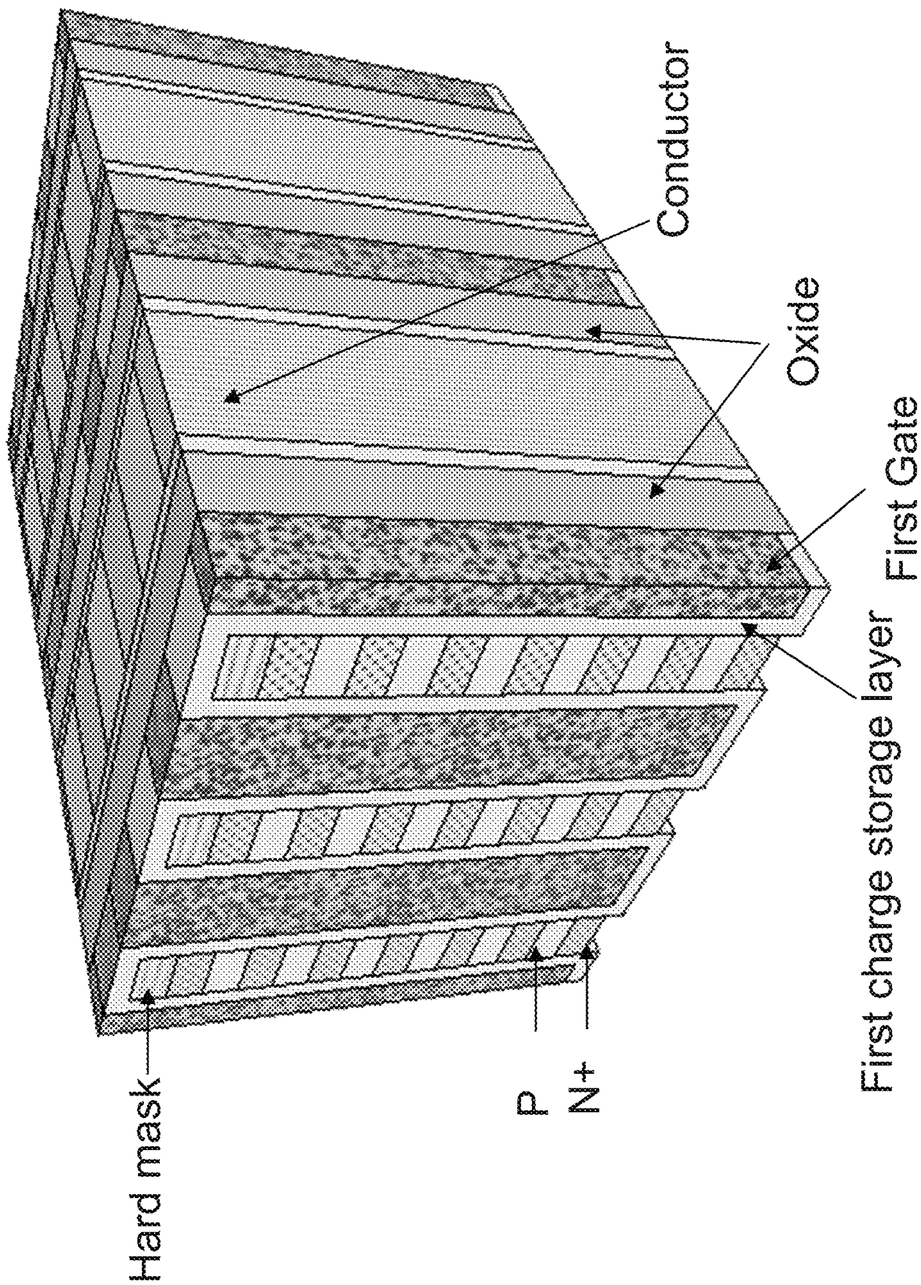
Figure 67E:
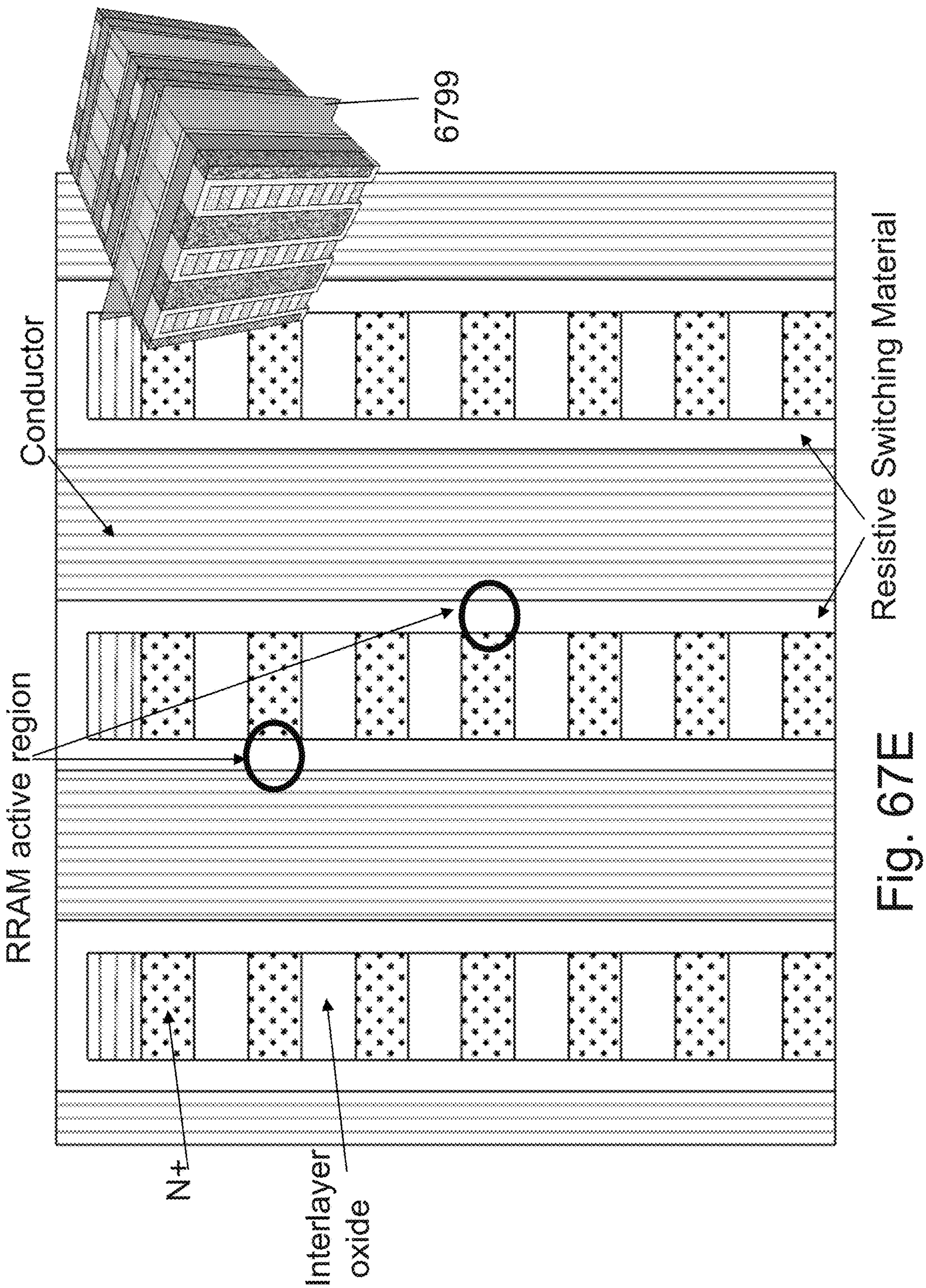

The starting point could be the 3D NOR structure as illustrated in FIG. 8B. Then the region designated to have R-RAM pillars are first filled with oxide in a non-directional deposition step in order to fill in with oxide those regions in which the P type silicon was removed. Then using a directional oxide etch, open the regions designated for RRAM by removing the oxide in regions other than in-between the S/D lines as illustrated in FIG. 67A. Followed by RRAM or OTP pillar formations using deposition techniques and sequence of RRAM or OTP formation layer—thin oxide as is illustrated in FIG. 67B, and conductive electrodes as is illustrated in FIG. 67C. Then using CMP or similar layer removing processing, the top surface is removed so these pillars are now isolated as is illustrated in FIG. 67D. FIG. 67E illustrates the resulting structure of a cut view (plane 6799) perpendicular to the S/D lines 6740 (at FIG. 67G).

An OTP technology has been presented U.S. Pat. Nos. 8,330,189 and 8,390,326 incorporated herein by reference. An RRAM compatible RRAM technology has been described in U.S. Pat. No. 8,581,349 such as in respect to FIG. 32A-J, FIG. 34A-L, FIG. 35A-F, its entirety incorporated herein by reference, a paper by D. Sekar titled "3D Memory with Shared Lithography Steps: The Memory Industry's Plan to "Cram More Components onto Integrated Circuits", presented at IEEE S3S 2014, By Daeseok Lee et al, titled "BEOL compatible (300° C.) TiN/TiOx/Ta/TiN 3D nanoscale (~10 nm) IMT selector" published at IEDM 2013, by Liang Zhao et al, titled "Ultrathin (~2 nm) HfOx as the Fundamental Resistive Switching Element: Thickness Scaling Limit, Stack Engineering and 3D Integration" published at IEDM 2014; by Ke-Jing Lee, titled "Effects of Electrodes on the Switching Behavior of Strontium Titanate Nickelate Resistive Random Access Memory" published at Materials 2015, 8, 7191-7198; and also in papers by Sung Hyun Jo et al. in a paper titled "Programmable Resistance Switching in Nanoscale Two-Terminal Devices" published by Nano Lett., Vol. 9, No. 1, 2009; by Adnan Mehonic et al titled "Resistive switching in silicon suboxide films" published by Journal of Applied Physics, Volume 111, Issue 7; and by Yuefei Wang et al. titled "Resistive switching mechanism in silicon highly rich SiOx (x<0.75) films based on silicon dangling bonds percolation model" published by Applied Physics Letters, Volume 102 Number 4; Volume 102 Number; and by Sungjun Kim et al. titled "Fully Si compatible SiN resistive switching memory with large self-rectification ratio" published at AIP ADVANCES 6, 015021 (2016), and titled Gradual bipolar resistive switching in Ni/Si3N4/n+-Si resistive-switching memory device for high-density integration and low-power applications published at Solid-State Electronics 114 (2015) 94-97; and by Shuang Gao et al. titled "Forming-free and self-rectifying resistive switching of the simple Pt/TaOx/n-Si structure for access device-free high-density memory application" published at Nanoscale, 2015, 7, 6031-6038; and by Umesh Chand, titled "Metal induced crystallized poly-Si-based conductive bridge resistive switching memory device with one transistor and one resistor architecture" published at APPLIED PHYSICS LETTERS 107, 203502 (2015); and by Adnan Mehonic titled "Resistive switching in silicon suboxide films" published by JOURNAL OF APPLIED PHYSICS 111, 074507 (2012); all of the foregoing are incorporated herein by reference.

It should be noted the 'OTP RRAM' technology described above herein may also be utilized as a multi-stage programmed technology, partially forming/programing to an intermediate resistance value and un-programming for emulation, and then a final full programmation to a low resistance value. With reference to U.S. Pat. Nos. 7,973,559 and 8,390,326, both incorporated herein by reference.

Figure 67F:
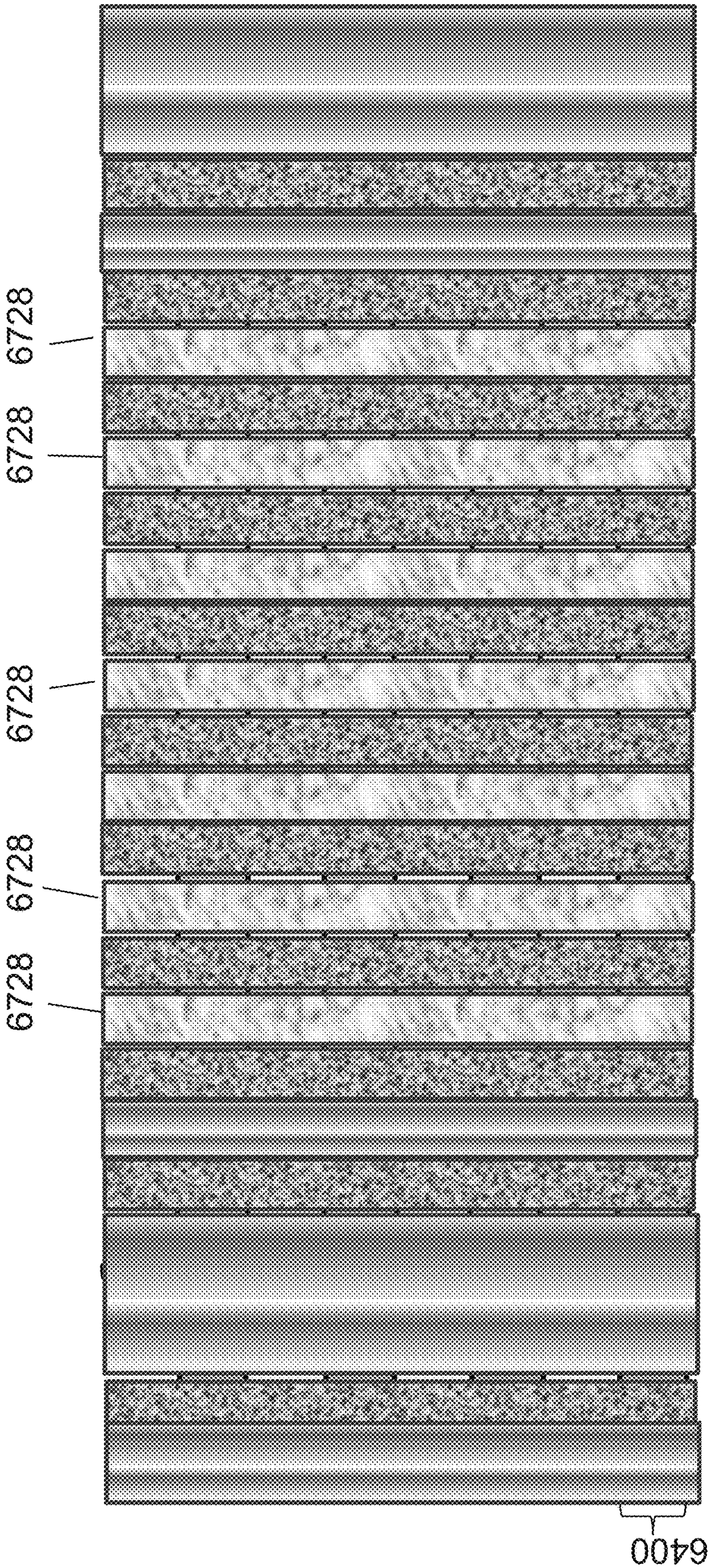

FIG. 67F illustrates the structure after the step of deposition of the RRAM/OTP layers 6728.

Figure 67G:
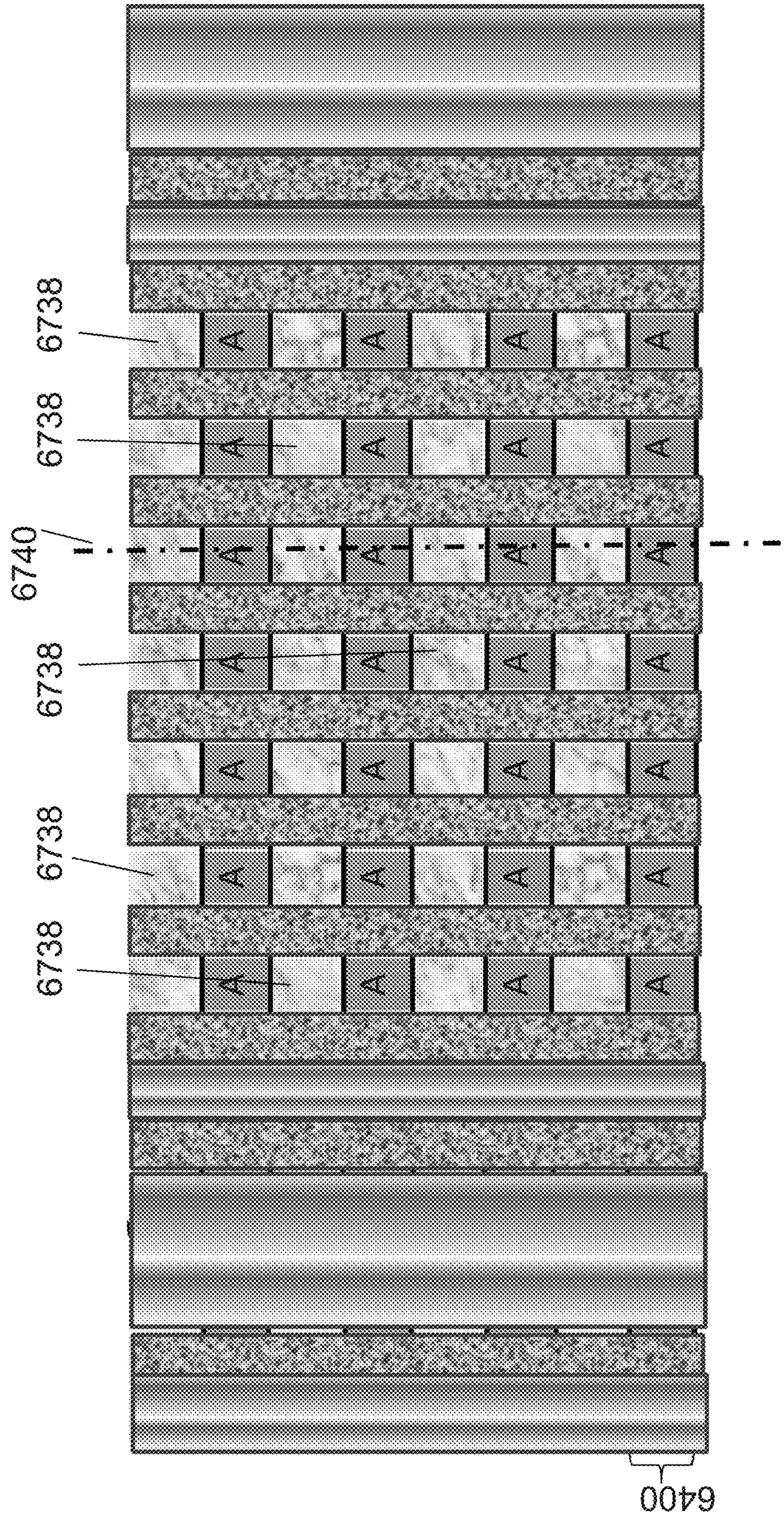

FIG. 67G illustrates the structure after removing the top surface of these layers by CMP or other technique, exposing the individual pillars 6738. Dash line 6740 will be utilized in FIG. 67G.

For proper operation a select device should be added to each pillar. These select devices, for example, could be an active transistor or a diode. The select device could use the vertical transistor or diode embedded within the ridges or may added in as polysilicon TFT devices. A simple flow could start by first etching the very top portion of these pillars.

Figure 67I:
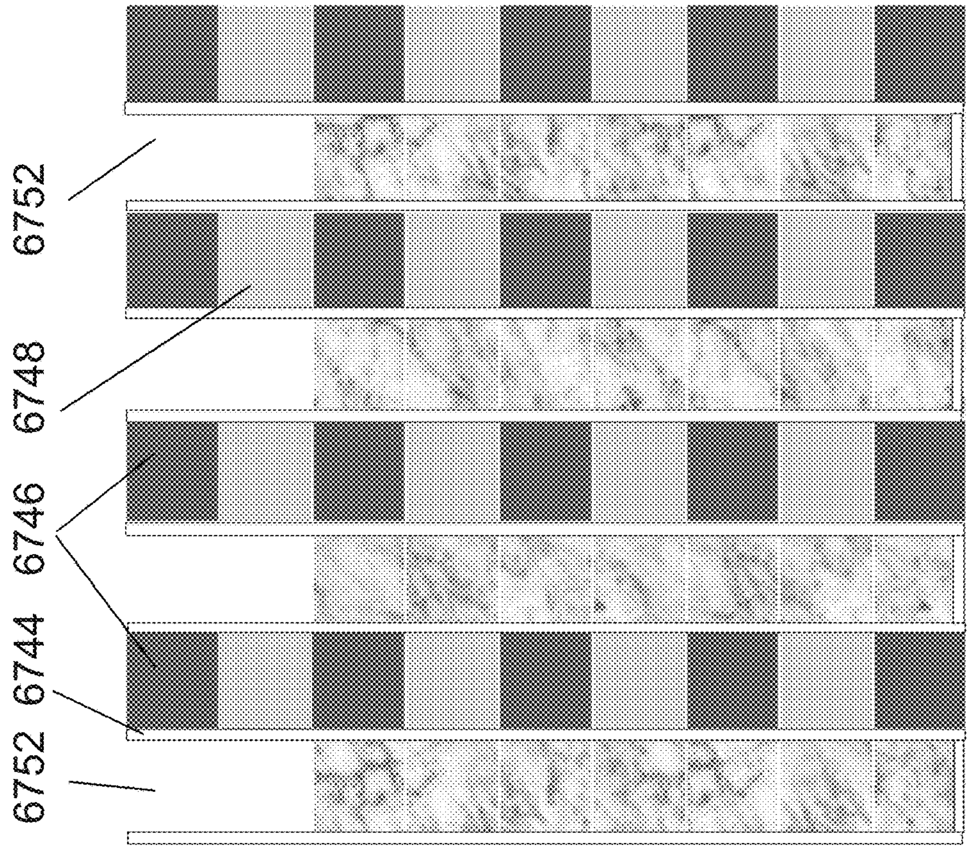
Figure 67H:
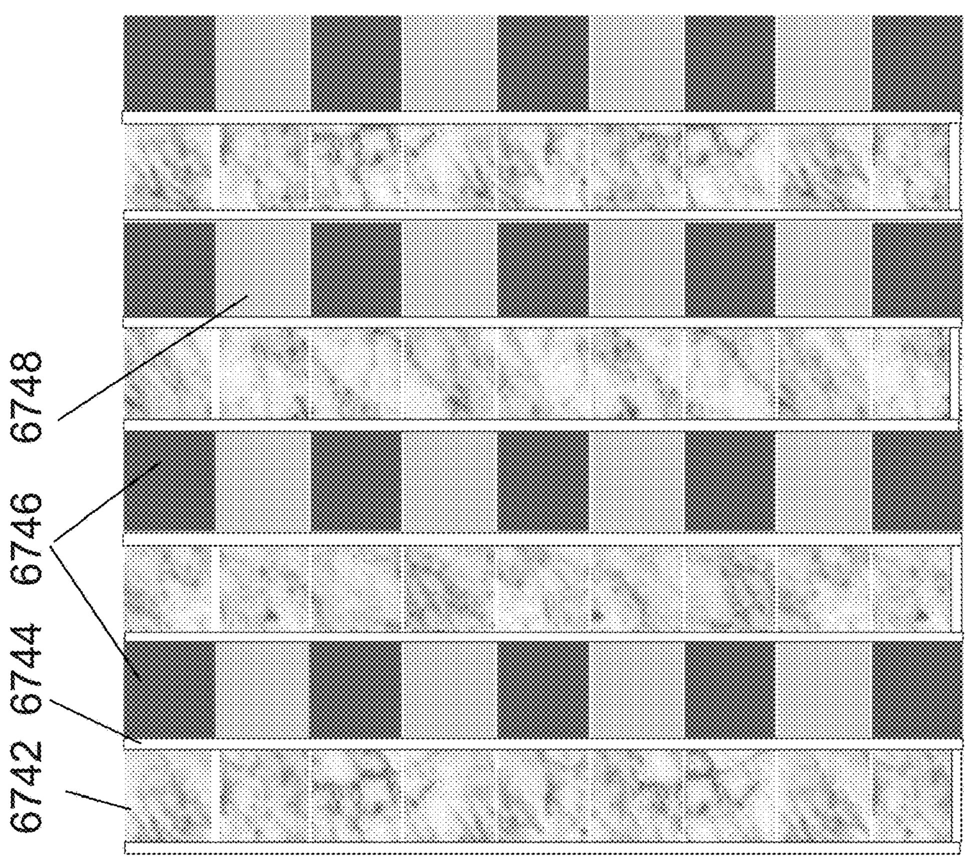

FIG. 67H illustrates a side cut view along dash line 6740. It illustrates the RRAM/OTP electrodes filled 6742, the thin oxide barriers 6744, the S/D lines 6746, and the filled oxide 6748 between the S/D lines. Oxide, of course, could instead be a semiconductor process/device compatible dielectric.

FIG. 67I illustrates the structure after removing the top portion of the RRAM/OTP electrode thus forming voids 6752.

Figure 67K:
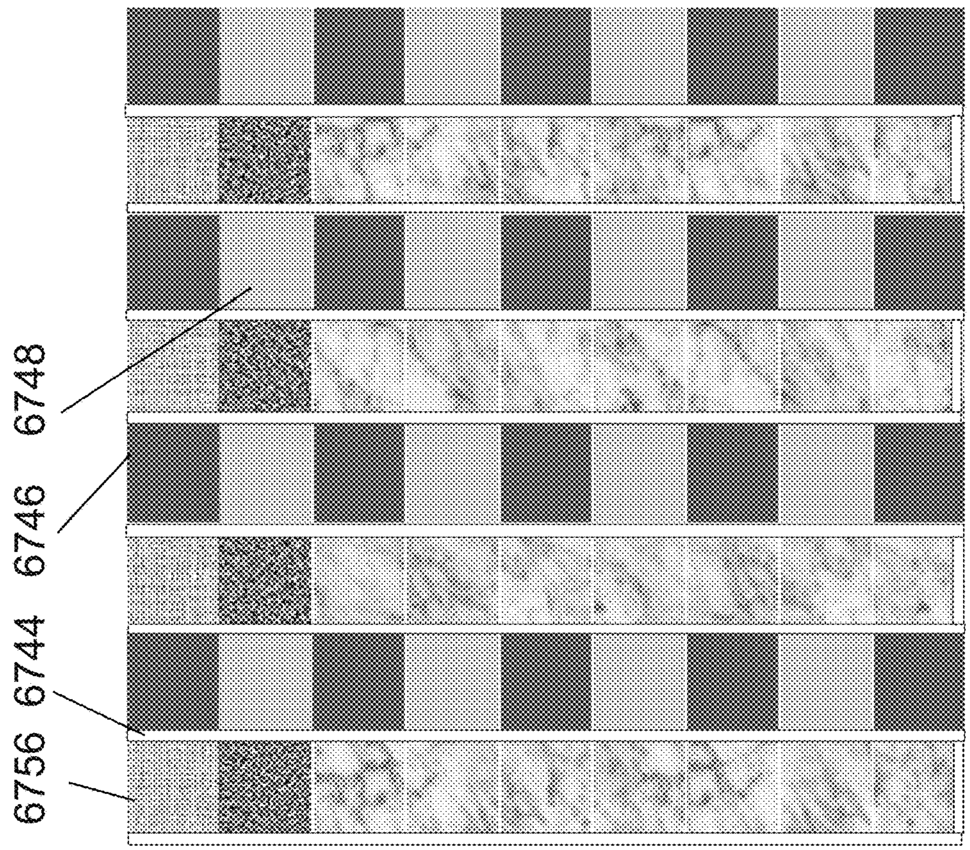
Figure 67J:
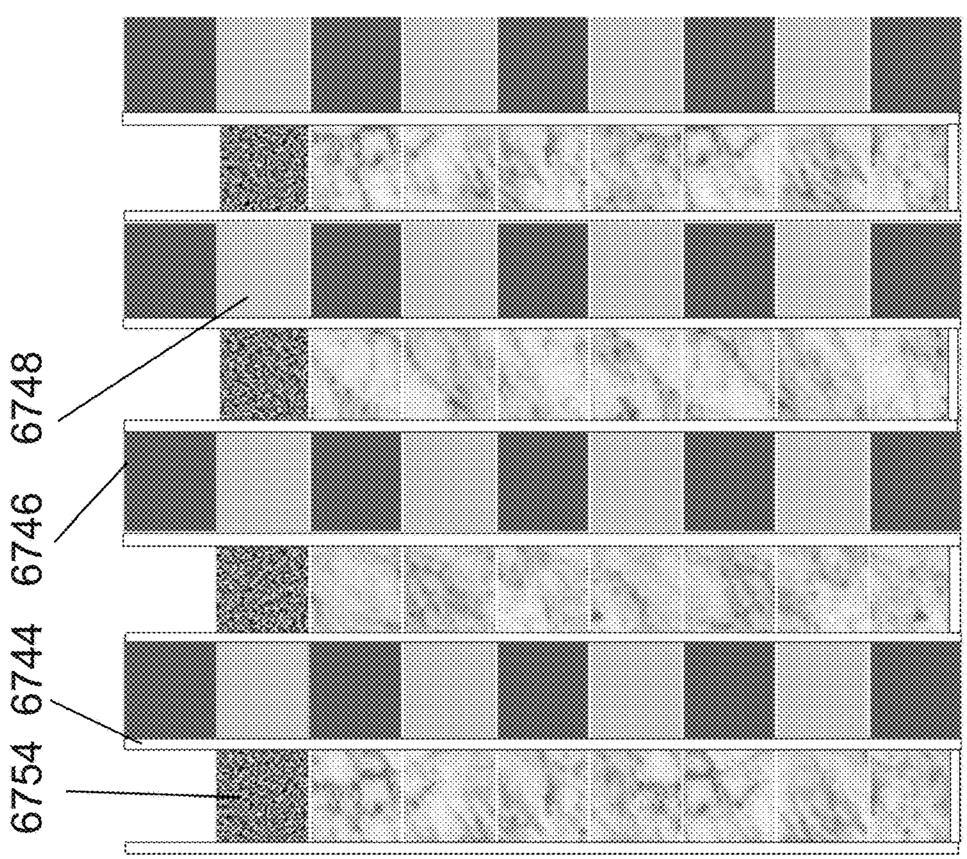

FIG. 67J illustrates the structure after filling in an N in-situ doped poly silicon 6754.

FIG. 67K illustrates the structure after follow-on filling in a P in-situ doped poly silicon 6756, thus completing the select device. In some alternatives the electrode itself could be part of the diode and the filling step could utilize one material type to complete the diode.

In some alternatives, the structure could include both type of pillars, RRAM and OTP. The OTP could function well for routing which might not need to be altered, for example, such as providing ground "0" to the lower S/D bar of the LUT-4; while the RRAM could function well for connections that would be desired to be reprogrammed. Herein, the junctionless transistor portions arranged in the horizontal plane are selectively replaced by the RRAM and/or OTP. These pillars could also be used for signal input or output by adding additional select elements such as diodes or transistors to protect interference with the pillar programming operation. It is important to note that the RRAM and OTP represented herein are desired to be Ohmic rather than self-rectifying.

The pillar could now be connected to word-lines. It could be desired to connect them in odd/even similar to the first gates connection illustration of FIG. 13A (WL2, WL3, WL5, WL6, . . . ).

OTP pillars are easier to construct, could offer easier programming and be good enough for most routing applications.

RRAM offer re-programmability and could also be used as embedded non-volatile memory. RRAM pillars could also be used to reduce the need for a JLT process. For such the S/D lines for the logic Ridges could be made with built-in disconnection gaps. RRAM pillars could be used to bridge the gaps with the help of the adjacent Ridge S/D lines for the programming phase.

Without JLT the routing fabric could be a bit less efficient as vertical gaps could be made in all ridges of the fabric in odd/even phases, or other patterns, and RRAM pillars could be used to route signals to adjacent ridges for routing in the S/D lines direction.

RRAM pillars could also be used to allow the ripple programming option for per layer bit-lines structure formation as an alternative to the troublesome stair-case process. For this a modified flow of the one presented in FIG. 63B-63G could be used.

In such a modified flow, first vertical transistors could be programmed to "On" by first S/D contact 6311 and the corresponding first gate. Than first RRAM pillar could be connected to second S/D line 6332. Now using the first RRAM pillar a second vertical transistor could be turned "On", and then third S/D line 6333 could be connected to second RRAM pillar. And so forth for all S/D lines. Then all the turned "On" vertical transistors could be turned Off and the correspond RRAM pillars could provide per layer connection to the S/D lines.

Another alternative use of these programmable vertical pillars (RRAM/OTP) is to help overcome poor yield of JLT structures. As discussed for the S/D lines to embed JLT the channel need to be sized below 20 nm—'necking'. In processing such thin 'necks' there is a possibility that some of these necks may be fully disconnected. Such disconnection could present a challenge to program the transistors connected to the permanently disconnected S/D line.

Having the 3D NOR fabric being very memory fabric like, a self-test could be used to write and test read all locations in the fabric to identify defects and such permanently disconnected S/D lines. Using the connected S/D lines the pillars and 'ripple' style programming, a flow could be performed to program those transistors and overcome their S/D lines disconnection. Such flow could be illustrated using FIG. 68.

Figure 68A:
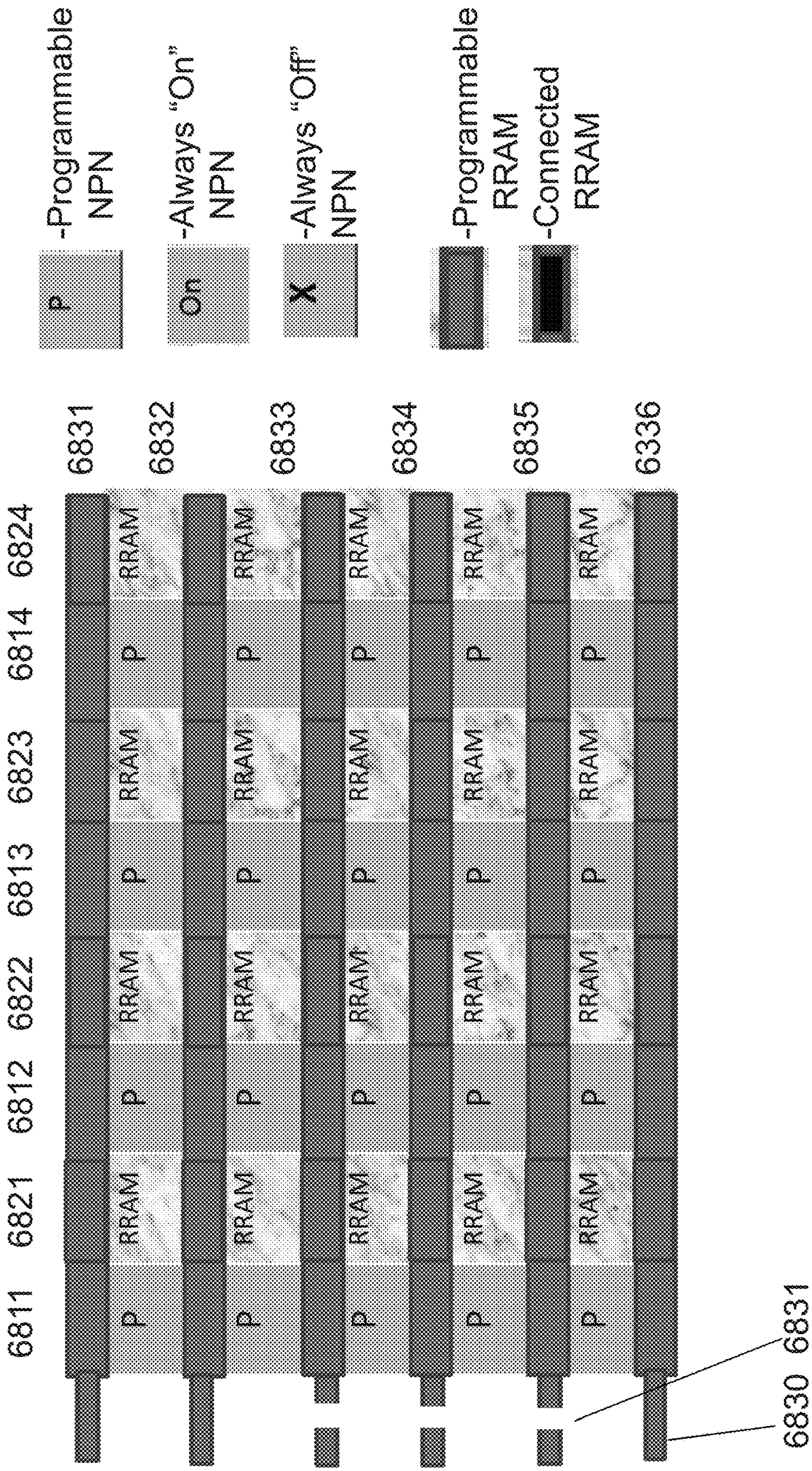
FIGS. 68A-68H are example illustrations of programming transistors to overcome S/D lines disconnection with the fabric.

FIG. 68A is a modified illustration from FIG. 63A illustrating the replacement of second gates with RRAM pillars $1^{st}$ RRP 6821, $2^{nd}$ RRP 6822, $3^{rd}$ RRP 6823, $4^{th}$ RRP 6824. On the right side there is the symbol map. The S/D line $6^{th}$ SD 6336 has a JLT neck 6830 while the S/D line $5^{th}$ SD 6835 has its JLT 'neck' 6831 disconnected and so are the JLTs of S/D lines $3^{rd}$ SD 6833 and $4^{th}$ SD 6834.

Figure 68B:
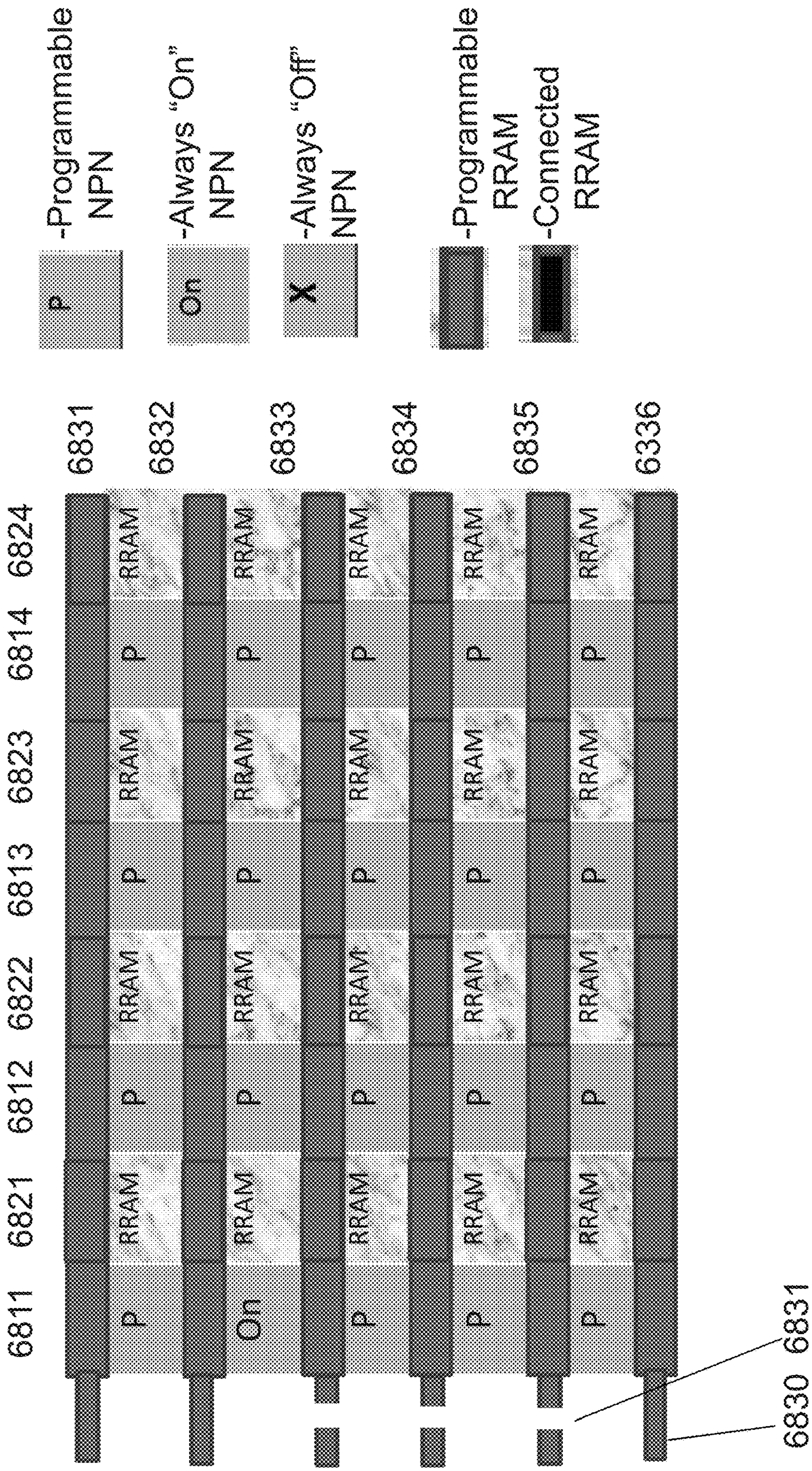

FIG. 68B illustrates the first step of the ripple recovery flow. It illustrates ripple tuning "On" the junction of column $1^{st}$ CC 6811 in between S/D lines $2^{nd}$ SD 6832 and $3^{rd}$ SD 6833.

Figure 68C:
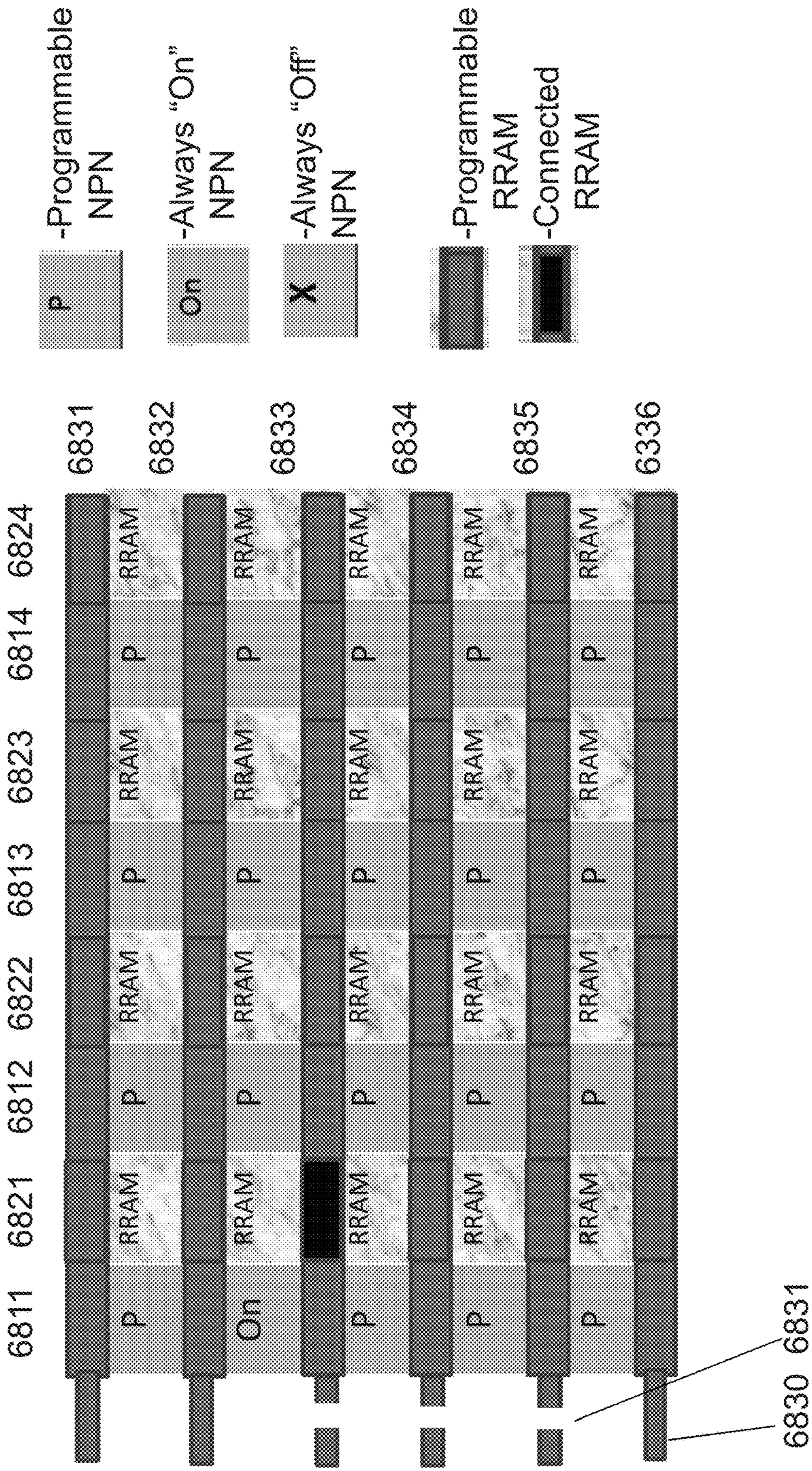

FIG. 68C illustrates the following step of the ripple recoveiy flow. It illustrates connecting the RRAM pillar $1^{st}$ RRP 6821 to the S/D line $3^{rd}$ SD 6833 using S/D line $2^{nd}$ SD 6832 and the recent turned On transistor.

Figure 68D:
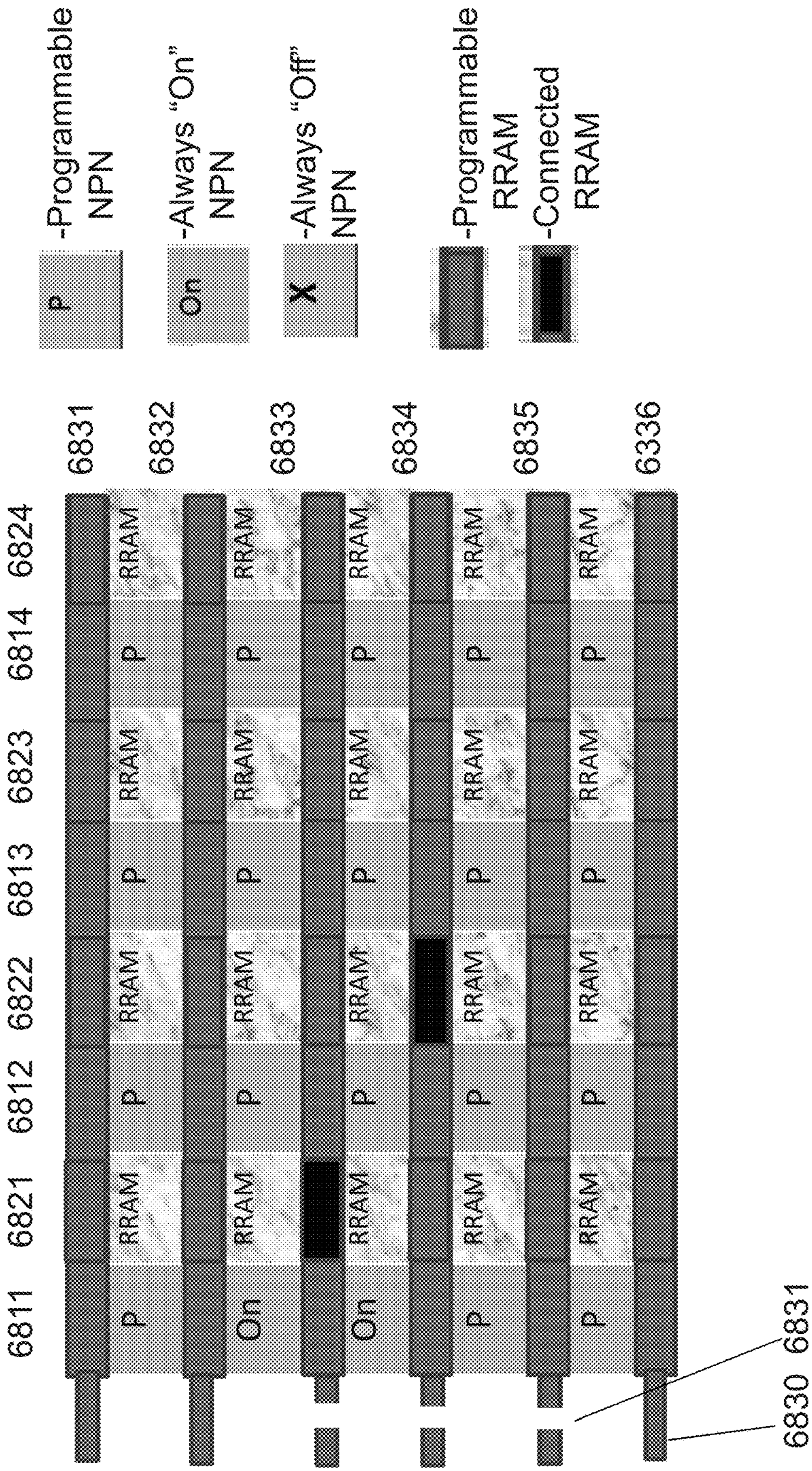

FIG. 68D illustrates the following step of the ripple recoveiy flow. It illustrates connecting the RRAM pillar $2^{nd}$ RRP 6822 to the S/D line $4^{th}$ SD 6834 using S/D line $2^{nd}$ SD 6832 after the ripple tuning "On" of the junction of column $1^{st}$ CC 6811 in between S/D lines $3^{rd}$ SD 6833 and $4^{th}$ SD 6834.

Figure 68E:
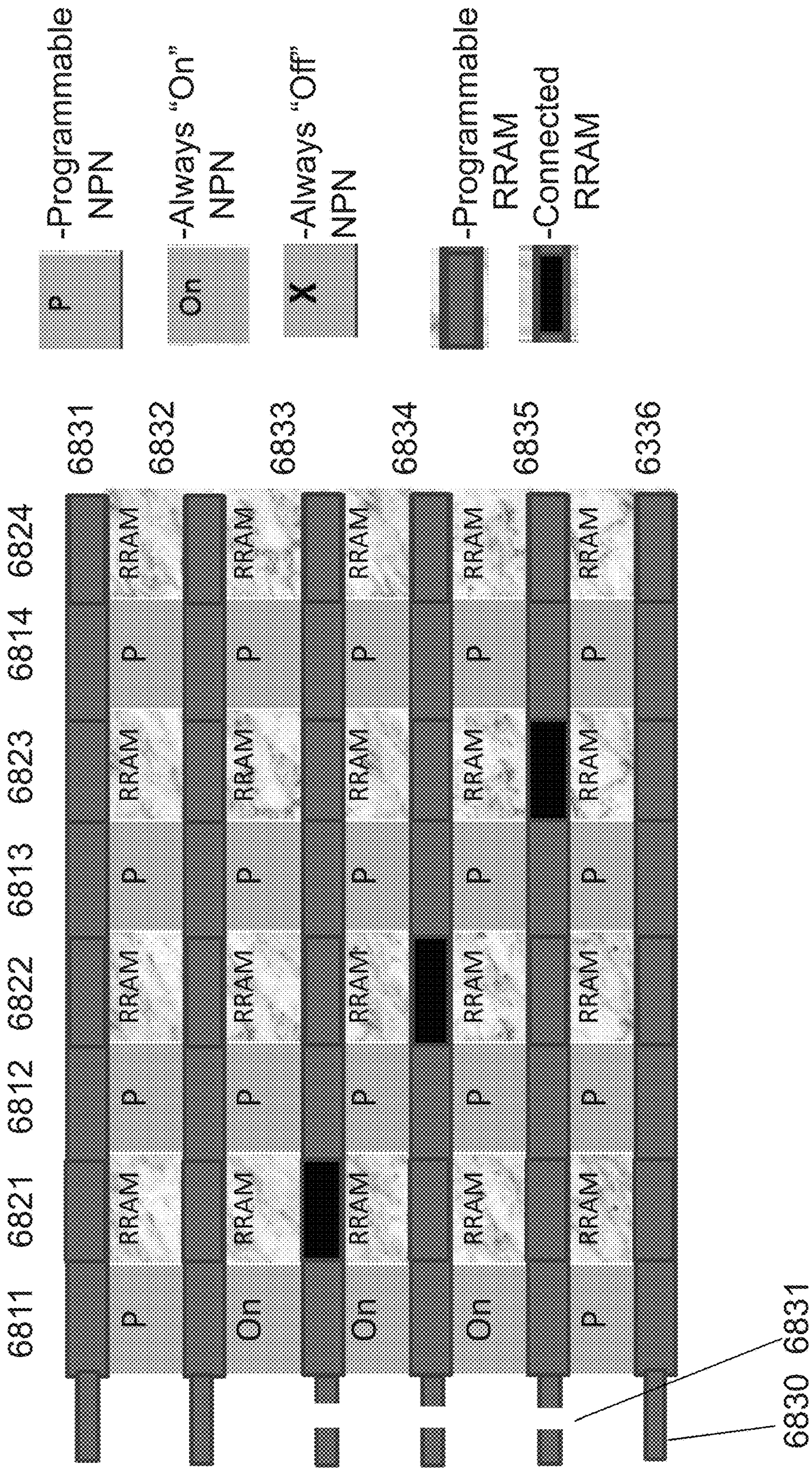

FIG. 68E illustrates the following step of the ripple recovery flow. It illustrates connecting the RRAM pillar $3^{rd}$ RRP 6823 to the S/D line $5^{th}$ SD 6835 using S/D line $2^{nd}$ SD 6832 after the ripple tuning "On" of the junction of column $1^{st}$ CC 6811 in between S/D lines 4th SD 6834 and $5^{th}$ SD 6835.

Figure 68F:
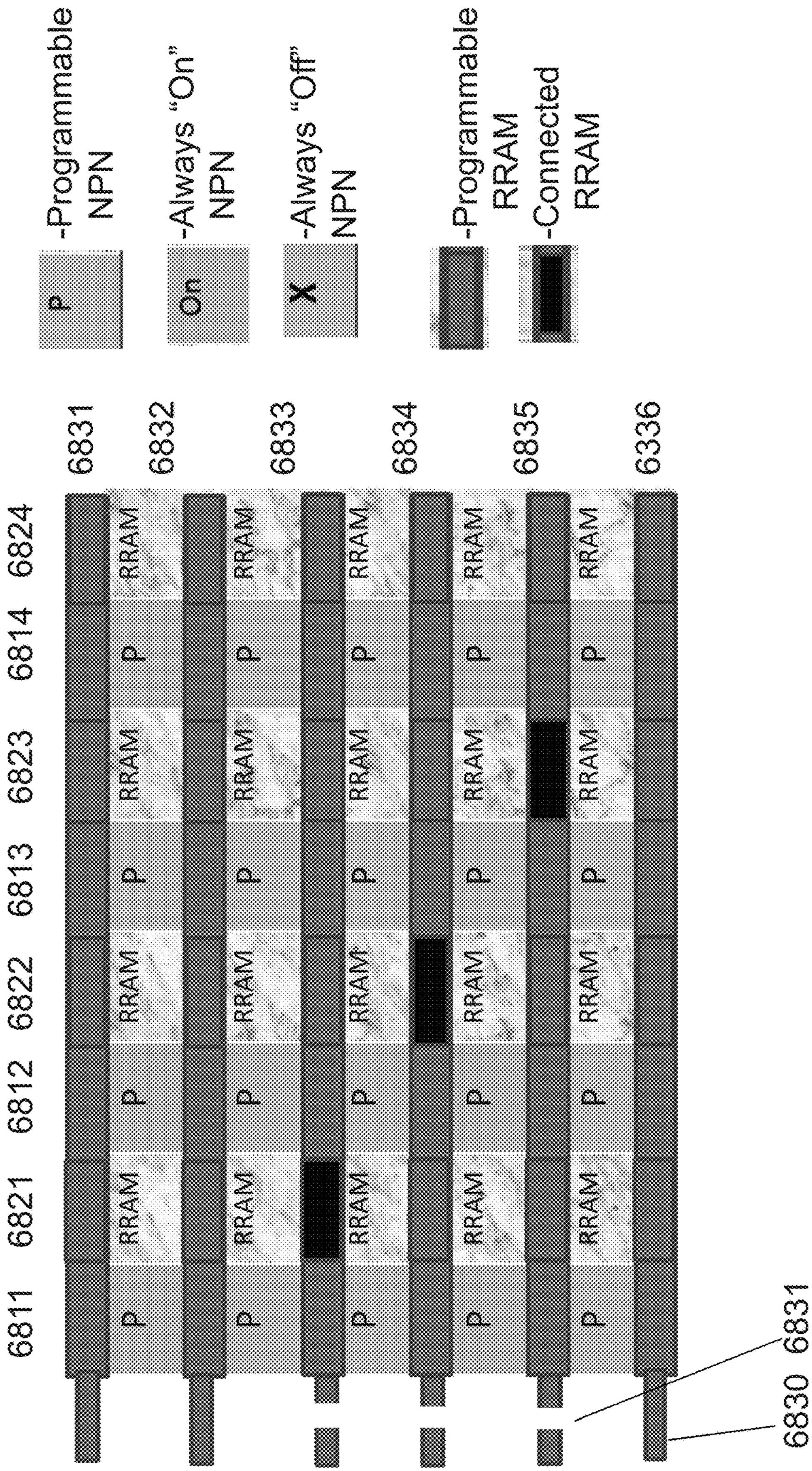

FIG. 68F illustrates the following step of the ripple recovery flow. It illustrates erasing the "On" transistors of column 1st CC 6811.

Figure 68G:
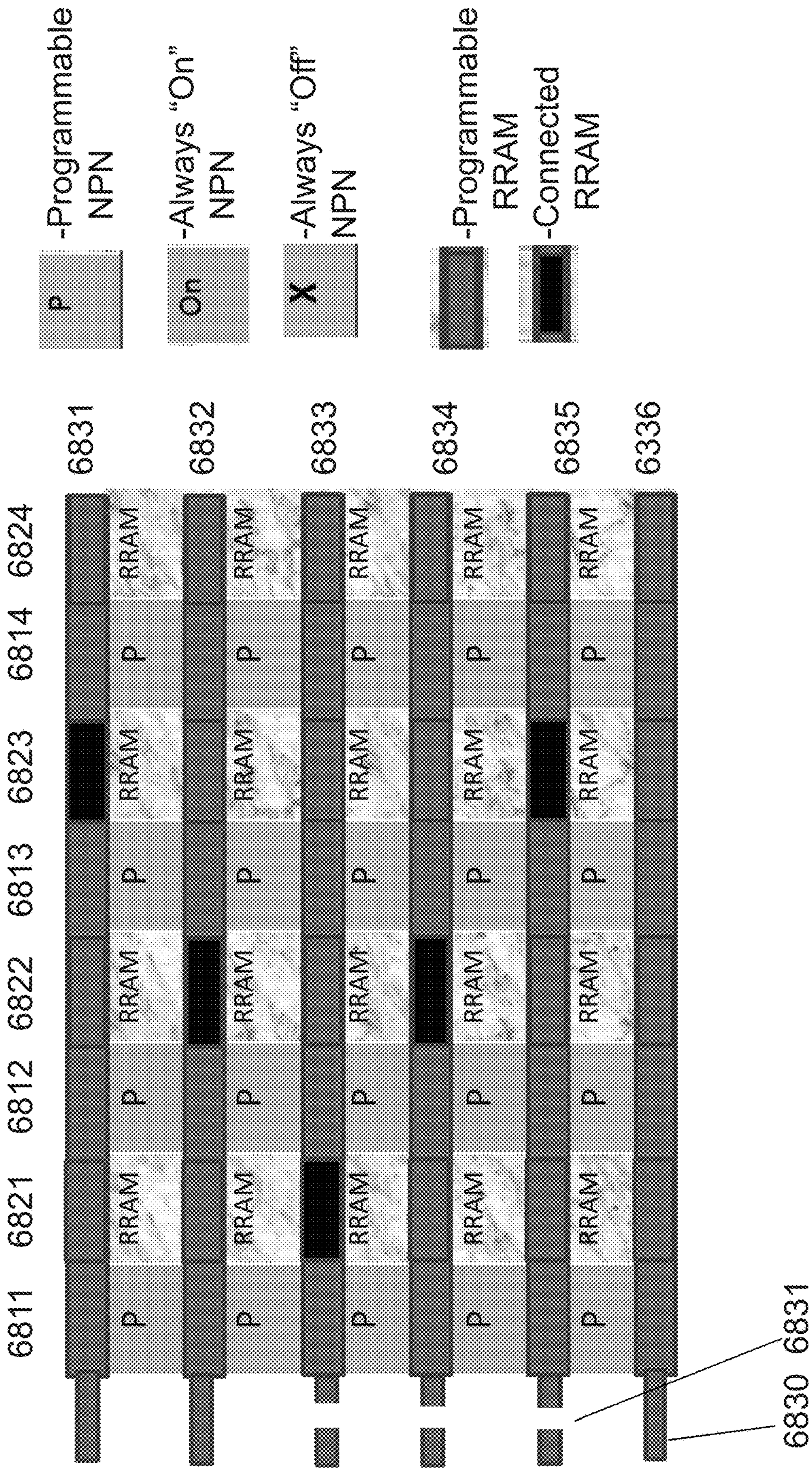

FIG. 68G illustrates the following step of the ripple recovery flow. It illustrates connecting pillar $2^{nd}$ RRP 6822 also to S/D line $2^{nd}$ SD 6832 and connecting pillar $1^{st}$ RRP 6823 also to S/D line $1^{st}$ SD 6831. Now the channels between disconnected S/D bars $4^{th}$ SD 6834 and $5^{th}$ SD 6835 could be programmed by S/D lines $1^{st}$ SD 6831 and $2^{nd}$ SD 6832 using the RRAM pillars $2^{nd}$ RRP 6822 and $3^{rd}$ RRP 6823.

Figure 68H:
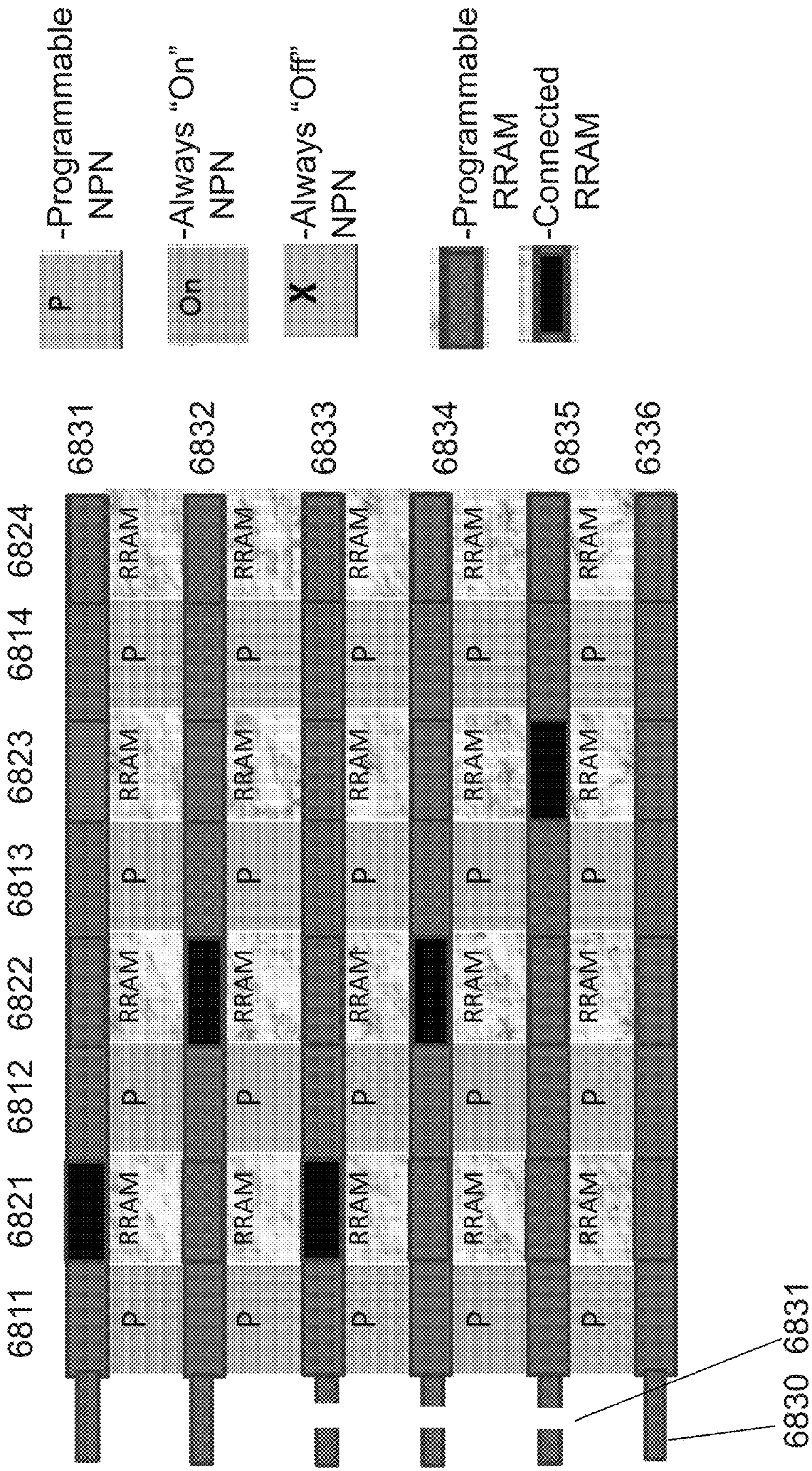

FIG. 68H illustrates the following step of the ripple recovery flow. It illustrates disconnecting pillar $3^{rd}$ RRP 6823 from S/D $1^{st}$ 6831 and connecting the RRAM pillar $1^{st}$ RRP 6821 instead. Now the channels between disconnected S/D bars $3^{rd}$ SD 6833 and $4^{th}$ SD 6834 could be programmed by S/D lines $1^{st}$ SD 6831 and $2^{nd}$ SD 6832 using the RRAM pillars $2^{nd}$ RRP 6822 and $3^{rd}$ RRP 6823.

Once programmed the pillars could be disconnected from the unbroken S/D lines $1^{st}$ SD 6831 and $2^{nd}$ SD 6832 and normal programming could resume. There are other variations and alternative recovery flows that could be made possible using the RRAM/OTP pillars.

Figure 69B:
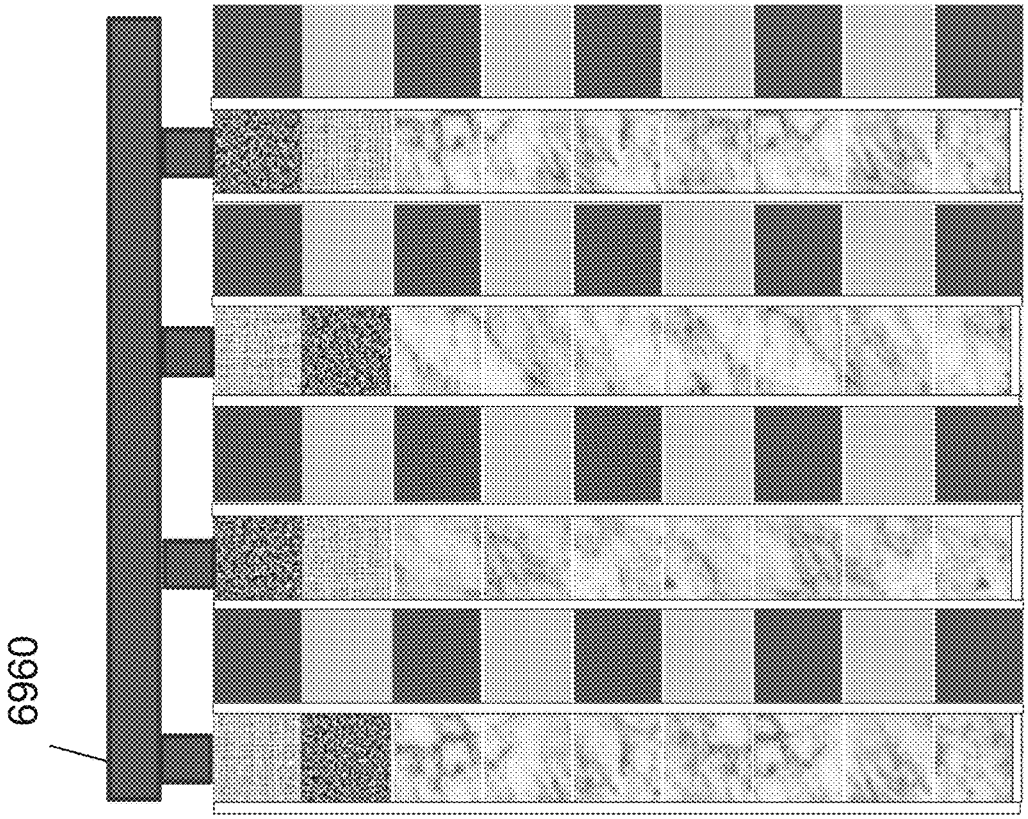
FIGS. 69A-69D are example illustrations of access devices to the RRAM/OTP pillars.
Figure 69A:
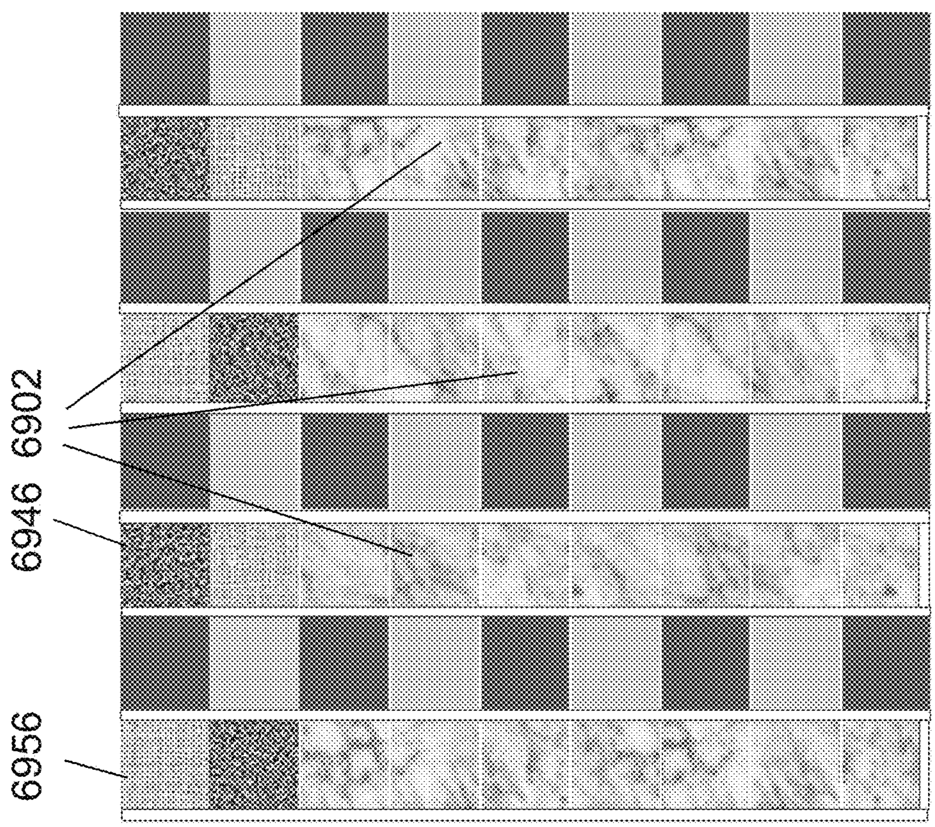

An additional alternative is to form the diode access device to the RRAM/OTP 6902 pillars electrode in two steps forming NP diodes for the odd pillars 6956 and PN diodes for the even pillars 6946 as is illustrated in FIG. 69A. In such case these pillars could be connected to the word-line 9690 as illustrated in FIG. 69B. The programming of the RRAM/OTP will use positive voltage for the even pillars programming and negative voltage for the odd pillars programming FIG. 69C illustrates formation of reverse diodes $1^{st}$ RD 6972 and $2^{nd}$ RD 6974 on the other side/end of the RRAM/OTP pillars 6902.

Figure 69D:
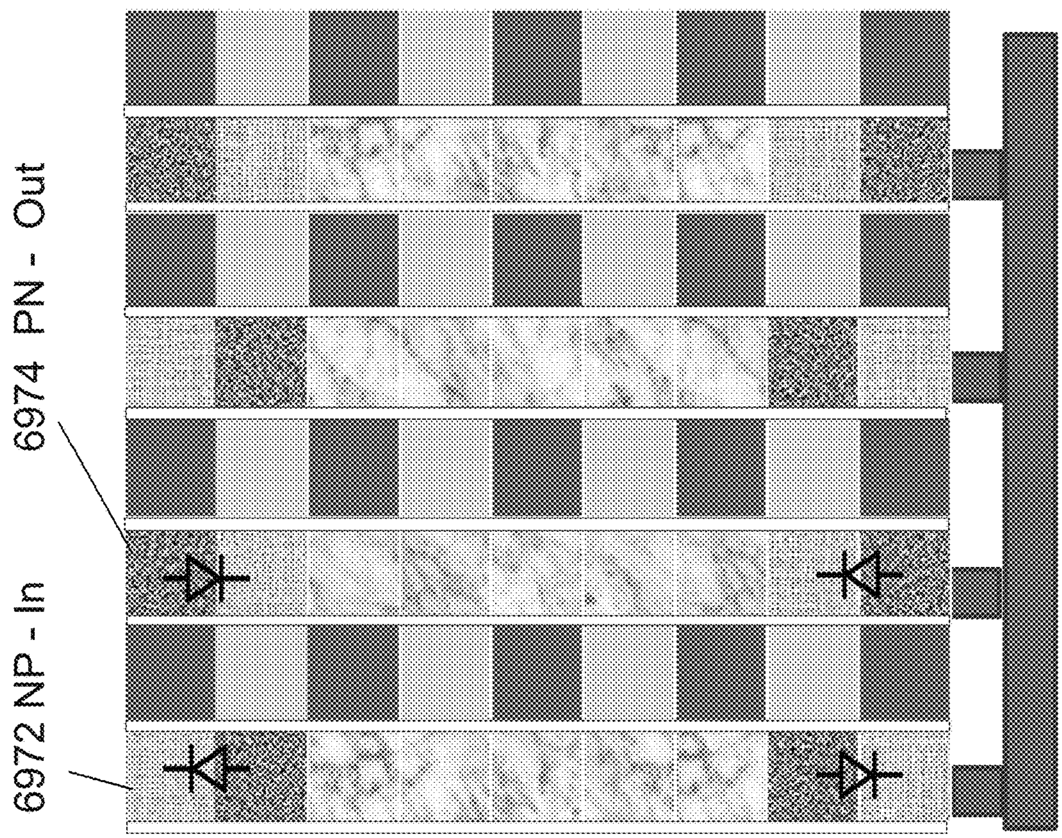
Figure 69C:
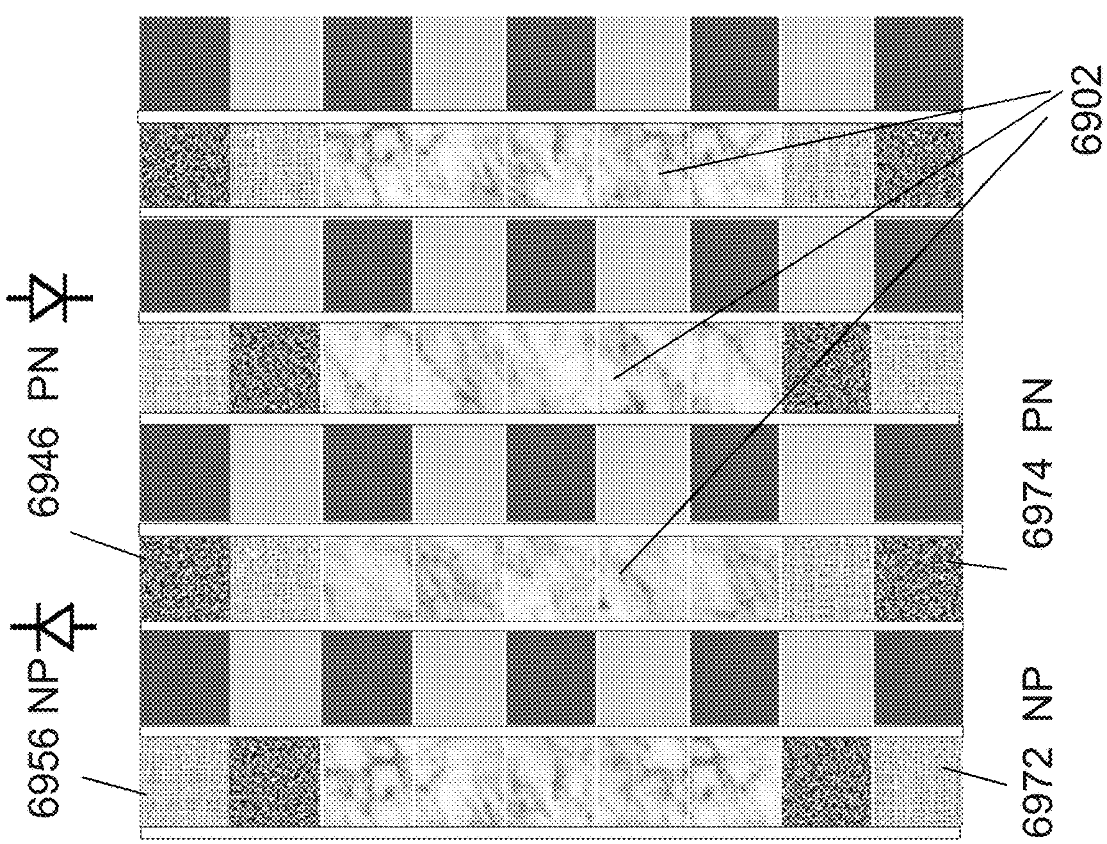

FIG. 69D illustrates the structure flipped so the word-line for the RRAM/OTP pillar programming is now at the bottom while the top side of the Pillar could be used for signal Input 6972 of the Fabric or Output 6974

Figure 70A:
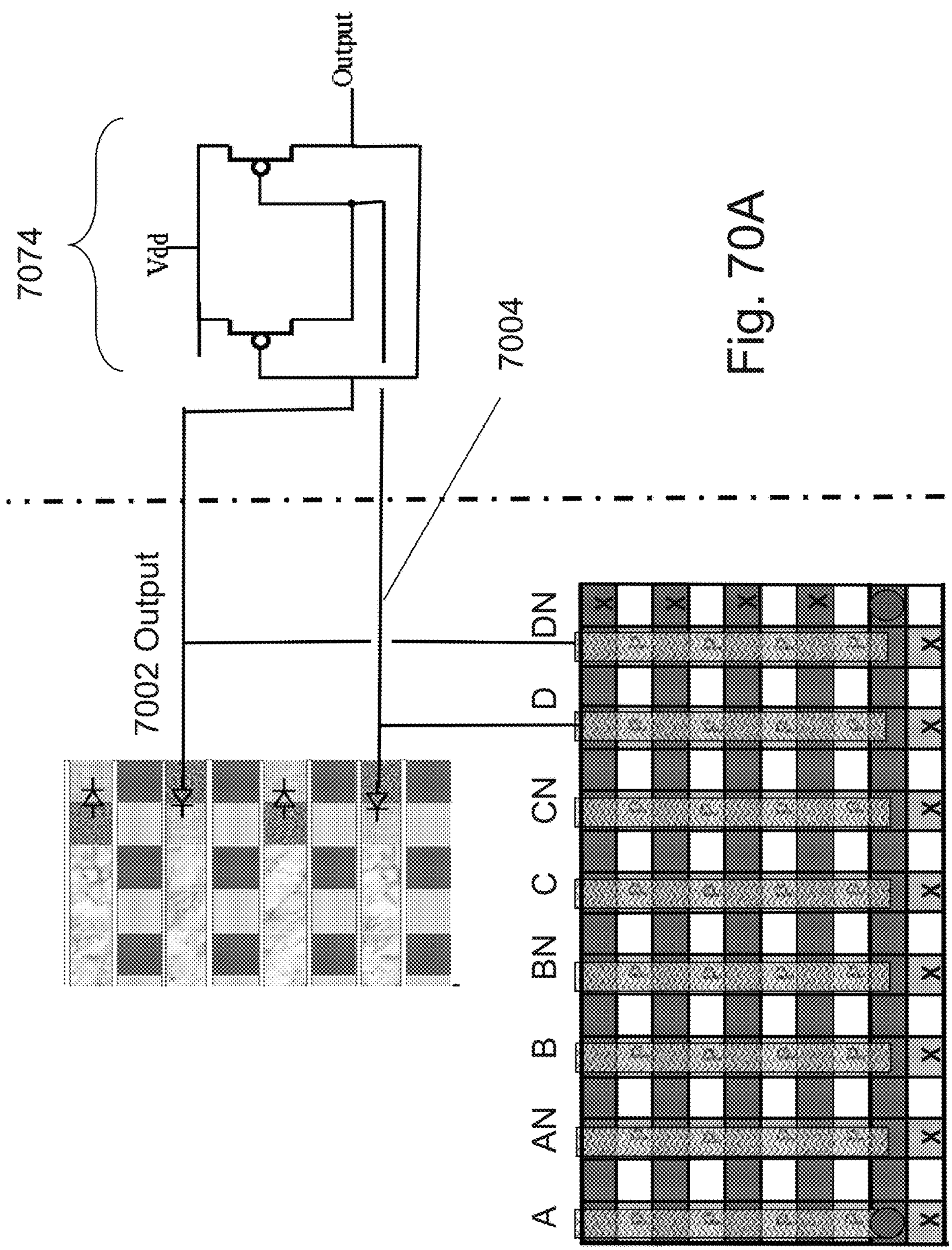
FIGS. 70A-70B are example illustrations of signal structuring.

FIG. 70A illustrates an example of signal structuring. Complementing logic signals are routed within the fabric using S/D segments, pillar segments and/or vertical channel column segments arriving to the top side of the fabric $1^{st}$ Out 7002 and $2^{nd}$ Out 7004. These signals may be then reconstructed by the half latch 7074, which may be disposed in the overlaying logic support circuits, and then fed to the gates of the next level LUT-X. Such could be implemented for each of the LUTs inputs. The dashed line is indicating the physical separation of the circuit portion within the 3D NOR fabric and the circuit portion within the logic layer/stack.

Figure 70B:
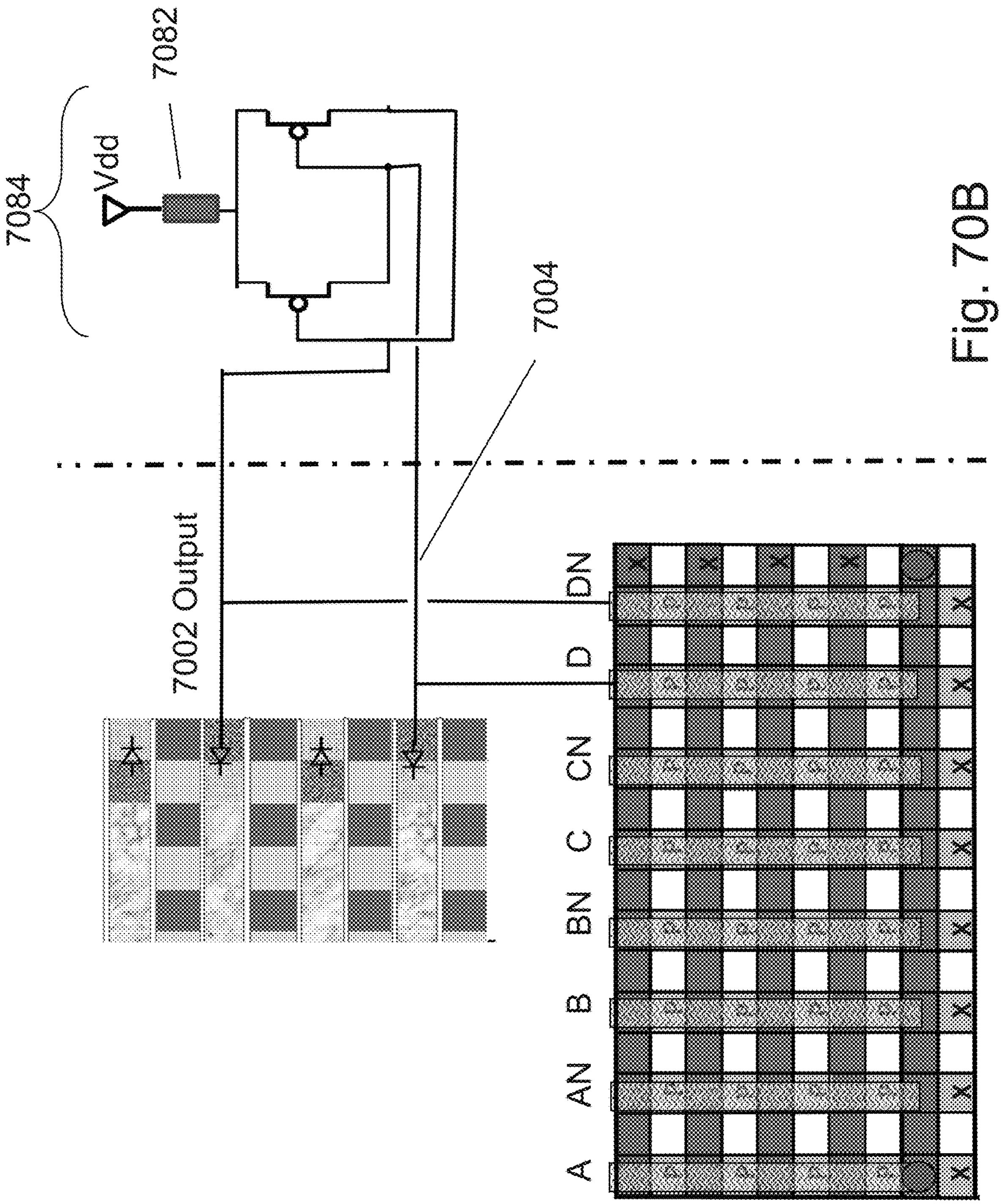

FIG. 70B illustrates alternative signal structuring. It uses a similar structure as half latch 7084 but instead of having the P transistors connected directly to Vdd they are connected a high resistance element 7082. This modified half latch is less of signal reconstruction circuit and more wire conditioning circuit supporting lower power operating option.

Figure 71:
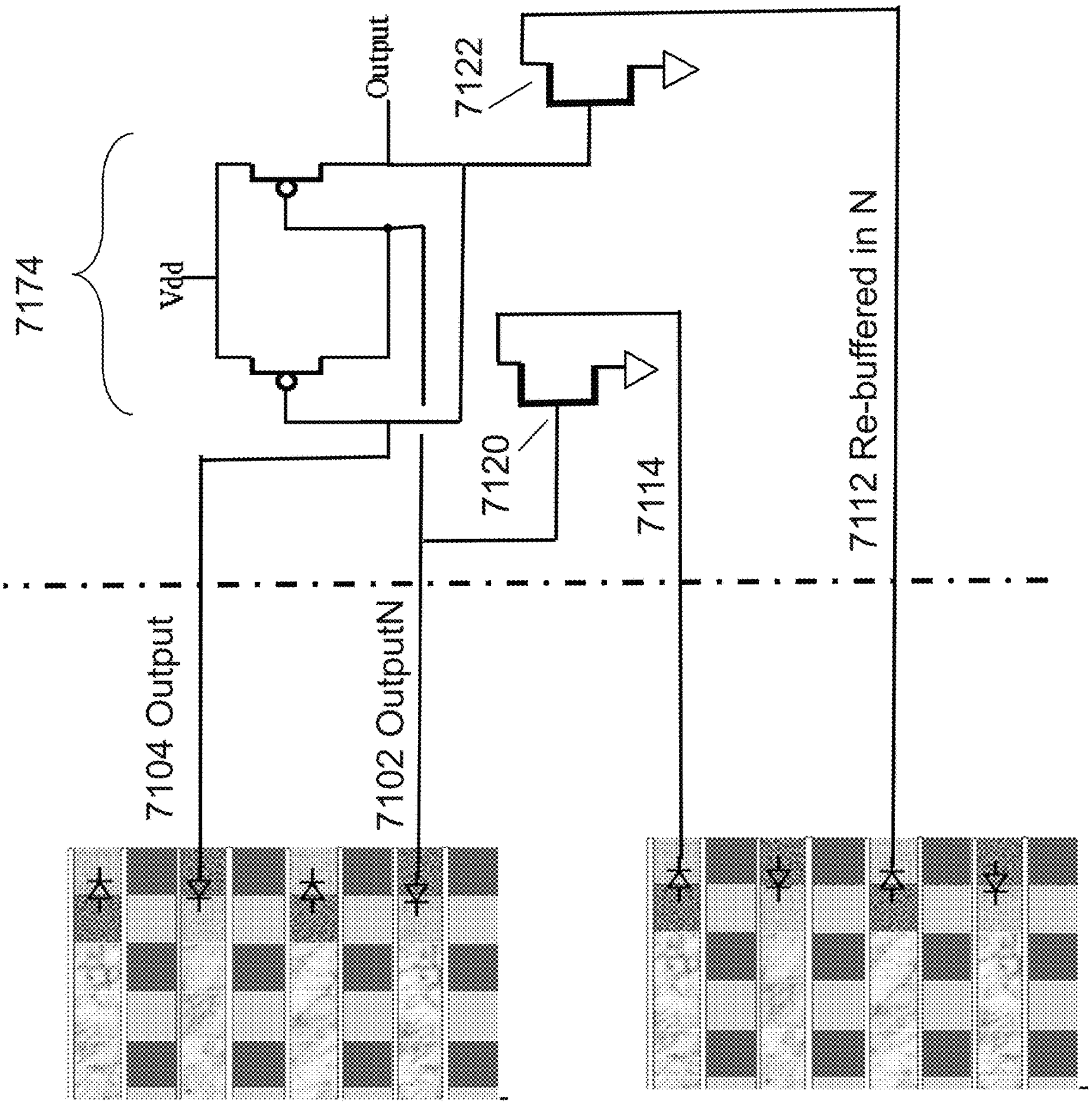
FIG. 71 is an example illustration of signal re-buffering.

FIG. 71 illustrates optional signal re-buffering. The routed signal Output 7104 and its complement OutputN 7102 may be output through the pillar, reconstructed by half latch 7174 and re-driven by two N transistors 1st N 7120 and 2nd N 7122 and fed back to the fabric via 1st Input 7114 and 2nd Input 7112 through the appropriate pillars.

Figure 72:
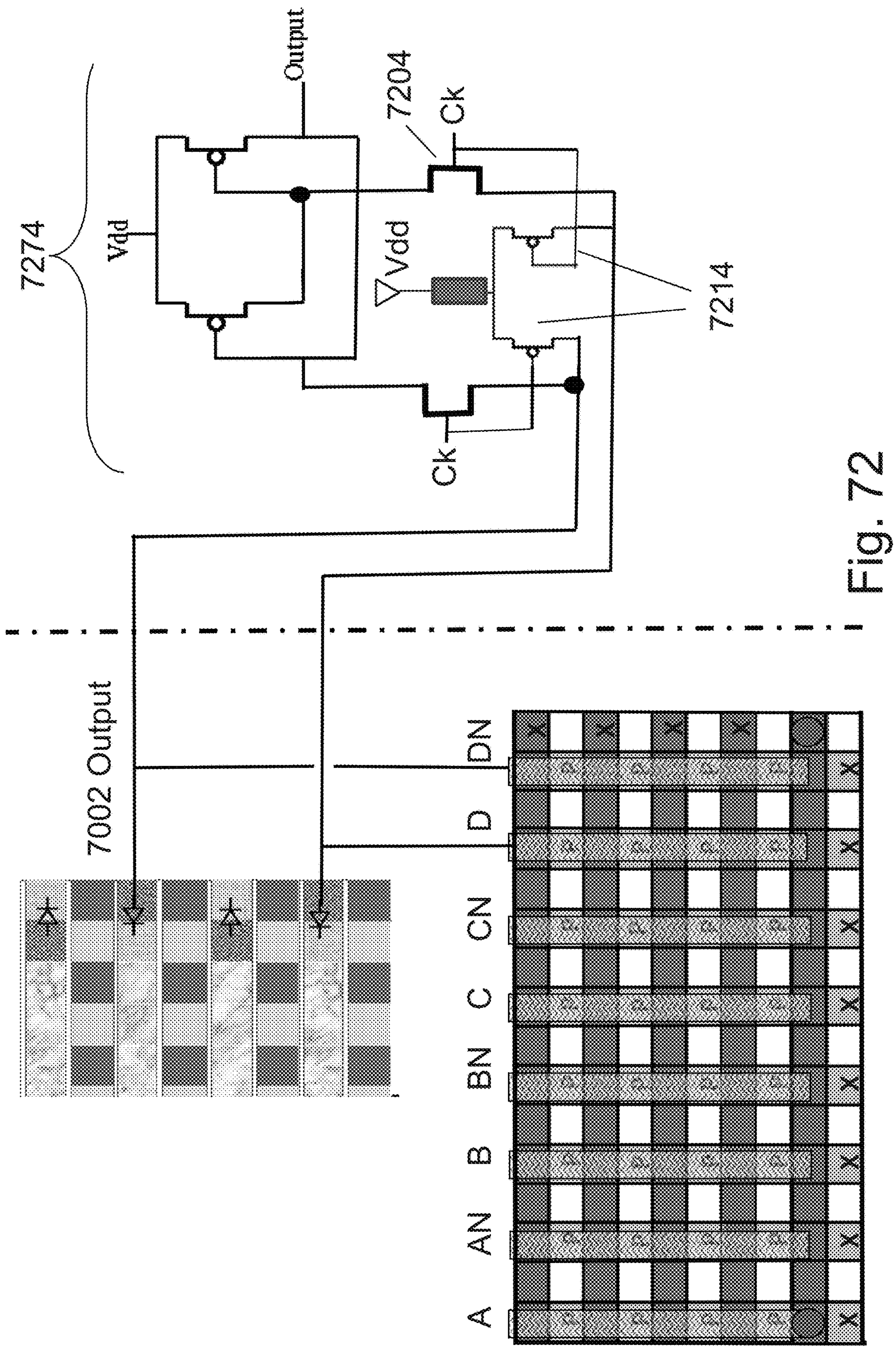
FIG. 72 is an example illustration of a clocked output reconstruction circuit.

FIG. 72 illustrates optional clocked output reconstruction circuit 7274. The circuit could include clocked control to allow the signal to reach the half-latch only when the clock signal is high and otherwise the lines are pulled up by weak pull up structure 7214. Such could help reduce the power consumption and provide a latched input to the LUTs.

In another alternative the embedded JLT 6451 could be replaced by P doped poly silicon thus forming a lateral NPN transistor integrated into the S/D lines.

The flow could start first by filling oxide in-between S/D lines just as was shown for the RRAM/OTP pillar formation flow. Then, using non directional etch in defined window regions designated for lateral channel are etch in the S/D lines. Then P doped poly silicon may be deposited in a non-directional deposition techniques such as ALD could be used to fully fill the etched S/D regions. Then using directional etch the side poly is removed leaving the poly integrated with the S/D lines. Laser and other annealing techniques could be used to crystallize the poly silicon and integrate it with S/D N type silicon to complete formation of the lateral NPN transistors. Then third O/N/O and gate could be deposited and formed, substantially completing the structure.

Figure 73A:
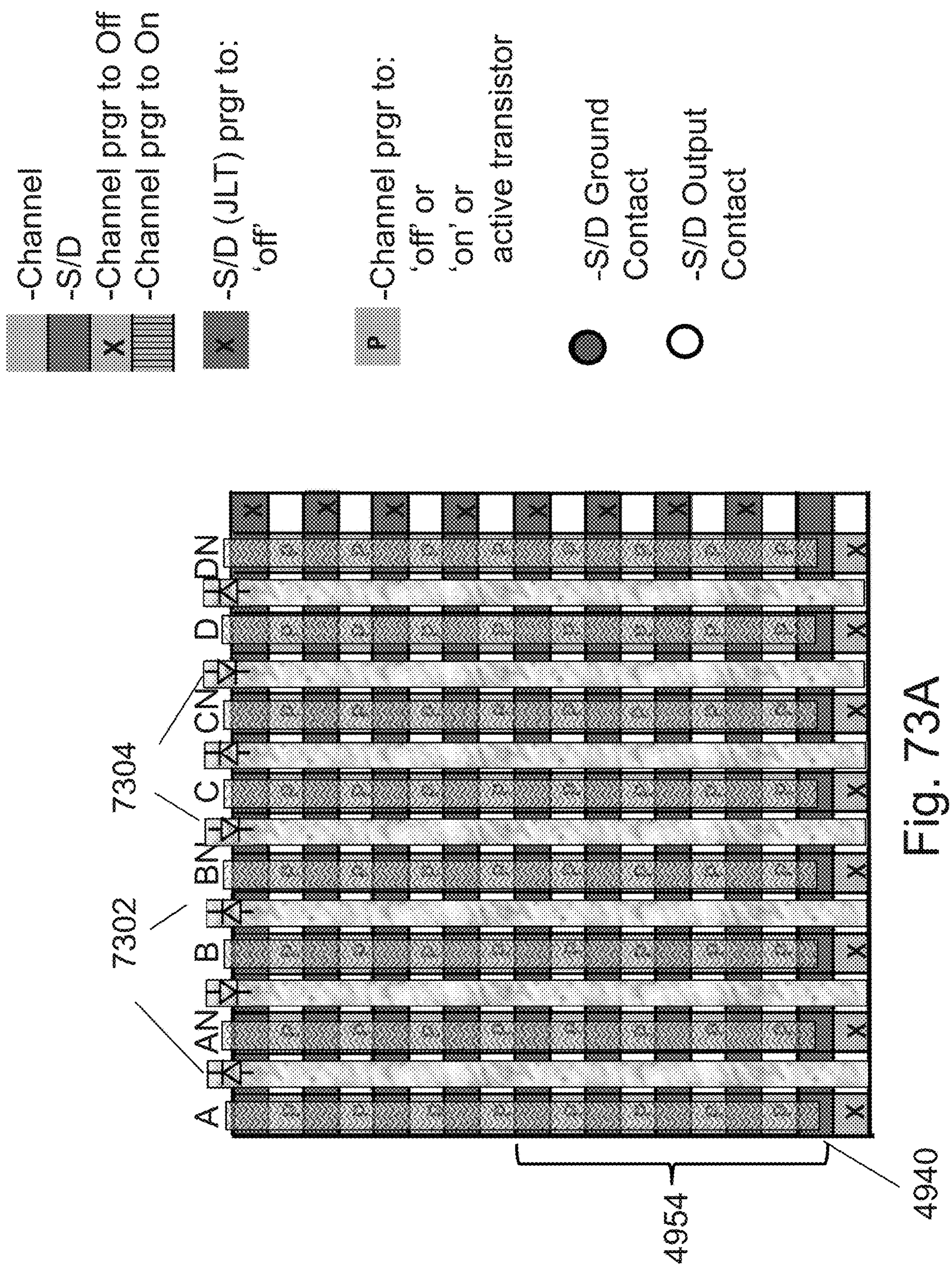
FIGS. 73A-73B are example illustrations of a structure being programmed to act as two LUT-2s.
Figure 73B:
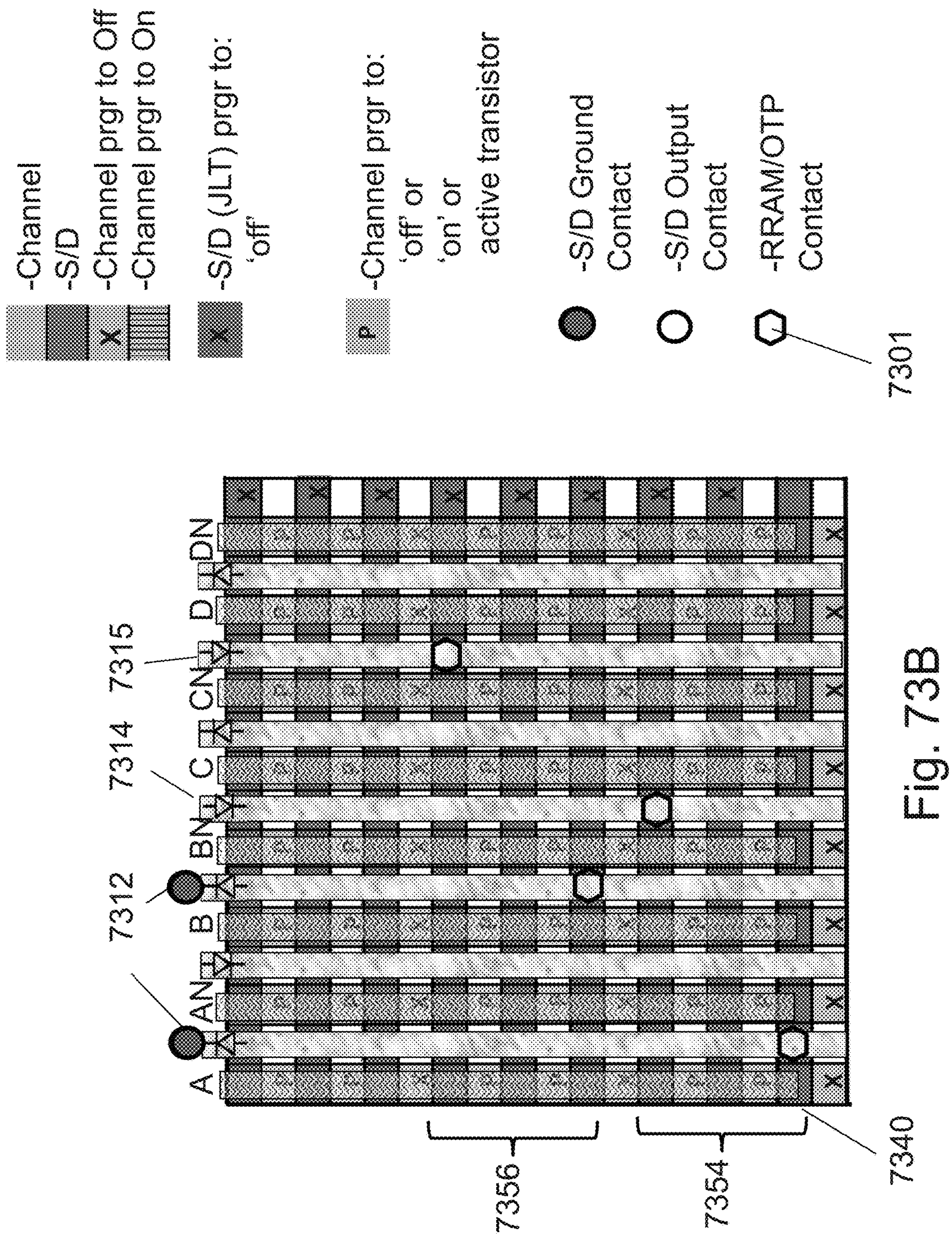

The RRAM/OTP pillars 7302, 7304, could be used to form connection into the LUT-X logic cell to enable cell programming such as converting one LUT-4 into two LUT-2s, as is illustrated in FIG. 73B. This flexibility could be used in many ways, for example, such as outputting of a mid-term within a LUT-X, or inputting terms from other functions.

FIG. 73A illustrates the LUT-4 structure of FIG. 49C with adding the 'input' pillars 7302 and output pillars 7304.

FIG. 73B illustrates the structure being programmed to act as two LUT-2s. The symbol map on the right includes symbol 7301 to indicate connection from pillar to the S/D strip. A "0" signal is connected by pillars 7312 to the base of two LUT-2s 1st L2 7354 and 2nd L2 7356. In between them the channel is programmed to "Off"—X. The LUT-2s 1st L2 7354 could use pillar Out 1 7314 as its output and the LUT-2 2nd L2 7356 could use pillar Out 2 7315 as its output. Many variations could be implemented including which of the 4 inputs (A, B, C, D) would act on each of the LUT-2s (1st L2 7354, 2nd L2 7356)

Figure 74A:
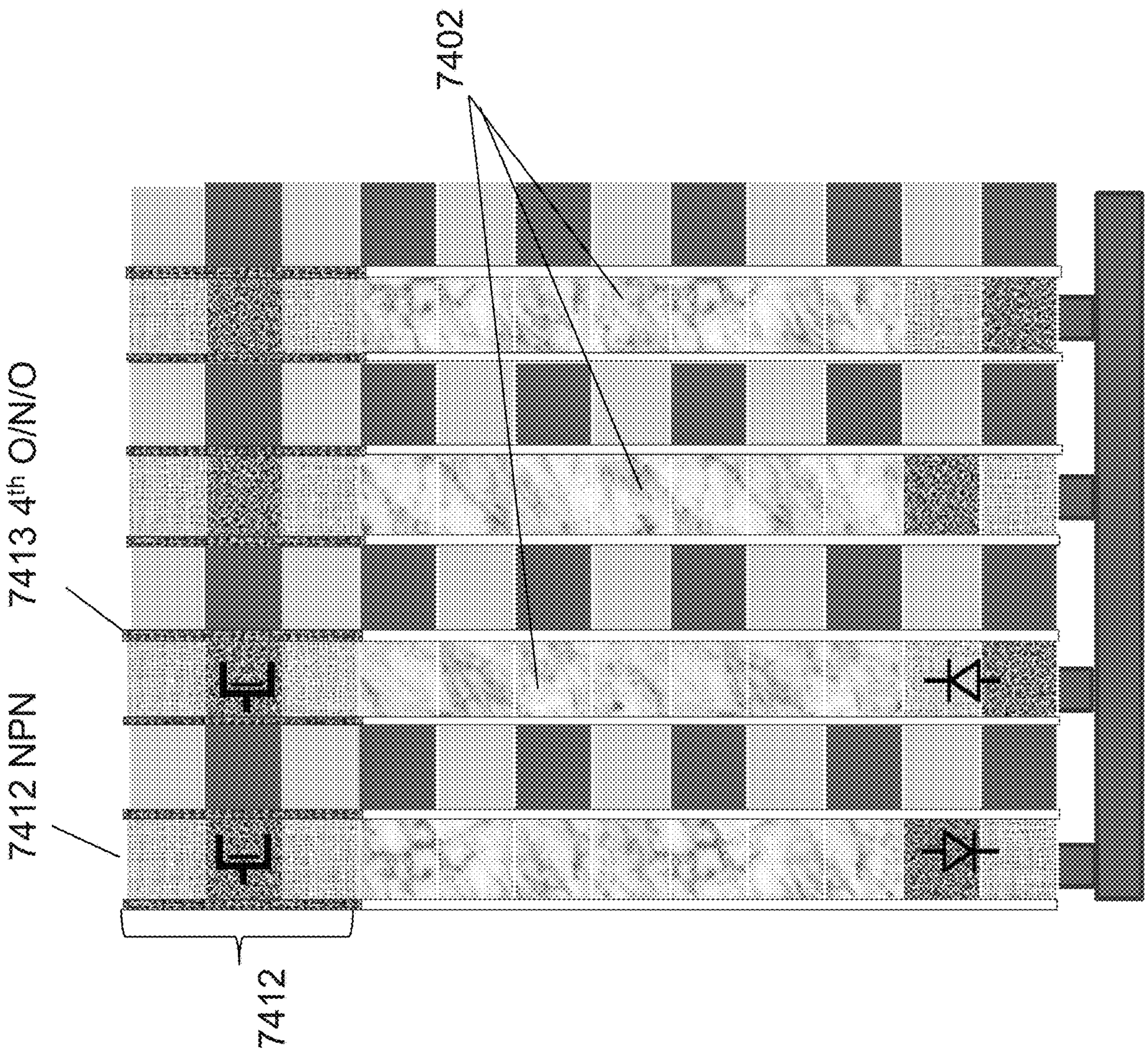
FIGS. 74A-74G are example illustrations of logic/programming access to the RRAM/OTP pillars.

FIG. 74A illustrates an alternative for the logic access to the RRAM/OTP pillars 7402. Using poly silicon deposition into the top pillars NPN TFT transistors 7412 could be formed.

Figure 74B:
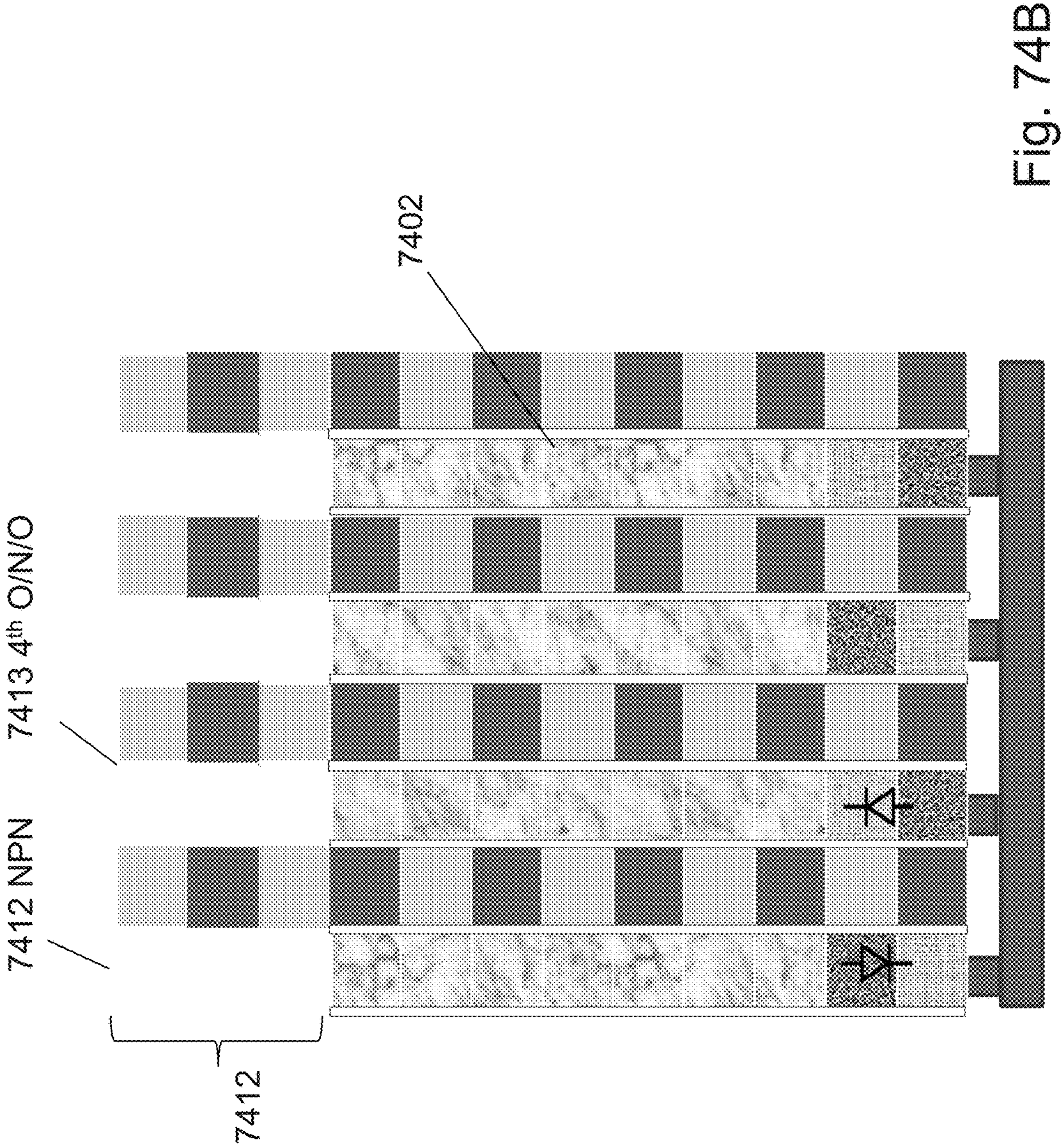

FIG. 74B illustrates the structure after a step of timed directional etch of the RRAM/OTP electrodes following with non-directional etch of the resistive switching material.

Figure 74C:
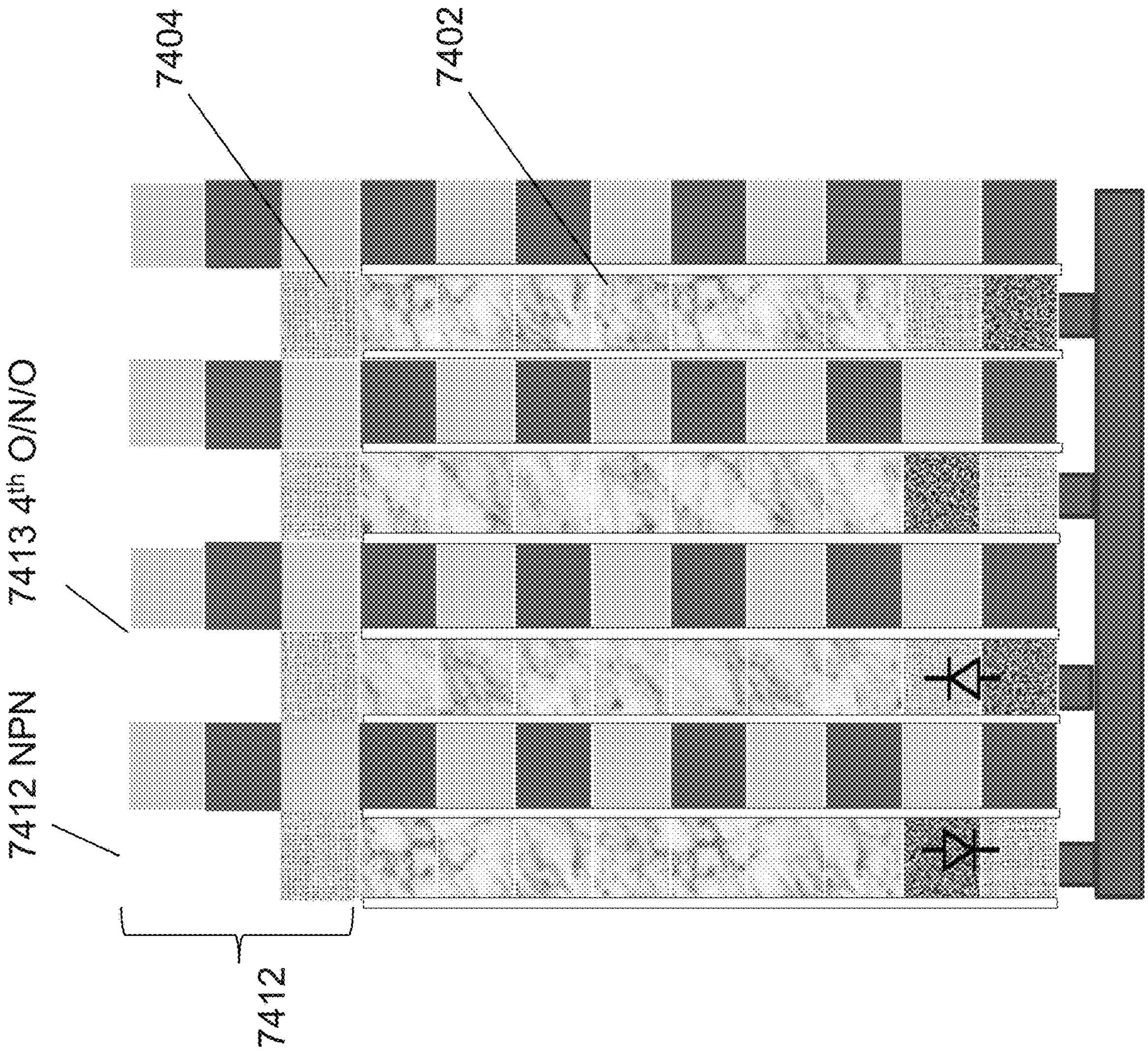

FIG. 74C illustrates the structure after directional deposition of N type polysilicon 7404.

Figure 74D:
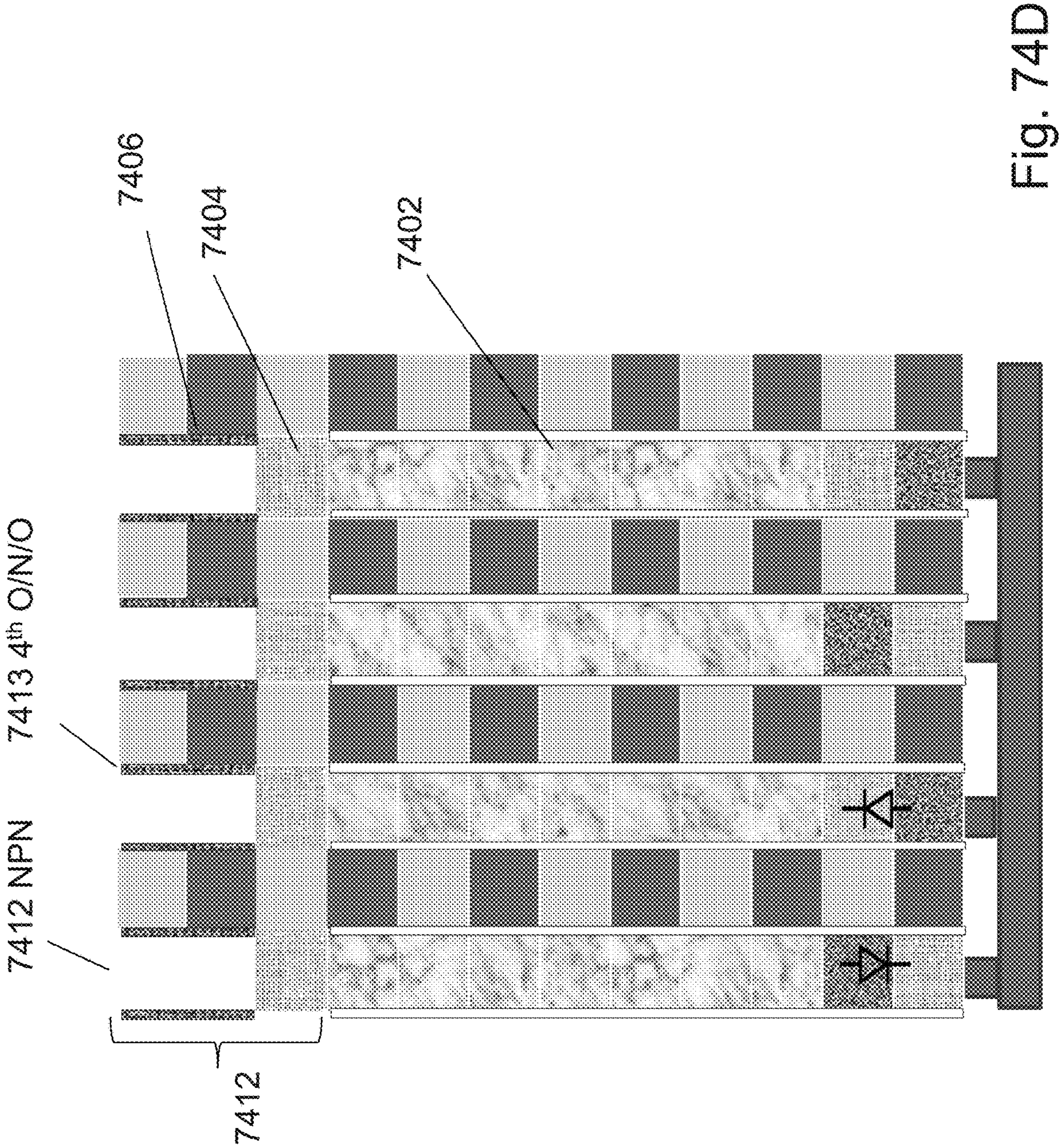

FIG. 74D illustrates the structure after ALD of 3rd O/N/O 7406, followed by directional etch (or potentially a light CMP) to remove it from the top surface of the N type polysilicon 7404.

Figure 74E:
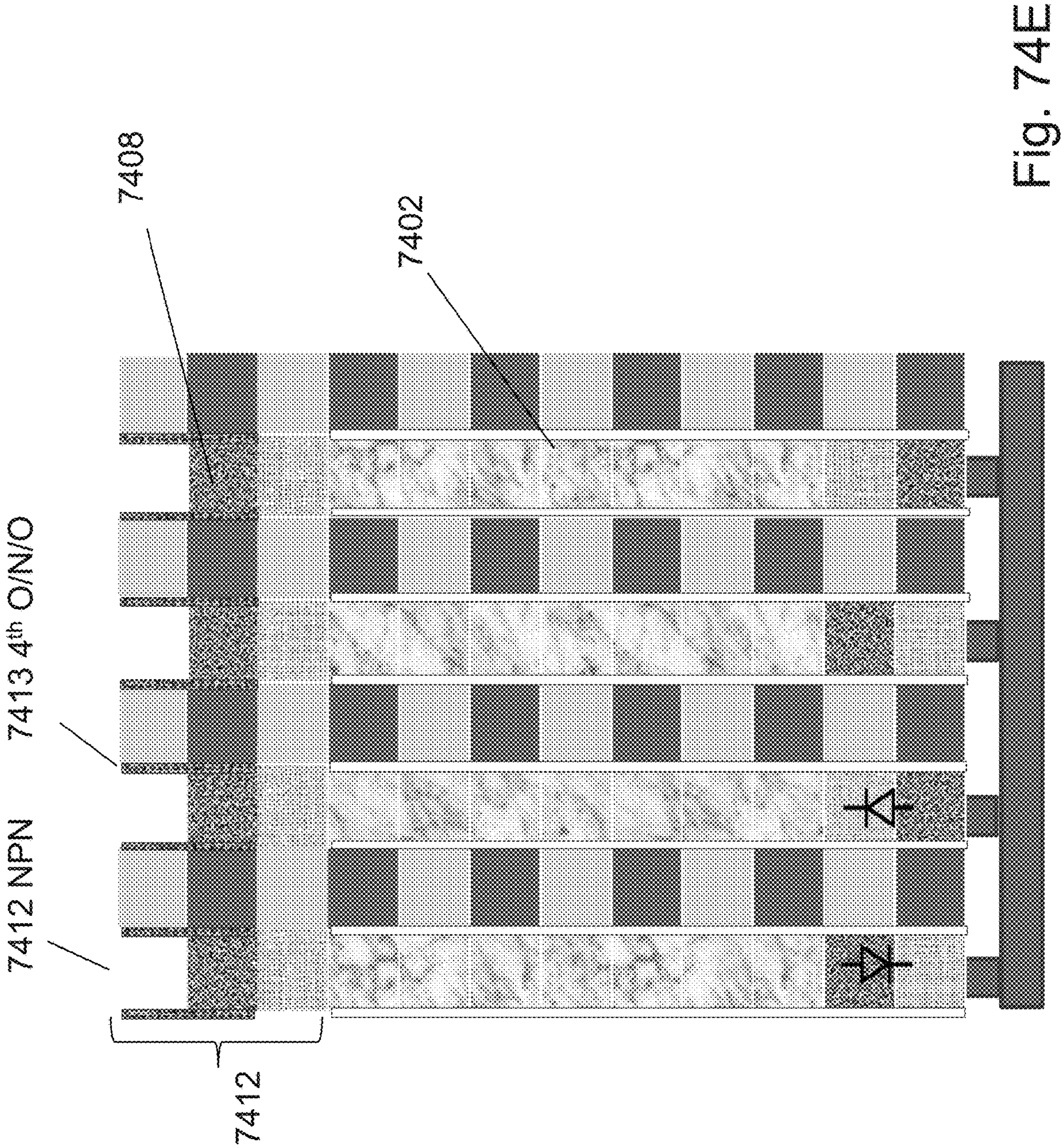

FIG. 74E illustrates the structure after directional deposition of P type polysilicon 7408.

Figure 74F:
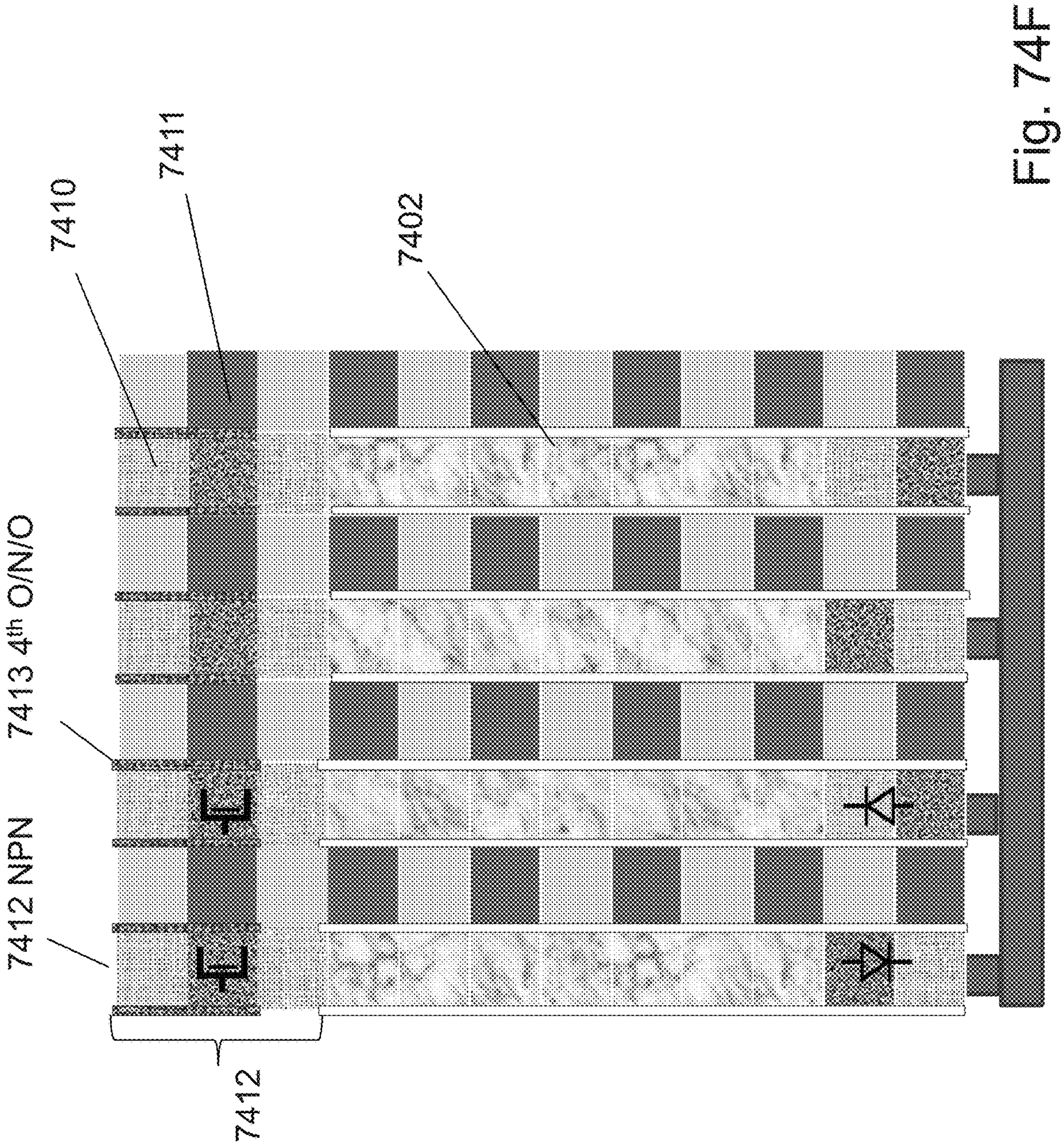

FIG. 74F illustrates the structure after an additional direction deposition of N type polysilicon 7410. An annealing such as laser annealing could be used to improve the performance of the newly formed top select device NPN transistor at the top region 7412 of RRAM/OTP pillars.

The top S/D lines 7411 would act as the gate for the programming of the 3rd O/N/O 7406 to program these select transistors.

Figure 74G:
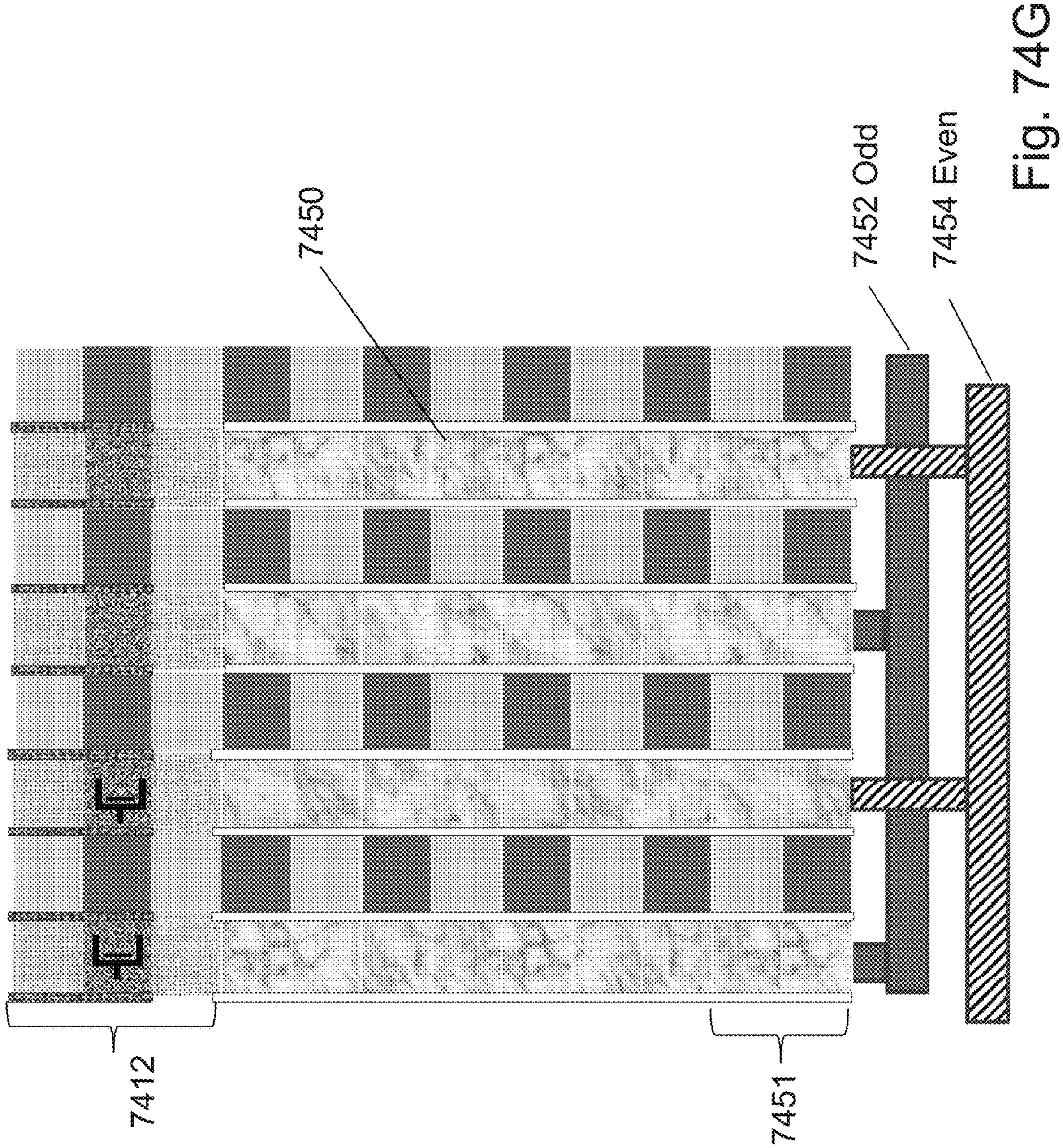

FIG. 74G illustrates an alternative for the programming access. It illustrates NPNs with a fourth O/N/O to provide programmable access to the Input/Output and through the control circuit Y direction routing, and no diodes 7451 at the bottom programming access, but rather Odd programming access 7452 and even programming access 7454.

Figure 75A:
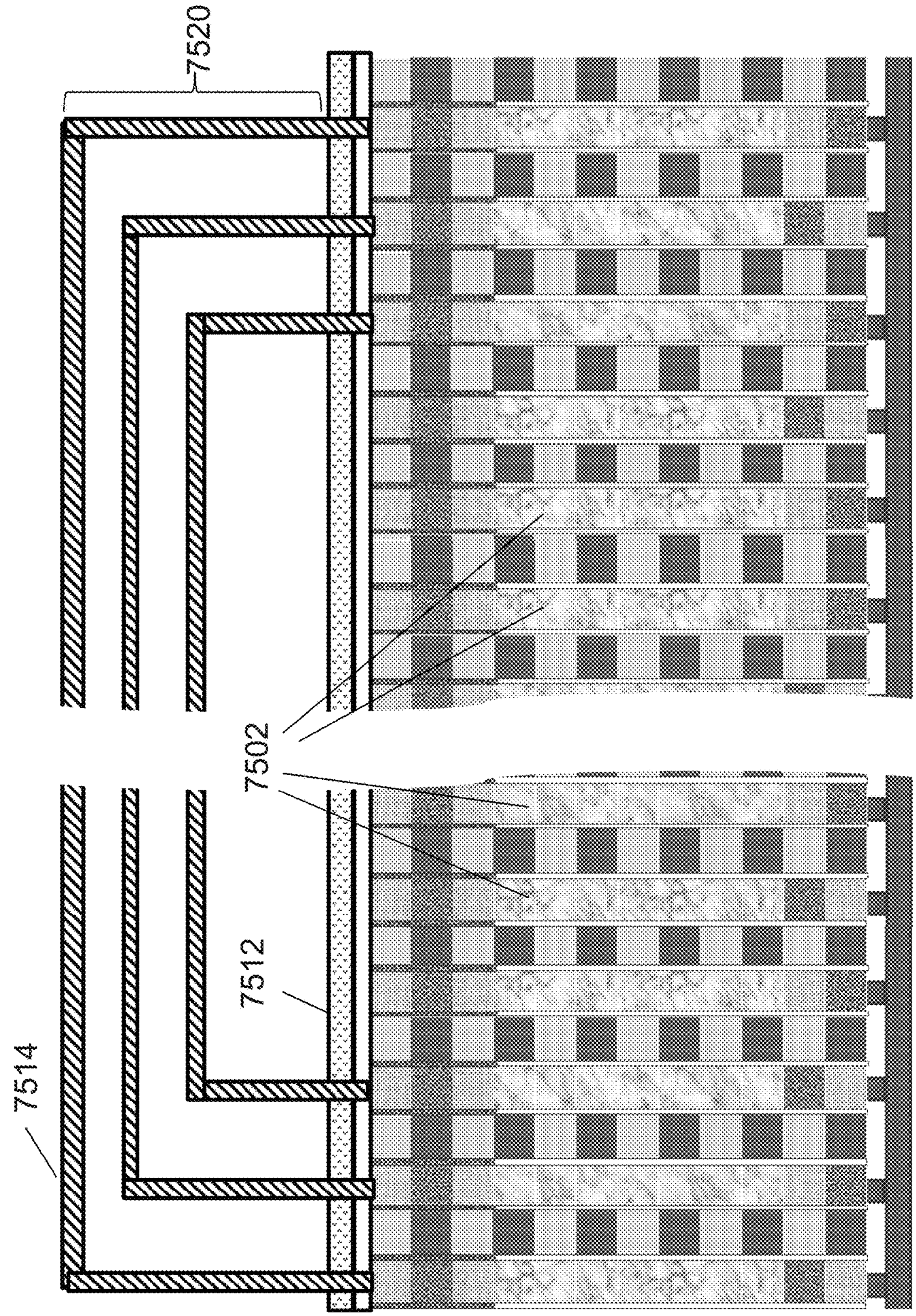
FIGS. 75A-75B are example illustrations of RRAM/OTP pillars connecting to a connectivity structure.

FIG. 75A illustrates the RRAM/OTP pillars 7502 usage to connect to a connectivity structure. The control circuits 7512 which overlays the 3D NOR fabric could be processed to provide metal connection grid 7520 to support long track connectivity, for example, long track 7514. Such could be architected to add long tracks to the programmable fabric. Metal connection grid 7520 may be integrated within the metallization of control circuits 7512 layer, or may be constructed as a separate layer or layers.

Figure 75B:
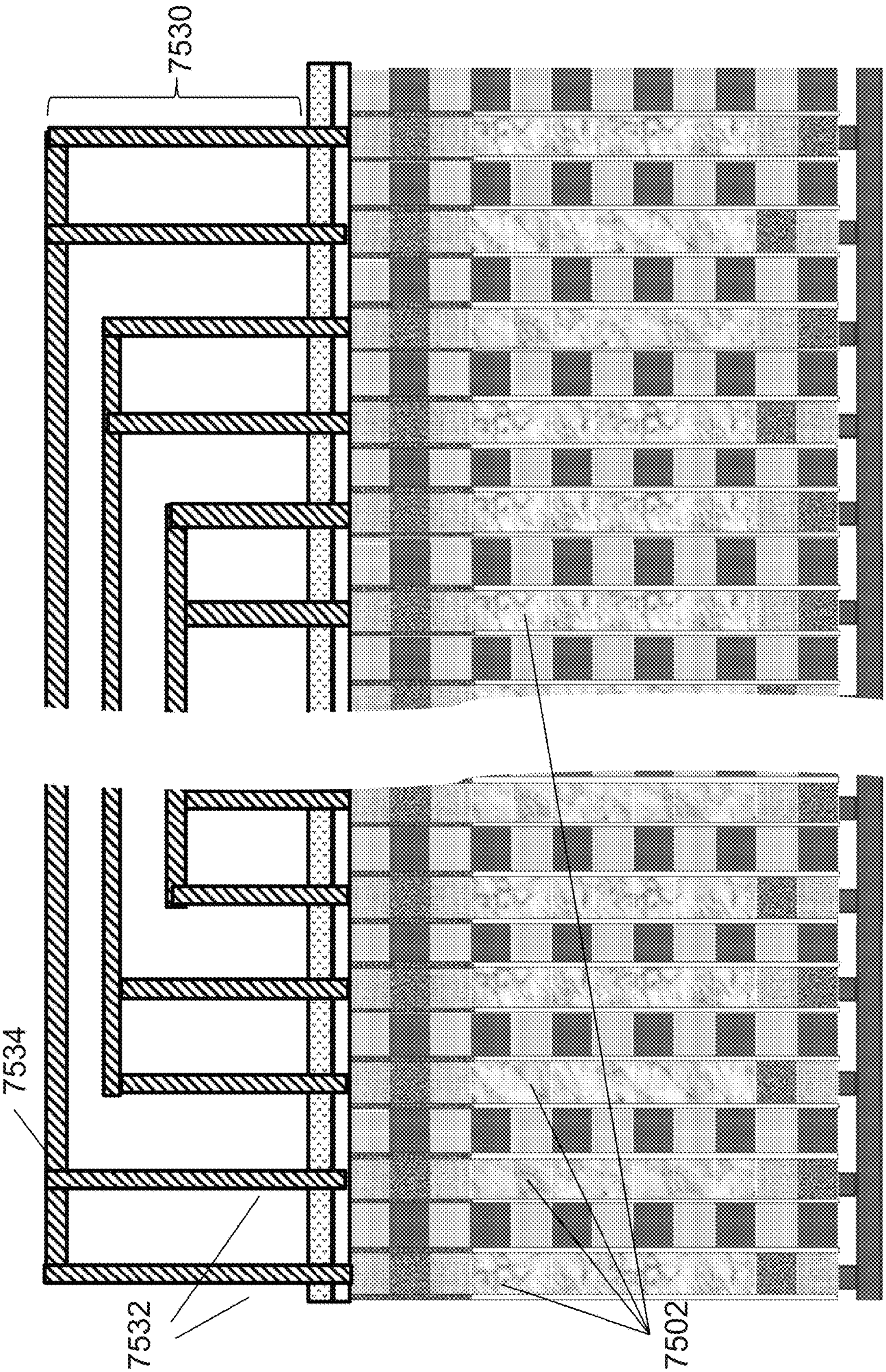

FIG. 75B illustrates an alternative in which multiple RRAM/OTP pillars 7502 may have programmable connection 7532 to a shared Y direction strip 7534 as part of the Y direction connection fabric 7530 constructed as part of the overlaying control circuits.

Differential routing is an option that has some advantages but does consume twice the routing resources. In some applications mixing differential routing with conventional single ended routing could provide better overall optimization Having mixed types of routing resources such as conventional metal routing over the control circuits 7530 and silicon through RRAM/OTP connection and through ONO programmable transistors in the 3D NOR fabric might advise mixing also the routing techniques. Accordingly standard single ended could be use for signals over metal while differential type could be used for the other type of routing resources.

An alternative for forming an NPN select device for the RRAM/OTP pillar is by depositing or transferring an NPN layer and then etch it thus leaving select device on top of each pillar.

Figure 76A:
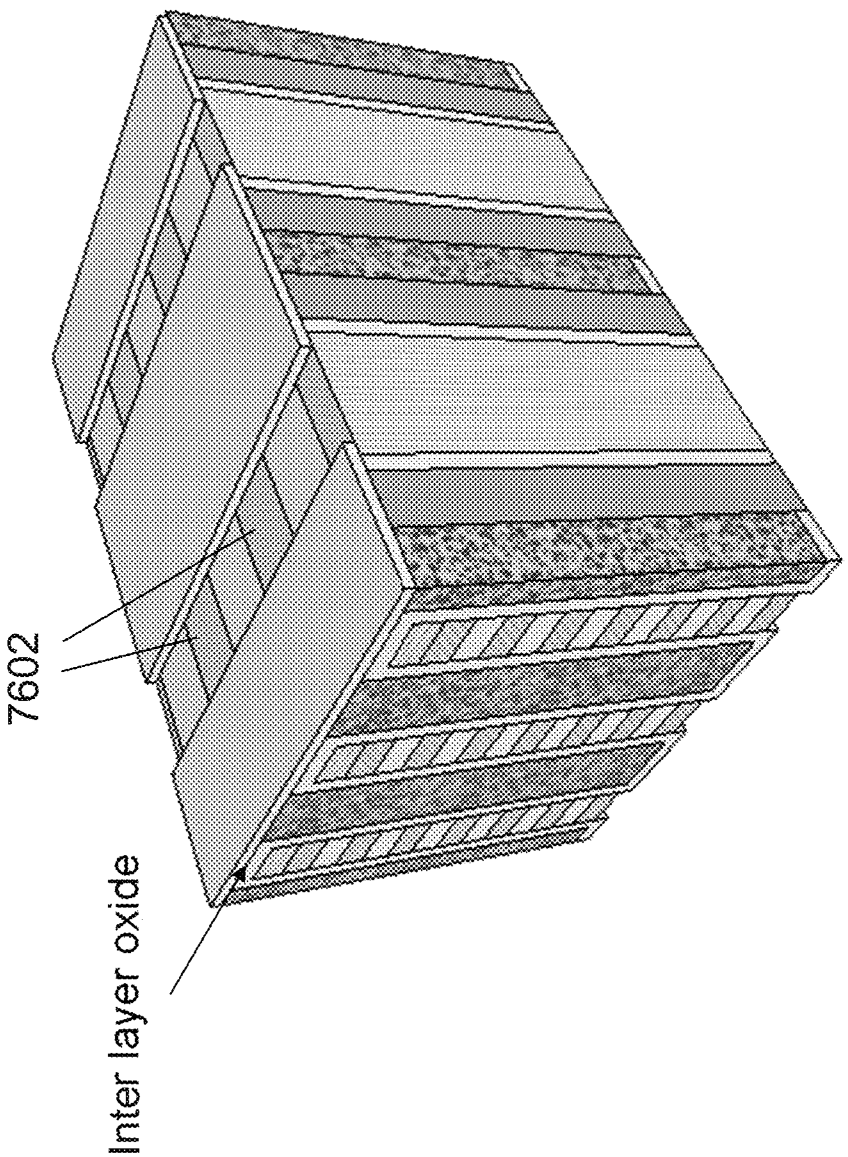
FIGS. 76A-76E are example illustrations of an alternative for forming an NPN select device for the RRAM/OTP pillars.

FIG. 76A illustrates a step of depositing oxide isolation and patterning it to expose the pillars 7602.

Figure 76B:
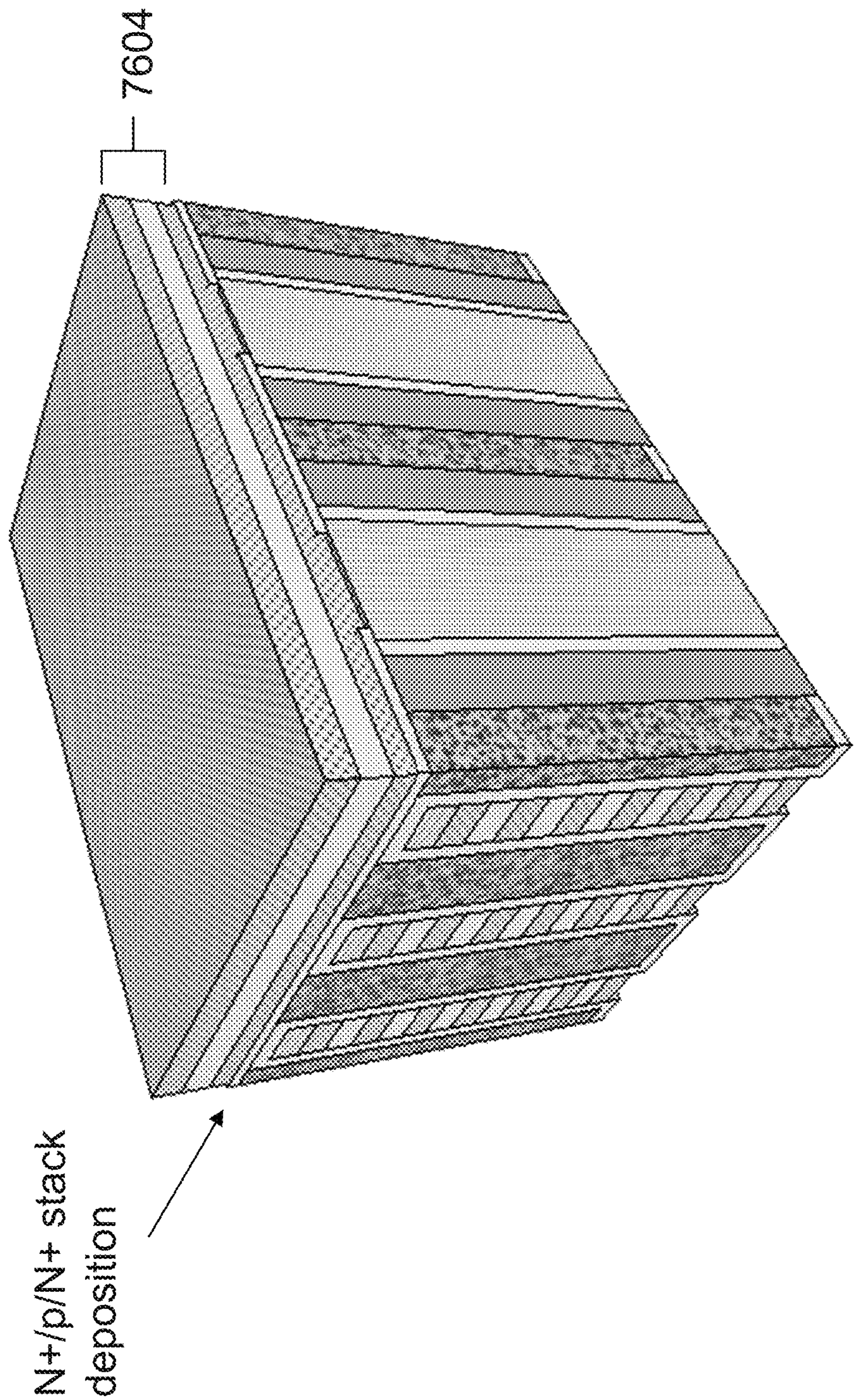

FIG. 76B illustrates the structure after depositing N+/P/N+ polysilicon layers 7604 or alternatively layer transferring N+/P/N+ mono-crystal layers.

Figure 76C:
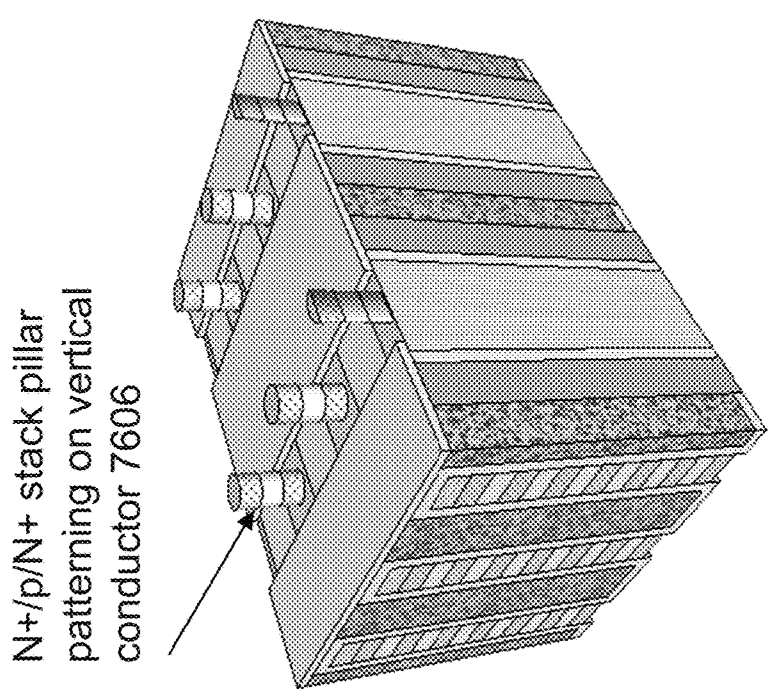

FIG. 76C illustrates the structure after patterning and etching away and leaving vertical NPN 7606 devices on top of the RRAM/OTP pillars. The process for the select transistor may use a more advanced node than that used in the 3D fabric core process. Thus, the vertical NPN select transistor and select gate can be accommodated within the pitch of the ridge.

Figure 76D:
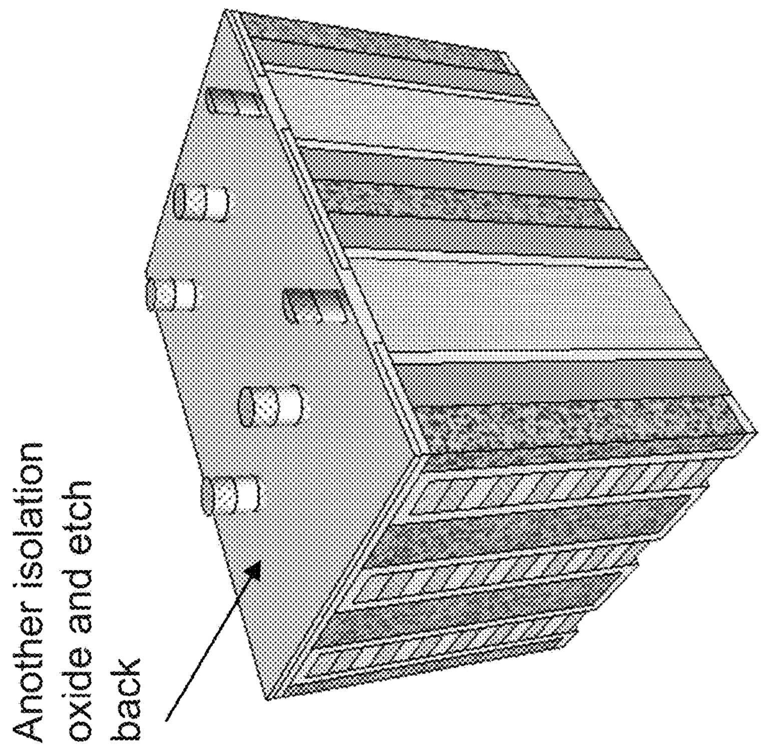

FIG. 76D illustrates the structure after adding isolation oxide and etch back and then O/N/O deposition over the vertical NPN 7606 devices. A directional etchback may optionally be performed.

Figure 76E:
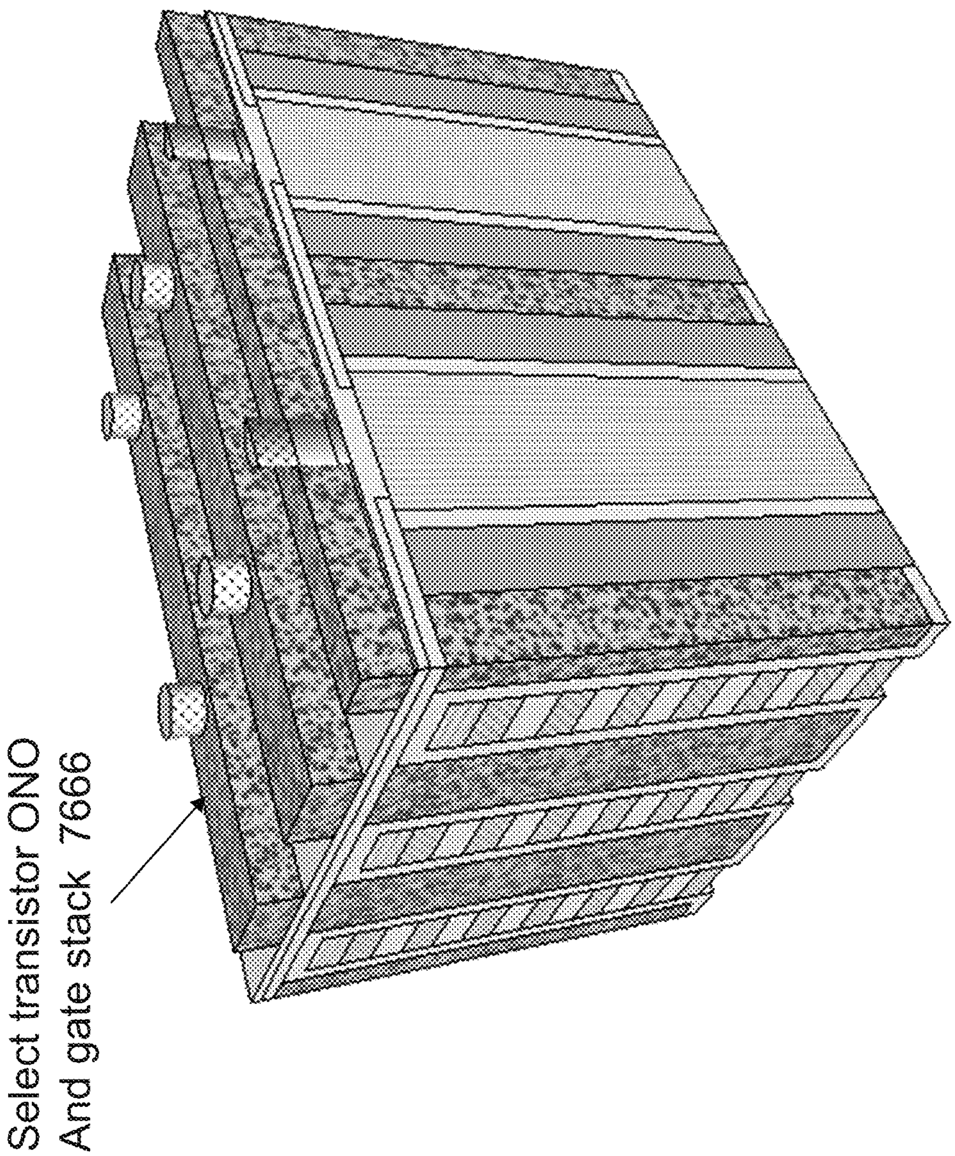

FIG. 76E illustrates the structure after forming 3rd gate 7666 in S/D line direction. Additional isolation oxide may be deposited and planarized.

Additional alternative is to replace the 'necking' process with a channel replacement process thereby instead of forming JLTs by 'necking', an NPN may be formed by replacing the 'neck' with P type poly silicon as is illustrated in the following FIGS. 77A-77D.

Figure 77A:
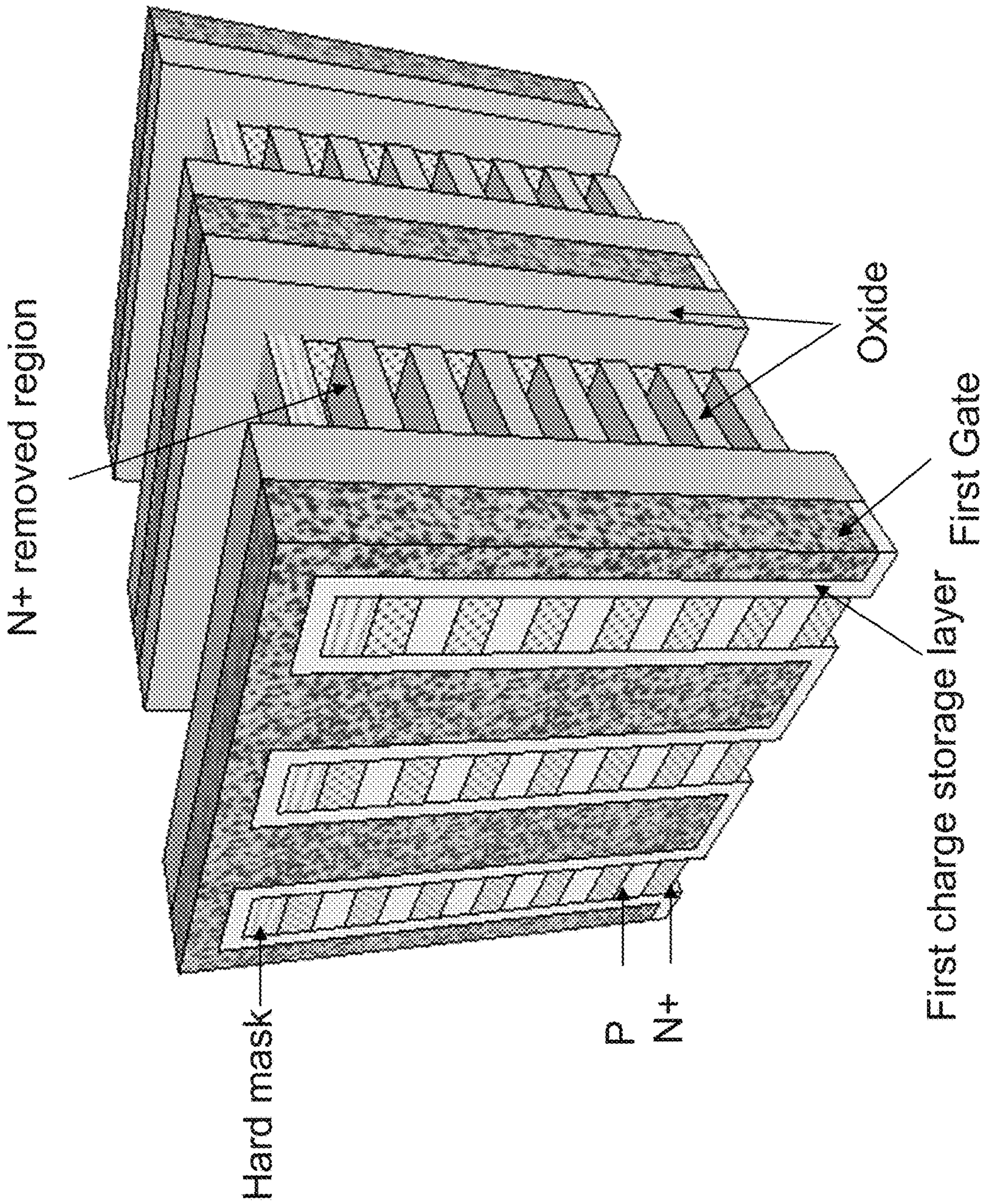
FIGS. 77A-77D are example illustrations of forming an NPN rather than forming JLTs by 'necking'.

FIG. 77A illustrates a designated region for lateral transistors. It could start with a region such as the one designed for RRAM/OTP pillars similar to FIG. 67A which may be processed with an isotropic S/D line etch resulting with the structure of FIG. 77A.

Figure 77B:
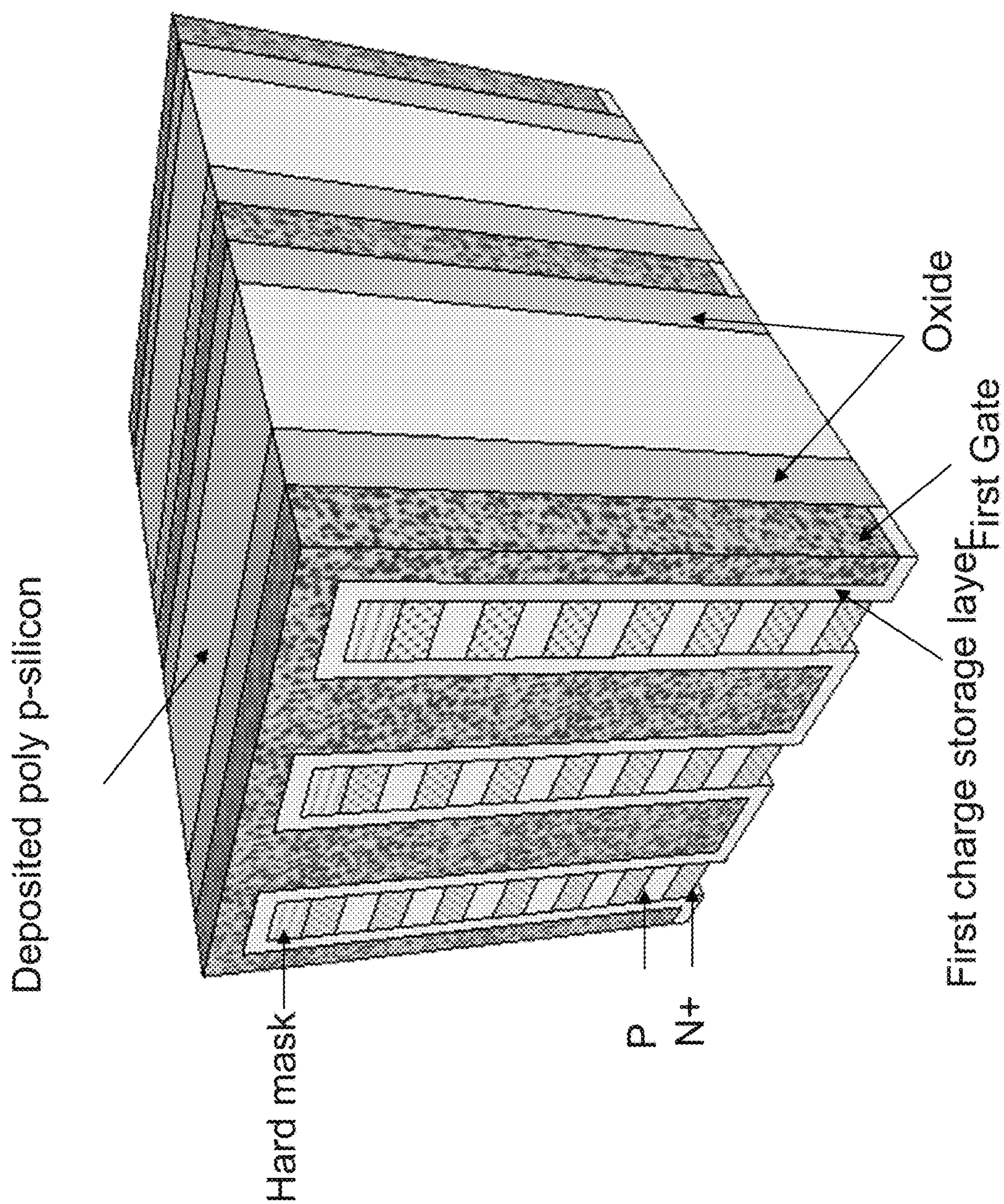

FIG. 77B illustrates the structure of FIG. 77A after filling-in using a conformal P type poly silicon deposition.

Figure 77C:
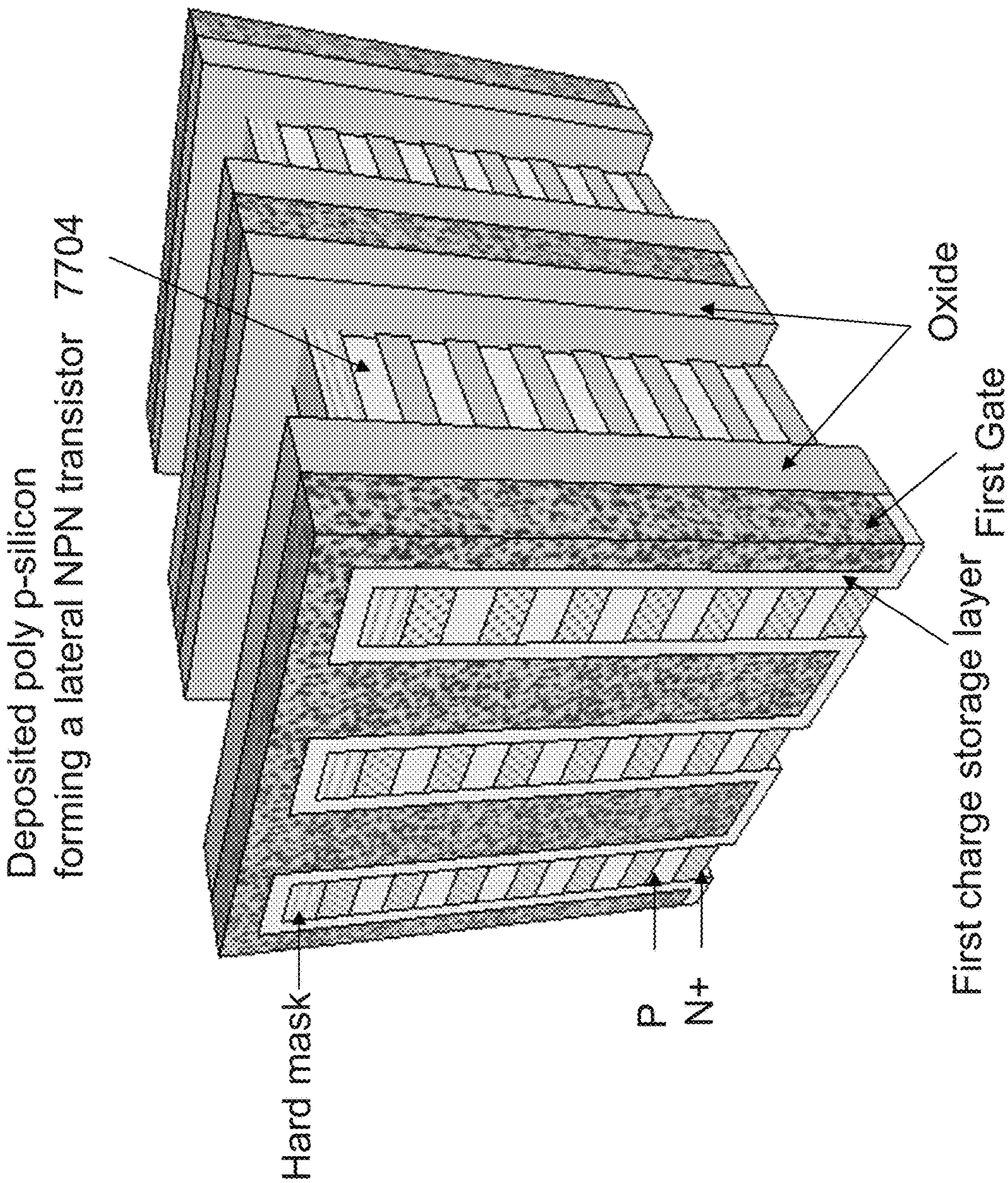

FIG. 77C illustrates the structure after directional etch of the poly silicon from the valleys. A laser annealing or other type of annealing could be used to improve the performance of the formed lateral NPN transistors 7704.

Figure 77D:
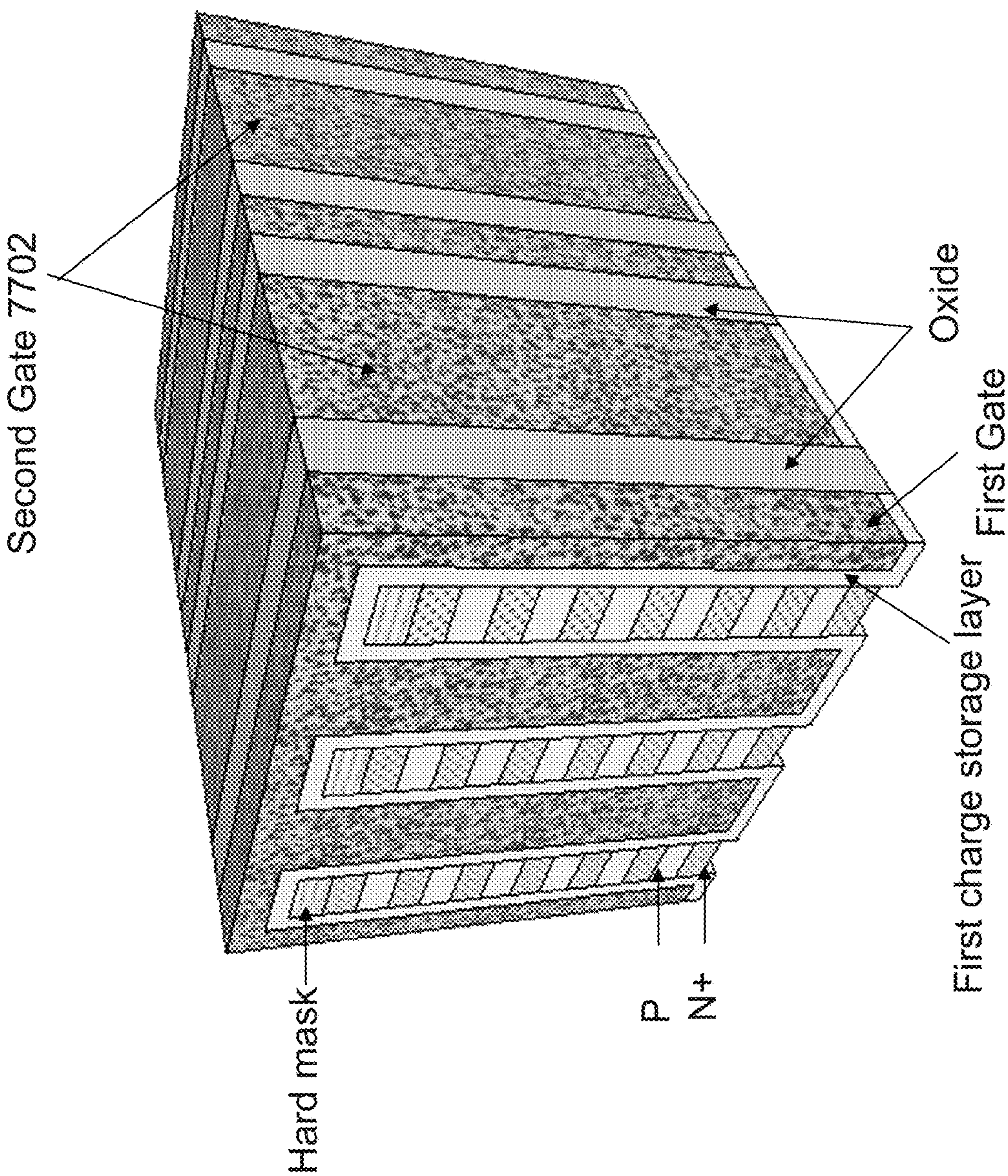

FIG. 77D illustrates the structure after adding second O/N/O and second gates 7702.

This kind of lateral NPN could be formed as an alternative to JLTs as were been presented herein.

For the read additional circuits could be added for the S/D line with integrating an analog to digital converter. Such structures could support multiple signal processing techniques to allow flexibility between storage density, access speed, and device yield. This charge trap 3D NOR memory could be used also for brain-like storage where charges are being added to memory locations in similar fashion to the human brain synapse. As a general note we described herein a memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some in-silicon control lines, improve speed and reduce variation by strengthening bit-lines and word-line with upper layer parallel miming and periodically connected metal lines.

The sizing of the structure and accordingly of the memory channel could be designed in consideration of access time, operation time memory durability costs and many other considerations. The 3D structure provides interesting attributes as more memory could be added by having a larger number of layers. Processing a higher number of layers is easier when the dimensions of the patterns within the layer are relatively larger. In general the historic trend of the industry has been to make devices smaller and smaller to reduce cost per storage bit and increase memory integration. As size gets reduced beyond a certain level the bit storage will be limited both in how much charge and accordingly how many levels could be stored in one charge trap site Additionally, bit storage will be limited by how many sites could be used on one facet without cross interference between them, also called the second-bit effect (SBE), retention time, reliability, and control-lines resistance and capacity (RC) are all negatively impacted as well. In a 3D NOR structure the individual memory cell could be kept relatively large to achieve the desired attributes of bit capacity on a individual facet both in number of sites and how many levels are stored in each site. This will achieve the desired reliability retention and access time while increasing the number of layers to increase memory integration and reduce cost per memory cell. The dimension of—length, width, and height of the memory cell channel could be designed accordingly and those could be relatively similar resulting with a cube like channel or varied to so they are very different. The formation of the O/N/O structure could be modified to enable a charge trap structure that has on its own multiple layers to allow more levels for the multilevel bit storage techniques. Some of these approaches are detailed in papers by: Gu Haiming et al titled "Novel multi-bit non-uniform channel charge trapping memory device with virtual-source NAND flash array" published in Vol. 31, No. 10 Journal of Semiconductors October 2010; Ye Zhoul, et al titled "Nonvolatile multilevel data storage memory device from controlled ambipolar charge trapping mechanism published at SCIENTIFIC REPORTS|3: 2319|DOI: 10.1038/srep02319; Kyoung-Rok Han et al titled ":Multi-bit/Cell SONOS Flash Memory with Recessed Channel Structure" published at NSTI-Nanotech 2008; by Guangli WANG titled "Charge trapping memory devices employing multi-layered Ge/Si nanocrystals for storage fabricated with ALD and PLD methods" published at Front. Optoelectron. China 2011, 4(2): 146-149; by Yan-Xiang Luo et al titled "Coupling of carriers injection and charges distribution in Schottky barrier charge trapping memories using source-side electrons programming" published at Semicond. Sci. Technol. 29 (2014) 115006 (8pp); by Chun-Hsing Shih, titled "Reading Operation and Cell Scalability of Nonvolatile Schottky barrier Multibit Charge-Trapping Memory Cells" at IEEE TRANSACTIONS ON ELECTRON DEVICES, VOL. 59, NO. 6, JUNE 2012, by Zhenjie Tang et al titled "Dependence of memory characteristics on the (ZrO2)x (SiO2)1−x elemental composition" at Semicond. Sci. Technol. 30 (2015) 065010, by Jun Yong Bak Nonvolatile Charge-Trap Memory Transistors With Top-Gate Structure Using In—Ga—Zn—O Active Channel and ZnO Charge-Trap Layer" at IEEE ELECTRON DEVICE LETTERS, VOL. 35, NO. 3, MARCH 2014, and U.S. Pat. No. 8,822,288 all incorporated herein by reference.

The differential amplifier circuit illustrated in FIG. 54 herein could be used to enhance the performance of the 3D NOR logic fabric described herein. It could be used both for LUT output reconstruction and other logic function output reconstruction and also for routing signal reconstruction. These types of signal reconstruction tend to consume more power and using it in combination with a clocking circuit might help reduce such power expenditure. Also a new type of device, for example, such as SOI Lateral Bipolar transistors as been presented by Tak H. Ning in a paper titled "A Perspective on Future Nanoelectronic Devices" published at IEEE VLSI-TSA 13, incorporated herein by reference, could be used for such circuit.

The 3D NOR fabric uses the O/N/O 'mirror bit' aspect to store many bits on each facet and accordingly a none conducting charge trap is valuable to increase memory storage. The use of 3D NOR fabric for logic and routing does not leverage this aspect and accordingly a floating gate such as polysilicon could be as useful. An artisan in the art could do the proper modifications to the process flows presented in here for alternatives utilizing the 3D NOR structure described herein utilizing alternative storage mediums such as floating gate, ReRAM, in which the O/N/O structure could be replaced by ReRAM structure, floating gate based structure and so forth.

The structure of this 3D NOR could be modified by changing the gate stack to construct a 3D-DRAM using the floating body technique.

The Floating body of the 3D-DRAM or of the 3D-NOR Universal memory could be refreshed using the self-refresh described herein.

A silicidation could be used in some portions of the S/D lines such as for regions designated to be potential contacts to the RRAM/OTP pillars as is illustrated in FIG. 67A. This can lower contact resistance and also improve the S/D effective resistivity.

For a JLT to have low off current it might be desired to limit the dopant of the S/D lines below 1E20 atoms/cm$^3$, yet for the S/D lines to serve better as a routing fabric it would be better to have them doped to over 1E20 atoms/cm$^3$. An optional solution could be to add doping by diffusion (gas, solid, implant, depending on integration engineering choices) or similar techniques while the regions for the JLT are protected using lithography and proper masking.

The 3D NOR fabric could be programmed to enable additional LUT type functions and other programmable functions. In the following sections, some of these other non LUT functions are presented.

Figure 78A:
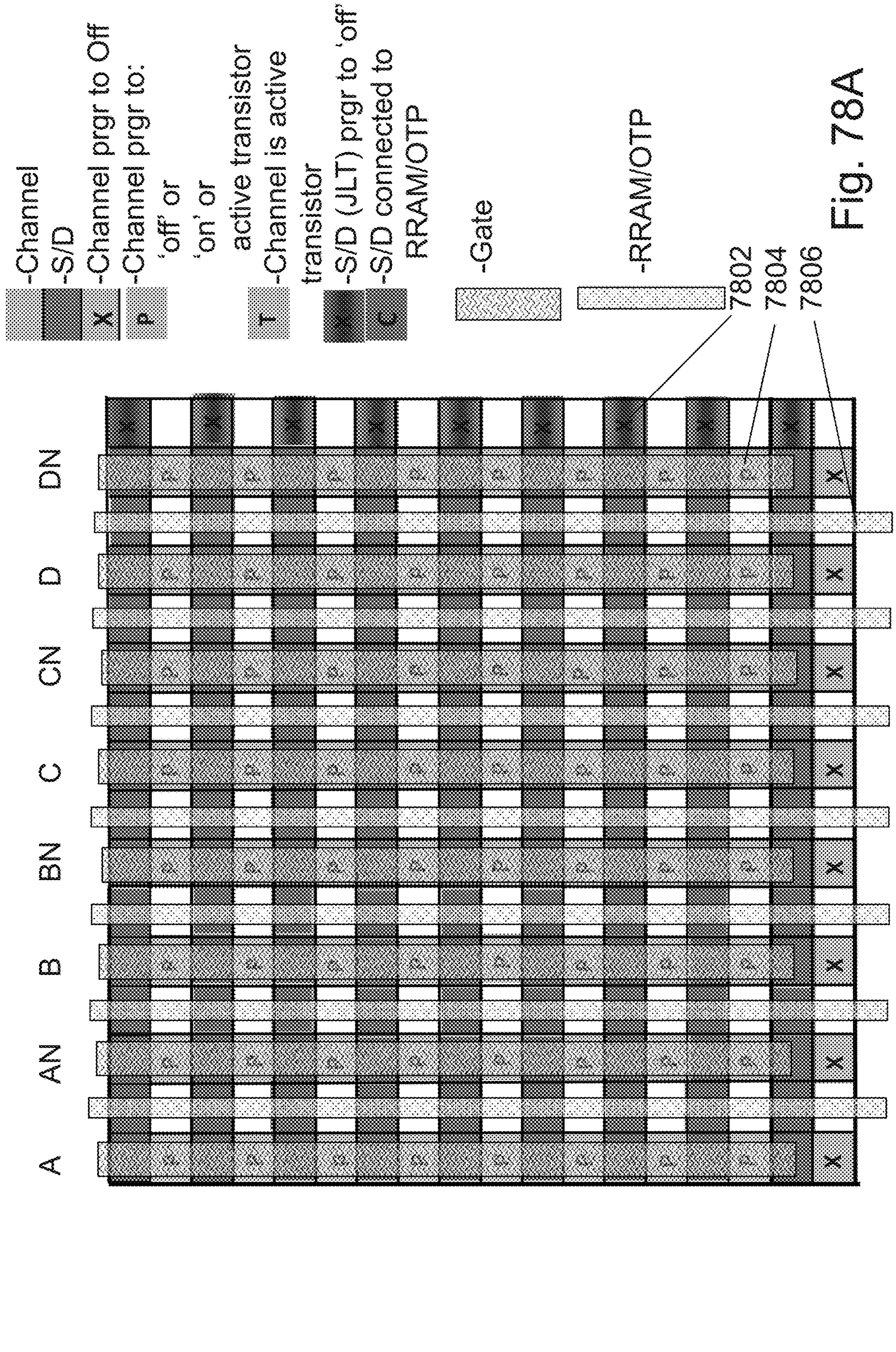
FIGS. 78A-78B are example illustrations of 3D NOR fabrics.
Figure 78B:
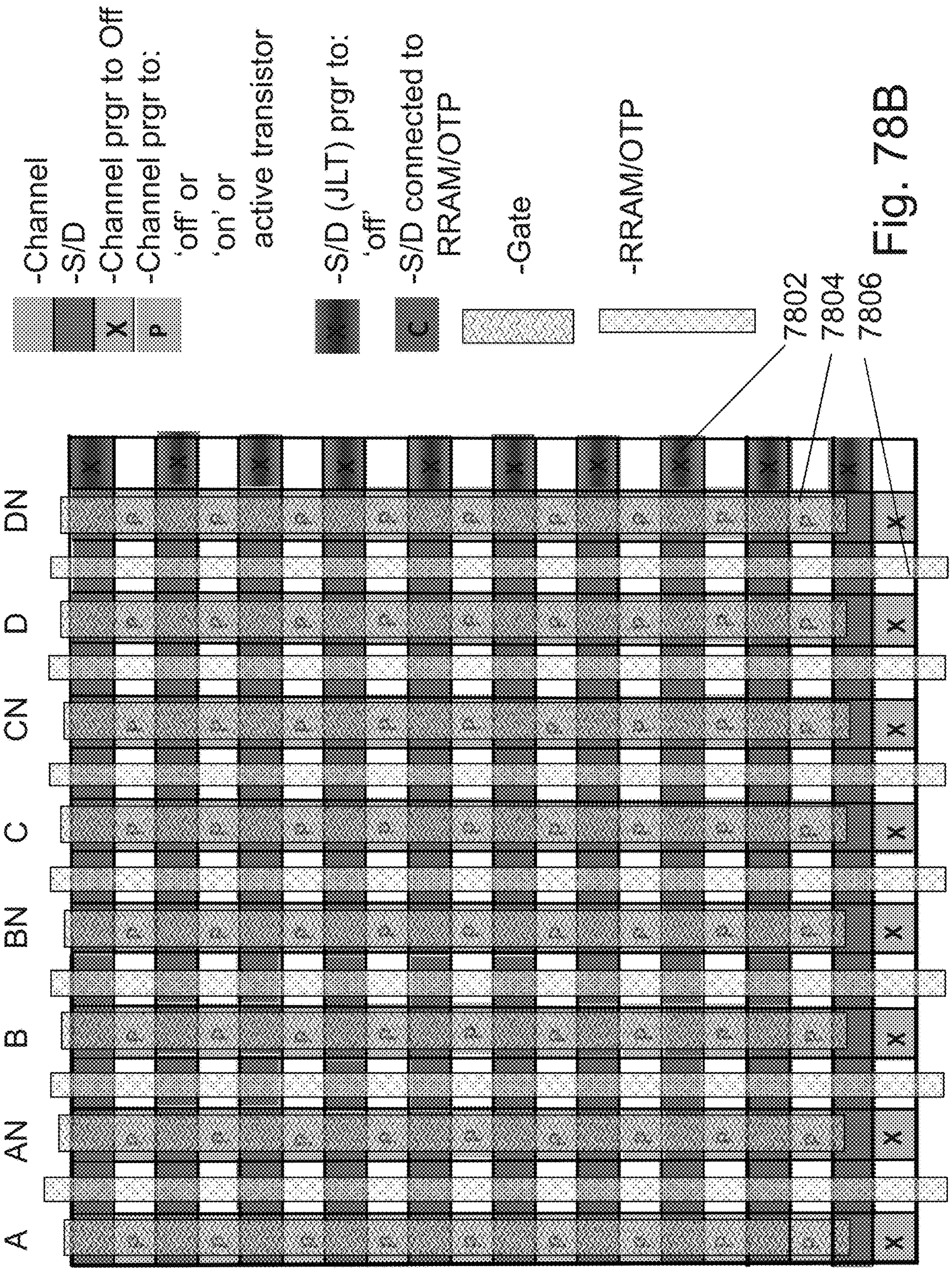

FIG. 78A illustrates an exemplary generic structure of the top 9 S/D lines between lateral S/D line transistors 7802; having 8 first gates 7804 and 7 RRAM/OTP pillars 7806. FIG. 78B illustrates an exemplary structure of the top 10 S/D lines.

Figure 79:
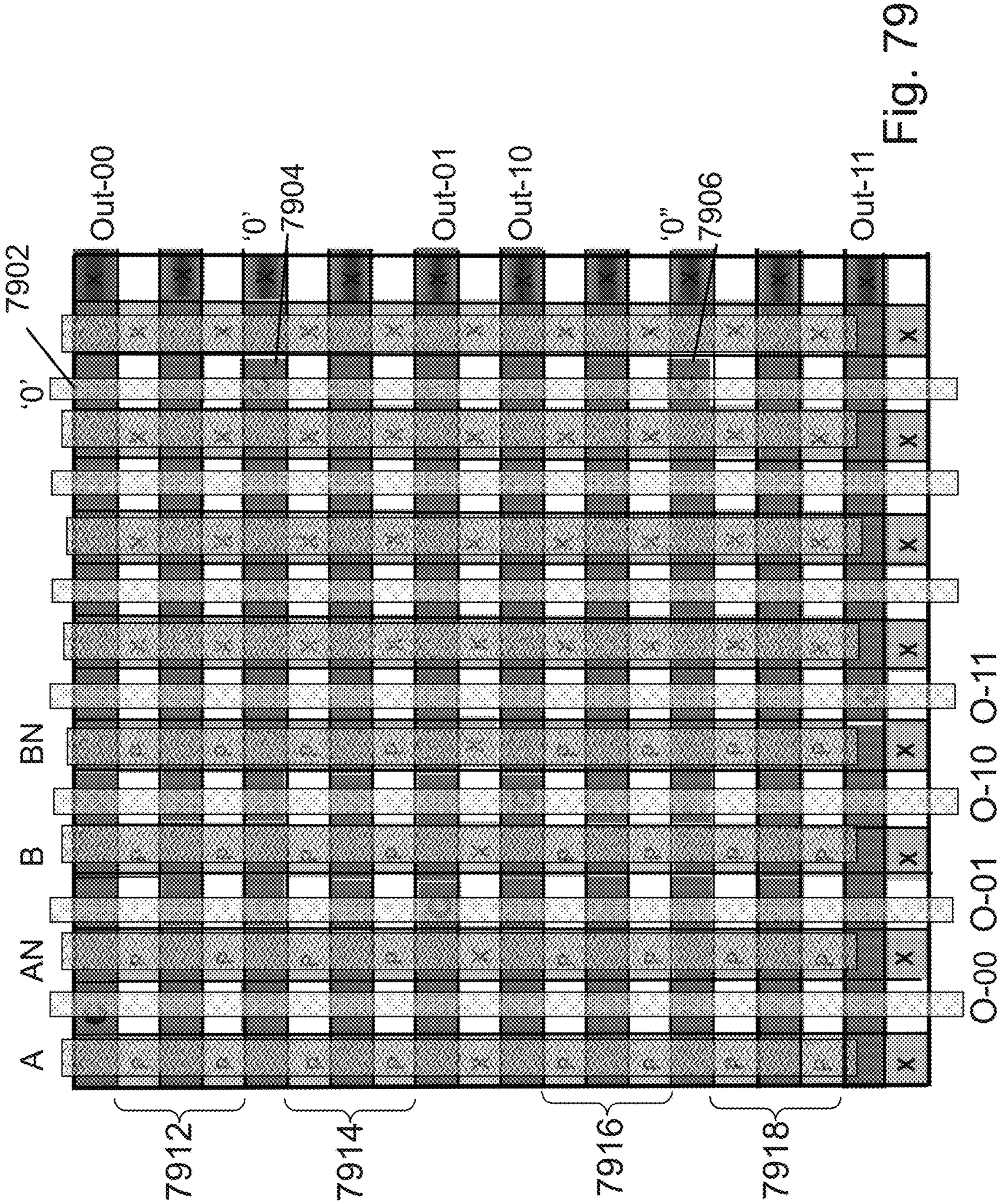
FIG. 79 is an example illustration of the function of a 2 bit decoder with 4 outputs implemented in a 3D NOR fabric.

FIG. 79 illustrates implementing the structure of the top 10 S/D lines shown in FIG. 78B for a 2 bit (A, B) decoder with 4 outputs (O-00, O-01, O-10, O-11). The 4 outputs are dumped into pillars through each S/D lines connected RRAM/OTP. A pillar 7902 may be used to connect two S/D segments, first S/D segment 7904 and second S/D segment 7906, to ground ('0'), where the first S/D segment 7904 feeds the ground signal into two top programmable 8 channels first top channel 7912 and second top channel 7914 and the second S/D segment 7906 feeds the ground signal into two bottom programmable 8 channels, first bottom channel 7916 and second bottom channel 7918. The control input gate lines (A, AN, B, BN) would control the top programmable 8channels first top channel 7912 to decode input 00 (AN=1, BN=1) to connect the top S/D line to ground and accordingly the 8 channels second top channel 7914 will connect the Out-01 to ground for 01 input, and so forth for first bottom channel 7916 and second bottom channel 7918. The adjacent ridge could be programmed to form an inverse decoding. This function impacts 4 outputs which would otherwise would have required 4 structures for its implementation. The structure flexibility increases utilization and performance while reducing power consumption.

Figure 80:
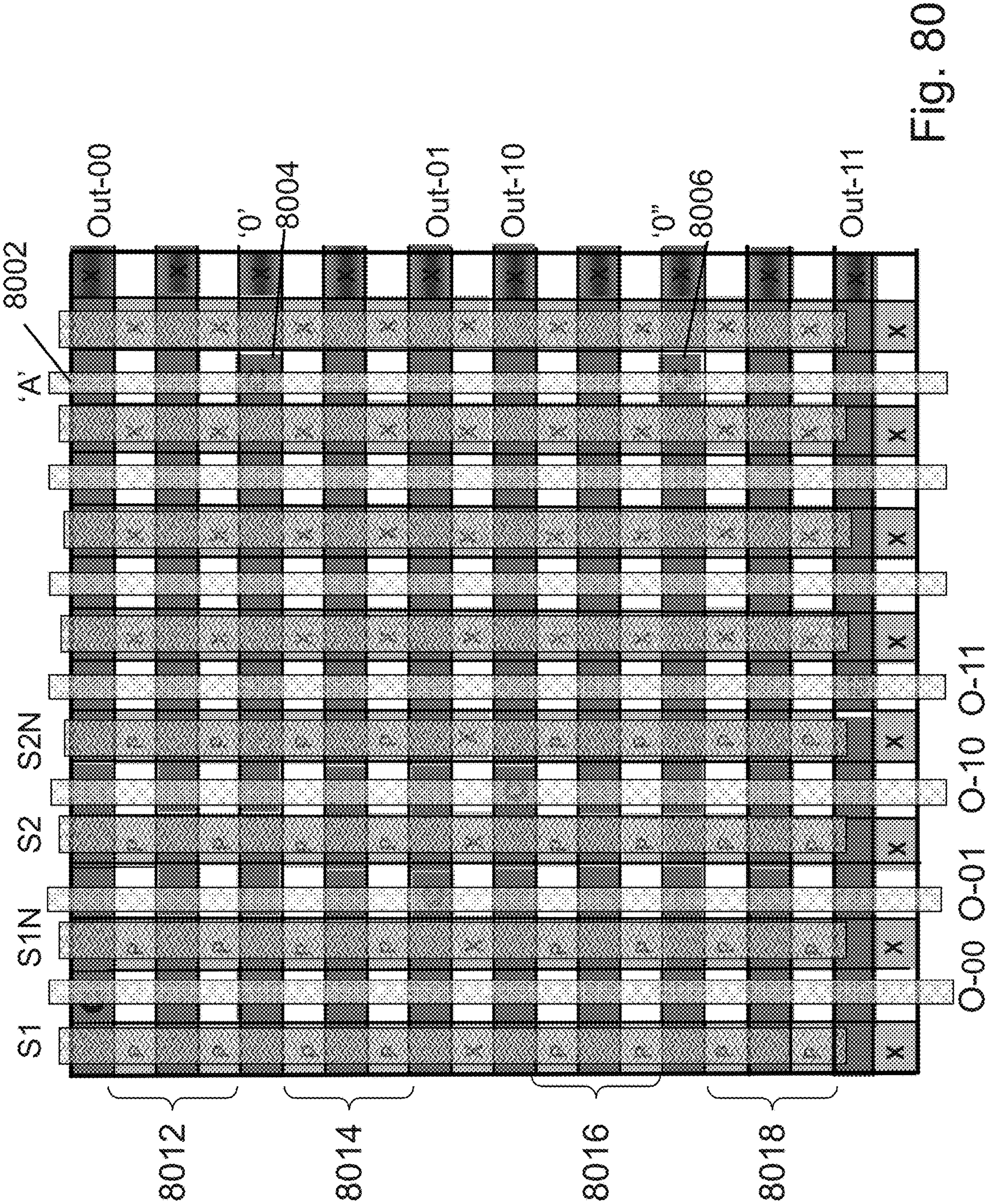
FIG. 80 is an example illustration of the function of a de-multiplexer with 4 outputs implemented in a 3D NOR fabric.

FIG. 80 illustrates implementing a 2 bit (S1, S2) demultiplexer with 4 outputs (O-00, O-01, O-10, O-11). A pillar 8002 may be used to connect two S/D segments, first S/D segment 8004 and second S/D segment 8006 to ground an input A, otherwise this structure is similar to the decoder of FIG. 79. The control input gate lines (S1, S1N, S2, S2N) would control the top programmable 8 channels first top channel 8012 to decode input 00 (S1N=1, S2N=1) to connect the top S/D line to ground and accordingly the 8 channels second top channel 8014 will connect the Out-01 to ground for 01 input, and so forth for first bottom channel 8016 and second bottom channel 8018. The adjacent ridge could be programmed to form the same decoding for input signal AN. This function impacts 4 outputs which would otherwise would have required 4 structures for its implementation. The structure flexibility increases utilization and performance while reducing power consumption The structure of FIG. 80 could be also be extended further to be used as a multiplexer in which the 4 outputs (O-00, O-01, O-10, O-11) are used as inputs of which one would be connected the output pillar 8002 based on the selection of the control input gate lines (S1, S2N, S2, S2N).

FIG. 81 illustrates using the NOR fabric structure for implementing the function of a full adder illustrated by adder schematic 8100. The mid S/D segment 8102 is the result of an XOR of A, B inputs. It connected by a pillar and on logic circuit 8110 to the input D. The carry-in input is input C. The second XOR is implemented using three S/D segments. First S/D segment 8103 would transfer the first XOR output to the S output 8103 if Cin=0 and otherwise the inversion of the XOR using the D gate to second S/D segment 8104 and Cin=1 would be transferred to the S output. The Cout output would be at third S/D segment 8108 using AND function 8106 of A,B input 'daisy chained OR' and the AND function of the Cin and the first XOR. An adjacent ridge could be used to form the inversion function.

FIG. 81 is an illustration of the fabric usability for one of many types of logic functions. For example:

Many additional functions could be formed to enhance the overall usability of the 3D NOR fabric for programmable logic implementation.

Two function outputs could be wired together forming a wired-AND function (one of the functions is low and the result is low).

An output of one function could be used in a following function by connecting it instead of the '0' input forming a 'daisy chain' OR connection (one of the function is 'high' and the output is 'high').

So if two functions are wired AND their inverting function could be 'daisy chain' OR to form a proper inverted signal.

An alternative approach to connect multiple functions is using Output Enable ("OE") control.

A structure for LUT-4 could be degraded to LUT-3 with one input function as OE.

Figure 82:
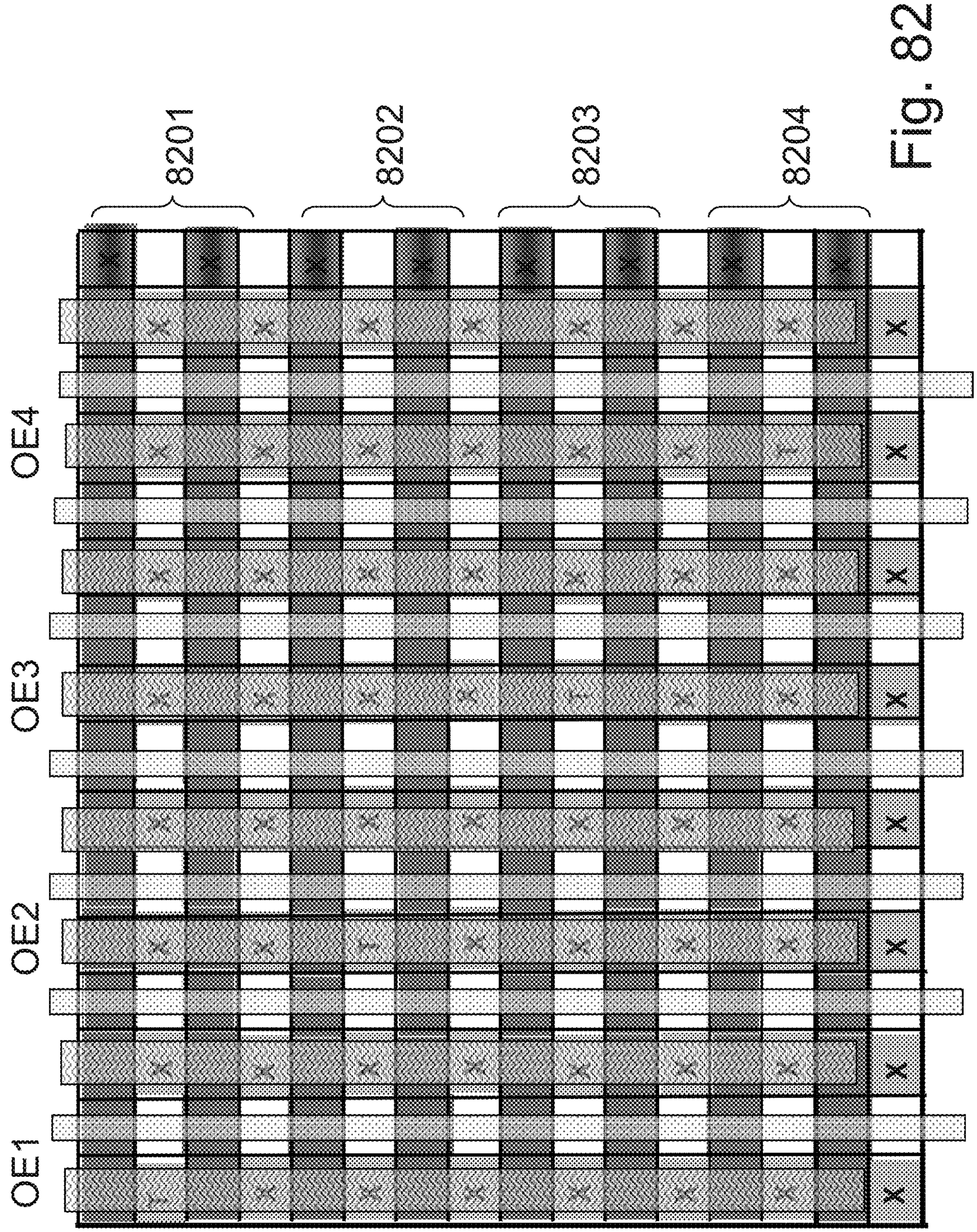
FIG. 82 is an example illustration of the function of 4 signals output enable buffers implemented in a 3D NOR fabric.

FIG. 82 illustrates the 8 gates structure used for 4 signals output enable buffers, first OE buffer 8201, second OE buffer 8202, second OE buffer 8203, and fourth OE buffer 8204.

Figure 83:
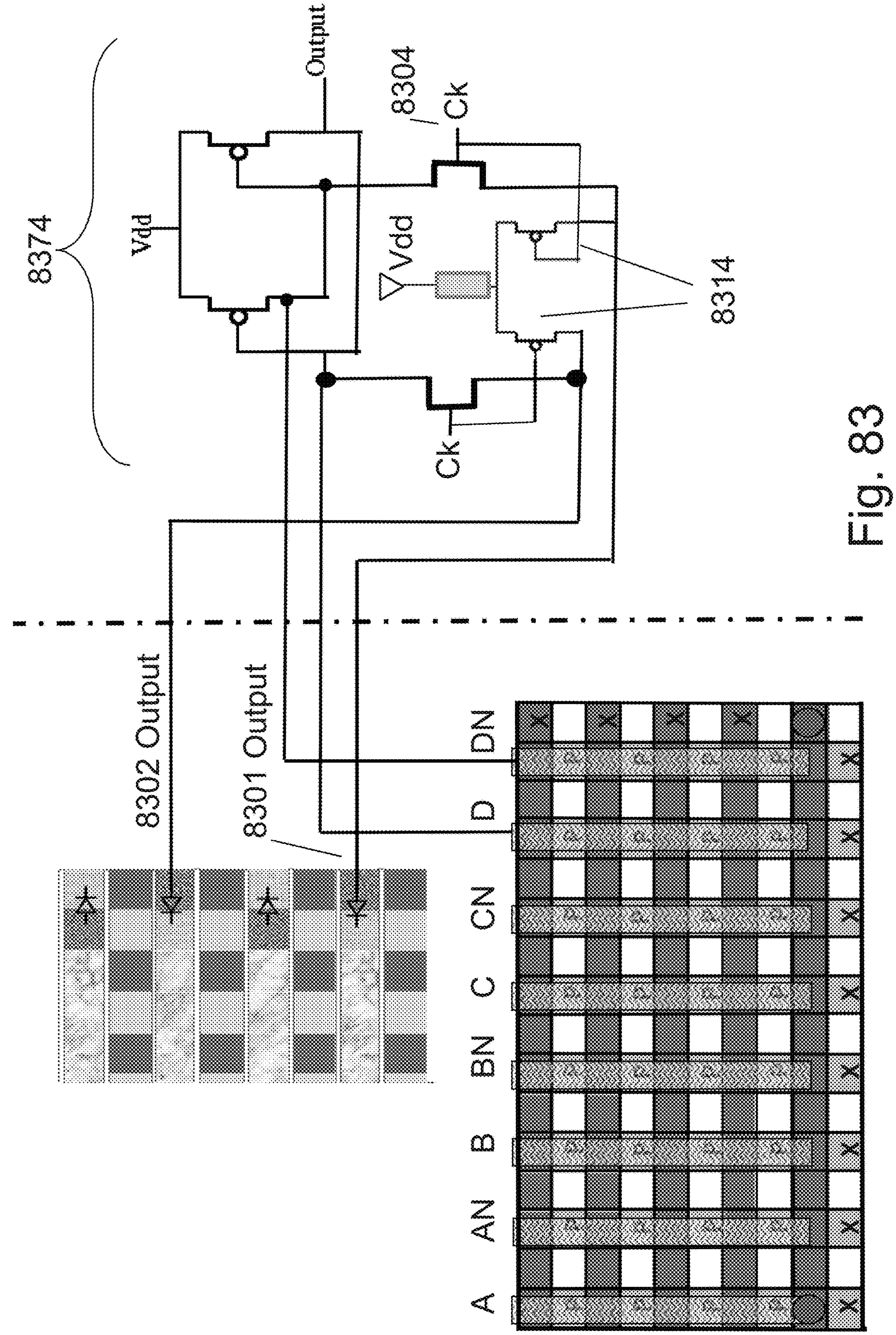
FIG. 83 is an example illustration of clocked half latch reconstruction circuit interfaced to a 3D NOR fabric.

FIG. 83 illustrates a clocked half latch reconstruction circuit 8374 in which the logic outputs first logic output 8301 and second logic output 8302 could affect the half latch only at the up phase of the Ck 8304 signal. The latched signals are then fed to the next level as inputs, for example, such as illustrated for D and DN.

Figure 84:
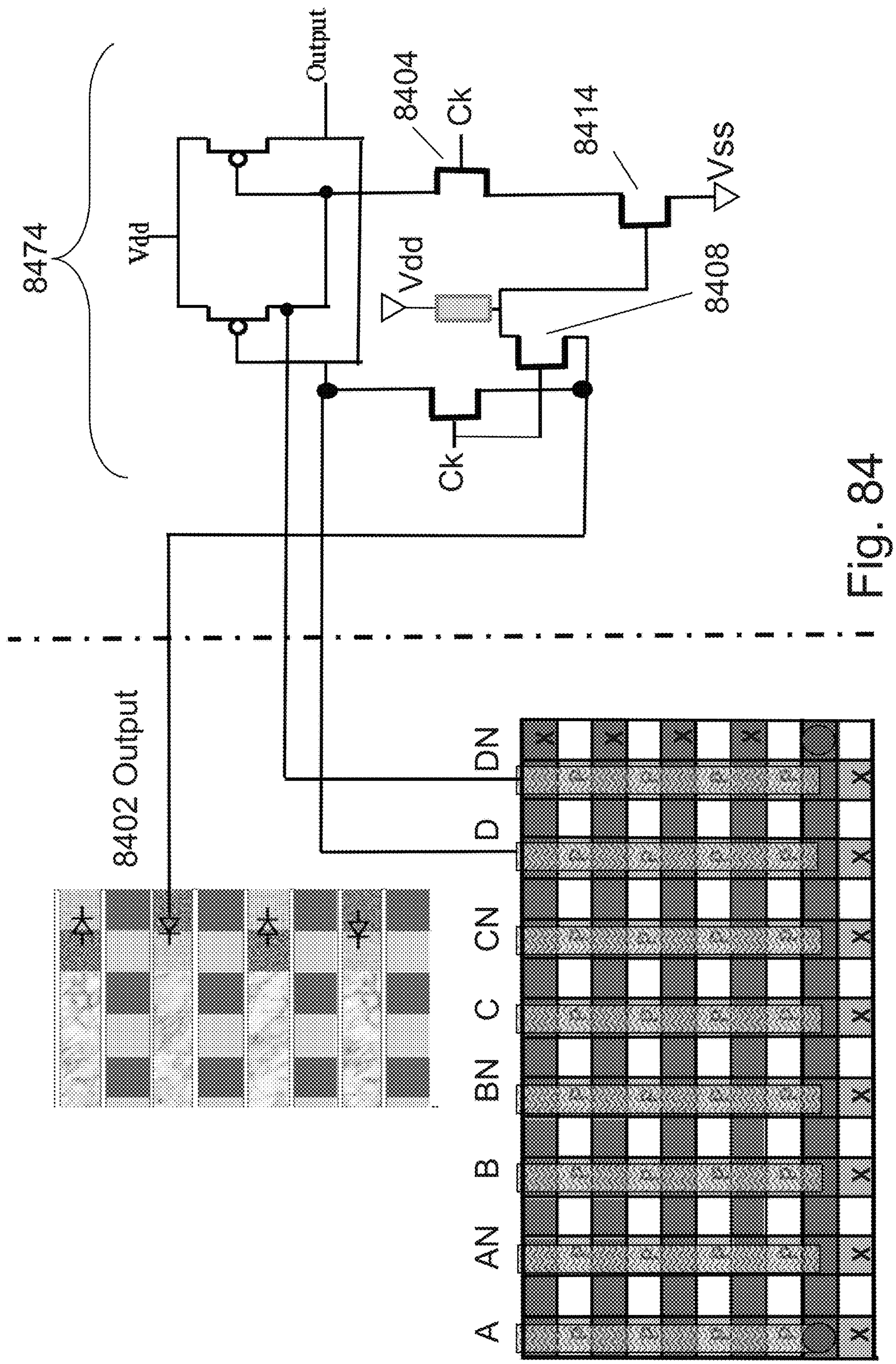
FIG. 84 is an example illustration of modified 'domino logic' reconstruction circuit interfaced to a 3D NOR fabric.

For some functions single ended logic could be used via a modified 'domino logic' reconstruction circuit. FIG. 84 illustrates such a reconstruction circuit 8474. The single ended output 8402 could function to affect the clocked half latch when active but if it is at a high resistivity state then at the high phase of the clock signal a pull up could activate a transistor 8414 to reset the half latch instead of the missing complement output.

Figure 85:
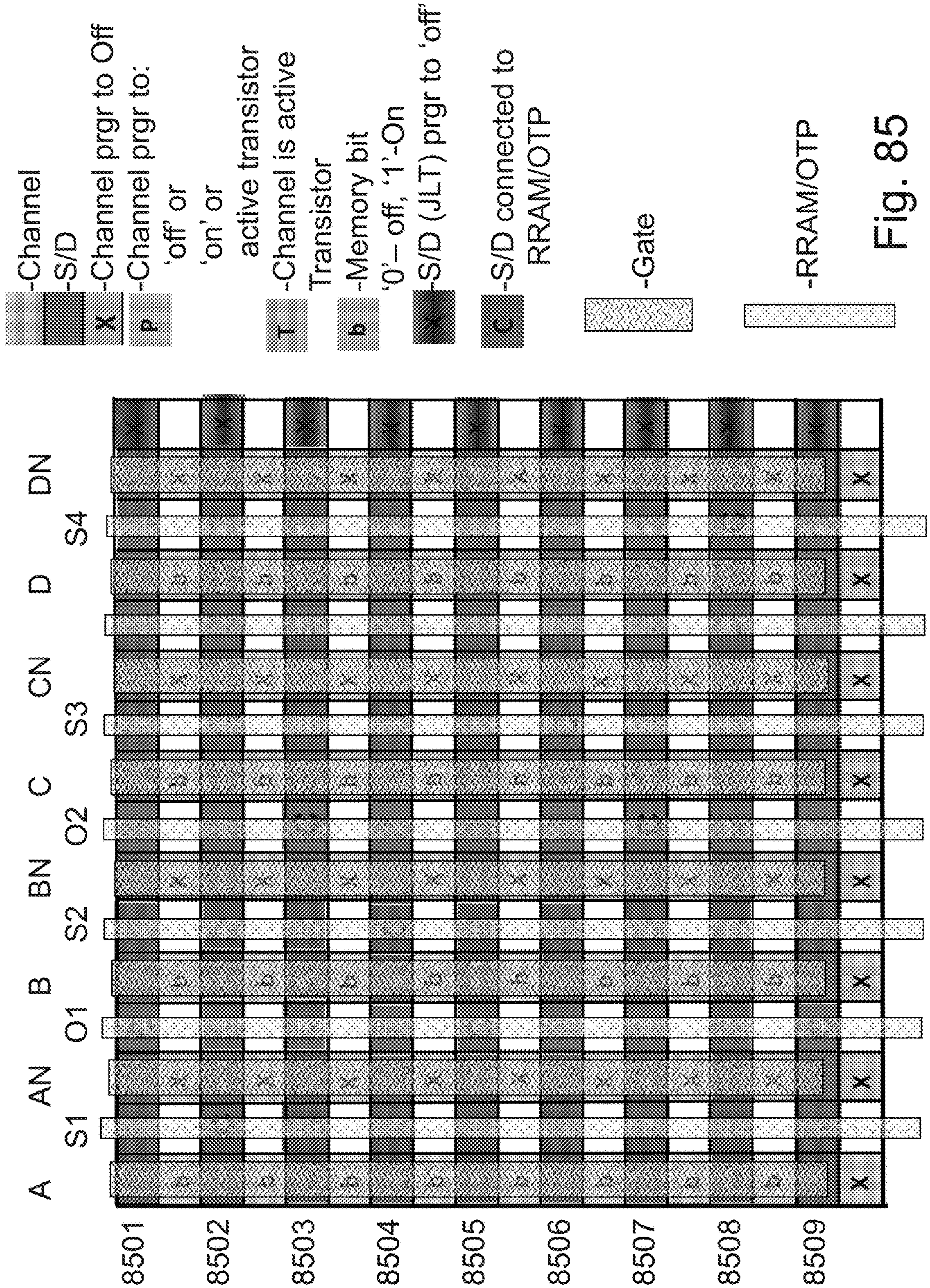
FIG. 85 is an example illustration of a 3D NOR fabric implementing a unit of 32 bits of NV memory.

Since the design of 3D NOR fabric allows for non-volatile (NV) programming of its channels it could support built-in NV memory. FIG. 85 illustrates a unit of 32 bits of NV memory. This particular configuration utilizes a fixed top control circuit connection such as is illustrated in FIG. 83 in which gates are connected in pairs, the signal and its complement (D, DN). In such configuration only half of the channels are utilized as memory indicated as "b" in the drawing) while the other half are programmed to always off ("X").

There are 4 select lines—S1, S2, S3, S4. One of those could be selected by connecting it to "ground" while the other are kept at high resistivity/floating. A 2 to 4 circuit (FIG. 79) could be used for this. Then by controlling one of the 4 gates inputs—A, B, C, D, the memory content of half of the channels would affect the output O1 while the other half would affect the other output O2.

The RRAM/OTP pillars may be programmed to be connected as illustrated in FIG. 85. Therefore, output pillar can be arbitrarily connected to the any of S/D segments upon design considerations. For example, output pillar O1 is connected to S/D segments—Seg1 8501, Seg5 8505, Seg9 8509, so output pillar O2 is connected to S/D segments—Seg3 8503, and Seg7 8507. And Select input S1 is connected to segment Seg2 8502. Select input S2 is connected to segment Seg4 8504. Select input S3 is connected to segment Seg6 8506. And select input S4 is connected to segment Seg8 8508.

If the gates input are not pre-connected in pairs then the memory content of the structure could be doubled.

The structure could be programmed in pairs, a ridge and its complement, for double output reconstruction. If a single ended output reconstruction is used then the memory density could be doubled.

Figure 86A:
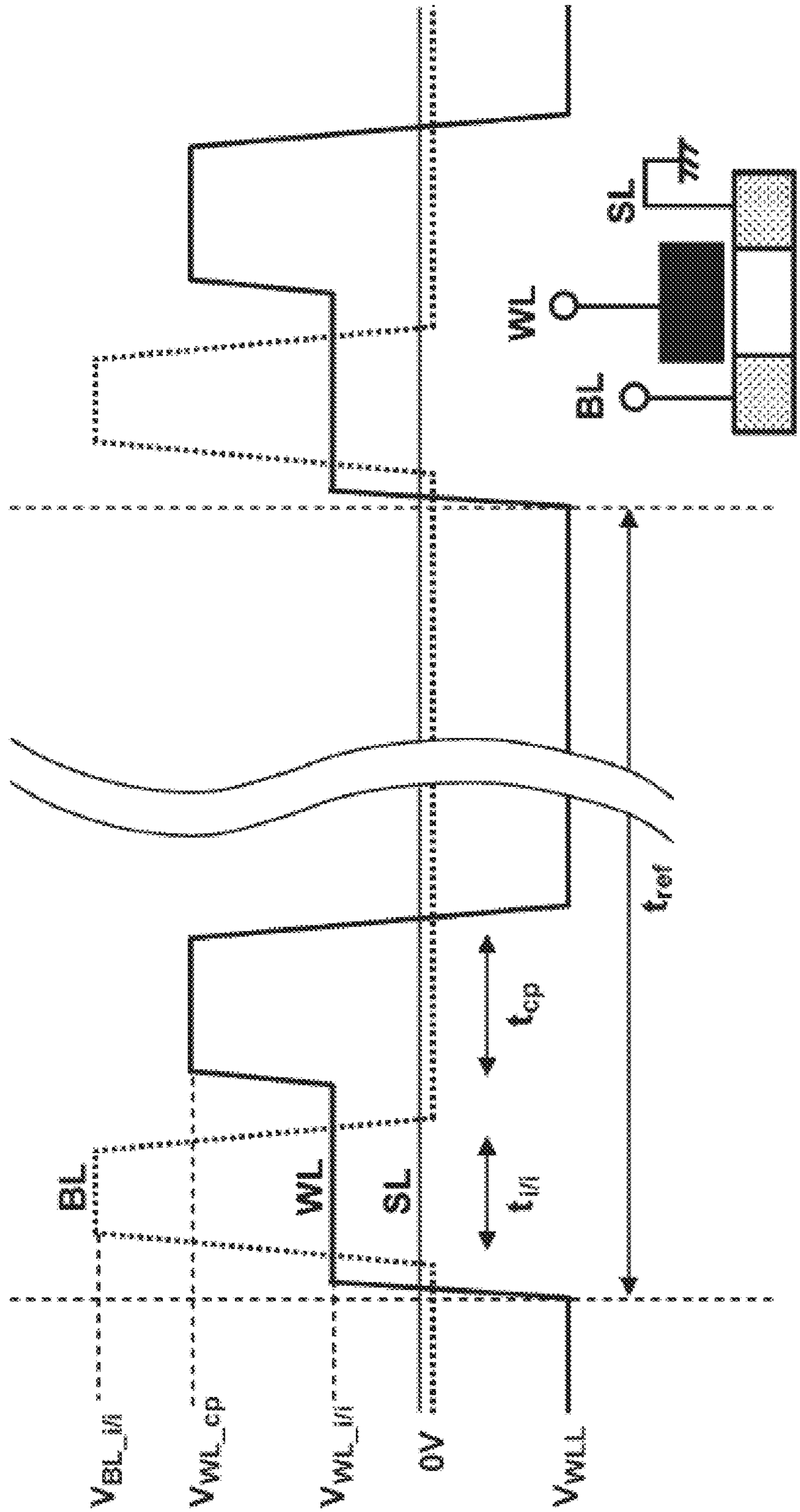
Figure 87:
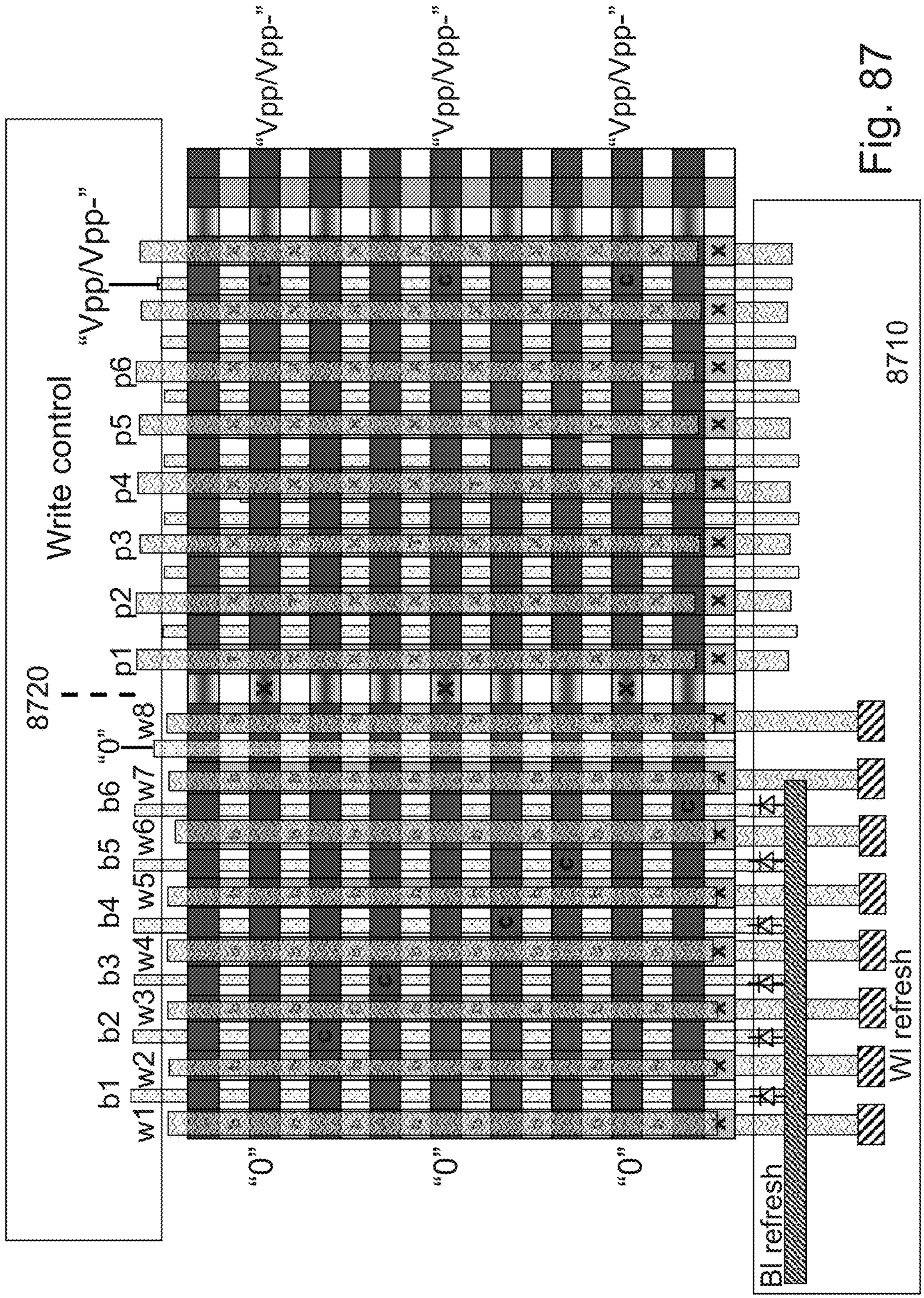
FIG. 87 is an example illustration of a floating body memory implemented in a 3DNOR fabric with dual access to each channel.

Another type of memory that could be implemented within the 3D NOR logic fabric is volatile memory utilizing the floating body effect of the P channel and the refresh techniques described before in respect to floating body memory under the terms 'periodic refresh', 'self refresh' or "Autonomous Refresh". Some of this technique has been detailed in a paper by Takashi Ohsawa et. al. entitled: "Autonomous Refresh of Floating-Body Cell due to Current Anomaly of Impact Ionization". FIG. 86A presents the signal chart and FIG. 86B a table for the operation of such a floating body memory including the conditions for "Autonomous Refresh". The WL in the table is equivalent to a gate of the 3D NOR fabric, the BL and SL correspond to a pair of S/D lines, respectively, and the substrate shown in the table corresponds to a gate located on opposite site of the WL gate. The voltage shown in the table is exemplary but the values can be varied according to the design and other engineering considerations. The 3D NOR fabric provides dual access to each channel location. From the 'bottom' the programming of the fabric and from the top the programmable logic and using reconstruction circuits. The bottom circuits 8710 could be designed to provide the refresh signals as illustrated in FIG. 87. The RRAM/OTP pillar could be used through diodes to provide the BL—Refresh of 2.4V through Bl refresh line, The gate side control could be used for the WL signal for the refresh through the W1 refresh lines. The dual access to each channel location enables the data access and refresh operation, simultaneously. This scheme may save latency due to interruption for the refresh, which results in an access time boosting.

The top circuit 8720 illustrates two sections. The left side is the direct access for reading the memory using the other side of the RRAM/OTP pillars to individually access the 'bit-lines' of each memory row—b1, b2, b3, b4, b5, b6. This could be done using the differential approach by having the adjacent ridge storing the complement data and using the half latch or differential amplifier circuit to compare the corresponding 'bit-lines' for the selected memory column by selecting one gate line acting as word-line—w1, w2, w3, w4, w5, w6, w7, w8.

The SL lines are the segments marked "0" and are shared between two memory cells. The other S/D segments are used for the BL lines. The right side of the structure is providing the write voltages for the structure Vpp (2.4V) or Vpp− (−1.5V). It utilizes three S/D segments marked as Vpp/Vpp− to distribute these writing voltages which then could be activated for the selected row by the gate control of one of p1, p2, p3, p4, p5, p6. The write control portion could support multiple memory structures if connected in series to the left side bit memory structure.

Both types of memory are dual port as they are accessible from the 'top'—the logic fabric side and from the 'bottom', the programming side.

Figure 88A:
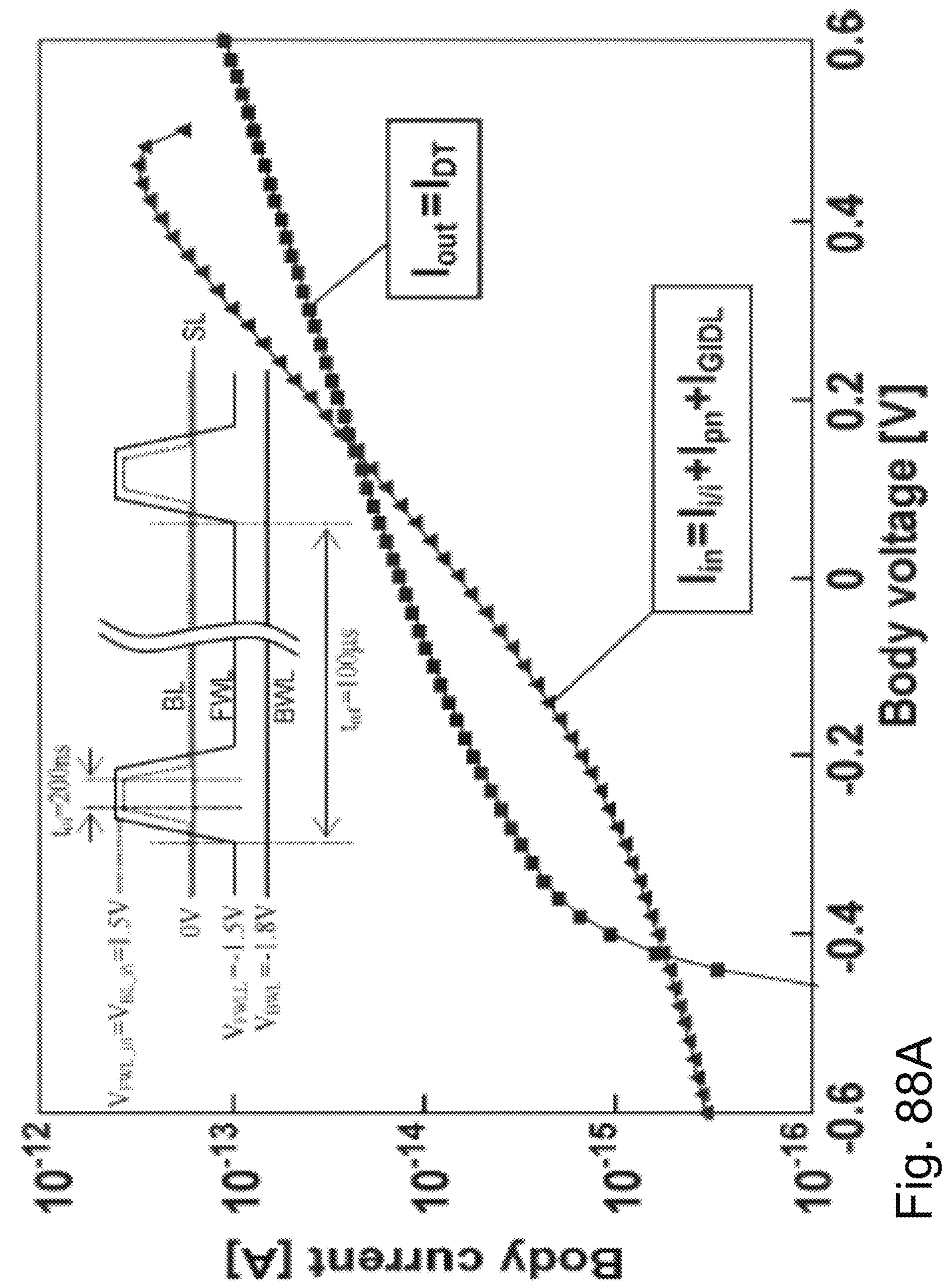
FIGS. 88A-88B are example illustrations of another operation mode for a floating body memory in a 3DNOR fabric.
Figure 88B:
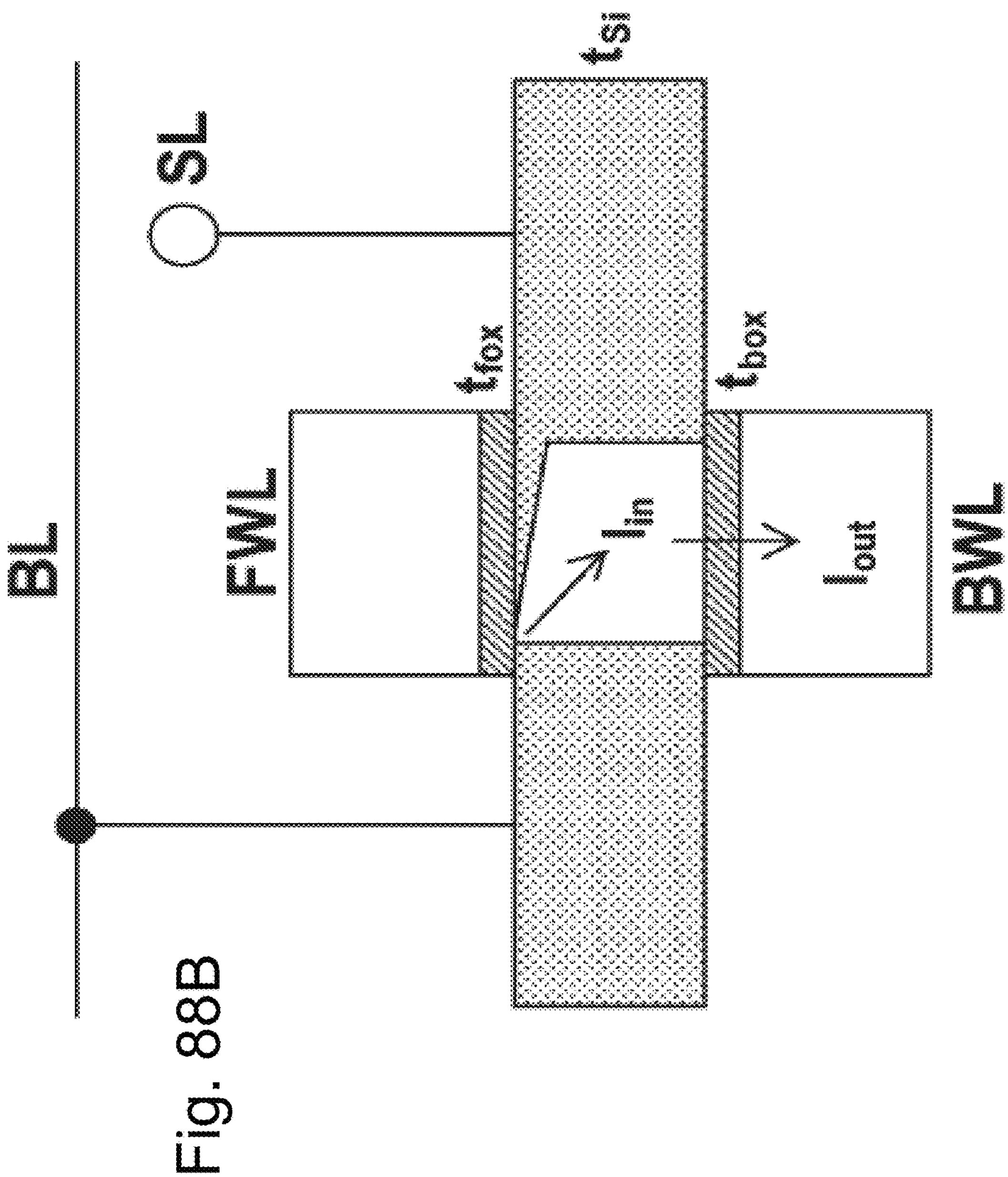

Alternatively another mode of "Autonomous Refresh" could be used as outlined in the referenced paper and is illustrated in FIGS. 88A and 88B, which would be very applicable to the 3D NOR fabric having two independent gates for each channel. Again the bottom circuits 8710 cold provide the "Autonomous Refresh" function.

The top control circuit 8720 for the RAM portion is dedicated and accordingly FIG. 87 illustrates an independent control for each gate lines (w1, w2, . . . p1, p2, . . . ) and not by pairs. These dedicated portions of the top logic control circuit could provide the circuit to select the write signals (2.4V/−1.5V) for the write '1" write "0" which be connected in inverse to the two adjacent ridges, so write '1' could be attached with write '0' to the corresponding channel in the adjacent ridge. The top control circuit could also include a sense amplifier circuit to determine the content of a memory cell being read. Sense amplifiers for memory read are known in the art. A paper by Xuelian Liu, et al titled "A three-dimensional DRAM using floating body cell in FDSOI devices" published at DDECS, 2012 IEEE, and U.S. patent application Ser. No. 13/563,960, all the forgoing incorporated herein by reference, present such optional memory sense amplifier. The memory structure could include a two complementing memory bank which improves the read speed or could be structured as high density with one memory cell per stored bit, in which the detection is made against a predefined reference.

Figure 89A:
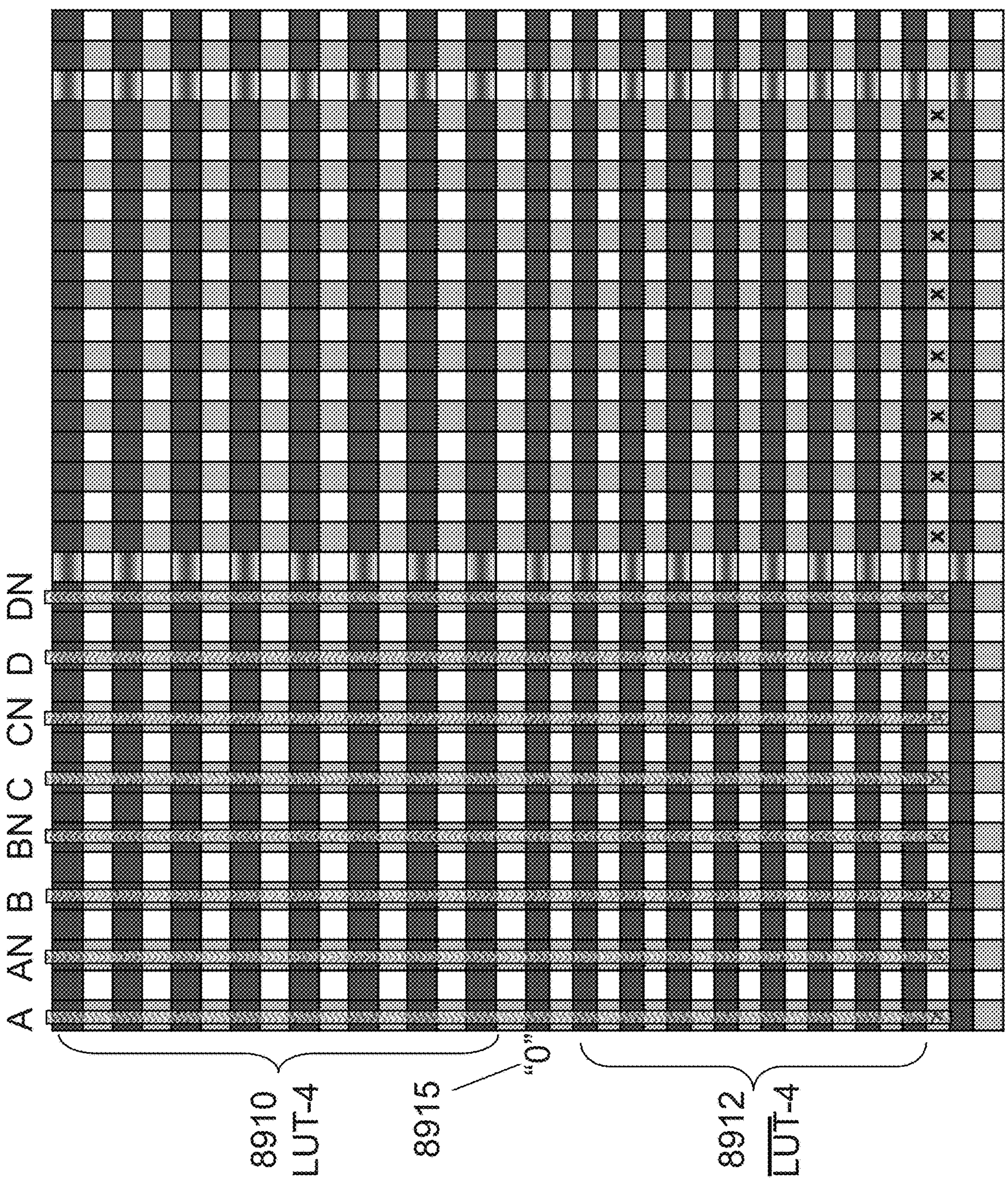
FIGS. 89A-89B are example illustrations of two complementing logic units implemented in a 3DNOR fabric.

The utilization of the 3D-NOR fabric for logic is highly dependent on the efficiency of the overlying control circuit. If the process node used for the control logic is advanced enough then substantially all of the fabric ridges could be used for logic operations. If the control logic circuit density is further improved it might be desired to improve the overall logic density by having the two complementing logic units, one underneath the other, as is illustrated in FIG. 89A. The upper LUT 4 8910 shares the starting point of the S/D segment connected to ground "0" 8915, with the complimentary logic in LUT 4—Not 8912. LUT 4 8910 may be considered to be 'above' or 'on top of' LUT 4—Not 8912.

Figure 89B:
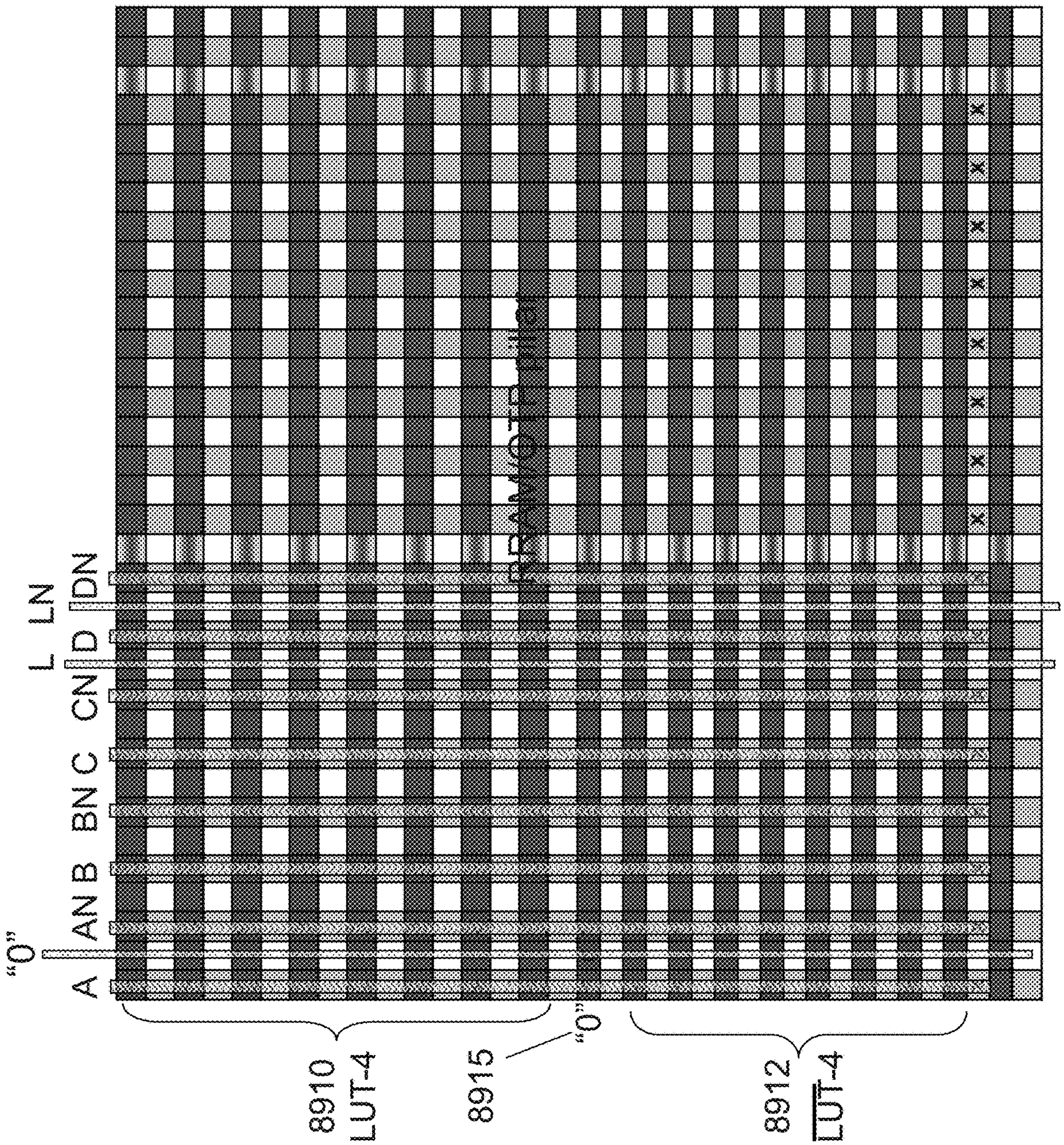

FIG. 89B illustrates the connection of ground "0" 8915 to the middle S/D line using an RRAM/OTP pillar, and the output L, LN connected by RRAM/OTP pillars. The input gates (A, AN, B, BN, . . . ) are shared between the top and the bottom LUTs function. Accordingly the useful NOR Fabric logic density could be doubled.

Figure 90:
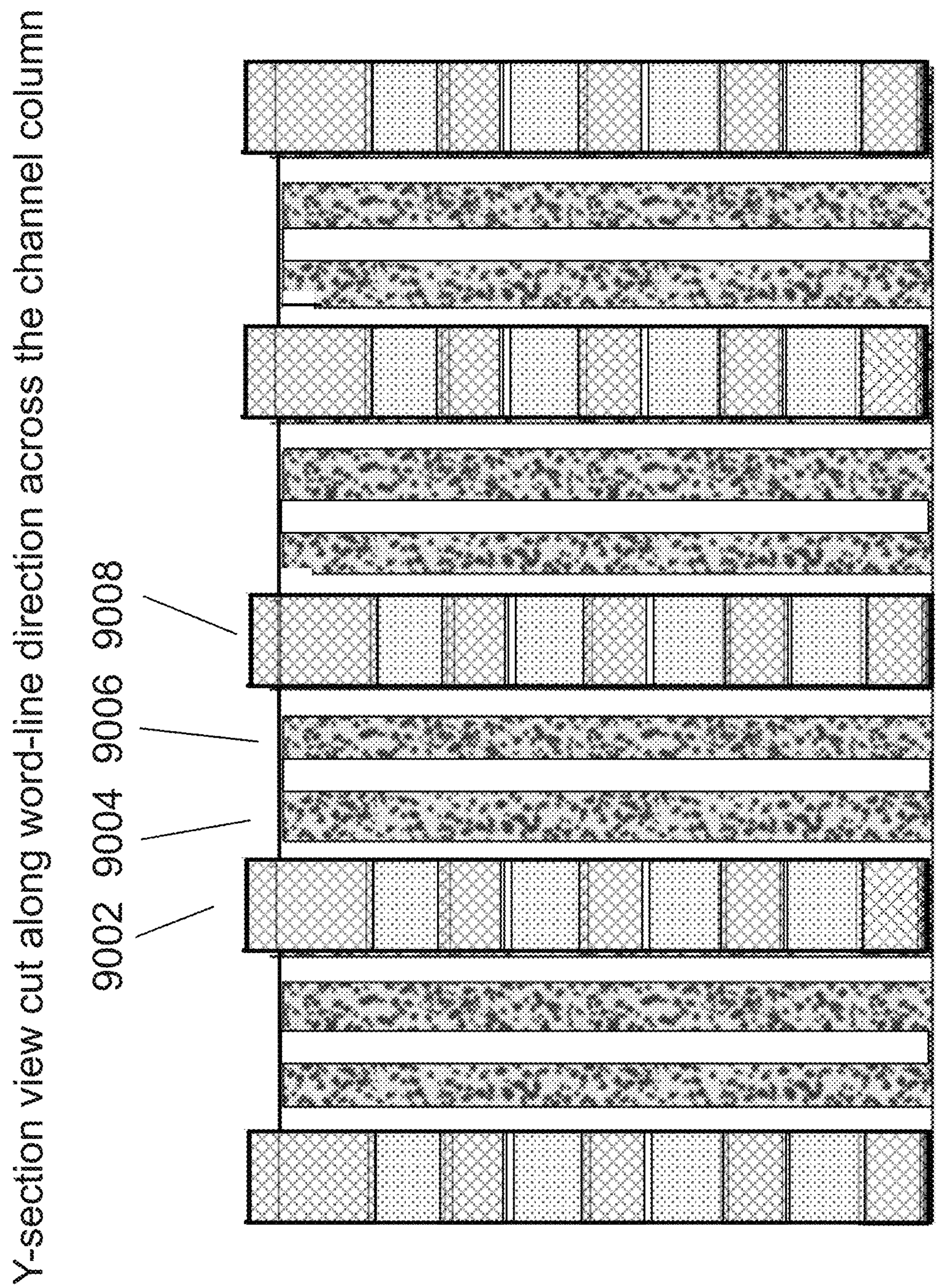
FIG. 90 is an example illustration of a modification to the process/structure to enable logic density doubling.

FIG. 90 illustrates the modification to the process/structure to enable this density doubling. It is a modification on FIG. 36B-4 (36E). To achieve an effective double density, the gate structure in the valleys between ridges needs to be split into two independent gates: first gate 9006 to control the channel of the right ridge 9008 and second gate 9004 for the left ridge 9002. The ALD process for forming the first gate stack would be modified to enable splitting the gate.

Figure 91A:
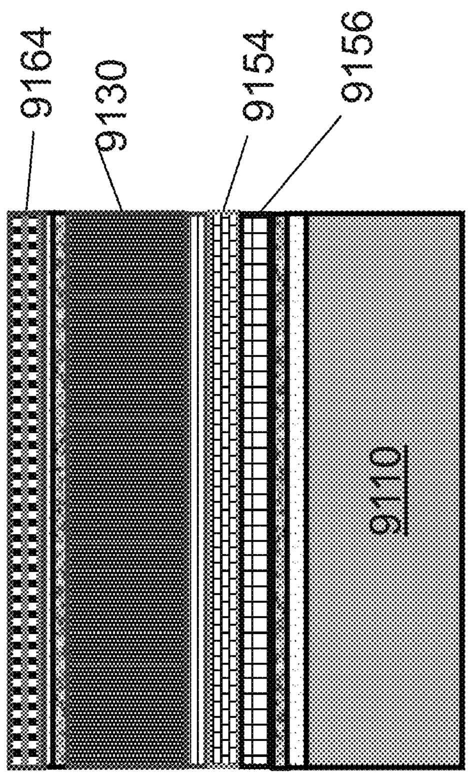
FIGS. 91A-91B are example illustrations of stack structure variations for a 3D programmable system.

Another alternative to increase the 3D NOR logic density is to use the bottom side for logic as well. A layer transfer flow for forming a 3D programmable system leveraging the 3D NOR fabric was described in respect to FIG. 56A-G and FIG. 57A-D herein. FIG. 91A illustrated a 3D programmable system including a carrying substrate 9110, a smart connection layer 9156 connecting the peripherals programming circuit 9154 to the 3D-NOR fabric 9130 with overlaying logic control circuit 9164.

Figure 91B:
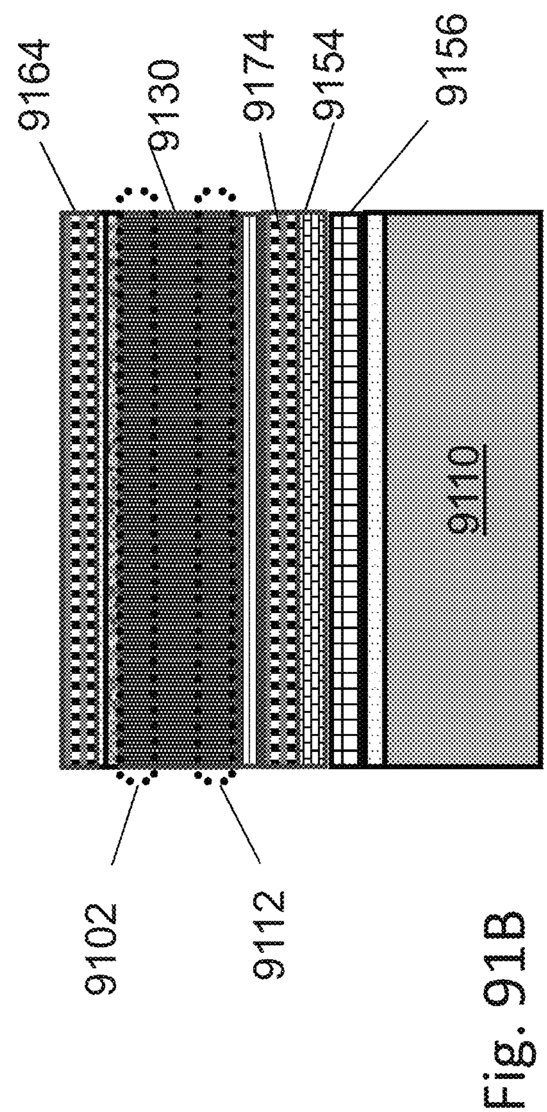

FIG. 91B illustrates the structure adapted to support logic on both sides, the bottom NOR fabric 9112 with its bottom control circuits 9174, and the top NOR fabric 9102 with its top control circuits 9164.

The programming peripherals circuits 9154 could be multiplexed with the bottom logic control circuits 9174 with access to the gates.

The gates could be allocated between right side of the ridge and left side and top control and bottom control circuits. Alternatively the fabrication of the 3D NOR fabric could include isolation of the gate between top and bottom using technique such as the one described in respect to FIG. 65A-E.

Figure 92A:
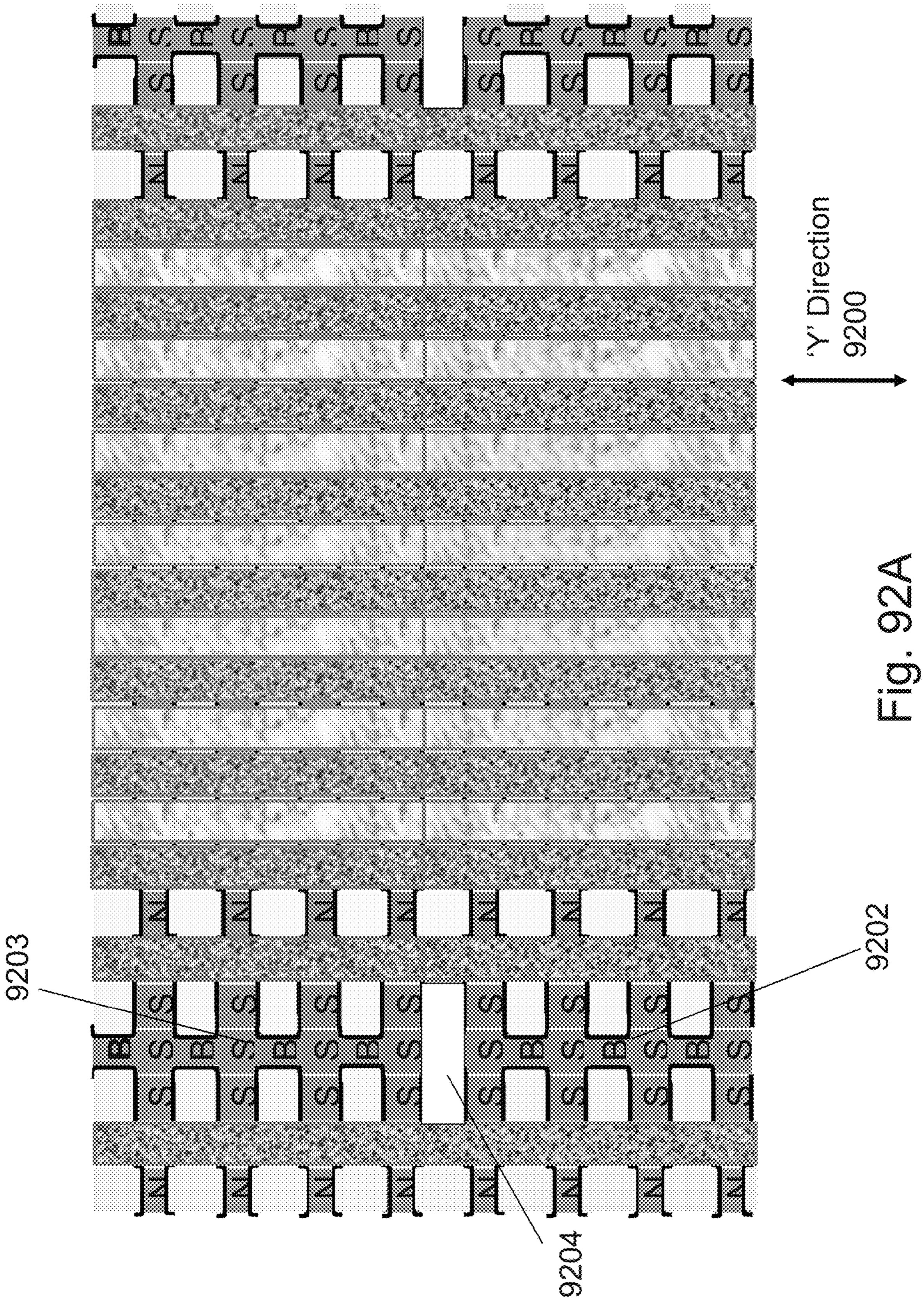
FIGS. 92A-92B are example illustrations of Lateral RRAM for Y direction connectivity in a 3DNOR fabric.

Another alternative enhancement for the 3D NOR logic fabric is adding Lateral RRAM for Y direction connectivity. The starting point is illustrated in FIG. 92A which is very similar to FIG. 64E. It illustrates a first bridge segment 9202 formation that extends across a group of ridges and then interrupt 9204 and then continue again as second bridge segment 9203. The Lateral RRAM formation starts before the necking. First a thin oxide barrier is deposited using ALD or similar technique. Then the RRAM electrode is deposited using ALD or similar technique, followed by a directional etch step leaving the conductive electrodes only in between the 'bridges' and the S/D region (Under S and B, and optional under N). Effectively forming strips of lateral RRAM which stop at interrupt regions 9204. This in-between the S/D lines RRAM could help the routing of signal in the 'Y' direction 9200.

Now the necking step could be done followed by its O/N/O and gate formation.

The programming of the Lateral RRAM portion can be conducted by the resistance change across the resistive switching material. The resistive switching materials incorporated herein can be electrolyte materials such as conductive bridge material, or phase change materials where its crystallographic phase can be changed from amorphous-to-crystalline or crystalline-to-amorphous by Joule heating, or a thin oxide layer where its oxygen vacancies form charge traps or conductive filaments. The resistance across the resistive switching materials is substantially changed from before to after the programming. The resistive changing material is normally insulating, but it is made to be conductive through the conductive path, which is called programming. The programming can be carried out by applying a high voltage, depending on material and design considerations for example such as 5 V, between a pillar and an S/D segment crossing a node to be programming. If the multi-time programmability is available, the programmed state can be erased. For example, if the erase mechanism involves the movement of oxygen vacancies, a high negative voltage such as −5 V is applied between a pillar and an S/D segment crossing a node to be erased. Alternatively, if the erase mechanism involves Joule heating, a high positive voltage but less than the programming voltage such as 3 V is applied between a pillar and an S/D segment crossing a node to be erased. During the programming or erasing operations, the lateral junctionless transistors on the selected pair of S/D segments are all turned on by applying a pass voltage to the second gate lines regardless of the programmed statues of the JLTs.

Figure 92B:
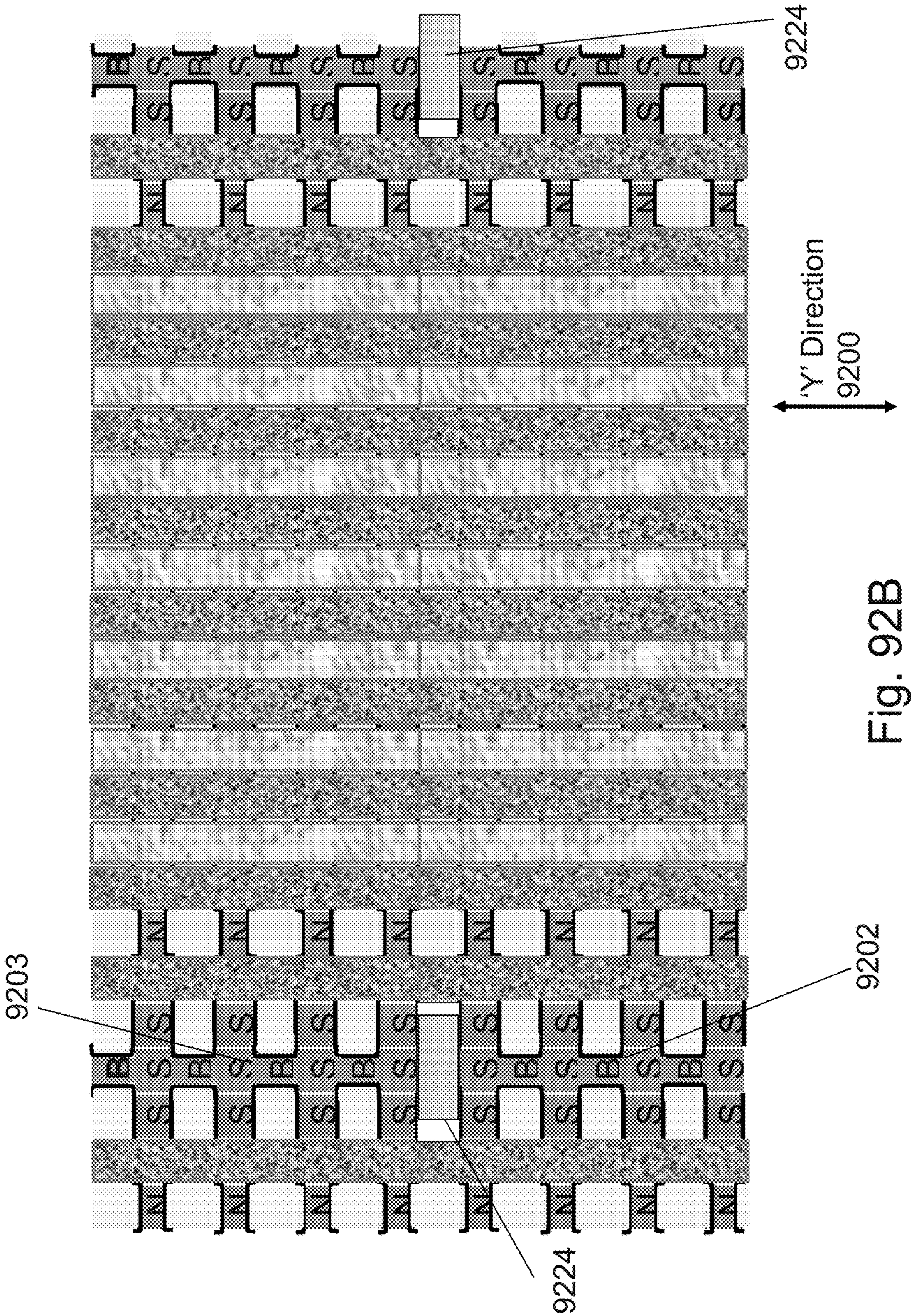

FIG. 92B illustrates a programming support pillar 9224 constructed to support the lateral RRAM programming. Using a lithographic step a window (where pillar 9224 is desired) is defined in the space 9204 between lateral RRAM. Then first a non directional/isotropic etch step is performed to etch the RRAM electrodes region in contact with the window (where pillar 9224 is desired). Then the whole window is filled with N+ type poly silicon. Then using directional/anisotropic etching the N+ poly is removed from all uncovered area so the N+ poly is left only in the region in which the electrode was etched away. Then the window (where pillar 9224 is desired) is filled with P+ poly forming a conductive pillar 9224 with diode feeding each of the lateral RRAMs.

Now these pillars 9224 could be connected forming a fourth gate to be used to start the lateral RRAM programming by feeding positive voltage through the P+ poly pillars to the lateral RRAMs. Then the lateral RRAM connection to the selected regions of the selected S/D lines could be done by selecting specific locations of the specific S/D segment to be connected to the relevant lateral RRAM. G An alternative application of the technology is to use part of the 3D NOR logic fabric for operations resembling a brain Synapse. A paper by Lixue Xia titled "Technological Exploration of RRAM Crossbar Array for Matrix-Vector Multiplication" published at JOURNAL OF COMPUTER SCIENCE AND TECHNOLOGY 31(1): 3-19 Jan. 2016, incorporated herein by reference, teach the use of a crossbar RRAM array for matrix-vector multiplication. Accordingly the RRAM pillars and the corresponding S/D segments could be used for such functions. Papers by Sangsu Park et al titled "Electronic system with memristive synapses for pattern recognition" published by Scientific Reports |5:10123|DOI: 10.1038/srep10123, by Yu Wang et al, titled "Energy Efficient RRAM Spiking Neural Network for Real Time Classification", published at the 25th Symposium on VLSI, by Manan Suri, titled "Exploiting Intrinsic Variability of Filamentary Resistive Memory for Extreme Learning Machine Architectures" published by IEEE Transactions on Nanotechnology 15 Jun. 2015 and Sangsu Park, titled "Nanoscale RRAM-based synaptic electronics: toward a neuromorphic computing device" published by Nanotechnology 24 (2013), all the forgoing incorporated herein by reference teach use of an RRAM cross-bar for brain type processing and accordingly could be implemented in the 3D NOR fabric RRAM pillars and the corresponding S/D segments.

Another alternative is to utilize the 3D NOR fabric floating-body memory structure for Synapse type circuit as is presented in paper such as one by Min-Woo Kwon et al titled "Integrate-and-Fire Neuron Circuit and Synaptic Device using Floating Body MOSFET with Spike Timing-Dependent Plasticity" published by JOURNAL OF SEMICONDUCTOR TECHNOLOGY AND SCIENCE, VOL. 15, NO. 6, DECEMBER, 2015, incorporated herein by reference.

As a general note we described herein 3D memory structure and variations. There are many ways to form other variations of these structures that would be obvious to artisan in the semiconductor memory domain to form by the presented elements described herein. These may include exchanging n type with p type and vice versa, increase density by sharing control lines, silicidation of some in silicon control lines, providing stair case on both sides of memory blocks to improve speed and reduce variation including sharing staircase in between two blocks and other presented variations herein. Many of these options had been presented in some memory options in more details and it would be obvious to artisan in the semiconductor memory domain to apply to the other memory structures.

The structures and flow presented herein are utilizing NPN transistors. Other types of transistors with the corresponding modification of process and materials could be used as alternative such as junction-less transistors, or non-silicon transistors (for example SiGe, CNT, and so on). Those alternatives could be implemented leveraging the special benefits of the architecture disclosed herein.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by appended claims.

We claim:

1. A 3D device, the device comprising:
a first level comprising logic circuits;
a second level comprising a plurality of volatile memory cells; and
a third level comprising a plurality of non-volatile memory cells,
wherein said first level is bonded to said second level.

2. The 3D device of claim 1,
wherein said third level comprises a NAND type memory array.

3. The 3D device of claim 1,
wherein said second level comprises a Random Access Memory ("RAM") array or a NOR type memory array.

4. The 3D device of claim 1, further comprising:
a first memory cell; and
a second memory cell,
wherein said second memory cell is overlaying said first memory cell, and
wherein said first memory cell is self-aligned to said second memory cell, being processed following a same lithography step.

5. The 3D device of claim 1, further comprising:
a fourth level,
wherein said fourth level comprises memory control circuits.

6. The 3D device of claim 1,
wherein said second level comprises an array of at least four by four units,
wherein each of said units comprises an array of memory cells, and
wherein each of said units is independently controlled.

7. The 3D device of claim 1,
wherein said third level comprises charge trap type memory cells.

8. A 3D device, the device comprising:
a first level comprising logic circuits;
a second level comprising a plurality of dynamic memory cells; and
a third level comprising a plurality of non-volatile memory cells,
wherein said first level is bonded to said second level, and
wherein said device comprises refresh circuits to refresh said dynamic memory cells.

9. The 3D device of claim 8,
wherein said third level comprises a NAND type memory array.

10. The 3D device of claim 8,
wherein said second level comprises a Random Access Memory ("RAM") array or a NOR type memory array.

11. The 3D device of claim 8, further comprising:
a first memory cell; and
a second memory cell,
wherein said second memory cell is overlaying said first memory cell, and
wherein said first memory cell is self-aligned to said second memory cell, being processed following a same lithography step.

12. The 3D device of claim 8, further comprising:
a fourth level,
wherein said fourth level comprises memory control circuits.

13. The 3D device of claim 8,
wherein said second level comprises an array of at least four by four units,
wherein each of said units comprises an array of memory cells, and
wherein each of said units is independently controlled.

14. The 3D device of claim 8,
wherein said third level comprises charge trap type memory cells.

15. A 3D device, the device comprising:
a first level comprising logic circuits;
a second level comprising a plurality of high speed memory cells; and
a third level comprising a plurality of high density memory cells,
wherein said first level is bonded to said second level, and
wherein said device comprises control circuits to store more than one bit per cell in said high density memory cells.

16. The 3D device of claim 15,
wherein said third level comprises a NAND type memory array.

17. The 3D device of claim 15,
wherein said second level comprises a Random Access Memory ("RAM") array or a NOR type memory array.

18. The 3D device of claim 15, further comprising:
a first memory cell; and
a second memory cell,
wherein said second memory cell is overlaying said first memory cell, and
wherein said first memory cell is self-aligned to said second memory cell, being processed following a same lithography step.

19. The 3D device of claim 15, further comprising:
a fourth level,
wherein said fourth level comprises memory control circuits.

20. The 3D device of claim 15,
wherein said second level comprises an array of at least four by four units,
wherein each of said units comprises an array of memory cells, and
wherein each of said units is independently controlled.

* * * * *